US011186669B2

(12) United States Patent
Endo et al.

(10) Patent No.: US 11,186,669 B2
(45) **Date of Patent: *Nov. 30, 2021**

(54) POLYMERIZABLE COMPOSITION AND OPTICALLY ANISOTROPIC BODY USING SAME

(71) Applicant: DIC Corporation, Tokyo (JP)

(72) Inventors: Kouichi Endo, Kita-adachi-gun (JP); Toru Ishii, Kita-adachi-gun (JP); Yasuhiro Kuwana, Kita-adachi-gun (JP); Kazuaki Hatsusaka, Kita-adachi-gun (JP); Mika Yamamoto, Kita-adachi-gun (JP)

(73) Assignee: DIC CORPORATION, Tokyo (JP)

( * ) Notice: Subject to any disclaimer, the term of this patent is extended or adjusted under 35 U.S.C. 154(b) by 494 days.

This patent is subject to a terminal disclaimer.

(21) Appl. No.: 15/543,377

(22) PCT Filed: Jan. 12, 2016

(86) PCT No.: PCT/JP2016/050660

§ 371 (c)(1),
(2) Date: Sep. 4, 2018

(87) PCT Pub. No.: WO2016/114252

PCT Pub. Date: Jul. 21, 2016

(65) Prior Publication Data

US 2019/0233565 A1 Aug. 1, 2019

(30) Foreign Application Priority Data

Jan. 16, 2015 (JP) ............................ JP2015-006297

(51) Int. Cl.

| | |
|---|---|
| ***G02F 1/13*** | (2006.01) |
| ***C08F 220/68*** | (2006.01) |
| ***G02F 1/13363*** | (2006.01) |
| ***G02B 5/30*** | (2006.01) |
| ***C08F 20/00*** | (2006.01) |
| ***C09K 19/38*** | (2006.01) |
| ***C09K 19/54*** | (2006.01) |
| ***C08F 222/24*** | (2006.01) |
| ***F21V 9/14*** | (2006.01) |
| ***G02B 1/04*** | (2006.01) |
| ***H01L 51/52*** | (2006.01) |

(52) U.S. Cl.

CPC ............ *C08F 220/68* (2013.01); *C08F 20/00* (2013.01); *C08F 222/24* (2013.01); *C09K 19/38* (2013.01); *C09K 19/3861* (2013.01); *C09K 19/54* (2013.01); *F21V 9/14* (2013.01); *G02B 1/04* (2013.01); *G02B 1/041* (2013.01); *G02B 5/3016* (2013.01); *G02B 5/3083* (2013.01); *G02F 1/13* (2013.01); *G02F 1/13363* (2013.01); *H01L 51/5275* (2013.01); *C08F 222/245* (2020.02); *G02F 1/133633* (2021.01)

(58) Field of Classification Search

CPC ........................................................ G02F 1/13

See application file for complete search history.

(56) References Cited

U.S. PATENT DOCUMENTS

| | | | |
|---|---|---|---|
| 5,445,854 | A | 8/1995 | Newsham et al. |
| 5,602,661 | A | 2/1997 | Schadt et al. |
| 5,995,184 | A | 11/1999 | Chung et al. |
| 6,465,060 | B1 | 10/2002 | Wingen et al. |
| 6,565,974 | B1 | 5/2003 | Uchiyama et al. |
| 7,658,864 | B2 | 2/2010 | Yoshikawa et al. |
| 9,586,917 | B2 | 3/2017 | Sakamoto et al. |
| 9,777,096 | B2 | 10/2017 | Sakamoto et al. |
| 9,995,865 | B2 | 6/2018 | Aimatsu et al. |
| 10,202,470 | B2 | 2/2019 | Endo et al. |
| 10,428,032 | B2 | 10/2019 | Horiguchi et al. |
| 10,539,714 | B2 | 1/2020 | Ishii et al. |
| 10,597,371 | B2 | 3/2020 | Horiguchi et al. |
| 10,633,353 | B2 | 4/2020 | Nose et al. |
| 2007/0176145 | A1 | 8/2007 | Nishikawa et al. |

(Continued)

FOREIGN PATENT DOCUMENTS

| | | |
|---|---|---|
| CN | 103664868 A | 3/2014 |
| CN | 103764610 A | 4/2014 |

(Continued)

OTHER PUBLICATIONS

International Search Report dated Apr. 19, 2016, issued in counterpart International Application No. PCT/JP2016/050660 (2 pages).
Notification of Reasons for Refusal dated Jan. 17, 2017, issued in counterpart Japanese Patent Application No. 2016-567049, w/English translation (9 pages).
Translation of International Search Report dated Apr. 5, 2016, issued in International Application No. PCT/JP2016/050321 (U.S. Appl. No. 15/542,515). (2 pages).
Non-Final Office Action dated Jan. 24, 2019, issued in U.S. Appl. No. 15/542,515. (11 pages).
Final Office Action dated Oct. 24, 2019, issued in U.S. Appl. No. 15/542,515. (7 pages).

(Continued)

*Primary Examiner* — Chanceity N Robinson
(74) *Attorney, Agent, or Firm* — Westerman, Hattori, Daniels & Adrian, LLP

(57) ABSTRACT

The present invention provides a polymerizable composition containing a specific polymerizable compound and a fluorosurfactant having, in its molecule, a pentaerythritol skeleton or a dipentaerythritol skeleton. The invention also provides an optically anisotropic body, a retardation film, an antireflective film, and a liquid crystal display device that are produced using the polymerizable composition of the present invention. The present invention is useful because, when an optically anisotropic body is produced by photo-polymerization of the polymerizable composition, three features including the leveling properties of the surface of the optically anisotropic body, offset onto the substrate, and liquid crystal alignment can be improved simultaneously.

16 Claims, No Drawings

(56) References Cited

U.S. PATENT DOCUMENTS

| | | | | |
|---|---|---|---|---|
| 2008/0057435 | A1* | 3/2008 | Weed | B41M 5/392 430/200 |
| 2009/0009693 | A1 | 1/2009 | Yoshikawa et al. | |
| 2009/0189120 | A1 | 7/2009 | Takeuchi | |
| 2009/0268143 | A1 | 10/2009 | Takeuchi et al. | |
| 2010/0053510 | A1 | 3/2010 | Bitou et al. | |
| 2010/0072422 | A1 | 3/2010 | Parri et al. | |
| 2010/0157204 | A1* | 6/2010 | Ichihashi | C09K 19/3491 349/75 |
| 2011/0237768 | A1 | 9/2011 | Katoh et al. | |
| 2012/0224245 | A1 | 9/2012 | Adlem et al. | |
| 2014/0002785 | A1* | 1/2014 | Choi | G02F 1/133711 349/194 |
| 2014/0107247 | A1* | 4/2014 | Sakamoto | C08F 26/06 522/39 |
| 2014/0142266 | A1 | 5/2014 | Sakamoto et al. | |
| 2014/0200320 | A1 | 7/2014 | Sakamoto et al. | |
| 2014/0309396 | A1 | 10/2014 | Sakamoto et al. | |
| 2015/0079380 | A1 | 3/2015 | Muramatsu et al. | |
| 2015/0115199 | A1 | 4/2015 | Choi et al. | |
| 2015/0175564 | A1* | 6/2015 | Sakamoto | C07D 277/84 526/257 |
| 2015/0183902 | A1 | 7/2015 | Sakamoto et al. | |
| 2015/0218453 | A1 | 8/2015 | Kobayashi et al. | |
| 2015/0218454 | A1 | 8/2015 | Kobayashi et al. | |
| 2015/0219811 | A1 | 8/2015 | Kobayashi et al. | |
| 2015/0219812 | A1 | 8/2015 | Kobayashi | |
| 2015/0274647 | A1 | 10/2015 | Sakamoto et al. | |
| 2015/0274872 | A1 | 10/2015 | Sakamoto et al. | |
| 2015/0277007 | A1 | 10/2015 | Matsuyama et al. | |
| 2015/0277010 | A1 | 10/2015 | Aimatsu et al. | |
| 2015/0285979 | A1 | 10/2015 | Aimatsu | |
| 2016/0002374 | A1 | 1/2016 | Sakamoto et al. | |
| 2016/0200841 | A1 | 7/2016 | Sakamoto | |
| 2016/0257659 | A1 | 9/2016 | Sakamoto et al. | |
| 2016/0272888 | A1 | 9/2016 | Endou et al. | |
| 2016/0280672 | A1 | 9/2016 | Sakamoto et al. | |
| 2017/0008833 | A1 | 1/2017 | Sakamoto et al. | |
| 2017/0047555 | A1 | 2/2017 | Ishiguro et al. | |
| 2017/0260150 | A1 | 9/2017 | Nose et al. | |
| 2017/0369783 | A1 | 12/2017 | Horiguchi et al. | |
| 2018/0002276 | A1 | 1/2018 | Kadomoto et al. | |
| 2018/0002459 | A1 | 1/2018 | Endo et al. | |
| 2018/0002460 | A1 | 1/2018 | Endo et al. | |
| 2018/0016502 | A1 | 1/2018 | Endo et al. | |
| 2018/0031738 | A1 | 2/2018 | Ishii et al. | |
| 2018/0037817 | A1 | 2/2018 | Kuwana et al. | |
| 2018/0066189 | A1 | 3/2018 | Ishii et al. | |
| 2018/0112022 | A1 | 4/2018 | Ishii et al. | |
| 2018/0319755 | A1 | 11/2018 | Teng et al. | |
| 2019/0233565 | A1 | 8/2019 | Endo et al. | |

FOREIGN PATENT DOCUMENTS

| | | | | | |
|---|---|---|---|---|---|
| CN | 103772335 | A | | 5/2014 | |
| JP | H05-100114 | A | | 4/1993 | |
| JP | H06-28937 | A | | 2/1994 | |
| JP | H06-289374 | A | | 10/1994 | |
| JP | H08-231958 | A | | 9/1996 | |
| JP | H11-231132 | A | | 8/1999 | |
| JP | 2000-105315 | A | | 4/2000 | |
| JP | 2001-206884 | A | | 7/2001 | |
| JP | 2003-270435 | A | | 9/2003 | |
| JP | 2005-289980 | A | | 10/2005 | |
| JP | 2007-304444 | A | | 11/2007 | |
| JP | 2007-328053 | A | | 12/2007 | |
| JP | 2007334014 | A | * | 12/2007 | |
| JP | 2008-033285 | A | | 2/2008 | |
| JP | 2008-37768 | A | | 2/2008 | |
| JP | 2008-107767 | A | | 5/2008 | |
| JP | 2008-133245 | A | | 6/2008 | |
| JP | 2008133245 | A | * | 6/2008 | |
| JP | 2008-165185 | A | | 7/2008 | |
| JP | 2009-029795 | A | | 2/2009 | |
| JP | 2009-62508 | A | | 3/2009 | |
| JP | 2009-134257 | A | | 6/2009 | |
| JP | 2009-173893 | A | | 8/2009 | |
| JP | 2009-179563 | A | | 8/2009 | |
| JP | 2009-181104 | A | | 8/2009 | |
| JP | 2009173893 | A | * | 8/2009 | |
| JP | 2009181104 | A | * | 8/2009 | |
| JP | 2009-242318 | A | | 10/2009 | |
| JP | 2009-265317 | A | | 11/2009 | |
| JP | 2010-031223 | A | | 2/2010 | |
| JP | 2010-100541 | A | | 5/2010 | |
| JP | 2010-163482 | A | | 7/2010 | |
| JP | 2010-522892 | A | | 7/2010 | |
| JP | 2010163482 | A | * | 7/2010 | |
| JP | 2010-230815 | A | | 10/2010 | |
| JP | 2010-265405 | A | | 11/2010 | |
| JP | 2010265405 | A | * | 11/2010 | |
| JP | 2010265605 | A | * | 11/2010 | |
| JP | 2011-006361 | A | | 1/2011 | |
| JP | 2011-158671 | A | | 8/2011 | |
| JP | 2011-162678 | A | | 8/2011 | |
| JP | 2011-207765 | A | | 10/2011 | |
| JP | 2011-207941 | A | | 10/2011 | |
| JP | 2011-246381 | A | | 12/2011 | |
| JP | 2012-21068 | A | | 2/2012 | |
| JP | 2012-077055 | A | | 4/2012 | |
| JP | 2012-87179 | A | | 5/2012 | |
| JP | 2012-136641 | A | | 7/2012 | |
| JP | 5013830 | B2 | | 8/2012 | |
| JP | 2013-003212 | A | | 1/2013 | |
| JP | 2013-509458 | A | | 3/2013 | |
| JP | 2013-071956 | A | | 4/2013 | |
| JP | 2014-17304 | A | | 1/2014 | |
| JP | 2014-063143 | A | | 4/2014 | |
| JP | 2015-200877 | A | | 11/2015 | |
| JP | 2016-113583 | A | | 6/2016 | |
| JP | 6066252 | B2 | | 1/2017 | |
| JP | 6172556 | B2 | | 8/2017 | |
| JP | 6172557 | B2 | | 8/2017 | |
| JP | 6213797 | B2 | | 10/2017 | |
| WO | 00/026705 | A1 | | 5/2000 | |
| WO | 2005/112540 | A2 | | 12/2005 | |
| WO | 2008/126421 | A1 | | 10/2008 | |
| WO | WO-2008126421 | A1 | * | 10/2008 | C09K 19/3861 |
| WO | 2012/141245 | A1 | | 10/2012 | |
| WO | WO-2012141245 | A1 | * | 10/2012 | C08F 28/06 |
| WO | 12/147904 | A1 | | 11/2012 | |
| WO | 2012/176679 | A1 | | 12/2012 | |
| WO | 2013/018526 | A1 | | 2/2013 | |
| WO | 2013/146633 | A1 | | 10/2013 | |
| WO | 2013/157888 | A1 | | 10/2013 | |
| WO | 2013/180217 | A1 | | 12/2013 | |
| WO | 2014/010325 | A1 | | 1/2014 | |
| WO | 2014/061709 | A1 | | 4/2014 | |
| WO | 2014/065176 | A1 | | 5/2014 | |
| WO | 2014-065243 | A1 | | 5/2014 | |
| WO | 2014/069515 | A1 | | 5/2014 | |
| WO | WO-2014069515 | A1 | * | 5/2014 | G02B 5/3016 |
| WO | 2014/126113 | A1 | | 8/2014 | |
| WO | 2014/132978 | A1 | | 9/2014 | |
| WO | 2015/025793 | A1 | | 2/2015 | |
| WO | 2015/064698 | A1 | | 5/2015 | |
| WO | 2015/076031 | A1 | | 5/2015 | |
| WO | 2015/122384 | A1 | | 8/2015 | |
| WO | 2015/122385 | A1 | | 8/2015 | |
| WO | 2015/166991 | A1 | | 11/2015 | |
| WO | 2016/056542 | A1 | | 4/2016 | |
| WO | 2016/088749 | A1 | | 6/2016 | |
| WO | 2016/104317 | A1 | | 6/2016 | |
| WO | 2016/114066 | A1 | | 7/2016 | |
| WO | 2016/114211 | A1 | | 7/2016 | |
| WO | 2016/114252 | A1 | | 7/2016 | |
| WO | 2016/114253 | A1 | | 7/2016 | |
| WO | 2016/114254 | A1 | | 7/2016 | |
| WO | 2016/114255 | A1 | | 7/2016 | |
| WO | 2016/114346 | A1 | | 7/2016 | |
| WO | 2016/114347 | A1 | | 7/2016 | |
| WO | 2016/114348 | A1 | | 7/2016 | |
| WO | 2017/038265 | A1 | | 3/2017 | |

(56) References Cited

FOREIGN PATENT DOCUMENTS

| | | | |
|---|---|---|---|
| WO | 2017/038266 | A1 | 3/2017 |
| WO | 2017/038267 | A1 | 3/2017 |
| WO | 2017/057020 | A1 | 4/2017 |
| WO | 2017/068860 | A1 | 4/2017 |

OTHER PUBLICATIONS

International Search Report dated Apr. 12, 2016, issued in International Application No. PCT/JP2016/050984 counterpart to U.S. Appl. No. 15/543,477). (2 pages).
Office Action dated Jan. 17, 2019, issued in JP Application No. 2018-052601 (counterpart to U.S. Appl. No. 15/772,981), with English translation (12 pages).
Office Action dated Nov. 15, 2017, issued in JP Application No. 2015-240161 (counterpart to U.S. Appl. No. 15/772,981), with English translation. (33 pages).
International Search Report dated Aug. 12, 2016, issued in International Application No. PCT/CN2015/094100 (counterpart to U.S. Appl. No. 15/772,981). (2 pages).
Notice of Allowance dated Sep. 11, 2018, issued in U.S. Appl. No. 15/543,782. (30 pages).
International Search Report dated Mar. 22, 2016, issued in International Application No. PCT/JP2015/085343 (counterpart to U.S. Appl. No. 15/543,782).(3 pages).
Notification of Reasons for Refusal dated Feb. 16, 2017, issued in JP Application No. 2016-558156 (counterpart to U.S. Appl. No. 15/543,782), with English translation. (6 pages).
Non-Final Office Action dated Dec. 2, 2019, issued in U.S. Appl. No. 15/532,224. (14 pages).
International Search Report and Written Opinion dated Feb. 16, 2016, issued in application No. PCT/JP2015/085342 (counterpart to U.S. Appl. No. 15/532,224) (10 pages).
Calvin, J. et al., "Rhodium-Catalyzed and Zinc(II)-Triftate-Promoted Asymmetric Hydrogenation of Tetrasubstituted Alpha, Beta-Unsaturated Ketones", Organic Letters, 2012,vol. 14, No. 4, pp. 1038-1041, (counterpart to U.S. Appl. No. 15/532,224). (4 pages).
Szelinski, H. et al., "Porphyrins Linked to High Acceptor Strength Cyano Quinones as Models for the Photosynthetic Reaction Center", Tetrahedron, 1996, vol. 52, No. 25, pp. 8497-8516, (counterpart to U.S. Appl. No. 15/532,224). (20 pages).
Kallitsis, J. et al., "Soluble Polymers with Laterally Attached Oligophenyl Units for Potential Use as Blue Luminescent Materials", Macromolecules, 1997, vol. 30, No. 10, pp. 2989-2996, (counterpart to U.S. Appl. No. 15/532,224. (8 pages).
Benbow, J. et al., "An Approach to Dibenzofuran Heterocycles. 1. Electron-Transfer Processes en Route to Dibenzofuran-1, 4-diones", J. Org. Chem., 1997, vol. 62, No. 26, pp. 9345-9347, (counterpart to U.S. Appl. No. 15/532,224). (3 pages).
Yu, S. et al., "Self-Assembled Electroluminescent Polymers Derived from Terpyridine-Based Moieties", Advanced Materials, 2003, vol. 15, No. 19, pp. 1643-1647, (counterpart to U.S. Appl. No. 15/532,224). (5 pages).
Benbow, J. et al., "Biaryl Formation Using the Suzuki Protocol: Considerations of Base, Halide, and Protecting Group" Tetrahedron Letters, 1996, vol. 37, No. 49, pp. 8829-8832, (counterpart to U.S. Appl. No. 15/532,224). (4 pages).
Macdonald, D. et al., "Substituted 2,2-bisaryl-bicycloheptanes as novel and potent inhibitors of 5-lipxygenase activating protein", Bioorganic and Medicinal Chemistry Letters, 2008, vol. 18, pp. 2023-2027, (counterpart to U.S. Appl. No. 15/532,224). (5 pages).
Final Office Action dated Apr. 18, 2019, issued in U.S. Appl. No. 15/532,224. (15 pages).
Scifinder, American Chemical Society (ACS) search, Apr. 14, 2019, pp. 1-5, (counterpart to U.S. Appl. No. 15/532,224). (5 pages).
International Search Report dated Apr. 12, 2016, issued in application No. PCT/JP2016/050322 (counterpart to U.S. Appl. No. 15/532,224) (2 pages).
Non-Final Office Action dated Jun. 21, 2018, issued in U.S. Appl. No. 15/532,224. (20 pages).
International Search Report dated Jan. 26, 2016, issued in application No. PCT/JP2015/083728 (counterpart to U.S. Appl. No. 15/532,224) (3 pages).
Notification of Reasons for Refusal dated Jan. 31, 2017, issued in JP application No. 2016-562632 (counterpart to U.S. Appl. No. 15/532,224), with English translation. (11 pages).
International Search Report dated May 17, 2016, issued in International application No. PCT/JP2016/054399 counterpart to U.S. Appl. No. 15/547,949). (2 pages).
Notification of Reasons for Refusal dated Jan. 24, 2017, issued in JP application No. 2016-567448 (counterpart to U.S. Appl. No. 15/547,949), with English translation (8 pages).
Decision to Grant a Patent dated May 25, 2017, issued in JP application No. 2016-567448 (counterpart to U.S. Appl. No. 15/547,949), with English translation. (6 pages).
Non-Final Office Action dated Oct. 4, 2018, issued in U.S. Appl. No. 15/543,449. (16 pages).
International Search Report dated Apr. 12, 2016, issued in International Application No. PCT/JP2016/050662 counterpart to U.S. Appl. No. 15/543,449). (2 pages).
International Search Report dated Nov. 15, 2016, issued in application No. PCT/JP2016/074802 (counterpart to U.S. Appl. No. 15/769,841) (2 pages).
Notification of Reason for Rejection dated Aug. 24, 2017, issued in JP application No. 2017-539467 (counterpart to U.S. Appl. No. 15/769,841), with English translation (10 pages).
Decision to Grant a Patent dated Jan. 18, 2018, issued in JP application No. 2017-539467 (counterpart to U.S. Appl. No. 15/769,841), with English translation. (5 pages).
International Search Report dated Apr. 12, 2016, issued in application No. PCT/JP2016/050661 (counterpart to U.S. Appl. No. 15/543,430) (2 pages).
Non-Final Office Action dated Mar. 9, 2020, issued in U.S. Appl. No. 15/772,981. (22 pages).
Non-Final Office Action dated Sep. 11, 2018, issued in U.S. Appl. No. 15/769,841. (19 pages).
Final Office Action dated May 17, 2019, issued in U.S. Appl. No. 15/547,949. (14 pages).
Non-Final Office Action dated Nov. 16, 2018, issued in U.S. Appl. No. 15/547,949. (16 pages).
Non-Final Office Action dated Dec. 21, 2018, issued in U.S. Appl. No. 15/543,430. (18 pages).
Non-Final Office Action dated May 8, 2020 issued in U.S. Appl. No. 15/543,477. (28 pages).
Final Office Action dated Oct. 9, 2019, issued in U.S. Appl. No. 15/543,477. (12 pages).
Non-Final Office Action dated Dec. 26, 2018 issued in U.S. Appl. No. 15/543,477. (27 pages).

* cited by examiner

POLYMERIZABLE COMPOSITION AND OPTICALLY ANISOTROPIC BODY USING SAME

TECHNICAL FIELD

The present invention relates to optically anisotropic polymers having various optical properties, to polymerizable compositions useful for components of films, to optically anisotropic bodies, retardation films, optical compensation films, antireflective films, lenses, and lens sheets that are composed of the polymerizable compositions, and to liquid crystal display devices, organic light-emitting display devices, lighting devices, optical components, polarizing films, coloring agents, security markings, laser light-emitting components, printed materials, etc. that use the polymerizable compositions.

BACKGROUND ART

Compounds having polymerizable groups (polymerizable compounds) are used for various optical materials. For example, by aligning a polymerizable composition containing a polymerizable compound into a liquid crystal state and then polymerizing the resulting polymerizable composition, a polymer with uniform alignment can be produced. Such a polymer can be used for polarizing plates, retardation plates, etc. necessary for displays. In many cases, polymerizable compositions containing two or more polymerizable compounds are used in order to meet the required optical properties, polymerization rate, solubility, melting point, glass transition temperature, transparency of polymers, mechanical strength, surface hardness, heat resistance, and light fastness. It is necessary for the polymerizable compounds used to provide good physical properties to the polymerizable compositions without adversely affecting other characteristics.

To improve the viewing angle of liquid crystal displays, it is necessary for retardation films to show birefringence with weak or reverse wavelength dispersion. Various polymerizable liquid crystal compounds with reverse or weak wavelength dispersion have been developed as the materials of these retardation films. When these polymerizable compounds are added to polymerizable compositions, crystals are precipitated, so that the storage stability of the polymerizable compositions is insufficient (PTL 1). Another problem with these polymerizable compounds is that when the polymerizable compositions are applied to substrates and polymerized, unevenness easily occurs (PTL 1 to PTL 3). When an uneven film is used for, for example, a display, a problem arises in that the quality of the display product deteriorates significantly because of unevenness in display brightness or unnatural color tone. There is therefore a need for the development of a polymerizable liquid crystal compound with reverse or weak wavelength dispersion that can solve the above problems. To solve the unevenness problem, specific surfactants are generally added to polymerizable liquid crystal compound compositions (PTL 2 to PTL 5). Another problem is that, when a polymerizable composition is applied to substrates and polymerized and the substrates are stacked and brought into contact with each other, the surfactant present on the coated surfaces is offset onto the substrates, causing poor appearance. An important technique to solve the coating unevenness problem and the offset problem simultaneously is to select an optimal surfactant.

CITATION LIST

Patent Literature

PTL 1: Japanese Unexamined Patent Application Publication No. 2008-107767

PTL 2: Japanese Unexamined Patent Application Publication (Translation of PCT Application) No. 2010-522892

PTL 3: Japanese Unexamined Patent Application Publication (Translation of PCT Application) No. 2013-509458

PTL 4: WO12/147904

PTL 5: Japanese Unexamined Patent Application

SUMMARY OF INVENTION

Technical Problem

An object of the present invention is to provide a polymerizable composition that is excellent in solubility, causes no precipitation of crystals, and has high storage stability. When the polymerizable composition provided is polymerized to produce a film-shaped polymerized product, unevenness is unlikely to occur, and poor appearance due to offset of the surfactant is unlikely to occur. Other objects of the invention are to provide optically anisotropic bodies, retardation films, optical compensation films, antireflective films, lenses, and lens sheets that are composed of the polymerizable composition and to provide liquid crystal display devices, organic light-emitting display devices, lighting devices, optical components, coloring agents, security markings, laser light-emitting components, polarizing films, coloring materials, printed materials, etc. that use the polymerizable composition.

Solution to Problem

In the present invention, to achieve the above objects, extensive studies have been conducted with attention paid to polymerizable compositions that use a specific fluorosurfactant and a polymerizable compound having a specific structure with one or at least two polymerizable groups. As a result of the extensive studies, the present invention is provided.

Accordingly, the present invention provides a polymerizable composition comprising:

a) a polymerizable compound having one polymerizable group or two or more polymerizable groups and satisfying formula (I)

$$Re(450\ \text{nm})/Re(550\ \text{nm})<1.0 \qquad \text{(I)}$$

(wherein Re(450 nm) is an in-plane retardation at a wavelength of 450 nm when the polymerizable compound having one polymerizable group is aligned on a substrate such that the direction of long axes of molecules of the polymerizable compound is substantially horizontal to the substrate, and Re(550 nm) is an in-plane retardation at a wavelength of 550 nm when the polymerizable compound having one polymerizable group is aligned on the substrate such that the direction of the long axes of the molecules of the polymerizable compound is substantially horizontal to the substrate); and b) at least one fluorosurfactant (III) selected from the group consisting of a compound having a pentaerythritol skeleton and a compound having a dipentaerythritol skeleton.

Moreover, the present invention provides an optically anisotropic body, a retardation film, an optical compensation film, an antireflective film, a lens, and a lens sheet that are composed of the polymerizable composition and also provides a liquid crystal display device, an organic light-emitting display device, a lighting device, an optical component, a coloring agent, a security marking, a laser light-emitting component, a printed material, etc. that use the polymerizable composition.

Advantageous Effects of Invention

The polymerizable composition of the present invention uses the fluorosurfactant (III) simultaneously with the liquid crystalline compound having a specific structure with one polymerizable group or two or more polymerizable groups and showing reverse wavelength dispersion. This allows the polymerizable composition obtained to have excellent solubility and excellent storage stability and also allows provision of polymers, optically anisotropic bodies, retardation films, etc. that are excellent in coating film surface leveling properties, cause less offset from liquid crystal coating film surfaces, and have good productivity.

DESCRIPTION OF EMBODIMENTS

Best modes of the polymerizable composition according to the present invention will next be described. In the present invention, the "liquid crystalline compound" is intended to mean a compound having a mesogenic skeleton, and it is not necessary for the compound alone to exhibit liquid crystallinity. The polymerizable composition can be polymerized (formed into a film) through polymerization treatment by irradiation with light such as UV rays or heating.

Polymerizable Compound Having One Polymerizable Group or Two or More Polymerizable Groups The liquid crystalline compound having one polymerizable group or two or more polymerizable groups in the present invention is characterized in that the birefringence of the compound is lager on a long-wavelength side than on a short-wavelength side within the visible range. Specifically, it is only necessary that formula (I):

$$Re(450\ \text{nm})/Re(550\ \text{nm})<1.0 \qquad \text{(I)}$$

be satisfied (wherein Re(450 nm) is an in-plane retardation at a wavelength of 450 nm when the polymerizable compound having one polymerizable group or two or more polymerizable groups is aligned on a substrate such that the direction of the long axes of molecules of the polymerizable compound is substantially horizontal to the substrate, and Re(550 nm) is an in-plane retardation at a wavelength of 550 nm when the polymerizable compound having one polymerizable group or two or more polymerizable groups is aligned on the substrate such that the direction of the long axes of the molecules of the polymerizable compound is substantially horizontal to the substrate). It is not necessary that the birefringence be larger on the long-wavelength side than on the short wavelength side within the ultraviolet and infrared ranges.

The above compound is preferably a liquid crystalline compound. In particular, it is preferable that the compound comprises at least one of liquid crystalline compounds represented by general formulas (1) to (7).

[Chem. 1]

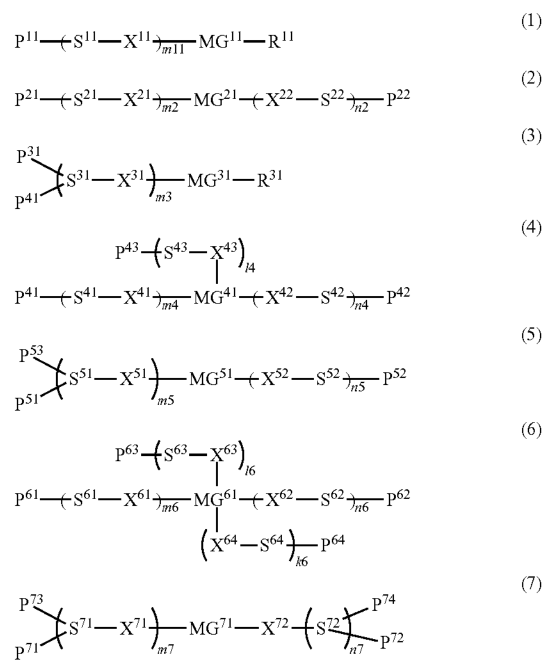

(In the above formulas, $P^{11}$ to $P^{74}$ each represent a polymerizable group; $S^{11}$ to $S^{72}$ each represent a spacer group or a single bond; when a plurality of $S^{11}$s to $S^{72}$s are present, they may be the same or different;

$X^{11}$ to $X^{72}$ each represent —O—, —S—, —OCH$_2$—, —CH$_2$O—, —CO—, —COO—, —OCO—, —CO—S—, —S—CO—, —O—CO—O—, —CO—NH—, —NH—CO—, —SCH$_2$—, —CH$_2$S—, —CF$_2$O—, —OCF$_2$—, —CF$_2$S—, —SCF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —COO—CH$_2$—, —OCO—CH$_2$—, —CH$_2$—COO—, —CH$_2$—OCO—, —CH═CH—, —N═N—, —CH═N—N═CH—, —CF═CF—, —C≡C—, or a single bond (provided that each P—(S—X)— bond contains no —O—O—); when a plurality of $X^{11}$s to $X^{72}$s are present, they may be the same or different;

$MG^{11}$ to $MG^{71}$ each independently represent formula (a):

[Chem. 2]

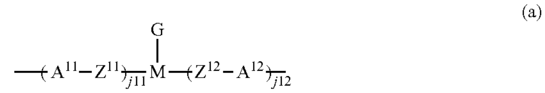

(wherein $A^{11}$ and $A^{12}$ each independently represent, a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, each of which may be unsubstituted or substituted by at least one $L^1$; when a plurality of $A^{11}$s and/or $A^{12}$s are present, they may be the same or different;

$Z^{11}$ and $Z^{12}$ each independently represent —O—, —S—, —OCH$_2$—, —CH$_2$O—, —CH$_2$CH$_2$—, —CO—, —COO—, —OCO—, —CO—S—, —S—CO—, —O—CO—O—, —CO—NH—, —NH—CO—, —SCH$_2$—, —CH$_2$S—, —CF$_2$O—, —OCF$_2$—, —CF$_2$S—, —SCF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —COO—CH$_2$—, —OCO—CH$_2$—, —CH$_2$—COO—, —CH$_2$—OCO—, —CH═CH—, —N═N—, —CH═N—, —N═CH—, —CH═N—N═CH—, —CF═CF—, —C≡C—, or a single bond; when a plurality of $Z^{11}$s and/or $Z^{12}$s are present, they may be the same or different;

M represents a group selected from formula (M-1) to formula (M-11) below:

[Chem. 3]

(M-1)

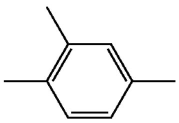

(M-2)

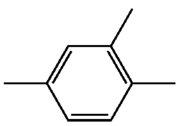

(M-3)

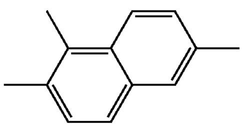

(M-4)

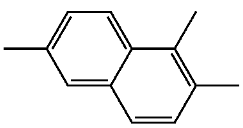

(M-5)

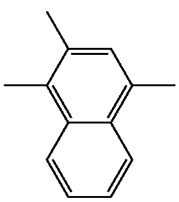

(M-6)

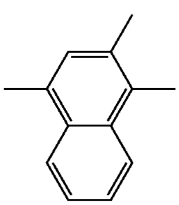

(M-7)

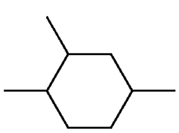

(M-8)

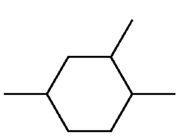

-continued (M-9)

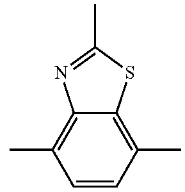

(M-10)

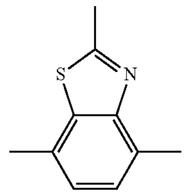

(M-11)

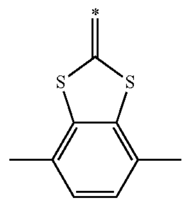

, the groups represented by formula (M-1) to formula (M-11) may be unsubstituted or substituted by at least one $L^1$;

G is one of formula (G-1) to formula (G-6) below:

[Chem. 4]

(G-1)

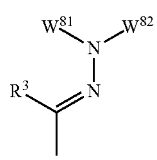

(G-2)

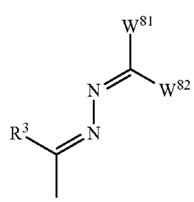

(G-3)

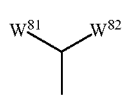

(G-4)

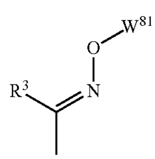

(G-5)

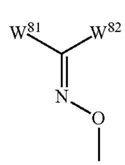

-continued (G-6)

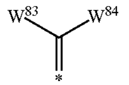

(wherein $R^3$ represents a hydrogen atom or an alkyl group having 1 to 20 carbon atoms, the alkyl group being linear or branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, or —C≡C—;

$W^{81}$ represents a group that has at least one aromatic group and has 5 to 30 carbon atoms and that may be unsubstituted or substituted by at least one $L^1$;

$W^{82}$ represents a hydrogen atom or an alkyl group having 1 to 20 carbon atoms, the alkyl group being linear or branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—; the meaning of $W^{82}$ may be the same as the meaning of $W^{81}$; $W^{81}$ and $W^{82}$ may be bonded together to form a single ring structure; alternatively, $W^{82}$ represents the following group:

[Chem. 5]

$$P^{W82} \text{—}\left(S^{W82}\text{—}X^{W82}\right)_{n^{W82}}$$

(wherein the meaning of $P^{W82}$ is the same as the meaning of $P^{11}$; the meaning of $S^{W82}$ is the same as the meaning of $S^{11}$; the meaning of $X^{W82}$ is the same as the meaning of $X^{11}$; and the meaning of $n^{W82}$ is the same as the meaning of m11); $W^{83}$ and $W^{84}$ are each independently a halogen atom, a cyano group, a hydroxy group, a nitro group, a carboxyl group, a carbamoyloxy group, an amino group, a sulfamoyl group, a group having at least one aromatic group and having 5 to 30 carbon atoms, an alkyl group having 1 to 20 carbon atoms, a cycloalkyl group having 3 to 20 carbon atoms, an alkenyl group having 2 to 20 carbon atoms, a cycloalkenyl group having 3 to 20 carbon atoms, an alkoxy group having 1 to 20 carbon atoms, an acyloxy group having 2 to 20 carbon atoms, or an alkylcarbonyloxy group having 2 to 20 carbon atoms, one —$CH_2$— group or two or more nonadjacent —$CH_2$— groups in each of the alkyl group, the cycloalkyl group, the alkenyl group, the cycloalkenyl group, the alkoxy group, the acyloxy group, and the alkylcarbonyloxy group being each independently optionally replaced by —O—, —S—, —CO—, —COO—, —OCO—, —CO—S—, —S—CO—, —O—CO—O—, —CO—NH—, —NH—CO—, or —C≡C—; when M is selected from formula (M-1) to formula (M-10), G is selected from formula (G-1) to formula (G-5); when M represents formula (M-11), G represents formula (G-6);

$L^1$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or an alkyl group having 1 to 20 carbon atoms, the alkyl group being linear or branched, any hydrogen atom in the alkyl group being optionally replaced by a fluorine atom, one —$CH_2$— group or two or more nonadjacent —$CH_2$— groups in the alkyl group being each independently optionally replaced by a group selected from —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, and —C≡C—; when a plurality of $L^1$s are present in the compound, they may be the same or different;

j11 represents an integer from 1 to 5; and j12 represents an integer of 1 to 5 while j11+j12 is an integer from 2 to 5); $R^{11}$ and $R^{31}$ each represent a hydrogen atom, a fluorine atom, a chlorine atom, a bromine atom, an iodine atom, a pentafluorosulfuranyl group, a cyano group, a nitro group, an isocyano group, a thioisocyano group, or an alkyl group having 1 to 20 carbon atoms, the alkyl group being linear or branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, or —C≡C—; m11 represents an integer of 0 to 8; and m2 to m7, n2 to n7, 14 to 16, and k6 each independently represent an integer from 0 to 5.)

In general formula (1) to general formula (7), it is preferable that the polymerizable groups $P^{11}$ to $P^{74}$ each represent a group selected from formula (P-1) to formula (P-20) below:

[Chem. 6]

(P-1)

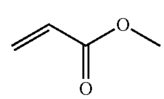

(P-2)

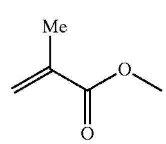

(P-3)

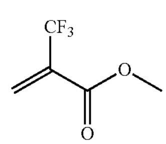

(P-4)

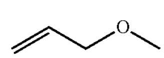

(P-5)

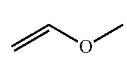

(P-6)

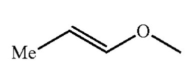

(P-7)

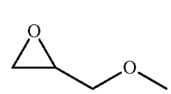

-continued (P-8)

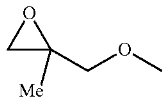

(P-9)

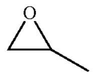

(P-10)

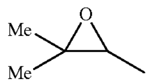

(P-11)

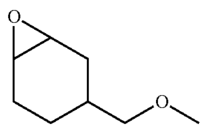

(P-12)

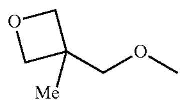

(P-13)

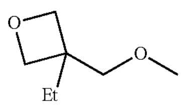

(P-14)

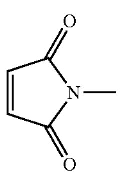

(P-15)

HS—

(P-16)

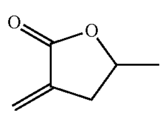

(P-17)

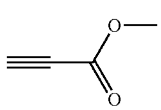

(P-18)

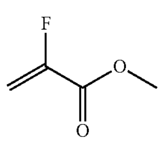

(P-19)

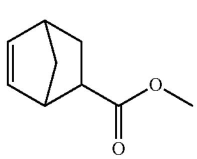

(P-20)

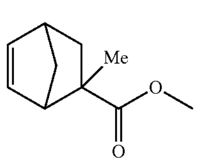

These polymerizable groups are polymerized by radical polymerization, radical addition polymerization, cationic polymerization, or anionic polymerization. In particular, when the polymerization method is UV polymerization, formula (P-1), formula (P-2), formula (P-3), formula (P-4), formula (P-5), formula (P-7), formula (P-11), formula (P-13), formula (P-15), or formula (P-18) is preferable, and formula (P-1), formula (P-2), formula (P-7), formula (P-11), or formula (P-13) is more preferable. Formula (P-1), formula (P-2), or formula (P-3) is still more preferable, and formula (P-1) or formula (P-2) is particularly preferable.

In general formula (1) to general formula (7), $S^{11}$ to $S^{72}$ each represent a spacer group or a single bond. When a plurality of $S^{11}$s to $S^{72}$s are present, they may be the same or different. Preferably, the spacer group represents an alkylene group which has 1 to 20 carbon atoms and in which one —$CH_2$— group or two or more nonadjacent —$CH_2$— groups may be each independently replaced by —O—, —COO—, —OCO—, —OCO—O—, —CO—NH—, —NH—CO—, —CH═CH—, —C≡C—, or formula (S-1) below:

[Chem. 7]

(S-1)

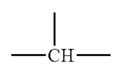

When a plurality of S's are present, they may be the same or different and more preferably each independently represent a single bond or an alkylene group which has 1 to 10 carbon atoms and in which one —$CH_2$— group or two or more nonadjacent —$CH_2$— groups may be each independently replaced by —O—, —COO—, or —OCO—, in terms of availability of raw materials and ease of synthesis. Still more preferably, $S^{11}$ to $S^{72}$ each independently represent a single bond or an alkylene group having 1 to 10 carbon atoms. When a plurality of S's are present, they may be the same or different and particularly preferably each independently represent an alkylene group having 1 to 8 carbon atoms.

In general formula (1) to general formula (7), $X^{11}$ to $X^{72}$ each represent —O—, —S—, —$OCH_2$—, —$CH_2O$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—COO—, —CH═CH—OCO—, —COO—CH═CH—, —OCO—CH═CH—, —COO—$CH_2CH_2$—, —OCO—$CH_2CH_2$—, —$CH_2CH_2$—COO—, —$CH_2CH_2$—OCO—, —COO—$CH_2$—, —OCO—$CH_2$, —$CH_2$—COO—, —$CH_2$—OCO—, —CH═CH—, —N═N—, —CH═N—N═CH—, —CF═CF—, —C≡C—, or a single bond (provided that each P—(S—X)— bond contains no —O—O—). When a plurality of $X^{11}$s to $X^{72}$s are present, they may be the same or different. When a plurality of $X^{11}$s to $X^{72}$s are present, they may be the same or different, preferably each independently represent —O—, —S—, —OCH—, —$CH_2O$—, —COO—, —OCO—, —CO—S—, —S—CO—, —O—CO—O—, —CO—NH—, —NH—CO—, —COO—$CH_2CH_2$—, —OCO—$CH_2CH_2$—, —$CH_2CH_2$—COO—, —$CH_2CH_2$—OCO—, or a single bond, and more preferably each independently represent —O—, —$OCH_2$—, —$CH_2O$—, —COO—, —OCO—, —COO—$CH_2CH_2$—, —OCO—$CH_2CH_2$—, —$CH_2CH_2$—COO—, —$CH_2CH_2$—OCO—, or a single bond, in terms of availability of raw materials and ease of synthesis. When a plurality of $X^{11}$s to $X^{72}$s are present, they may be the same or different and particularly preferably each independently represent —O—, —COO—, —OCO—, or a single bond.

In general formula (1) to general formula (7), $A^{11}$ and $A^{12}$ each independently represent a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, each or which may be unsubstituted or substituted by at least one $L^1$. When a plurality of $A^{11}$s and/or $A^{12}$s are present, they may be the same or different. In terms of availability of raw materials and ease of synthesis, $A^{11}$ and $A^{12}$ preferably each independently represent a 1,4-phenylene group, a 1,4-cyclohexylene group, or naphthalene-2,6-diyl that may be unsubstituted or substituted by at least one $L^1$, more preferably each independently represent a group selected from formula (A-1) to formula (A-11) below:

[Chem. 8]

(A-1)

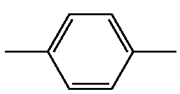

(A-2)

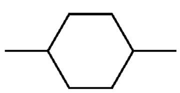

(A-3)

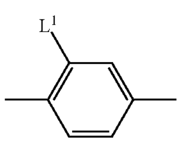

(A-4)

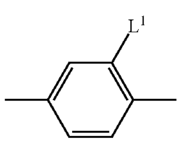

(A-5)

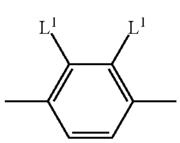

(A-6)

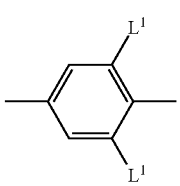

(A-7)

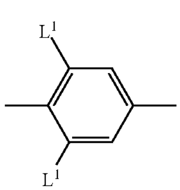

-continued (A-8)

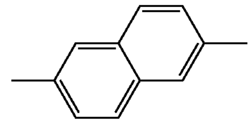

(A-9)

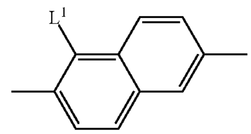

(A-10)

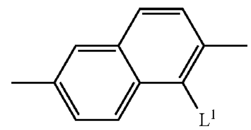

(A-11)

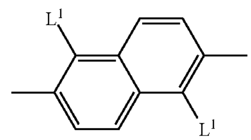

still more preferably each independently represent a group selected from formula (A-1) to formula (A-8), and particularly preferably each independently represent a group selected from formula (A-1) to formula (A-4).

In general formula (1) to general formula (7), $Z^{11}$ and $Z^{12}$ each independently represent —O—, —S—, $—OCH_2—$, $—CH_2O—$, $—CH_2CH_2—$, —CO—, —COO—, —OCO—, —CO—S—, —S—CO—, —O—CO—O—, —CO—NH—, —NH—CO—, —OCO—NH—, —NH—COO—, —NH—CO—NH—, —NH—O—, —O—NH—, $—SCH_2—$, $—CH_2S—$, $—CF_2O—$, $—OCF_2—$, $—CF_2S—$, $—SCF_2—$, —CH═CH—COO—, —CH═CH—OCO—, —COO—CH═CH—, —OCO—CH═CH—, $—COO—CH_2CH_2—$, $—OCO—CH_2CH_2—$, $—CH_2CH_2—COO—$, $—CH_2CH_2—OCO—$, $—COO—CH_2—$, $—OCO—CH_2—$, $—CH_2—COO—$, $—CH_2—OCO—$, —CH═CH—, —N═N—, —CH═N—, —N═CH—, —CH═N—N═CH—, —CF═CF—, —C≡C—, or a single bond. When a plurality of $Z^{11}$s and/or $Z^{12}$s are present, they may be the same or different.

In terms of the liquid crystallinity of the compound, availability of raw materials, and ease of synthesis, $Z^{11}$ and $Z^{12}$ preferably each independently represent a single bond, $—OCH_2—$, $—CH_2O—$, —COO—, —OCO—, $—CF_2O—$, $—OCF_2—$, $—CH_2CH_2—$, $—CF_2CF_2—$, —CH═CH—COO—, —CH═CH—OCO—, —COO—CH═CH—, —OCO—CH═CH—, $—COO—CH_2CH_2—$, $—OCO—CH_2CH_2—$, $—CH_2CH_2—COO—$, $—CH_2CH_2—OCO—$, —CH═CH—, —CF═CF—, —C≡C—, or a single bond, more preferably each independently represent $—OCH_2—$, $—CH_2O—$, $—CH_2CH_2—$, —COO—, —OCO—, $—COO—CH_2CH_2—$, $—OCO—CH_2CH_2—$, $—CH_2CH_2—COO—$, $—CH_2CH_2—OCO—$, —CH═CH—, —C≡C—, or a single bond, still more preferably each independently represent $—CH_2CH_2—$, —COO—, —OCO—, $—COO—CH_2CH_2—$, $—OCO—CH_2CH—$, $—CH_2CH_2—COO—$, $—CH_2CH_2—OCO—$, or a single bond, and particularly preferably each independently represent $—CH_2CH_2—$, —COO—, —OCO—, or a single bond.

In general formula (1) to general formula (7), M represents a group selected from formula (M-1) to formula (M-11) below:

[Chem. 9]

(M-1)

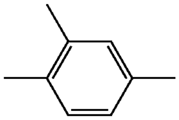

(M-2)

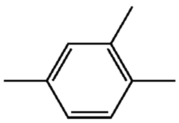

(M-3)

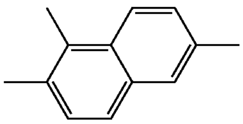

(M-4)

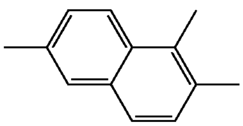

(M-5)

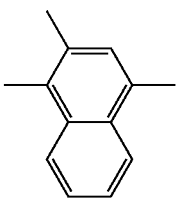

(M-6)

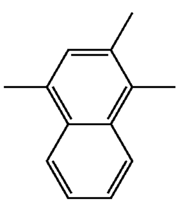

(M-7)

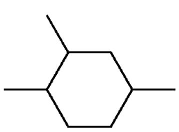

(M-8)

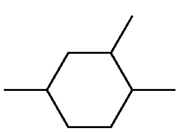

(M-9)

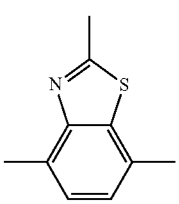

-continued (M-10)

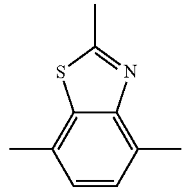

(M-11)

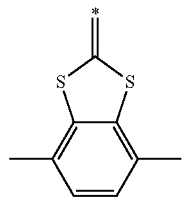

These groups may be unsubstituted or substituted by at least one $L^1$. In terms of availability of raw materials and ease of synthesis, M preferably represents a group selected from formula (M-1) and formula (M-2) that may be each independently unsubstituted or substituted by at least one $L^1$ and formula (M-3) to formula (M-6) that are unsubstituted, more preferably represents a group selected from formula (M-1) and formula (M-2) that may be unsubstituted or substituted by at least one $L^1$, and particularly preferably represents a group selected from formula (M-1) and formula (M-2) that are unsubstituted.

In general formula (1) to general formula (7), $R^{11}$ and $R^{31}$ each represent a hydrogen atom, a fluorine atom, a chlorine atom, a bromine atom, an iodine atom, a pentafluorosulfuranyl group, a cyano group, a nitro group, an isocyano group, a thioisocyano group, or a linear or branched alkyl group which has 1 to 20 carbon atoms and in which one —$CH_2$— group or two or more nonadjacent —$CH_2$— groups may be each independently replaced by —O—, —S—, —CO—, —COO—, —OCO—, —CO—S—, —S—CO—, —O—CO—O—, —CO—NH—, —NH—CO—, or —C≡C—, and any hydrogen atom in the alkyl group may be replaced by a fluorine atom. In terms of liquid crystallinity and ease of synthesis, $R^1$ preferably represents a hydrogen atom, a fluorine atom, a chlorine atom, a cyano group, or a linear or branched alkyl group which has 1 to 12 carbon atoms and in which one —$CH_2$— group or two or more nonadjacent —$CH_2$— groups may be each independently replaced by —O—, —COO—, —OCO—, or —O—CO—O—. $R^1$ more preferably represents a hydrogen atom, a fluorine atom, a chlorine atom, a cyano group, a linear alkyl group having 1 to 12 carbon atoms, or a linear alkoxy group having 1 to 12 carbon atoms and particularly preferably represents a linear alkyl group having 1 to 12 carbon atoms or a linear alkoxy group having 1 to 12 carbon atoms.

In general formula (1) to general formula (7), G represents a group selected from formula (G-1) to formula (G-6):

[Chem. 10]

(G-1)

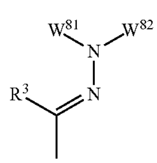

-continued (G-2)

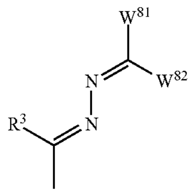

(G-3)

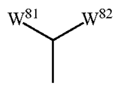

(G-4)

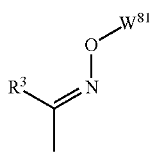

(G-5)

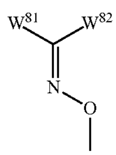

(G-6)

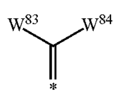

In these formulas, $R^3$ represents a hydrogen atom or an alkyl group having 1 to 20 carbon atoms. The alkyl group may be linear or branched, and any hydrogen atom in the alkyl group may be replaced by a fluorine atom. One —$CH_2$— group or two or more nonadjacent —$CH_2$— groups in the alkyl group may be each independently replaced by —O—, —S—, —CO—, —COO—, —OCO—, —CO—S—, —S—CO—, —O—CO—O—, —CO—NH—, —NH—CO—, or —C≡C—. $W^{81}$ represents a group that has at least one aromatic group and has 5 to 30 carbon atoms and that may be unsubstituted or substituted by at least one $L^1$. $W^{82}$ represents a hydrogen atom or an alkyl group having 1 to 20 carbon atoms, and the alkyl group may be linear or branched. Any hydrogen atom in the alkyl group may be replaced by a fluorine atom, and one —$CH_2$— group or two or more nonadjacent —$CH_2$— group in the alkyl group may be each independently replaced by —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—. The meaning of $W^{82}$ may be the same as the meaning of $W^{81}$, and $W^{81}$ and $W^{82}$ may together form a ring structure. Alternatively, $W^{82}$ represents the following group:

[Chem. 11]

$$P^{W82}\text{—}(S^{W82}\text{—}X^{W82})_{nW82}$$

(wherein the meaning of $P^{W82}$ is the same as the meaning of $P^{11}$; the meaning of $S^{W82}$ is the same as the meaning of $S^{11}$; the meaning of $X^{W82}$ is the same as the meaning of $X^{11}$; and the meaning of $n^{W82}$ is the same as the meaning of m11).

The aromatic group included in $W^{81}$ may be an aromatic hydrocarbon group or a heteroaromatic group, and $W^{81}$ may include both of them. These aromatic groups may be bonded through a single bond or a linking group (—OCO—, —COO—, —CO—, or —O—) or may form a condensed ring. $W^{81}$ may include, in addition to the aromatic group, an acyclic structure and/or a cyclic structure other than the aromatic group. In terms of availability of raw materials and ease of synthesis, the aromatic group included in $W^{81}$ is one of formula (W-1) to formula (W-19) below that may be unsubstituted or substituted by at least one $L^1$:

[Chem. 12]

(W-1)

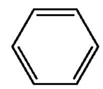

(W-2)

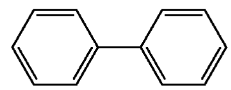

(W-3)

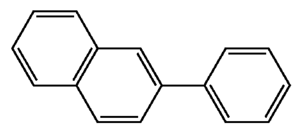

(W-4)

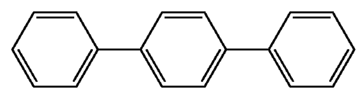

(W-5)

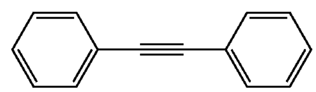

(W-6)

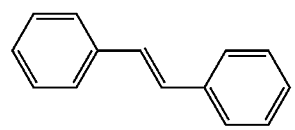

(W-7)

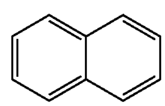

(W-8)

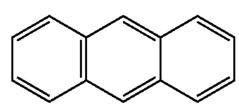

(W-9)

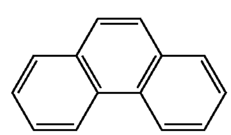

(W-10)

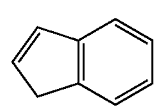

(W-11)

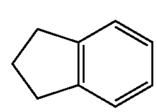

-continued (W-12)

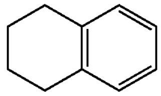

(W-13)

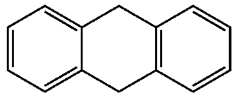

(W-14)

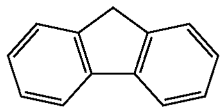

(W-15)

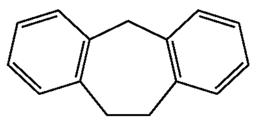

(W-16)

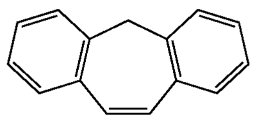

(W-17)

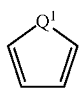

(W-18)

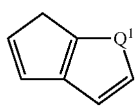

(W-19)

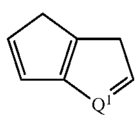

(In the above formulas, these groups may have a bond at any position, and any two or more aromatic groups selected from these groups may form a group connected through a single bond. $Q^1$ represents —O—, —S—, or —$NR^4$— (wherein $R^4$ represents a hydrogen atom or an alkyl group having 1 to 8 carbon atoms), or —CO—. In these aromatic groups, —CH═ groups may be each independently replaced by —N═, and —$CH_2$— groups may be each independently replaced by —O—, —S—, —$NR^4$— (wherein $R^4$ represents a hydrogen atom or an alkyl group having 1 to 8 carbon atoms) or —CO—. However, these groups include no —O—O— bond. The group represented by formula (W-1) is preferably a group selected from formula (W-1-1) to formula (W-1-8) below that may be unsubstituted or substituted by at least one $L^1$:

[Chem. 13]

(W-1-1)

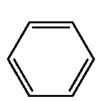

(W-1-2)

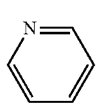

-continued (W-1-3)

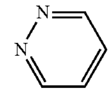

(W-1-4)

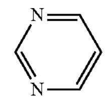

(W-1-5)

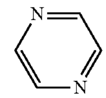

(W-1-6)

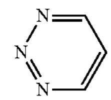

(W-1-7)

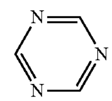

(W-1-8)

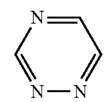

(wherein these groups may have a bond at any position). The group represented by formula (W-7) is preferably a group selected from formula (W-7-1) to formula (W-7-7) below that may be unsubstituted or substituted by at least one $L^1$:

[Chem. 14]

(W-7-1)

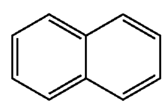

(W-7-2)

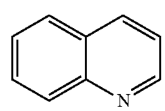

(W-7-3)

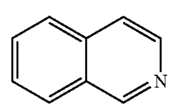

(W-7-4)

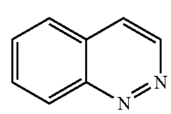

(W-7-5)

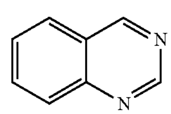

(W-7-6)

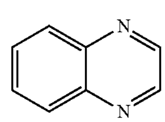

-continued (W-7-7)

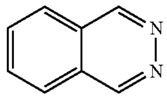

(wherein these groups may have a bona at any position). The group represented by formula (W-10) is preferably a group selected from formula (W-10-1) to formula (W-10-8) below that may be unsubstituted or substituted by at least one $L^1$:

[Chem. 15]

(W-10-1)

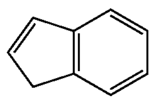

(W-10-2)

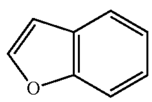

(W-10-3)

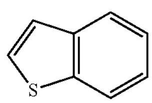

(W-10-4)

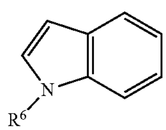

(W-10-5)

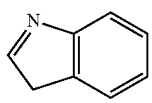

(W-10-6)

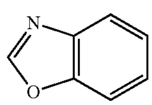

(W-10-7)

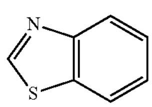

(W-10-8)

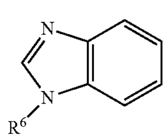

(wherein these groups may have a bond at any position, and $R^6$ represents a hydrogen atom or an alkyl group having 1 to 8 carbon atoms). The group represented by formula (W-11) is preferably a group selected from formula (W-11-1) to formula (W-1-13) below that may be unsubstituted or substituted by at least one $L^1$:

[Chem, 16]

(W-11-1)

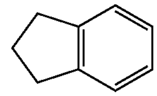

(W-11-2)

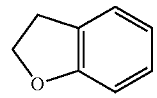

(W-11-3)

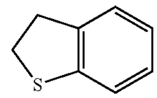

(W-11-4)

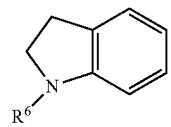

(W-11-5)

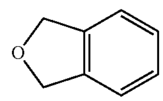

(W-11-6)

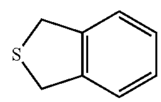

(W-11-7)

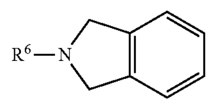

(W-11-8)

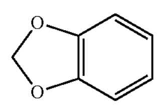

(W-11-9)

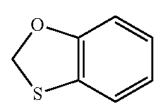

(W-11-10)

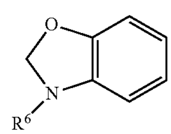

(W-11-11)

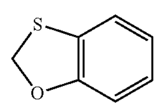

(W-11-12)

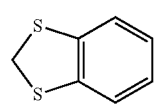

(W-11-13)

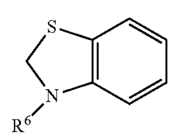

(wherein these groups may have a bond at any position, and $R^6$ represents a hydrogen atom or an alkyl group having 1 to 8 carbon atoms). The group represented by formula (W-12)

is preferably a group selected from formula (W-12-1) to formula (W-12-19) below that may be unsubstituted or substituted by at least one $L^1$:

[Chem. 17]

(W-12-1)

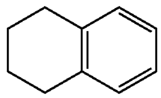

(W-12-2)

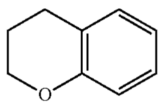

(W-12-3)

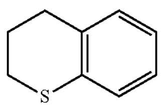

(W-12-4)

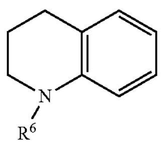

(W-12-5)

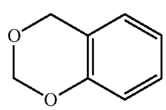

(W-12-6)

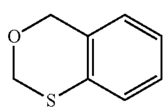

(W-12-7)

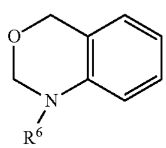

(W-12-8)

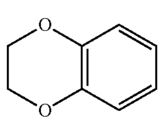

(W-12-9)

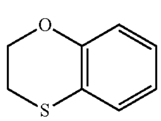

(W-12-10)

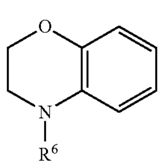

(W-12-11)

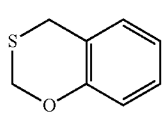

-continued (W-12-12)

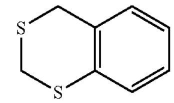

(W-12-13)

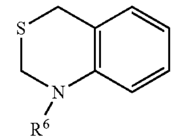

(W-12-14)

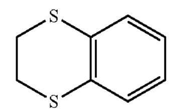

(W-12-15)

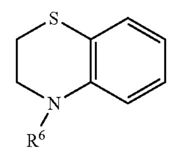

(W-12-16)

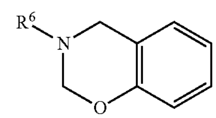

(W-12-17)

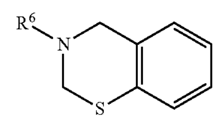

(W-12-18)

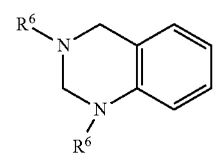

(W-12-19)

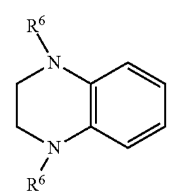

(wherein these groups may have a bond at any position; $R^6$ represents a hydrogen atom or an alkyl group having 1 to 8 carbon atoms; and, when a plurality of $R^6$s are present, they may be the same or different). The group represented by formula (W-13) is preferably a group selected from formula (W-13-1) to formula (W-13-10) below that may be unsubstituted or substituted by at least one $L^1$:

[Chem. 18]

(W-13-1)

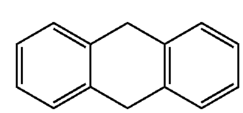

-continued (W-13-2)

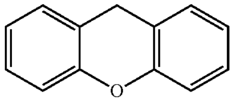

(W-13-3)

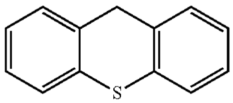

(W-13-4)

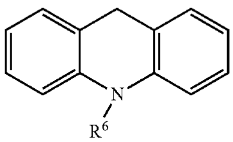

(W-13-5)

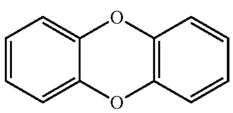

(W-13-6)

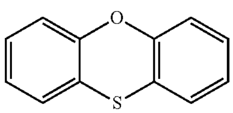

(W-13-7)

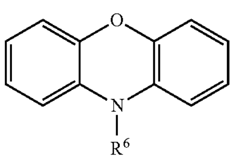

(W-13-8)

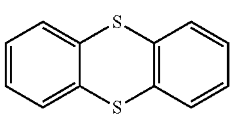

(W-13-9)

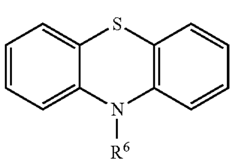

(W-13-10)

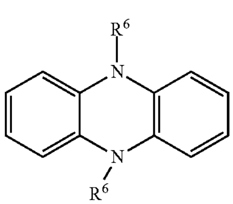

(wherein these groups may have a bond at any position; $R^6$ represents a hydrogen atom or an alkyl group having 1 to 8 carbon atoms; and, when a plurality of $R^6$s are present, they may be the same or different). The group represented by formula (W-14) is preferably a group selected from formula (W-14-1) to formula (W-14-4) below that may be unsubstituted or substituted by at least one $L^1$:

[Chem. 19]

(W-14-1)

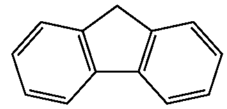

(W-14-2)

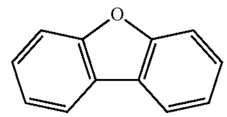

(W-14-3)

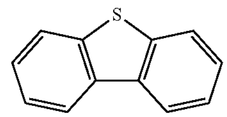

(W-14-4)

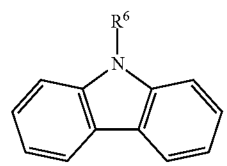

(wherein these groups may have a bond at any position, and $R^6$ represents a hydrogen atom or an alkyl group having 1 to 8 carbon atoms). The group represented by formula (W-15) is preferably a group selected from formula (W-15-1) to formula (W-15-18) below that may be unsubstituted or substituted by at least one $L^1$:

[Chem. 20]

(W-15-1)

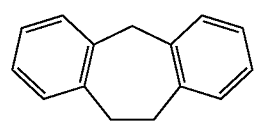

(W-15-2)

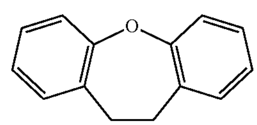

(W-15-3)

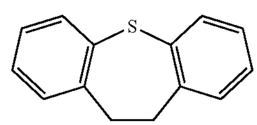

(W-15-4)

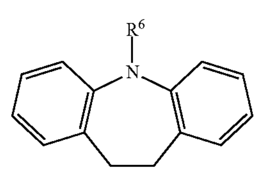

(W-15-5)

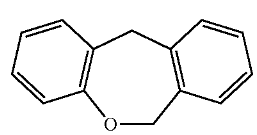

(W-15-6)

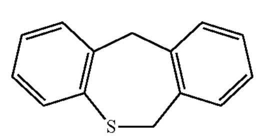

-continued (W-15-7)

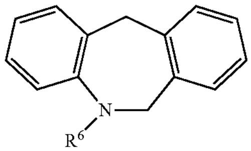

(W-15-8)

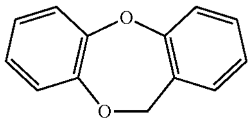

(W-15-11)

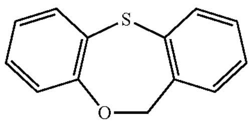

(W-15-12)

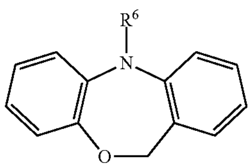

(W-15-13)

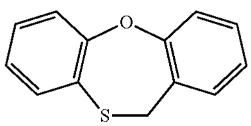

(W-15-14)

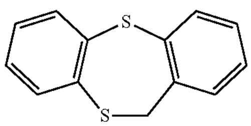

(W-15-15)

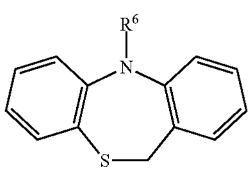

(W-15-16)

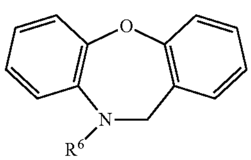

(W-15-17)

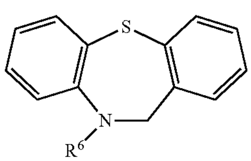

(W-15-18)

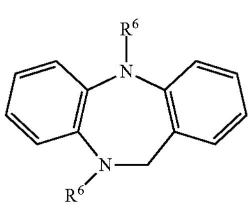

(wherein these groups may have a bond at any position, and $R^6$ represents a hydrogen atom or an alkyl group having 1 to 8 carbon atoms). The group represented by formula (W-16) is preferably a group selected from formula (W-16-1) to formula (W-16-4) below that may be unsubstituted or substituted by at least one $L^1$:

[Chem. 21]

(W-16-1)

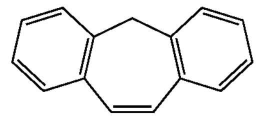

(W-16-2)

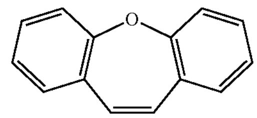

(W-16-3)

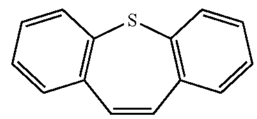

(W-16-4)

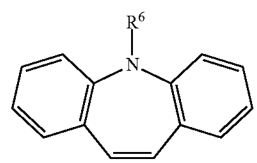

(wherein these groups may have a bond at any position, and $R^6$ represents a hydrogen atom or an alkyl group having 1 to 8 carbon atoms). The group represented by formula (W-17) is preferably a group selected from formula (W-17-1) to formula (W-17-6) below that may be unsubstituted or substituted by at least one $L^1$:

[Chem. 22]

(W-17-1)

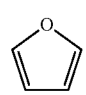

(W-17-2)

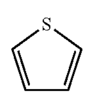

(W-17-3)

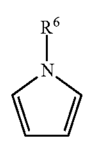

(W-17-4)

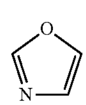

(W-17-5)

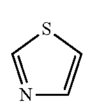

-continued (W-17-6)

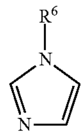

(wherein these groups may have a bond at any position, and $R^6$ represents a hydrogen atom or an alkyl group having 1 to 8 carbon atoms). The group represented by formula (W-18) is preferably a group selected from formula (W-18-1) to formula (W-18-6) below that may be unsubstituted or substituted by at least one $L^1$:

[Chem. 23]

(W-18-1)

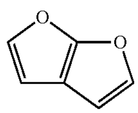

(W-18-2)

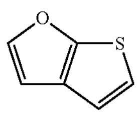

(W-18-3)

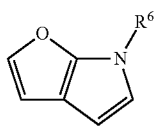

(W-18-4)

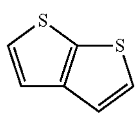

(W-18-5)

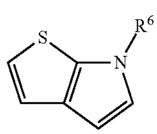

(W-18-6)

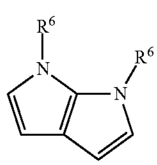

(wherein these groups may have a bond at any position; $R^6$ represents a hydrogen atom or an alkyl group having 1 to 8 carbon atoms; and, when a plurality of $R^6$s are present, they may be the same or different). The group represented by formula (W-19) is preferably a group selected from formula (W-19-1) to formula (W-19-9) below that may be unsubstituted or substituted by at least one $L^1$:

[Chem. 24]

(W-19-1)

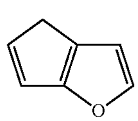

-continued (W-19-2)

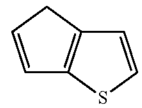

(W-19-3)

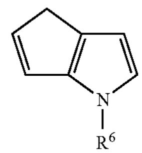

(W-19-4)

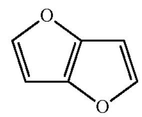

(W-19-5)

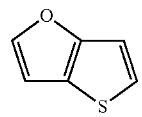

(W-19-6)

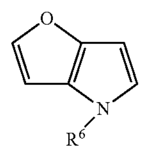

(W-19-7)

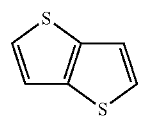

(W-19-8)

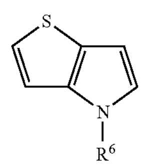

(W-19-9)

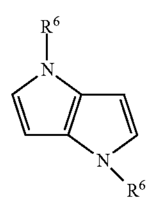

(wherein these groups may have a bond at any position; $R^6$ represents a hydrogen atom or an alkyl group having 1 to 8 carbon atoms; and, when a plurality of $R^6$s are present, they may be the same or different). The aromatic group included in $W^{81}$ is more preferably a group selected from formula (W-1-1), formula (W-7-1), formula (W-7-2), formula (W-7-7), formula (W-8), formula (W-10-6), formula (W-10-7), formula (W-10-8), formula (W-11-8), formula (W-11-9), formula (W-11-10), formula (W-11-11), formula (W-11-12), and formula (W-11-13) that may be unsubstituted or substituted by at least one $L^1$ and is particularly preferably a group selected from formula (W-1-1), formula (W-7-1), formula (W-7-2), formula (W-7-7), formula (W-10-6), formula (W-10-7), and formula (W-10-8) that may be unsubstituted or substituted by at least one $L^1$. Particularly preferably, $W^{81}$ is a group selected from formula (W-a-1) to formula (W-a-6) below:

[Chem. 25]

(W-a-1)

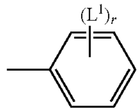

(W-a-2)

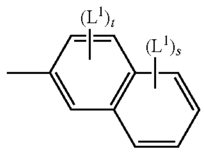

(W-a-3)

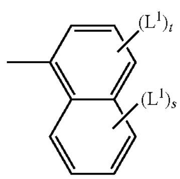

(W-a-4)

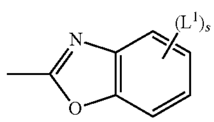

(W-a-5)

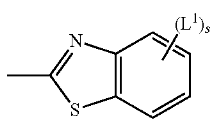

(W-a-6)

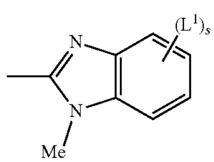

(wherein r represents an integer from 0 to 5; s represents an integer from 0 to 4; and t represents an integer from 0 to 3).

$W^{82}$ represents a hydrogen atom or a linear or branched alkyl group which has 1 to 20 carbon atoms and in which one —$CH_2$— group or two or more nonadjacent —$CH_2$— groups may be each independently replaced by —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, and any hydrogen atom in the alkyl group may be replaced by a fluorine atom. The meaning of $W^{82}$ may be the same as the meaning of $W^{81}$, and $W^{81}$ and $W^{82}$ may together form a ring structure. Alternatively, $W^{82}$ represents the following group:

[Chem. 26]

$$P^{W82}\text{—}(S^{W82}\text{—}X^{W82})_{n^{W82}}$$

(wherein the meaning of $P^{W82}$ is the same as the meaning of $P^{11}$; the meaning of $S^{W82}$ is the same as the meaning of $S^{11}$; the meaning of $X^{W82}$ is the same as the meaning of $X^{11}$; and the meaning of $n^{W82}$ is the same as the meaning of m11).

In terms of availability of raw materials and ease of synthesis, $W^{82}$ preferably represents a hydrogen atom or a linear or branched alkyl group which has 1 to 20 carbon atoms, in which any hydrogen atom in the alkyl group may be replaced by a fluorine atom, and in which one —$CH_2$— group or two or more nonadjacent —$CH_2$— groups in the alkyl group may be each independently replaced by —O—, —CO—, —COO—, —OCO—, —CH═CH—COO—, —OCO—CH═CH—, —CH═CH—, —CF═CF—, or —C≡C—, more preferably represents a hydrogen atom or a linear or branched alkyl group having 1 to 20 carbon atoms, and particularly preferably represents a hydrogen atom or a linear alkyl group having 1 to 12 carbon atoms. When the meaning of $W^{82}$ is the same as the meaning of $W^{81}$, $W^{82}$ and $W^{81}$ may be the same or different, and preferred groups for $W^{82}$ are the same as those described for $W^{81}$. When $W^{81}$ and $W^{82}$ together form a ring structure, a ring group represented by —$NW^{81}W^{82}$ is preferably a group selected from formula (W-b-1) to formula (W-b-42) below that may be unsubstituted or substituted by at least one $L^1$:

[Chem. 27]

(W-b-1)

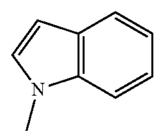

(W-b-2)

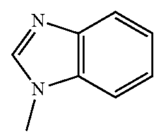

(W-b-3)

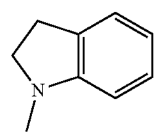

(W-b-4)

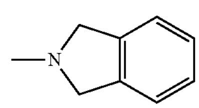

(W-b-5)

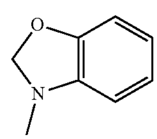

(W-b-6)

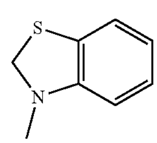

(W-b-7)

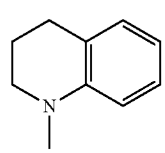

(W-b-8)

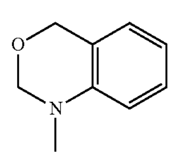

-continued
(W-b-9)
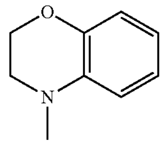
(W-b-9)
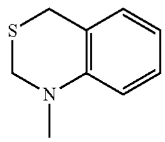
(W-b-10)
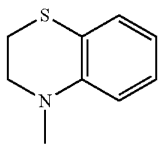
(W-b-11)
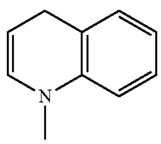
(W-b-11)
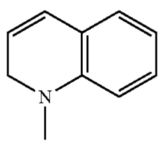
(W-b-12)
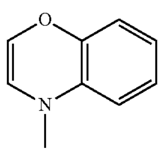
(W-b-13)
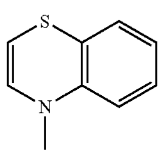
(W-b-14)
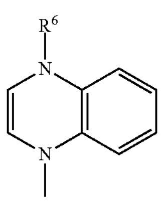
(W-b-15)
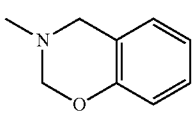
(W-b-16)
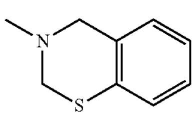
-continued
(W-b-17)
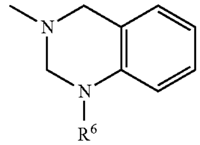
(W-b-18)
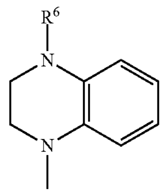
(W-b-19)
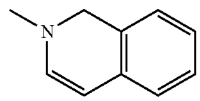
[Chem. 28]
(W-b-20)
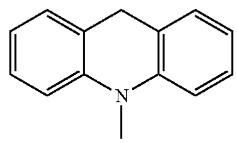
(W-b-21)
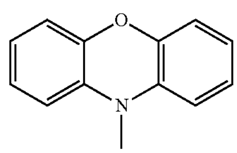
(W-b-22)
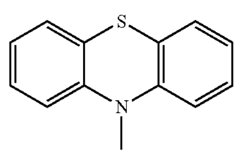
(W-b-23)
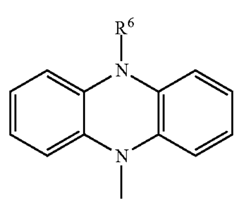
(W-b-24)
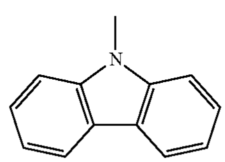
(W-b-25)
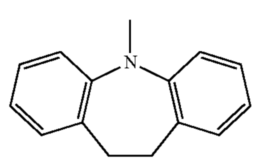

-continued (W-b-26)

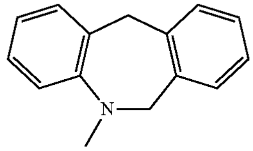

(W-b-27)

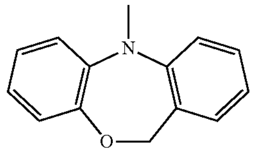

(W-b-28)

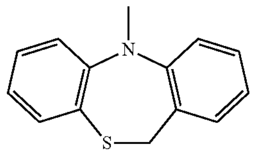

(W-b-29)

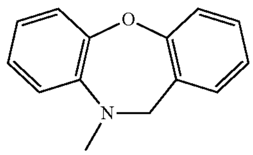

(W-b-30)

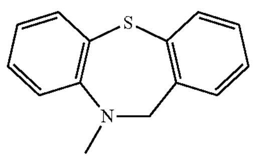

(W-b-31)

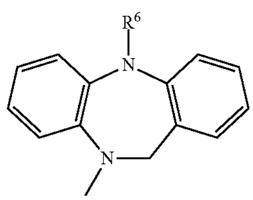

(W-b-32)

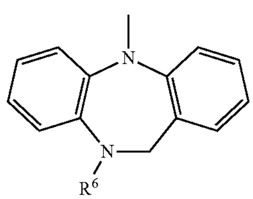

(W-b-33)

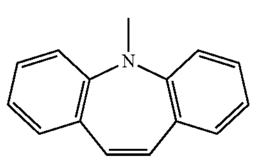

(W-b-34)

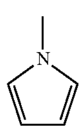

(W-b-35)

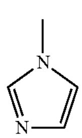

-continued (W-b-36)

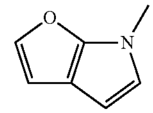

(W-b-37)

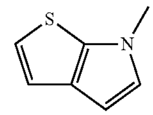

(W-b-38)

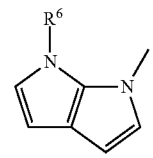

(W-b-39)

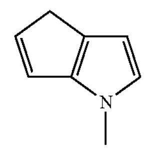

(W-b-40)

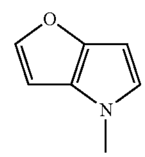

(W-b-41)

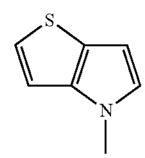

(W-b-42)

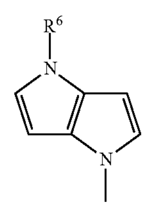

(wherein $R^6$ represents a hydrogen atom or an alkyl group having 1 to 8 carbon atoms). In terms of availability of raw materials and ease of synthesis, the ring group represented by —$NW^{81}W^{82}$ is particularly preferably a group selected from formula (W-b-20), formula (W-b-21), formula (W-b-22), formula (W-b-23), formula (W-b-24), formula (w-b-25), and formula (W-b-33) that may be unsubstituted or substituted by at least one $L^1$.

A ring group represented by $=CW^{81}W^{82}$ is preferably a group selected from formula (W-c-1) to formula (W-c-81) below that may be unsubstituted or substituted by at least one $L^1$.

[Chem. 29]
(W-c-1)
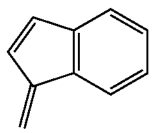
(W-c-2)
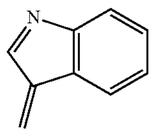
(W-c-3)
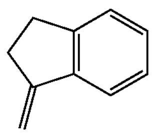
(W-c-4)
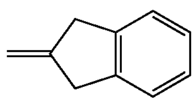
(W-c-5)
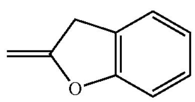
(W-c-6)
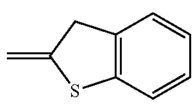
(W-c-7)
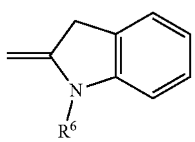
(W-c-8)
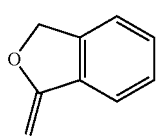
(W-c-9)
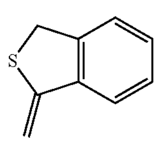
(W-c-9)
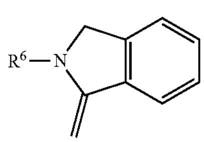
(W-c-10)
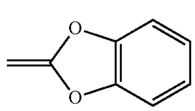
(W-c-11)
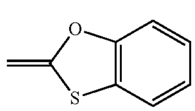
-continued
(W-c-11)
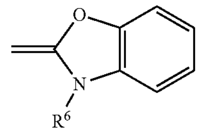
(W-c-12)
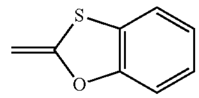
(W-c-13)
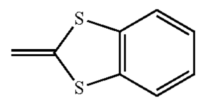
(W-c-14)
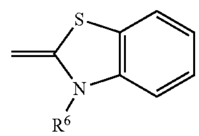
(W-c-15)
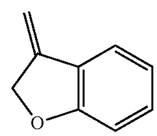
(W-c-16)
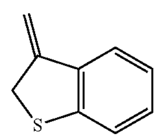
(W-c-17)
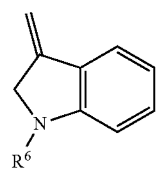
(W-c-18)
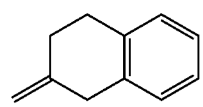
(W-c-19)
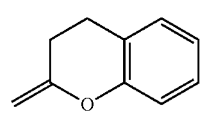
(W-c-20)
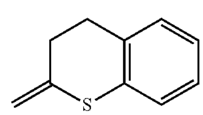
(W-c-21)
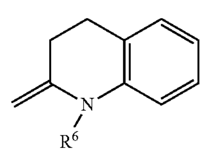
(W-c-22)
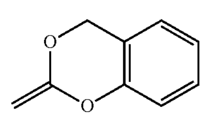

-continued
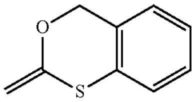
(W-c-23)
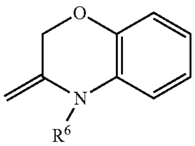
(W-c-24)
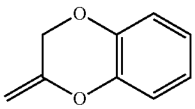
(W-c-25)
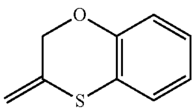
(W-c-26)
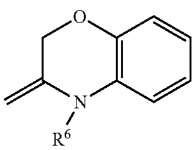
(W-c-27)
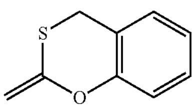
(W-c-28)
[Chem. 30]
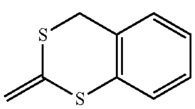
(W-c-29)
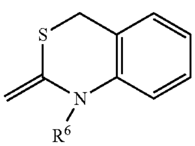
(W-c-30)
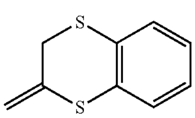
(W-c-31)
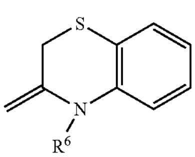
(W-c-32)
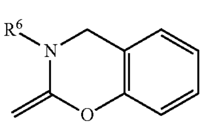
(W-c-33)
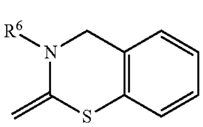
(W-c-34)
-continued
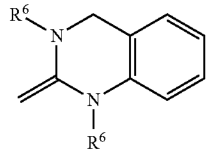
(W-c-35)
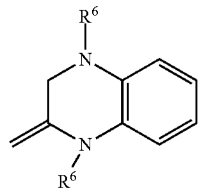
(W-c-36)
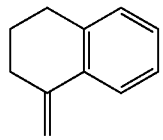
(W-c-37)
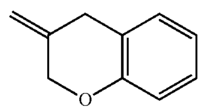
(W-c-38)
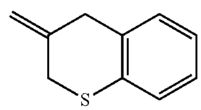
(W-c-39)
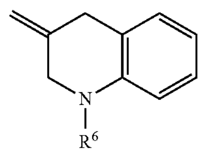
(W-c-40)
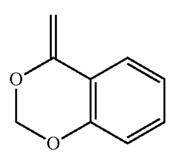
(W-c-41)
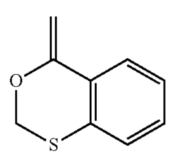
(W-c-42)
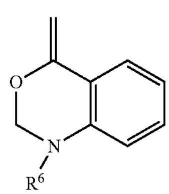
(W-c-43)
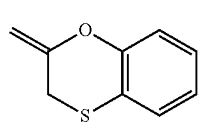
(W-c-44)

-continued
(W-c-45)
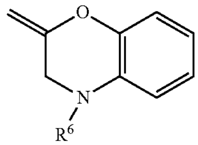
(W-c-46)
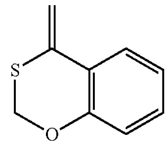
(W-c-47)
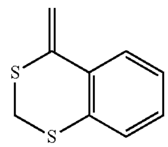
(W-c-48)
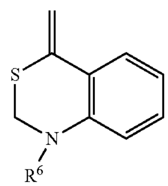
(W-c-49)
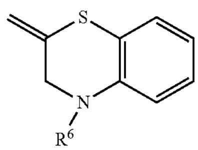
(W-c-50)
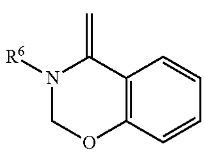
(W-c-51)
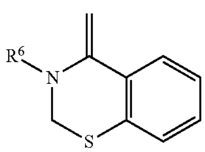
(W-c-52)
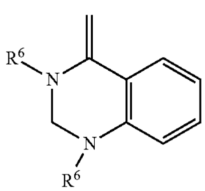
(W-c-53)
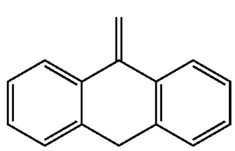
(W-c-54)
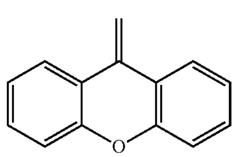
-continued
(W-c-55)
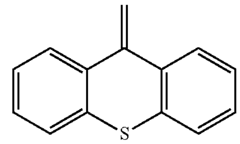
(W-c-56)
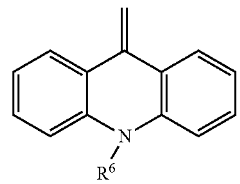
(W-c-57)
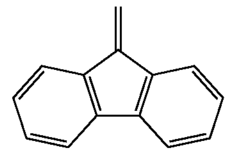
[Chem. 31]
(W-c-58)
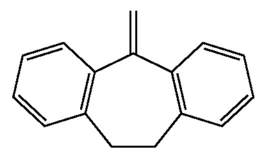
(W-c-59)
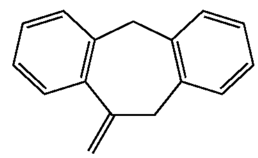
(W-c-60)
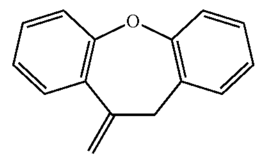
(W-c-61)
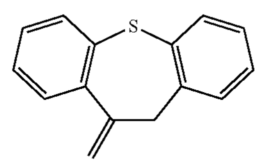
(W-c-62)
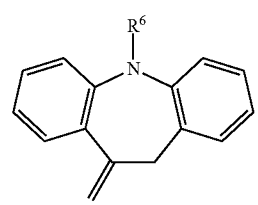
(W-c-63)
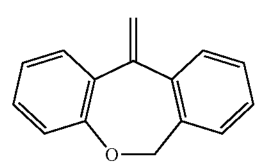

-continued
(W-c-64)
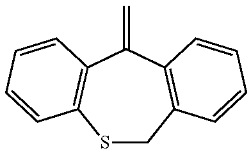
(W-c-65)
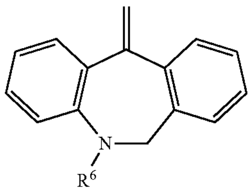
(W-c-66)
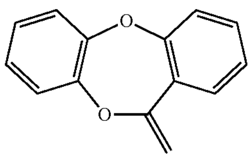
(W-c-67)
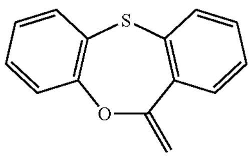
(W-c-68)
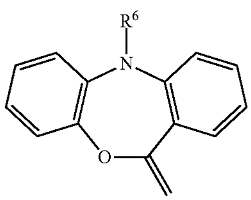
(W-c-69)
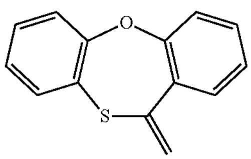
(W-c-70)
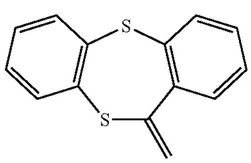
(W-c-71)
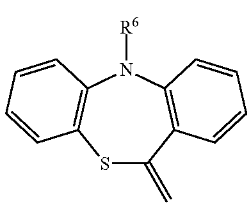
(W-c-72)
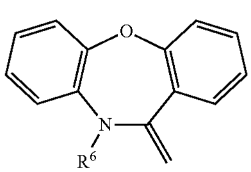
-continued
(W-c-73)
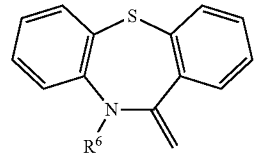
(W-c-74)
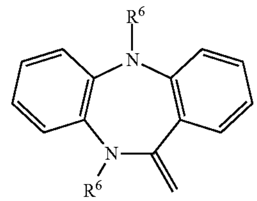
(W-c-75)
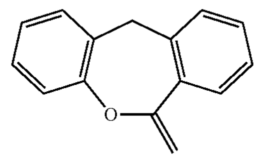
(W-c-76)
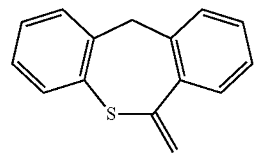
(W-c-77)
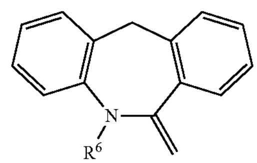
(W-c-78)
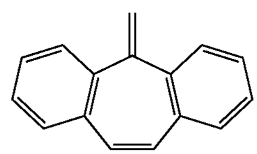
(W-c-79)
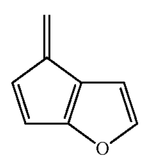
(W-c-80)
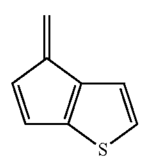
(W-c-81)
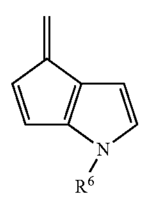
(wherein $R^6$ represents a hydrogen atom or an alkyl group having 1 to 8 carbon atoms, and, when a plurality of $R^6$s are present, they may be the same or different). In terms of availability of raw materials and ease of synthesis, the ring group represented by $=CW^{81}W^{82}$ is particularly preferably a group selected from formula (W-c-11), formula (W-c-12), formula (W-c-13), formula (W-c-14), formula (W-c-53), formula (W-c-54), formula (W-c-55), formula (W-c-56), formula (W-c-57), and formula (W-c-78) that may be unsubstituted or substituted by at least one L.

When $W^{82}$ represents the following group:

[Chem. 32]

$$P^{W82}\text{—}(S^{W82}\text{—}X^{W82})_{n^{W82}},$$

preferred groups for $P^{W82}$ are the same as those described for $P^{11}$, and preferred groups for $S^{W82}$ are the same as those described for $S^{11}$. Preferred groups for $X^{W82}$ are the same as those described for $X^{11}$, and preferred $n^{W82}$ is the same as that described for m11.

The total number of π electrons contained in $W^{81}$ and $W^{82}$ is preferably 4 to 24, in terms of wavelength dispersion properties, storage stability, liquid crystallinity, and ease of synthesis.

$W^{83}$ and $W^{84}$ each independently represent a halogen atom, a cyano group, a hydroxy group, a nitro group, a carboxyl group, a carbamoyloxy group, an amino group, a sulfamoyl group, a group having at least one aromatic group and having 5 to 30 carbon atoms, an alkyl group having 1 to 20 carbon atoms, a cycloalkyl group having 3 to 20 carbon atoms, an alkenyl group having 2 to 20 carbon atoms, a cycloalkenyl group having 3 to 20 carbon atoms, an alkoxy group having 1 to 20 carbon atoms, an acyloxy group having 2 to 20 carbon atoms, or an alkylcarbonyloxy group having 2 to 20 carbon atoms. In the alkyl group, the cycloalkyl group, the alkenyl group, the cycloalkenyl group, the alkoxy group, the acyloxy group, and the alkylcarbonyloxy group, one —$CH_2$— group or two or more nonadjacent —$CH_2$— groups may be each independently replaced by —O—, —S—, —CO—, —COO—, —OCO—, —CO—S—, —S—CO—, —O—CO—O—, —CO—NH—, —NH—CO—, or —C≡C—. $W^{83}$ is more preferably a group selected from a cyano group, a nitro group, a carboxyl group, and alkyl, alkenyl, acyloxy, and alkylcarbonyloxy groups which have 1 to 20 carbon atoms and in which one —$CH_2$— group or two or more nonadjacent —$CH_2$— groups may be each independently replaced by —O—, —S—, —CO—, —COO—, —OCO—, —CO—S—, —S—CO—, —O—CO—O—, —CO—NH—, —NH—CO—, or —C≡C—. $W^{83}$ is particularly preferably a group selected from a cyano group, a carboxyl group, and alkyl, alkenyl, acyloxy, and alkylcarbonyloxy groups which have 1 to 20 carbon atoms and in which one —$CH_2$— group or two or more nonadjacent —$CH_2$— groups may be each independently replaced by —CO—, —COO—, —OCO—, —O—CO—O—, —CO—NH—, —NH—CO—, or —C≡C—. $W^{84}$ is more preferably a group selected from a cyano group, a nitro group, a carboxyl group, and alkyl, alkenyl, acyloxy, and alkylcarbonyloxy groups which have 1 to 20 carbon atoms and in which one —$CH_2$— group or two or more nonadjacent —$CH_2$— groups may be each independently replaced by —O—, —S—, —CO—, —COO—, —OCO—, —CO—S—, —S—CO—, —O—CO—O—, —CO—NH—, —NH—CO—, or —C≡C—. $W^{84}$ is particularly preferably a group selected from a cyano group, a carboxyl group, and alkyl, alkenyl, acyloxy, and alkylcarbonyloxy groups which have 1 to 20 carbon atoms and in which one —$CH_2$— group or two or more nonadjacent —$CH_2$— groups may be each independently replaced by —CO—, —COO—, —OCO—, —O—CO—O—, —CO—NH—, —NH—CO—, or —C≡C—.

$L^1$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or a linear or branched alkyl group which has 1 to 20 carbon atoms and in which one —$CH_2$— group or two or more nonadjacent —$CH_2$— groups may be each independently replaced by —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, and any hydrogen atom in the alkyl group may be replaced by a fluorine atom. In terms of liquid crystallinity and ease of synthesis, $L^1$ preferably represents a fluorine atom, a chlorine atom, a pentafluorosulfuranyl group, a nitro group, a methylamino group, a dimethylamino group, a diethylamino group, a diisopropylamino group, or a linear or branched, alkyl group which has 1 to 20 carbon atoms, in which any hydrogen atom may be replaced by a fluorine atom, and in which one —$CH_2$— group or two or more nonadjacent —$CH_2$— groups may be each independently replaced by a group selected from —O—, —S—, —CO—, —COO—, —OCO—, —O—CO—O—, —CH═CH—, —CF═CF—, and —C≡C—. $L^1$ more preferably represents a fluorine atom, a chlorine atom, or a linear or branched alkyl group which has 1 to 12 carbon atoms, in which any hydrogen atom may be replaced by a fluorine atom, and in which one —$CH_2$— group or two or more nonadjacent —$CH_2$— groups may be each independently replaced by a group selected from —O—, —COO—, and —OCO—. $L^1$ still more preferably represents a fluorine atom, a chlorine atom, or a linear or branched alkyl or alkoxy group which has 1 to 12 carbon atoms and in which any hydrogen atom may be replaced by a fluorine atom. $L^1$ particularly preferably represents a fluorine atom, a chlorine atom, or a linear alkyl or alkoxy group having 1 to 8 carbon atoms.

In general formula (1), m11 represents an integer of 0 to 8. In terms of liquid crystallinity, availability of raw materials, and ease of synthesis, m11 represents preferably an integer from 0 to 4, more preferably an integer from 0 to 2, still more preferably 0 or 1, and particularly preferably 1.

In general formula (2) to general formula (7), m2 to m7 each represent an integer from 0 to 5. In terms of liquid crystallinity, availability of raw materials, and ease of synthesis, m2 to m7 each represent preferably an integer from 0 to 4, more preferably an integer from 0 to 2, still more preferably 0 or 1, and particularly preferably 1.

In general formula (a), j11 and j12 each independently represent an integer from 1 to 5 while j11+j12 represents an integer from 2 to 5. In terms of liquid crystallinity, ease of synthesis, and storage stability, j11 and j12 each independently represent preferably an integer from 1 to 4, more preferably an integer from 1 to 3, and particularly preferably 1 or 2. Preferably, j11+j12 represents an integer from 2 to 4.

Specifically, the compound represented by general formula (1) is preferably compounds represented by the following formula (1-a-1) to formula (1-a-105):

[Chem. 33]
(1-a-1)
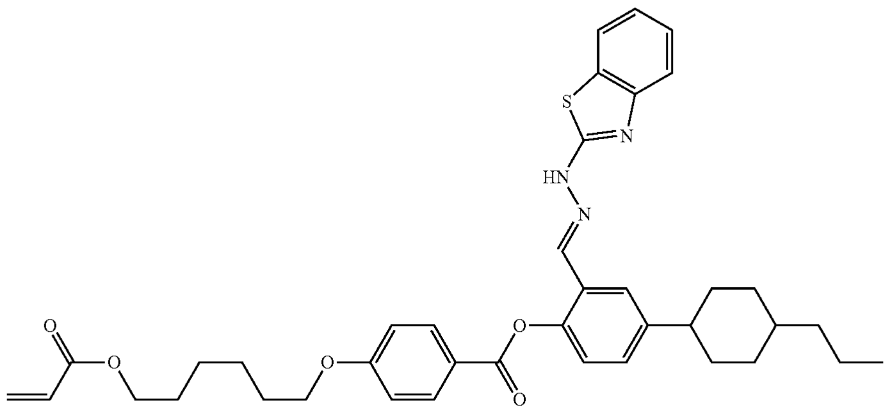
(1-a-2)
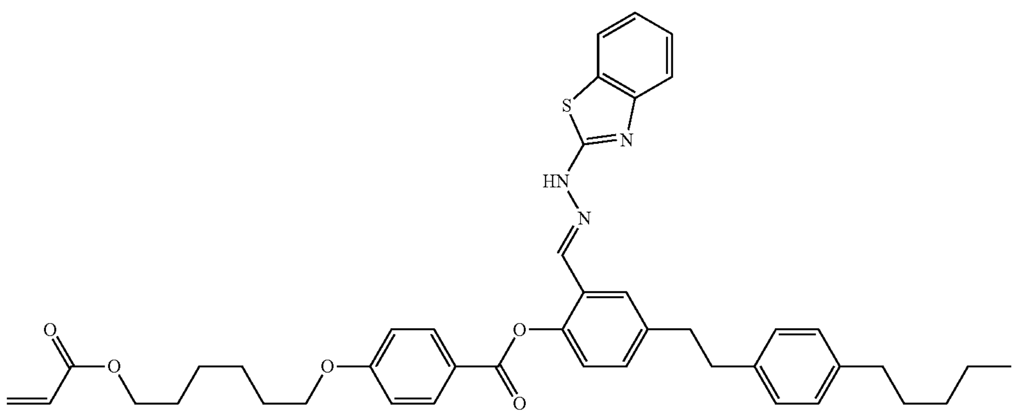
(1-a-3)
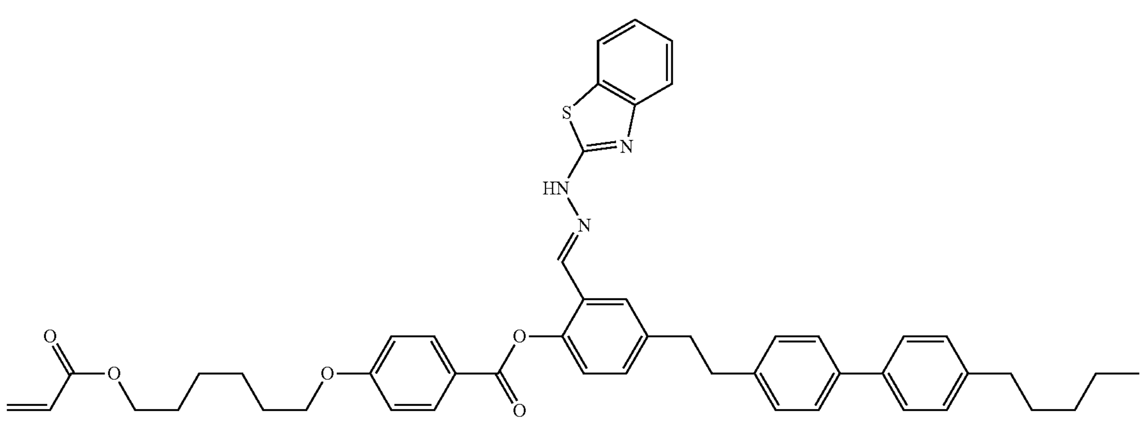

-continued
(1-a-4)
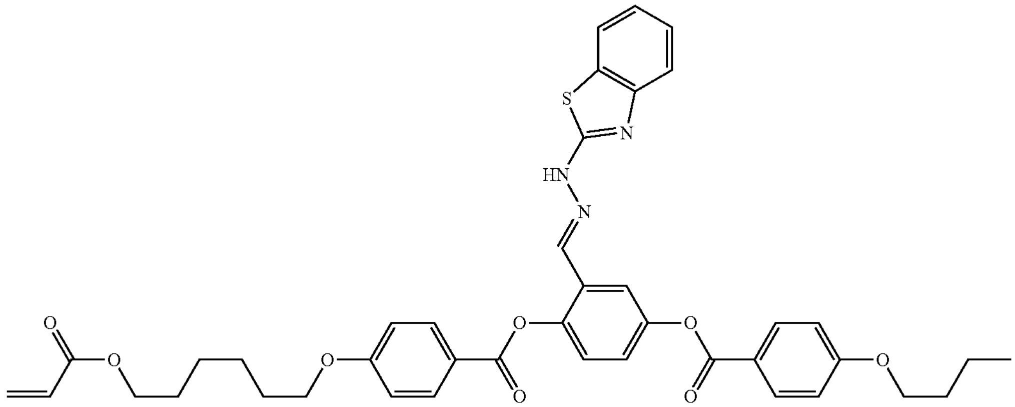
(1-a-5)
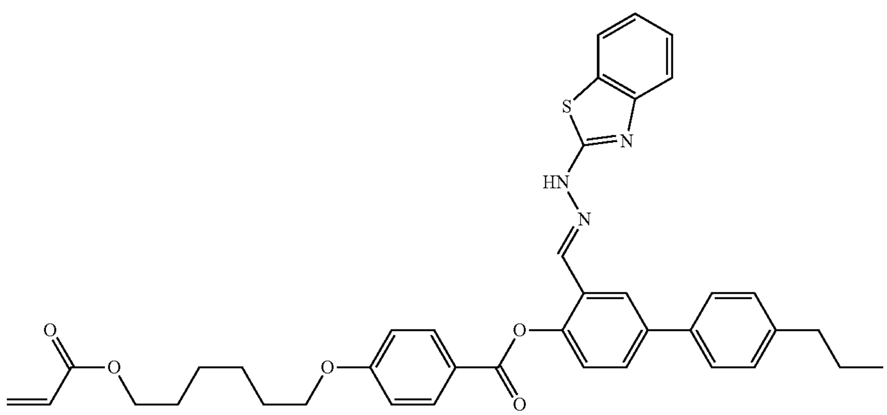
[Chem. 34]
(1-a-6)
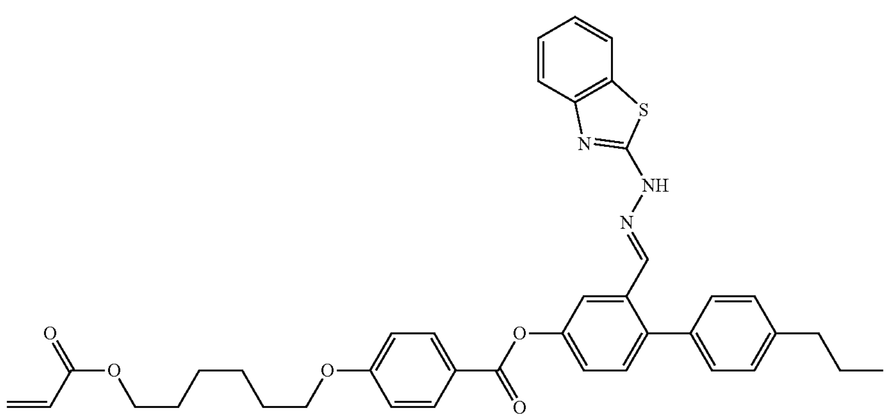

-continued
(1-a-7)
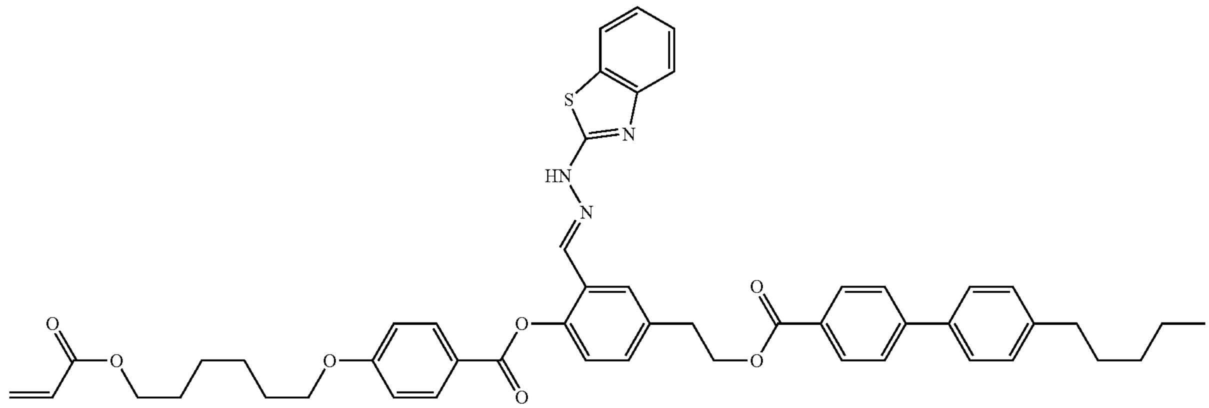
(1-a-8)
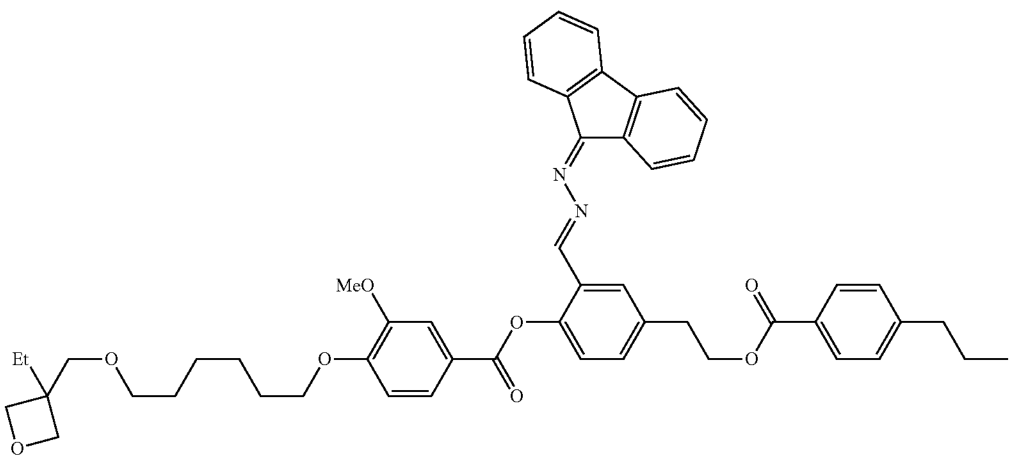
(1-a-9)
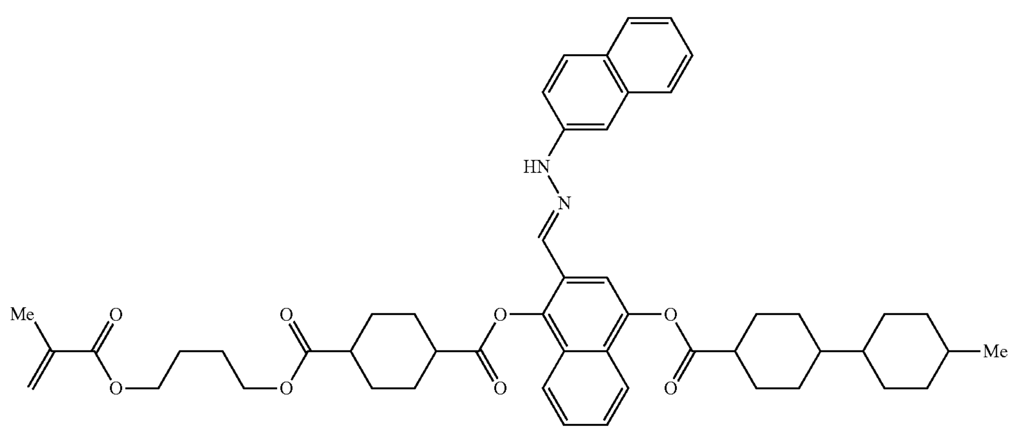

-continued
[Chem. 35]
(1-a-10)
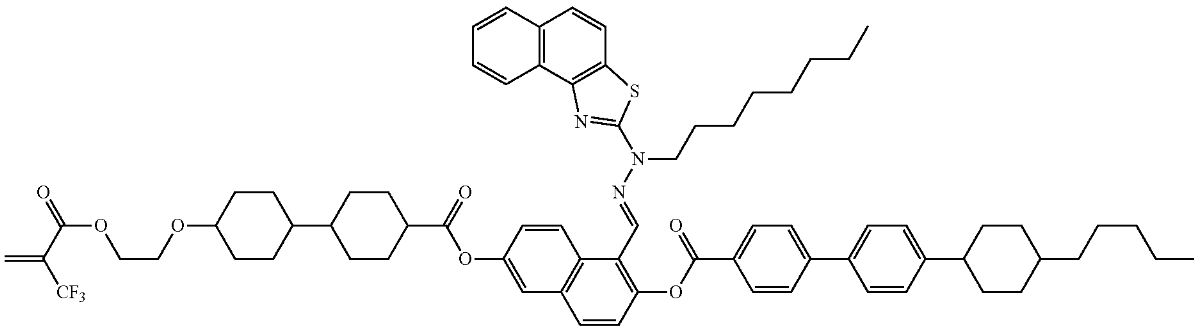
(1-a-11)
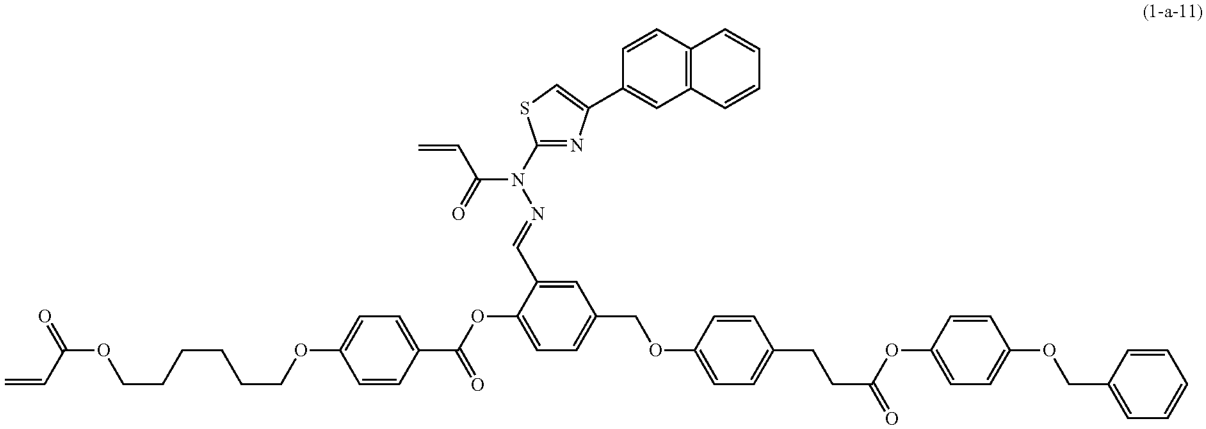
(1-a-12)
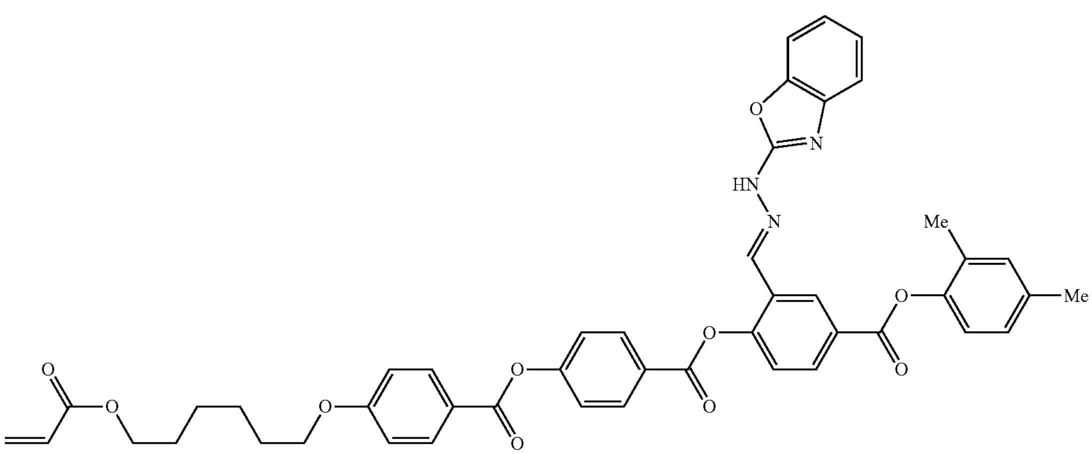

-continued
(1-a-13)
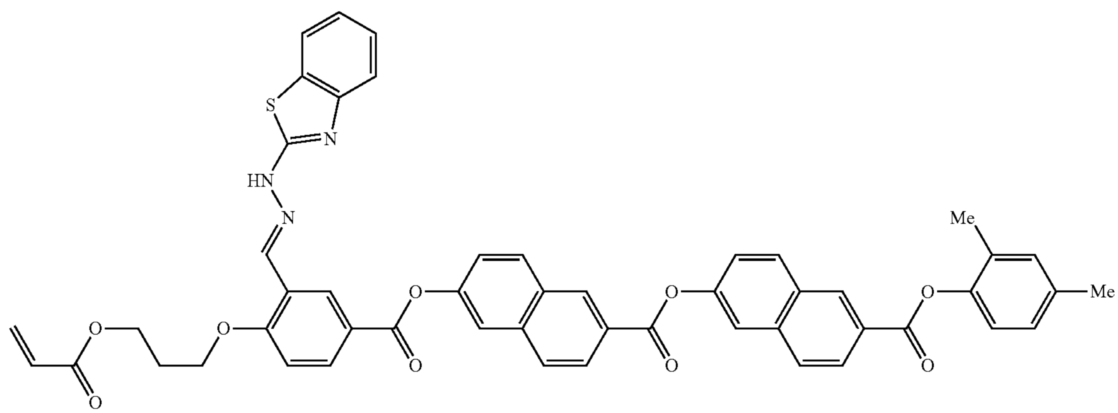
[Chem. 36]
(1-a-14)
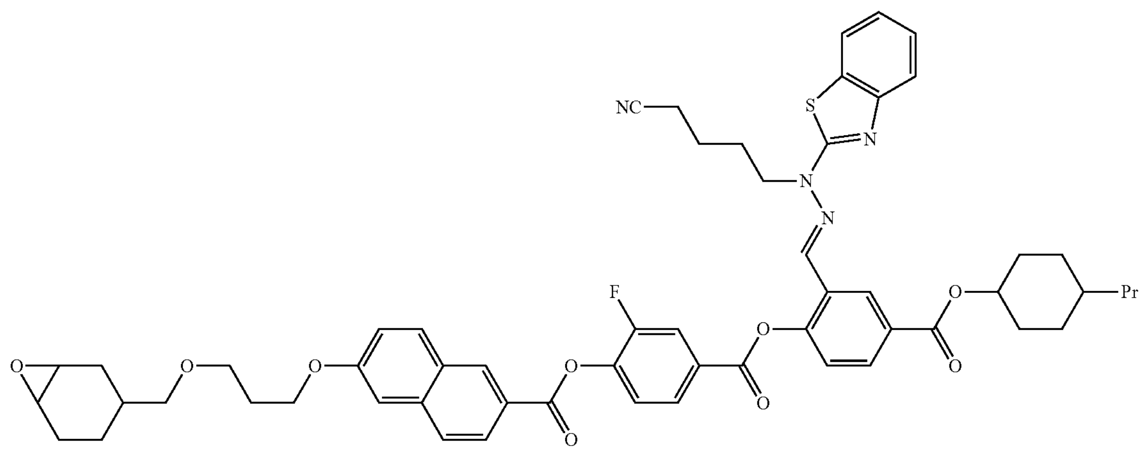
(1-a-15)
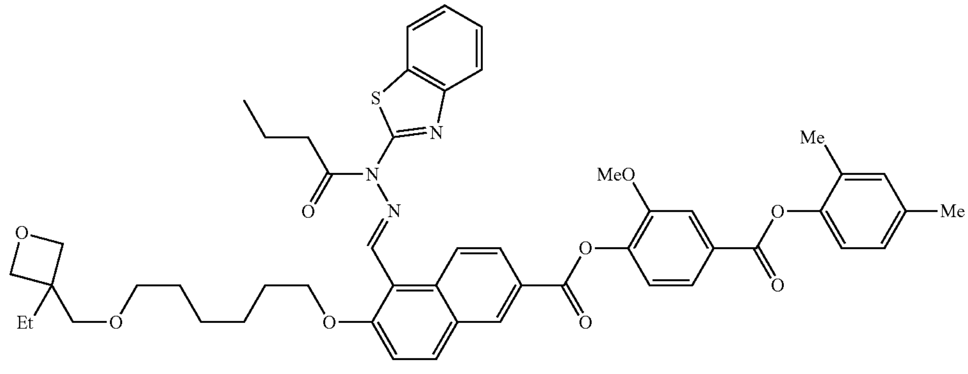

-continued
(1-a-16)
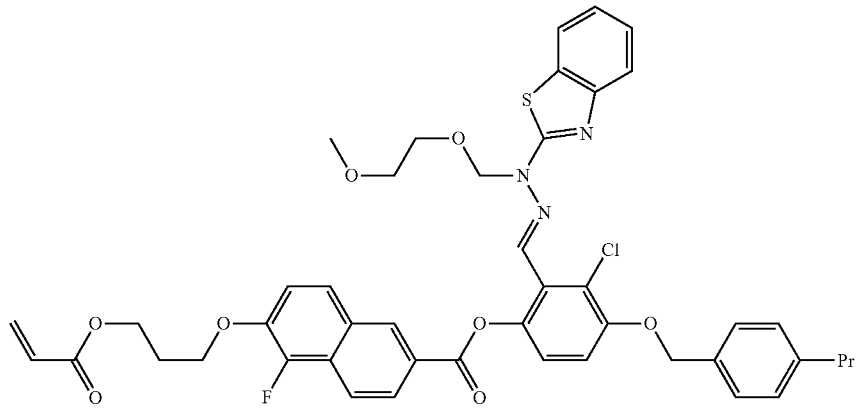
(1-a-17)
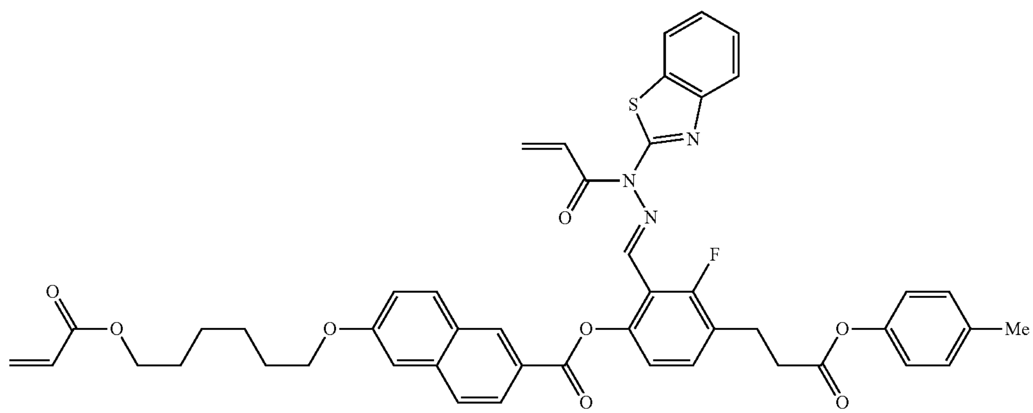
[Chem. 37]
(1-a-20)
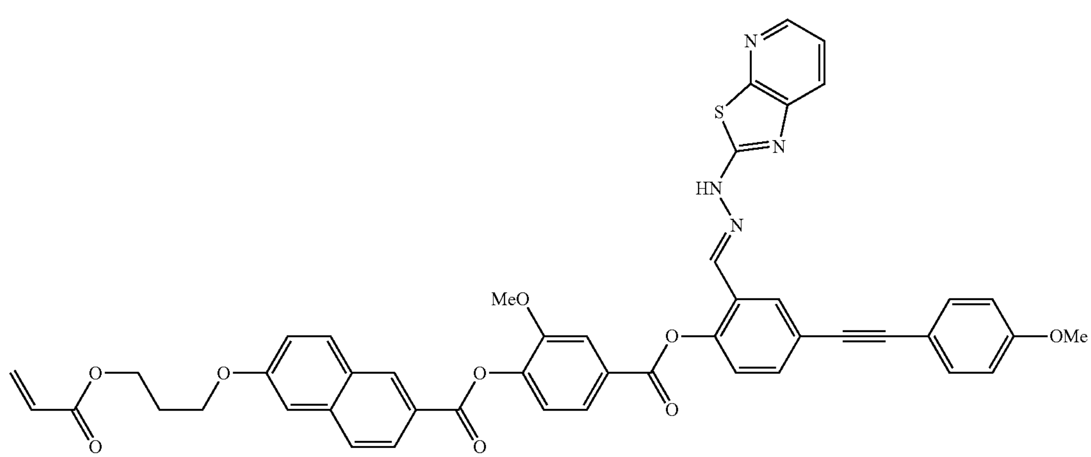

-continued
(1-a-21)
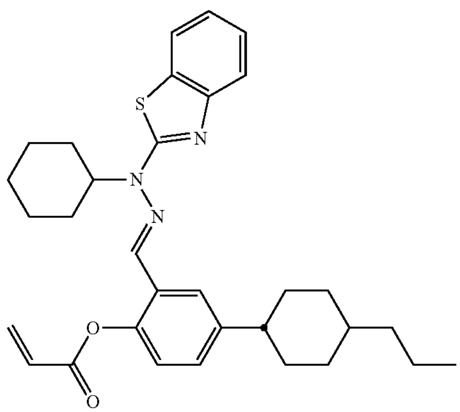
(1-a-22)
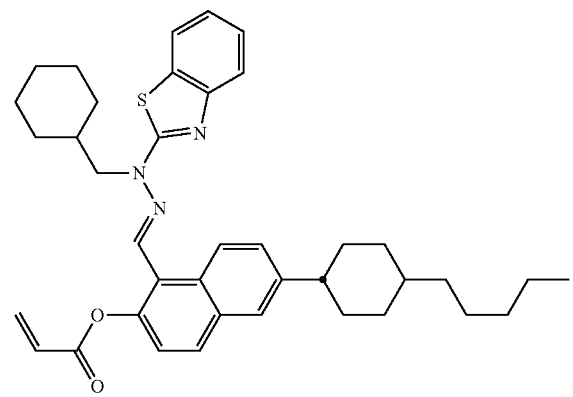
[Chem. 38]
(1-a-23)
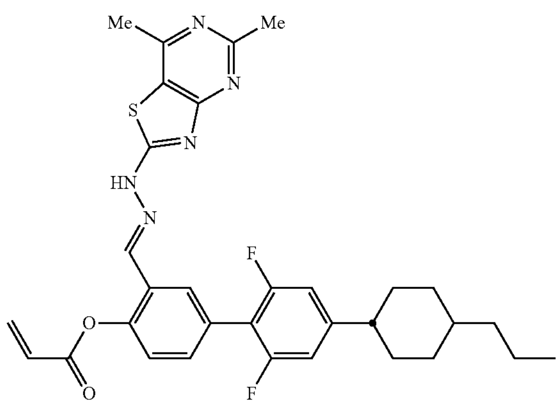
(1-a-24)
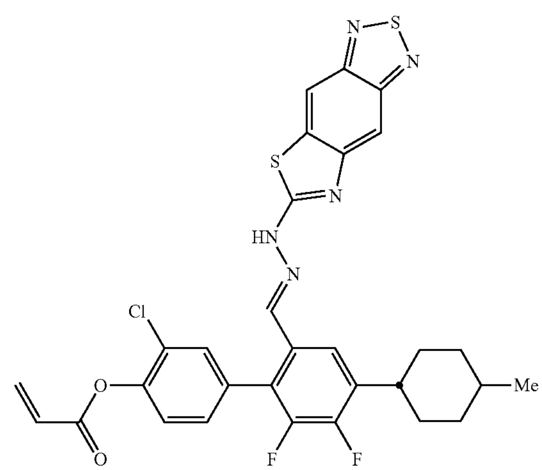
(1-a-25)
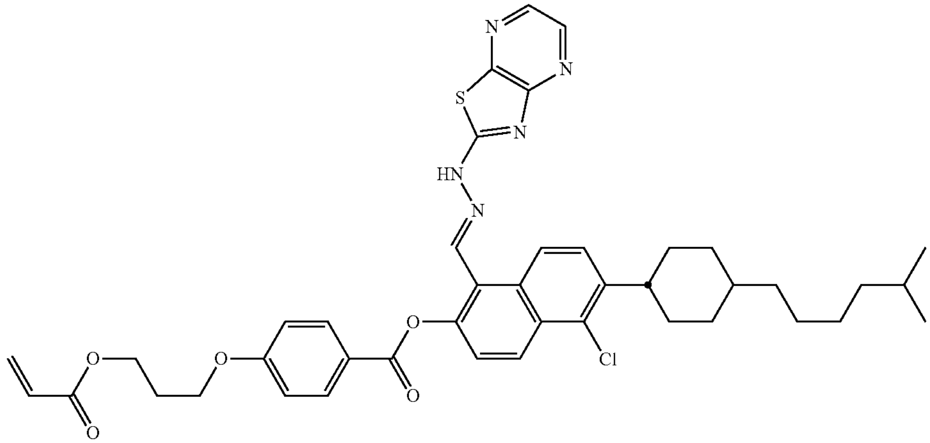

-continued
(1-a-26)
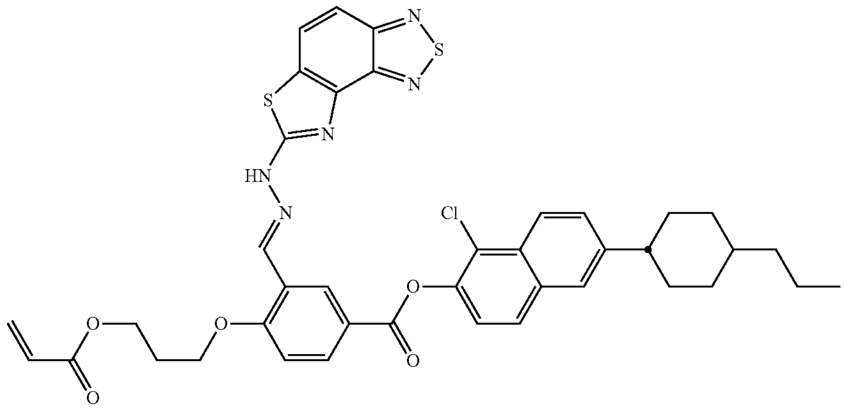
(1-a-27)
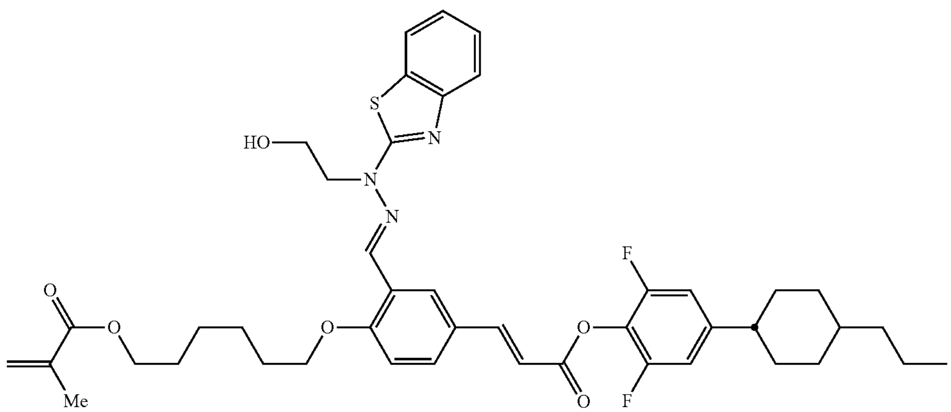
[Chem. 39]
(1-a-28)
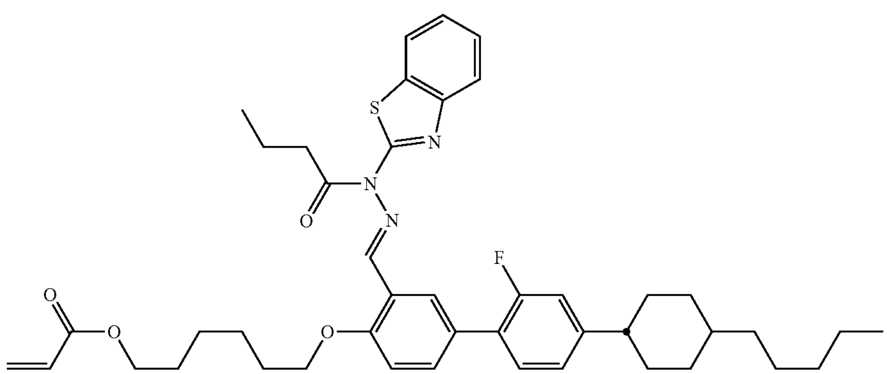
(1-a-29)
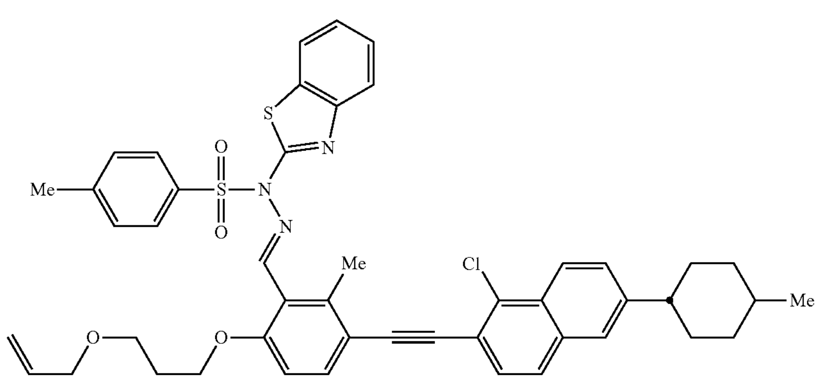

-continued
(1-a-30)
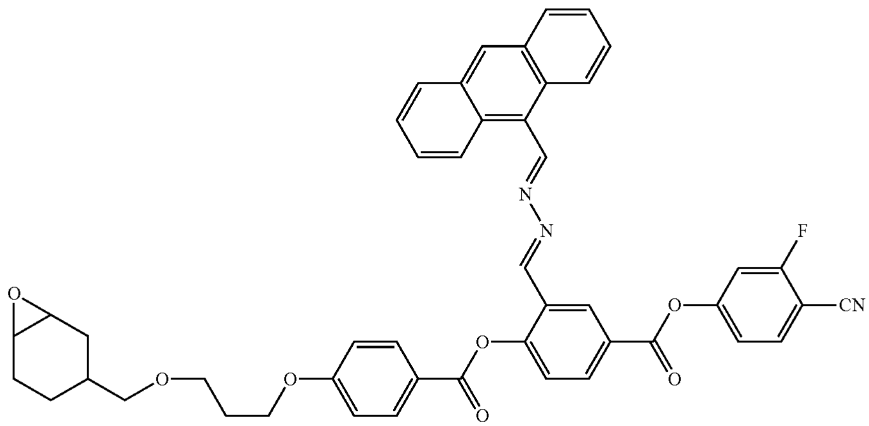
(1-a-31)
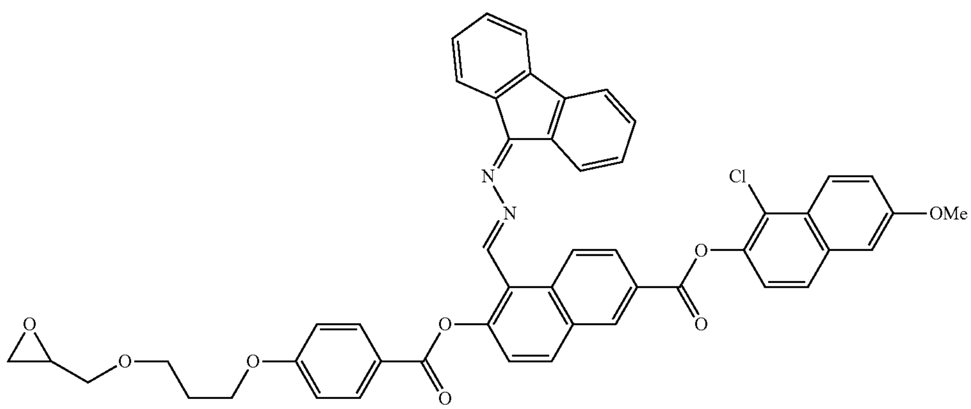
(1-a-32)
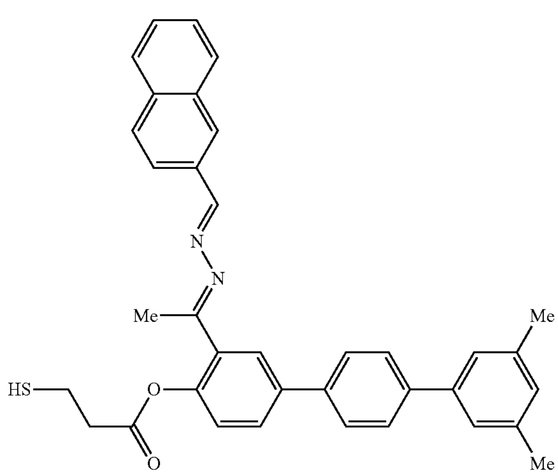

-continued
[Chem. 40]
(1-a-33)
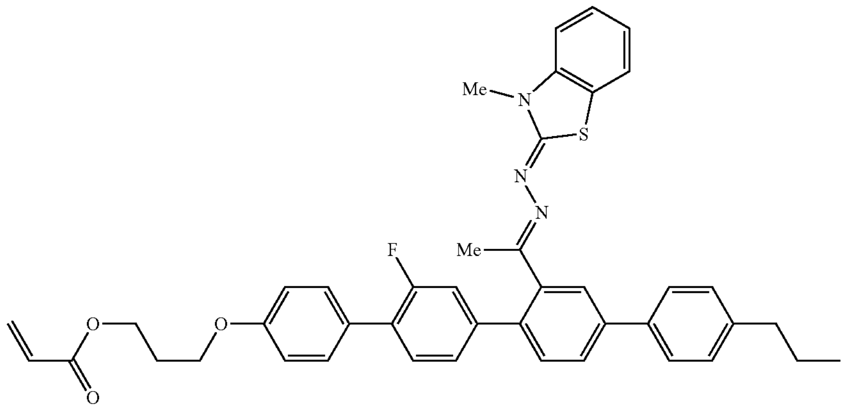
(1-a-34)
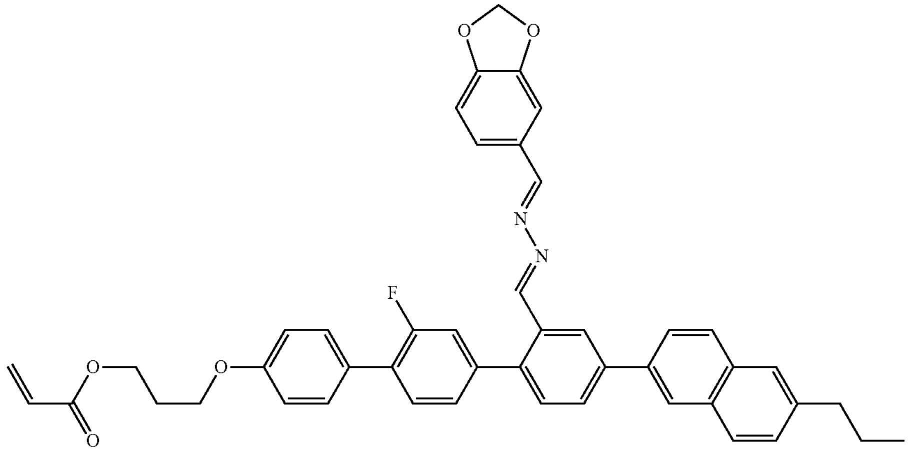
(1-a-35)
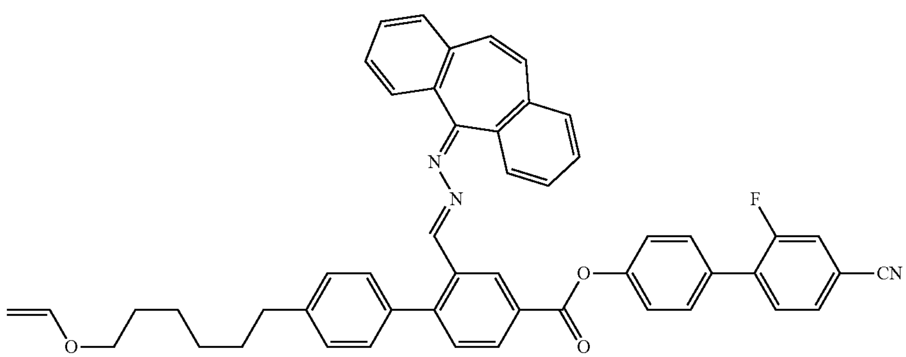

-continued
(1-a-36)
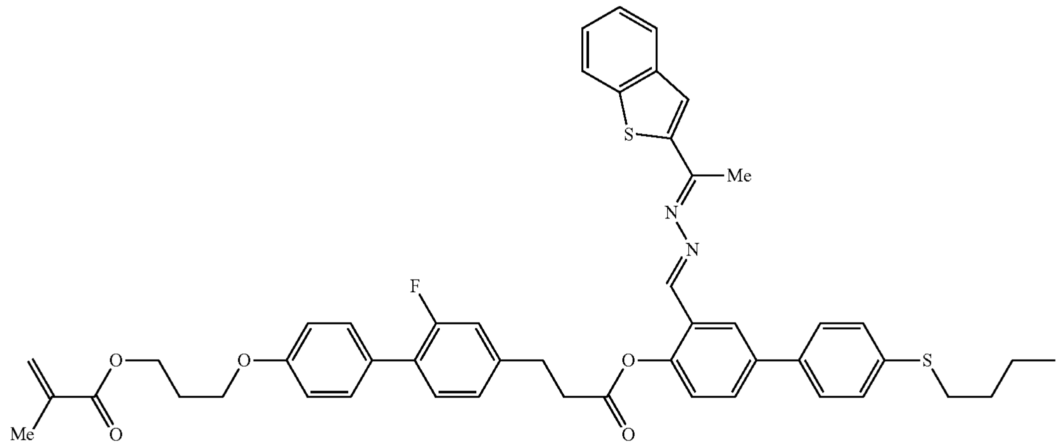
(1-a-37)
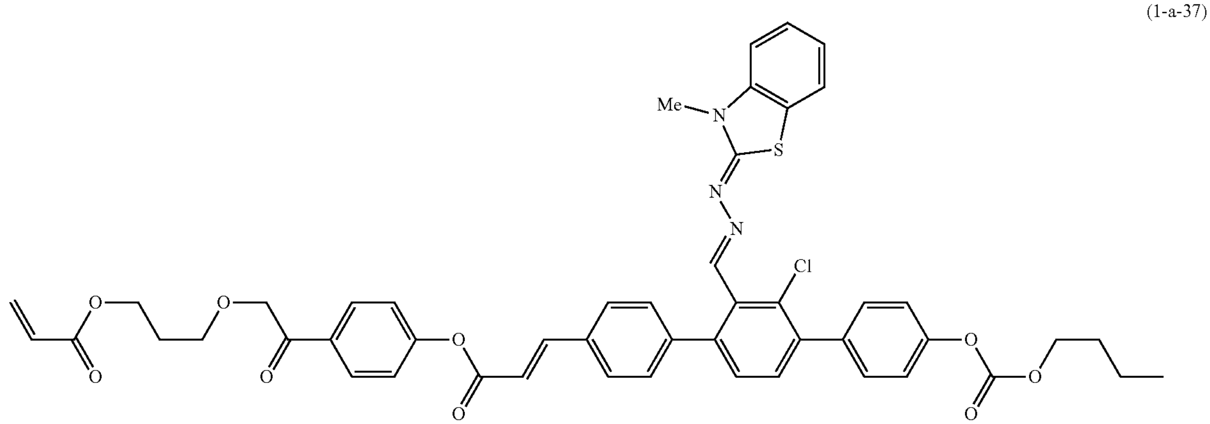
[Chem. 41]
(1-a-38)
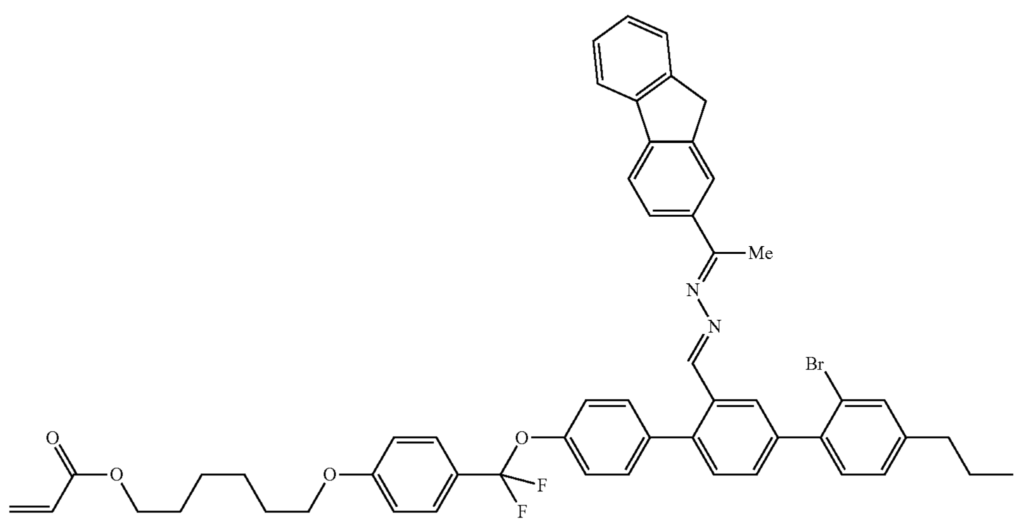

-continued
(1-a-39)
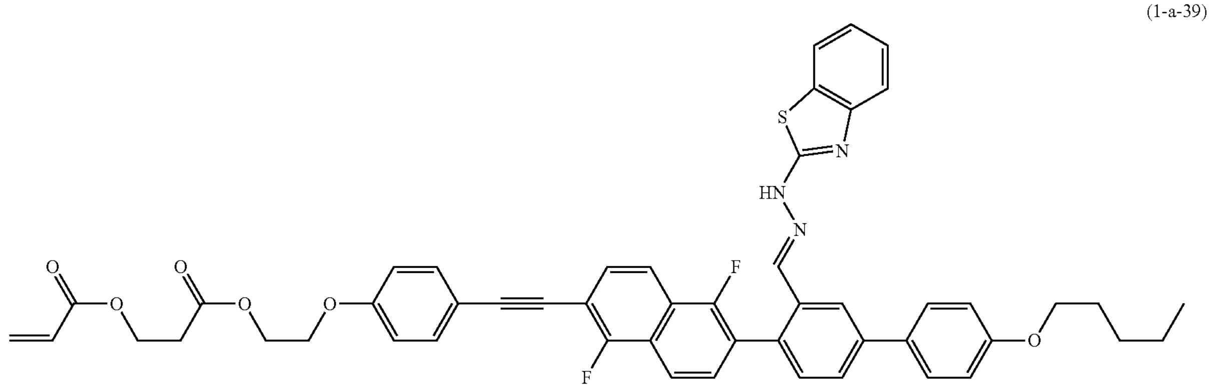
(1-a-40)
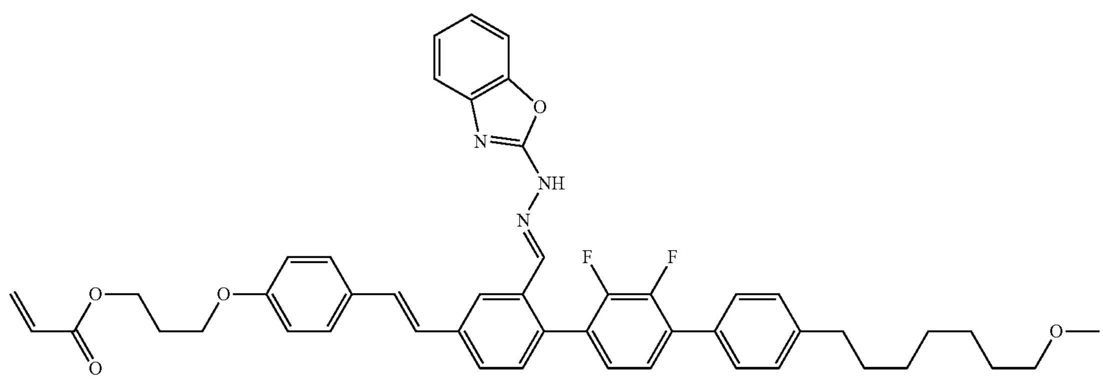
(1-a-41)
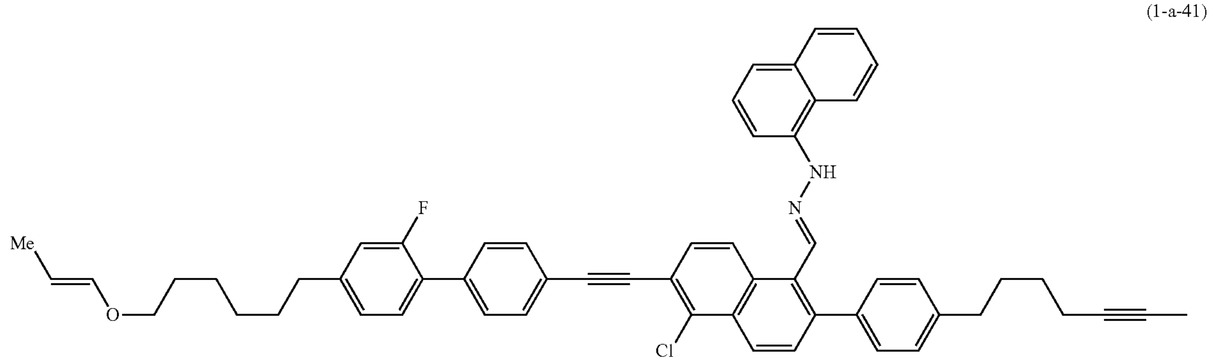
(1-a-42)
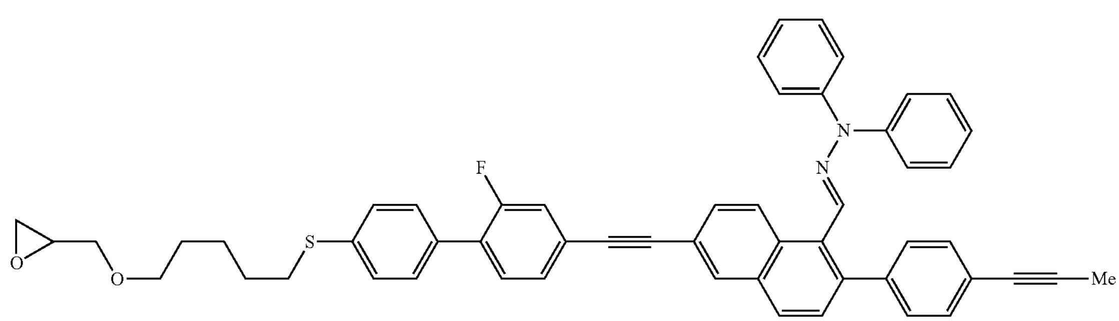

-continued
[Chem. 42]
(1-a-43)
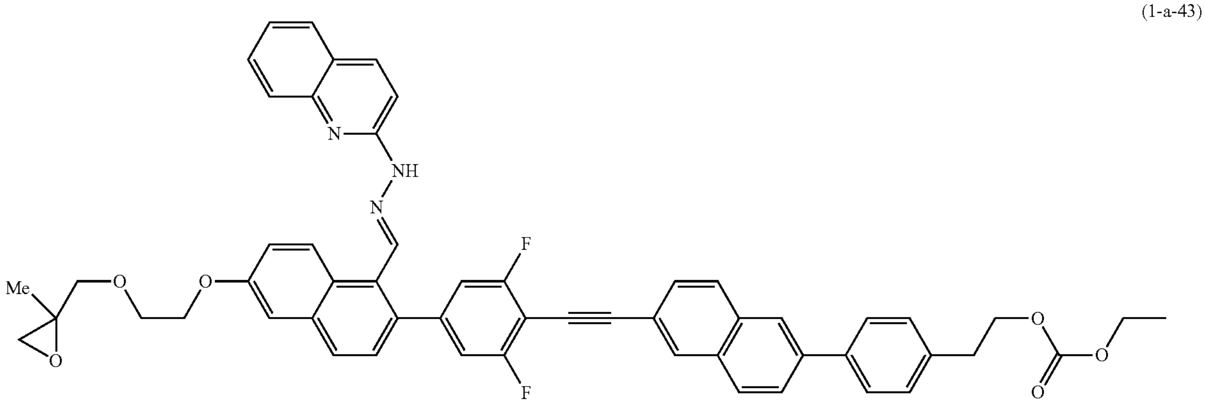
(1-a-44)
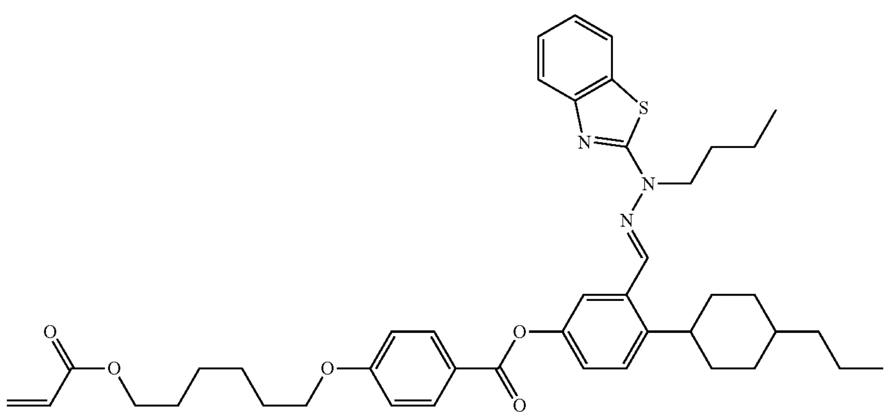
(1-a-45)
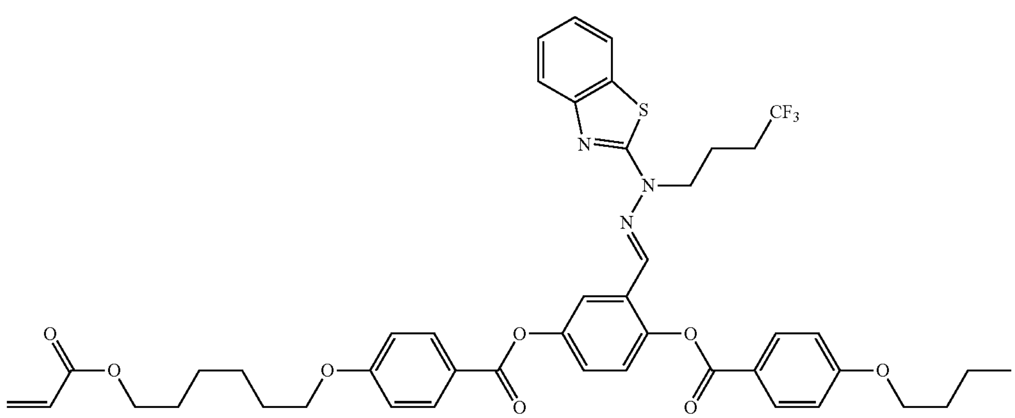

-continued
(1-a-47)
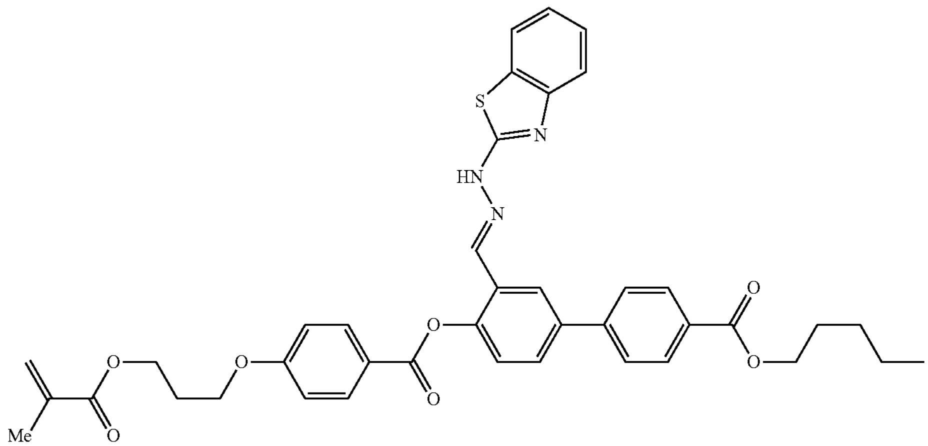
(1-a-48)
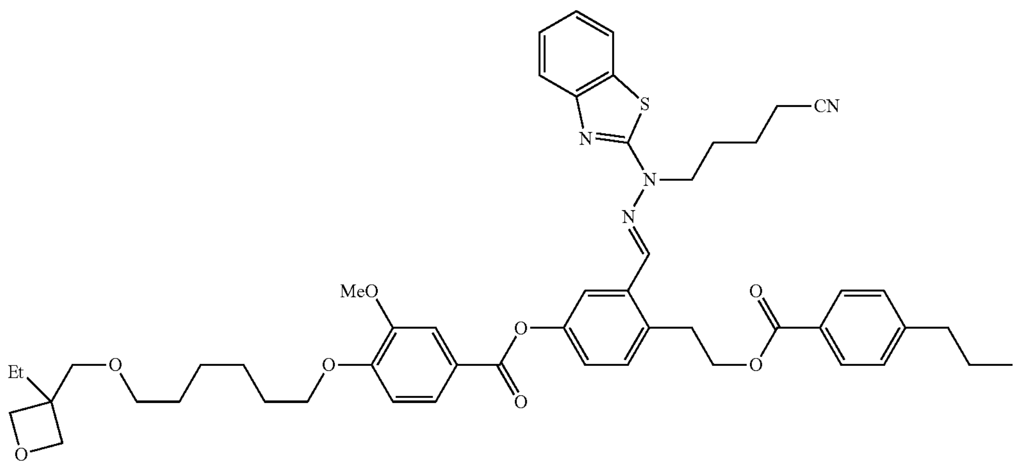
(1-a-49)
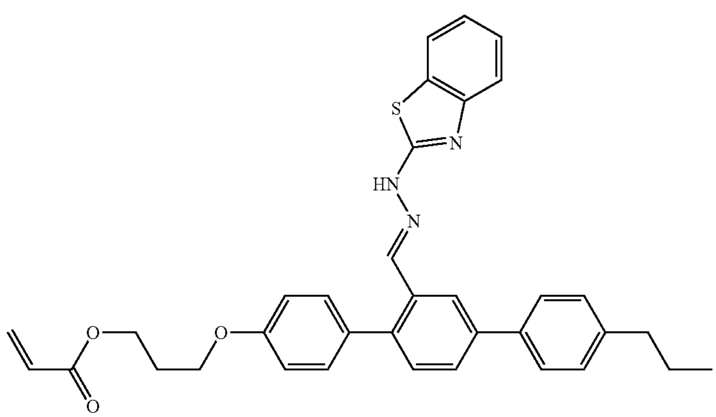

-continued
[Chem. 43]
(1-a-50)
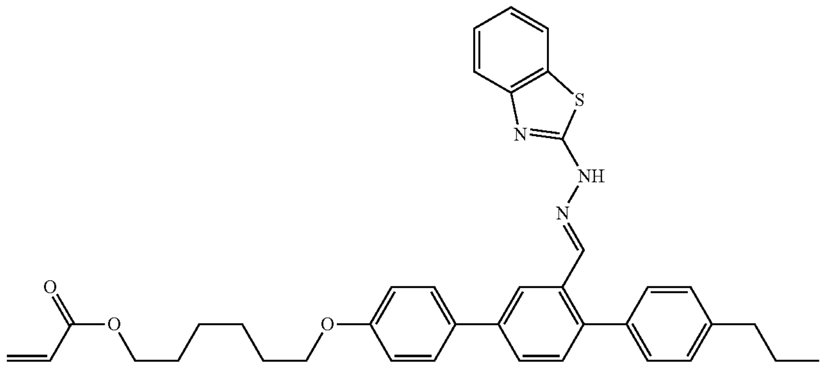
(1-a-51)
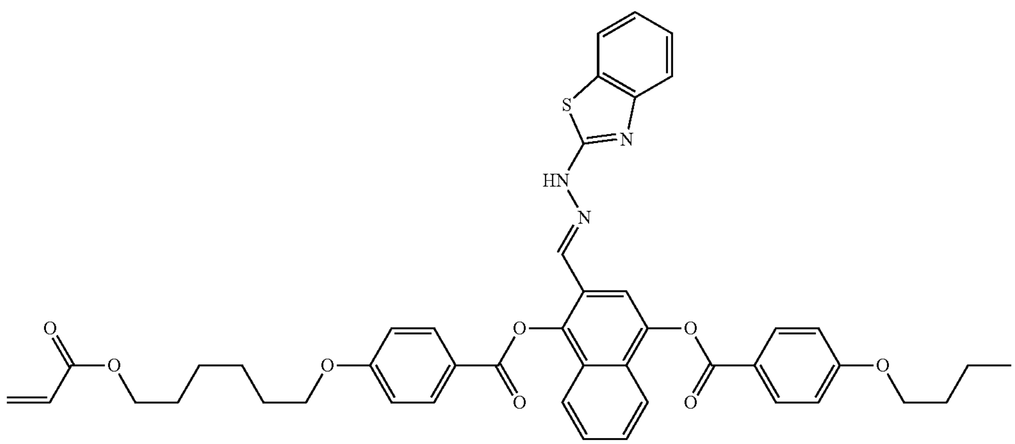
(1-a-52)
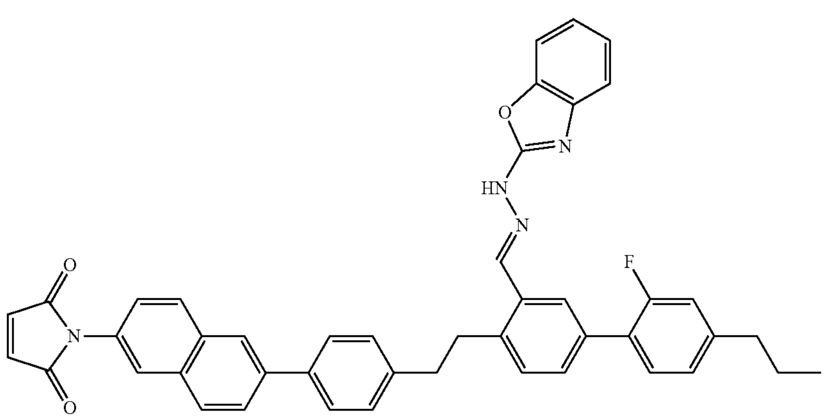

-continued
(1-a-53)
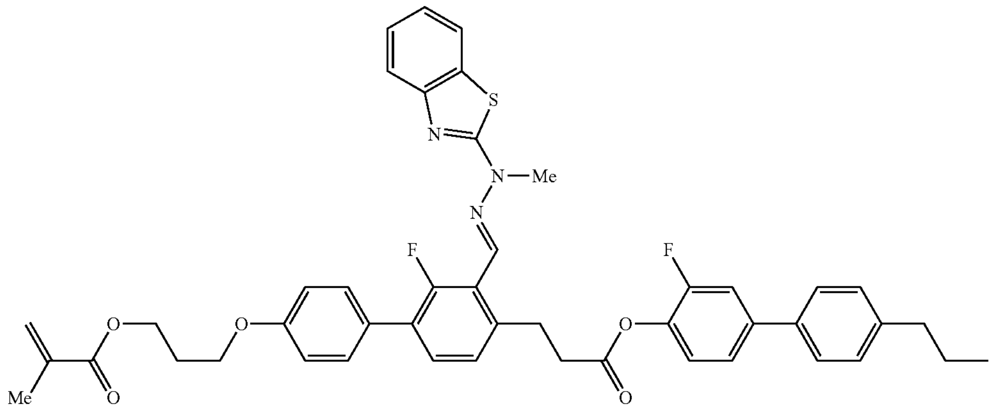
(1-a-54)
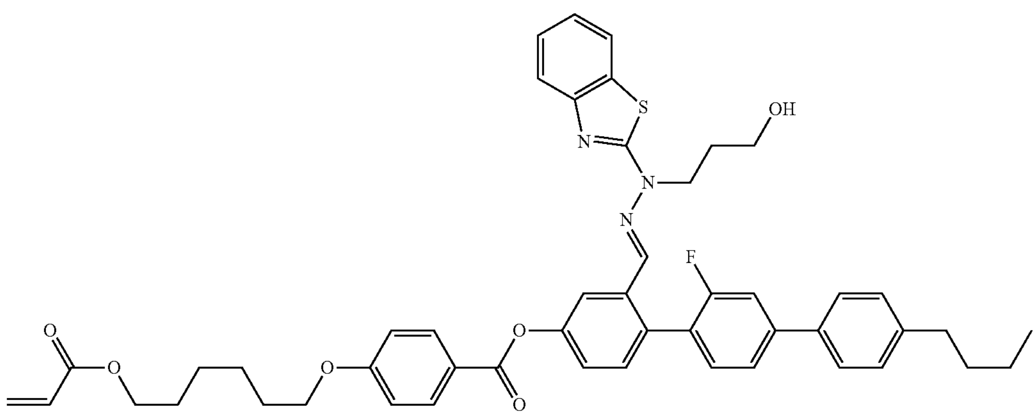
[Chem. 44]
(1-a-55)
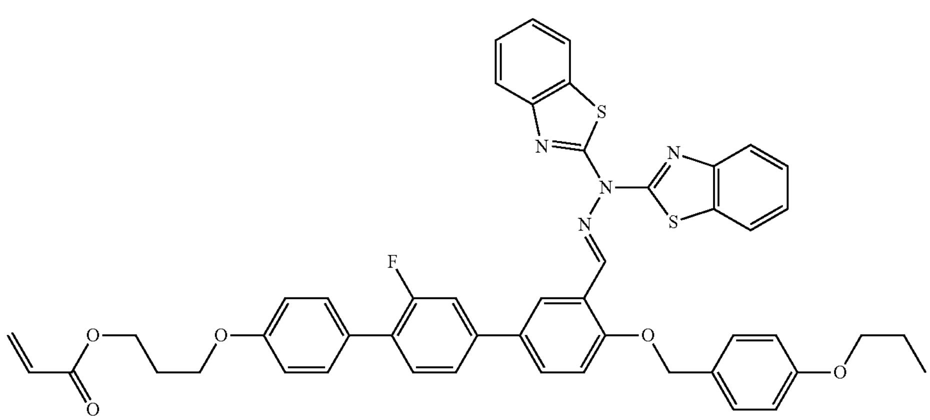

-continued
(1-a-56)
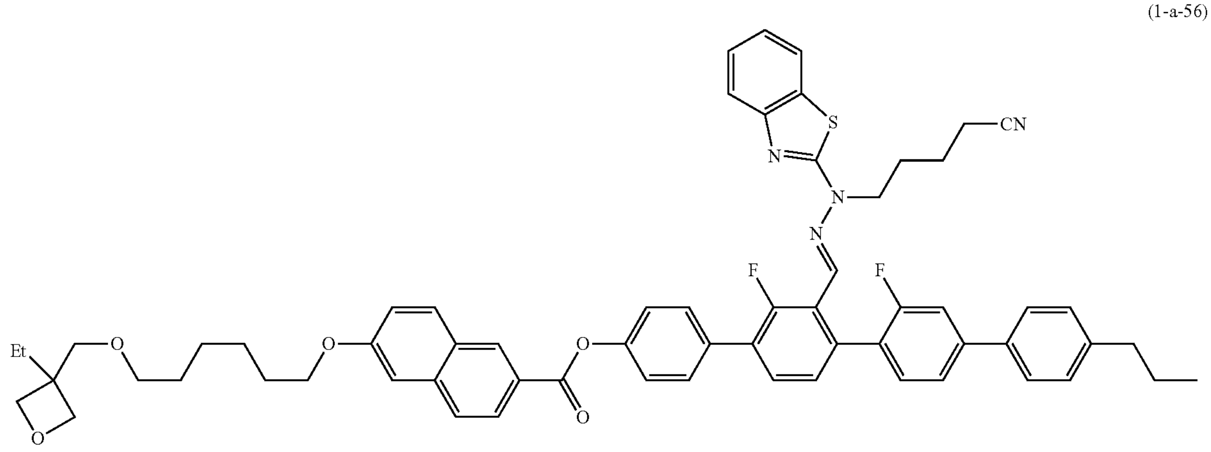
(1-a-57)
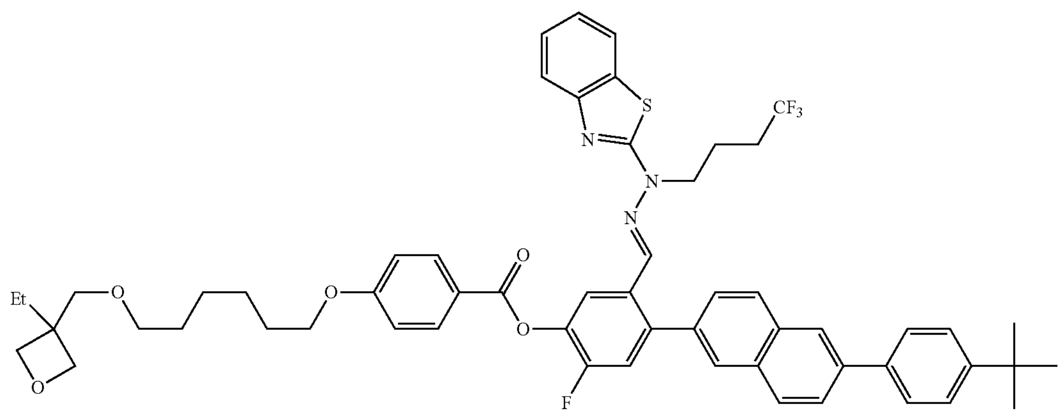
(1-a-58)
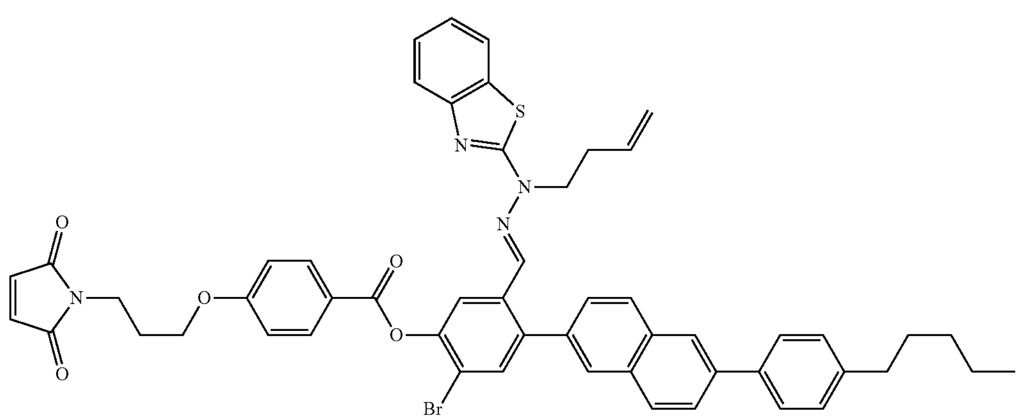

-continued
(1-a-59)
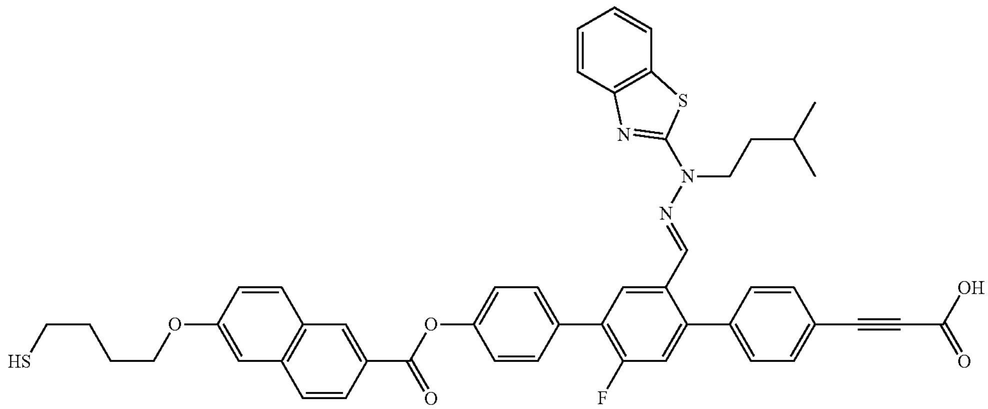
[Chem. 45]
(1-a-60)
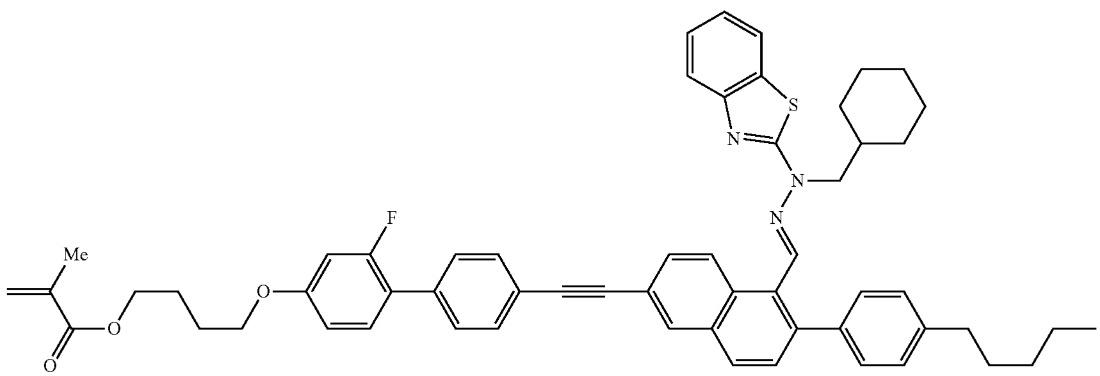
(1-a-61)
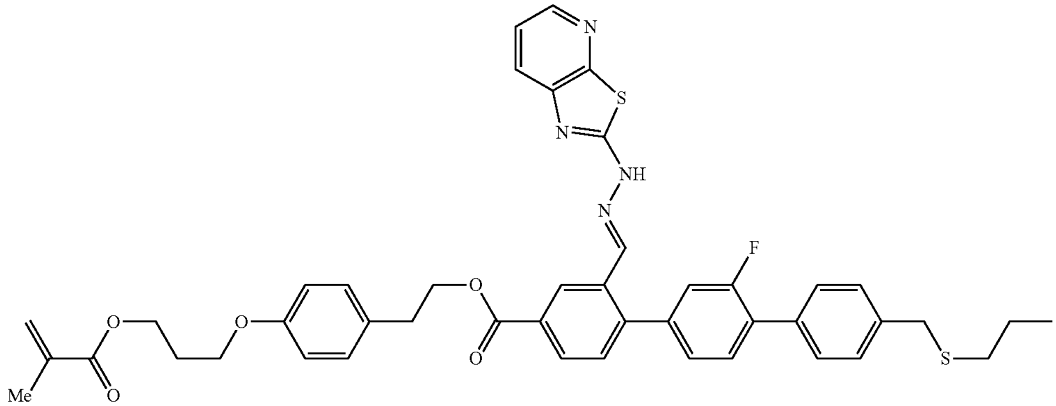

-continued
(1-a-62)
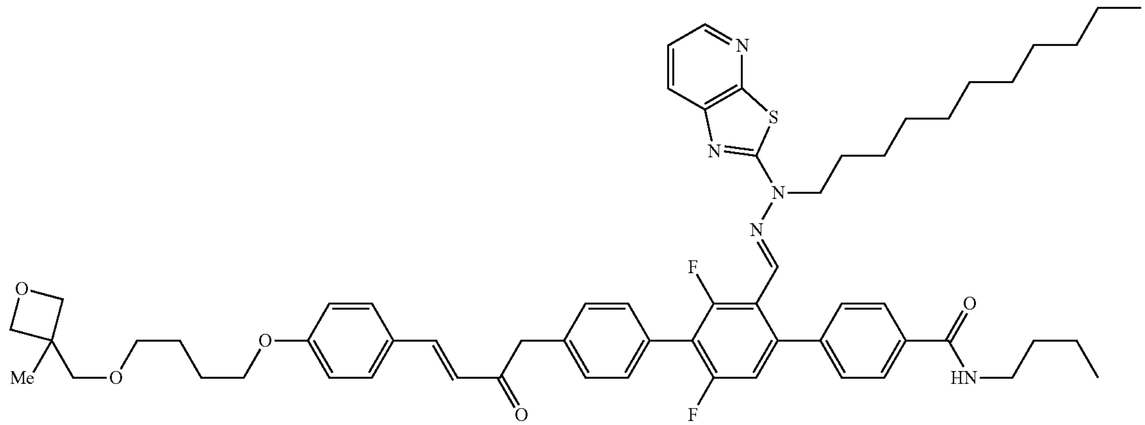
(1-a-63)
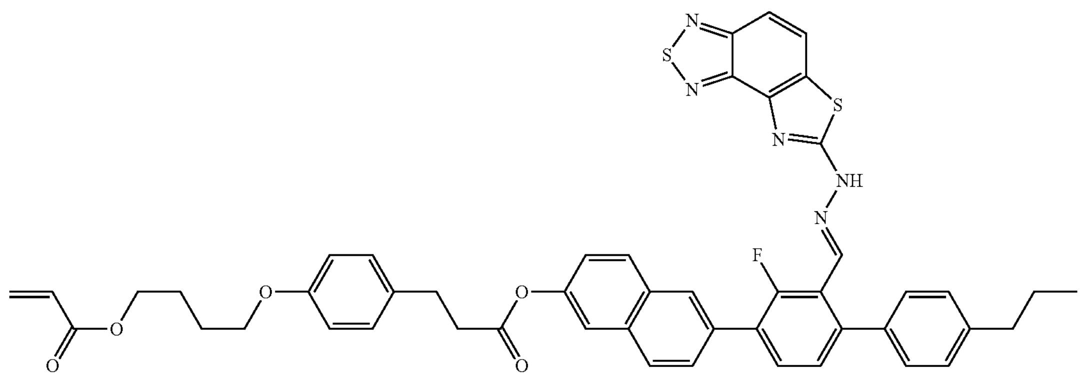
(1-a-64)
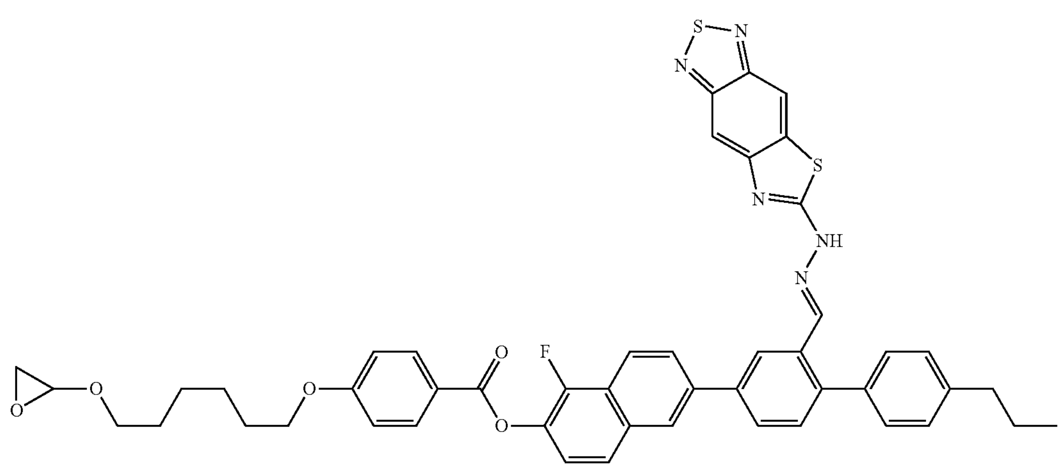

-continued
[Chem. 46]
(1-a-65)
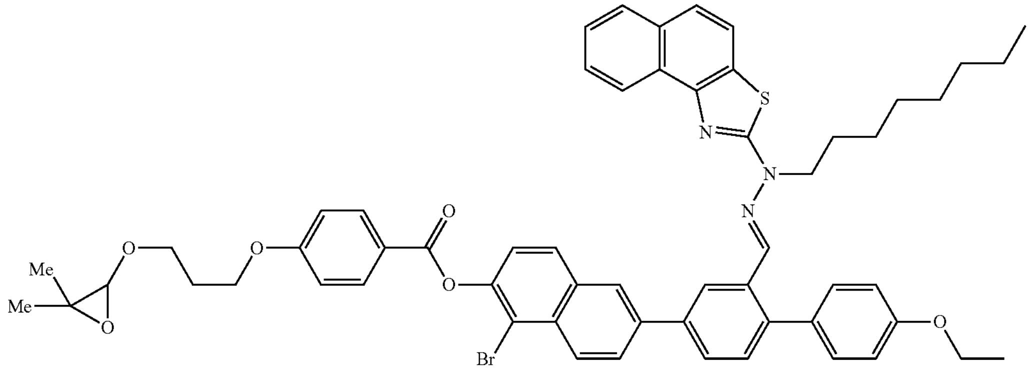
(1-a-66)
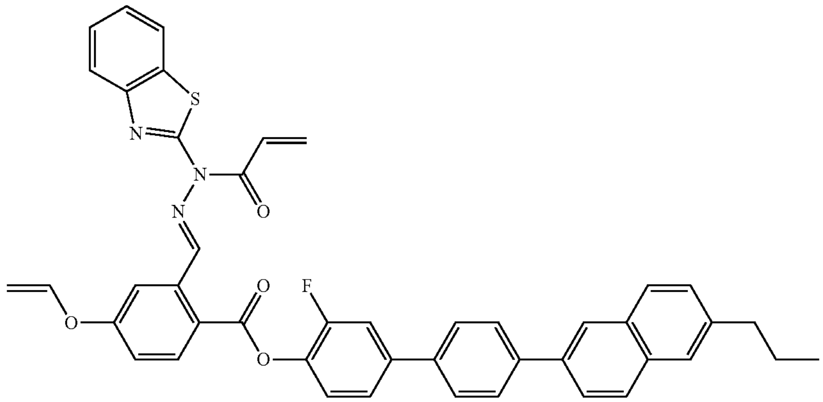
(1-a-67)
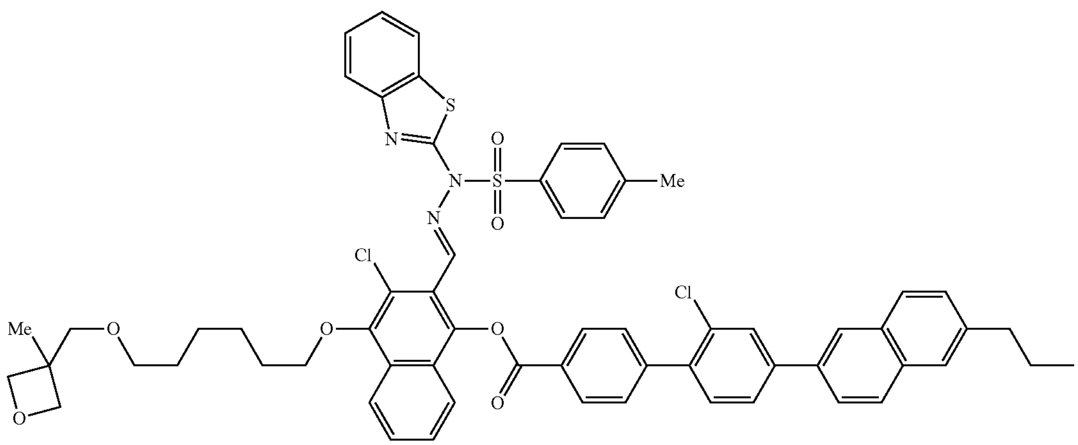
(1-a-68)
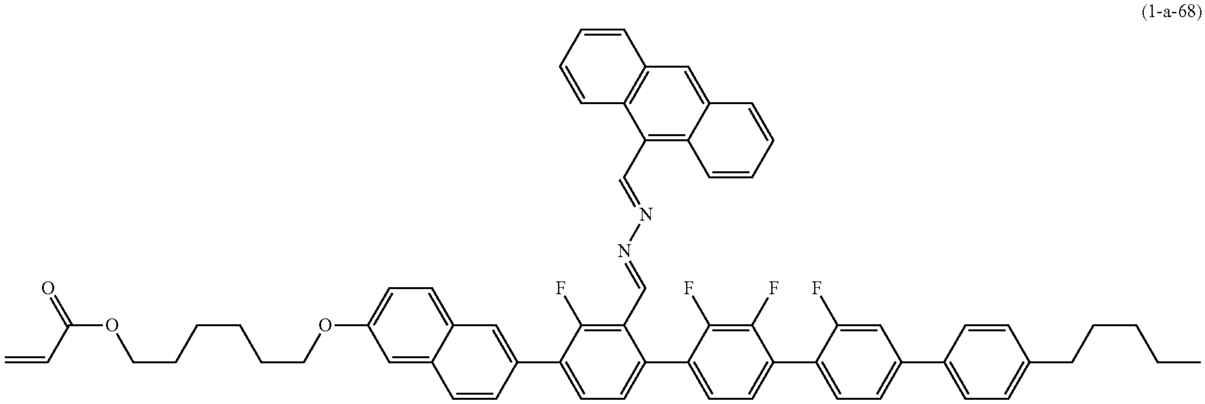

-continued
[Chem. 46]
(1-a-69)
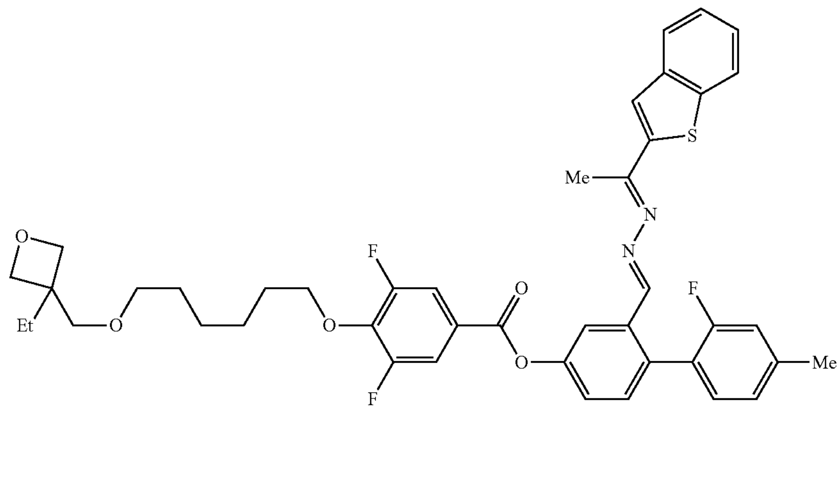
(1-a-70)
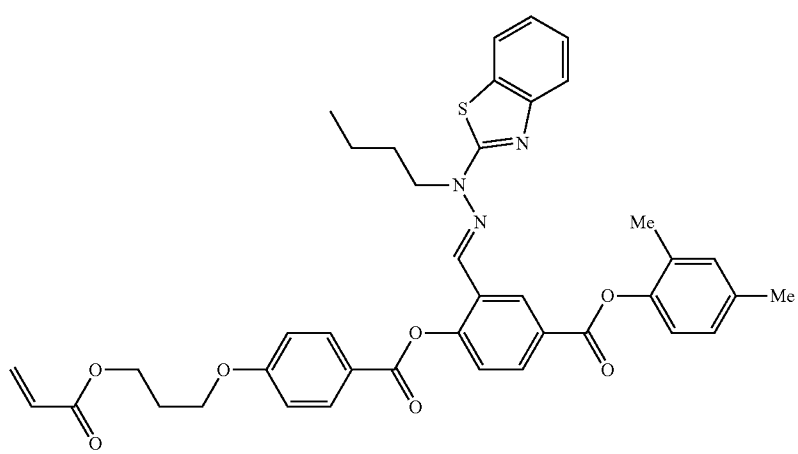
[Chem. 47]
(1-a-71)
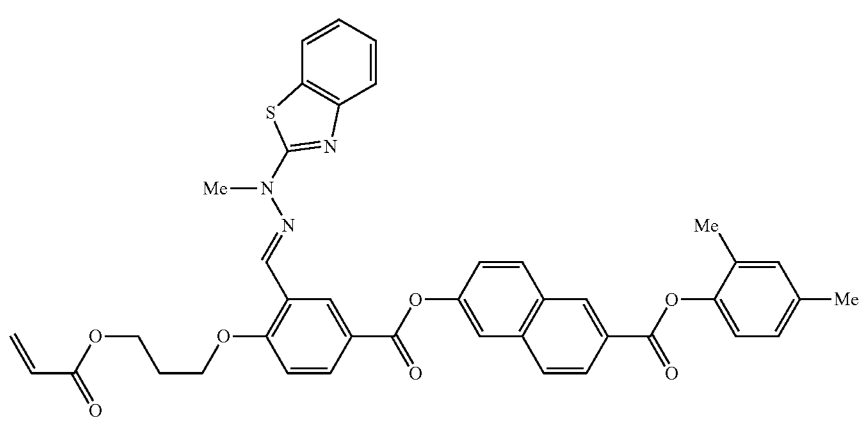

-continued
(1-a-72)
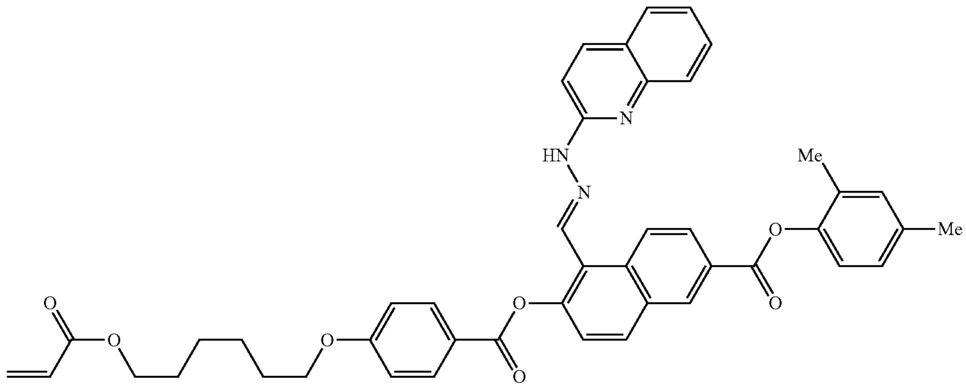
(1-a-73)
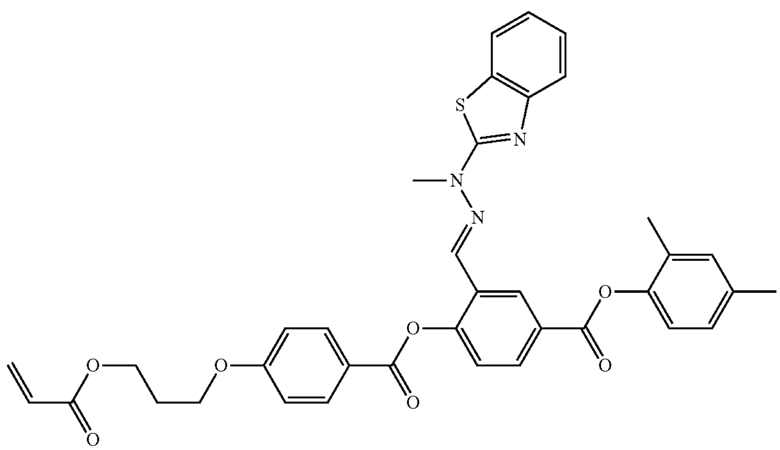
(1-a-75)
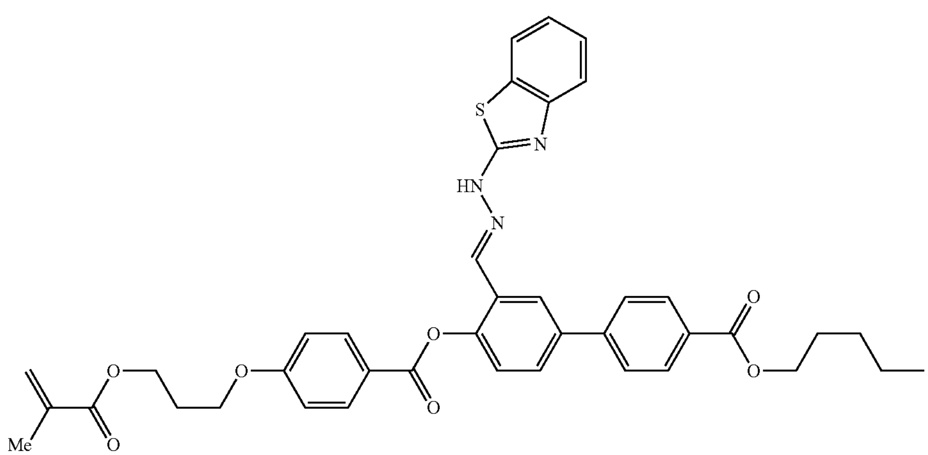

-continued
(1-a-76)
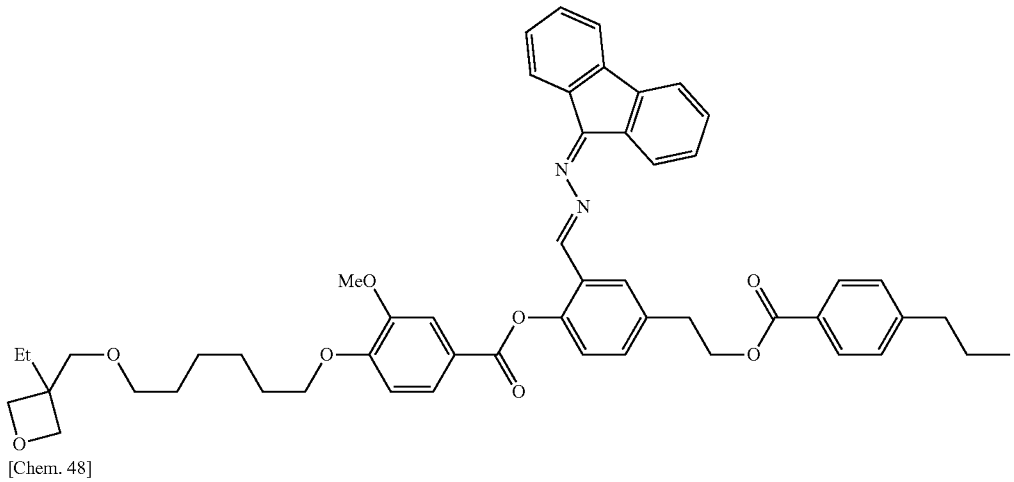
[Chem. 48]
(1-a-77)
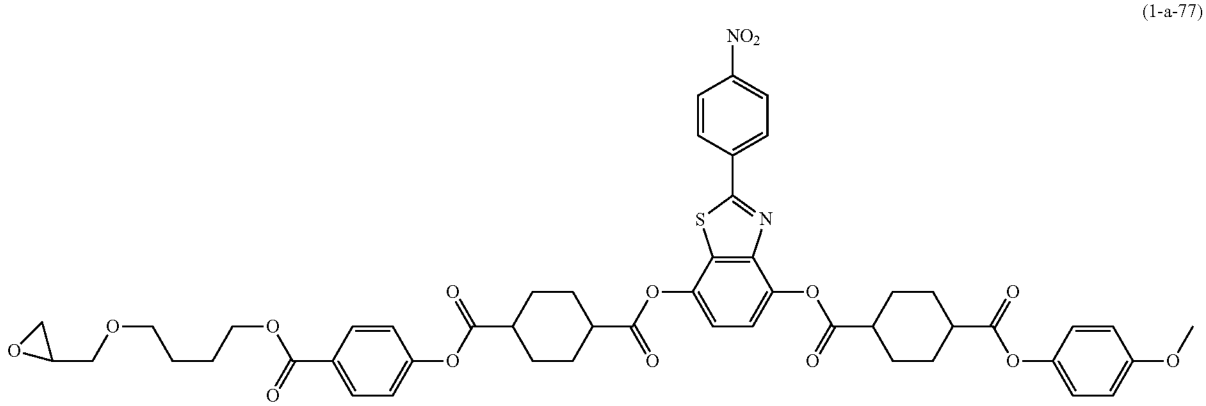
(1-a-78)
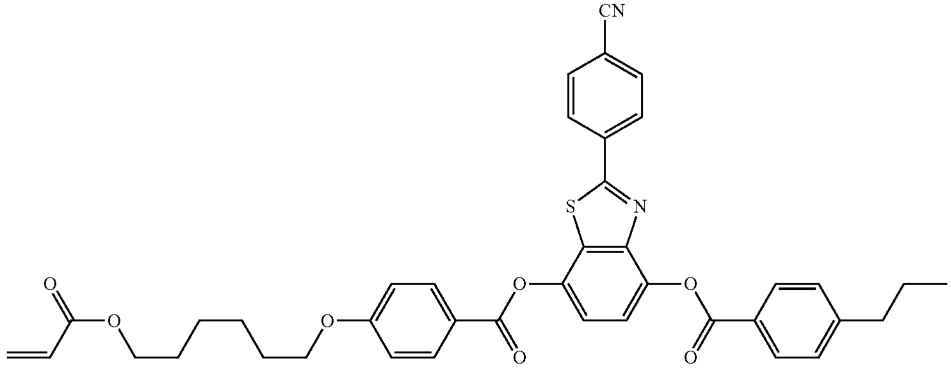

-continued
(1-a-79)
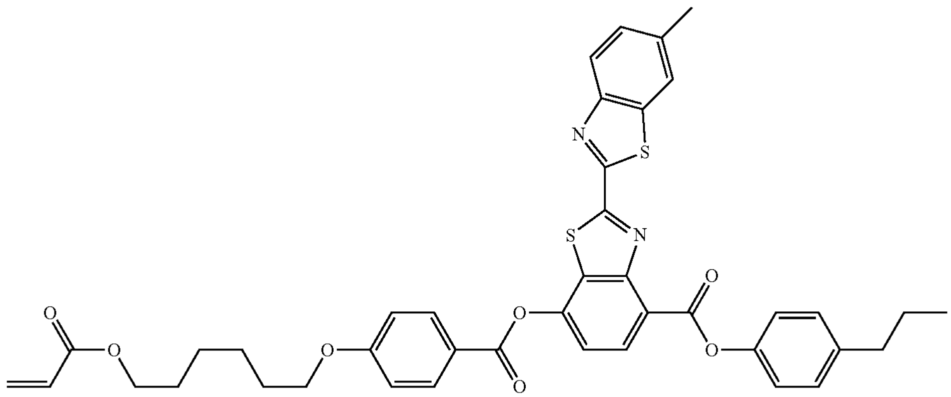
(1-a-80)
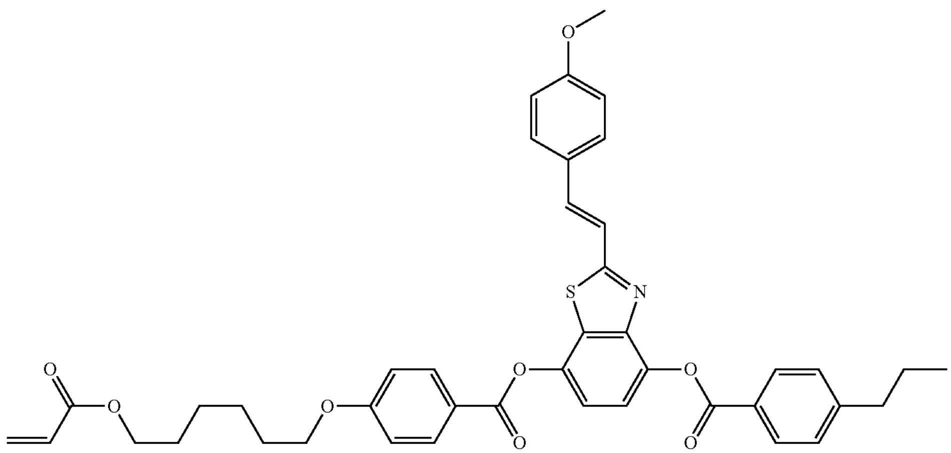
(1-a-81)
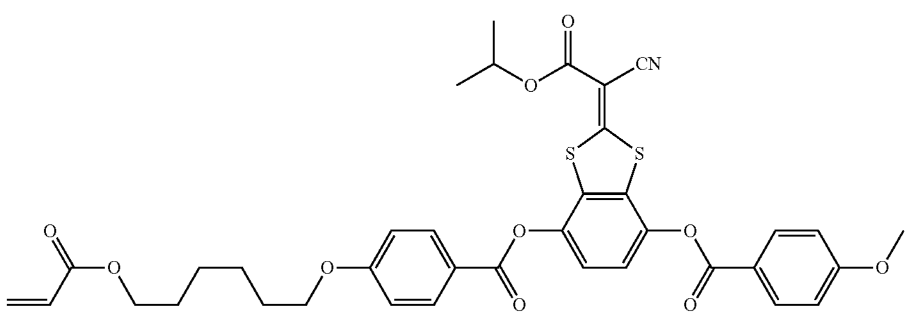
[Chem. 49]
(1-a-82)
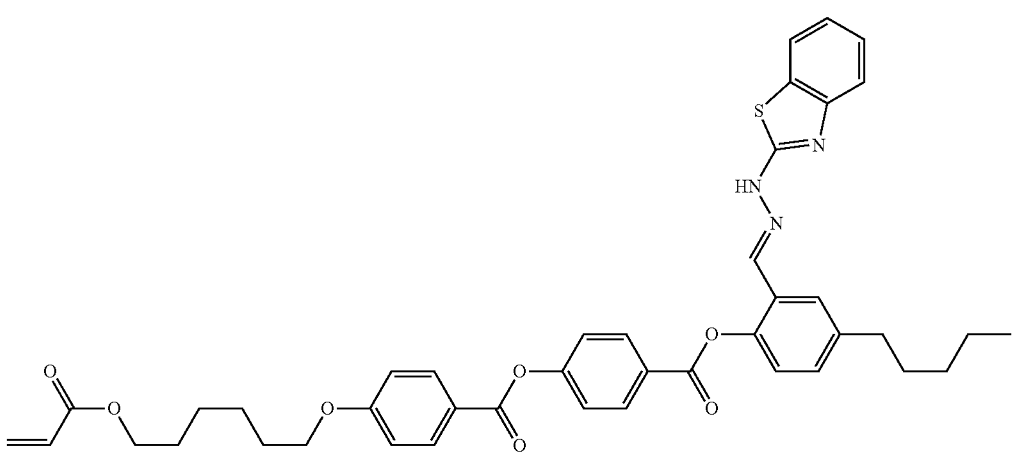

-continued
(1-a-83)
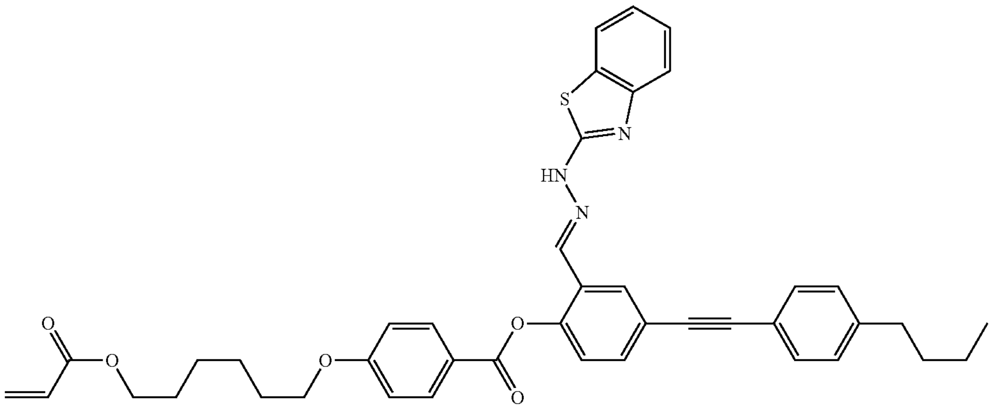
(1-a-84)
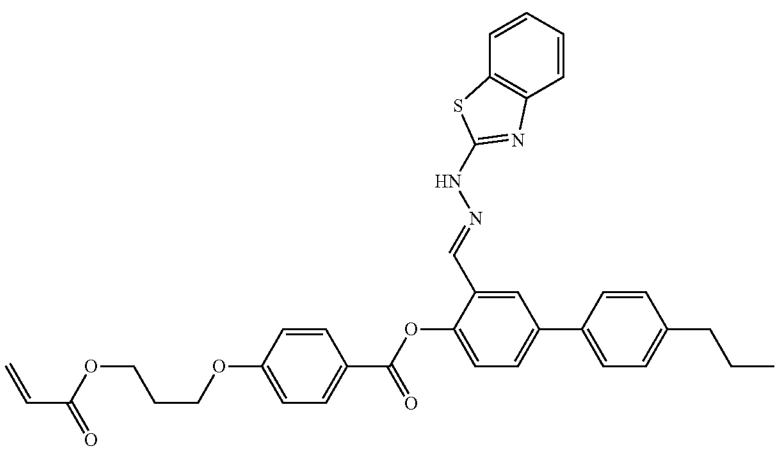
[Chem. 50]
(1-a-85)
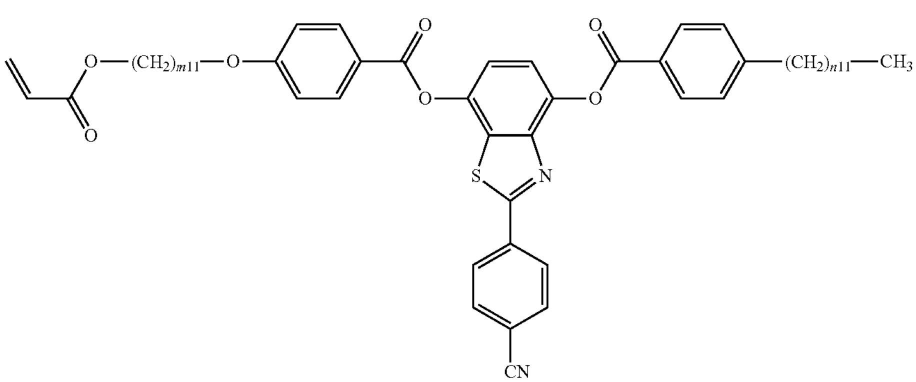

-continued
(1-a-86)
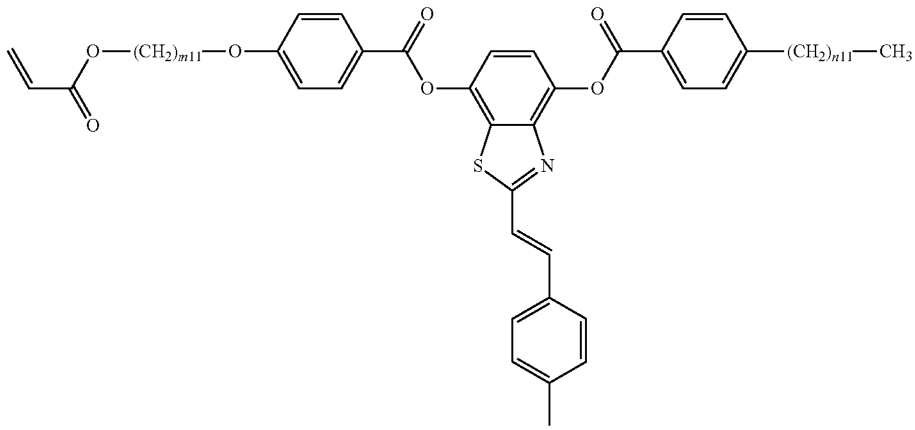
(1-a-87)
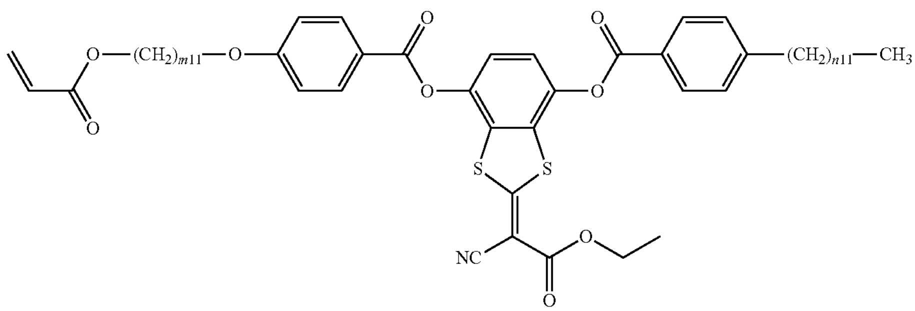
(1-a-88)
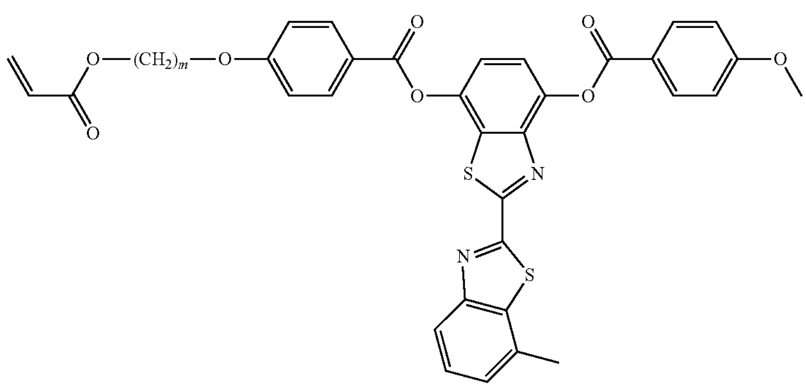
[Chem. 51]
(1-a-89)
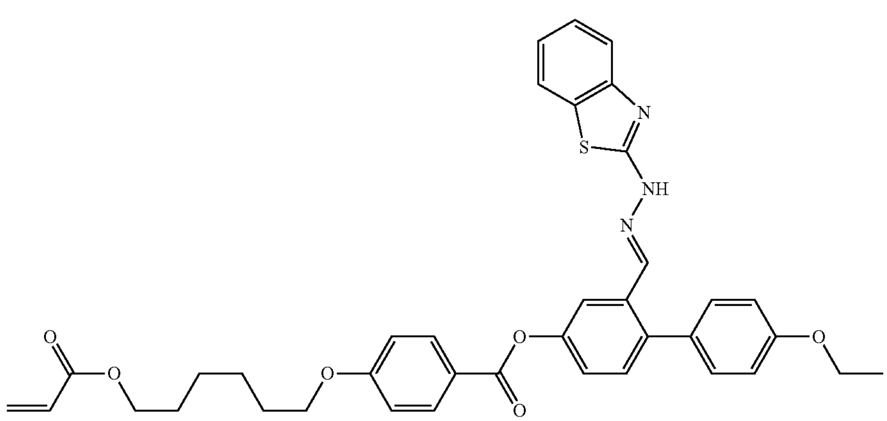

-continued
(1-a-90)
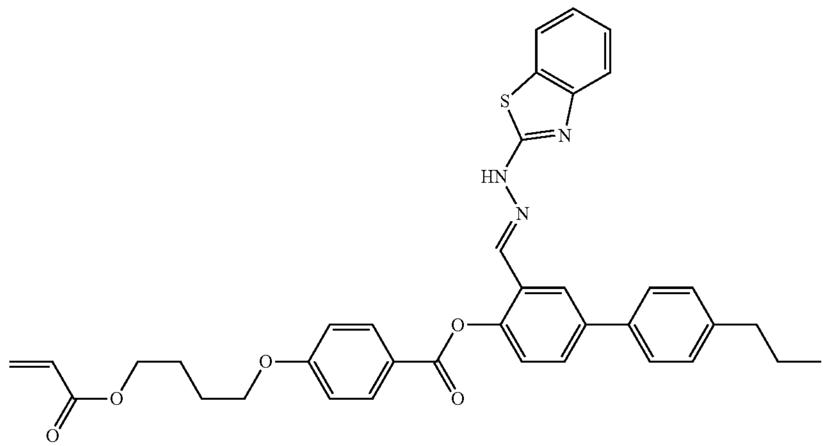
(1-a-91)
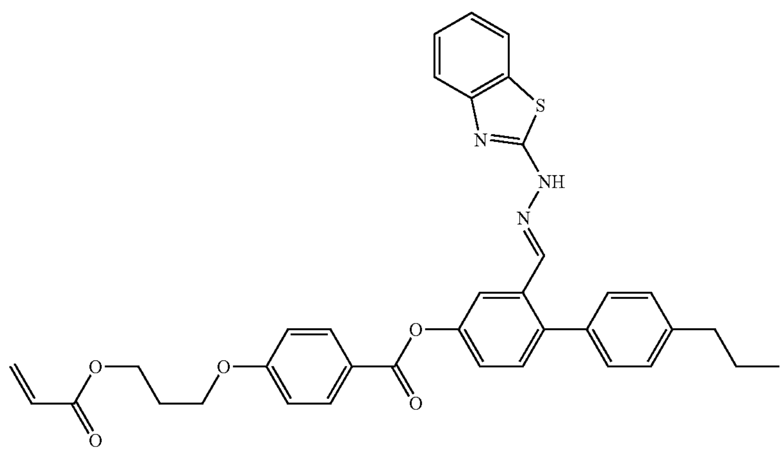
(1-a-92)
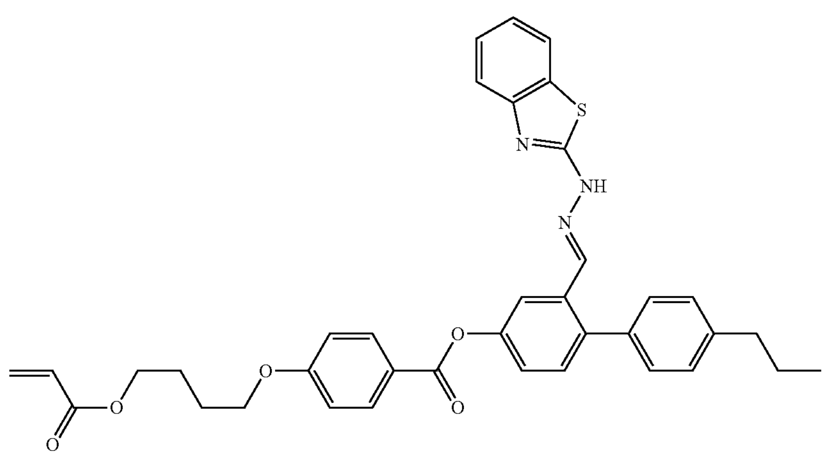

-continued
[Chem. 52]
(1-a-93)
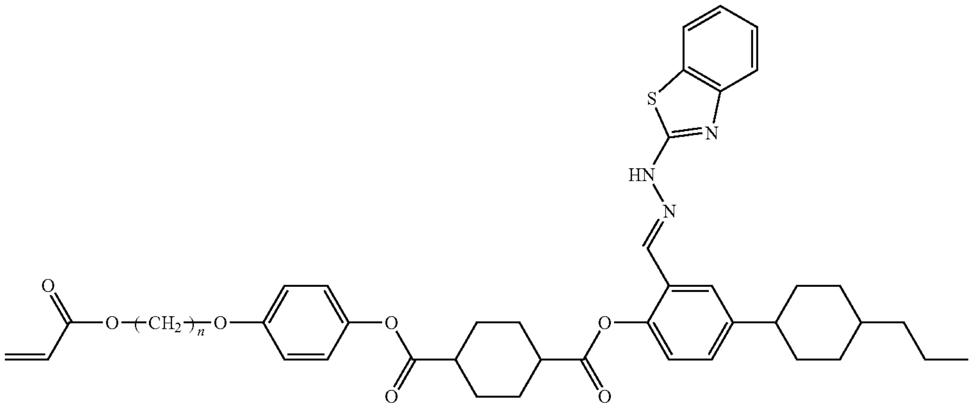
(1-a-94)
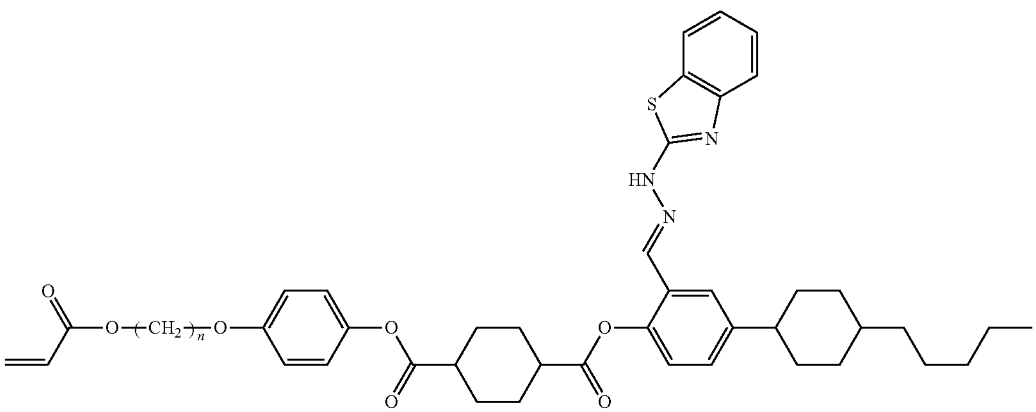
(1-a-95)
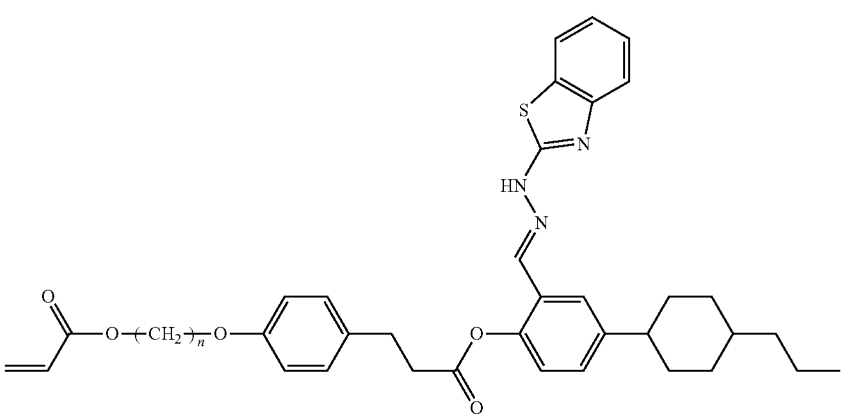

-continued
[Chem. 53]
(1-a-96)
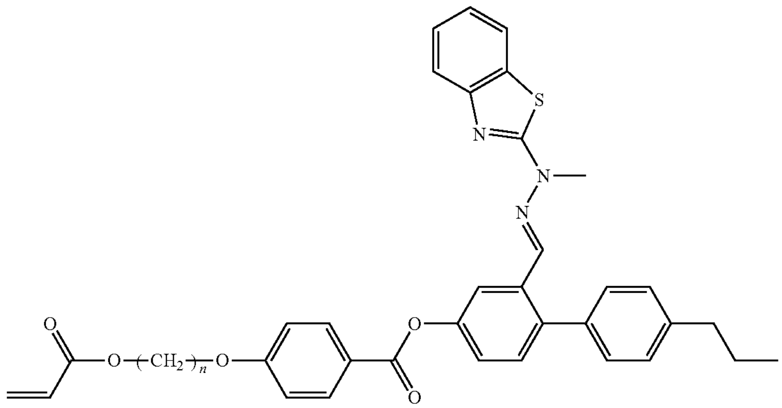
(1-a-97)
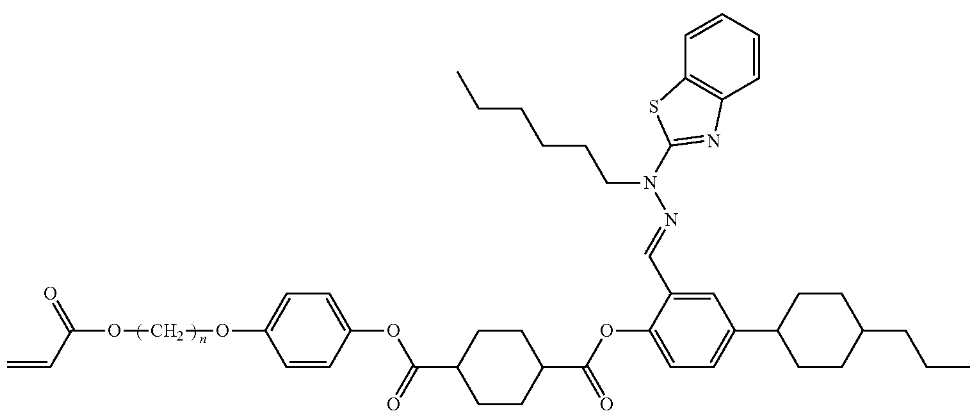
[Chem. 54]
(1-a-98)
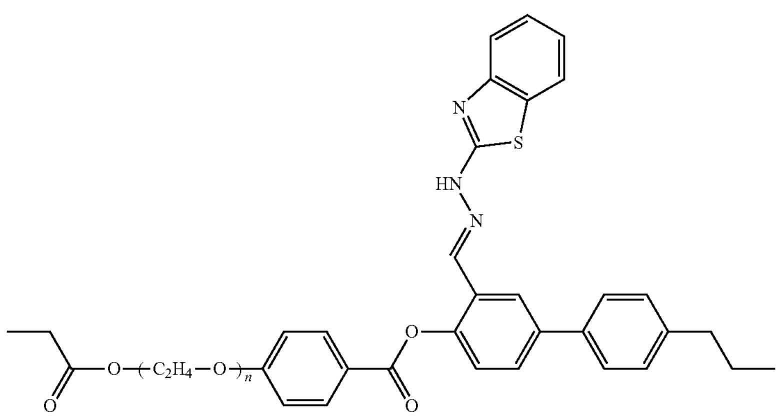

-continued
(1-a-99)
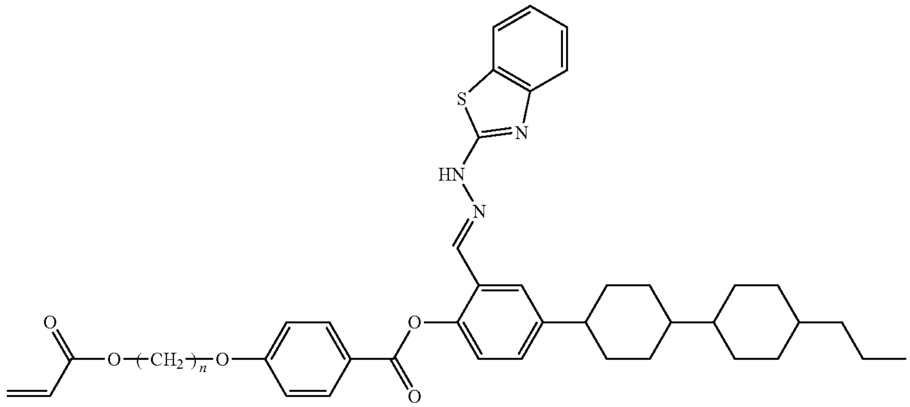
(1-a-100)
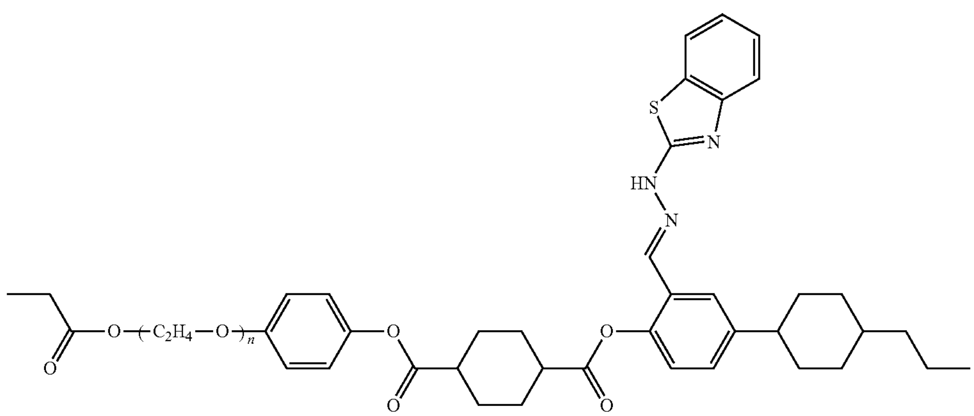
[Chem. 55]
(1-a-101)
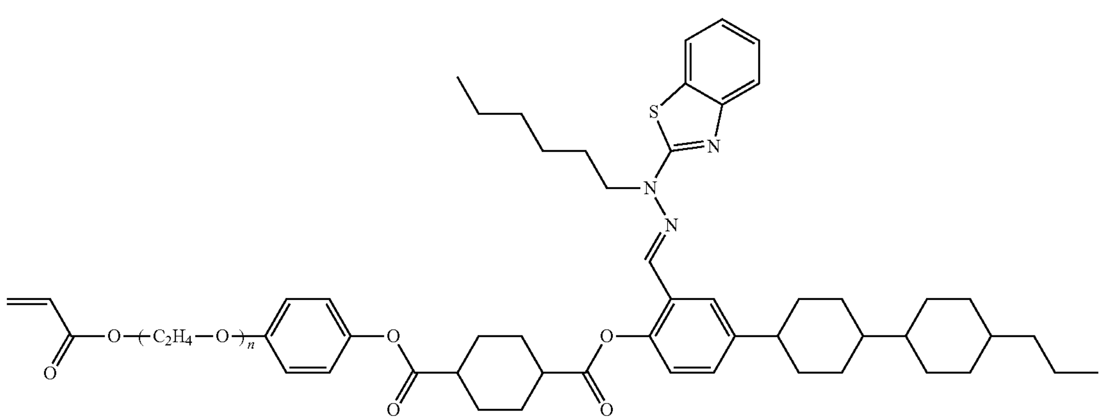

-continued
(1-a-102)
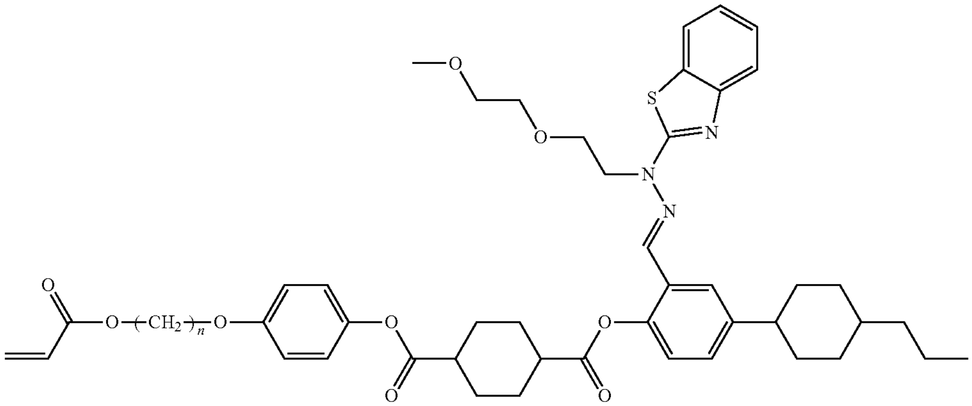
[Chem. 56]
(1-a-103)
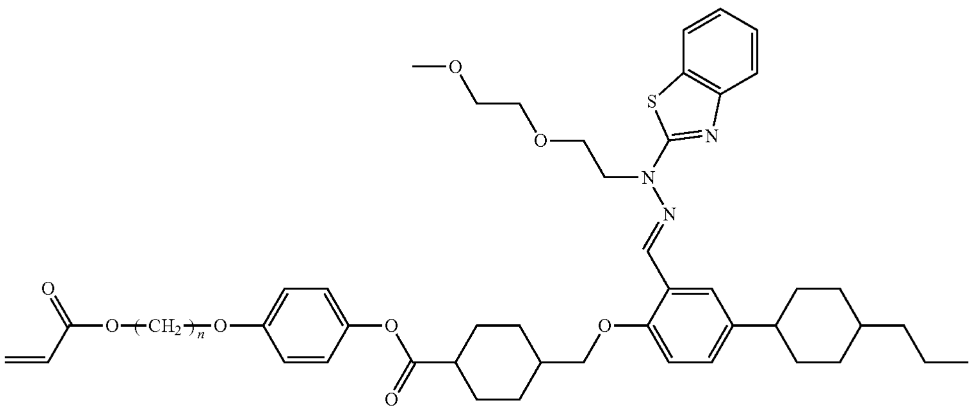
(1-a-104)
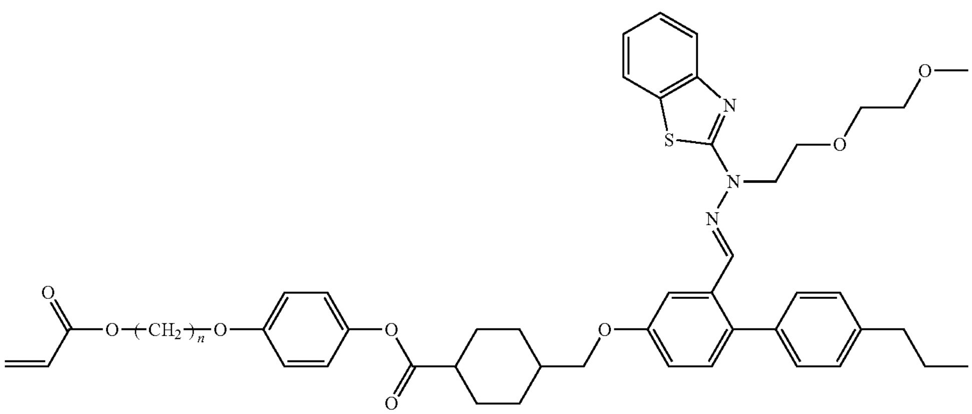

-continued
(1-a-105)
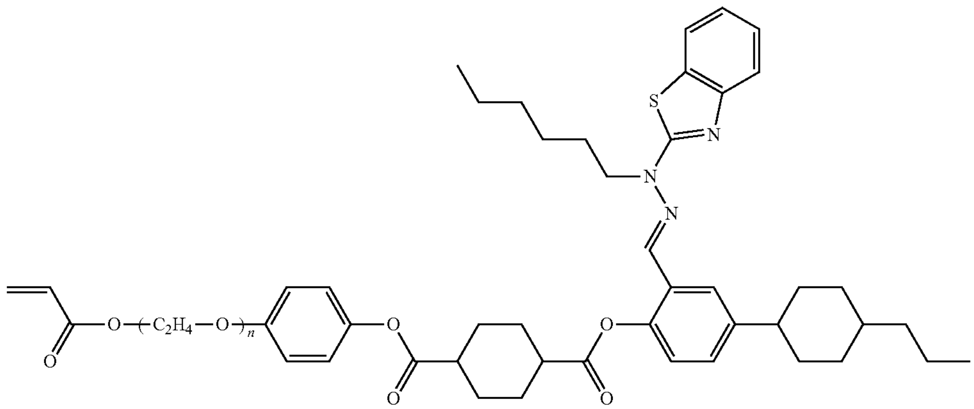
(in the above formulas, m11, n11, m, and n each represent an integer from 1 to 10). These liquid crystalline compounds may be used alone or as a mixture of two or more.
Specifically, the compound represented by general formula (2) is preferably compounds represented by the following formula (2-a-1) to formula (2-a-61):
[Chem. 57]
(2-a-1)
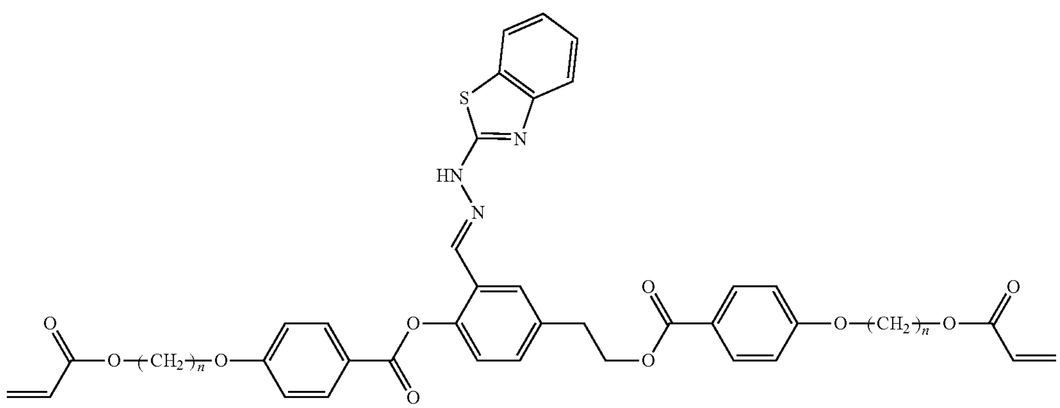
(2-a-2)
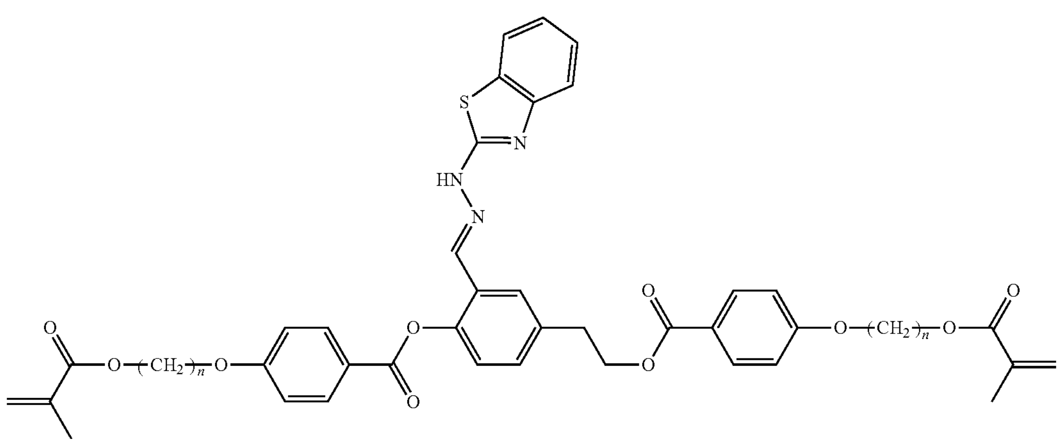

-continued
(2-a-3)
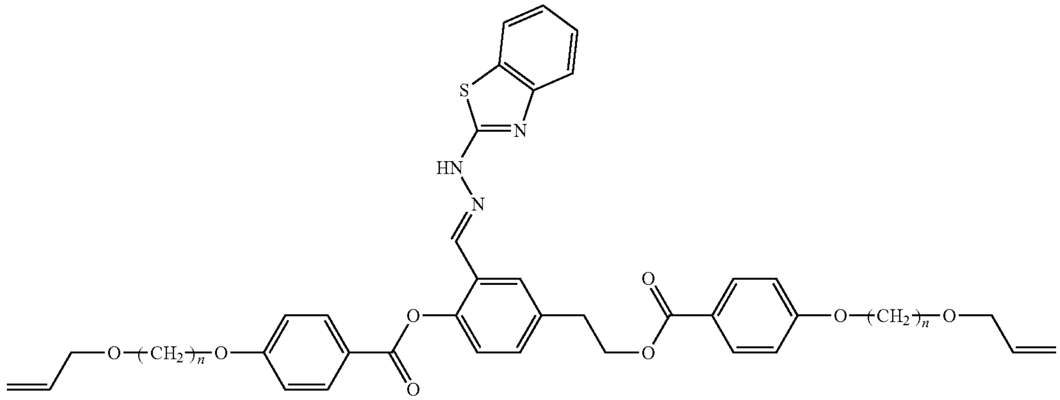
(2-a-4)
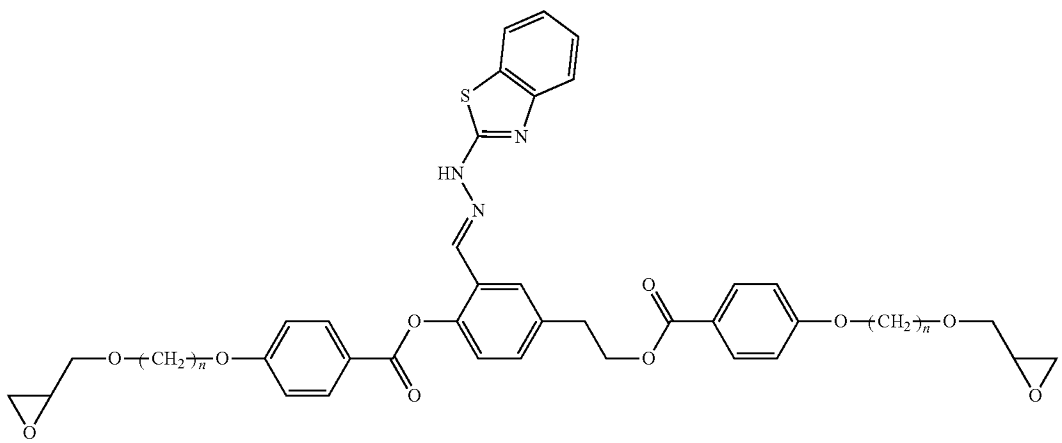
(2-a-5)
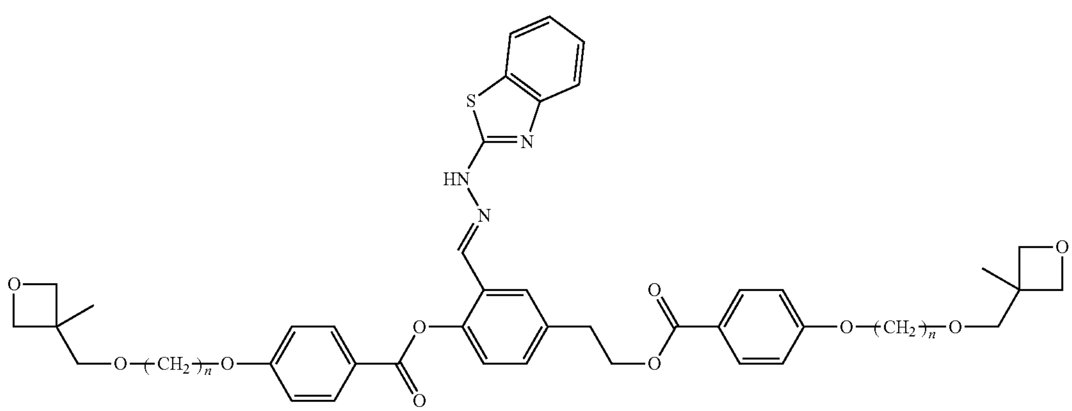

-continued
[Chem. 58]
(2-a-6)
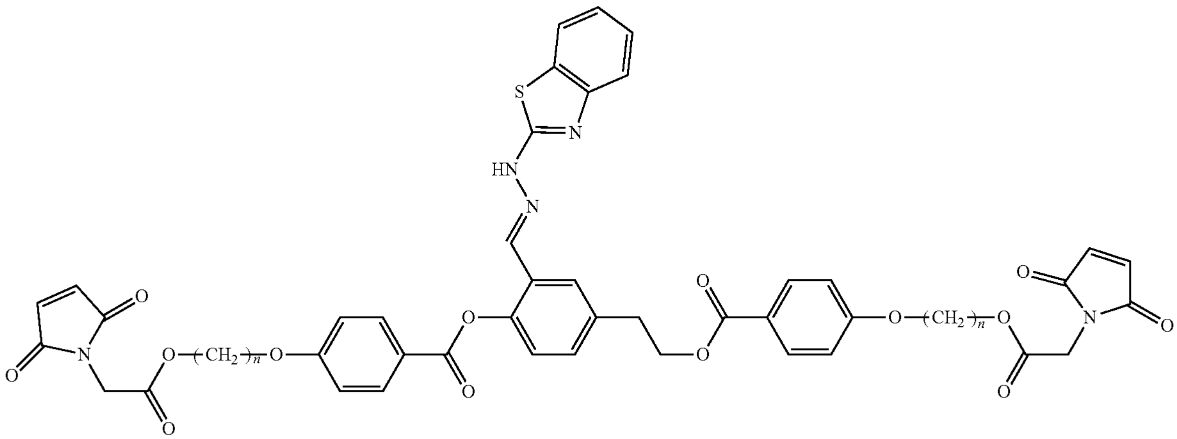
(2-a-7)
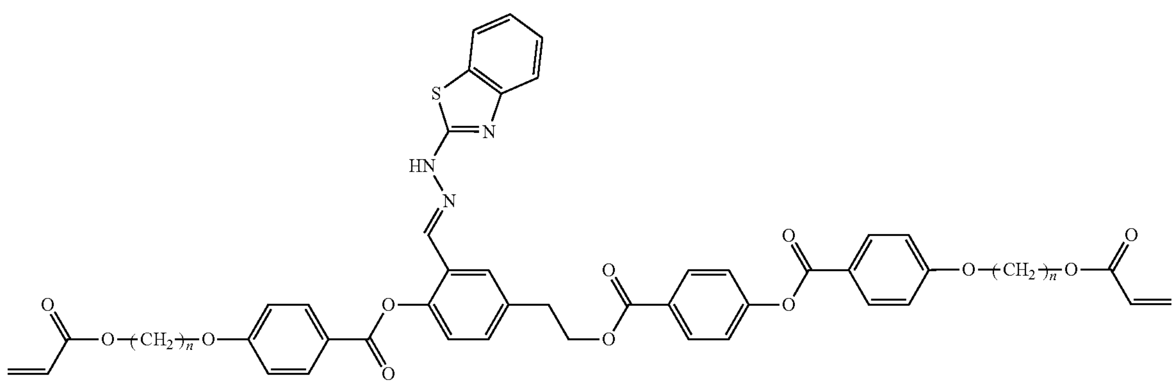
(2-a-8)
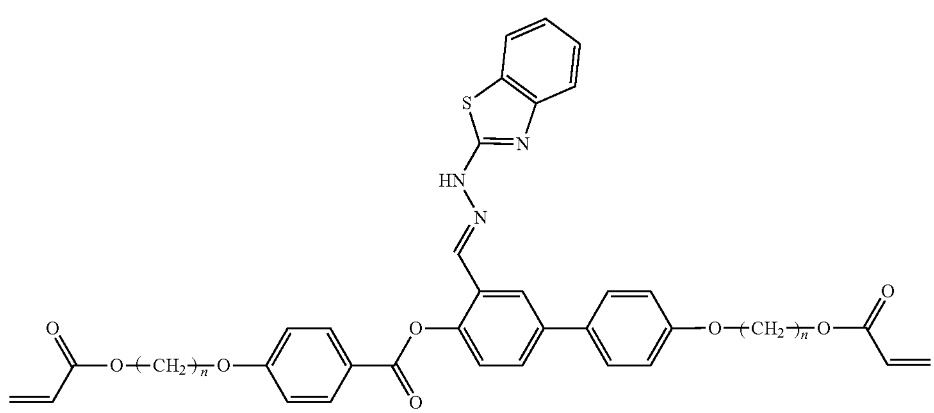

-continued
(2-a-9)
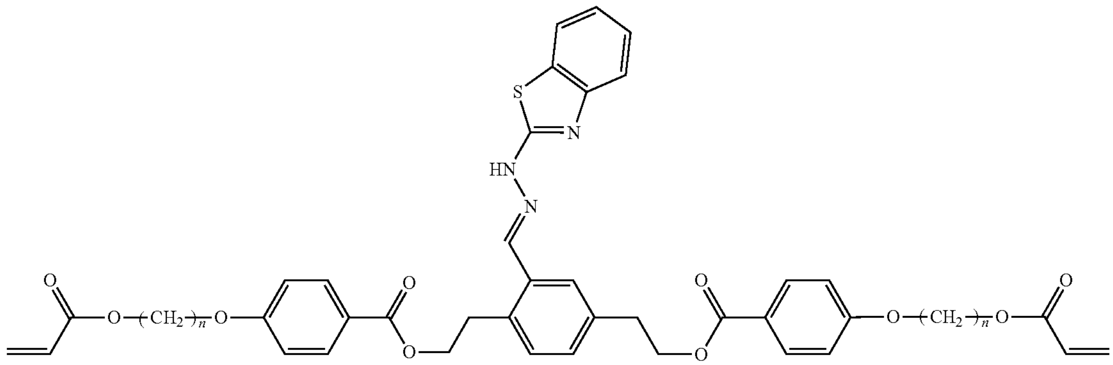
(2-a-10)
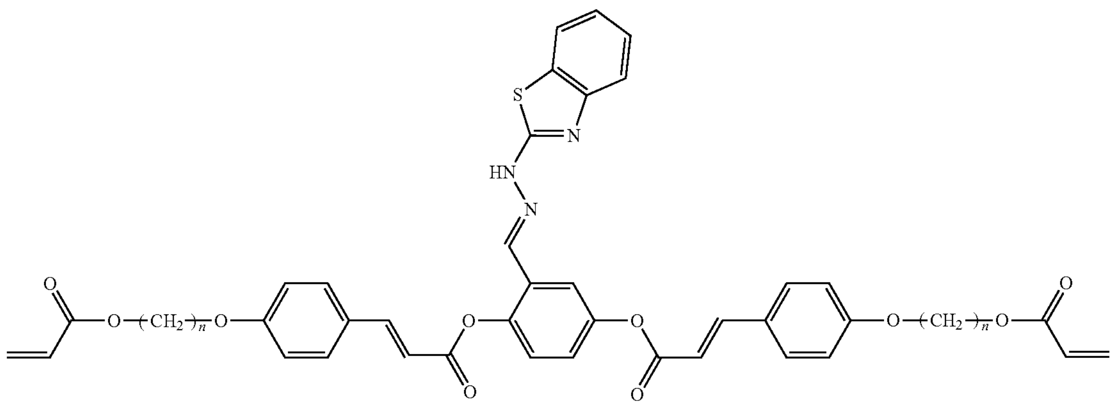
[Chem. 59]
(2-a-11)
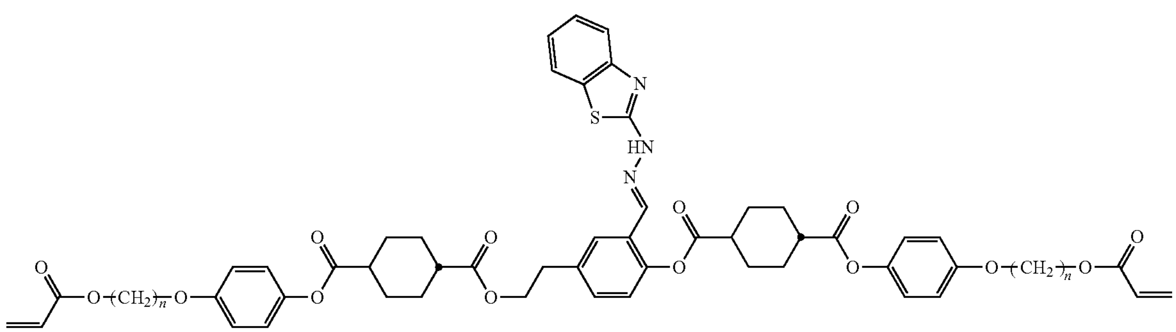
(2-a-12)
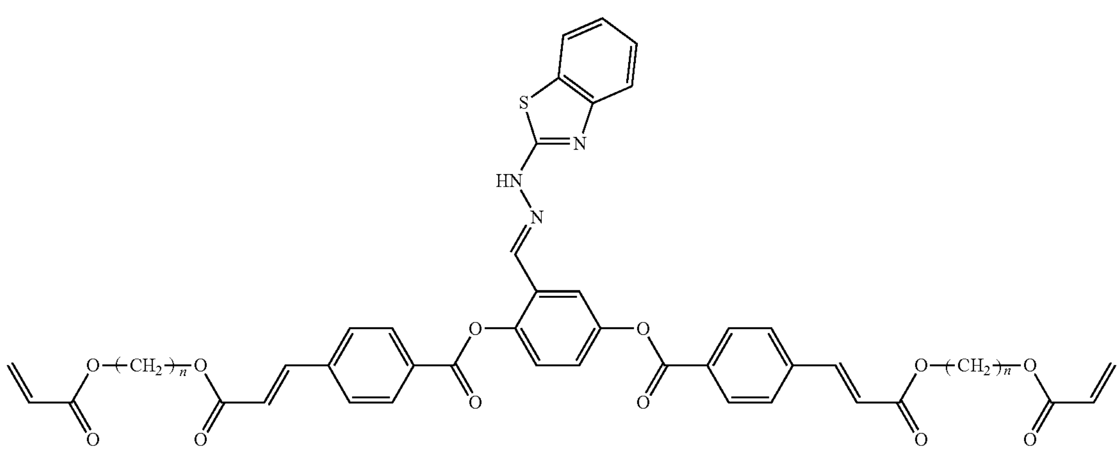

-continued
(2-a-13)
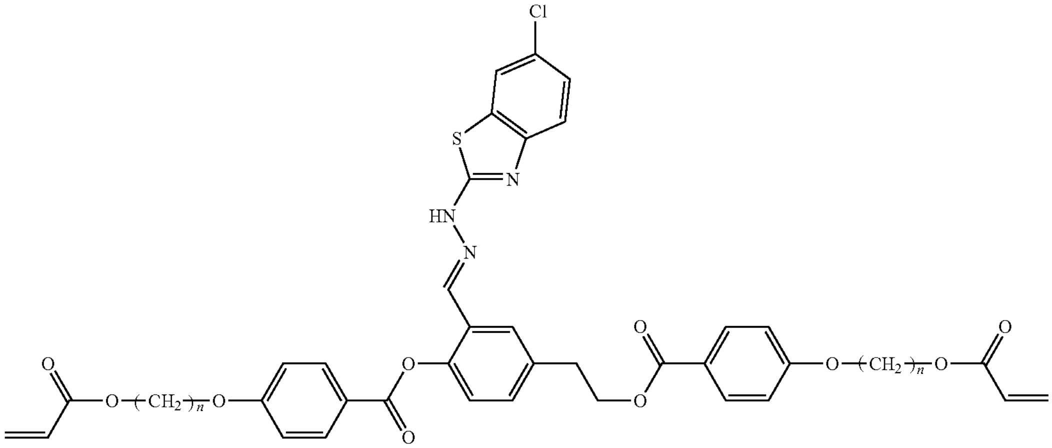
(2-a-14)
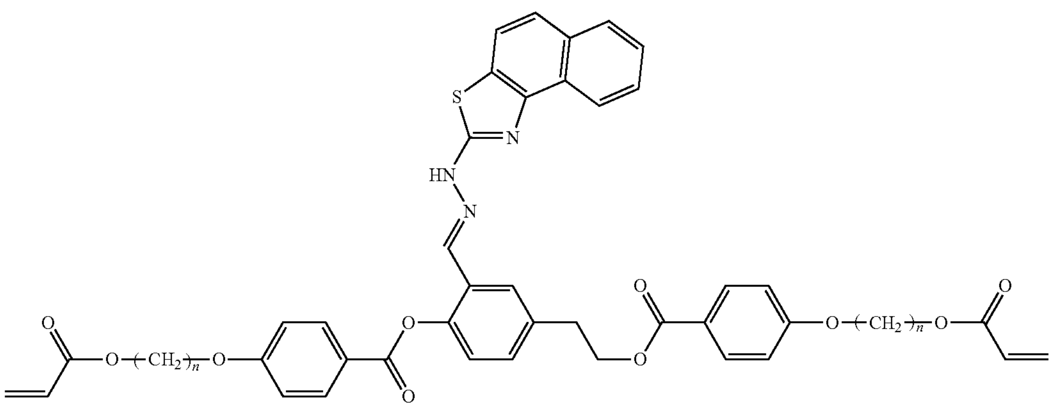
(2-a-15)
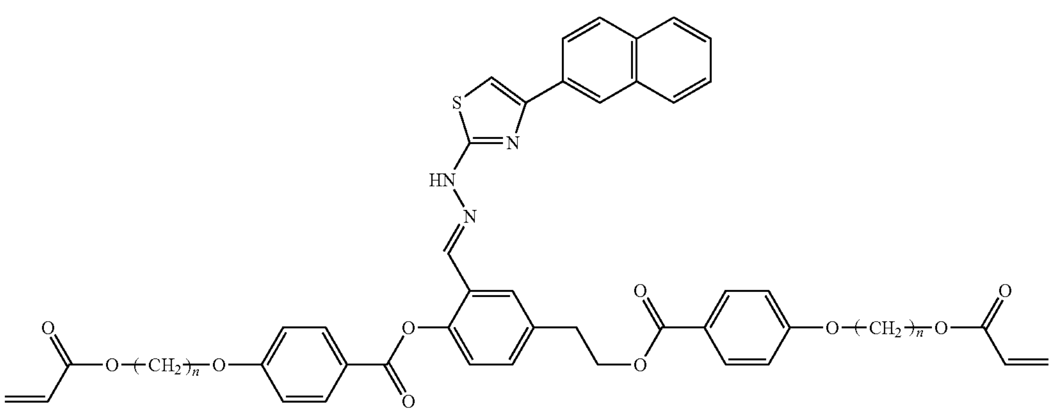

-continued
[Chem. 60]
(2-a-16)
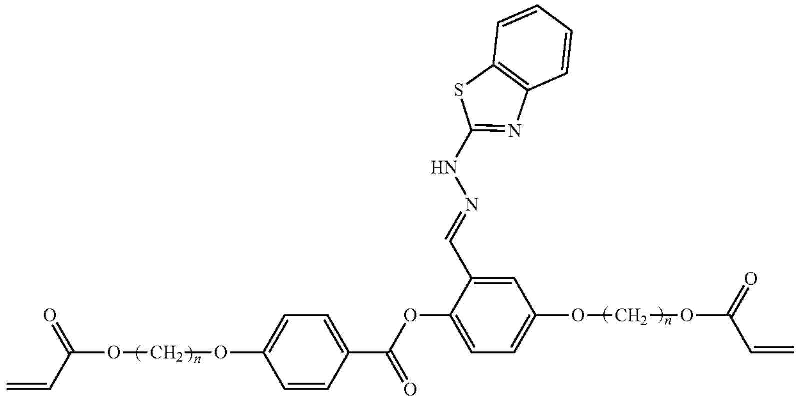
(2-a-17)
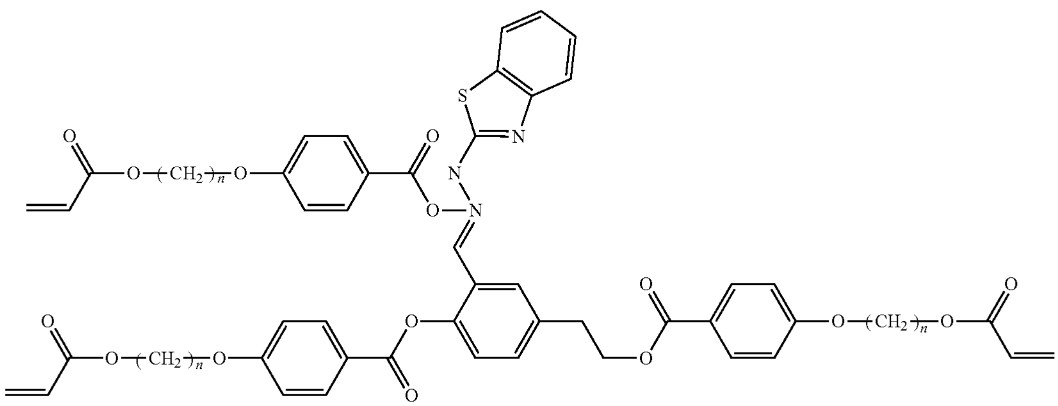
(2-a-18)
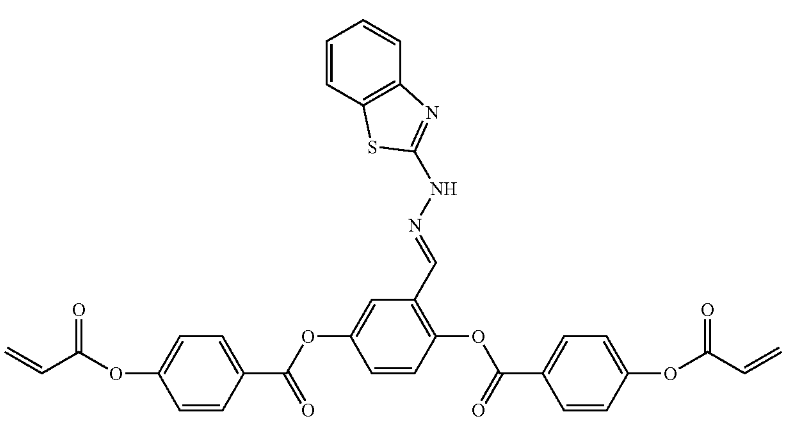

-continued
(2-a-19)
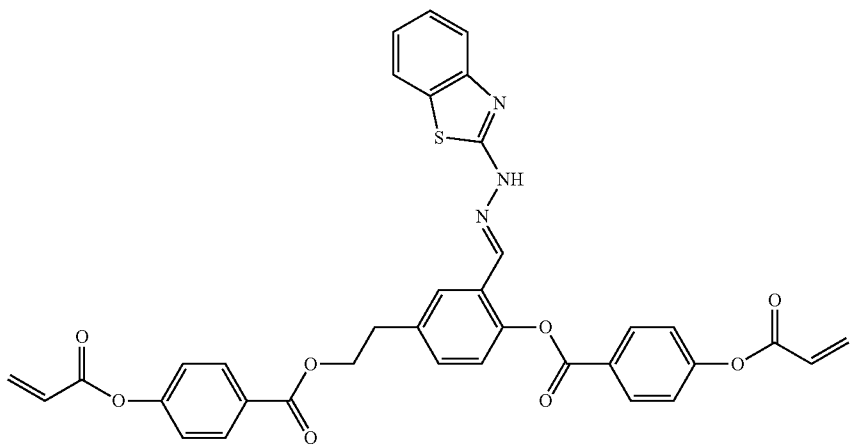
(2-a-20)
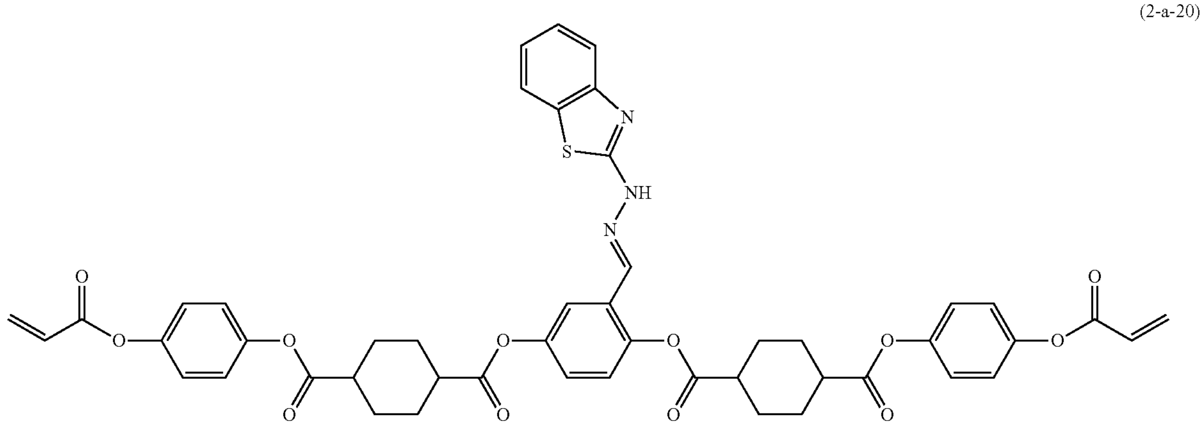
[Chem. 61]
(2-a-21)
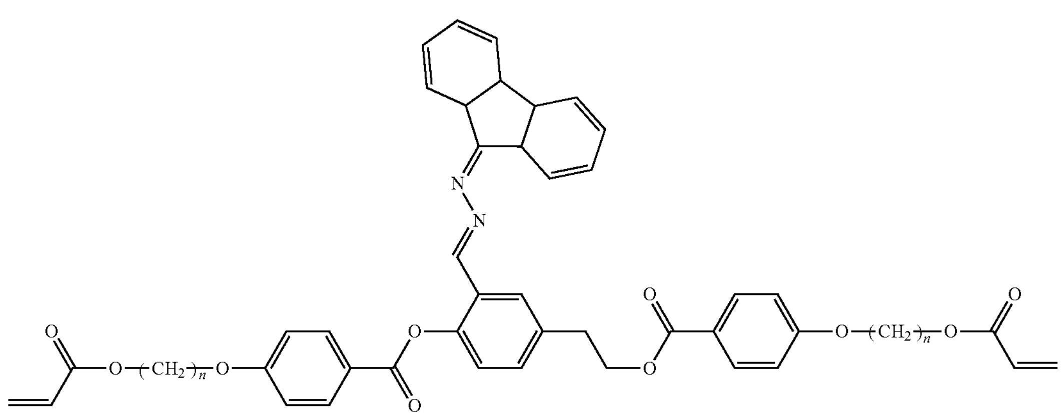

-continued
(2-a-22)
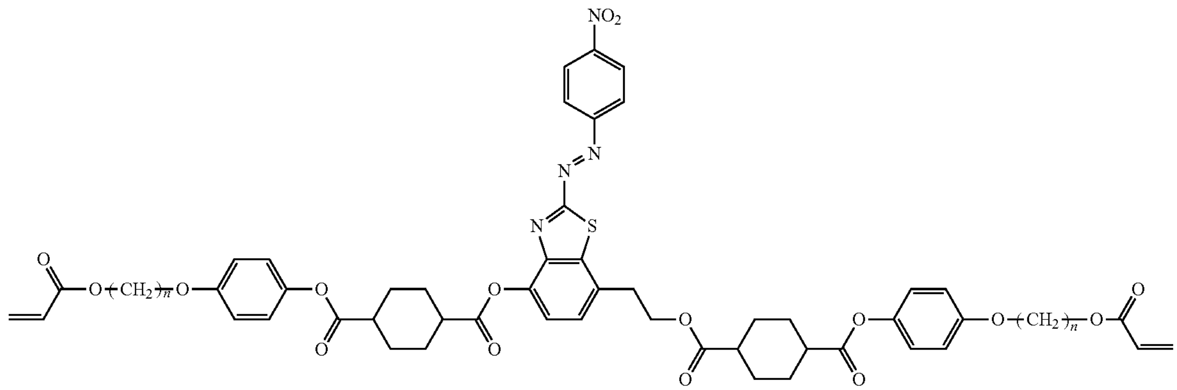
(2-a-23)
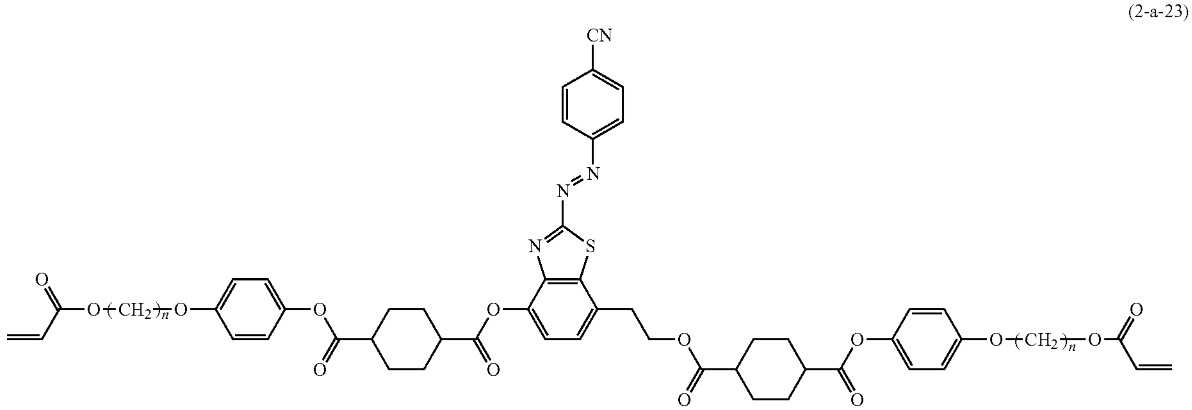
(2-a-24)
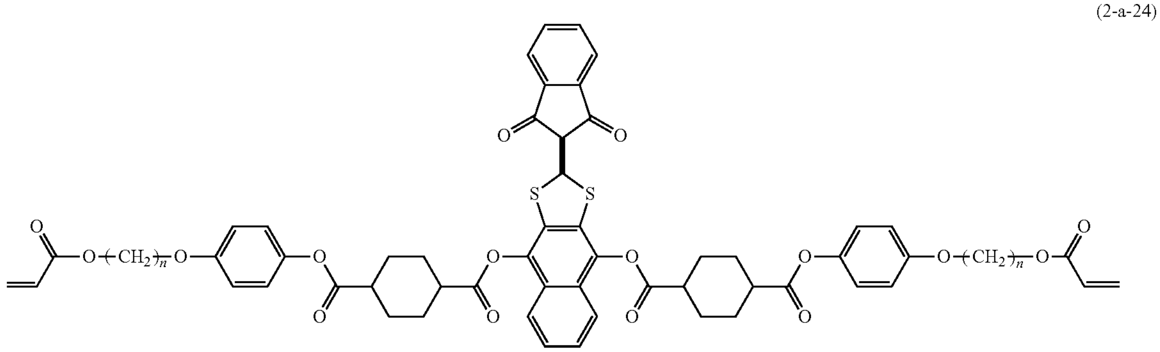
(2-a-25)
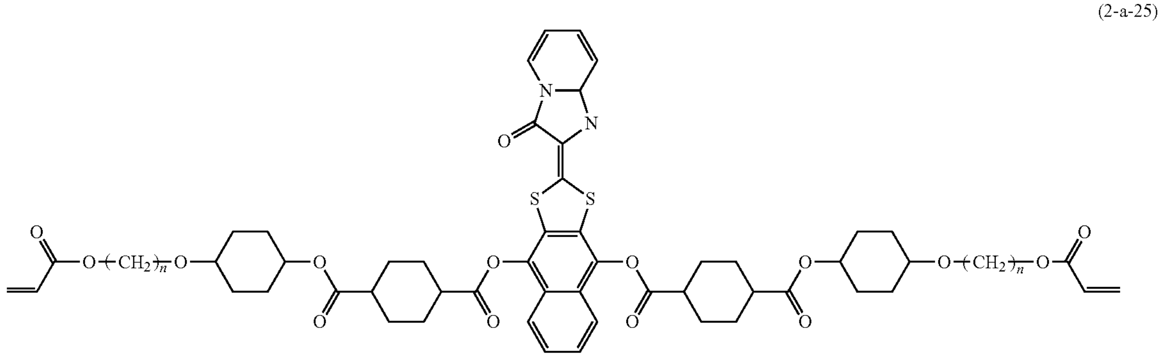

-continued
[Chem. 62]
(2-a-26)
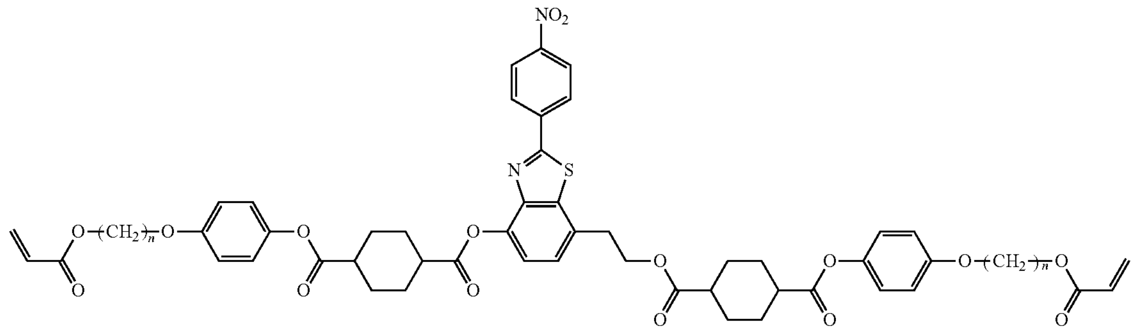
(2-a-27)
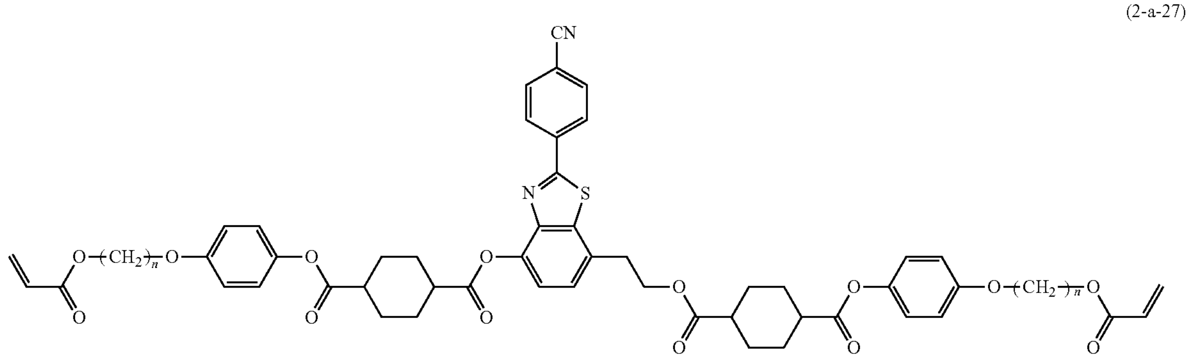
(2-a-28)
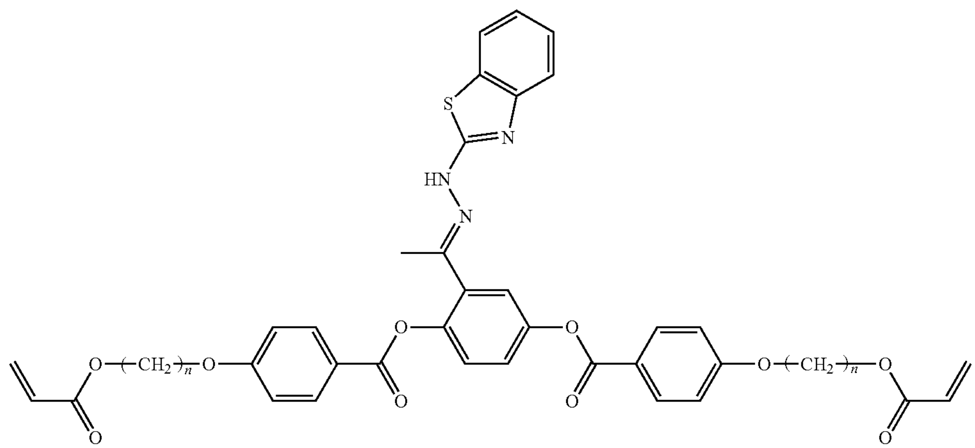
(2-a-29)
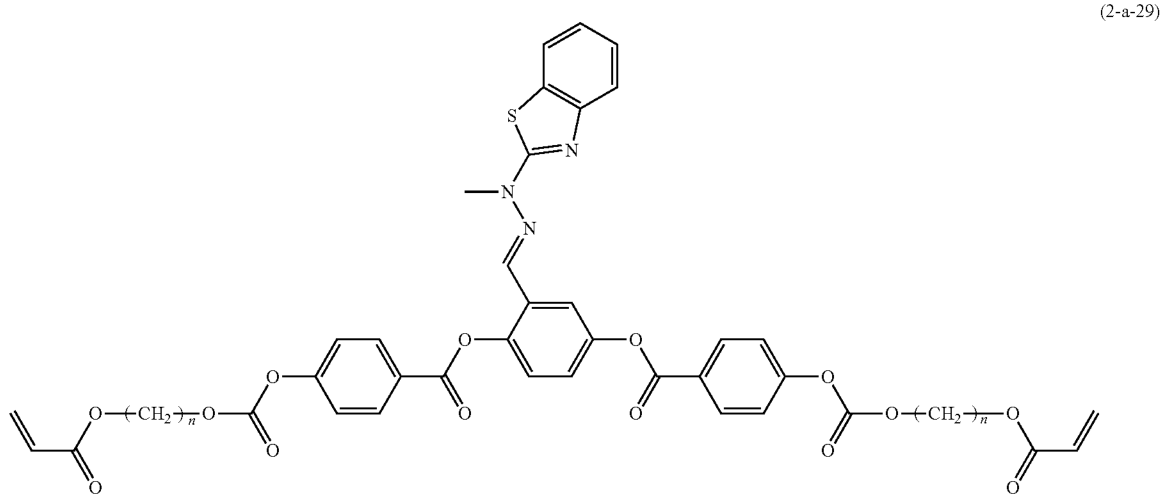

-continued
[Chem. 63]
(2-a-30)
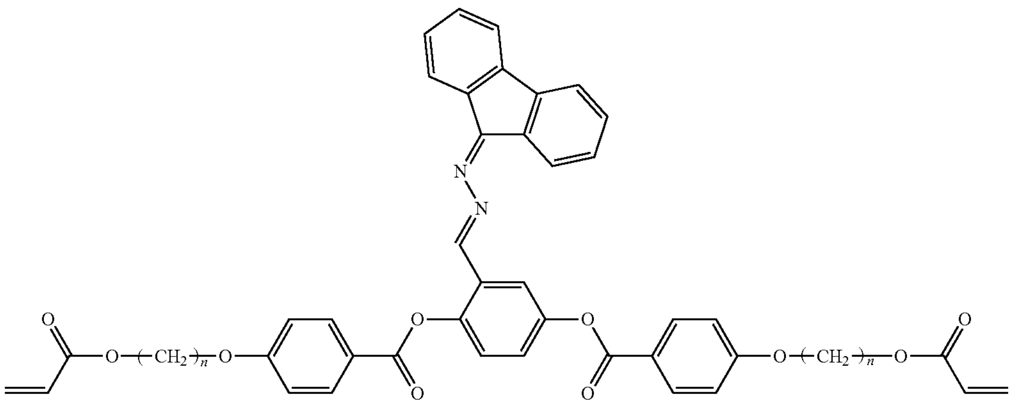
(2-a-31)
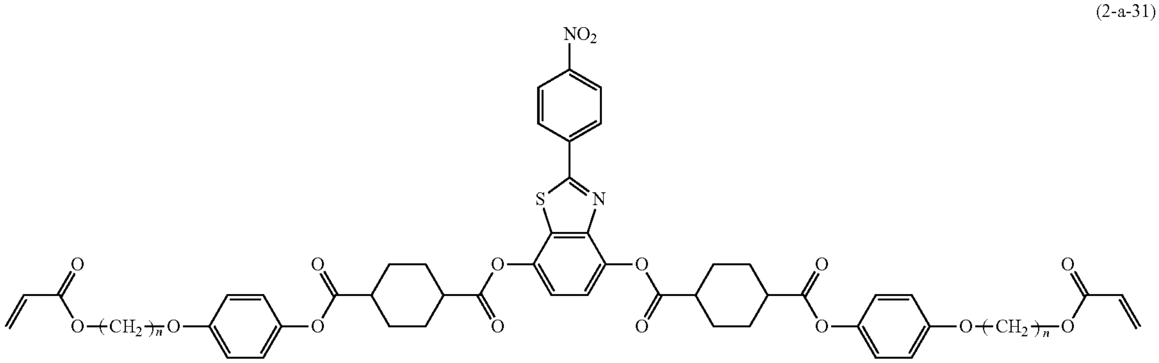
(2-a-32)
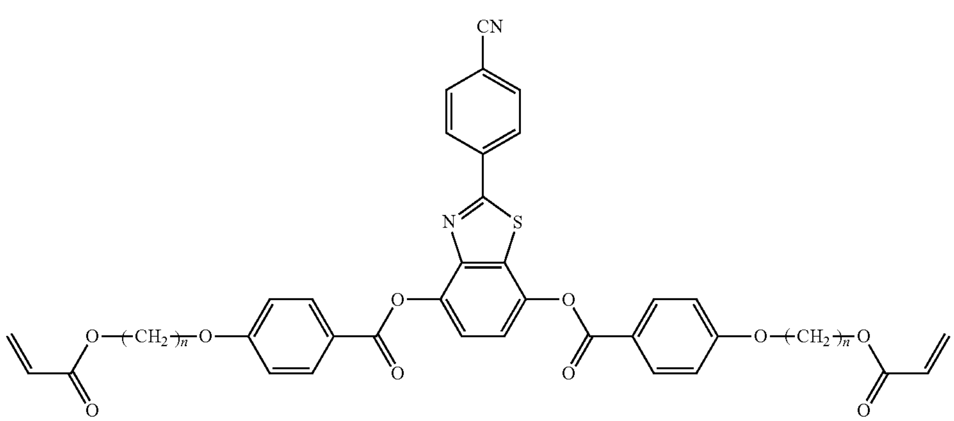

-continued
[Chem. 64]
(2-a-33)
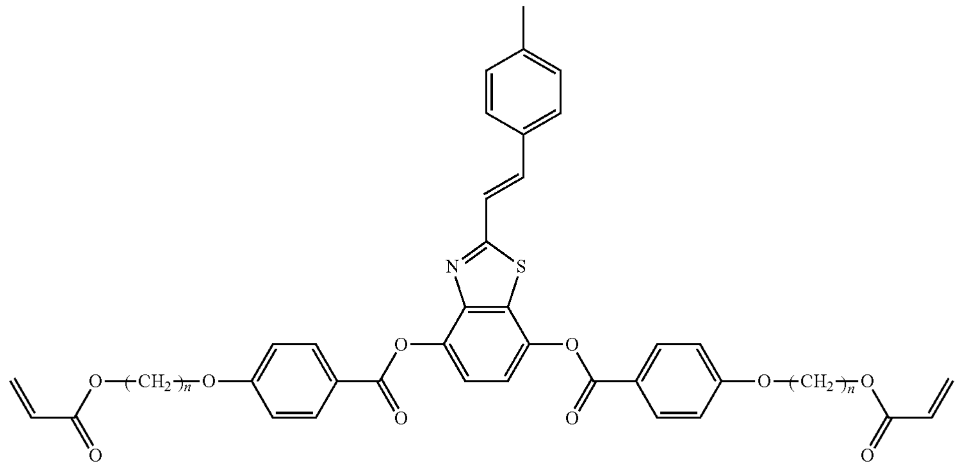
(2-a-34)
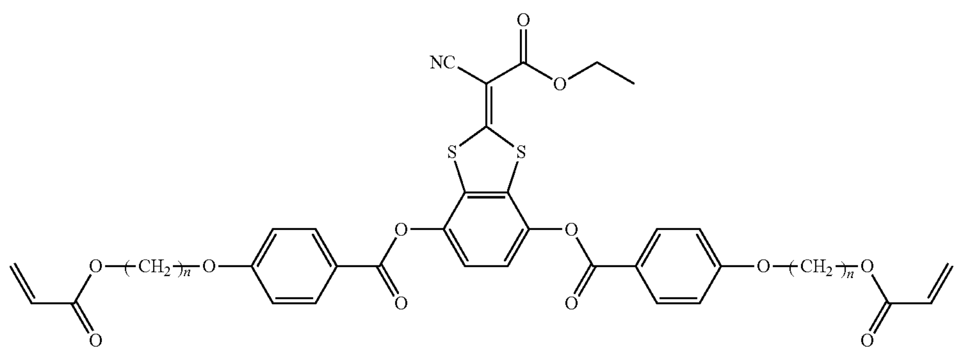
(2-a-35)
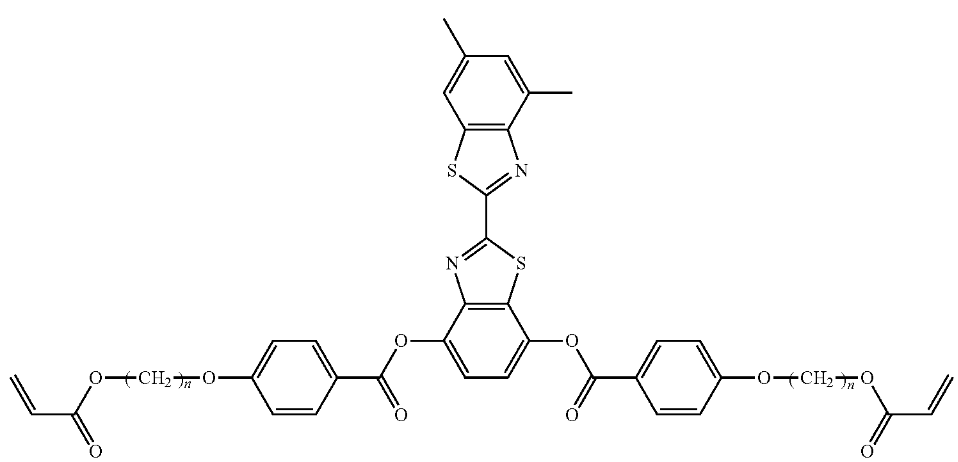

-continued
(2-a-36)
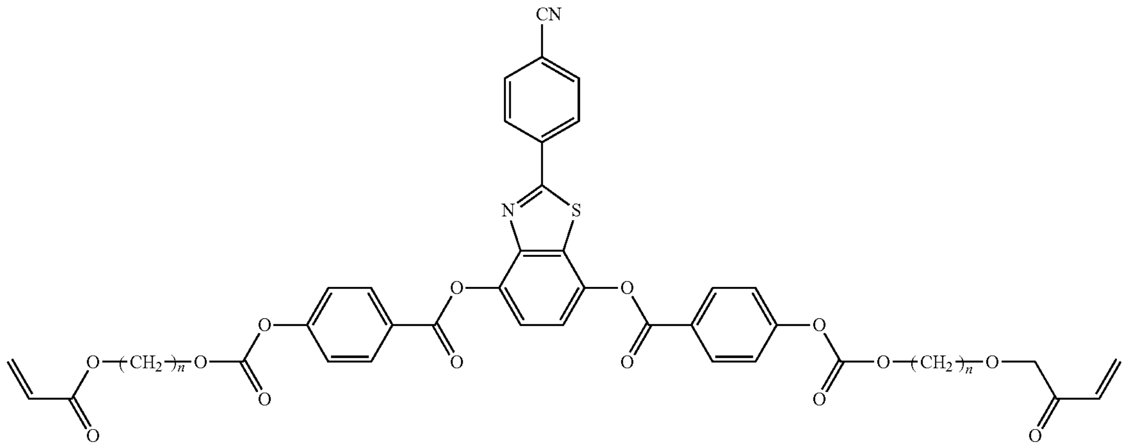
[Chem. 65]
(2-a-37)
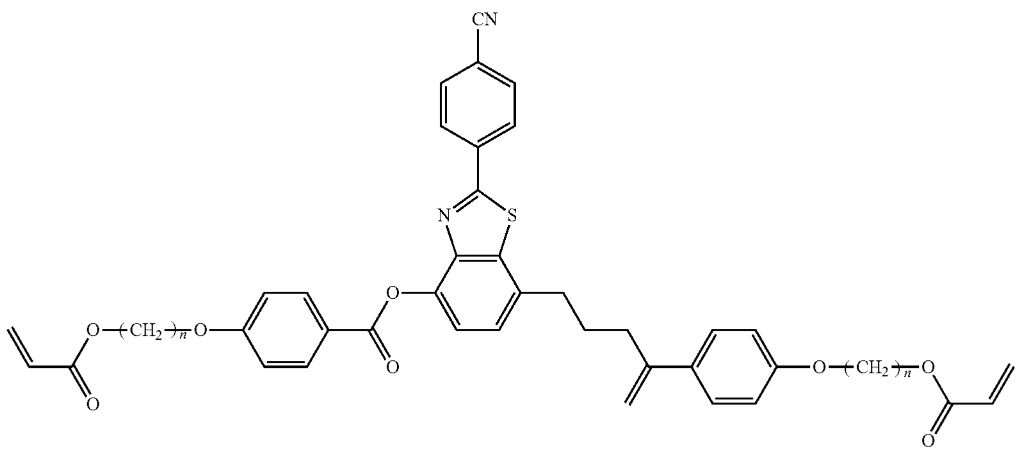
(2-a-38)
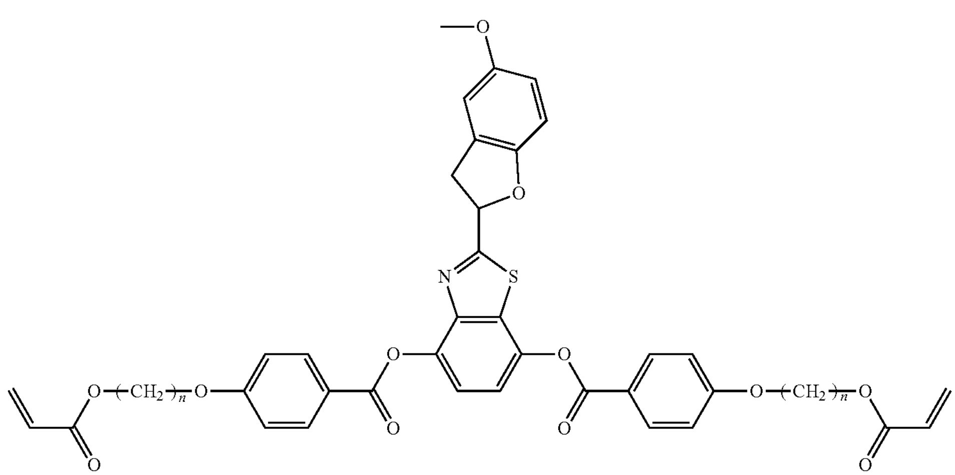

-continued
(2-a-39)
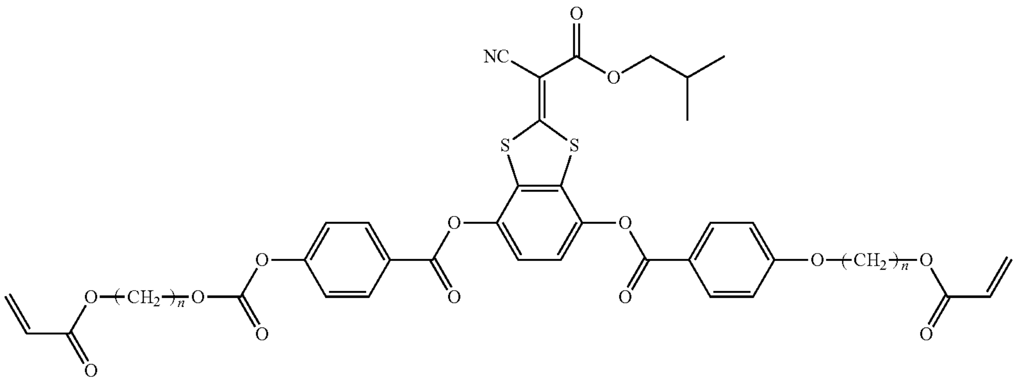
(2-a-40)
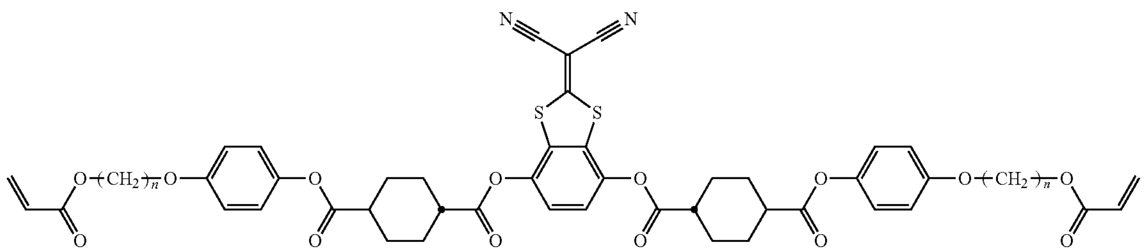
[Chem. 66]
(2-a-41)
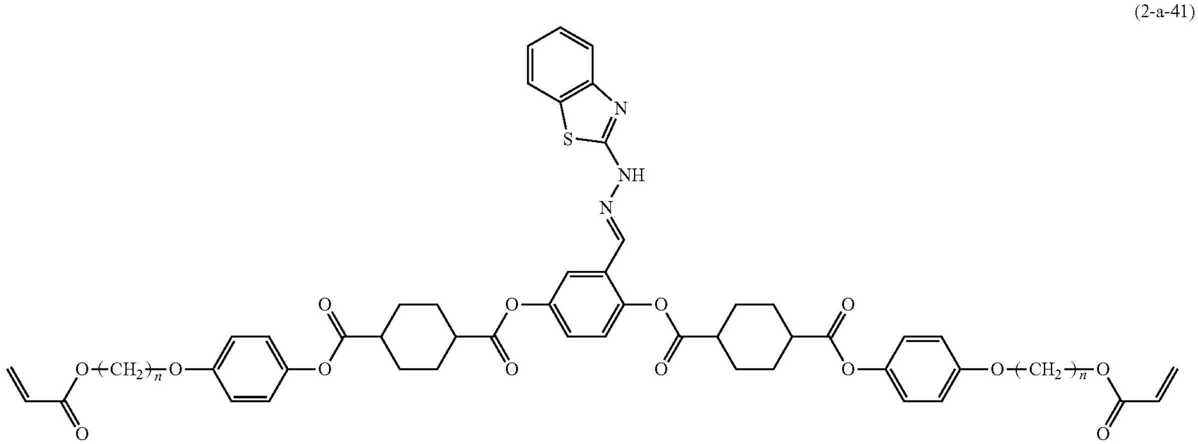
(2-a-42)
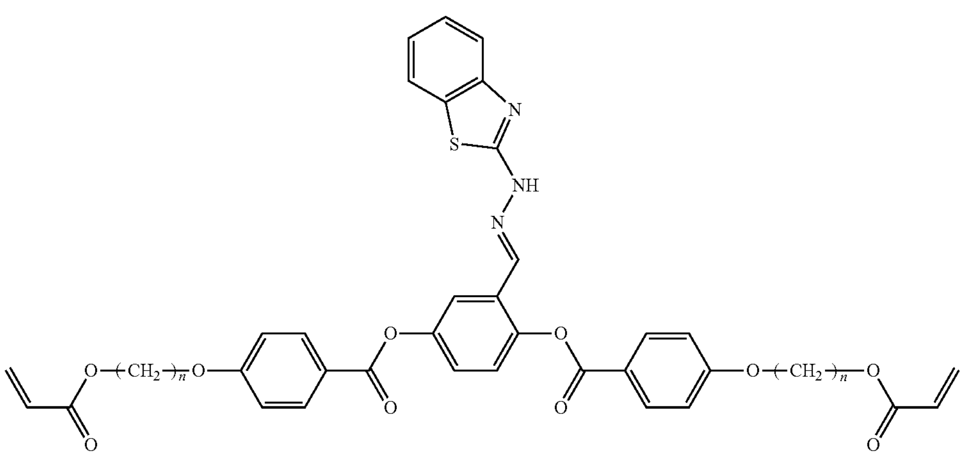

-continued
(2-a-43)
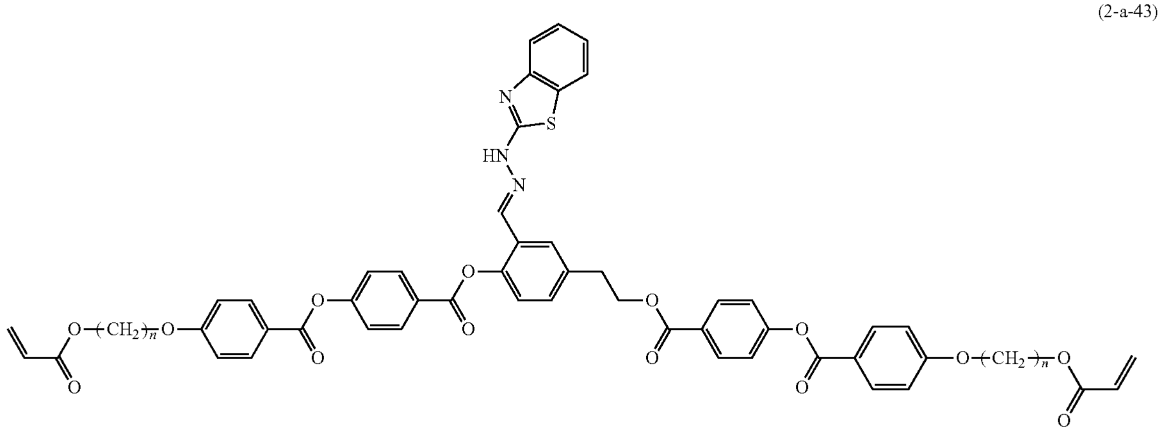
(2-a-44)
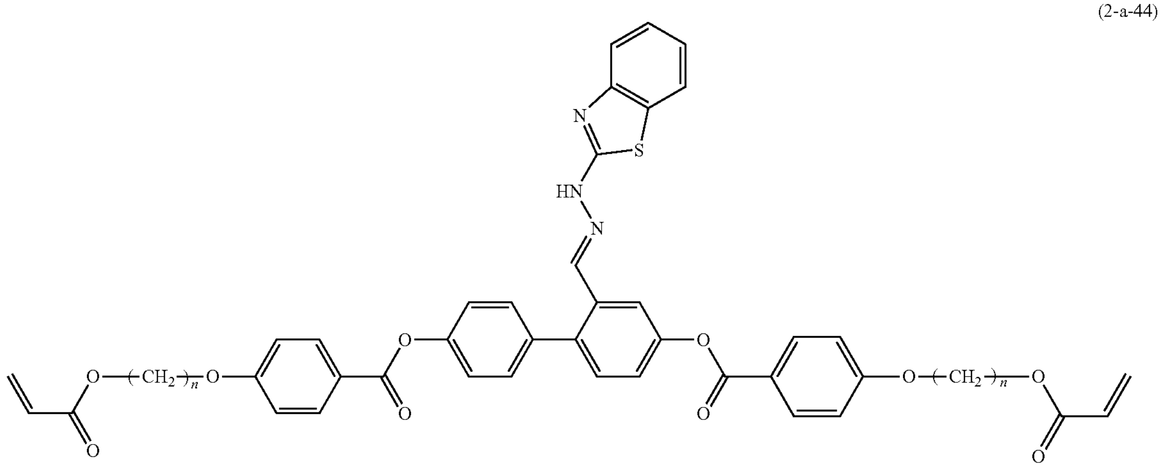
[Chem. 67]
(2-a-45)
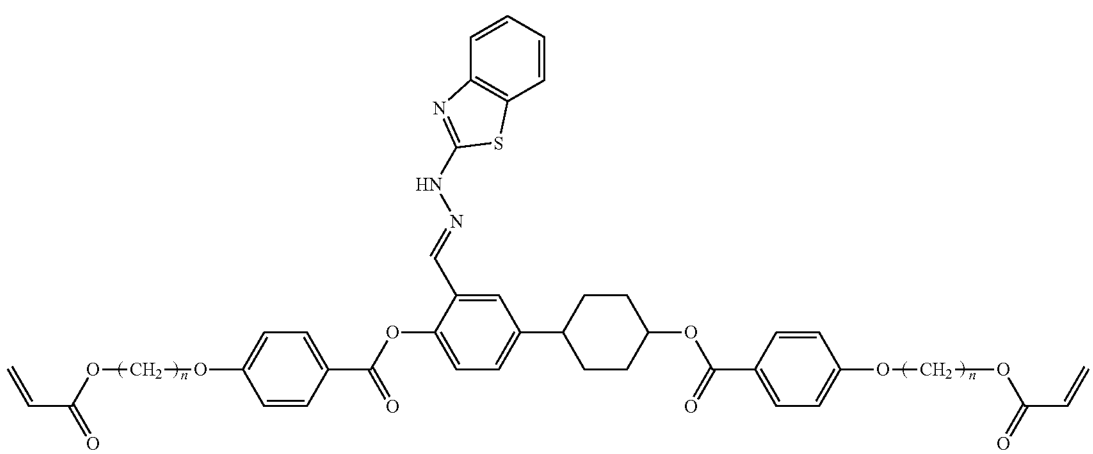
(2-a-46)
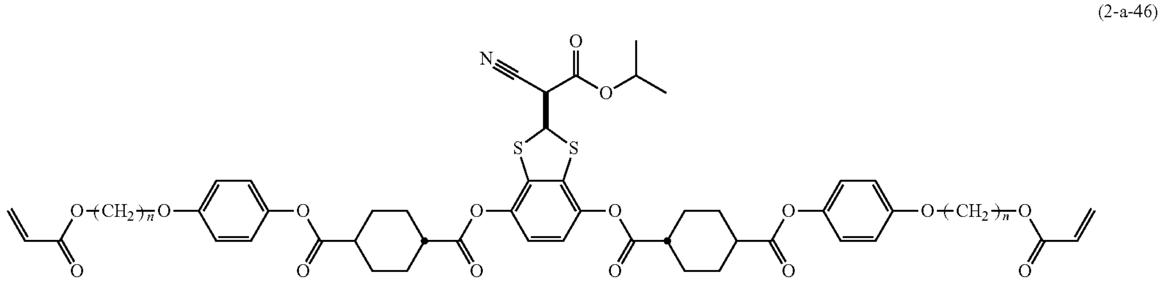

-continued
[Chem. 68]
(2-a-47)
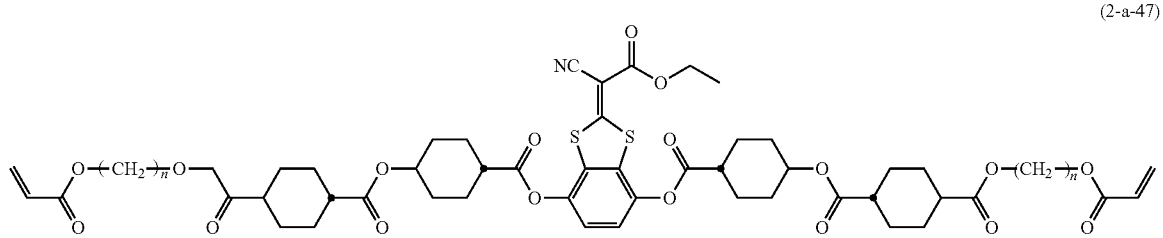
(2-a-48)
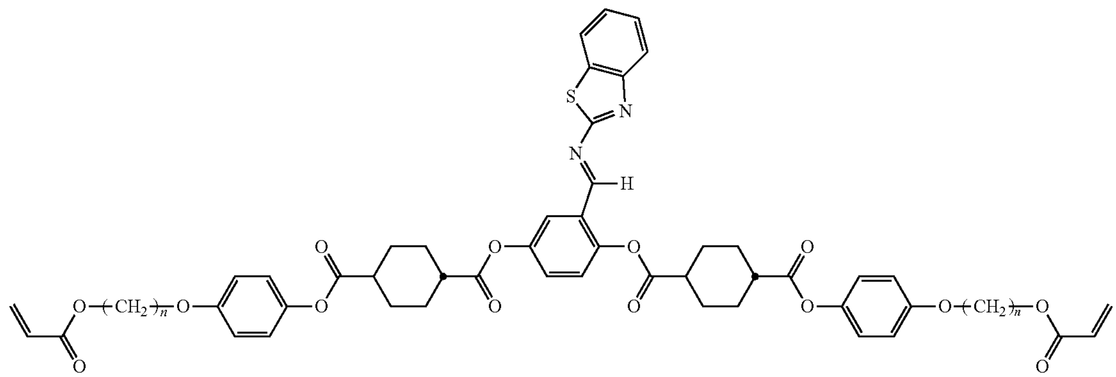
(2-a-49)
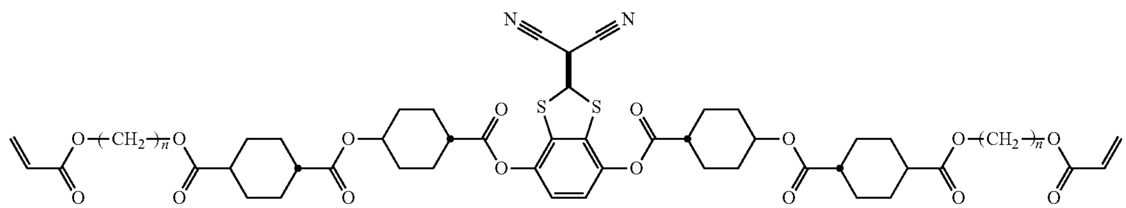
[Chem. 69]
(2-a-50)
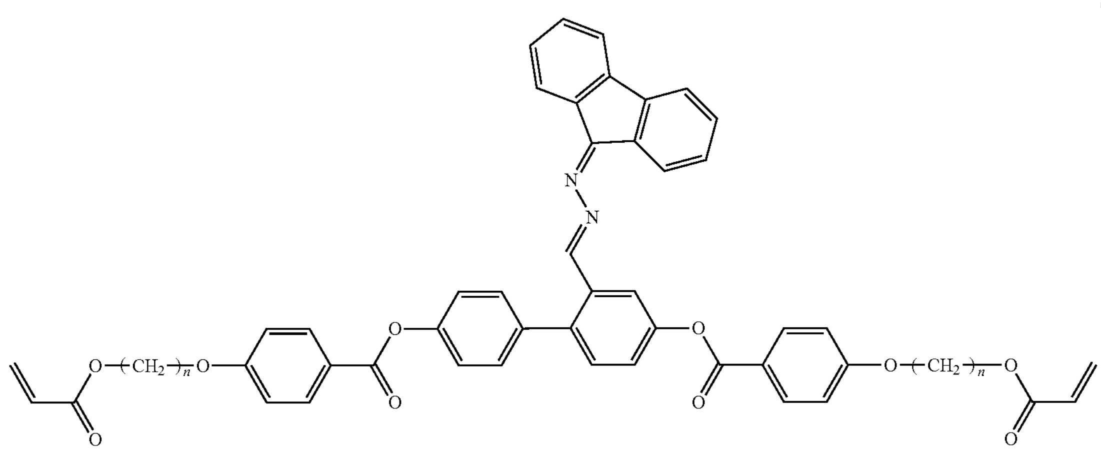
(2-a-51)
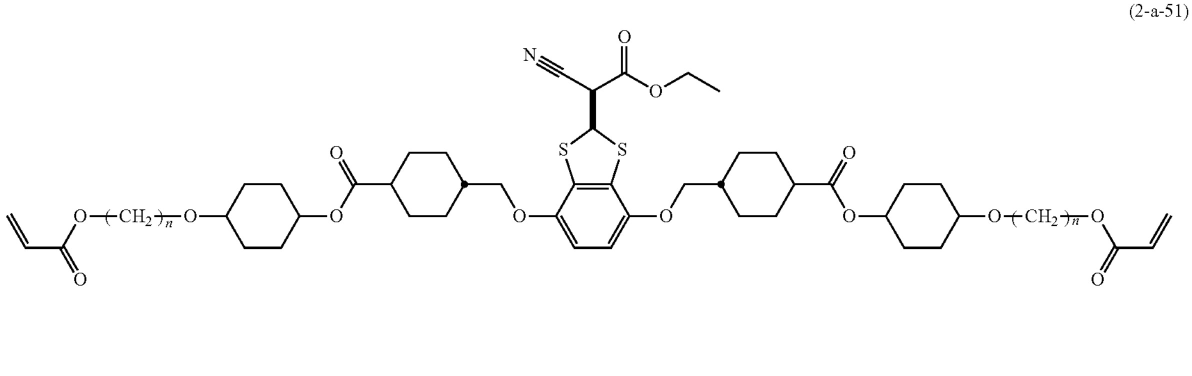

-continued
(2-a-52)
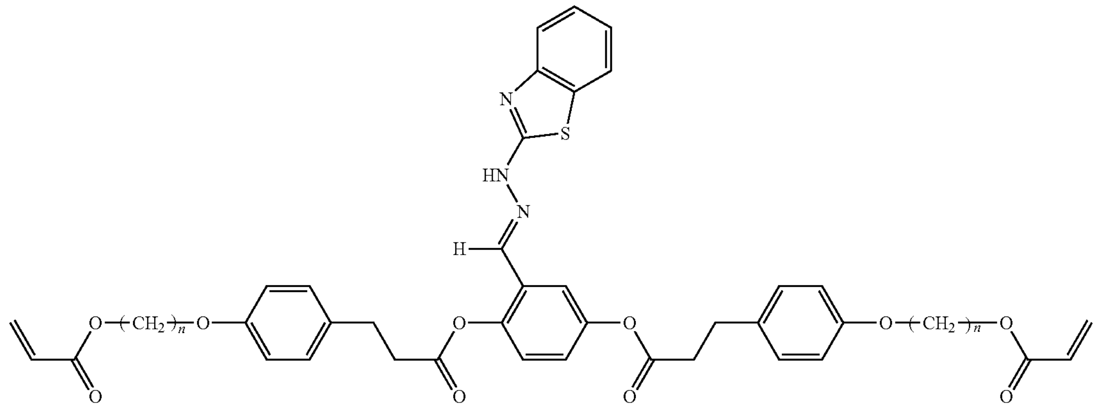
[Chem. 70]
(2-a-53)
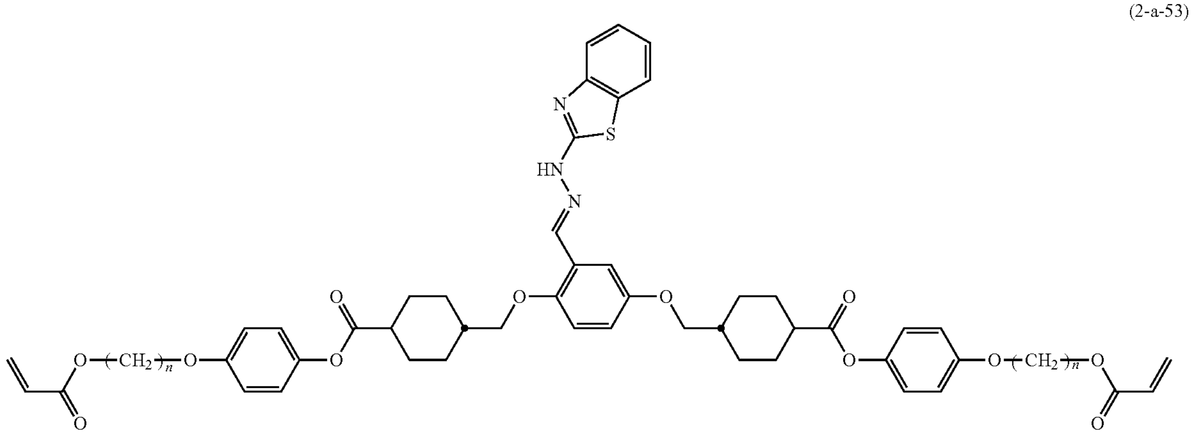
(2-a-54)
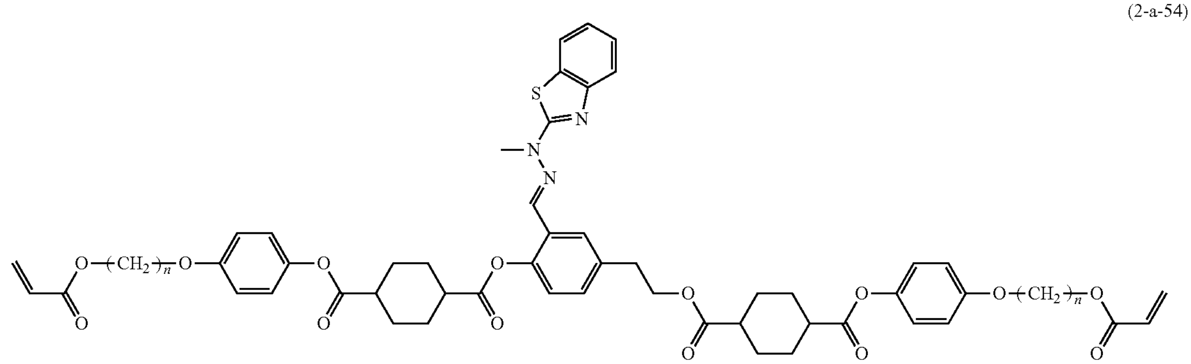
(2-a-55)
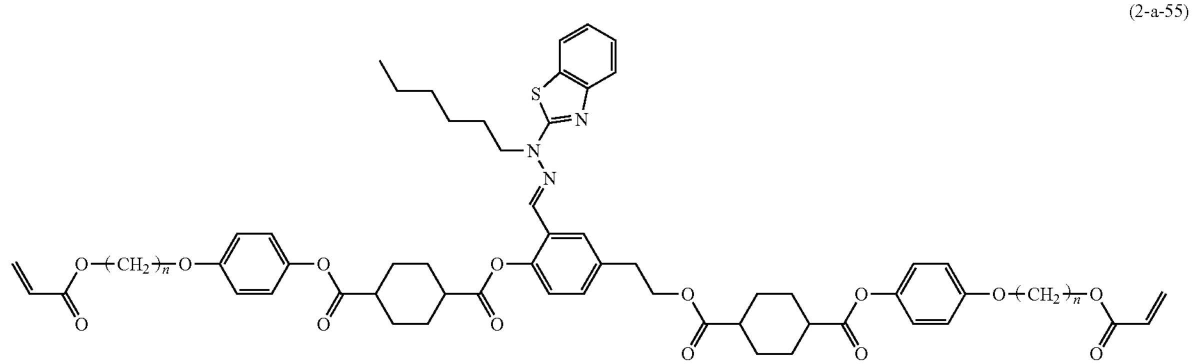

-continued
[Chem. 71]
(2-a-56)
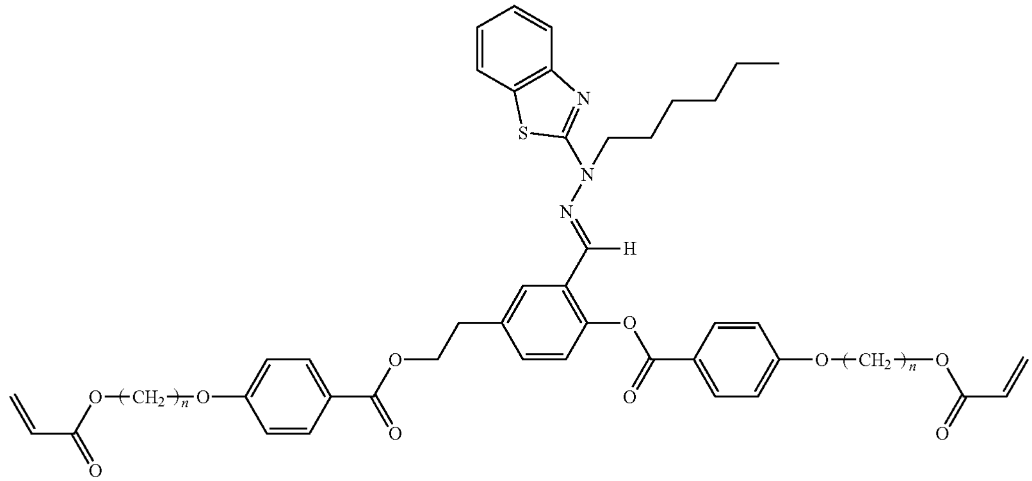
(2-a-57)
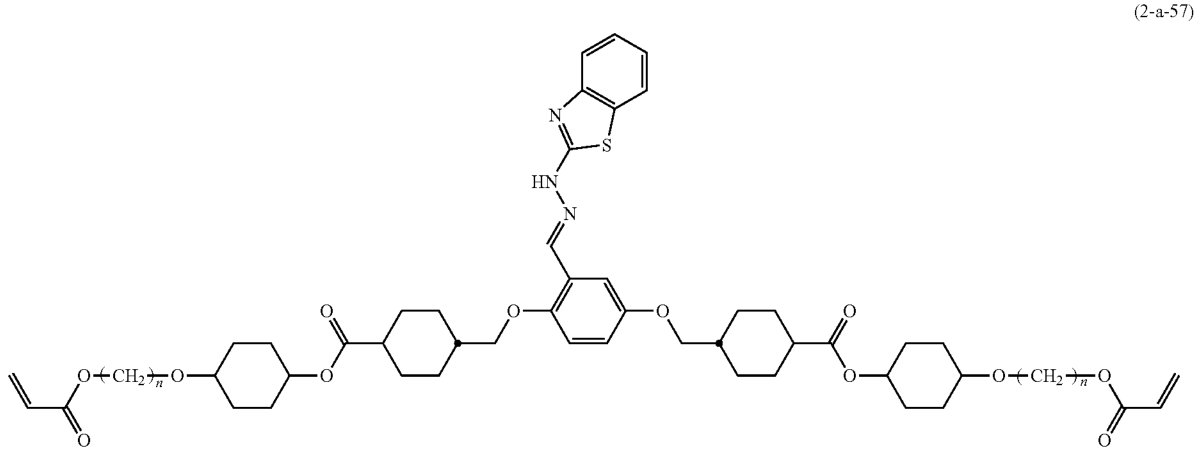
(2-a-58)
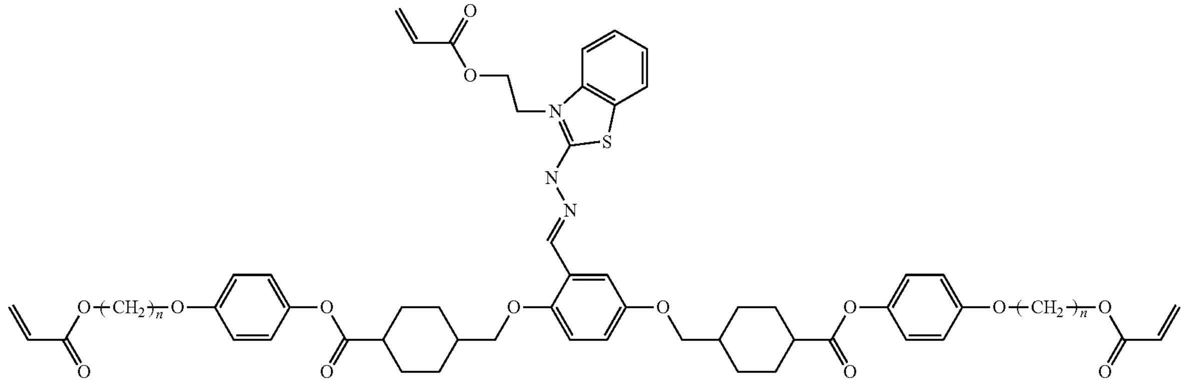

-continued
[Chem. 72]
(2-a-59)
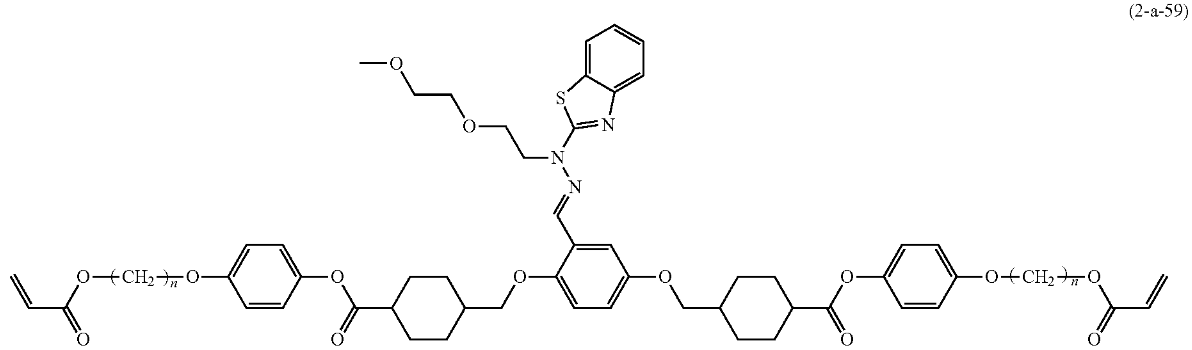
(2-a-60)
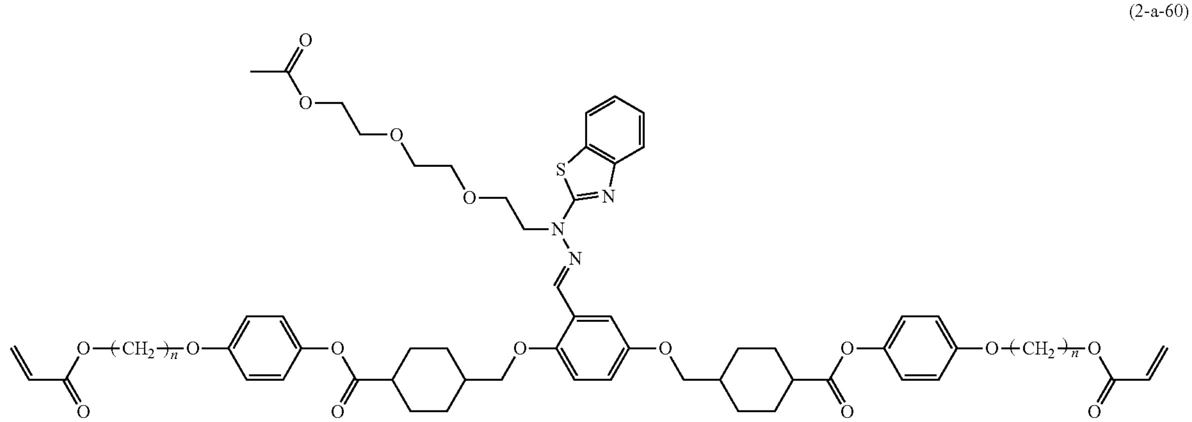
(2-a-61)
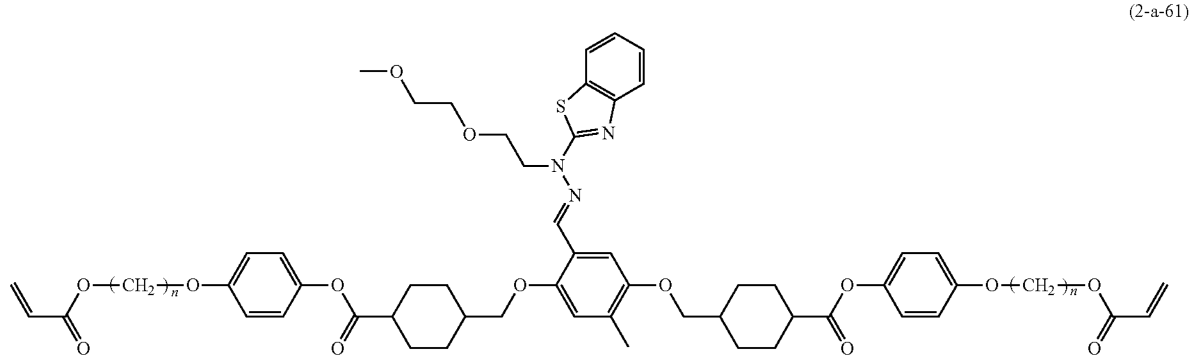
(in the above formulas, n represents an integer of 1 to 10). These liquid crystalline compounds may be used alone or as a mixture of two or more.

Specifically, the compound represented by general formula (3) is preferably compounds represented by the following formula (3-a-1) to formula (3-a-17):
[Chem. 73]
(3-a-1)
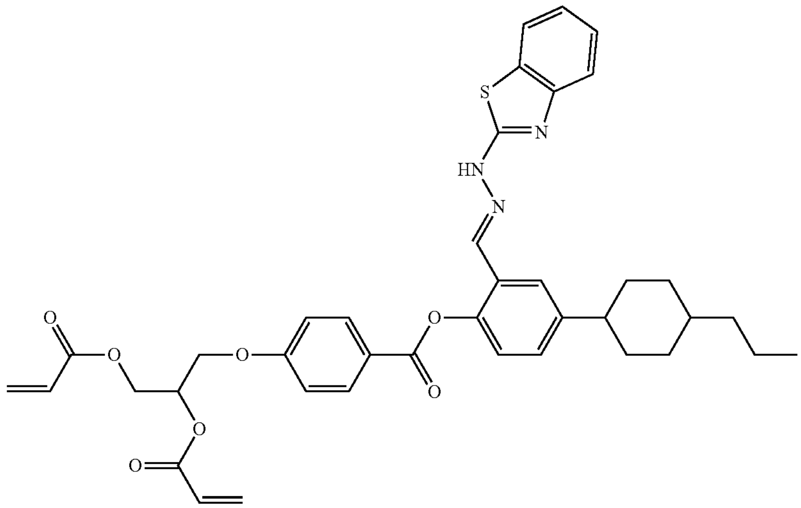
(3-a-2)
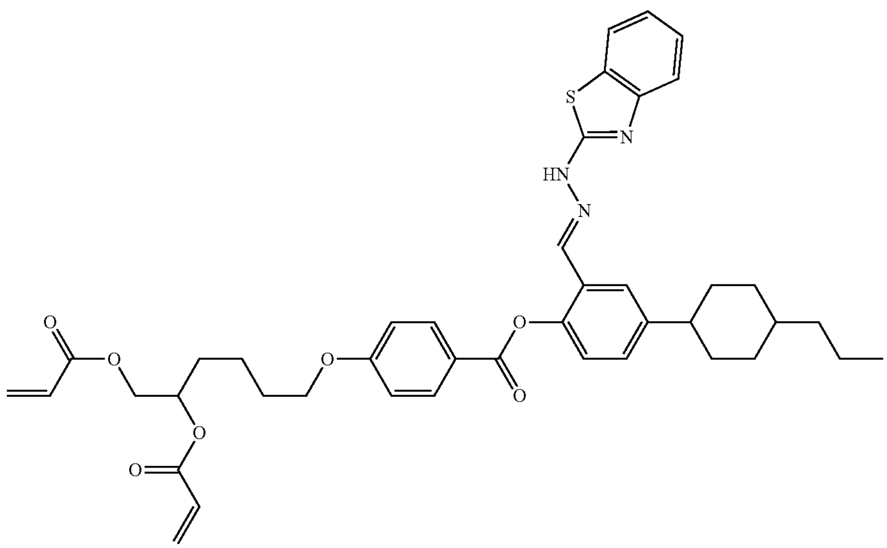
(3-a-3)
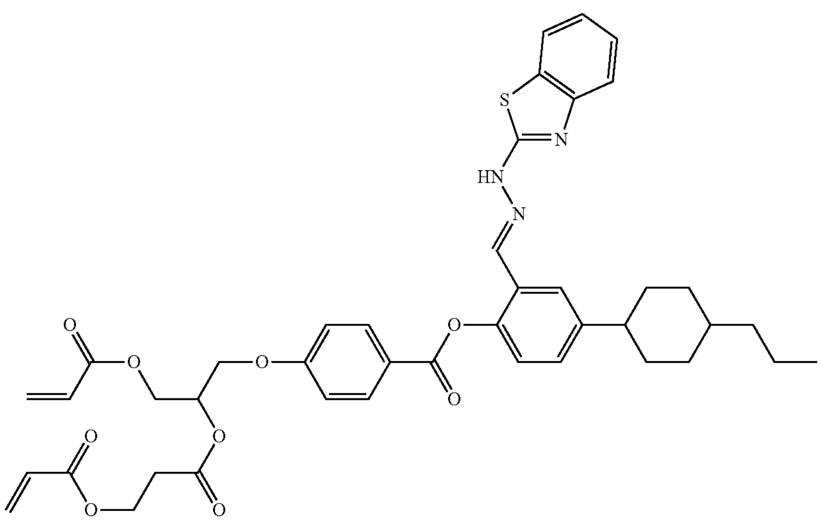

-continued
(3-a-4)
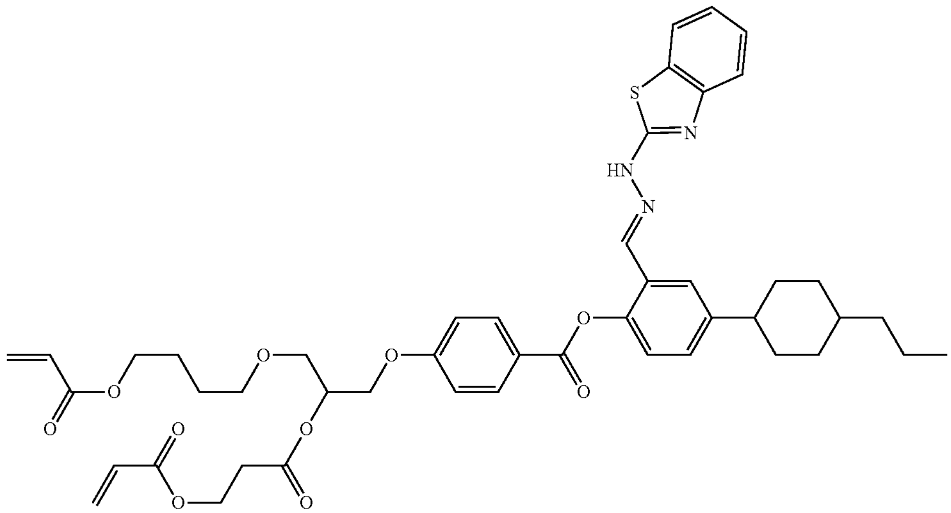
[Chem. 74]
(3-a-5)
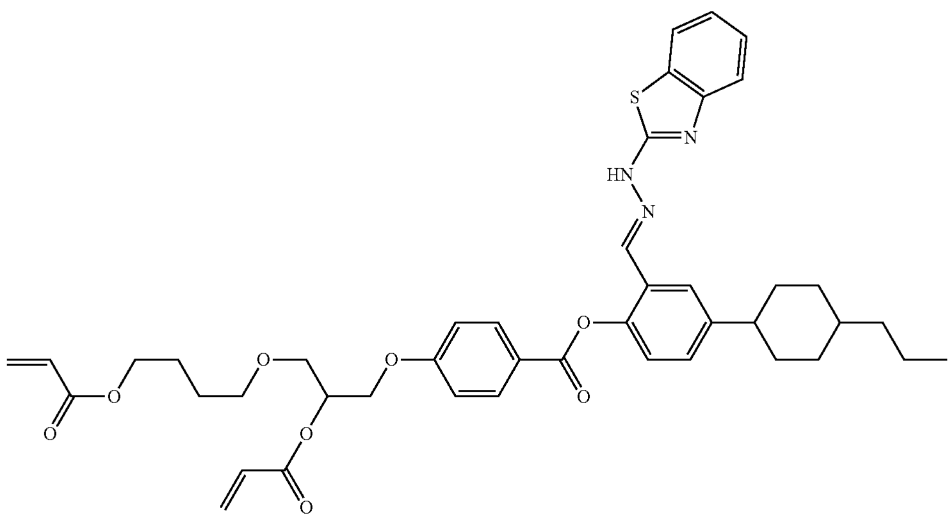
(3-a-6)
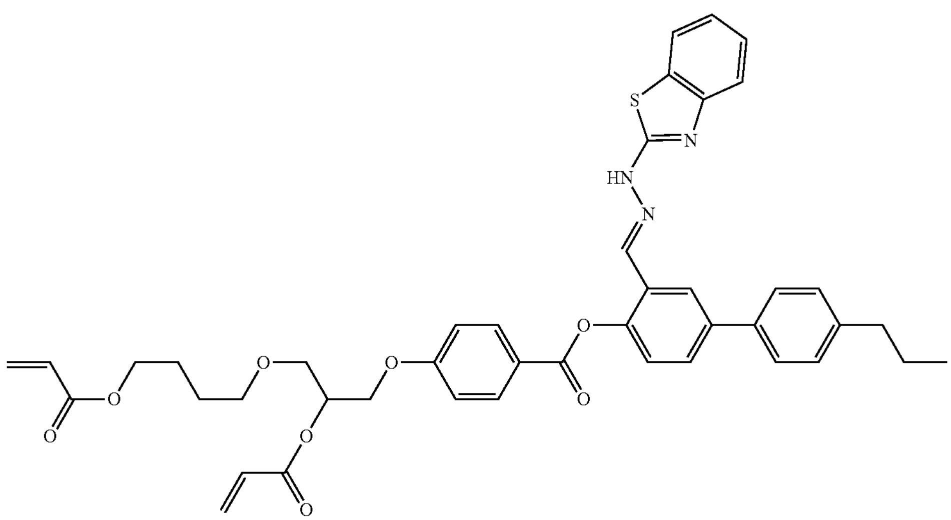

-continued
(3-a-7)
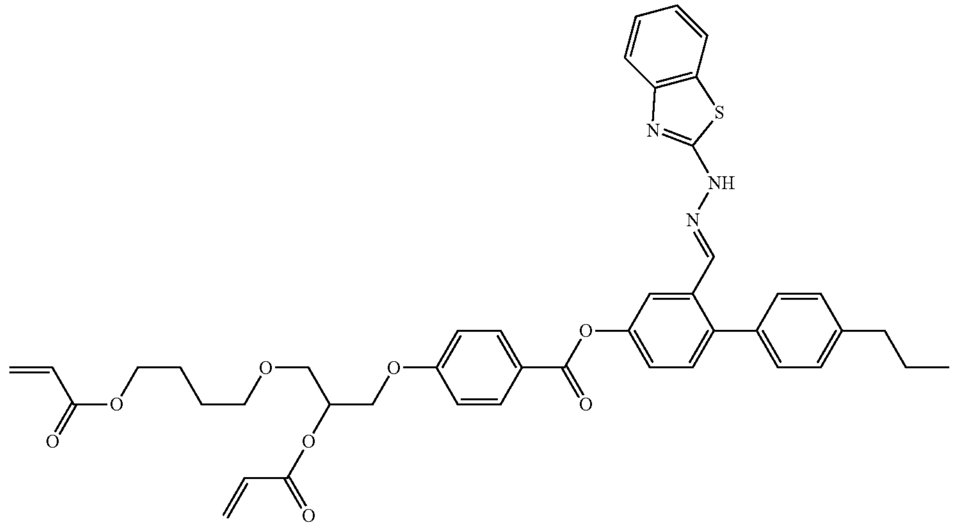
(3-a-8)
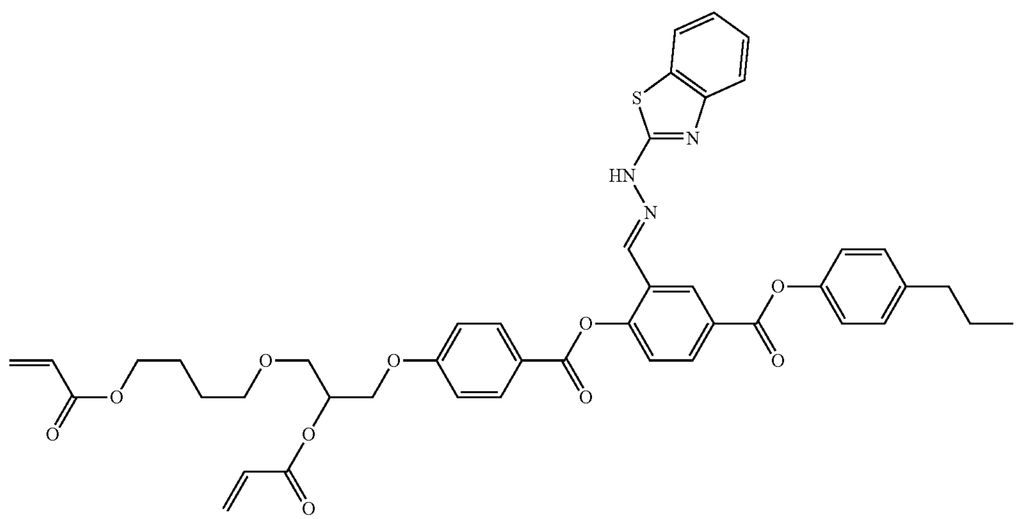
[Chem.75]
(3-a-9)
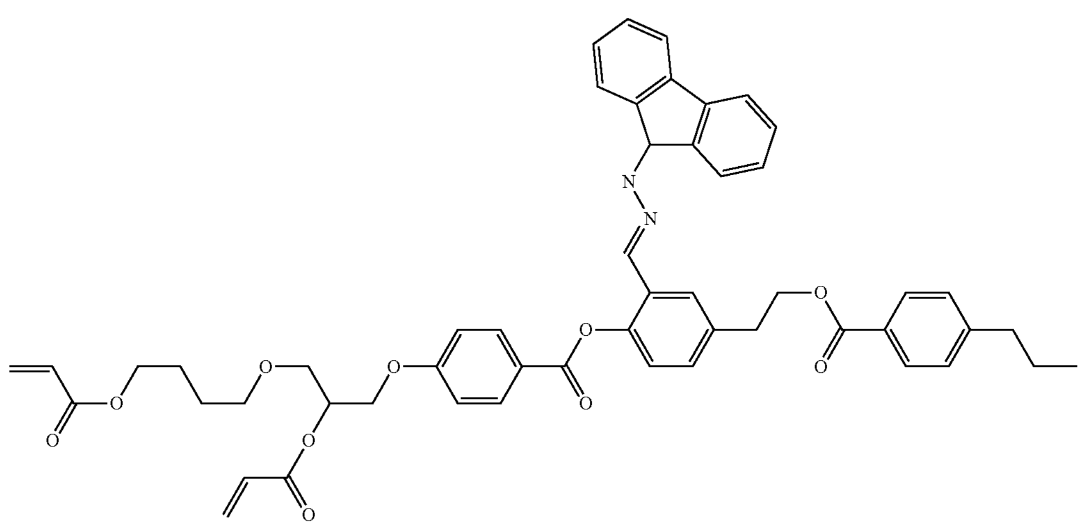

-continued
(3-a-10)
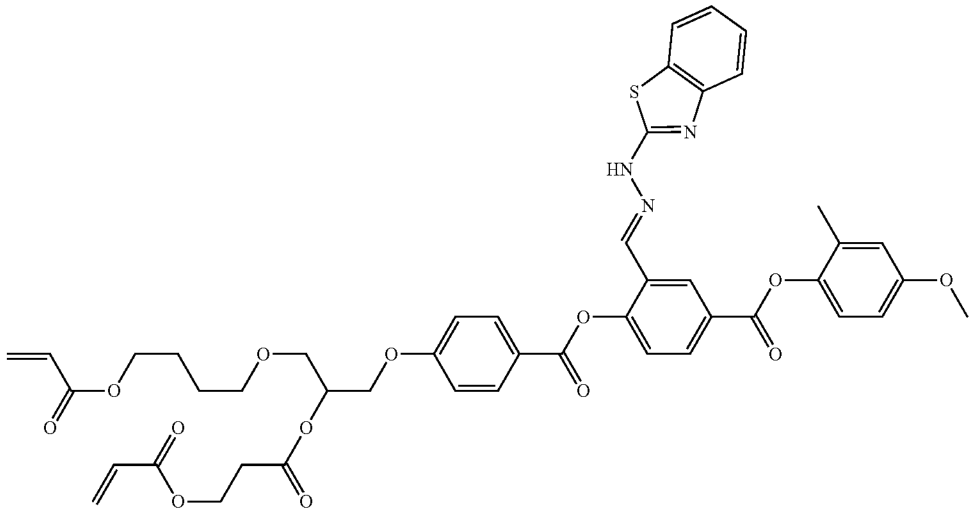
(3-a-11)
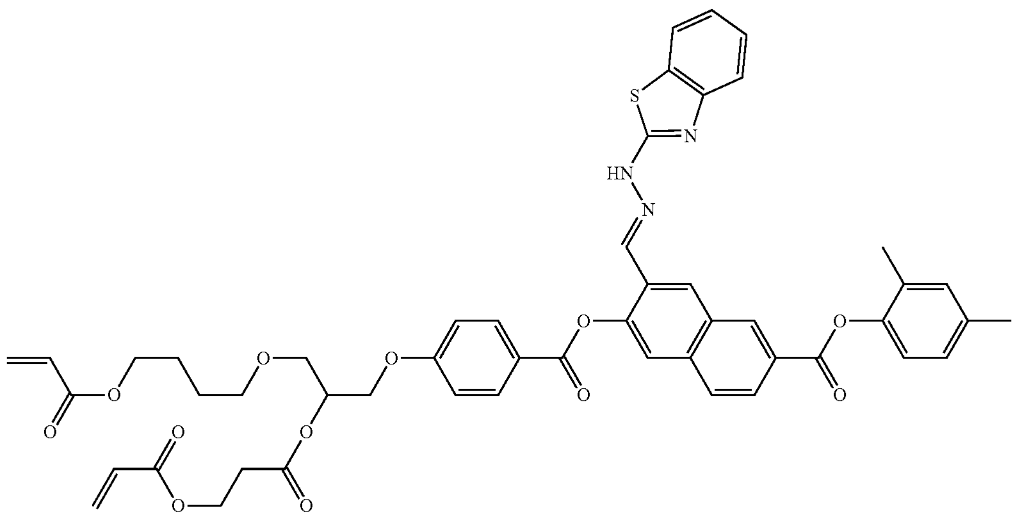
(3-a-12)
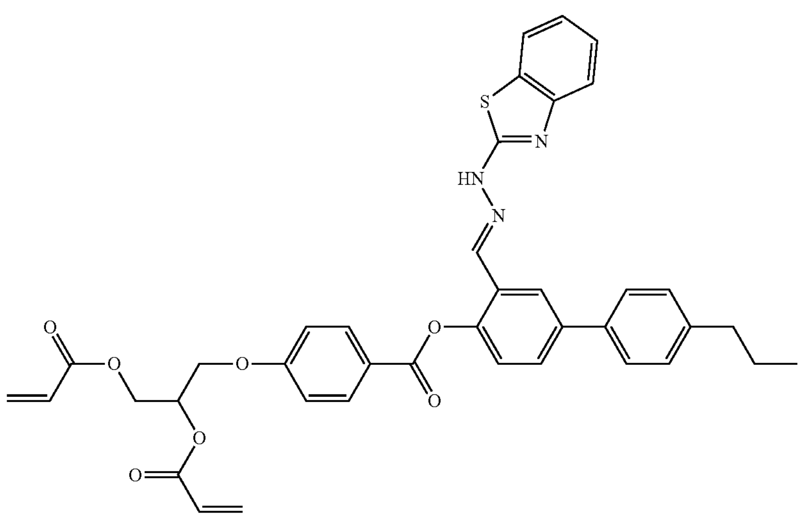

-continued
[Chem.76]
(3-a-13)
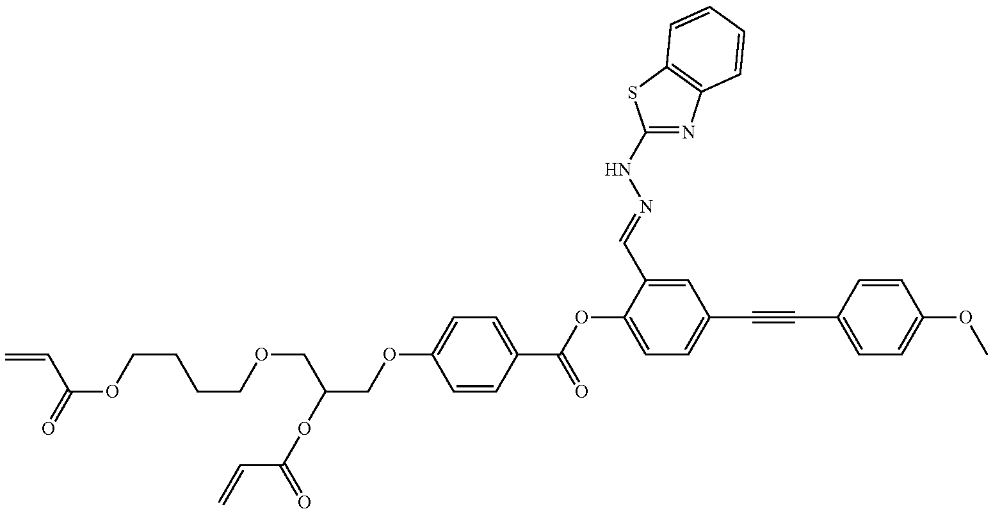
(3-a-14)
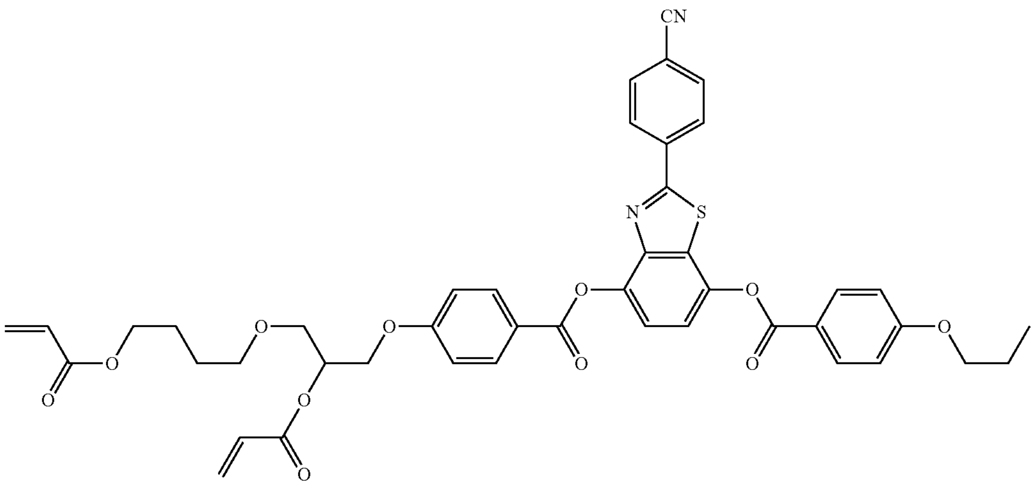
(3-a-15)
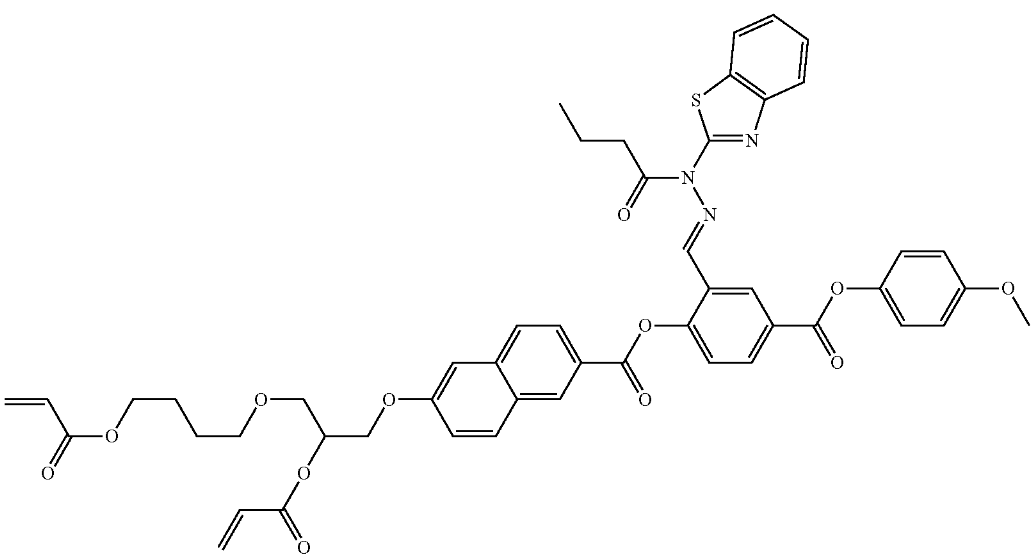

-continued
(3-a-16)
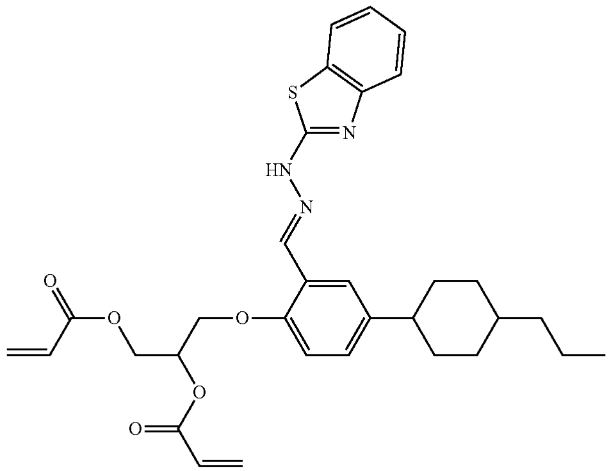
(3-a-17)
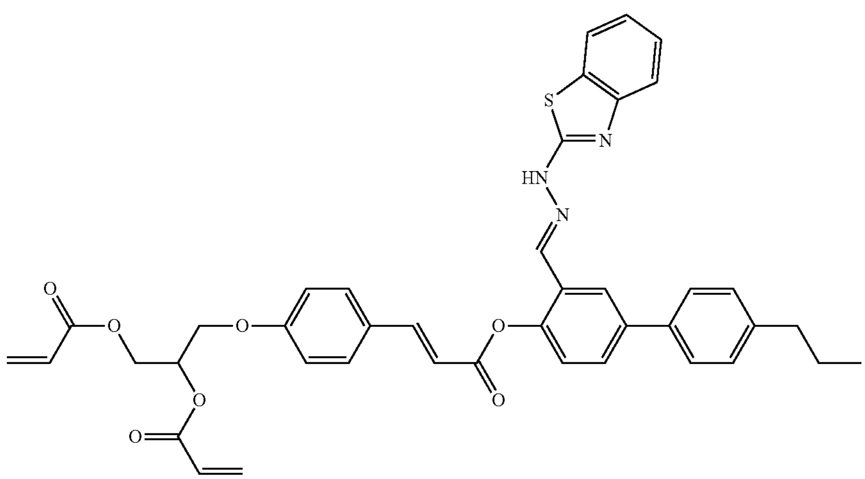
These liquid crystalline compounds may be used alone or as a mixture of two or more.
In general formula (4), the group represented by $P^{43}$—$(S^{43}$—$X^{43})_{14}$— is bonded to $A^{11}$ or $A^{12}$ in general formula (a).

Specifically, the compound represented by general formula (4) is preferably compounds represented by the following formula (4-a-1) to formula (4-a-26):
[Chem. 77]
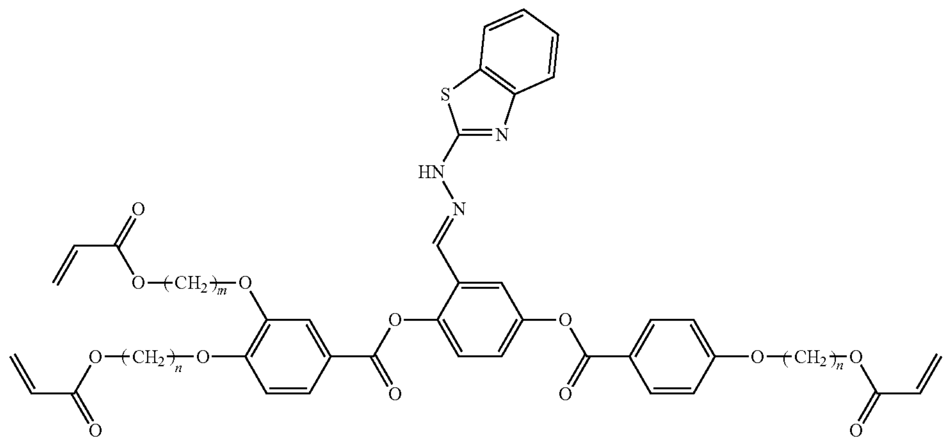
(4-a-1)
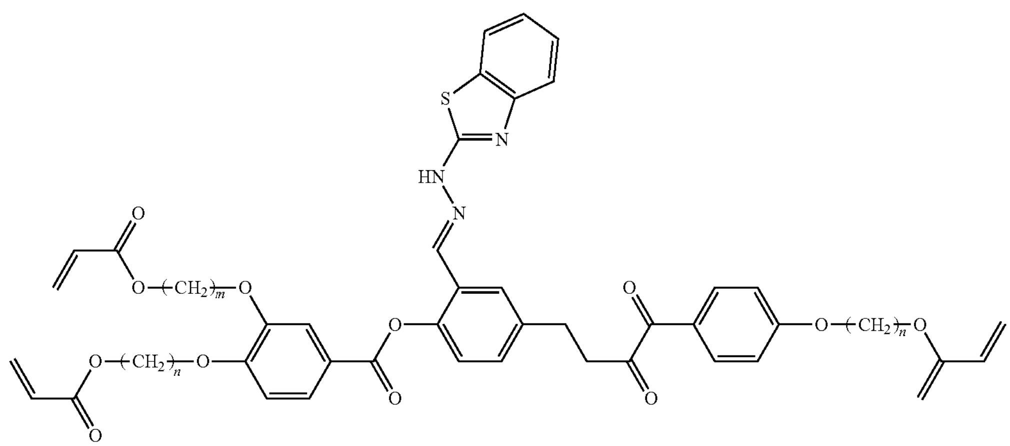
(4-a-2)
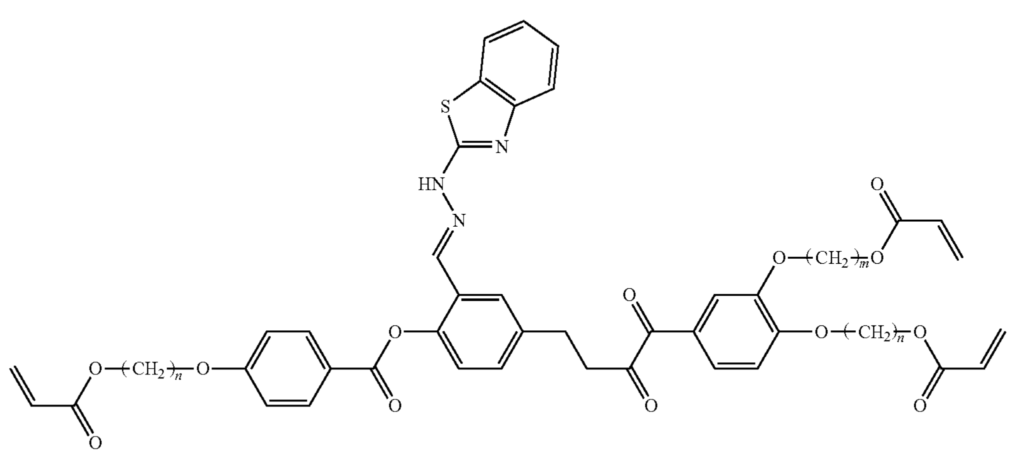
(4-a-3)

-continued
(4-a-4)
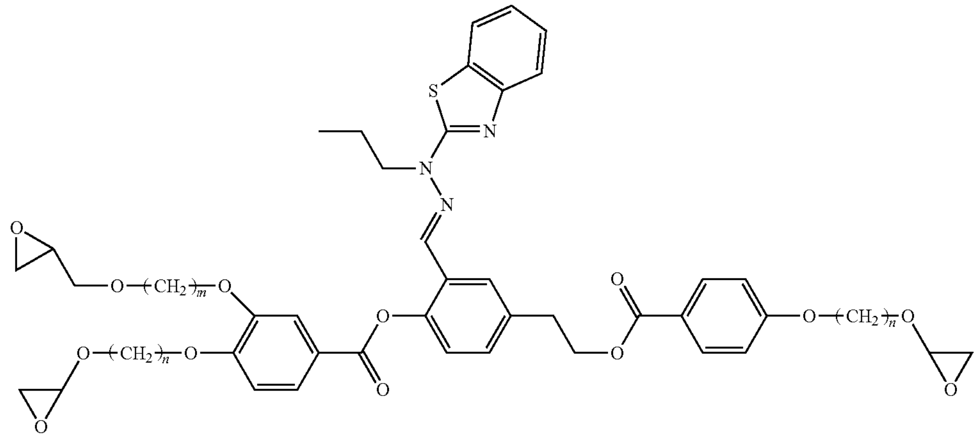
[Chem. 78]
(4-a-5)
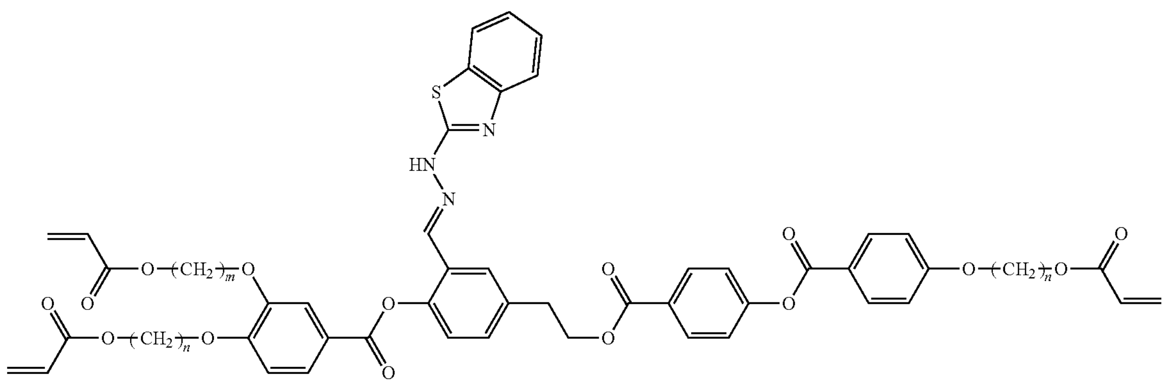
(4-a-6)
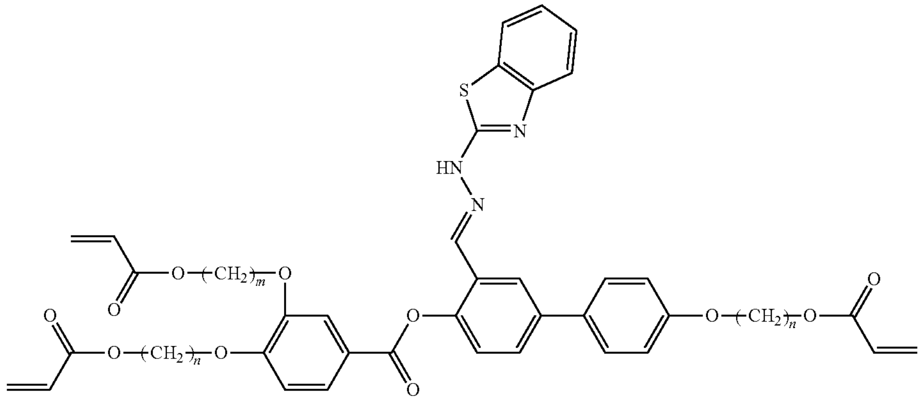

-continued
(4-a-7)
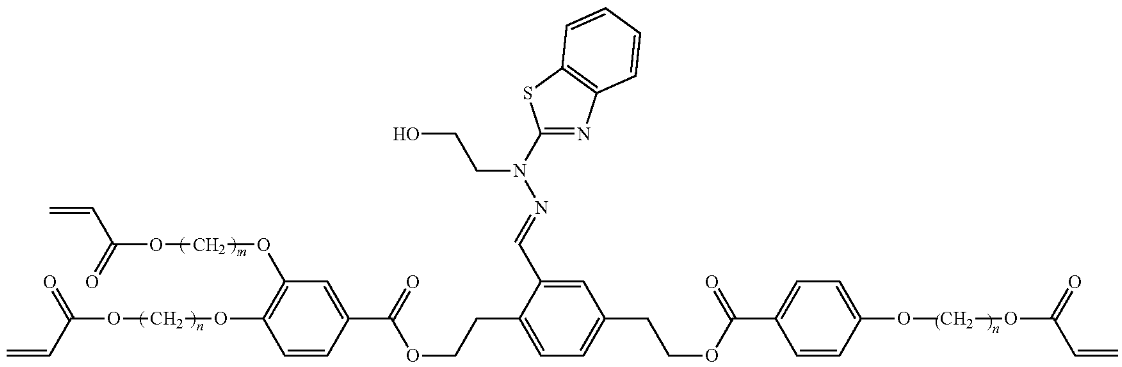
(4-a-8)
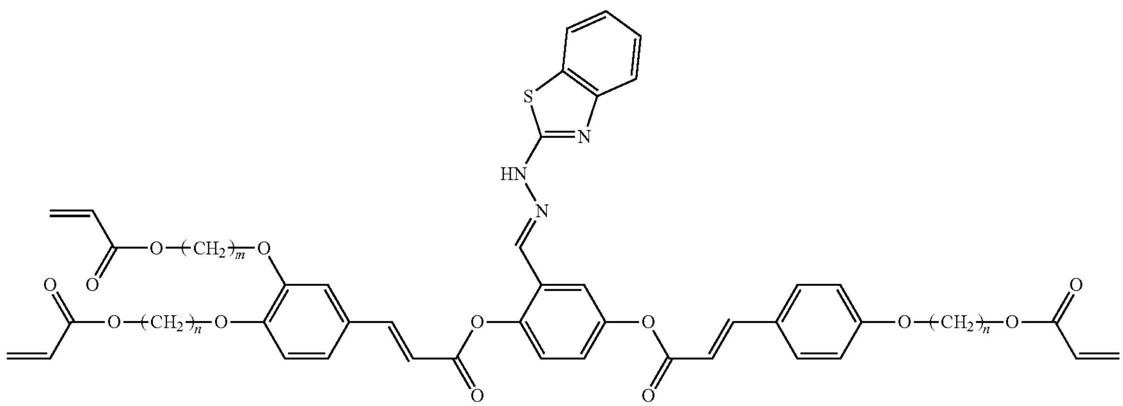
[Chem. 79]
(4-a-9)
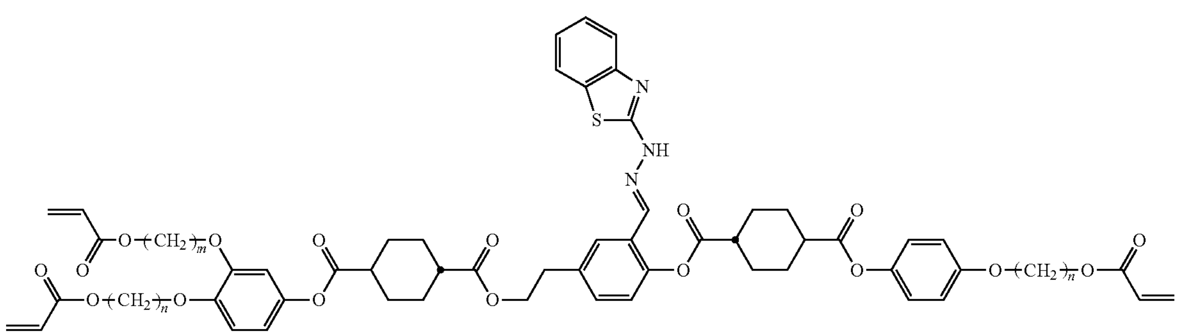
(4-a-10)
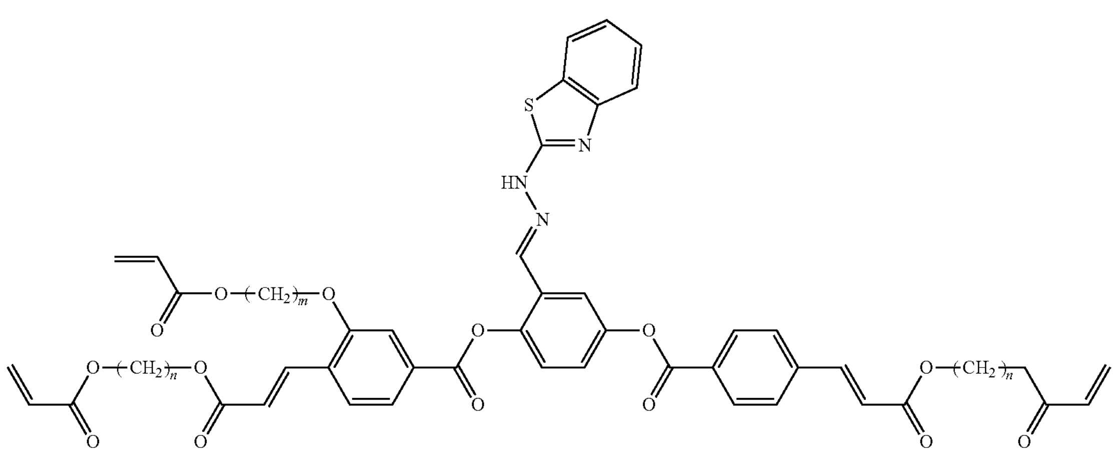

-continued
(4-a-11)
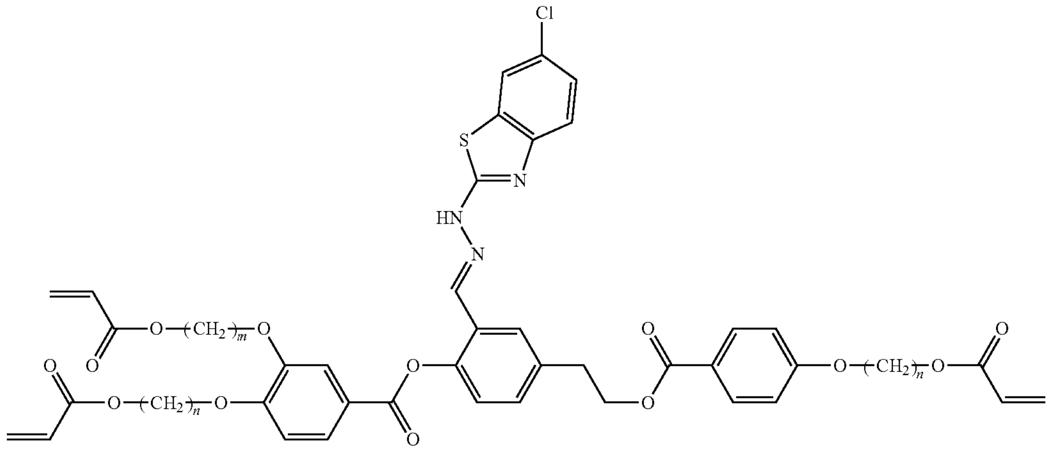
(4-a-12)
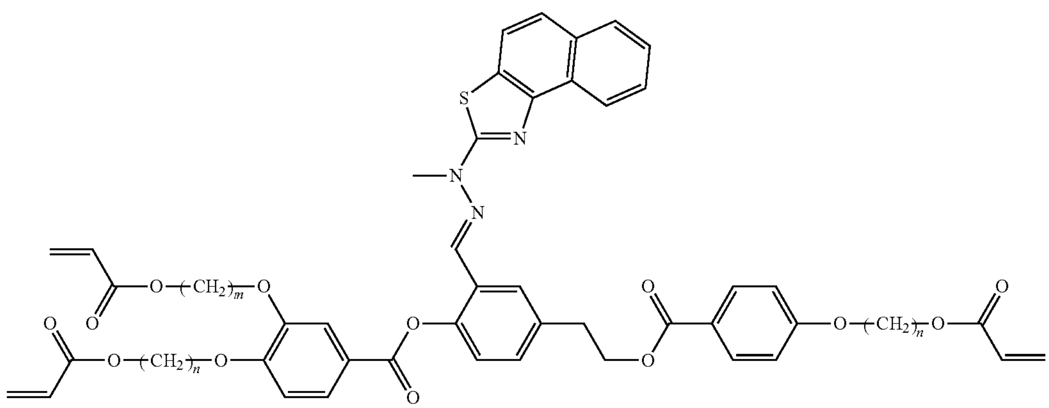
[Chem. 80]
(4-a-13)
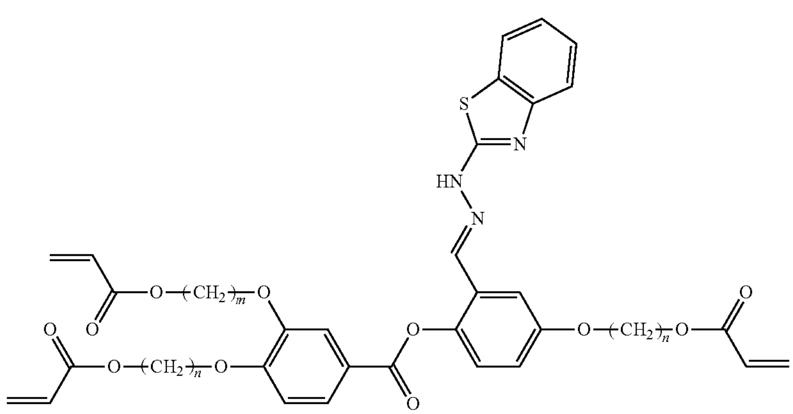

-continued
(4-a-14)
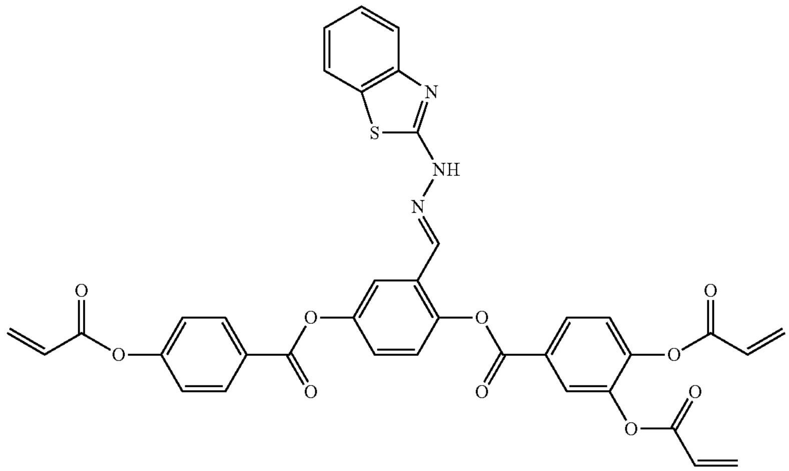
(4-a-15)
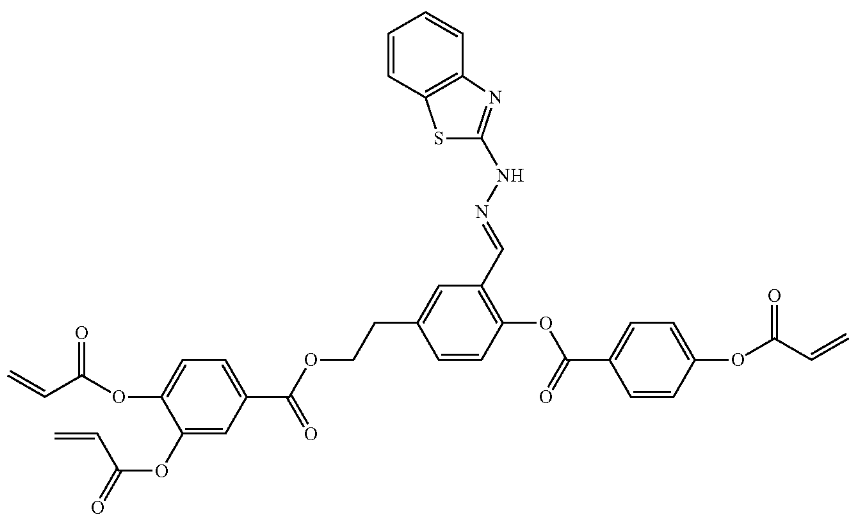
(4-a-16)
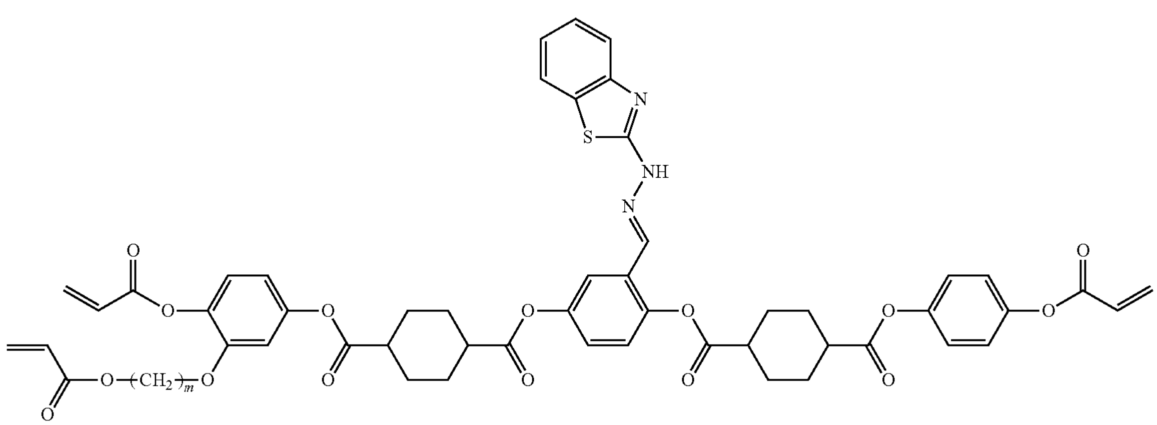

-continued
[Chem. 81]
(4-a-17)
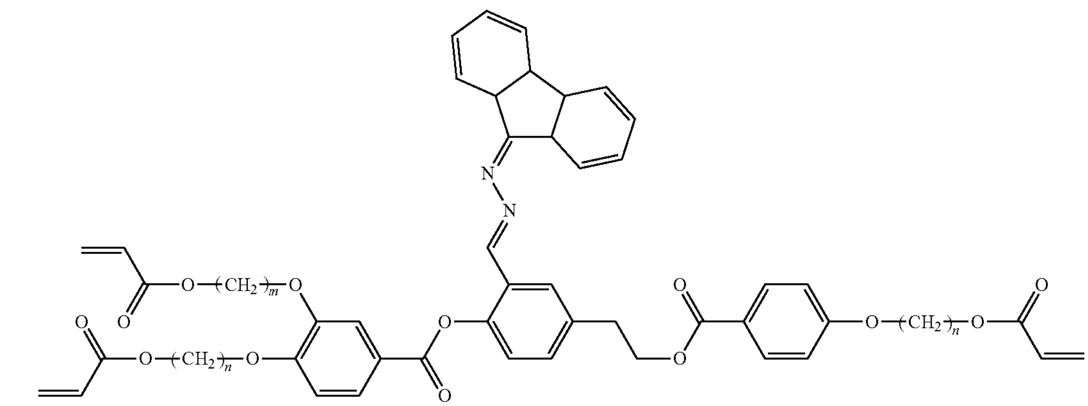
(4-a-18)
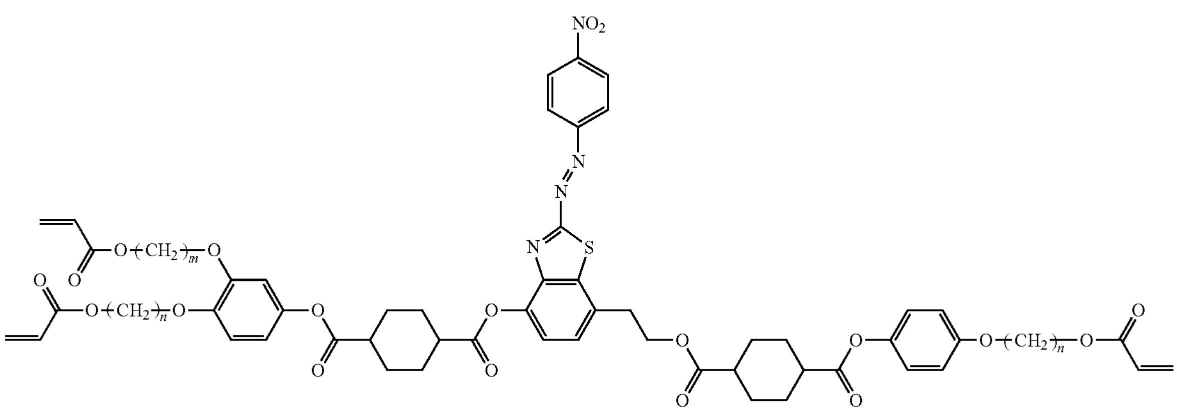
(4-a-19)
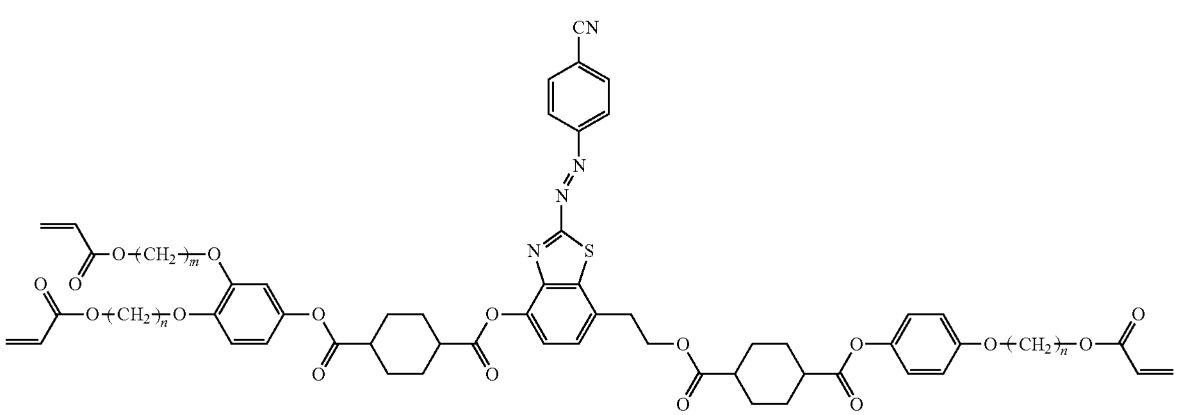

-continued
(4-a-20)
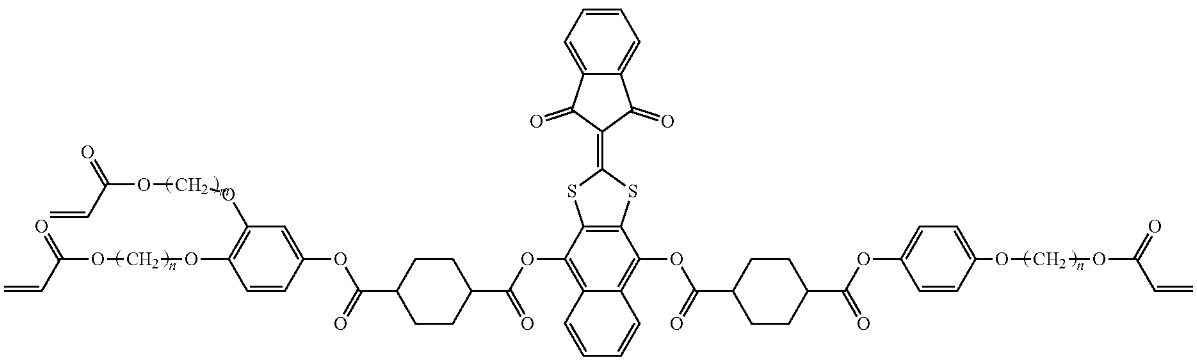
[Chem. 82]
(4-a-21)
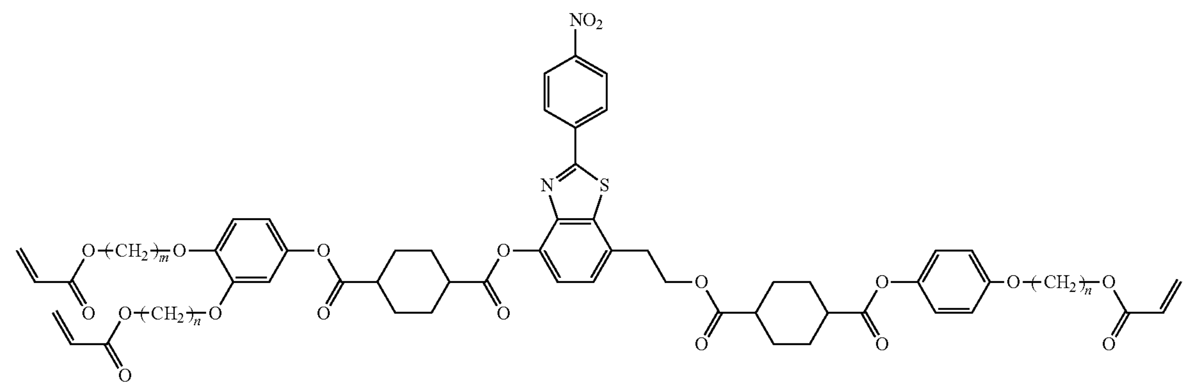
(4-a-22)
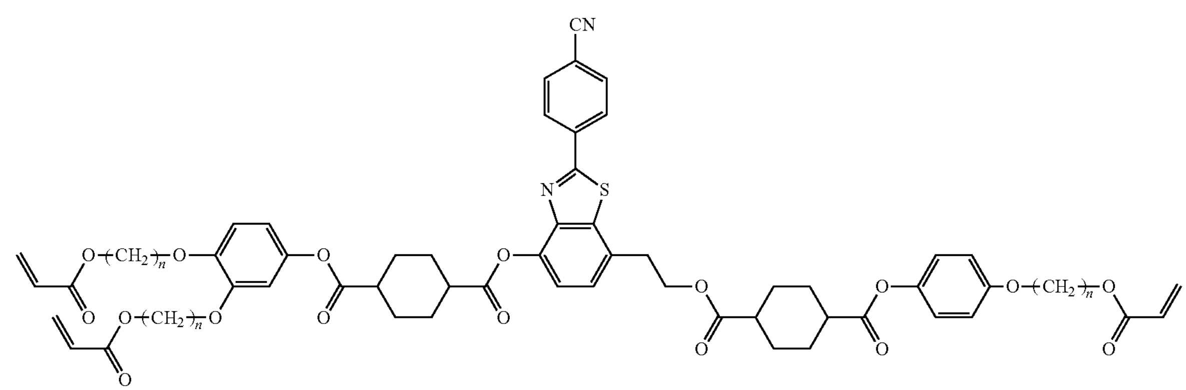

-continued
(4-a-23)
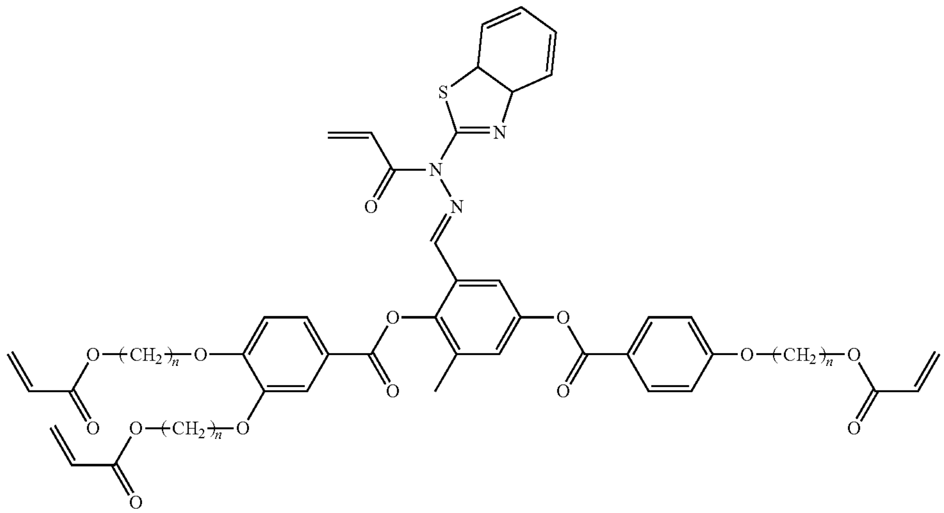
[Chem. 83]
(4-a-24)
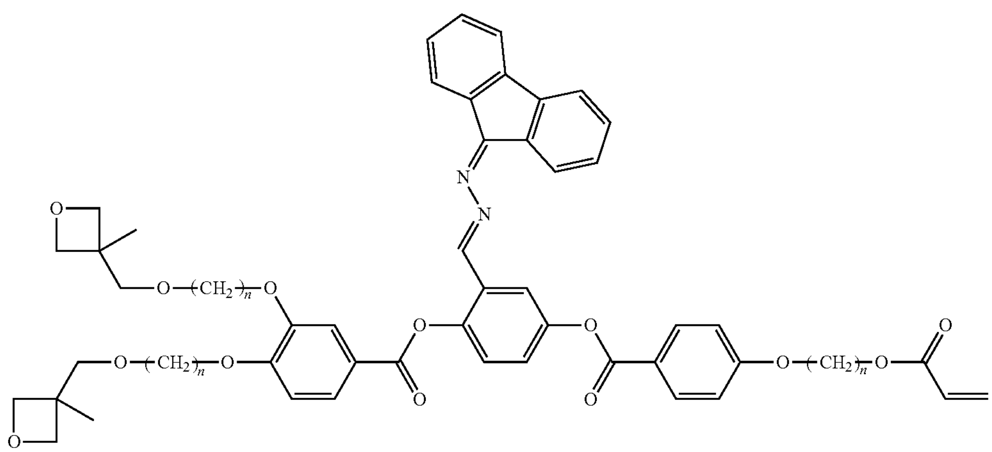
(4-a-25)
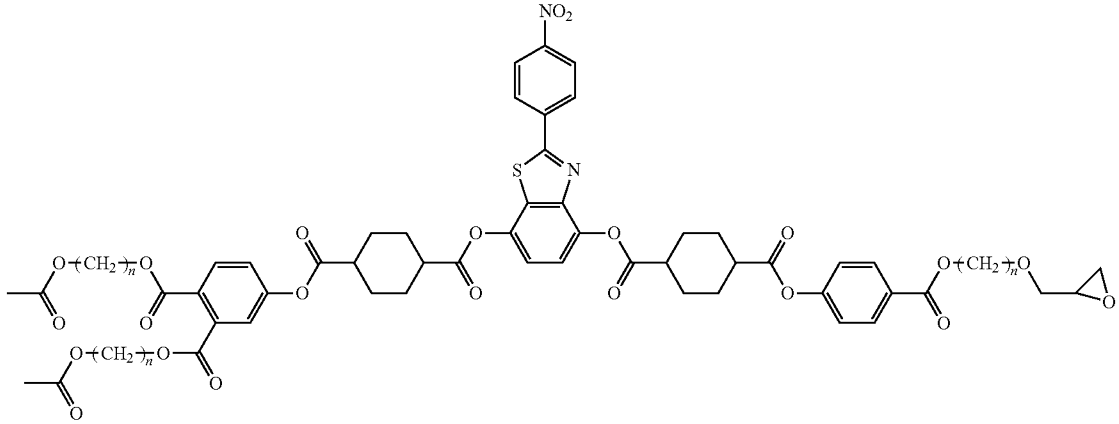

-continued
(4-a-26)
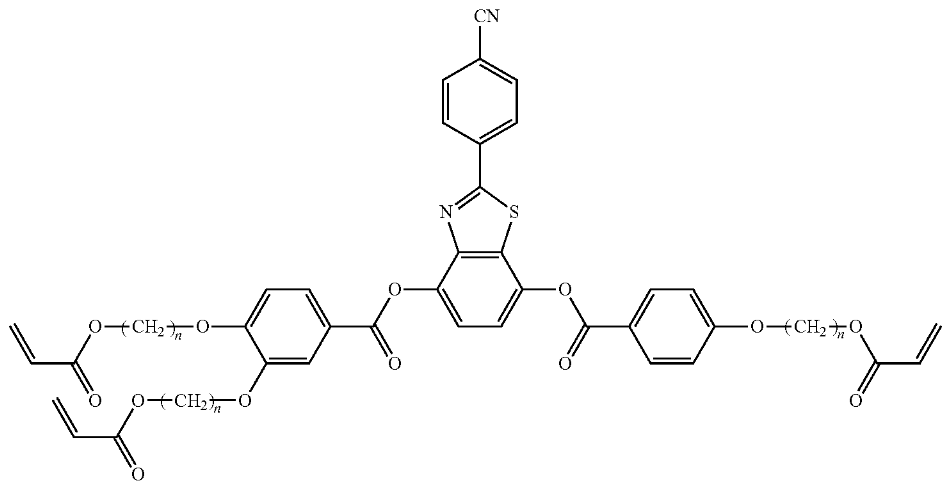
(in the above formulas, m and n each independently represent an integer of 1 to 10.) These liquid crystalline compounds may be used alone or as a mixture of two or more.
Specifically, the compound represented by general formula (5) is preferably compounds represented by the following formula (5-a-1) to formula (5-a-29).
[Chem. 84]
(5-a-1)
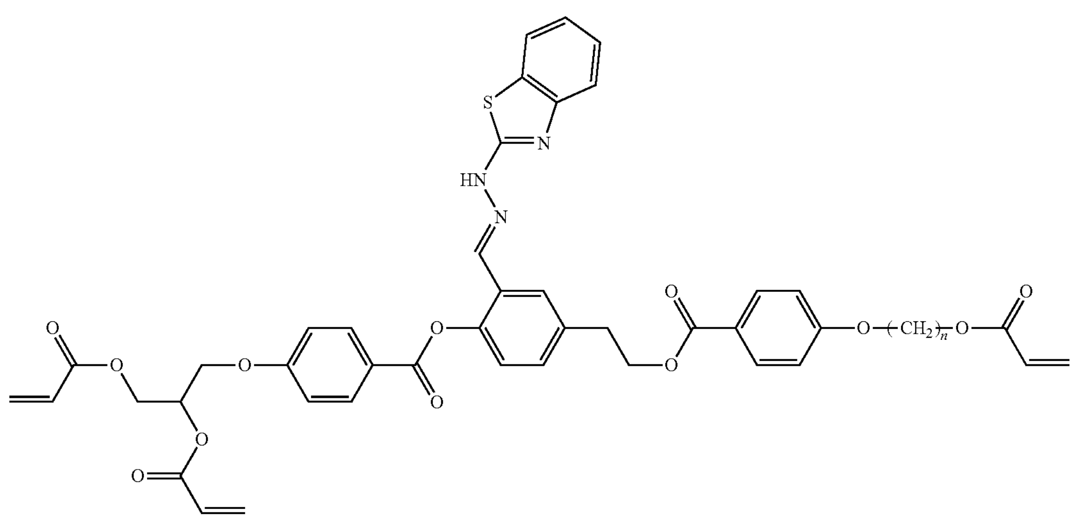

-continued
(5-a-2)
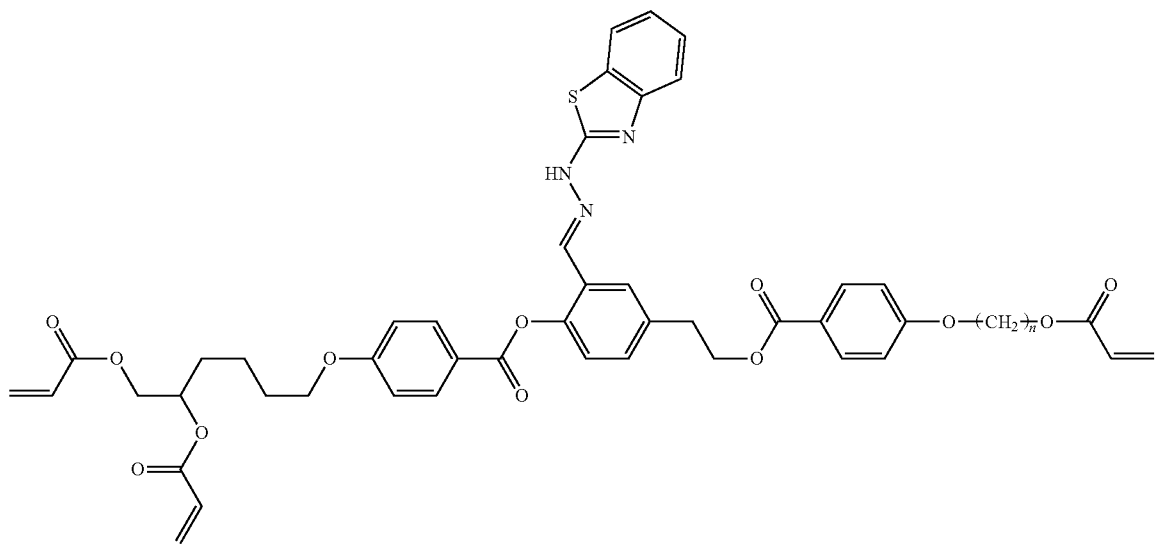
(5-a-3)
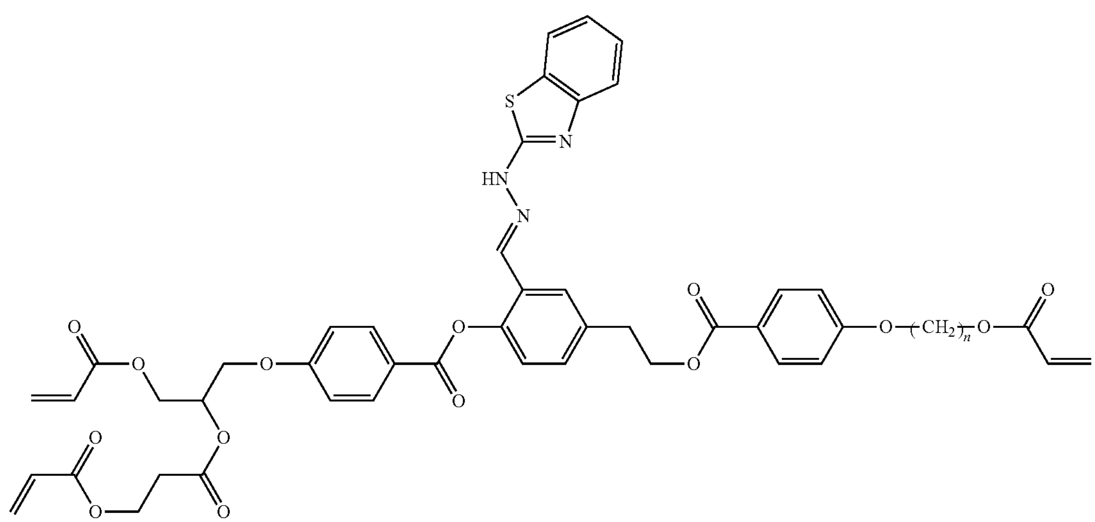
(5-a-4)
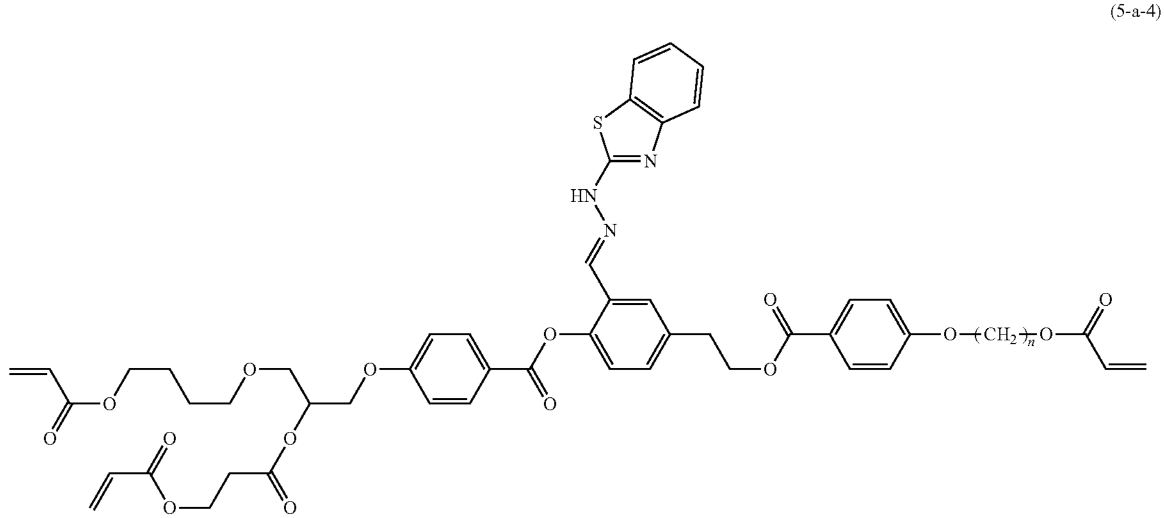

-continued
[Chem. 85]
(5-a-5)
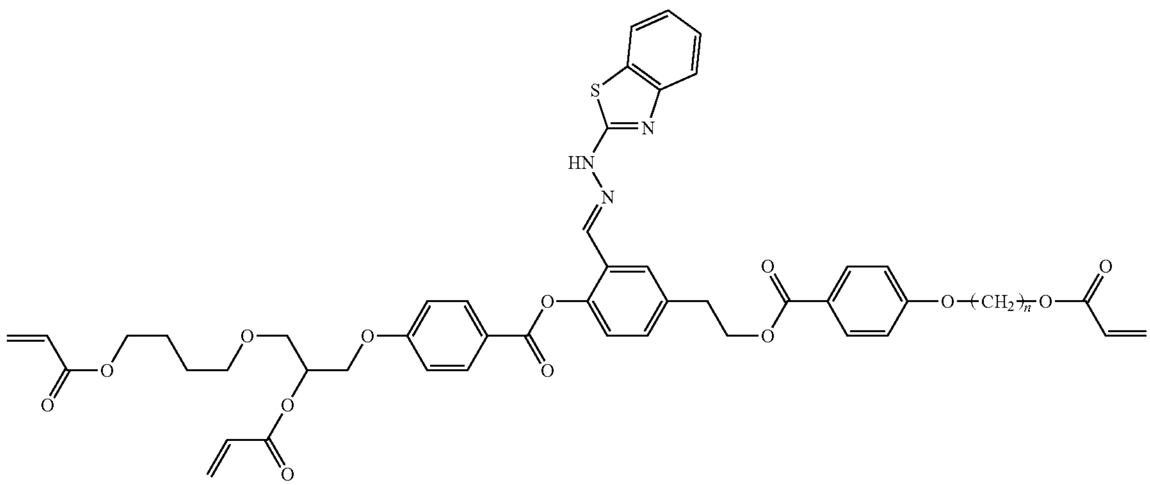
(5-a-6)
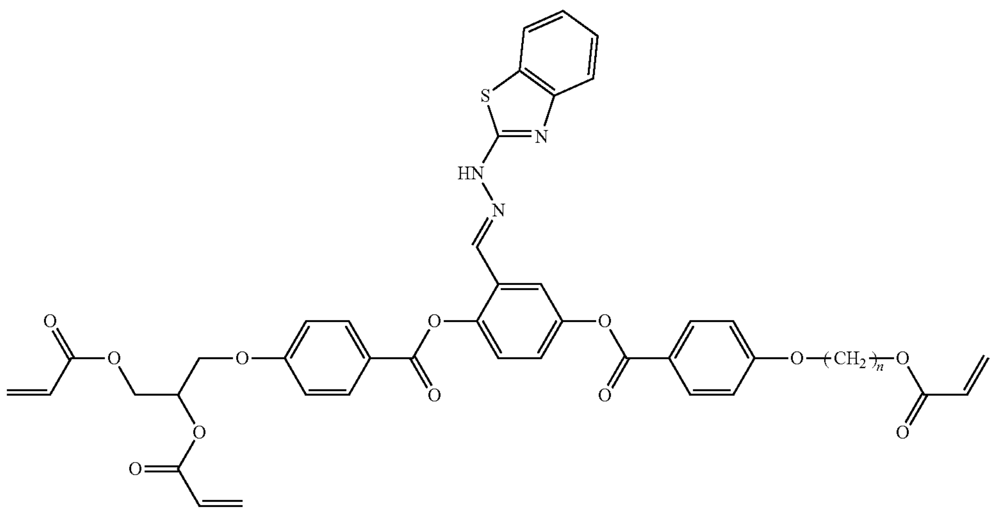
(5-a-7)
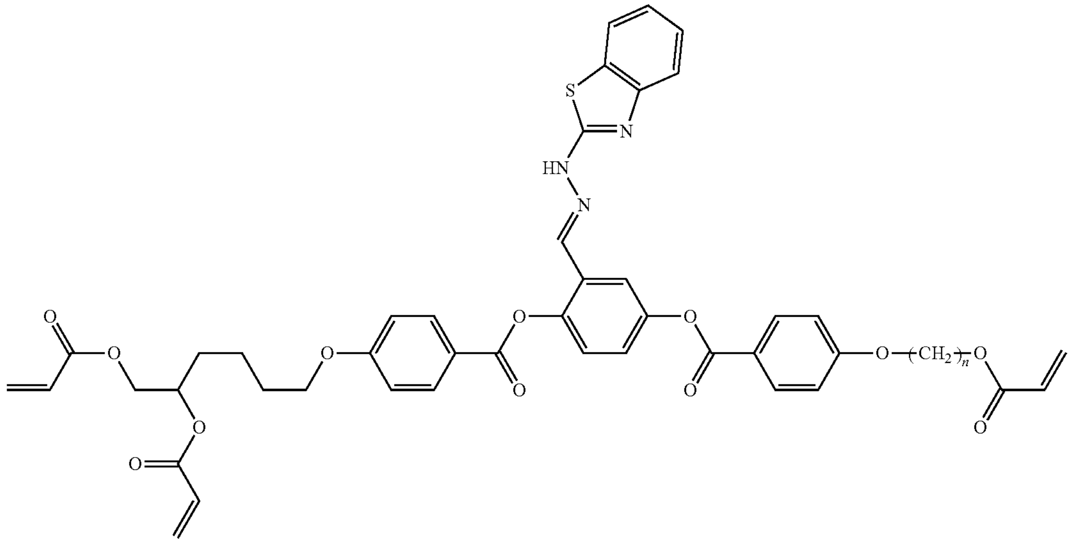

-continued
(5-a-8)
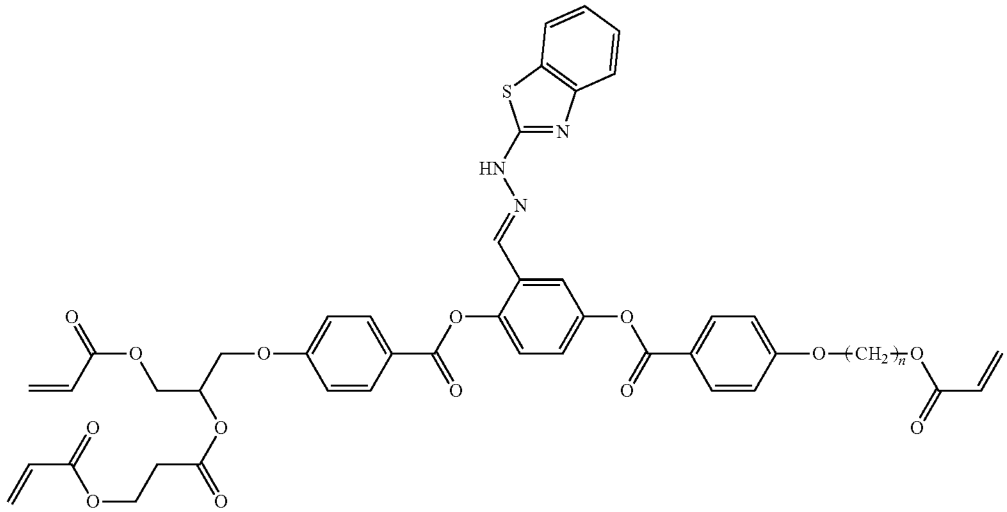
[Chem. 86]
(5-a-9)
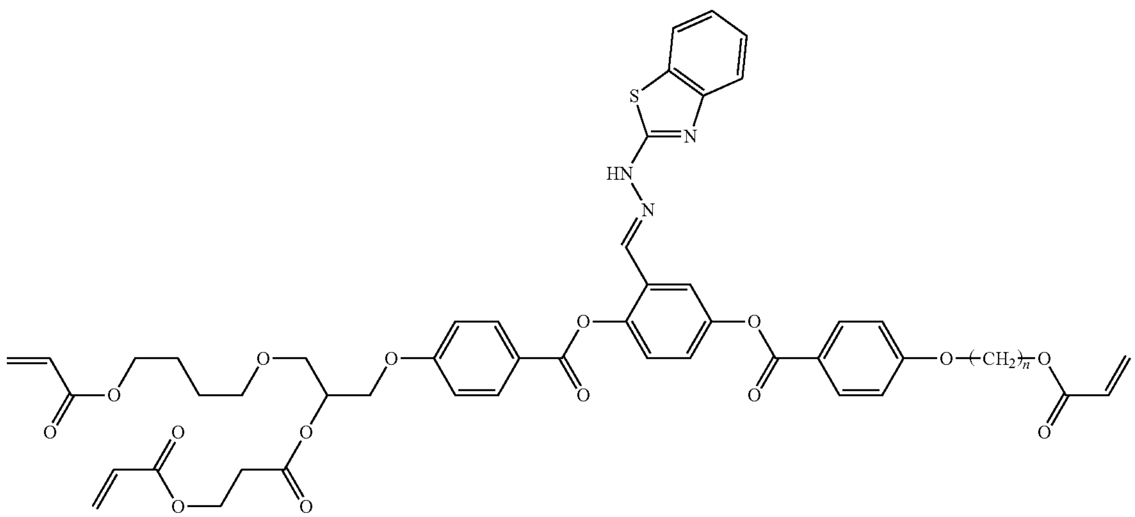
(5-a-10)
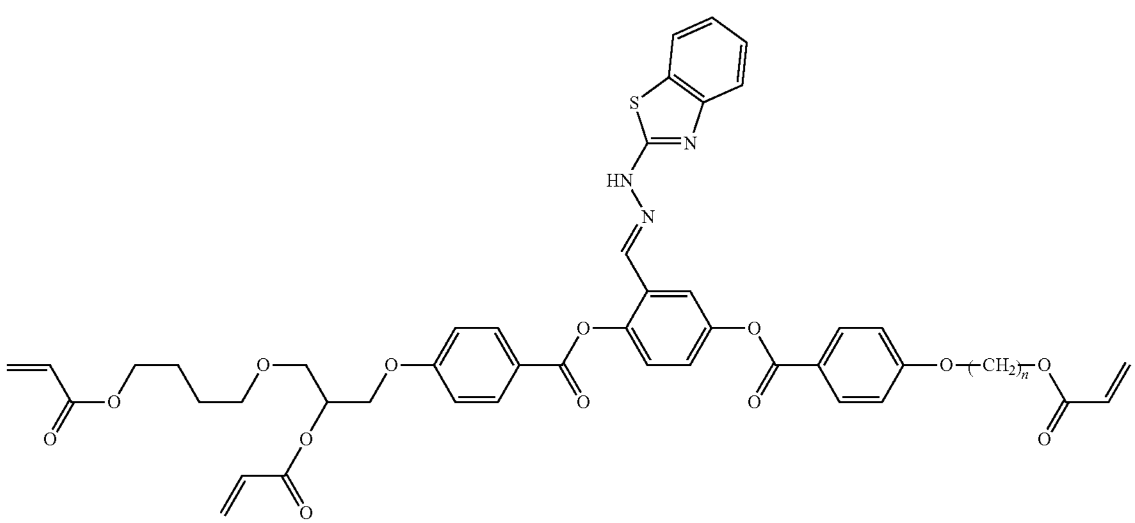

-continued
(5-a-11)
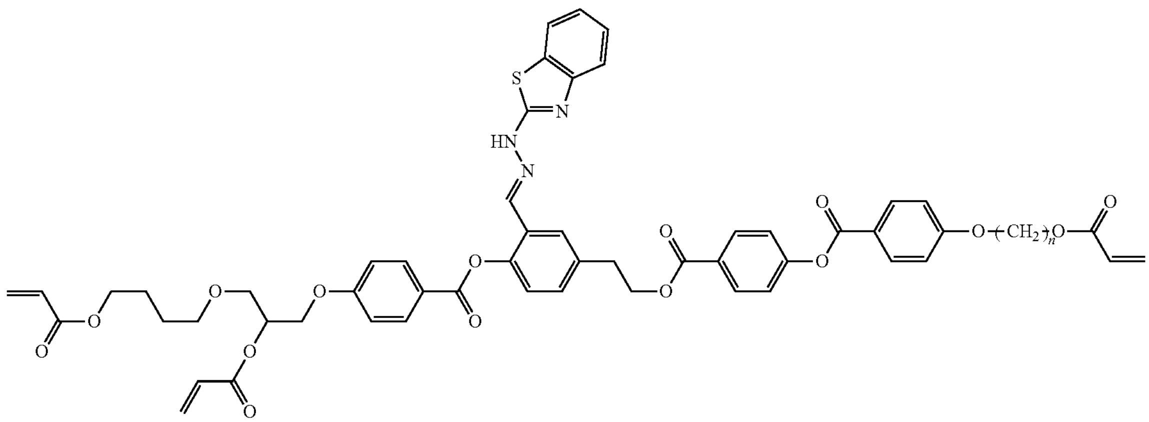
(5-a-12)
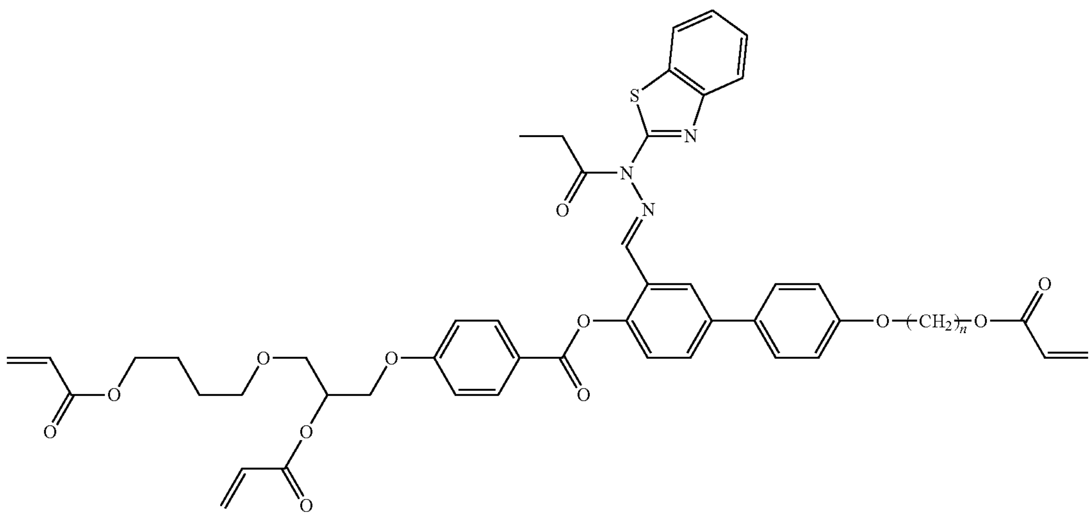
[Chem. 87]
(5-a-13)
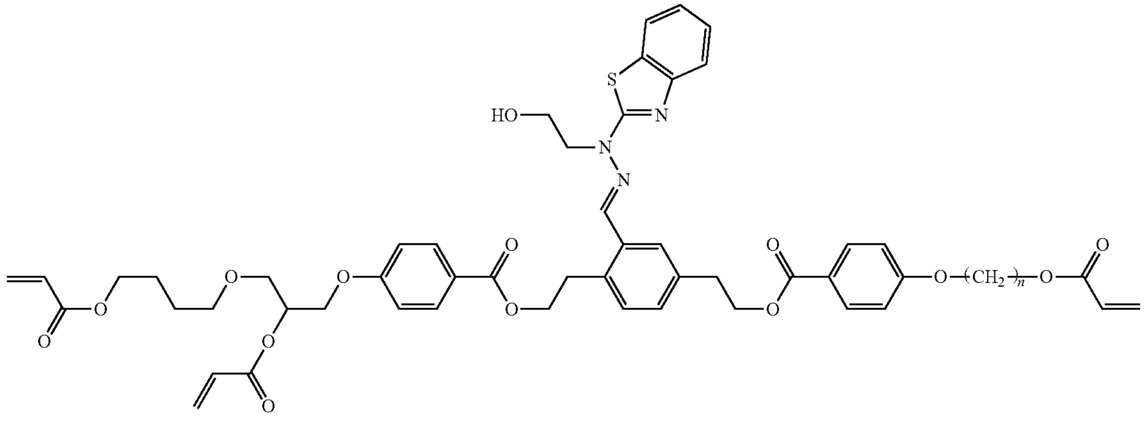

-continued
(5-a-14)
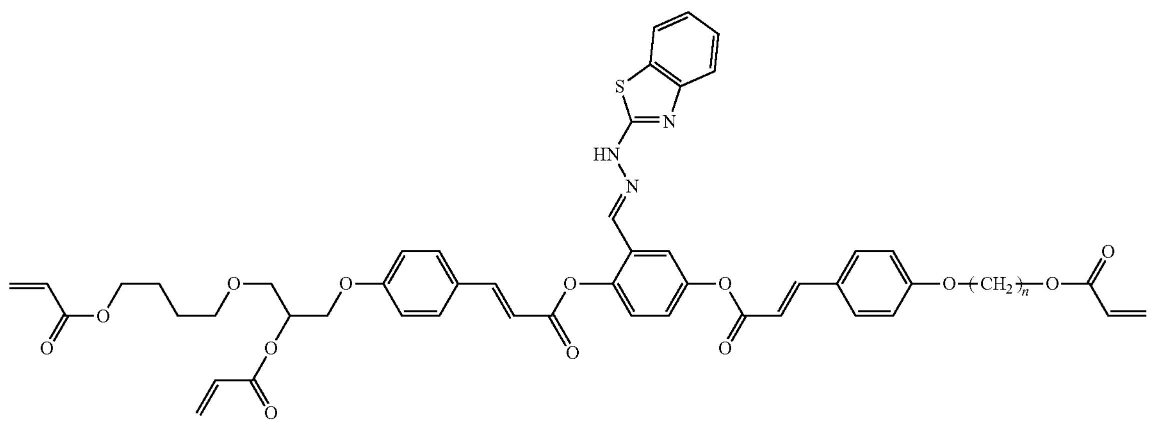
(5-a-15)
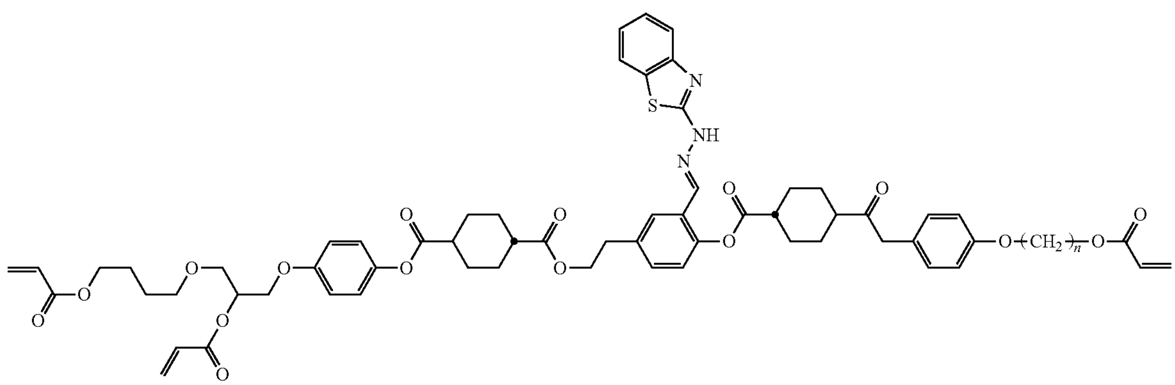
(5-a-16)
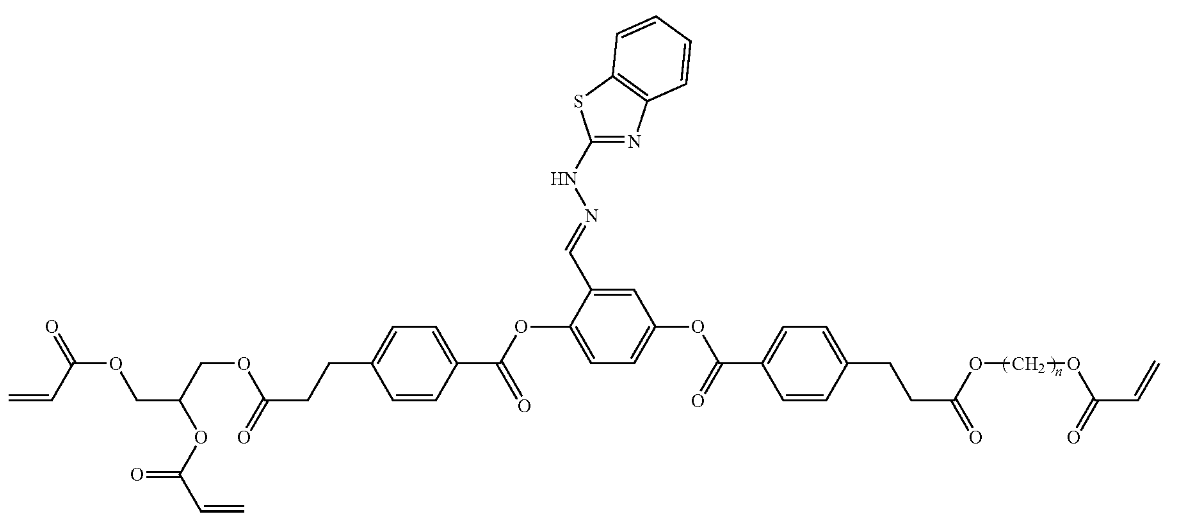

-continued
[Chem. 88]
(5-a-17)
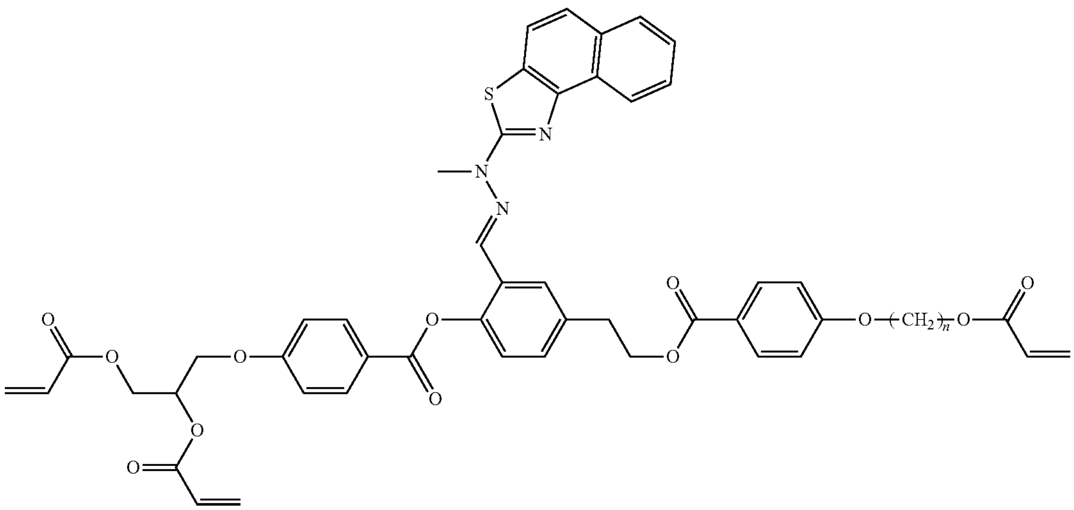
(5-a-18)
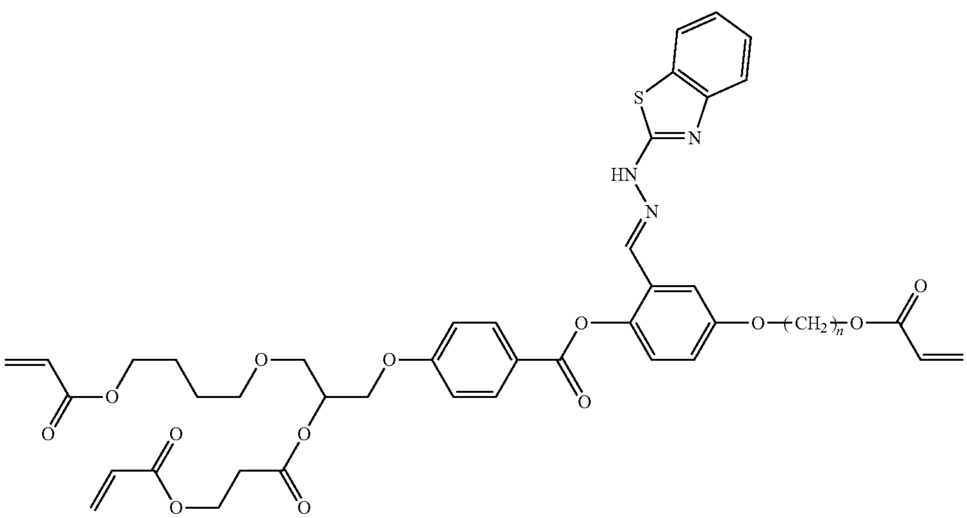
(5-a-19)
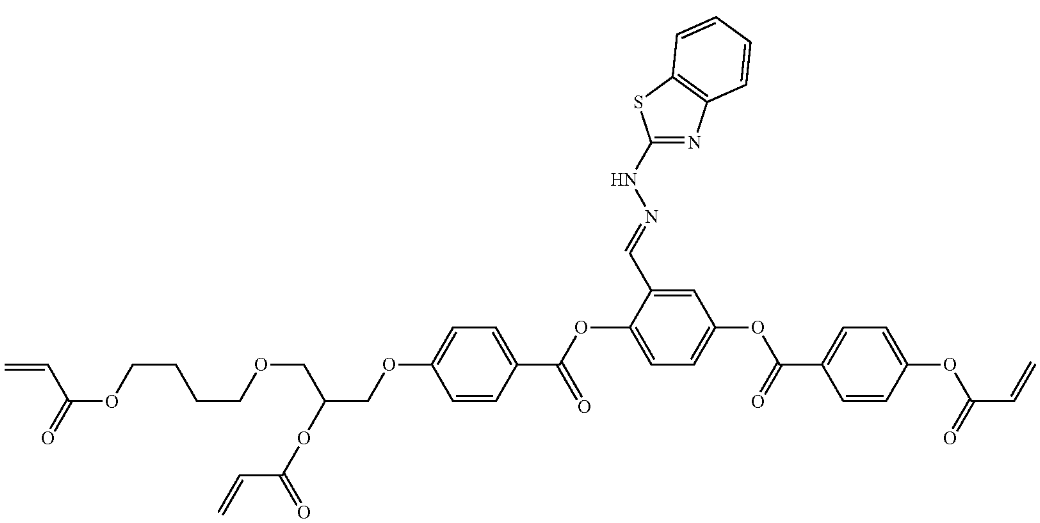

-continued
(5-a-20)
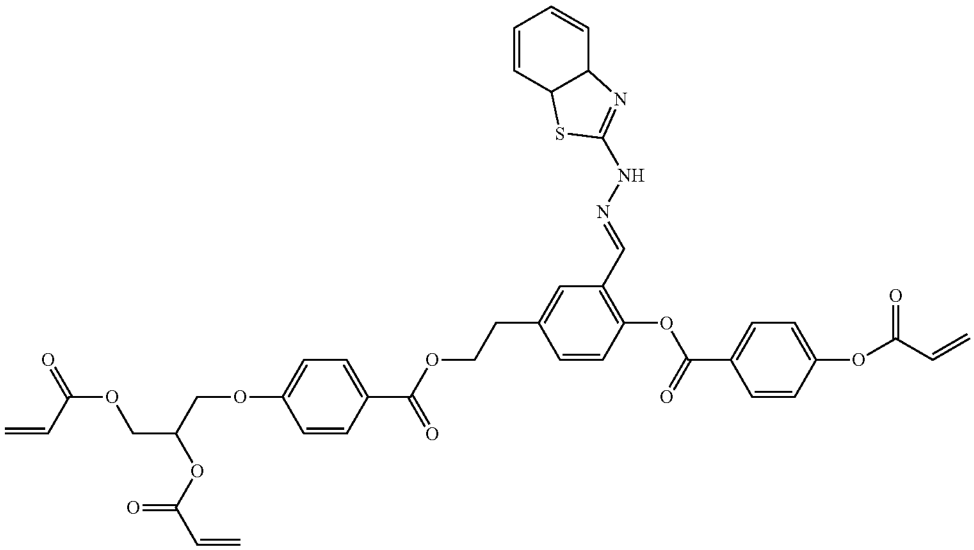
[Chem. 89]
(5-a-21)
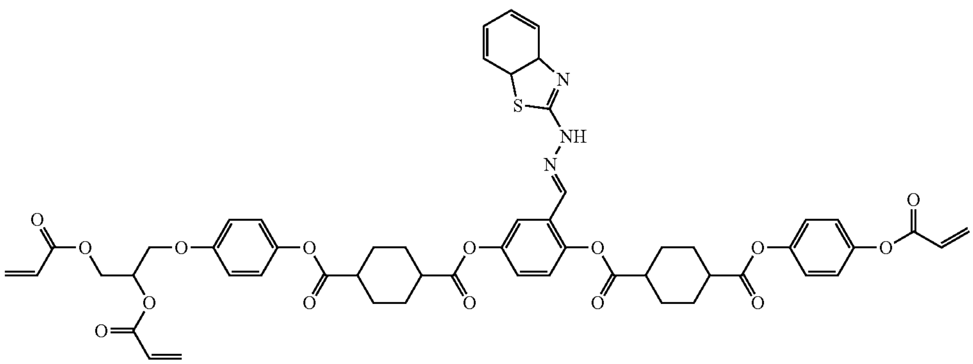
(5-a-22)
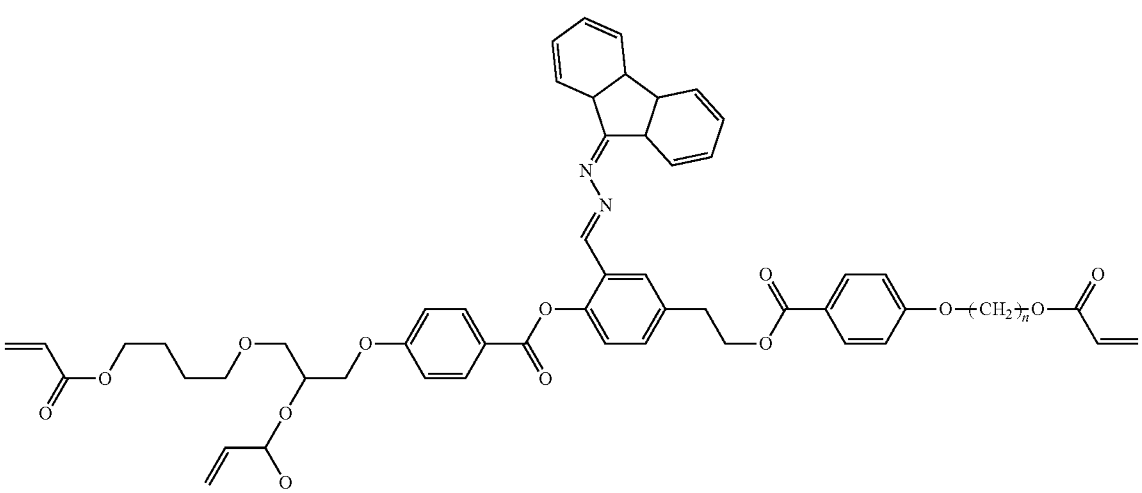

-continued
[Chem. 90]
(5-a-23)
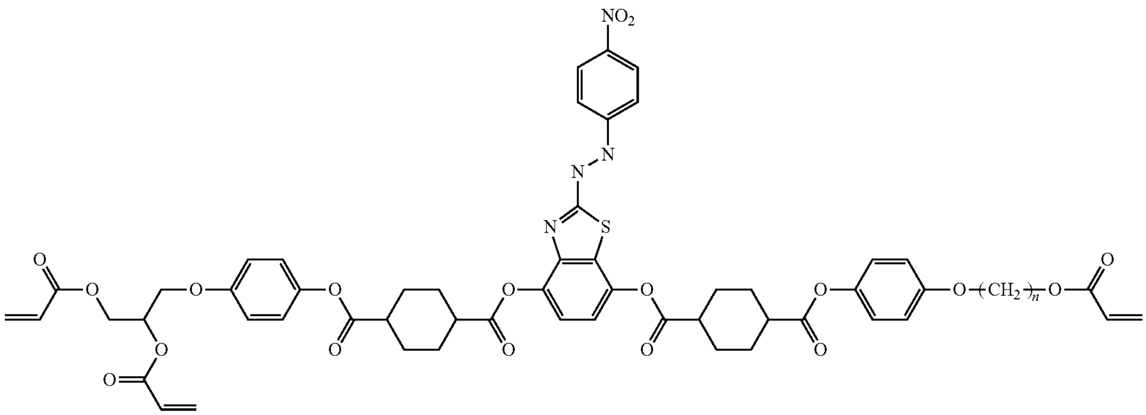
(5-a-24)
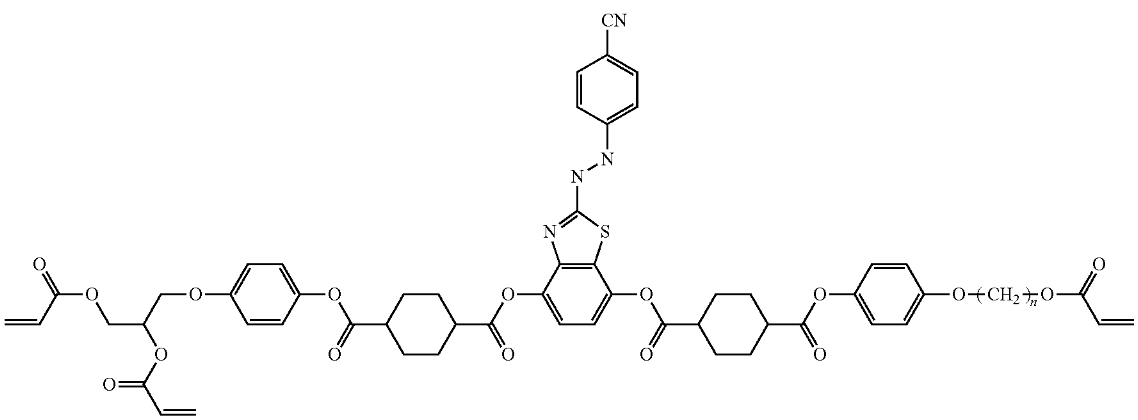
[Chem. 91]
(5-a-25)
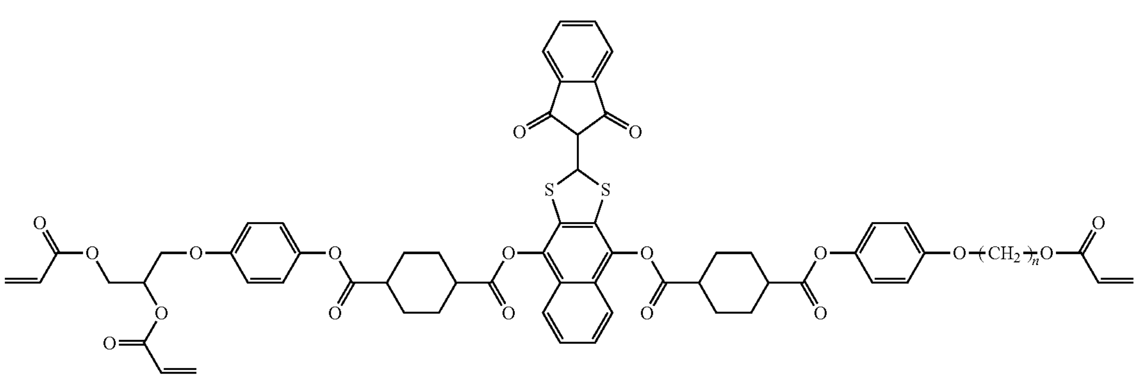

-continued
(5-a-26)
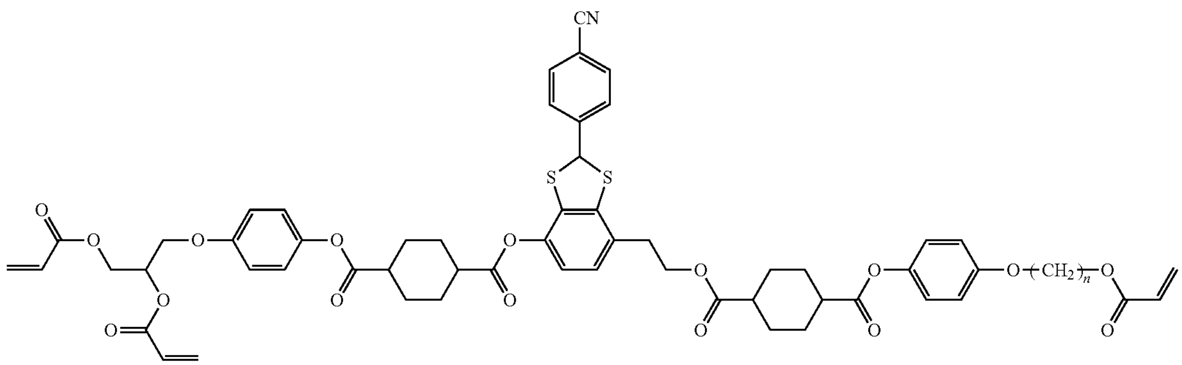
[Chem. 92]
(5-a-27)
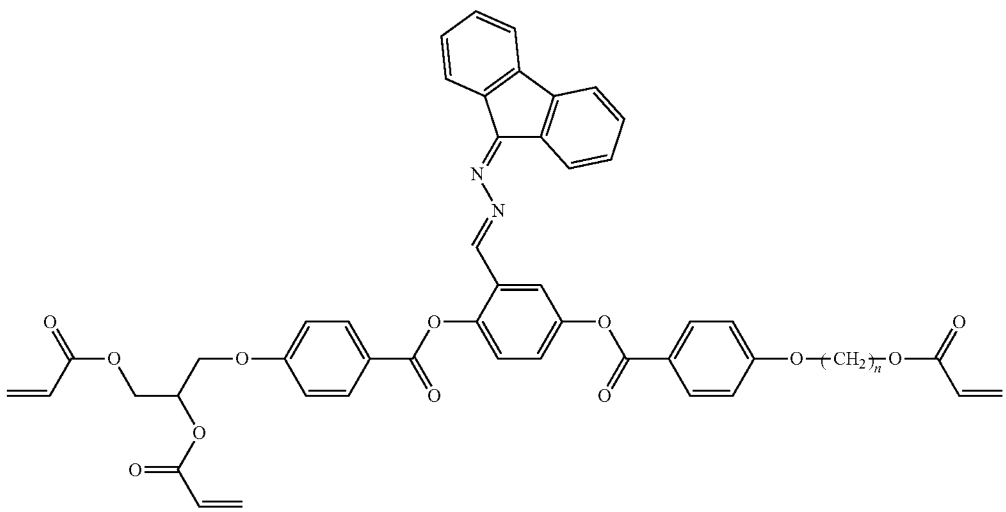
(5-a-28)
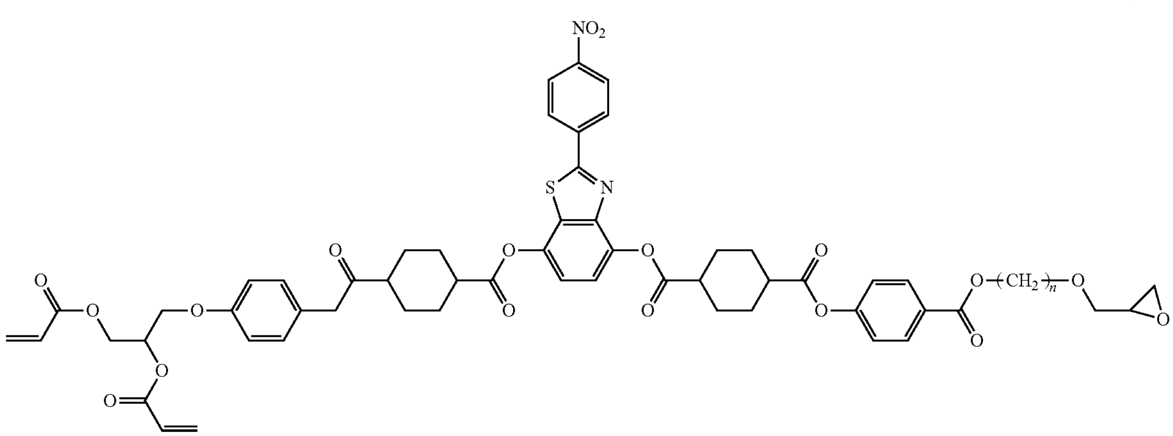

-continued (5-a-29)

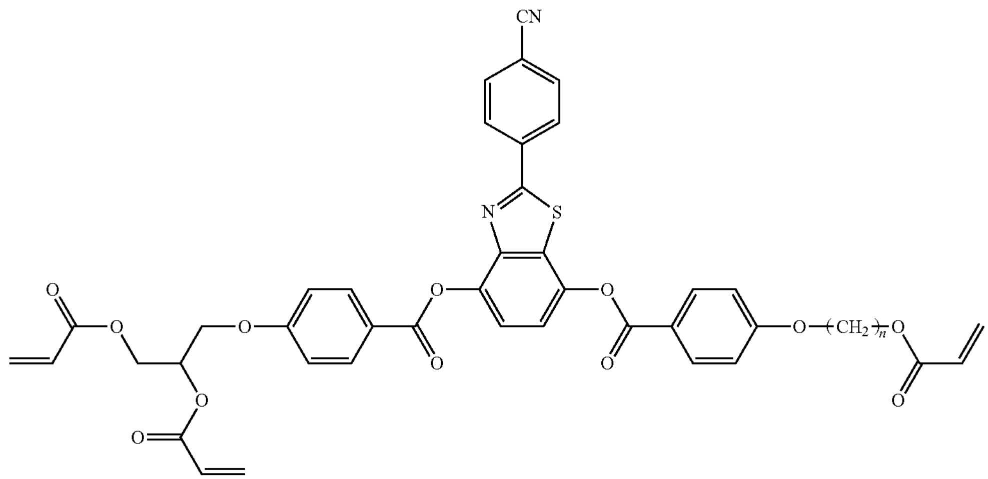

(in these formulas, n represents the number of carbon atoms and is 1 to 10). These liquid crystalline compounds may be used alone or as a mixture of two or more.

In general formula (6), the group represented by $P^{63}$—$(S^{63}$—$X^{63})_{16}$— and the group represented by $P^{64}$—$(S^{64}$—$X^{64})_{k6}$— are bonded to $A^{11}$ or $A^{12}$ in general formula (a).

Specifically, the compound represented by general formula (6) is preferably compounds represented by the following formula (6-a-1) to formula (6-a-25):

[Chem. 93]

(6-a-1)

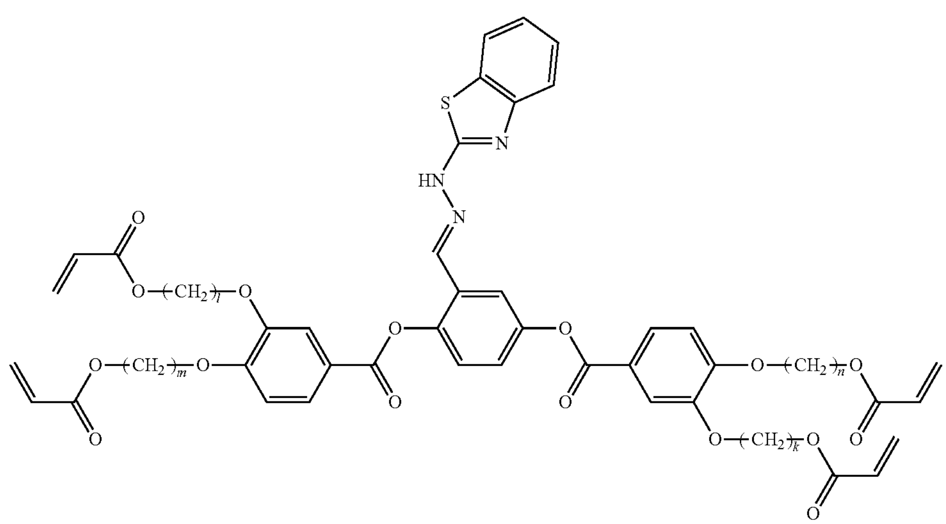

-continued
(6-a-2)
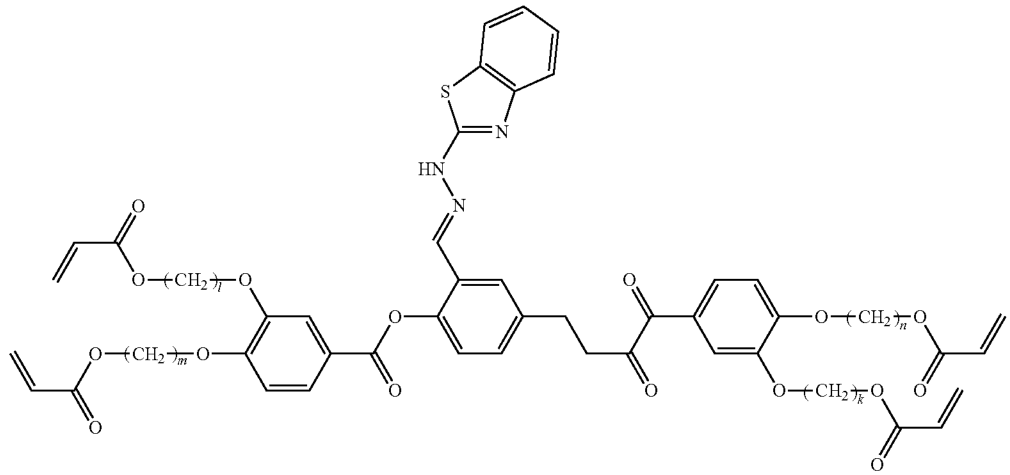
(6-a-3)
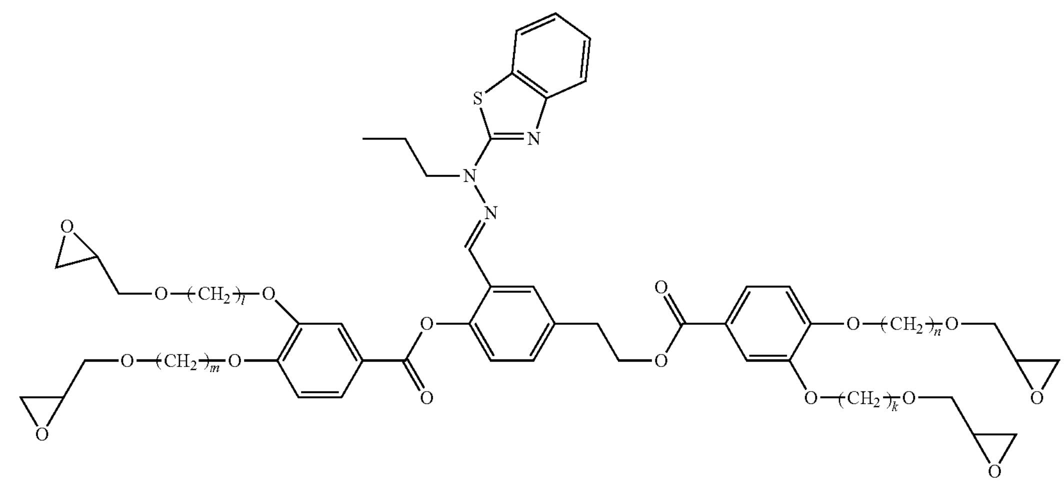
(6-a-4)
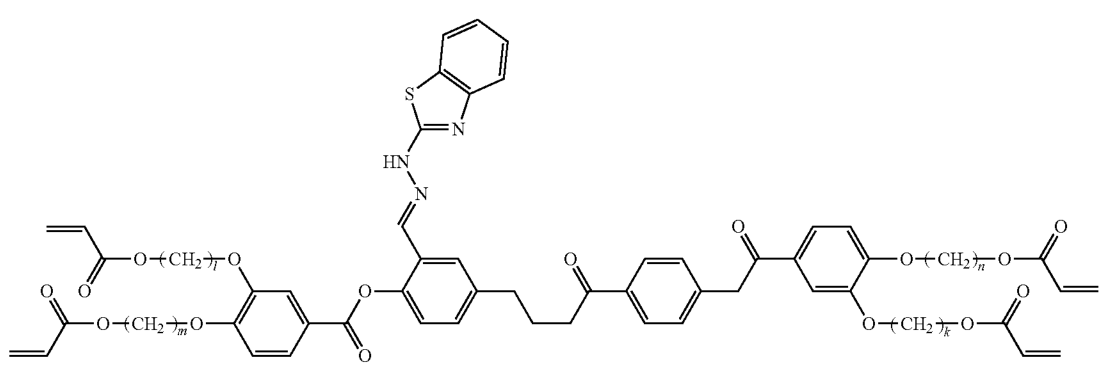

-continued
[Chem. 94]
(6-a-5)
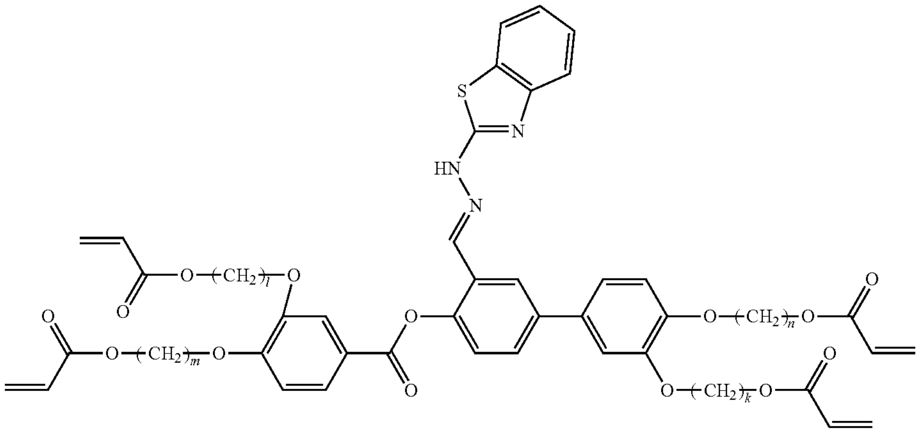
(6-a-6)
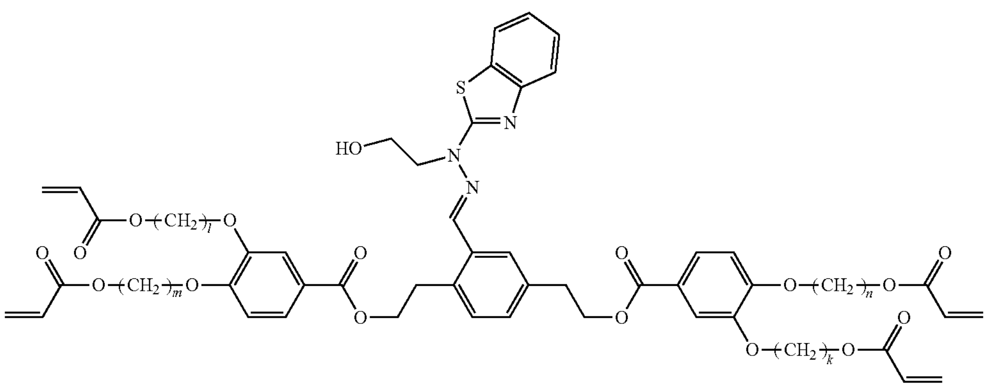
(6-a-7)
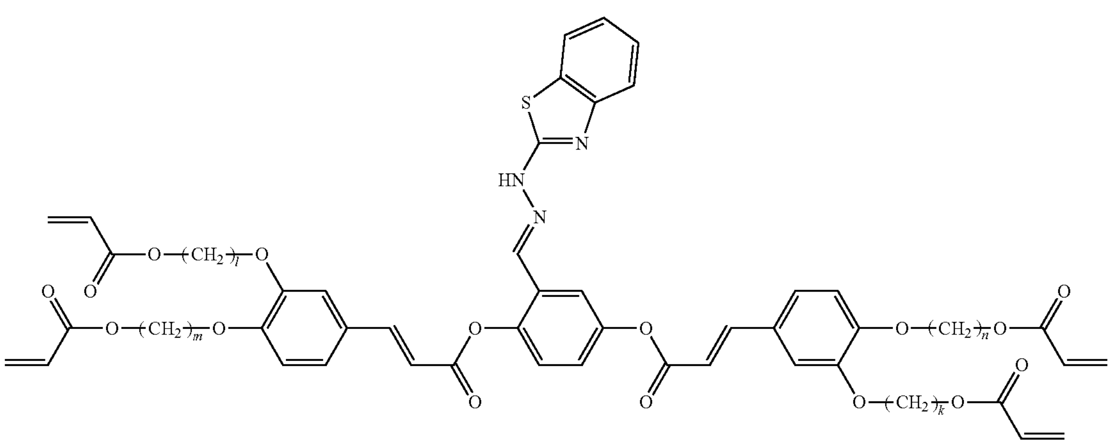

-continued
(6-a-8)
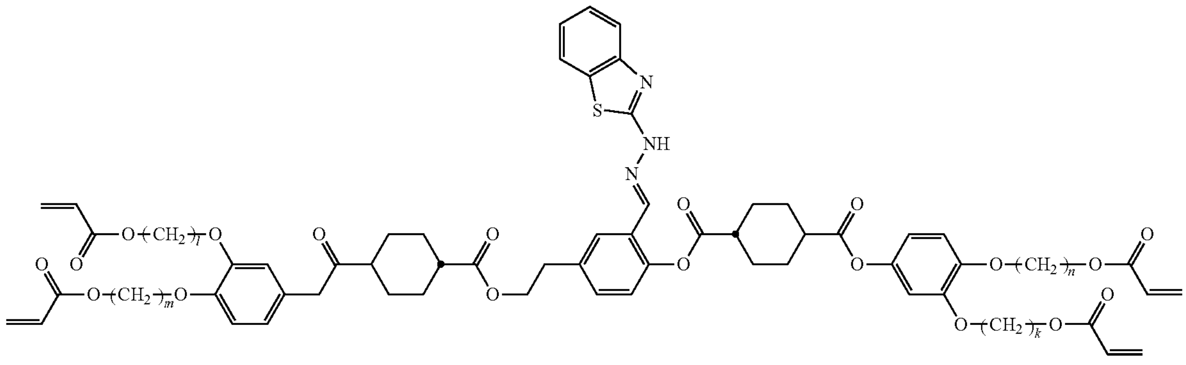
(6-a-9)
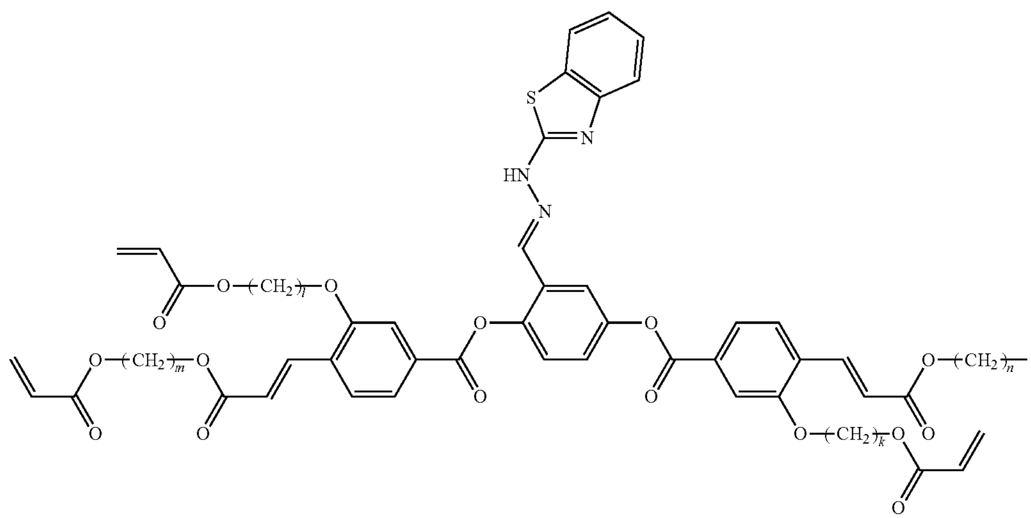
[Chem. 95]
(6-a-10)
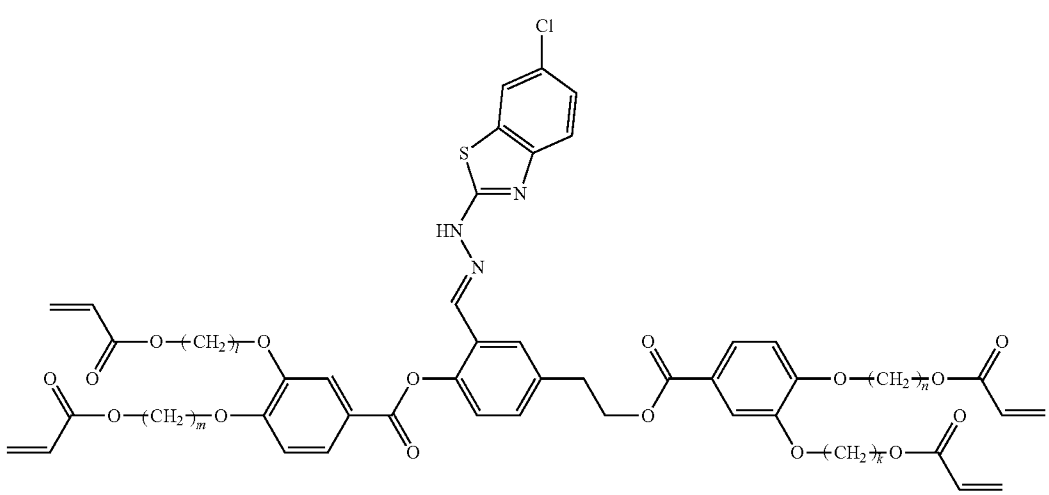

-continued
(6-a-11)
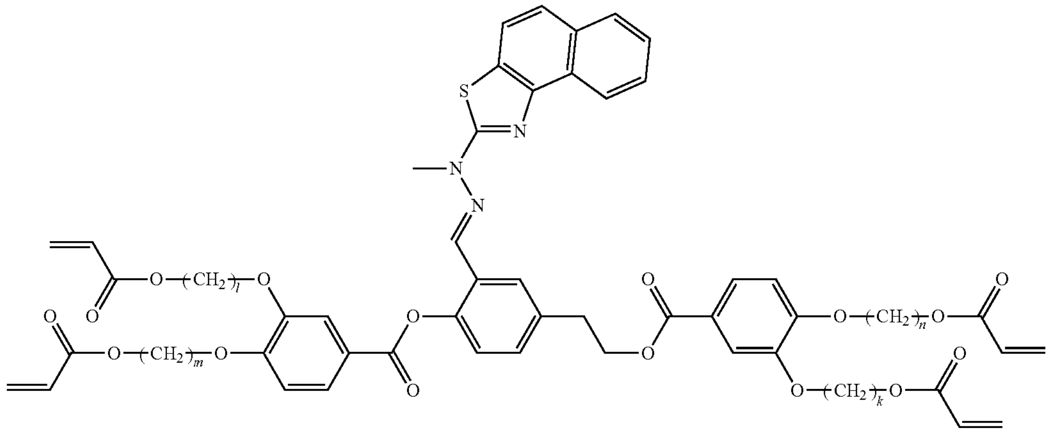
(6-a-12)
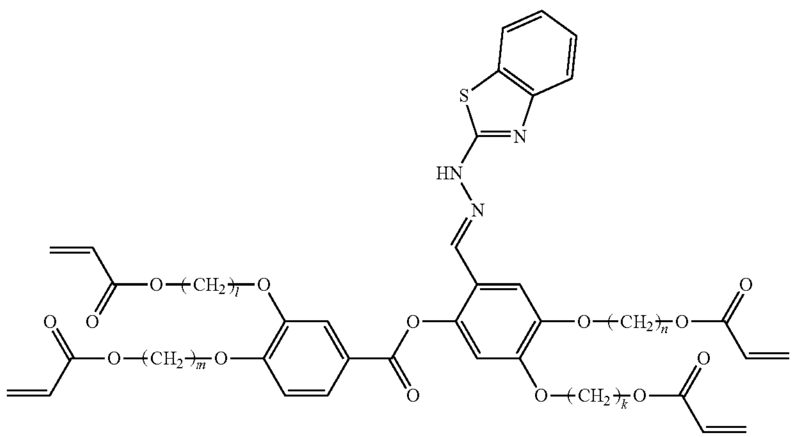
(6-a-13)
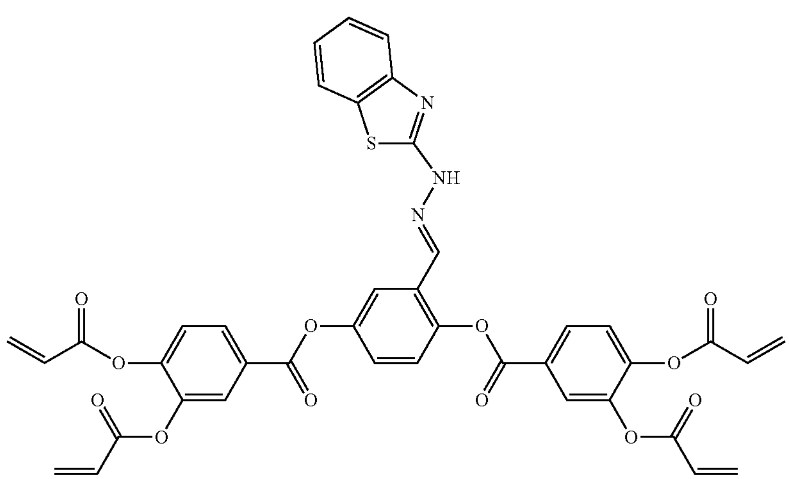

-continued
(6-a-14)
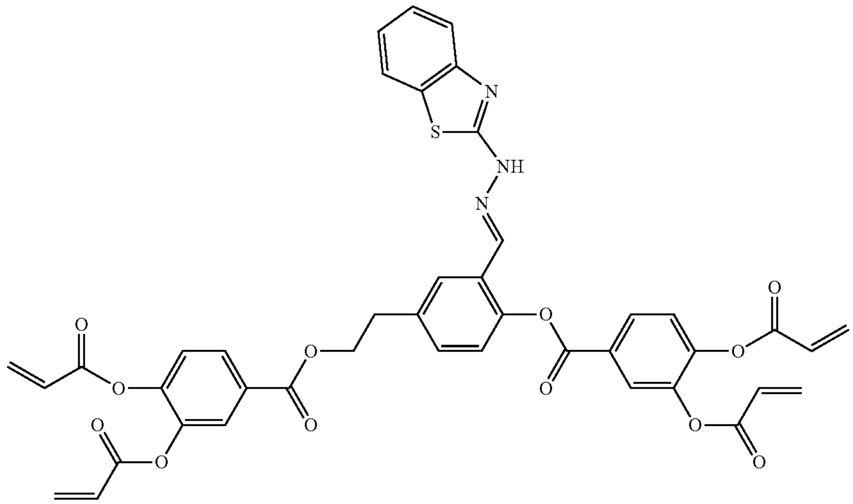
[Chem. 96]
(6-a-15)
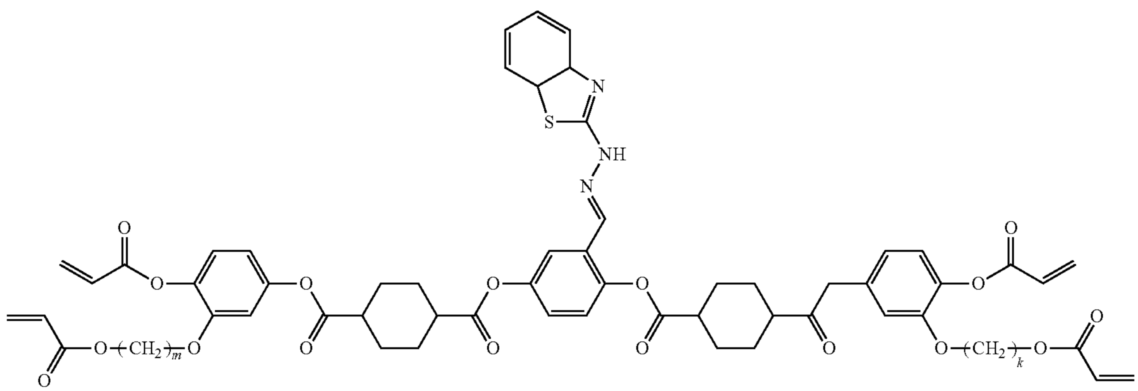
(6-a-16)
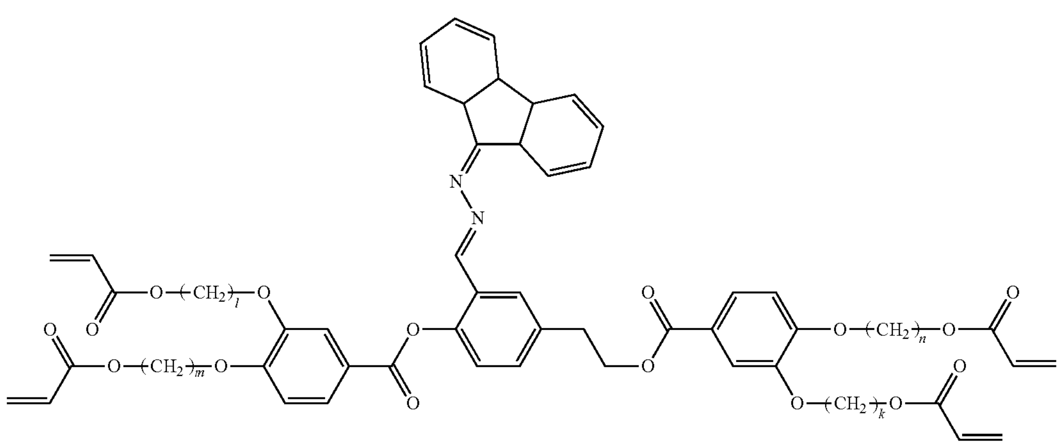

-continued
(6-a-17)
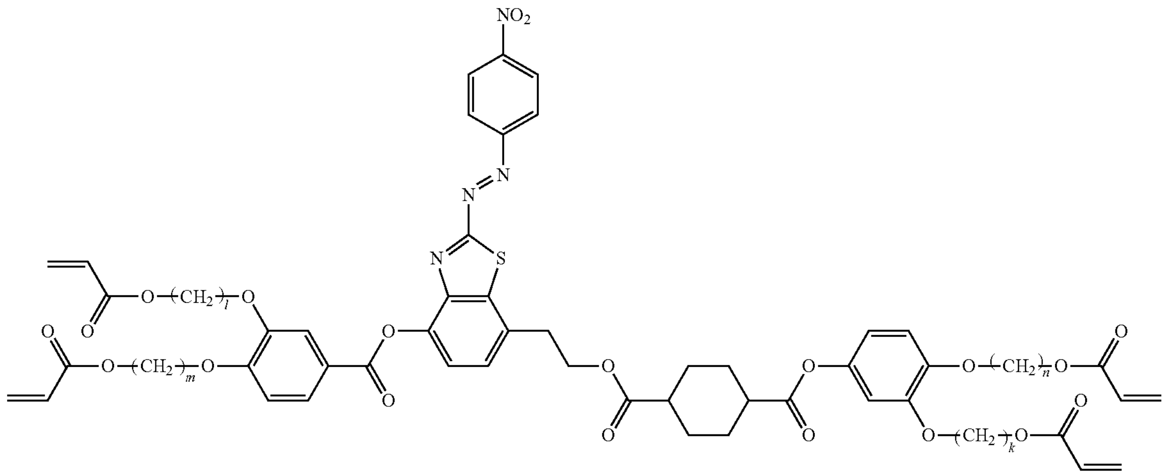
(6-a-18)
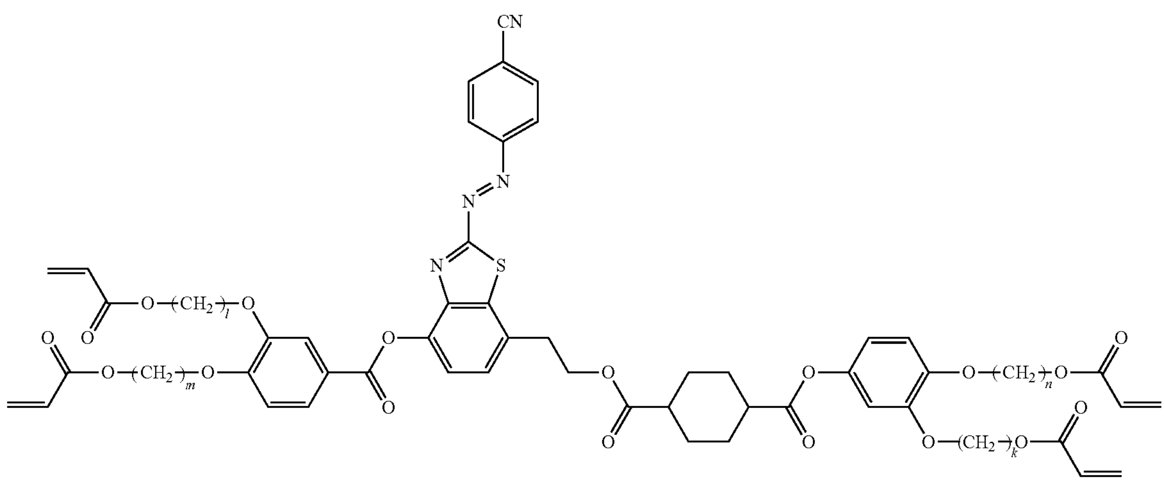
[Chem. 97]
(6-a-19)
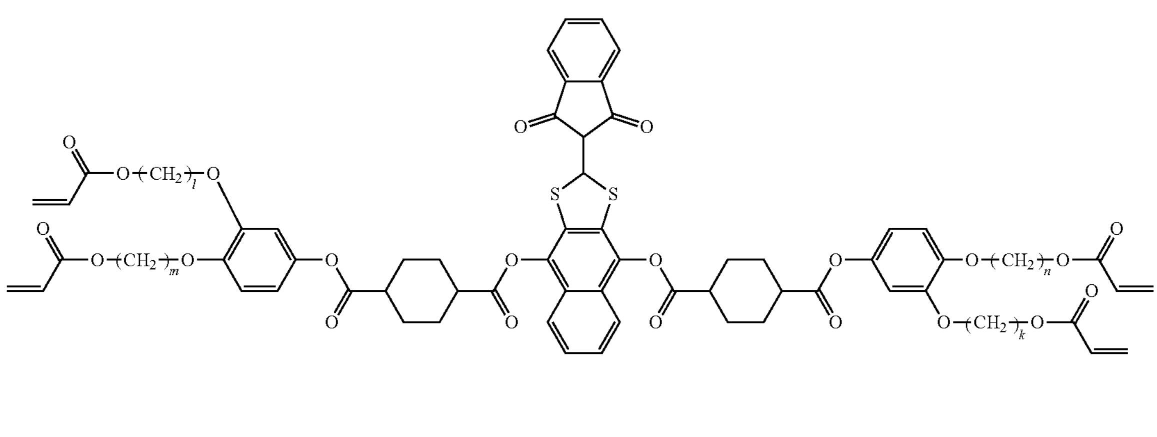

-continued
(6-a-20)
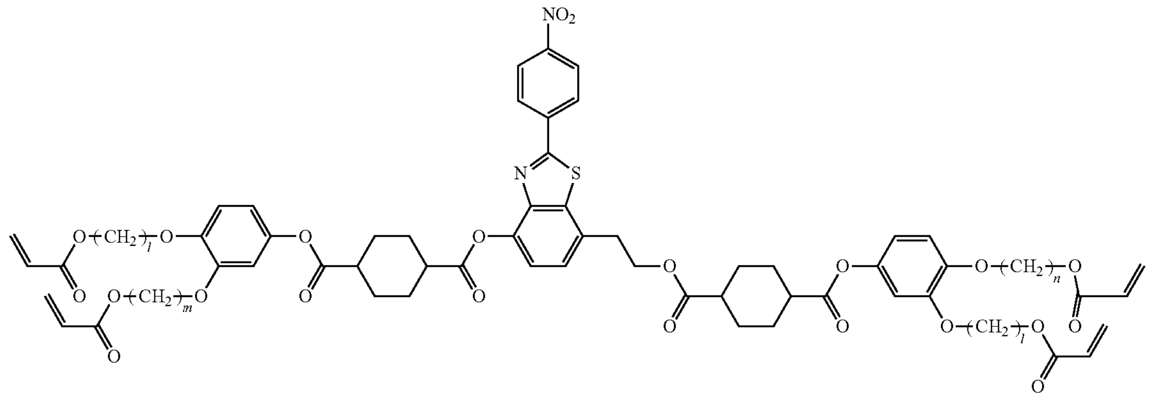
(6-a-21)
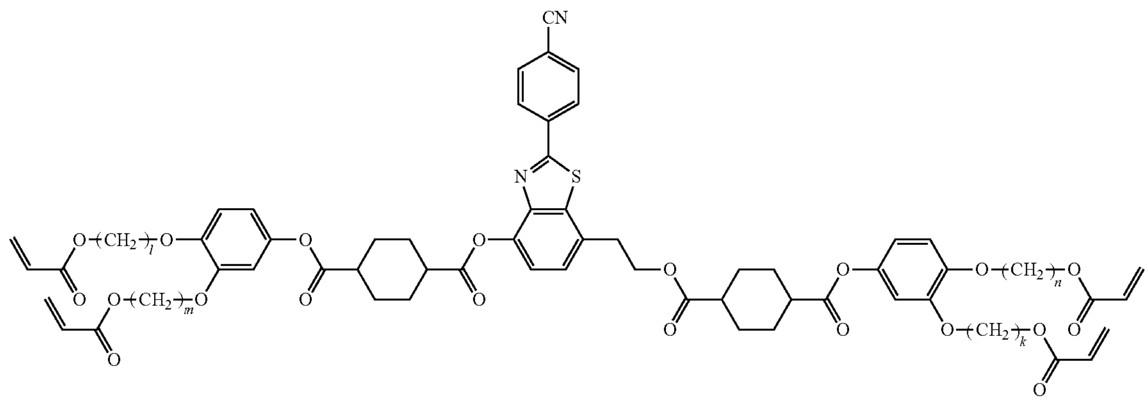
(6-a-22)
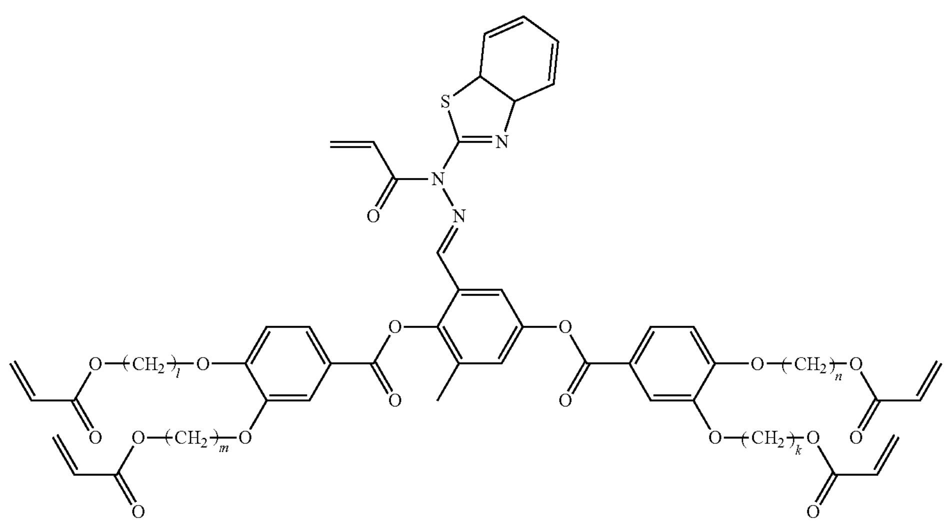

-continued
[Chem. 98]
(6-a-23)
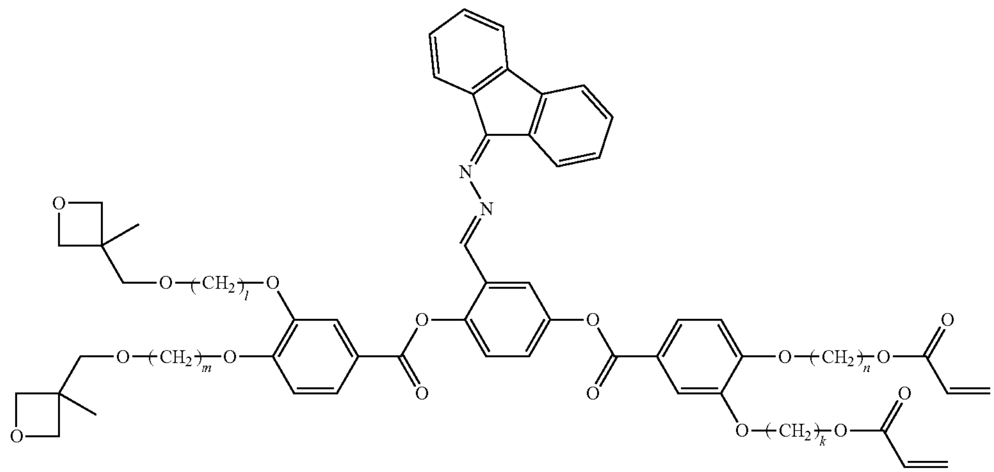
(6-a-24)
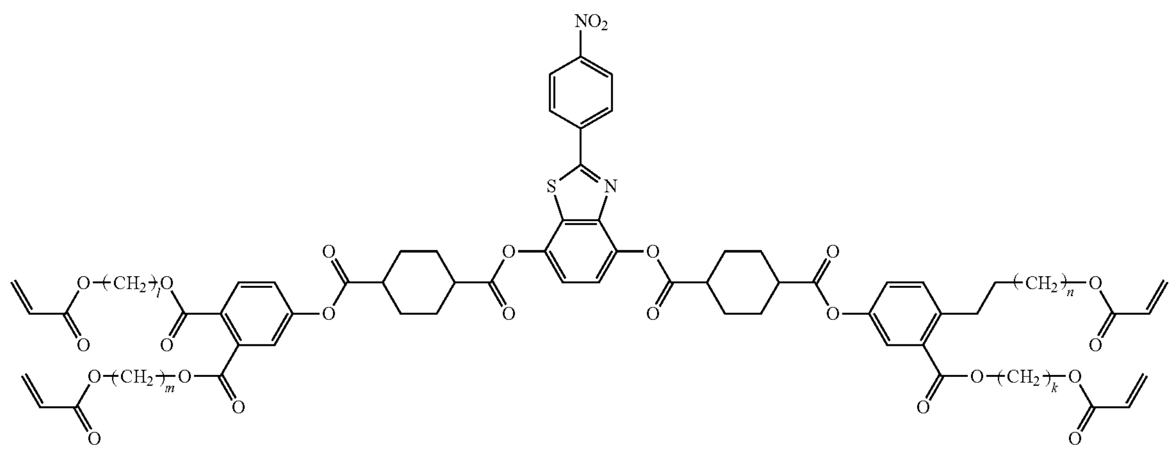
(6-a-25)
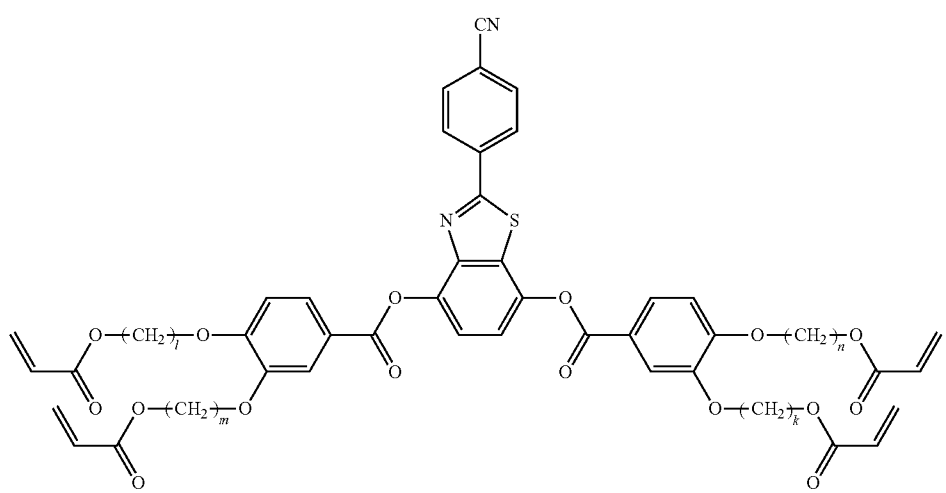
(in the above formulas, k, l, m, and n each independently represent the number of carbon atoms and are 1 to 10). These liquid crystalline compounds may be used alone or as a mixture of two or more.

Specifically, the compound represented by general formula (7) is preferably compounds represented by the following formula (7-a-1) to formula (7-a-26).
[Chem. 99]
(7-a-1)
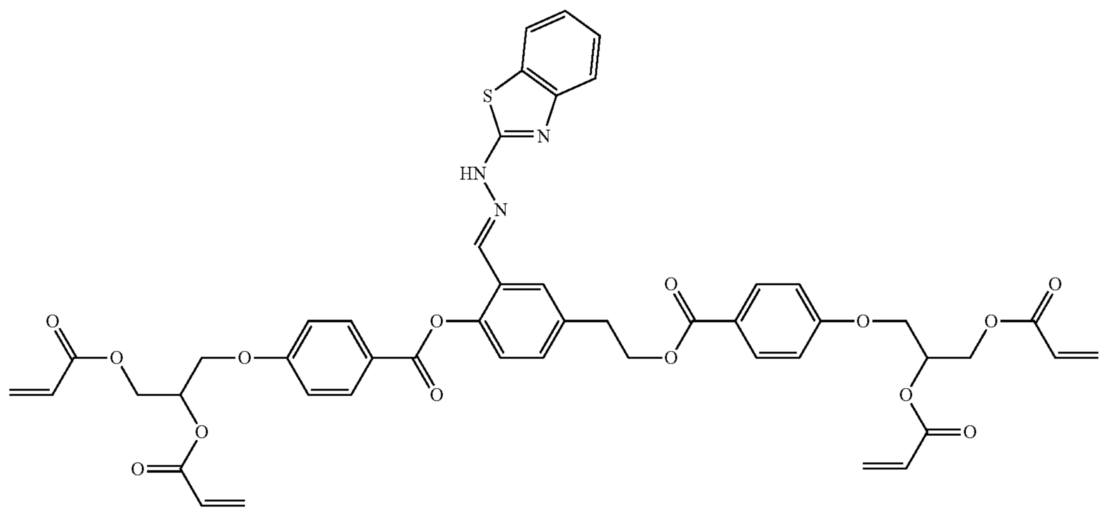
(7-a-2)
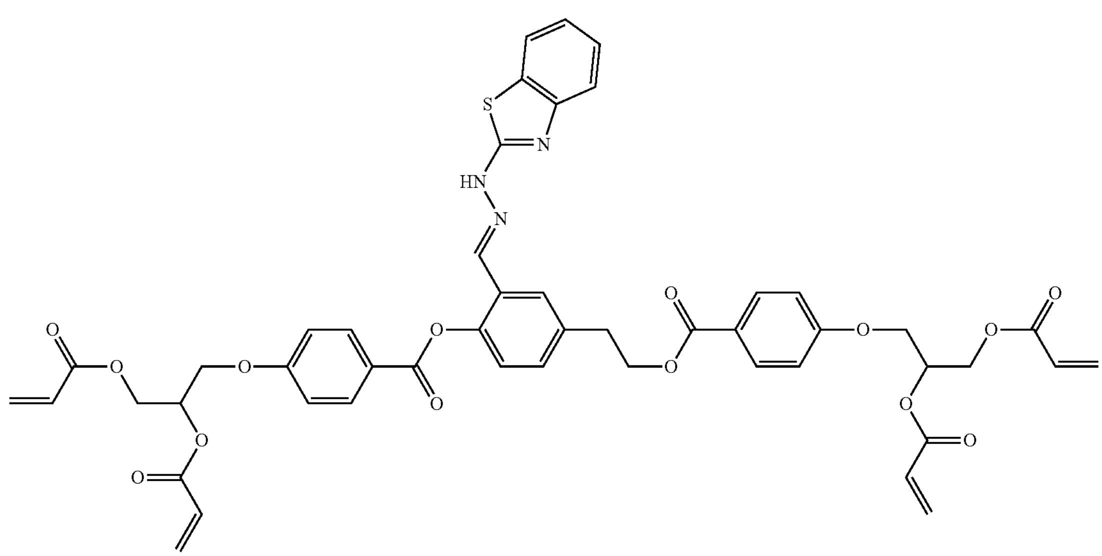

-continued
(7-a-3)
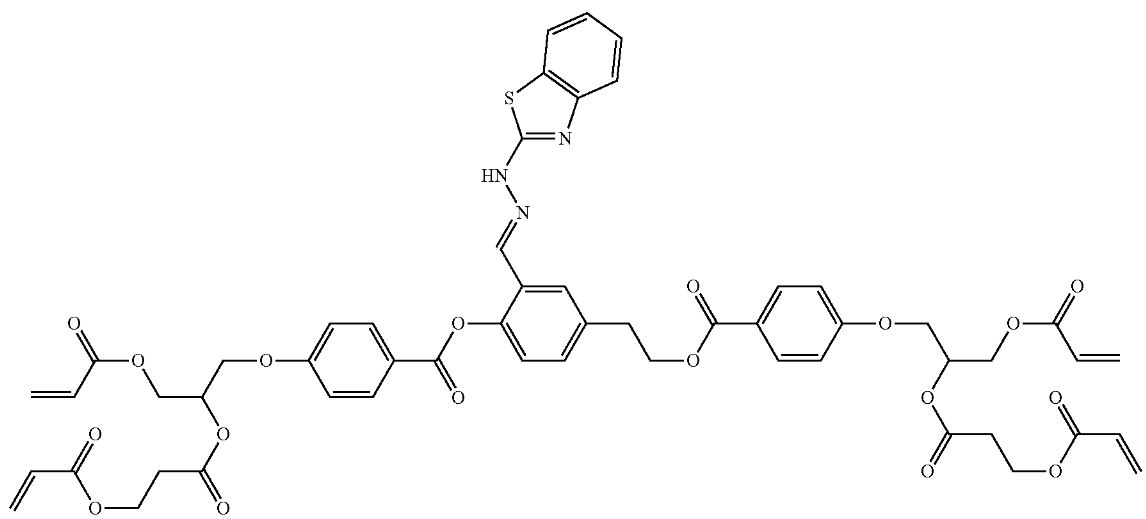
(7-a-4)
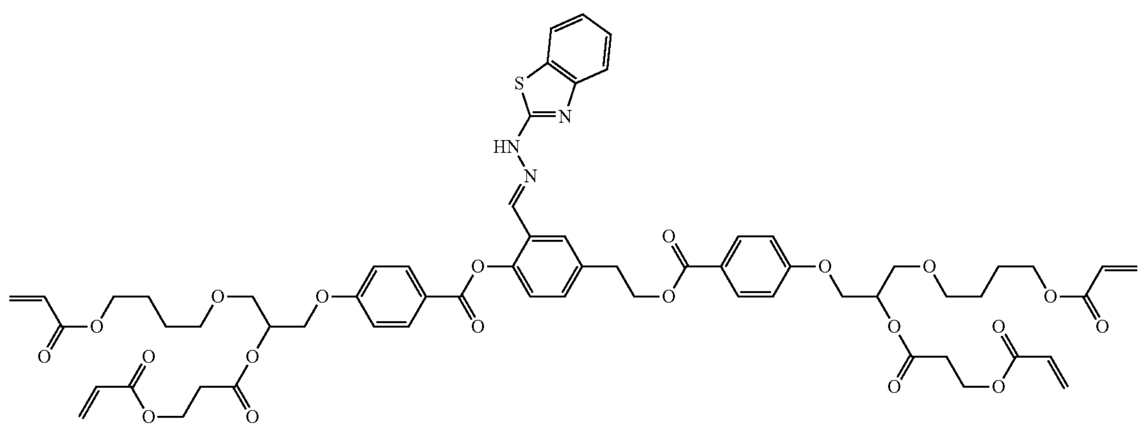
(7-a-5)
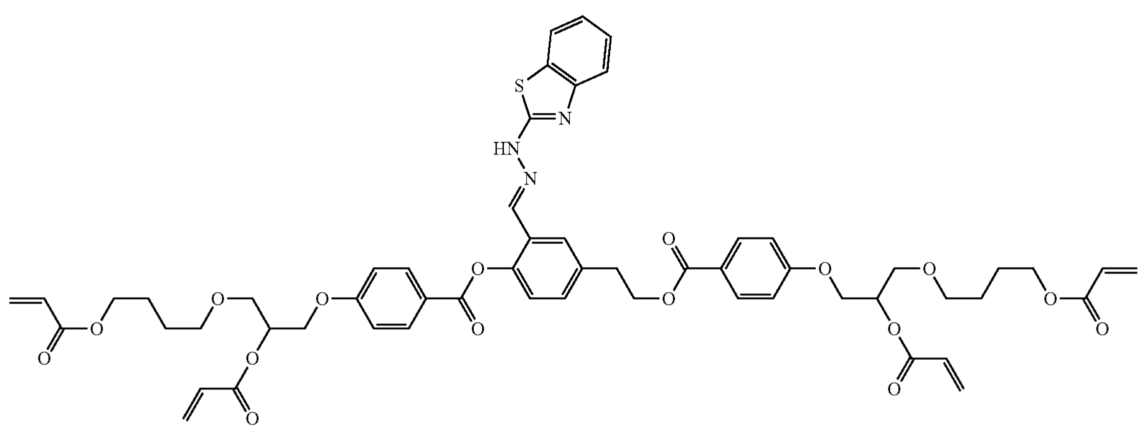

-continued
[Chem. 100]
(7-a-6)
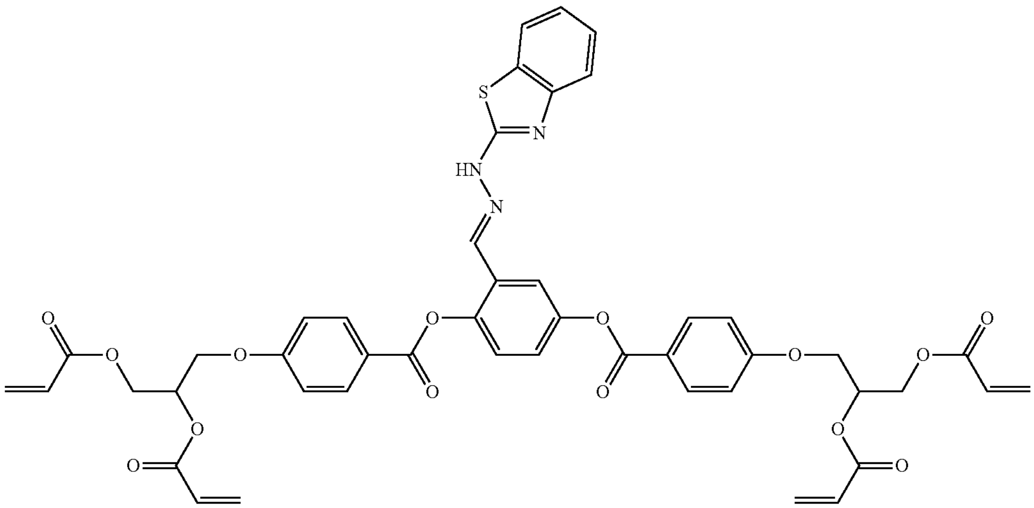
(7-a-7)
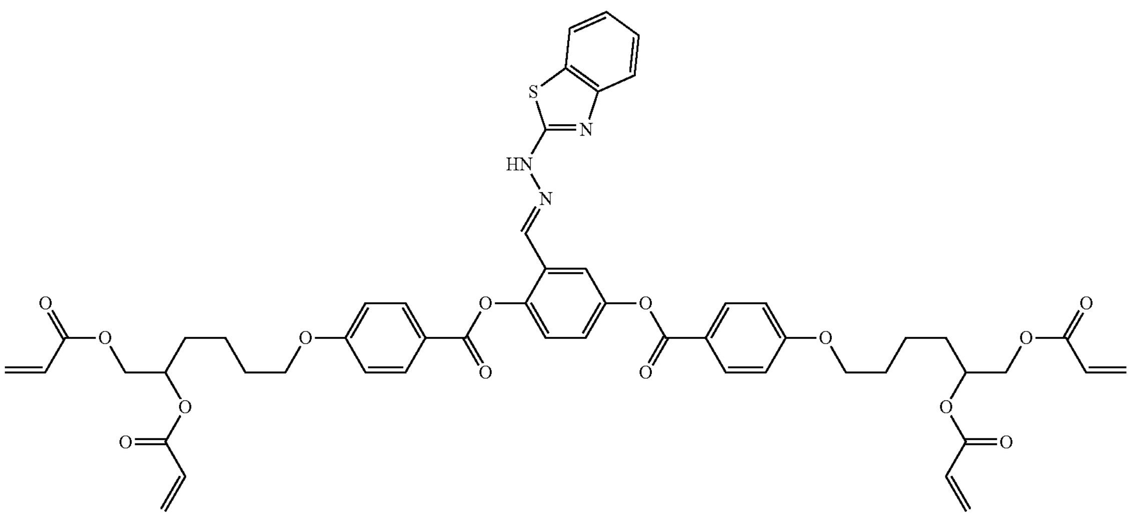
(7-a-8)
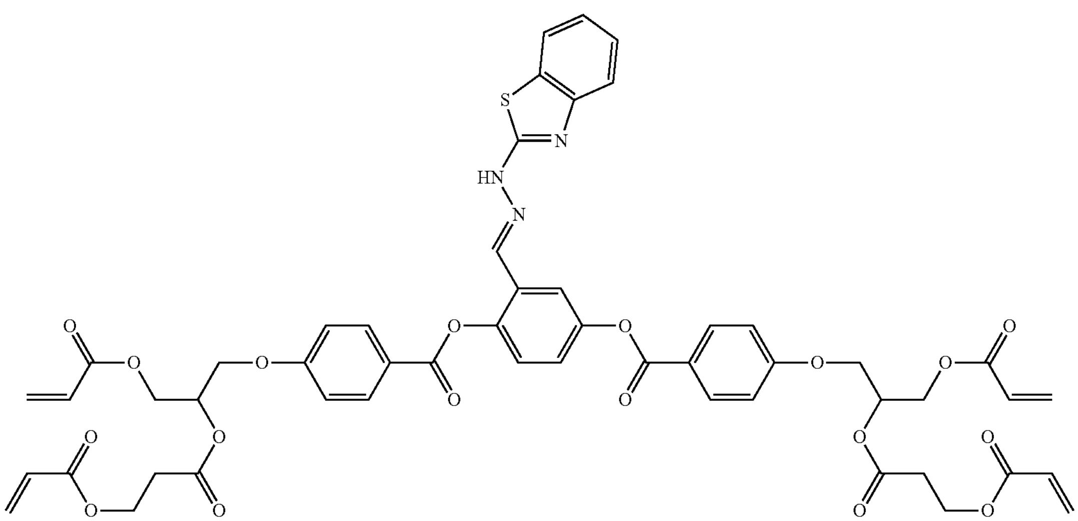

-continued
(7-a-9)
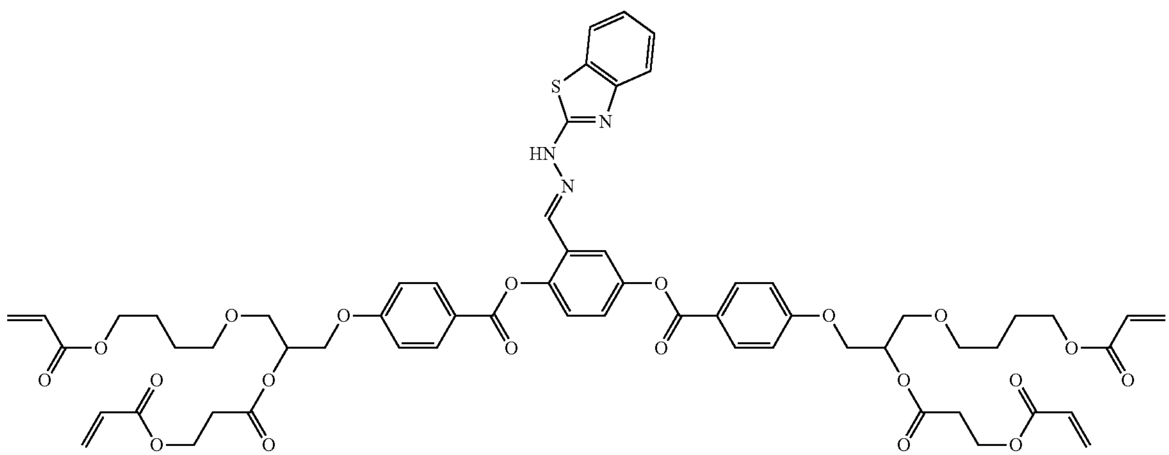
[Chem. 101]
(7-a-10)
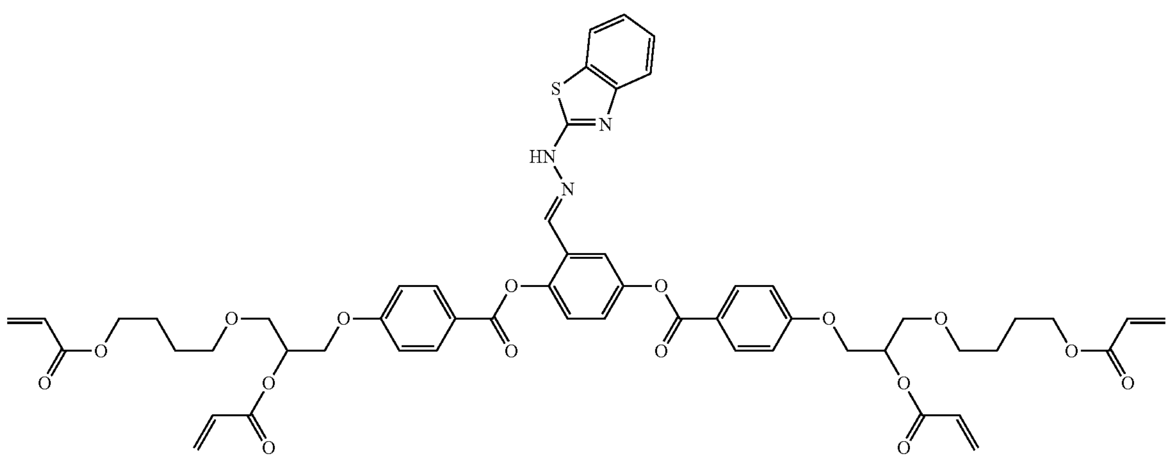
(7-a-11)
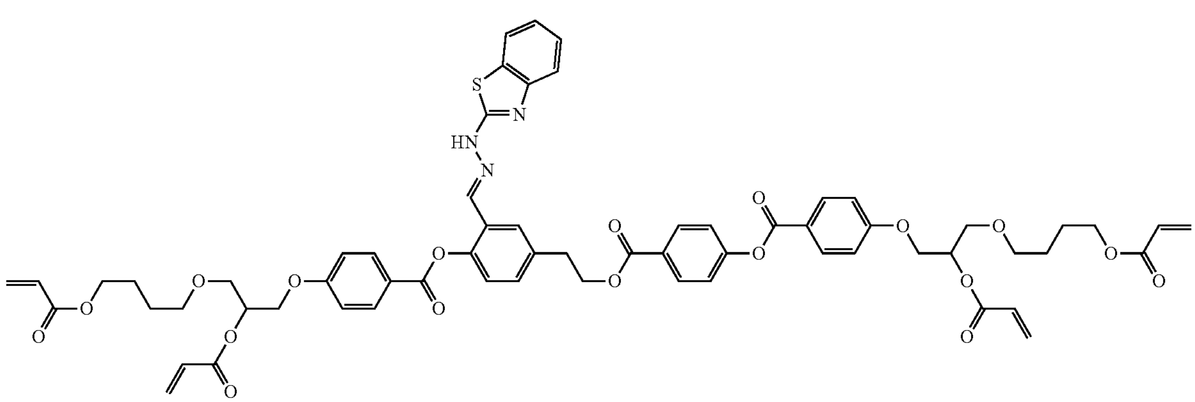

-continued
(7-a-12)
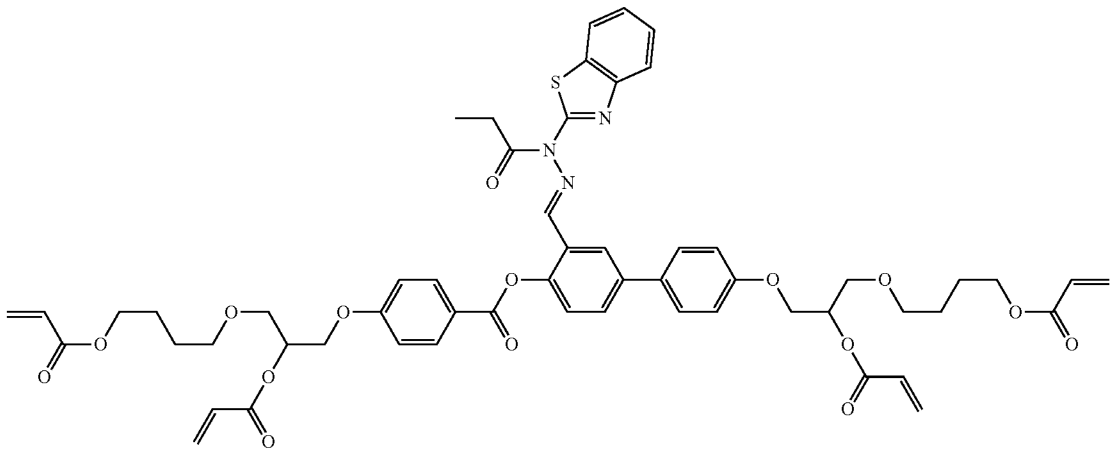
(7-a-13)
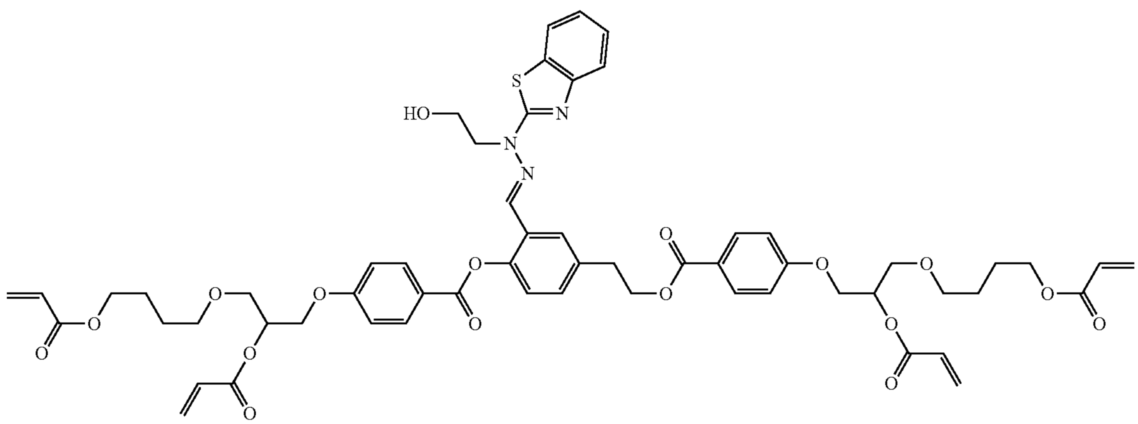
[Chem. 102]
(7-a-14)
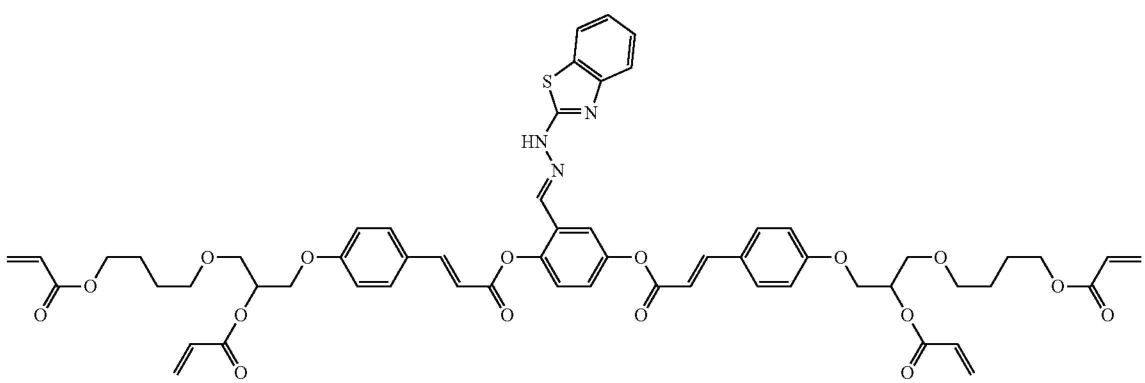

-continued
(7-a-15)
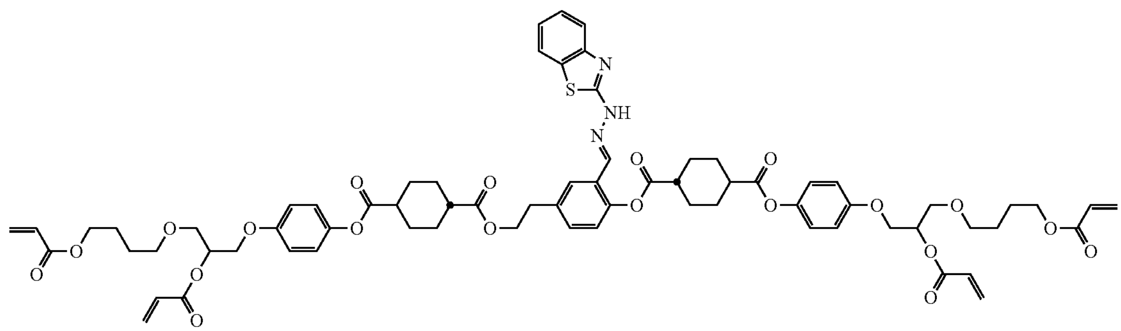
(7-a-16)
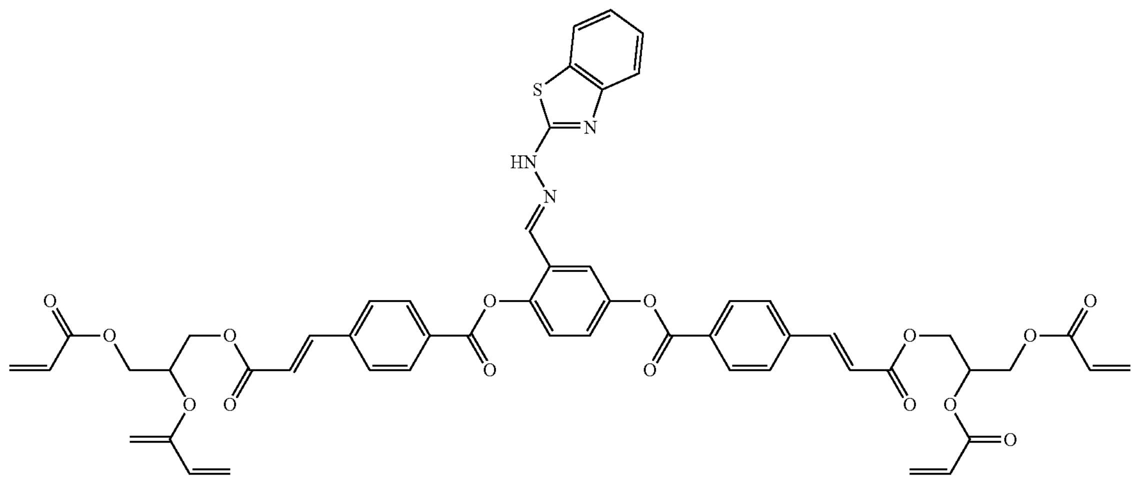
(7-a-17)
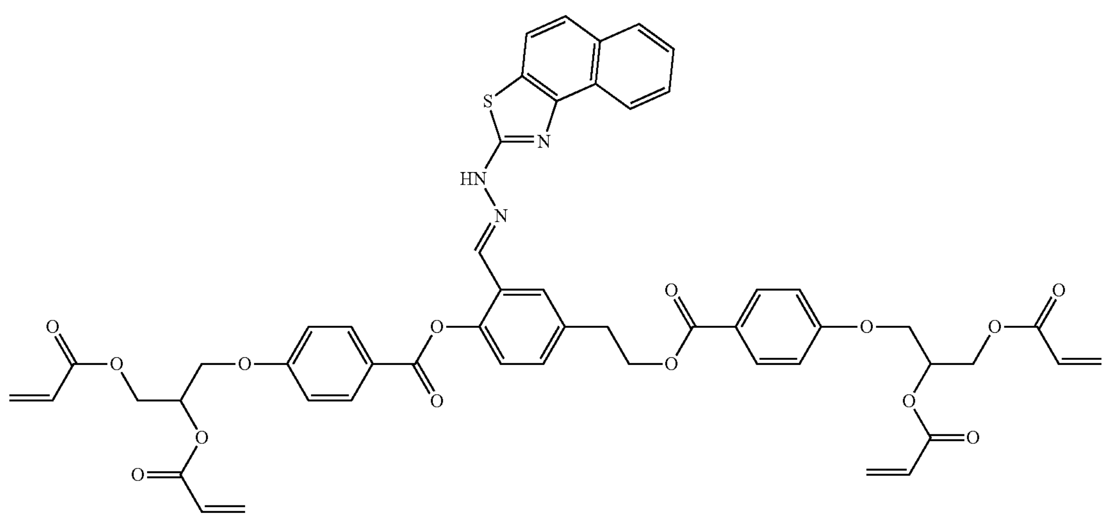

-continued
[Chem. 103]
(7-a-18)
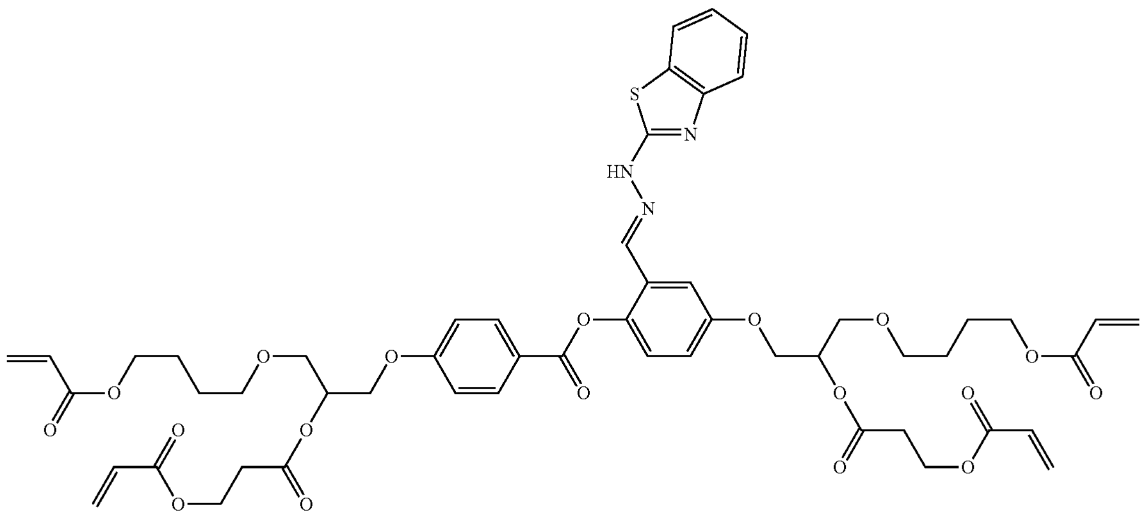
(7-a-19)
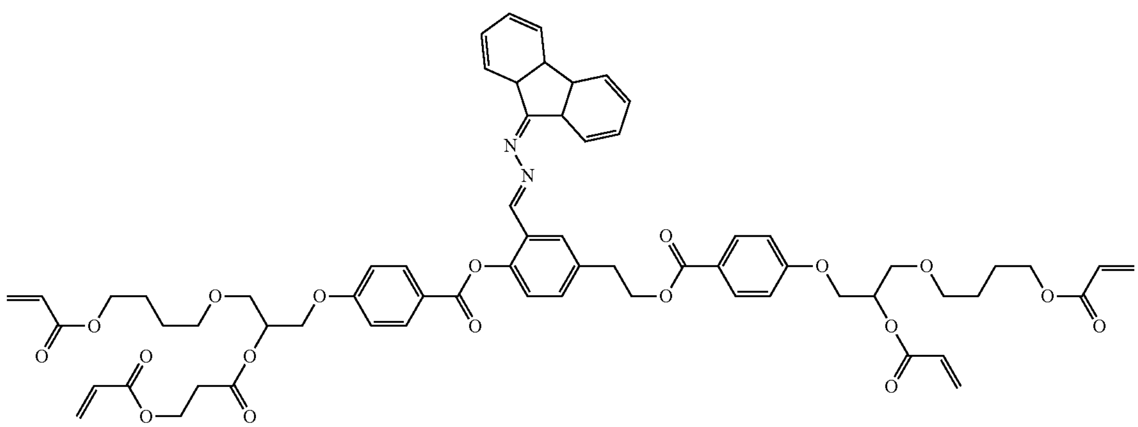
(7-a-20)
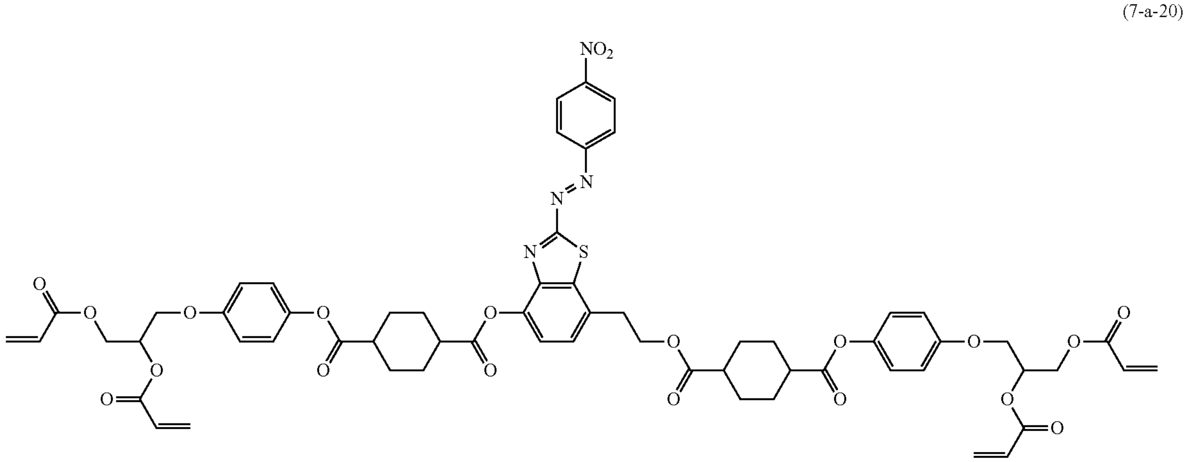

-continued
(7-a-21)
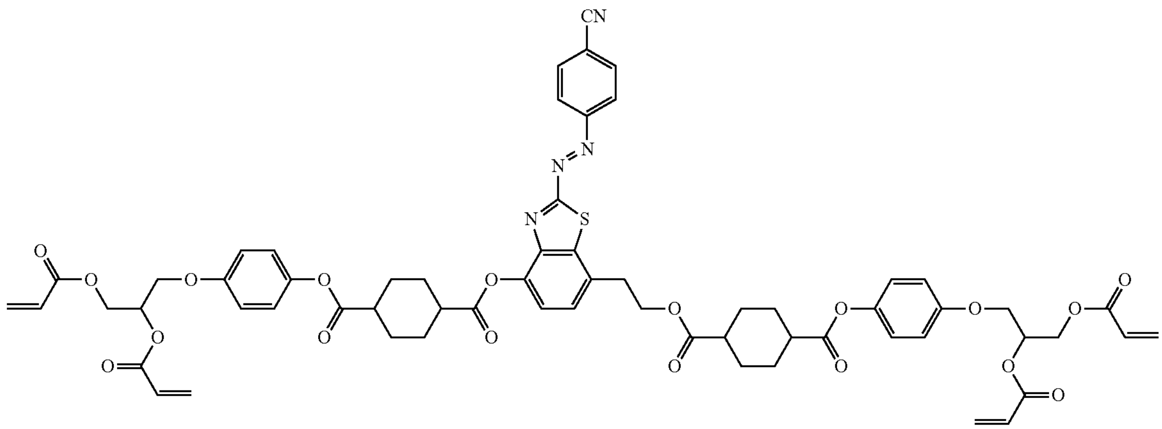
[Chem. 104]
(7-a-22)
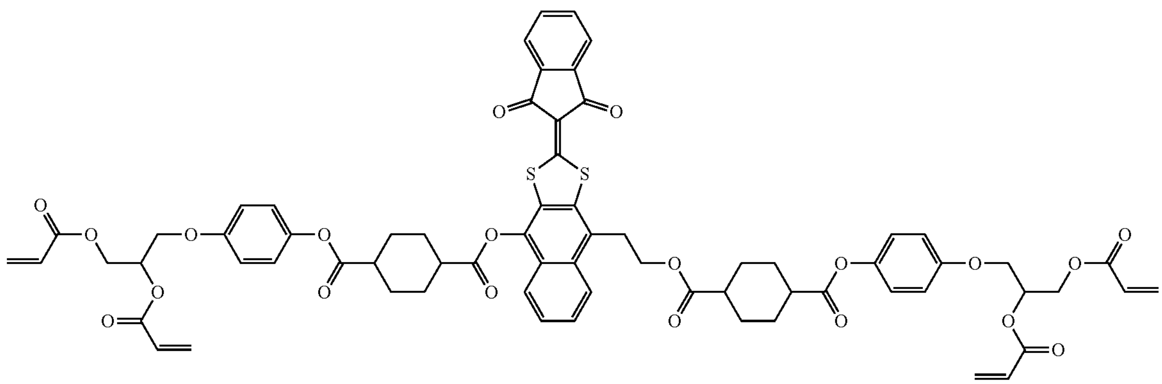
(7-a-23)
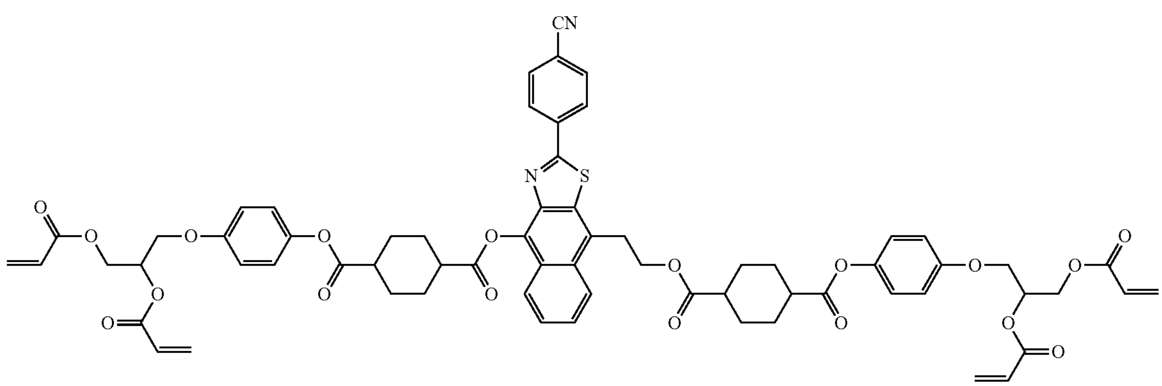

-continued
(7-a-24)
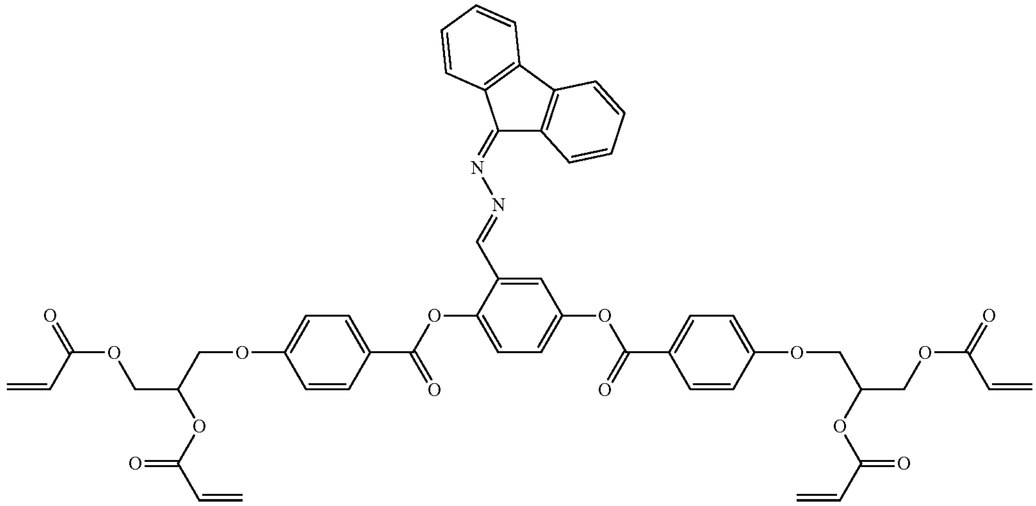
[Chem. 105]
(7-a-25)
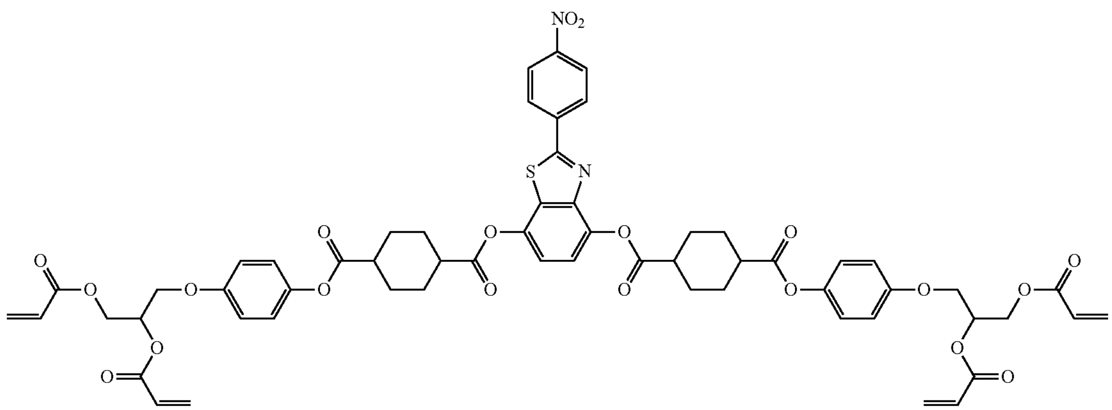
(7-a-26)
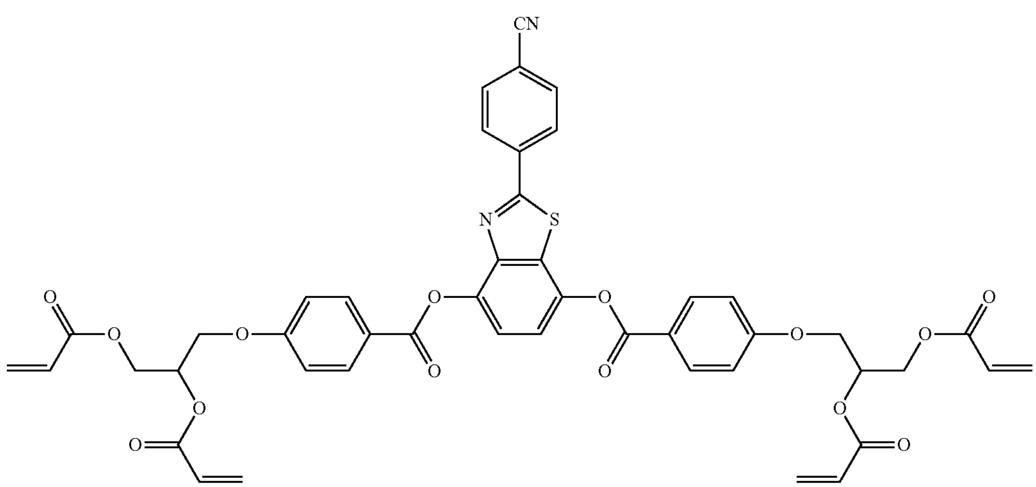

These liquid crystalline compounds may be used alone or as a mixture of two or more.

The total content of polymerizable compounds having one or two or more polymerizable groups is preferably 60 to 100% by mass, more preferably 65 to 98% by mass, and particularly preferably 70 to 95% by mass with respect to the total mass of polymerizable compounds used for the polymerizable composition.

Fluorosurfactant

The polymerizable composition of the present invention contains at least one fluorosurfactant (III) selected from the group consisting of a compound having a pentaerythritol skeleton and a compound having a dipentaerythritol skeleton.

The use of the fluorosurfactant allows the polymerizable composition of the present invention to have excellent solution stability because the fluorosurfactant has good compatibility with polymerizable compounds and also allows an optically anisotropic body formed of the polymerizable composition to have improved surface leveling properties and improved offset properties simultaneously while good alignment is maintained.

Preferably, the fluorosurfactant is composed only of carbon atoms, hydrogen atoms, oxygen atoms, fluorine atoms, and sulfur atoms. These atoms forming the surfactant are the same as atoms forming the structures of portions (spacer (Sp) portions and mesogenic (MG) portions other than terminal portions (terminal groups)) of polymerizable compounds used in the present invention, and this may be the reason for the increased compatibility with the polymerizable compounds.

Compound Having Pentaerythritol Skeleton

Examples of the compound having a pentaerythritol skeleton include a compound represented by general formula (III-1) below:

[Chem. 106]

(III-1)

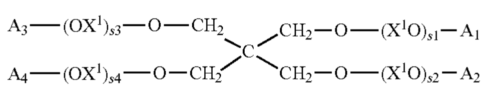

(wherein $X^1$ represents an alkylene group; s1 represents a numerical value of 1 to 80; s2 to s4 each independently represent a numerical value of 0 to 79; and s1+s2+s3+s4 represents a numerical value of 4 to 80. $A_1$ represents a fluoroalkyl group or a fluoroalkenyl group, and $A_2$ to $A_4$ each independently represent a hydrogen atom, an acryloyl group, a methacryloyl group, a fluoroalkyl group, or a fluoroalkenyl group).

In general formula (III-1), $X^1$ represents an alkylene group. $X^1$ is preferably an ethylene group or a propylene group and more preferably an ethylene group.

In general formula (III-1), s1 represents a numerical value of 1 to 80 and is preferably 1 to 60 and particularly preferably 1 to 40. s2 to s4 each independently represent a numerical value of 0 to 79 and are preferably 0 to 65 and particularly preferably 0 to 50. s1+s2+s3+s4 represents a numerical value of 4 to 80 and is preferably 4 to 40 and particularly preferably 4 to 30.

In general formula (III-1), $A_1$ represents a fluoroalkyl group or a fluoroalkenyl group. The number of carbon atoms in the fluoroalkyl group or the fluoroalkenyl group is preferably 3 to 10 and more preferably 4 to 9, and the fluoroalkyl group and the fluoroalkenyl group may be linear or branched. $A_2$ to $A_4$ each independently represent a hydrogen atom, an acryloyl group, a methacryloyl group, a fluoroalkyl group, or a fluoroalkenyl group. The number of carbon atoms in the fluoroalkyl group or the fluoroalkenyl group is preferably 3 to 10 and more preferably 4 to 9, and the fluoroalkyl group and the fluoroalkenyl group may be linear or branched. $A_1$ to $A_4$ are each preferably a fluoroalkenyl group and particularly preferably a branched fluorononenyl group.

The compound represented by general formula (III-1) is produced, for example, by adding an alkylene oxide to pentaerythritol and then substituting active hydrogen at each terminal end of the adduct with a fluoroalkyl group or a fluoroalkenyl group. A hydrocarbon group such as a long-chain alkyl, acrylic acid, methacrylic acid, or a reactive functional group such as a glycidyl group may be introduced into an active hydrogen group into which no fluoroalkyl group or no fluoroalkenyl group is introduced.

Examples of the compound having a pentaerythritol skeleton include a compound represented by general formula (III-1a) below:

[Chem. 107]

(III-1a)

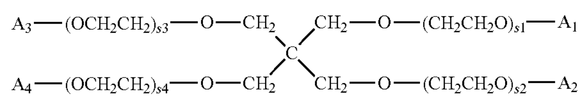

(wherein $A_1$ represents any one of groups represented by formula (Rf-1-1) to formula (Rf-1-8) below, and $A_2$ to $A_4$ each independently represent a hydrogen atom or any one of the groups represented by formula (Rf-1-1) to formula (Rf-1-9) below):

[Chem. 108]

$$-C_nF_{2n+1} \quad \text{(Rf-1-1)}$$

$$-C_nF_{2n}H \quad \text{(Rf-1-2)}$$

$$-C_nF_{2n-1} \quad \text{(Rf-1-3)}$$

$$-C_nF_{2n-3} \quad \text{(Rf-1-4)}$$

$$-C_mF_{2m}OC_nF_{2n}CF_3 \quad \text{(Rf-1-5)}$$

$$-C_mF_{2m}OC_nF_{2n}OC_pF_{2p}CF_3 \quad \text{(Rf-1-6)}$$

$$-CF_2OC_2F_4OC_2F_4OCF_3 \quad \text{(Rf-1-7)}$$

(Rf-1-8)

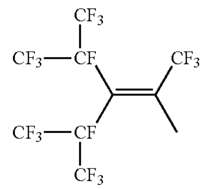

(in formulas (Rf-1-1) to (Rf-1-4) above, n represents an integer of 4 to 6. In formula (Rf-1-5) above, m is an integer of 1 to 5; n is an integer of 0 to 4; and the sum of m and n is 4 to 5. In formula (Rf-1-6) above, m is an integer of 0 to 4; n is an integer of 1 to 4; p is an integer of 0 to 4; and the sum of m, n, and p is 4 to 5). More preferred specific examples of the above general formula (III-1a) include general formula (III-1a-1) below:

[Chem. 109]

(III-1a-1)

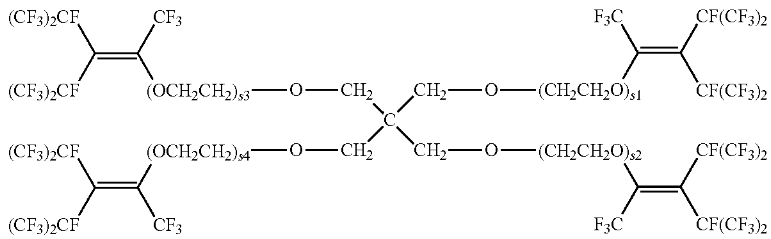

(wherein s1 represents a numerical value of 1 to 80 and is preferably 1 to 60 and particularly preferably 1 to 40; s2 to s4 each independently represent a numerical value of 0 to 79 and are preferably 0 to 65 and particularly preferably 0 to 50; and s1+s2+s3+s4 represents a numerical value of 4 to 80 and is preferably 4 to 40 and particularly preferably 4 to 30).

Compound Having Dipentaerythritol Skeleton

Examples of the compound having a dipentaerythritol skeleton include a compound represented by general formula (III-2) below:

[Chem. 110]

(III-2)

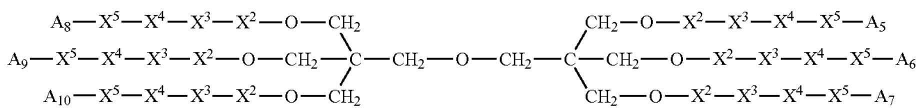

(wherein $X^2$, $X^3$, $X^4$, and $X^5$ each independently represent a single bond, —O—, —S—, —CO—, an alkyl group having 1 to 4 carbon atoms, or an oxyalkylene group; $A_5$ represents a fluoroalkyl group or a fluoroalkenyl group; and $A_6$ to $A_{10}$ each independently represent a hydrogen atom, an acryloyl group, a methacryloyl group, a fluoroalkyl group, or a fluoroalkenyl group).

In general formula (III-2), $A_5$ represents a fluoroalkyl group or a fluoroalkenyl group. The number of carbon atoms in the fluoroalkyl group or the fluoroalkenyl group is preferably 3 to 10 and more preferably 4 to 9, and the fluoroalkyl group and the fluoroalkenyl group may be linear or branched. $A_6$ to $A_{10}$ each independently represent a hydrogen atom, an acryloyl group, a methacryloyl group, a fluoroalkyl group, or a fluoroalkenyl group. The number of carbon atoms in the fluoroalkyl group or the fluoroalkenyl group is preferably 3 to 10 and more preferably 4 to 9, and the fluoroalkyl group and the fluoroalkenyl group may be linear or branched. $A_5$ is preferably a fluoroalkyl group and particularly preferably a linear fluoroalkyl group, and $A_6$ to $A_{10}$ are each preferably an acryloyl group, a methacryloyl group, or a fluoroalkyl group and particularly preferably an acryloyl group or a linear fluoroalkyl group. Particularly preferably, at least one of $A_6$ to $A_{10}$ is an acryloyl group.

The compound represented by general formula (III-2) is produced, for example, by reacting a monothiol monomer having a fluoroalkyl group or a fluoroalkenyl group with a polyfunctional acrylate of dipentaerythritol through Michael addition.

Examples of the compound having a dipentaerythritol skeleton include a compound represented by general formula (III-2a) below:

[Chem. 111]

(III-2a)

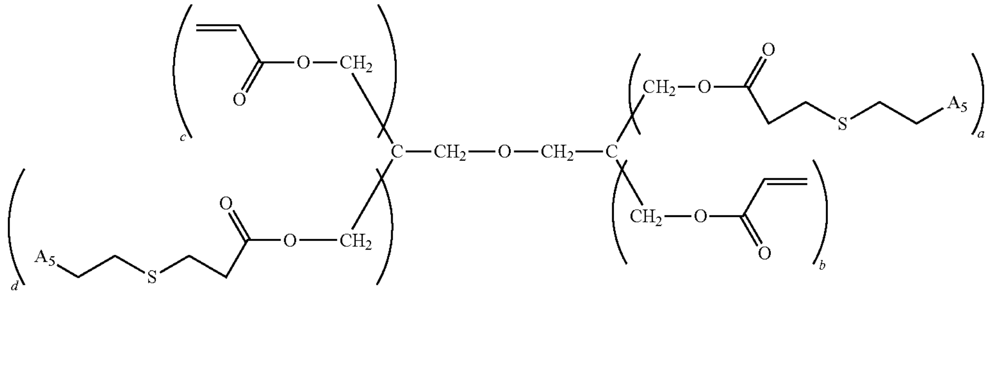

(wherein a and b are each an integer of 1 or 2 while a+b=3 holds; c and d are each an integer from 0 to 3 while c+d=3 holds; and $A_5$ represents any one of groups represented by formula (Rf-2-1) to formula (Rf-2-8) below):

[Chem. 112]

$$—C_nF_{2n+1} \quad \text{(Rf-2-1)}$$

$$—C_nF_{2n}H \quad \text{(Rf-2-2)}$$

$$—C_nF_{2n-1} \quad \text{(Rf-2-3)}$$

$$—C_nF_{2n-3} \quad \text{(Rf-2-4)}$$

$$—C_mF_{2m}OC_nF_{2n}CF_3 \quad \text{(Rf-2-5)}$$

$$—C_mF_{2m}OC_nF_{2n}OC_pF_{2p}CF_3 \quad \text{(Rf-2-6)}$$

$$—CF_2OC_2F_4OC_2F_4OCF_3 \quad \text{(Rf-2-7)}$$

(Rf-2-8)

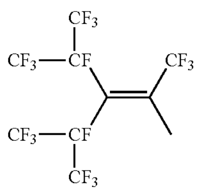

(in formula (Rf-2-1) to (Rf-2-4) above, n represents an integer of 4 to 6. In formula (Rf-2-5) above, m is an integer of 1 to 5; n is an integer of 0 to 4; and the sum of m and n is 4 to 5. In formula (Rf-2-6) above, m is an integer of 0 to 4; n is an integer of 1 to 4; p is an integer of 0 to 4; and the sum of m, n, and p is 4 to 5).

More preferred specific examples of the above general formula (III-2a) include general formula (III-2a-1) below:

[Chem. 113]

(III-2a-1)

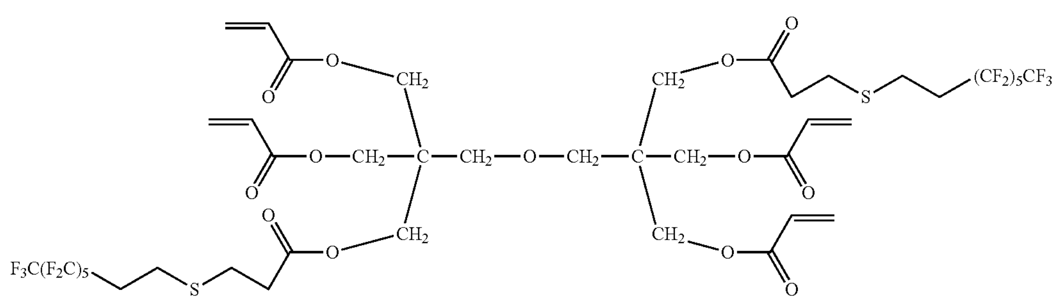

The amount of the fluorosurfactant added is preferably 0.005 to 5% by mass, more preferably 0.01 to 3% by mass, and still more preferably 0.05 to 20% by mass with respect to the total mass of polymerizable compounds and a chiral compound.

Polymerization Initiator

The polymerizable composition used in the present invention may optionally contain a polymerization initiator. The polymerization initiator used for the polymerizable composition of the present invention is used for polymerization of the polymerizable composition of the present invention. No particular limitation is imposed on the photopolymerization initiator used when the polymerizable composition is polymerized by irradiation with light. A commonly used photopolymerization initiator may be used so long as the aligned state of the polymerizable compound used is not inhibited.

Examples of the photopolymerization initiator include: 1-hydroxycyclohexyl phenyl ketone "IRGACURE 184," 1-(4-isopropylphenyl)-2-hydroxy-2-methylpropan-1-one "DAROCUR 1116," 2-methyl-1-[(methylthio)phenyl]-2-morpholinopropan-1 "IRGACURE 907," 2,2-dimethoxy-1,2-diphenylethan-1-one "IRGACURE 651," 2-benzyl-2-dimethylamino-1-(4-morpholinophenyl)-butanone "IRGACURE 369"), 2-dimethylamino-2-(4-methylbenzyl)-1-(4-morpholino-phenyl)butan-1-one "IRGACURE 379," 2,2-dimethoxy-1,2-diphenylethan-1-one, bis(2,4,6-trimethylbenzoyl)-diphenylphosphine oxide "LUCIRIN TPO," 2,4,6-trimethylbenzoyl-phenyl-phosphine oxide "IRGACURE 819," 1,2-octanedione,1-[4-(phenylthio)-,2-(O-benzoyloxime)], ethanone "IRGACURE OXE 01"), and 1-[9-ethyl-6-(2-methylbenzoyl)-9H-carbazole-3-yl]-,1-(O-acetyloxime) "IRGACURE OXE 02" (these are manufactured by BASF; a mixture of 2,4-diethylthioxanthone ("KAYACURE DETX" manufactured by Nippon Kayaku Co., Ltd.) and p-dimethylaminobenzoic acid ethyl ester ("KAYACURE EPA" manufactured by Nippon Kayaku Co., Ltd.); a mixture of isopropylthioxanthone ("QUANTACURE-ITX" manufactured by Ward Blenkinsop) and p-dimethylaminobenzoic acid ethyl ester; "Esacure ONE," "Esacure KIP150," "Esacure KIP160," "Esacure 1001M," "Esacure A198," "Esacure KIP IT," "Esacure KTO46," and "Esacure TZT" (manufactured by Lamberti); and "Speedcure BMS," "Speedcure PBZ," and "Benzophenone" from LAMBSON. A photo-acid generator may be used as a photo-cationic initiator. Examples of the photo-acid generator include diazodisulfone-based compounds, triphenylsulfonium-based compounds, phenylsulfone-based compounds, sulfonylpyridine-based compounds, triazine-based compounds, and diphenyliodonium compounds.

The content of the photopolymerization initiator is preferably 0.1 to 10% by mass and particularly preferably 1 to 6% by mass with respect to the total mass of the polymerizable compounds contained in the polymerizable composition. One photopolymerization initiator may be used, or a mixture of two or more may be used.

A commonly used thermal polymerization initiator may be used for thermal polymerization. Examples of the thermal polymerization initiator that can be used include: organic peroxides such as methyl acetoacetate peroxide, cumene hydroperoxide, benzoyl peroxide, bis(4-t-butylcyclohexyl)

peroxydicarbonate, t-butylperoxybenzoate, methyl ethyl ketone peroxide, 1,1-bis(t-hexylperoxy)3,3,5-trimethylcyclohexane, p-pentahydroperoxide, t-butyl hydroperoxide, dicumyl peroxide, isobutyl peroxide, di(3-methyl-3-methoxybutyl)peroxydicarbonate, and 1,1-bis(t-butylperoxy)cyclohexane; azonitrile compounds such as 2,2'-azobisisobutyronitrile and 2,2'-azobis(2,4-dimethylvaleronitrile); azoamidine compounds such as 2,2'-azobis(2-methyl-N-phenylpropione-amidine)dihydrochloride; azoamide compounds such as 2,2'azobis(2-methyl-N-[1,1-bis(hydroxymethyl)-2-hydroxyethyl]propionamide); and alkylazo compounds such as 2,2'azobis(2,4,4-trimethylpentane). The content of the thermal polymerization initiator is preferably 0.1 to 10 mass and particularly preferably 1 to 6% by mass. These may be used alone or as a mixture of two or more.

Organic Solvent

The polymerizable composition used in the present invention may optionally contain an organic solvent. No particular limitation is imposed on the organic solvent used. However, it is preferable that the polymerizable compound exhibits high solubility in the organic solvent used. It is also preferable that the organic solvent used can be dried at a temperature equal to or lower than 100° C. Examples of such a solvent include: aromatic hydrocarbons such as toluene, xylene, cumene, and mesitylene; ester-based solvents such as methyl acetate, ethyl acetate, propyl acetate, butyl acetate, cyclohexyl acetate, 3-butoxymethyl acetate, and ethyl lactate; ketone-based solvents such as methyl ethyl ketone, methyl isobutyl ketone, cyclohexanone, and cyclopentanone; ether-based solvents such as tetrahydrofuran, 1,2-dimethoxyethane, and anisole; amide-based solvents such as N,N-dimethylformamide and N-methyl-2-pyrrolidone; ethylene glycol monomethyl ether acetate; propylene glycol monomethyl ether acetate; propylene glycol monomethyl ether; propylene glycol diacetate; propylene glycol monomethyl propyl ether; diethylene glycol monomethyl ether acetate; γ-butyrolactone; and chlorobenzene. These may be used alone or as a mixture of two or more. In terms of solution stability, it is preferable to use at least one of the ketone-based solvents, the ether-based solvents, the ester-based solvents, and aromatic hydrocarbon-based solvents.

The polymerizable composition used in the present invention is generally used for coating. No particular limitation is imposed on the ratio of the organic solvent used so long as the coated state is not significantly impaired. The ratio of the total mass of polymerizable compounds in the polymerizable composition is preferably 0.1 to 93% by mass, more preferably 5 to 60% by mass, and particularly preferably 10 to 50% by mass.

When, the polymerizable compounds are dissolved in the organic solvent, it is preferable to dissolve the compounds under heating and stirring in order to dissolve them uniformly. The heating temperature during the heating and stirring may be appropriately controlled in consideration of the solubility of the polymerizable compounds used in the organic solvent. In terms of productivity, the heating temperature is preferably 15° C. to 130° C., more preferably 30° C. to 110° C., and particularly preferably 50° C. to 100° C.

Additives

In the polymerizable composition used in the present invention, general-purpose additives may be used according to the intended purpose. For example, additives such as a polymerization inhibitor, an antioxidant, an ultraviolet, absorber, an alignment, controlling agent, a chain transfer agent, an infrared absorber, a thixotropic agent, an antistatic agent, a pigment, a filler, a chiral compound, a non-liquid crystalline compound having a polymerizable group, other liquid crystal compounds, and an alignment material may be added so long as the alignment of the liquid crystal is not significantly impaired.

Polymerization Inhibitor

The polymerizable composition used in the present invention may optionally contain a polymerization inhibitor. No particular limitation is imposed on the polymerization inhibitor used, and a commonly used polymerization inhibitor may be used.

Examples of the polymerization inhibitor include: phenol-based compounds such as p-methoxyphenol, cresol, t-butylcatechol, 3.5-di-t-butyl-4-hydroxytoluene, 2.2'-methylene bis(4-methyl-6-t-butylphenol), 2.2'-methylene bis(4-ethyl-6-t-butylphenol), 4.4'-thio bis(3-methyl-6-t-butylphenol), 4-methoxy-1-naphthol, and 4,4'-dialkoxy-2,2'-bi-1-naphthol; quinone-based compounds such as hydroquinone, methylhydroquinone, tert-butylhydroquinone, p-benzoquinone, methyl-p-benzoquinone, tert-butyl-p-benzoquinone, 2,5-diphenylbenzoquinone, 2-hydroxy-1,4-naphthoquinone, 1,4-naphthoquinone, 2,3-dichloro-1,4-naphthoquinone, anthraquinone, and diphenoquinone; amine-based compounds such as p-phenylenediamine, 4-aminodiphenylamine, N.N'-diphenyl-p-phenylenediamine, N-i-propyl-N'-phenyl-p-phenylenediamine, N-(1.3-dimethylbutyl)-N'-phenyl-p-phenylenediamine, N.N'-di-2-naphthyl-p-phenylenediamine, diphenylamine, N-phenyl-β-naphthylamine, 4.4'-dicumyl-diphenylamine, and 4.4'-dioctyl-diphenylamine; thioether-based compounds such as phenothiazine and distearyl thiodipropionate; and nitroso-based compounds such as N-nitrosodiphenylamine, N-nitrosophenylnaphthylamine, N-nitrosodinaphthylamine, p-nitrosophenol, nitrosobenzene, p-nitrosodiphenylamine, α-nitroso-β-naphthol, etc., N,N-dimethyl-p-nitrosoaniline, p-nitrosodiphenylamine, p-nitrosodimethylamine, p-nitroso-N,N-diethylamine, N-nitrosoethanolamine, N-nitrosodi-n-butylamine, N-nitroso-N-n-butyl-4-butanolamine, N-nitroso-diisopropanolamine, N-nitroso-N-ethyl-4-butanolamine, 5-nitroso-8-hydroxyquinoline, N-nitrosomorpholine, N-nitroso-N-phenylhydroxylamine ammonium salt, nitrosobenzene, 2,4.6-tri-tert-butylnitrosobenzene, N-nitroso-N-methyl-p-toluenesulfonamide, N-nitroso-N-ethylurethane, N-nitroso-N-n-propylurethane, 1-nitroso-2-naphthol, 2-nitroso-1-naphthol, sodium 1-nitroso-2-naphthol-3,6-sulfonate, sodium 2-nitroso-1-naphthol-4-sulfonate, 2-nitroso-5-methylaminophenol hydrochloride, and 2-nitroso-5-methylaminophenol hydrochloride.

The amount of the polymerization inhibitor added is preferably 0.01 to 1.0% by mass and more preferably 0.05 to 0.5% by mass with respect to the total mass of the polymerizable compounds contained in the polymerizable composition.

Antioxidant

The polymerizable composition used in the present invention may optionally contain an antioxidant etc. Examples of such compounds include hydroquinone derivatives, nitrosoamine-based polymerization inhibitors, and hindered phenol-based antioxidants. More specific examples of such compounds include: tert-butylhydroquinone; "Q-1300" and "Q-1301" available from Wako Pure Chemical Industries, Ltd.; pentaerythritol tetrakis[3-(3,5-di-tert-butyl-4-hydroxyphenyl)propionate "IRGANOX 1010," thiodiethylene bis[3-(3,5-di-tert-butyl-4-hydroxyphenyl)propionate "IRGANOX 1035," octadecyl-3-(3,5-di-tert-butyl-4-hydroxyphenyl)propionate "IRGANOX 1076," "IRGANOX 1135," "IRGANOX 1330," 4,6-bis(octylthiomethyl)-o-cresol "IRGANOX 1520L," "IRGANOX 1726," "IRGANOX 245," "IRGANOX 259," "IRGANOX 3114," "IRGANOX 3790," "IRGANOX 5057," and "IRGANOX 565" (these are manufactured by BASF); ADEKA STAB AO-20, AO-30, AO-40, AO-50, AO-60, and AO-80 manufactured by ADEKA CORPORATION; and SUMILIZER BHT, SUMILIZER BBM-S, and SUMILIZER GA-80 available from Sumitomo Chemical Co., Ltd.

The amount of the antioxidant added is preferably 0.01 to 20% by mass and more preferably 0.05 to 1.0% by mass with respect to the total mass of the polymerizable compounds contained in the polymerizable composition.

Ultraviolet Absorber

The polymerizable composition used in the present invention may optionally contain an ultraviolet absorber and a light stabilizer. No particular limitation is imposed on the ultraviolet absorber used and the light stabilizer used. It is preferable to use an ultraviolet absorber and a light stabilizer that can improve the light fastness of optically anisotropic bodies, optical films, etc.

Examples of the ultraviolet absorber include: 2-(2-hydroxy-5-t-butylphenyl)-2H-benzotriazole "TINUVIN PS," "TINUVIN 99-2," "TINUVIN 109," "TINUVIN 213," "TINUVIN 234," "TINUVIN 326," "TINUVIN 328," "TINUVIN 329," "TINUVIN 384-2," "TINUVIN 571," 2-(2H-benzotriazol-2-yl)-4,6-bis(1-methyl-1-phenylethyl) phenol "TINUVIN 900," 2-(2H-benzotriazol-2-yl)-6-(1-methyl-1-phenylethyl)-4-(1,1,3,3-tetramethylbutyl)phenol "TINUVIN 928," "TINUVIN 1130," "TINUVIN 400," "TINUVIN 405," 2,4-bis[2-hydroxy-4-butoxyphenyl]-6-(2,4-dibutoxyphenyl)-1,3,5-triazine "TINUVIN 460," "TINUVIN 479," and "TINUVIN 5236" (these are manufactured by BASF); and "ADEKA STAB LA-32," "ADEKA STAB LA-34," "ADEKA STAB LA-36," "ADEKA STAB LA-31," "ADEKA STAB 1413," and "ADEKA STAB LA-51" (these are manufactured by ADEKA CORPORATION).

Examples of the light stabilizer include: "TINUVIN 111FDL," "TINUVIN 123," "TINUVIN 144," "TINUVIN 152," "TINUVIN 292," "TINUVIN 622," "TINUVIN 770," "TINUVIN 765," "TINUVIN 780," "TINUVIN 905," "TINUVIN 5100," "TINUVIN 5050," "TINUVIN 5060," "TINUVIN 5151," "CHIMASSORB 119FL," "CHIMASSORB 944FL," and "CHIMASSORB 944LD" (these are manufactured by BASF); and "ADEKA STAB LA-52," "ADEKA STAB LA-57," "ADEKA STAB LA-62," "ADEKA STAB LA-67," "ADEKA STAB LA-63P," "ADEKA STAB LA-68LD," "ADEKA STAB LA-77," "ADEKA STAB LA-82," and "ADEKA STAB LA-87" (these are manufactured by ADEKA CORPORATION).

Alignment Controlling Agent

The polymerizable composition used in the present invention may contain an alignment controlling agent in order to control the alignment state of the liquid crystalline compound. Examples of the alignment controlling agent used include those that allow the liquid crystalline compound to align in a substantially horizontal manner, a substantially vertical manner, and a substantially hybrid manner with respect to a substrate. Examples of the alignment controlling agent used when a chiral compound is added include those that allow the liquid crystalline compound to align in a substantially planar manner. As described above, the surfactant may induce horizontal alignment or planar alignment. However, no particular limitation is imposed on the alignment controlling agent so long as the intended alignment state is induced, and a commonly used alignment controlling agent may be used.

Examples of such an alignment controlling agent include a compound having a repeating unit represented by general formula (8) below, having a weight average molecular weight of from 100 to 1,000,000 inclusive, and having the effect of effectively reducing the tilt angle of an optically anisotropic body to be formed at its air interface:

[Chem. 114]

$$\left( CR^{11}R^{12}—CR^{13}R^{14} \right) \qquad (8)$$

(wherein $R^{11}$, $R^{12}$, $R^{13}$, and $R^{14}$ each independently represent a hydrogen atom, a halogen atom, or a hydrocarbon group having 1 to 20 carbon atoms, and at least one hydrogen atom in the hydrocarbon group may be replaced by a halogen atom).

Other examples of the alignment controlling agent include rod-shaped liquid crystalline compounds modified with fluoroalkyl groups, disk-shaped liquid crystalline compounds, and polymerizable compounds having long-chain aliphatic alkyl groups optionally having a branch structure.

Examples of the compound having the effect of effectively increasing the tilt angle of an optically anisotropic body to be formed at its air interface include cellulose nitrate, cellulose acetate, cellulose propionate, cellulose butyrate, rod-shaped liquid crystalline compounds modified with heteroaromatic ring salts, and rod-shaped liquid crystalline compounds modified with cyano groups and cyanoalkyl groups.

Chain Transfer Agent

The polymerizable composition used in the present invention may contain a chain transfer agent in order to further improve adhesion of the polymer or the optically anisotropic body to a substrate. Examples of the chain transfer agent include: aromatic hydrocarbons; halogenated hydrocarbons such as chloroform, carbon tetrachloride, carbon tetrabromide, and bromotrichloromethane; mercaptan compounds such as octyl mercaptan, n-butyl mercaptan, n-pentyl mercaptan, n-hexadecyl mercaptan, n-tetradecyl mercaptan, n-dodecyl mercaptan, t-tetradecyl mercaptan, and t-dodecyl mercaptan; thiol compounds such as hexanedithiol, decanedithiol, 1,4-butanediol bisthiopropionate, 1,4-butanediol bisthioglycolate, ethylene glycol bisthioglycolate, ethylene glycol bisthiopropionate, trimethylolpropane tristhioglycolate, trimethylolpropane tristhiopropionate, trimethylolpropane tris(3-mercaptobutyrate), pentaerythritol tetrakisthioglycolate, pentaerythritol tetrakisthioppropronate, trimercaptopropionic acid tris(2-hydroxyethyl)isocyanurate, 1,4-dimethylmercaptobenzene, 2,4,6-trimercapto-s-triazine, and 2-(N,N-dibutylamino)-4,6-dimercapto-s-triazine; sulfide compounds such as dimethylxanthogen disulfide, diethylxanthogen disulfide, diisopropylxanthogen disulfide, tetramethylthiuram disulfide, tetraethylthiuram disulfide, and tetrabutylthiuram disulfide; N,N-dimethylaniline; N,N-divinylaniline; pentaphenylethane; an α-methylstyrene dimer; acrolein; allyl alcohol; terpinolene; α-terpinene, γ-terpinene, and dipentene. Of these, 2,4-diphenyl-4-methyl-1-pentene and thiol compounds are more preferred.

Specifically, compounds represented by general formulas (9-1) to (9-12) below are preferred:

[Chem. 115]

(9-1)

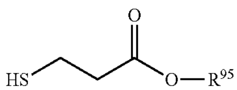

(9-2)

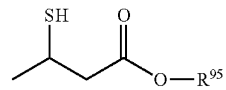

(9-3)

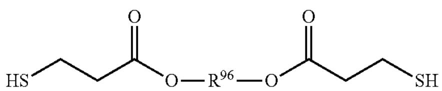

(9-4)

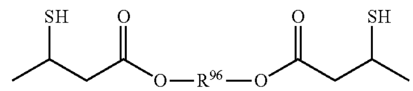

(9-5)

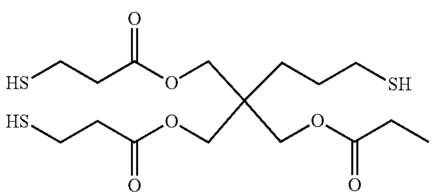

(9-6)

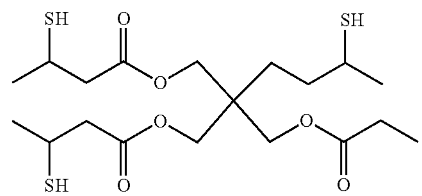

(9-7)

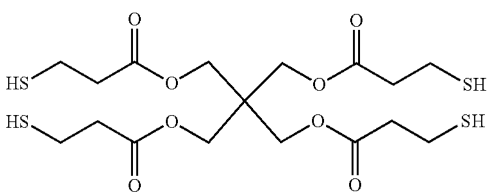

(9-8)

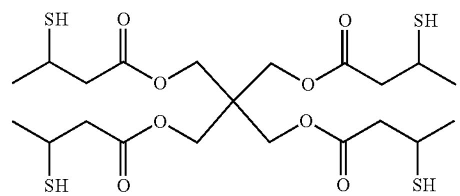

[Chem. 116]

(9-9)

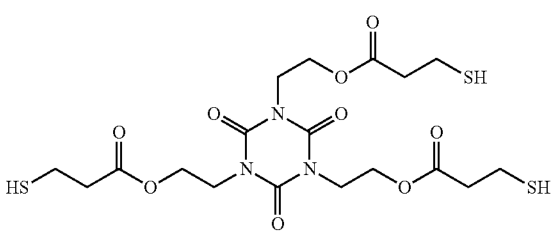

(9-10)

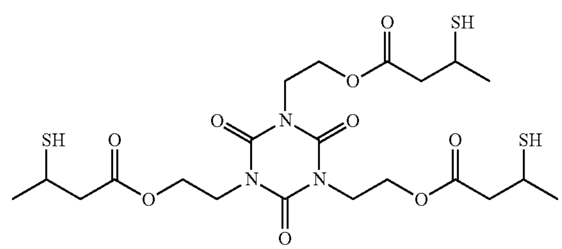

(9-11)

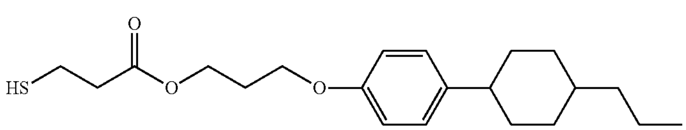

(9-12)

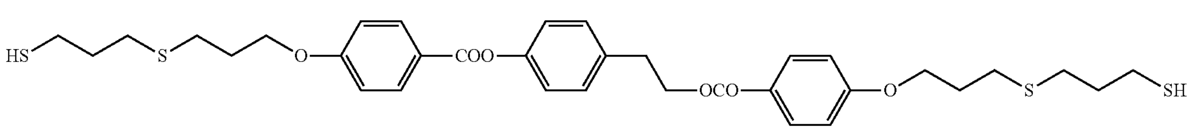

In these formulas, $R^{95}$ represents an alkyl group having 2 to 18 carbon atoms. The alkyl group may be linear or branched, and at least one methylene group in the alkyl group is optionally replaced by an oxygen atom, a sulfur atom, —CO—, —OCO—, —COO—, or —CH═CH—, provided that no oxygen atom is bonded directly to a sulfur atom. $R^{96}$ represents an alkylene group having 2 to 18 carbon atoms, and at least one methylene group in the alkylene group is optionally replaced by an oxygen atom, a sulfur atom, —CO—, —OCO—, —COO—, or —CH═CH—, provided that no oxygen atom is bonded directly to a sulfur atom.

Preferably, the chain transfer agent is added in the step of mixing the polymerizable compounds with the organic solvent under heating and stirring to prepare a polymerizable solution. However, the chain transfer agent may be added in the subsequent step of mixing the polymerization initiator with the polymerizable solution or in both the steps.

The amount of the chain transfer agent added is preferably 0.5 to 10% by mass and more preferably 1.0 to 50% by mass with respect to the total mass of the polymerizable compounds contained in the polymerizable composition.

To control physical properties, a non-polymerizable liquid crystal compound etc. may also be added optionally. Preferably, the non-liquid crystalline polymerizable compound is added in the step of mixing the polymerizable compounds with the organic solvent under heating and stirring to prepare a polymerizable solution. However, the non-polymerizable liquid crystal compound etc. may be added in the subsequent step of mixing the polymerization initiator with the polymerizable solution or in both the steps. The amount of these compounds added is preferably 20% by mass or less, more preferably 10% by mass or less, and still more preferably 5% by mass or less with respect to the mass of the polymerizable composition.

Infrared Absorber

The polymerizable composition used in the present invention may optionally contain an infrared absorber. No particular limitation is imposed on the infrared absorber used, and a commonly used infrared absorber may be contained so long as the alignment is not disturbed.

Examples of the infrared absorber include cyanine compounds, phthalocyanine compounds, naphthoquinone compounds, dithiol compounds, diimmonium compounds, azo compounds, and aluminum salts.

Specific examples include: a diimmonium salt-type infrared absorber "NIR-IM1" and an aluminum salt-type infrared absorber "NIR-AM1" (manufactured by Nagase ChemteX Corporation); "Karenz IR-T" and "Karenz IR-13F" (manufactured by Showa Denko K.K.); "YKR-2200" and "YKR-2100" (manufactured by Yamamoto Chemicals, Inc.); and "IRA 908," "IRA 931," "IRA 955," and "IRA 1034" (INDECO).

Antistatic Agent

The polymerizable composition used in the present invention may optionally contain an antistatic agent. Mo particular limitation is imposed on the antistatic agent used, and a commonly used antistatic agent may be contained so long as the alignment is not disturbed.

Examples of the antistatic agent include macromolecular compounds having at least one sulfonate group or phosphate group in their molecule, compounds including a quaternary ammonium salt, and surfactants having a polymerizable group.

Of these, surfactants having a polymerizable group are preferred. Examples of anionic surfactants having a polymerizable group include: alkyl ether-based surfactants such as "Antox SAD," "Antox MS-2N" (manufactured by Nippon Nyukazai Co., Ltd.), "AQUALON KH-05," "AQUALON KH-10," "AQUALON KH-20," "AQUALON KH-0530," "AQUALON KB-1025" (manufactured by DAI-ICHI KOGYO SEIYAKU Co., Ltd.), "ADEKA REASOAP SR-10N," "ADEKA REASOAP SR-20N" (manufactured by ADEKA CORPORATION), and "LATEMUL PD-104" (manufactured by Kao Corporation); sulfosuccinate-based surfactants such as "LATEMUL S-120," "LATEMUL S-120A," "LATEMUL S-180P," "LATEMUL S-180A" (manufactured by Kao Corporation), and "ELEMINOL JS-2" (manufactured by Sanyo Chemical Industries, Ltd.); alkyl phenyl ether- and alkyl phenyl ester-based surfactants such as "AQUALON S-2855A," "AQUALON H-3855B," "AQUALON H-3855C," "AQUALON H-3856," "AQUALON HS-05," "AQUALON HS-10," "AQUALON HS-20," "AQUALON HS-30," "AQUALON HS-1025," "AQUALON BC-05," "AQUALON BC-10," "AQUALON BC-20," "AQUALON BC-1025," "AQUALON BC-2020" (manufactured by DAI-ICHI KOGYO SEIYAKU Co., Ltd.) "ADEKA REASOAP SDX-222," "ADEKA REASOAP SDX-223," "ADEKA REASOAP SDX-232," "ADEKA REASOAP SDX-233," "ADEKA REASOAP SDX-259," "ADEKA REASOAP SE-10N," and "ADEKA REASOAP SE-20N" (manufactured by ADEKA CORPORATION); (meth)acrylate sulfate-based surfactants such as "Antox MS-60," "Antox MS-2N" (manufactured by Nippon Nyukazai Co., Ltd.), and "ELEMINOL RS-30" (manufactured by Sanyo Chemical Industries, Ltd.); and phosphate-based surfactants such as "H-3330P" (manufactured by DAI-ICHI KOGYO SEIYAKU Co., Ltd.) and "ADEKA REASOAP PP-70" (manufactured by ADEKA CORPORATION).

Examples of nonionic surfactants having a polymerizable group include: alkyl ether-based surfactants such as "Antox LMA-20," "Antox LMA-27," "Antox EMH-20," "Antox LMH-20," "Antox SMH-20" (manufactured by Nippon Nyukazai Co., Ltd.), "ADEKA REASOAP ER-10," "ADEKA REASOAP ER-20," "ADEKA REASOAP ER-30," "ADEKA REASOAP ER-40" (manufactured by ADEKA CORPORATION), "LATEMUL PD-420," "LATEMUL PD-430," and "LATEMUL PD-450" (manufactured by Kao Corporation); alkyl phenyl ether- and alkyl phenyl ester-based surfactants such as "AQUALON RN-10," "AQUALON RN-20," "AQUALON RN-30," "AQUALON RN-50," "AQUALON RN-2025" (manufactured by DAI-ICHI KOGYO SEIYAKU Co., Ltd.), "ADEKA REASOAP NE-10," "ADEKA REASOAP NE-20," "ADEKA REASOAP NE-30," and "ADEKA REASOAP NE-40" (manufactured by ADEKA CORPORATION); and (meth)acrylate sulfate-based surfactants such as "RMA-564," "RMA-568," and "RMA-1114," (manufactured by Nippon Nyukazai Co., Ltd.).

Other examples of the antistatic agent include polyethylene glycol (meth)acrylate, methoxypolyethylene glycol (meth)acrylate, ethoxypolyethylene glycol (meth)acrylate, propoxypolyethylene glycol (meth)acrylate, n-butoxypolyethylene glycol (meth)acrylate, n-pentoxypolyethylene glycol (meth)acrylate, phenoxypolyethylene glycol (meth)acrylate, polypropylene glycol (meth)acrylate, methoxypolypropylene glycol (meth)acrylate, ethoxypolypropylene glycol (meth)acrylate, propoxypolypropylene glycol (meth)acrylate, n-butoxypolypropylene glycol (meth) acrylate, n-pentoxypolypropylene glycol (meth)acrylate, phenoxypolypropylene glycol (meth)acrylate, polytetramethylene glycol (meth)acrylate, methoxypolytetramethylene glycol (meth)acrylate, phenoxytetraethylene glycol (meth) acrylate, hexaethylene glycol (meth)acrylate, and methoxyhexaethylene glycol (meth)acrylate.

Only one antistatic agent may be used, or a combination of two or more antistatic agents may be used. The amount of the antistatic agent added is preferably 0.001 to 10% by weight and more preferably 0.01 to 5% by weight with respect to the total weight of the polymerizable compounds contained in the polymerizable composition.

Pigment

The polymerizable composition used in the present invention may optionally contain a pigment. No particular limitation is imposed on the pigment used, and a commonly used pigment may be used so long as the alignment is not disturbed.

Examples of the pigment include dichroic pigments and fluorescent pigments. Examples of the dichroic and fluorescent pigments include polyazo pigments, anthraquinone pigments, cyanine pigments, phthalocyanine pigments, perylene pigments, perinone pigments, and squarylium pigments. From the viewpoint of addition, the pigment is preferably a pigment having liquid crystallinity.

Examples of the pigment that can be used include pigments described in U.S. Pat. No. 2,400,877, pigments described in Dreyer J. F., Phys. and Colloid Chem., 1948, 52, 808., "The Fixing of Molecular Orientation," pigments described in Dreyer J. F., Journal de Physique, 1969, 4, 114., "Light Polarization from Films of Lyotropic Nematic Liquid Crystals," pigments described in J. Lydon, "Chromonics" in "Handbook of Liquid Crystals Vol. 2B: Low Molecular Weight Liquid Crystals II," D. Demus, J. Goodby, G. W. Gray, H. W. Spiessm, V. Vill ed., Willey-VCH, P. 981-1007 (1998), pigments described in Dichroic Dyes for Liquid Crystal Display, A. V. Ivashchenko, CRC Press, 1994, and pigments described in "Novel Development of Functional Pigment Market," Chapter 1, p. 1, 1994, CMC Publishing Co., Ltd.

Examples of the dichroic pigments include formula (d-1) to formula (d-8) below.

[Chem. 117]

(d-1)

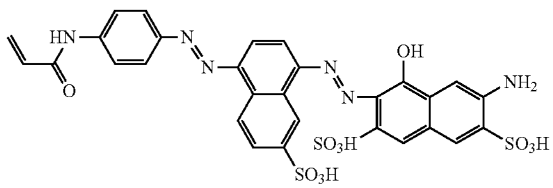

(d-2)

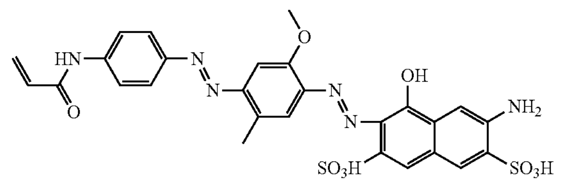

(d-3)

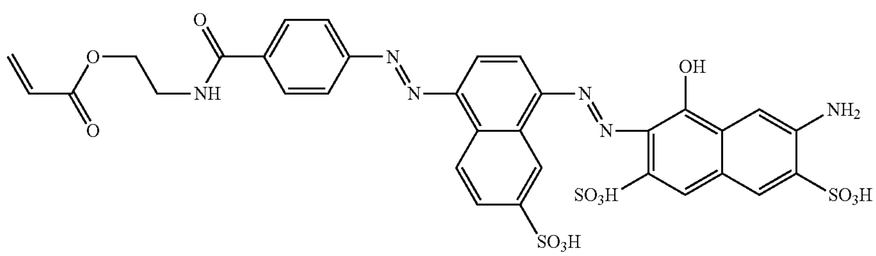

(d-4)

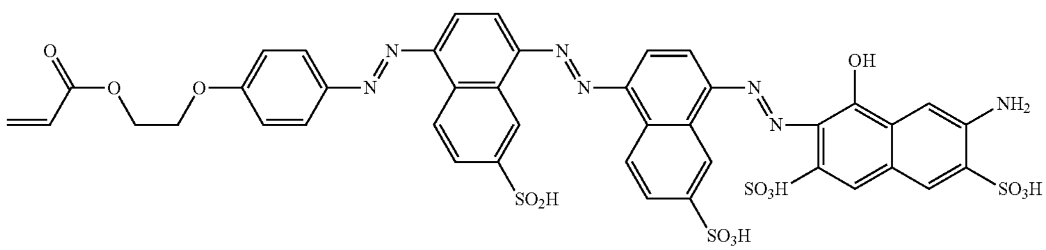

[Chem. 118]

(d-5)

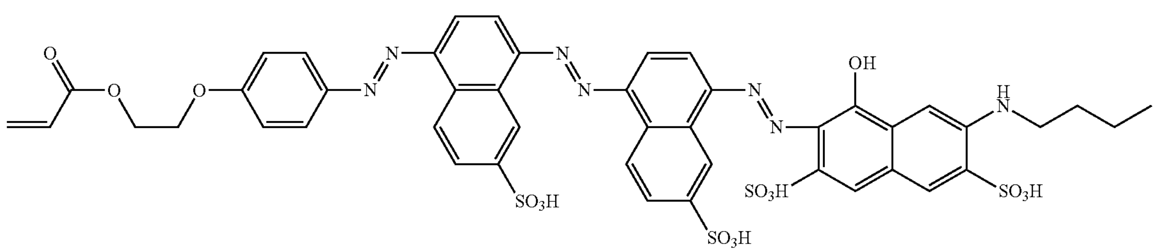

(d-6)

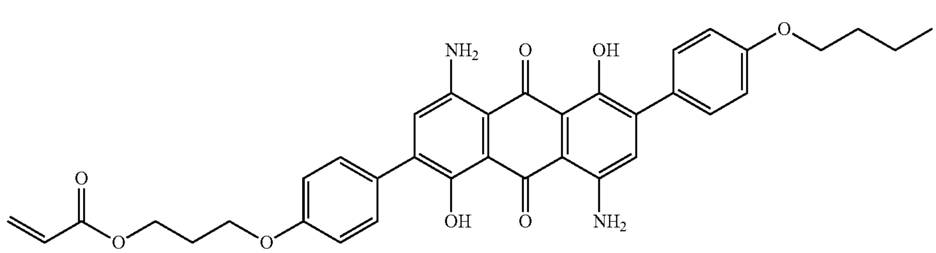

-continued (d-7)

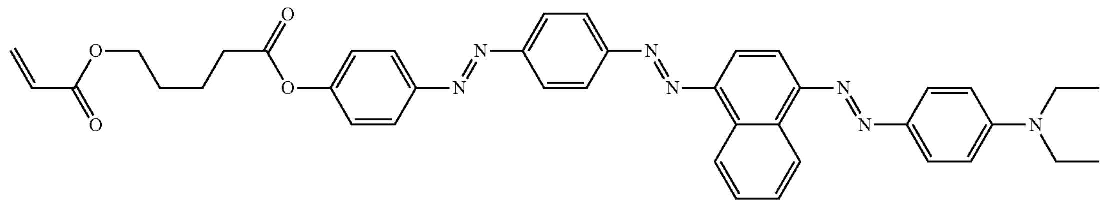

(d-8)

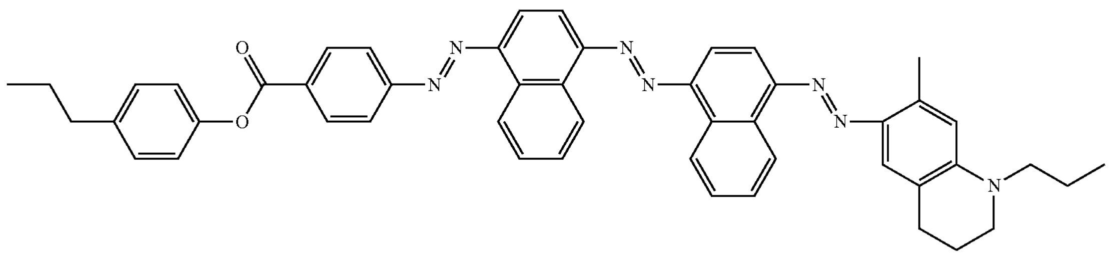

The amount of the pigment such as the dichroic pigment added is preferably 0.001 to 10% by weight and more preferably 0.01 to 5% by weight with respect to the total weight of the polymerizable compounds contained in the polymerizable composition.

Filler

The polymerizable composition used in the present invention may optionally contain a filler. No particular limitation is imposed on the filler used, and a commonly used filler may be used so long as the thermal conductivity of the polymer, to be obtained is not impaired.

Examples of the filler include: inorganic fillers such as alumina, titanium white, aluminum hydroxide, talc, clay, mica, barium titanate, zinc oxide, and glass fibers; metal powders such as silver powder and copper powder; thermal conductive fillers such as aluminum nitride, boron nitride, silicon nitride, gallium nitride, silicon carbide, magnesia (aluminum oxide), alumina (aluminum oxide), crystalline silica (silicon oxide), and fused silica (silicon oxide); and silver nanoparticles.

Chiral Compound

The polymerizable composition of the present invention may contain a chiral compound for the purpose of obtaining a chiral nematic phase. It is unnecessary for the chiral compound itself to exhibit liquid crystallinity, and the chiral compound may or may not have a polymerizable group. The helical direction of the chiral compound may be appropriately selected according to the application purpose of the polymer.

No particular limitation is imposed on the chiral compound having a polymerizable group. A commonly used chiral compound may be used, but a chiral compound having a large helical twisting power (HTP) is preferred. The polymerizable group is preferably a vinyl group, a vinyloxy group, an allyl group, an allyloxy group, an acryloyloxy group, a methacryloyloxy group, a glycidyl group, or an oxetanyl group and particularly preferably an acryloyloxy group, a glycidyl group, or an oxetanyl group.

The amount of the chiral compound added must be appropriately controlled according to the helical twisting power of the compound. The amount of the chiral compound contained is preferably 0.5 to 80% by mass, more preferably 3 to 50% by mass, and particularly preferably 5 to 30% by mass with respect to the total mass of the chiral compound and the liquid crystalline compounds having a polymerizable group.

Specific examples of the chiral compound include compounds represented by general formula (10-1) to formula (10-4) below, but the chiral compound is not limited to the compounds represented by the general formulas below:

[Chem. 119]

(10-1)

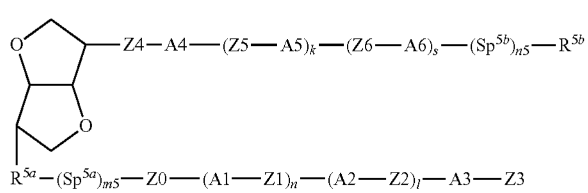

-continued (10-2)

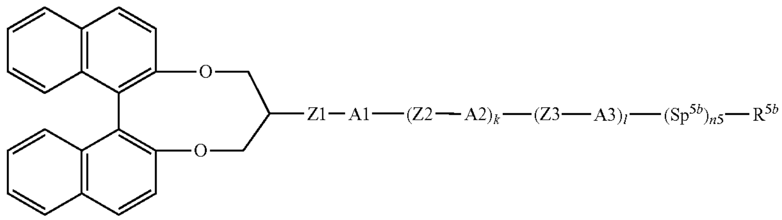

(10-3)

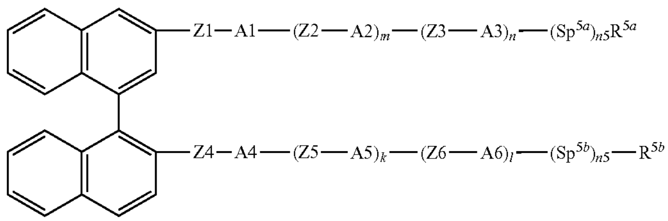

(10-4)

$$R^{5a}—(Sp^{5a})_{m5}—Z0—(A1—Z1)_n—(A2—Z2)_l—A3—Z3—A4—Z4—A5—Z5—\underset{*}{CH_2CH}(R^{5a})R^{5b}$$

In the above formulas, $Sp^{5a}$ and $Sp^{5b}$ each independently represent an alkylene group having 0 to 18 carbon atoms, and the alkylene group may be substituted by at least one halogen atom, a CN group, or an alkyl group having 1 to 8 carbon atoms and having a polymerizable functional group. One $CH_2$ group or two or more nonadjacent $CH_2$ groups in the alkyl group may be each independently replaced by —O—, —S—, —NH—, —N($CH_3$)—, —CO—, —COO—, —OCO—, —OCOO—, —SCO—, —COS—, or —C≡C—, provided that no oxygen atoms are mutually bonded. A1, A2, A3, A4, A5, and A6 each independently represent a 1,4-phenylene group, a 1,4-cyclohexylene group, a 1,4-cyclohexenyl group, a tetrahydropyran-2,5-diyl group, a 1,3-dioxane-2,5-diyl group, a tetrahydrothiopyran-2,5-diyl group, a 1,4-bicyclco(2,2,2)octylene group, a decahydronaphthalene-2,6-diyl group, a pyridine-2,5-diyl group, a pyrimidine-2,5-diyl group, a pyrazine-2,5-diyl group, a thiophene-2,5-diyl group-, a 1,2,3,4-tetrahydronaphthalene-2,6-diyl group, a 2,6-naphthylene group, a phenanthrene-2,7-diyl group, a 9,10-dihydrophenanthrene-2,7-diyl group, a 1,2,3,4,4a,9,10a-octahydrophenanthrene-2,7-diyl group, a 1,4-naphthylene group, a benzo[1,2-b:4,5-b']dithiophene-2,6-diyl group, a benzo[1,2-b:4,5-b']diselenophene-2,6-diyl group, a [1]benzothieno[3,2-b]thiophene-2,7-diyl group, a [1]benzoselenopheno[3,2-b]selenophen-2,7-diyl group, or a fluorene-2,7-diyl group, n, l, and k each independently represent 0 or 1, provided that $0 \leq n+l+k \leq 3$. m5 represents 0 or 1, and Z0, Z1, Z2, Z3, Z4, Z5, and Z6 each independently represent —COO—, —OCO—, —$CH_2CH_2$—, —$OCH_2$—, —$CH_2O$—, —CH═CH—, —C≡C—, —CH═CHCOO—, —OCOCH═CH—, —$CH_2CH_2COO$—, —$CH_2CH_2OCO$—, —$COOCH_2CH_2$—, —$OCOCH_2CH_2$—, —CONH—, —NHCO—, an alkyl group having 2 to 10 carbon atoms and optionally having a halogen atom, or a single bond. $R^{5a}$ and $R^{5b}$ each represent a hydrogen atom, a halogen atom, a cyano group, or an alkyl group having 1 to 18 carbon atoms, and the alkyl group may be substituted by at least one halogen atom or CN. One $CH_2$ group or two or more nonadjacent $CH_2$ groups in the alkyl group may be each independently replaced by —O—, —S—, —NH—, —N($CH_3$)—, —CO—, —COO—, —OCO—, —OCOO—, —SCO—, —COS—, or —C≡C—, provided that no oxygen atoms are mutually bonded. Alternatively, $R^{5a}$ and $R^{5b}$ each represent general formula (10-a):

[Chem. 120]

$$—P^{5a} \tag{10-a}$$

(wherein $P^{5a}$ represents a polymerizable group, and the meaning of $Sp^{5a}$ is the same as the meaning of $Sp^1$).

$P^{5a}$ represents a substituent selected from polymerizable groups represented by formula (P-1) to formula (P-20) below:

[Chem. 121]

(P-1)

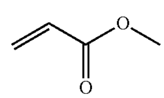

(P-2)

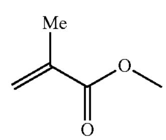

(P-3)

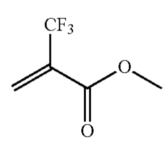

(P-4)

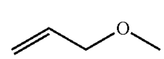

(P-5)

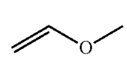

(P-6)

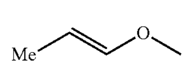

(P-7)

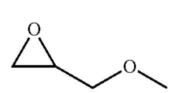

-continued
(P-8)
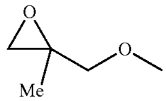
(P-9)
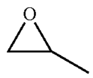
(P-10)
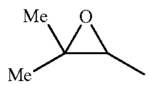
(P-11)
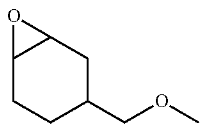
(P-12)
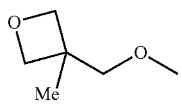
(P-13)
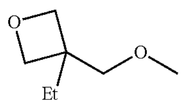
(P-14)
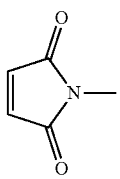
-continued
(P-15)
(P-16)
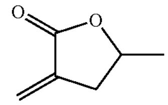
(P-17)
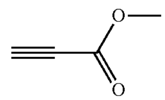
(P-18)
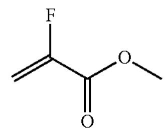
(P-19)
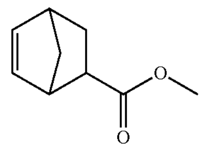
(P-20)
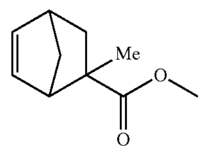
Other specific examples of the chiral compound include compounds represented by general formula (10-5) to formula (10-31) below:
[Chem. 122]
(10-5)
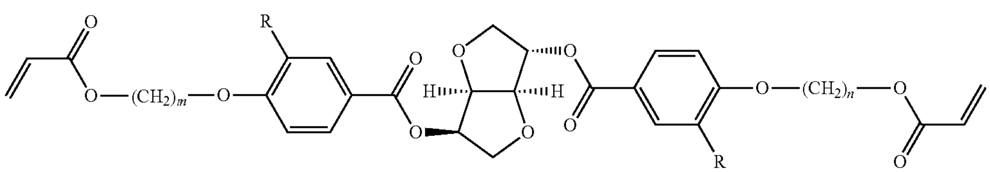
(10-6)
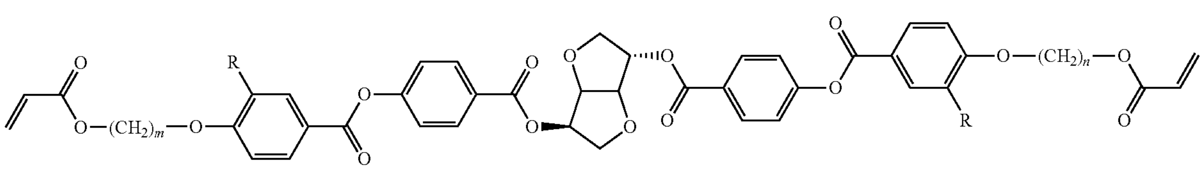
(10-7)
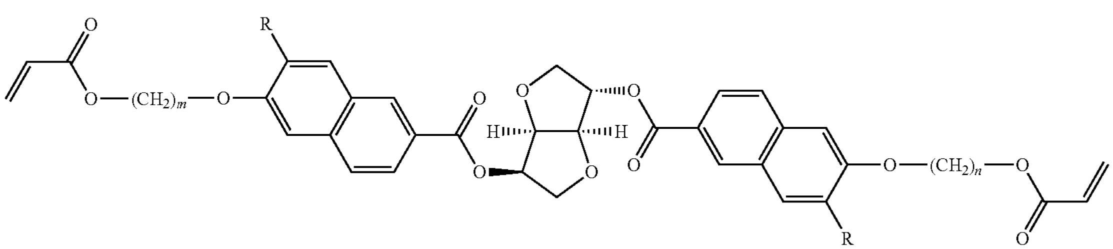

-continued
(10-8)
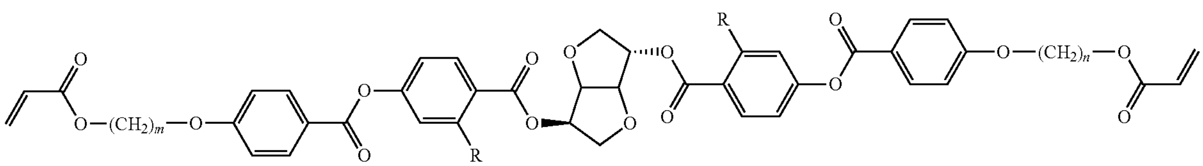
[Chem. 123]
(10-9)
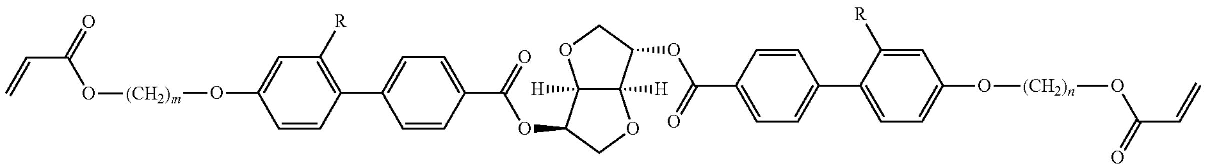
(10-10)
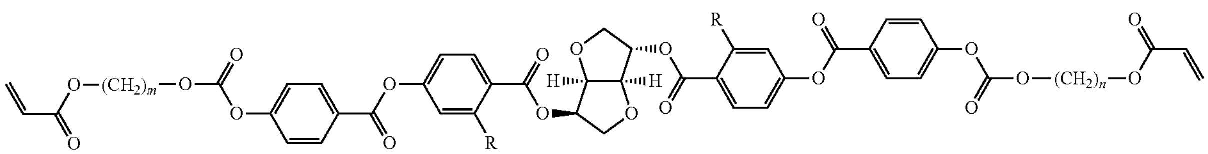
(10-11)
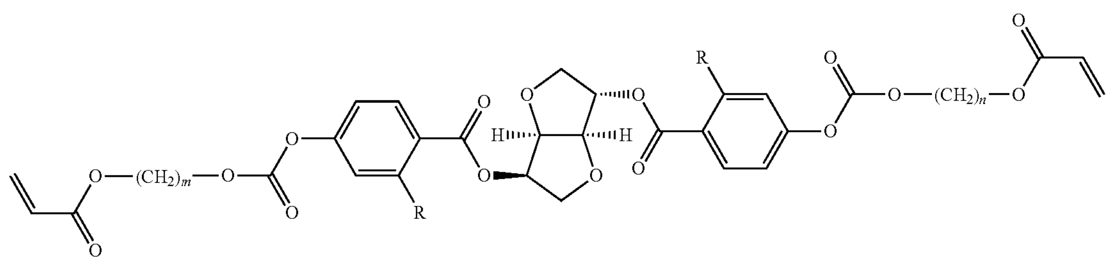
(10-12)
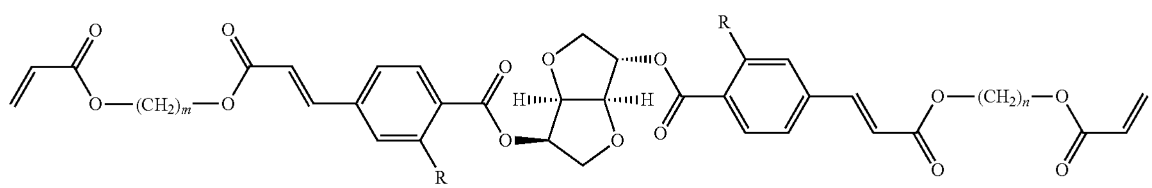
(10-13)
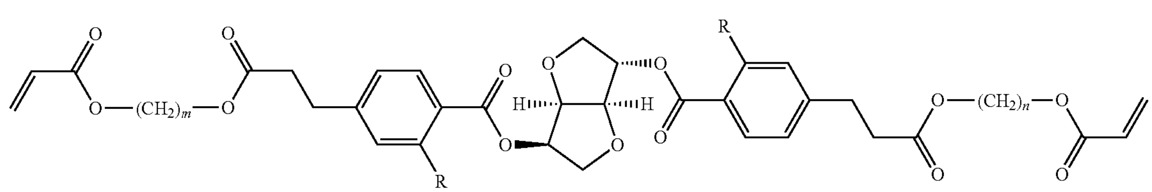
[Chem. 124]
(10-14)
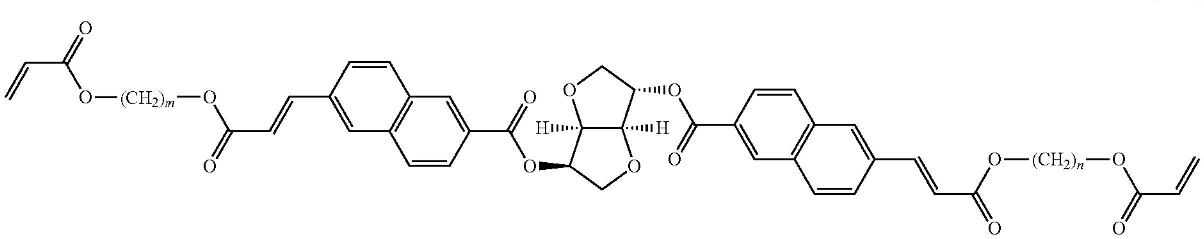

-continued
(10-15)
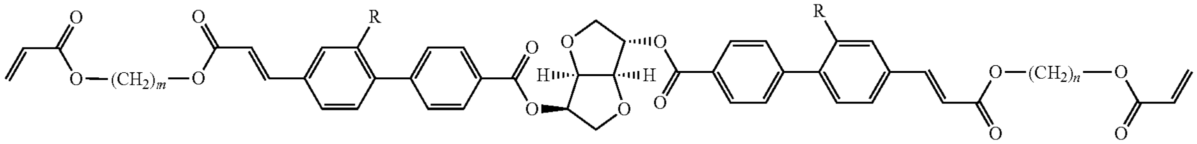
(10-16)
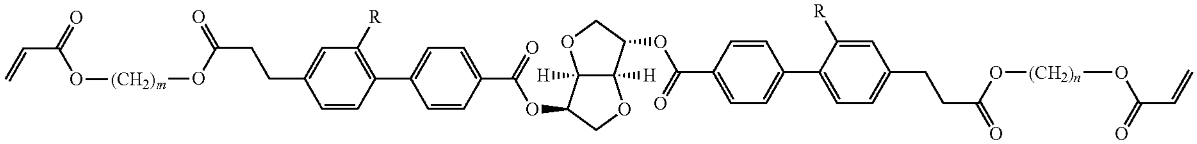
(10-17)
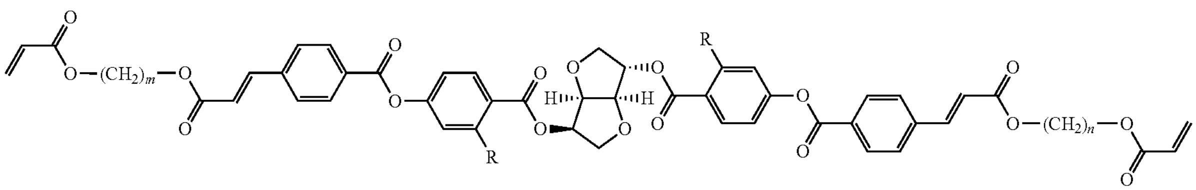
(10-18)
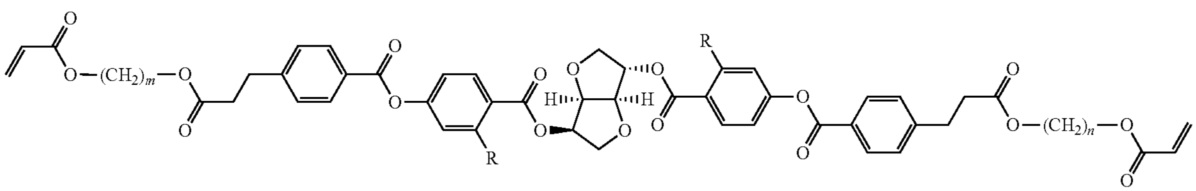
[Chem. 125]
(10-19)
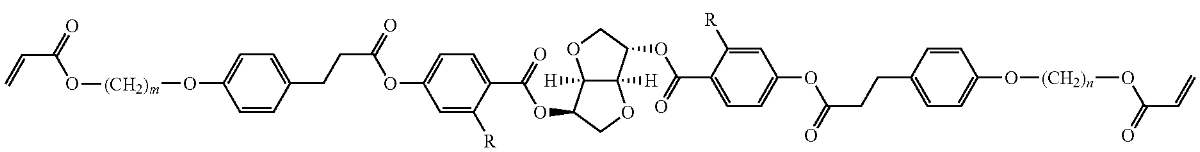
(10-20)
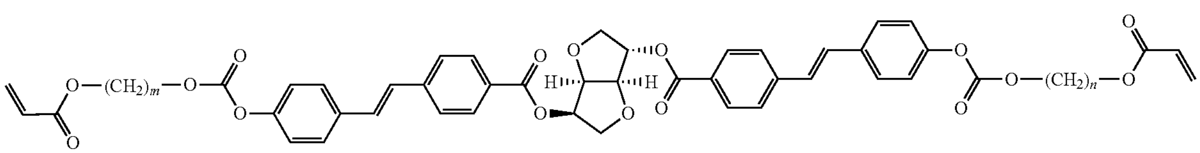
(10-21)
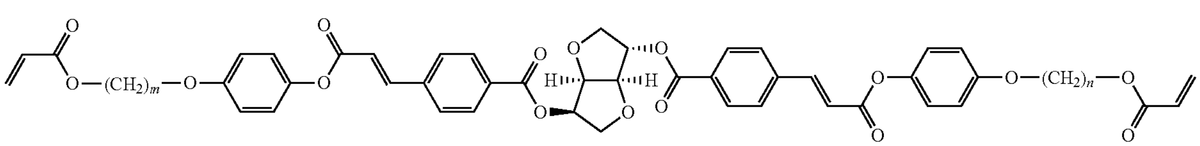
(10-22)
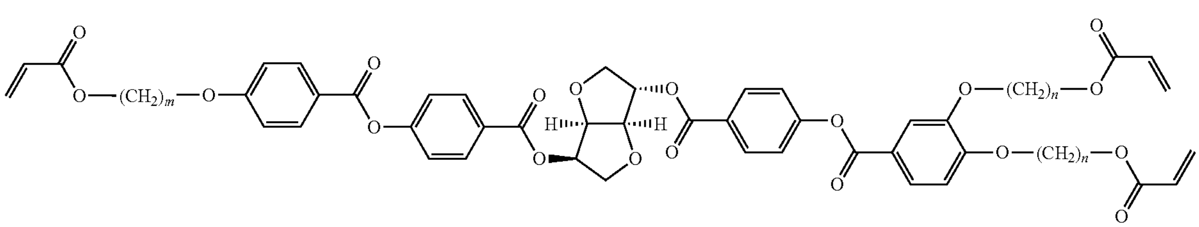

-continued
[Chem. 126]
(10-23)
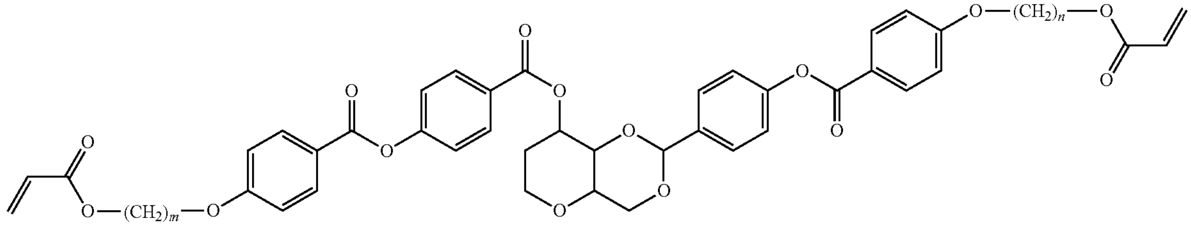
(10-24)
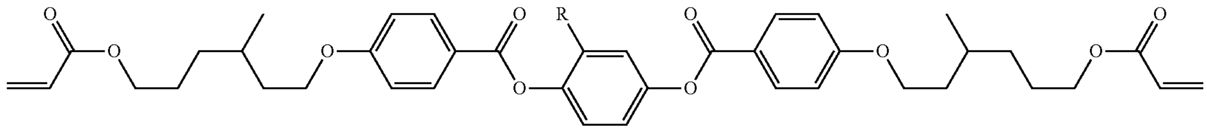
(10-25)
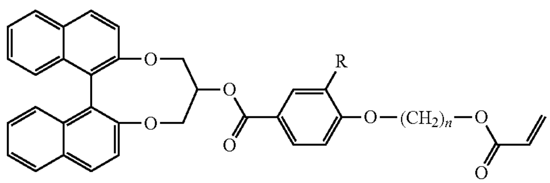
(10-26)
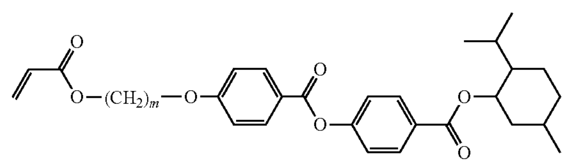
(10-27)
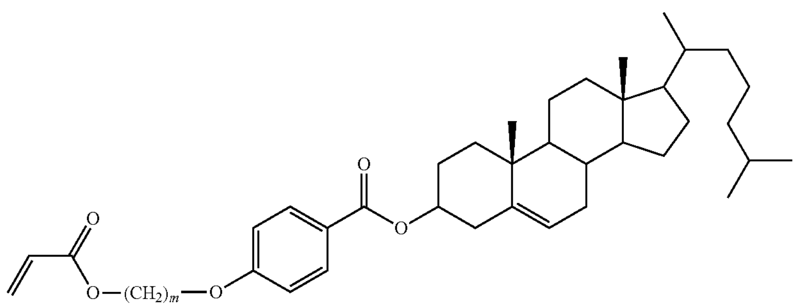
(10-28)
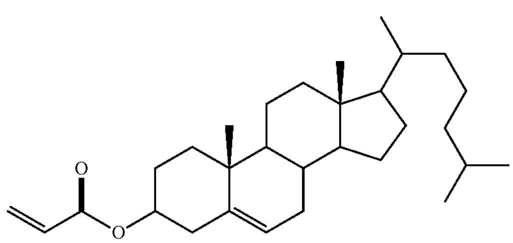
[Chem. 127]
(10-29)
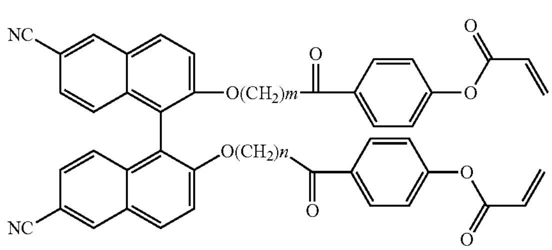
(10-30)
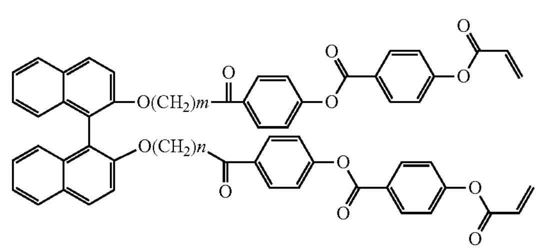

-continued (10-31)

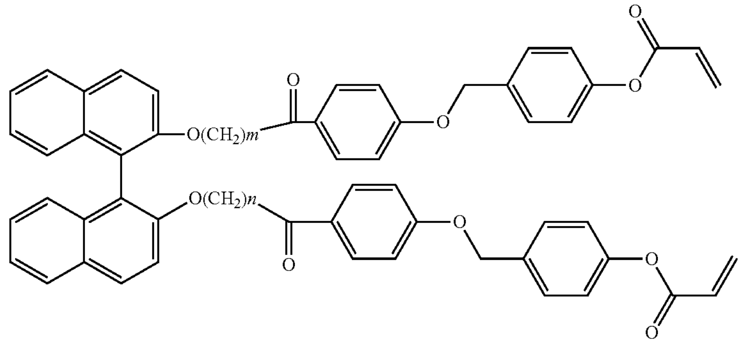

In the above formulas, m and n each independently represent an integer of 1 to 10, and R represents a hydrogen atom, an alkyl group having 1 to 10 carbon atoms, or a fluorine atom. When a plurality of Rs are present, they may be the same or different.

Specific examples of the chiral compound having no polymerizable group include: cholesterol pelargonate and cholesterol stearate that have a cholesteryl group as a chiral group; "CB-15" and "C-15" manufactured by BDH, "S-1082" manufactured by Merck, and "CM-19," "CM-20," and "CM" manufactured by Chisso Corporation, each of which has a 2-methylbutyl group as a chiral group; and "S-811" manufactured by Merck and "CM-21" and "CM-22" manufactured by Chisso Corporation, each of which has a 1-methylheptyl group as a chiral group.

When the chiral compound is added, the amount of the chiral compound added is controlled such that a value obtained by dividing the thickness (d) of the polymer to be obtained by the helix pitch (P) of the polymer, i.e., (d/P), is in the range of preferably 0.1 to 100 and more preferably 0.1 to 20, but this depends on the intended purpose of the polymer of the polymerizable composition of the present invention.

Non-Liquid Crystalline Compound Having Polymerizable Group

A compound that has a polymerizable group but is not a liquid crystal compound may be added to the polymerizable composition of the present invention. No particular limitation is imposed on the above compound, so long as the compound used is commonly recognized as a polymerizable monomer or a polymerizable oligomer in the present technical field. When the non-liquid crystalline compound is added, its amount is preferably 15% by mass or less and more preferably 10% by mass or less with respect to the total amount of the polymerizable liquid compounds used in the polymerizable composition of the present invention.

Specific examples include: mono(meth)acrylates such as methyl(meth)acrylate, ethyl (meth)acrylate, 2-hydroxyethyl acrylate, propyl (meth)acrylate, 2-hydroxypropyl (meth) acrylate, butyl (meth)acrylate, isobutyl (meth)acrylate, 4-hydroxybutyl (meth)acrylate, 2-hydroxybutyl (meth)acrylate, octyl (meth)acrylate, 2-ethylhexyl (meth)acrylate, dodecyl (meth)acrylate, stearyl (meth)acrylate, cyclohexyl (meth)acrylate, dicyclopentanyloxylethyl (meth)acrylate, isobornyloxylethyl (meth)acrylate, isobornyl (meth)acrylate, adamantyl (meth)acrylate, dimethyladamantyl (meth) acrylate, dicyclopentanyl (meth)acrylate, dicyclopentenyl (meth)acrylate, methoxyethyl (meth)acrylate, ethylcarbitol (meth)acrylate, tetrahydrofurfuryl (meth)acrylate, benzyl (meth)acrylate, phenoxyethyl (meth)acrylate, 2-phenoxydiethylene glycol (meth)acrylate, 2-hydroxy-3-phenoxyethyl (meth)acrylate, (2-methyl-2-ethyl-1,3-dioxolan-4-yl)methyl (meth)acrylate, (3-ethyloxetan-3-yl)methyl (meth)acrylate, o-phenylphenolethoxy (meth)acrylate, dimethylamino (meth)acrylate, diethylamino (meth)acrylate, 2,2,3,3,3-pentafluoropropyl (meth)acrylate, 2,2,3,4,4,4-hexafluorobutyl (meth)acrylate, 2,2,3,3,4,4,4-heptafluorobutyl (meth)acrylate, 2-(perfluorobutyl)ethyl (meth)acrylate, 2-(perfluorohexyl)ethyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, 1H-1-(trifluoromethyl)trifluoroethyl (meth)acrylate, 1H,1H,3H-hexafluorobutyl (meth)acrylate, 1,2,2,2-tetrafluoro-1-(trifluoromethyl)ethyl (meth)acrylate, 1H,1H-pentadecafluorooctyl (meth)acrylate, 1H,1H,2H,2H-tridecafluorooctyl (meth)acrylate, 2-(meth)acryloyloxyethyl phthalate, 2-(meth)acryloyloxyethylhexahydro phthalate, glycidyl (meth)acrylate, 2-(meth)acryloyloxyethyl phosphate, acryloylmorpholine, dimethylacrylamide, dimethylaminopropylacrylamide, isopropylacrylamide, diethylacrylamide, hydroxyethylacrylamide, and N-acryloyloxyethylhexahydrophthalimide; diacrylates such as 1,4-butanediol di(meth)acrylate, 1,6-hexanediol di(meth) acrylate, 1,9-nonanediol di(meth)acrylate, neopentyldiol di(meth)acrylate, tripropylene glycol di(meth)acrylate, ethylene glycol di(meth)acrylate, diethylene glycol di(meth) acrylate, triethylene glycol di(meth)acrylate, ethylene oxide-modified bisphenol A di(meth)acrylate, tricyclodecanedimethanol di(meth)acrylate, 9,9-bis[4-(2-acryloyloxyethoxy)phenyl]fluorene, glycerin di(meth)acrylate, 2-hydroxy-3-acryloyloxypropyl methacrylate, an acrylic acid adduct of 1,6-hexanediol diglycidyl ether, and an acrylic acid adduct of 1,4-butanediol diglycidyl ether; tri(meth)acrylates such as trimethylolpropane tri(meth)acrylate, ethoxylated isocyanuric acid triacrylate, pentaerythritol tri(meth)acrylate, and ε-caprolactone-modified tris-(2-acryloyloxyethyl)isocyanurate; tetra(meth)acrylates such as pentaerythritol tetra(meth)acrylate and ditrimethylolpropane tetra(meth)acrylate; dipentaerythritol hexa(meth)acrylate; oligomer-type (meth)acrylates; various urethane acrylates; various macromonomers; epoxy compounds such as ethylene glycol diglycidyl ether, diethylene glycol diglycidyl ether, propylene glycol diglycidyl ether, neopentyl glycol diglycidyl ether, 1,6-hexanediol diglycidyl ether, glycerin diglycidyl ether, and bisphenol A diglycidyl ether; and maleimide. These may be used alone or may be used as a mixture of two or more.

Other Liquid Crystalline Compounds

The polymerizable composition used in the present invention may contain a liquid crystalline compound having at least one polymerizable group other than the liquid crystalline compounds of general formula (1) to general formula (7). If the amount of such a liquid crystalline compound added is excessively large, the retardation ratio of a retardation plate prepared using the polymerizable composition may become large. Therefore, when the above liquid crystalline compound is added, its amount is preferably 30% by mass or less, more preferably 10% by mass or less, and particularly preferably 5% by mass or less with respect to the total mass of the polymerizable liquid compounds used in the polymerizable composition of the present invention.

Examples of the above liquid crystalline compound include liquid crystalline compounds represented by general formula (1-b) to general formula (7-b):

[Chem. 128]

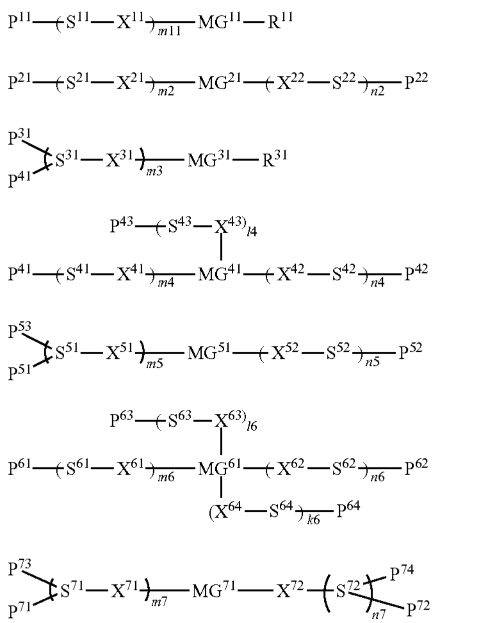

(1-b) (2-b) (3-B) (4-b) (5-b) (6-b) (7-b)

(wherein $P^{11}$ to $P^{74}$ each represent a polymerizable group; $S^{11}$ to $S^{72}$ each represent a spacer group or a single bond; when a plurality of $S^{11}$s to $S^{72}$s are present, they may be the same or different; $X^{11}$ to $X^{72}$ each represent —O—, —S—, —OCH$_2$—, —CH$_2$O—, —CO—, —COO—, —OCO—, —CO—S—, —S—CO—, —O—CO—O—, —CO—NH—, —NH—CO—, —SCH$_2$—, —CH$_2$S—, —CF$_2$O—, —OCF$_2$—, —CF$_2$S—, —SCF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —COO—CH$_2$—, —OCO—CH$_2$—, —CH$_2$—COO—, —CH$_2$—OCO—, —CH═CH—, —N═N—, —CH═N—N═CH—, —CF═CF—, —C≡C—, or a single bond (provided that each P—(S—X)— bond contains no —O—O—); when a plurality of $X^{11}$s to $X^{72}$s are present, they may be the same or different; $MG^{11}$ to $MG^{71}$ each independently represent formula (b):

[Chem. 129]

$$-\left(A^{83}-Z^{83}\right)_{j83}-M^{81}-\left(Z^{84}-A^{84}\right)_{j84}- \qquad \text{(b)}$$

(wherein $A^{83}$ and $A^{84}$ each independently represent a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, each of which may be unsubstituted or substituted by at least one $L^2$; when a plurality of $A^{83}$s and/or $A^{83}$s are present, they may be the same or different;

$Z^{83}$ and $Z^{84}$ each independently represent —O—, —S—, —OCH$_2$—, —CH$_2$O—, —CH$_2$CH$_2$—, —CO—, —COO—, —OCO—, —CO—S—, —S—CO—, —O—CO—O—, —CO—NH—, —NH—CO—, —SCH$_2$—, —CH$_2$S—, —CF$_2$O—, —OCF$_2$—, —CF$_2$S—, —SCF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —COO—CH$_2$—, —OCO—CH$_2$—, —CH$_2$—COO—, —CH—OCO—, —CH═CH—, —N═N—, —CH═N—, —H═CH—, —CH═N—N═CH—, —CF═CF—, —C≡—, or a single bond; when a plurality of $Z^{83}$s and/or $Z^{84}$s are present, they may be the same or different;

$M^{81}$ is a group selected from a 1,4-phenylene group, a 1,4-cyclohexylene group, a 1,4-cyclohexenyl group, a tetrahydropyran-2,5-diyl group, a 1,3-dioxane-2,5-diyl group, a tetrahydrothiopyran-2,5-diyl group, a 1,4-bicyclo(2,2,2)octylene group, a decahydronaphthalene-2,6-diyl group, a pyridine-2,5-diyl group, a pyrimidine-2,5-diyl group, a pyrazine-2,5-diyl group, a thiophene-2,5-diyl group-, a 1,2,3,4-tetrahydronaphthalene-2,6-diyl group, a naphthylene-1,4-diyl group, a naphthylene-1,5-diyl group, a naphthylene-1,6-diyl group, a naphthylene-2,6-diyl group, a phenanthrene-2,7-diyl group, a 9,10-dihydrophenanthrene-2,7-diyl group, a 1,2,3,4,4a,9,10a-octahydrophenanthrene-2,7-diyl group, a benzo[1,2-b:4,5-b']dithiophene-2,6-diyl group, a benzo[1,2-b:4,5-b']diselenophen-2,6-diyl group, a [1]benzothieno[3,2-b]thiophene-2,7-diyl group, a [1]benzoselenopheno[3,2-b]selenophen-2,7-diyl group, and a fluorene-2,7-diyl group, each of which may be unsubstituted or substituted by at least one $L^2$;

$L^2$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or an alkyl group having 1 to 20 carbon atoms, the alkyl group being linear or branched, any hydrogen atom in the alkyl group being optionally replaced by a fluorine atom, one —CH$_2$— group or two or more nonadjacent —CH$_2$— groups in the alkyl group being each independently optionally replaced by a group selected from —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, and —C≡C—; when a plurality of $L^2$s are present in the compound, they may be the same or different; m represents an integer from 0 to 8; and j83 and j84 each independently represent an integer from 0 to 5 while j83+j84 represents an integer from 1 to 5); $R^{11}$ and $R^{31}$ each represent a hydrogen atom, a fluorine atom, a chlorine atom, a bromine atom, an iodine atom, a pentafluorosulfuranyl group, a cyano group, a nitro group, an isocyano group, a thioisocyano group, or an alkyl group having 1 to 20 carbon atoms, the alkyl group being linear or branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, or —C≡C—; m11 represents an integer of 0 to 8; m2 to m7, n2 to n7, 14 to 16, and k6 each independently represent an integer from 0 to 5; but general formula (1) to general formula (7) are excluded).

Specific examples of the compound represented by general formula (1-b) include compounds represented by formula (1-b-1) to formula (1-b-39) below:

[Chem. 130]

(1-b-1)

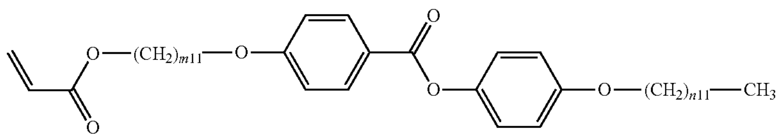

(1-b-2)

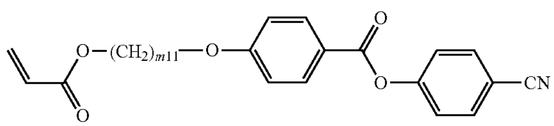

(1-b-3)

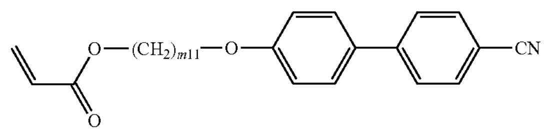

(1-b-4)

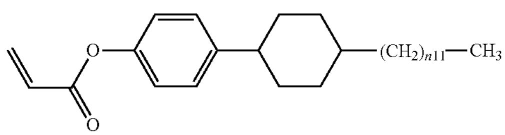

(1-b-5)

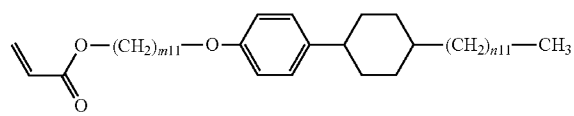

(1-b-6)

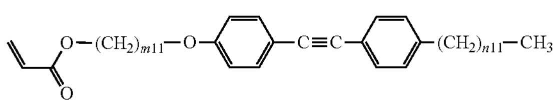

(1-b-7)

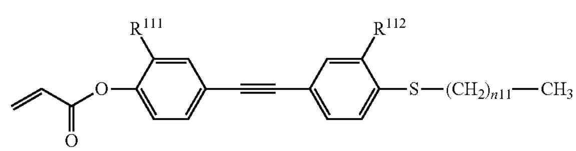

(1-b-8)

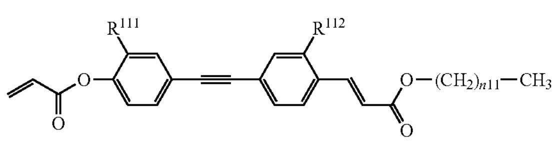

(1-b-9)

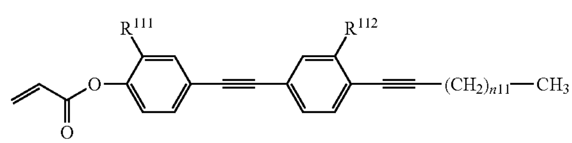

[Chem. 131]

(1-b-10)

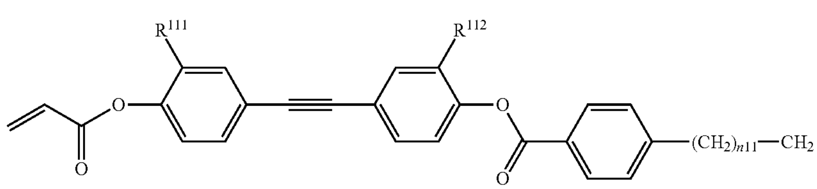

(1-b-11)

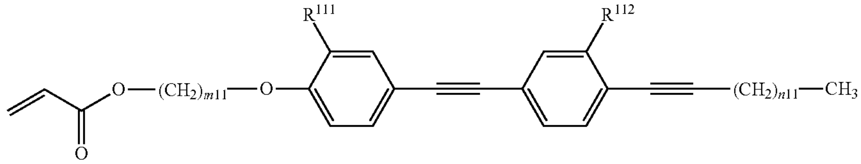

-continued
(1-b-12)
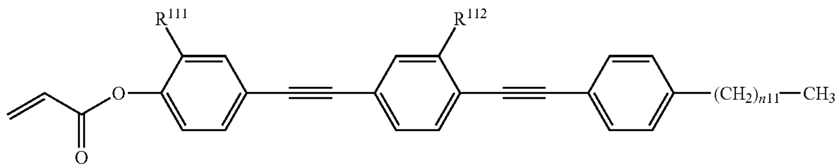
(1-b-13)
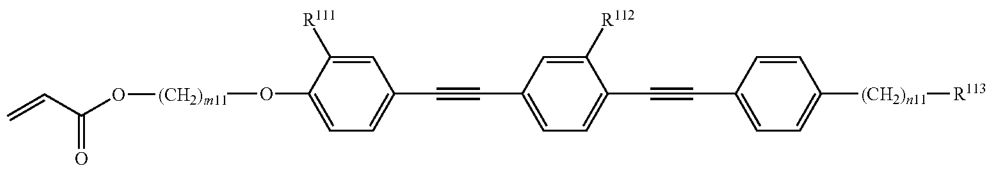
(1-b-14)
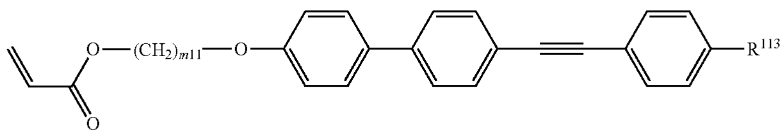
(1-b-15)
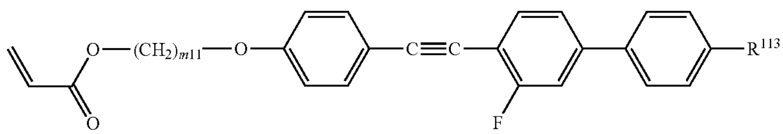
(1-b-16)
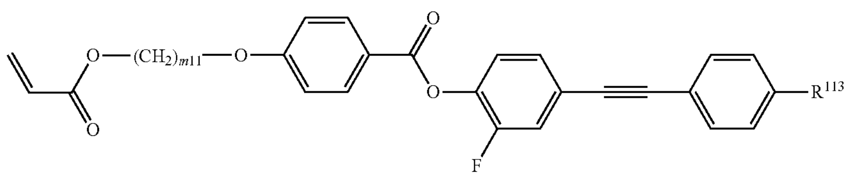
(1-b-17)
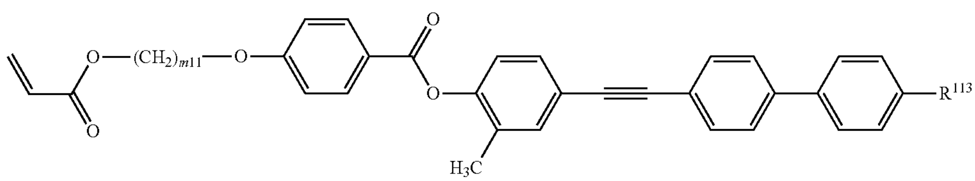
[Chem. 132]
(1-b-18)
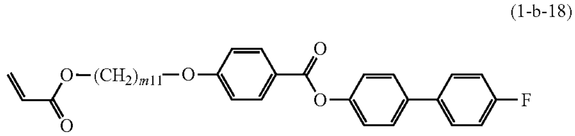
(1-b-19)
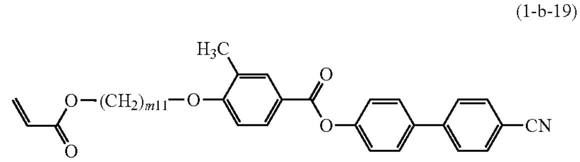
(1-b-20)
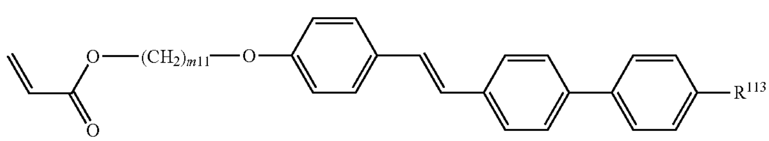
(1-b-21)
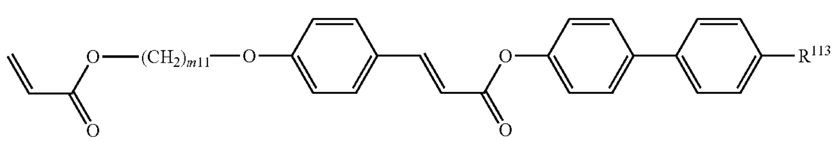

-continued
(1-b-22)
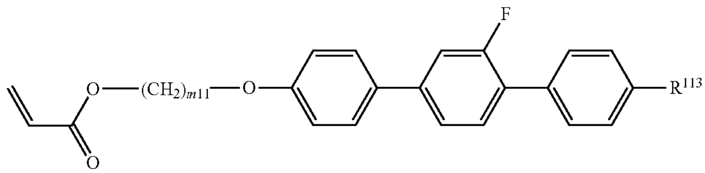
(1-b-23)
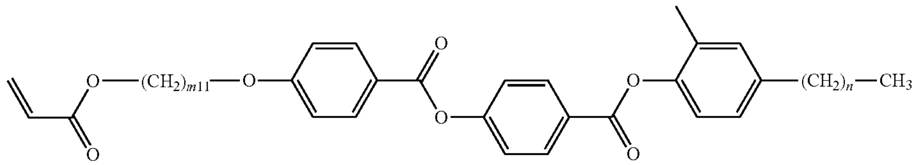
(1-b-24)
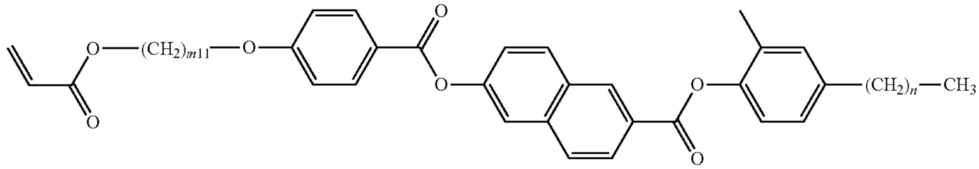
(1-b-25)
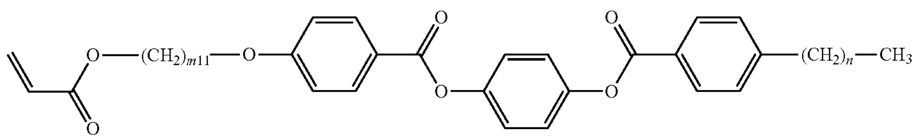
[Chem. 133]
(1-b-26)
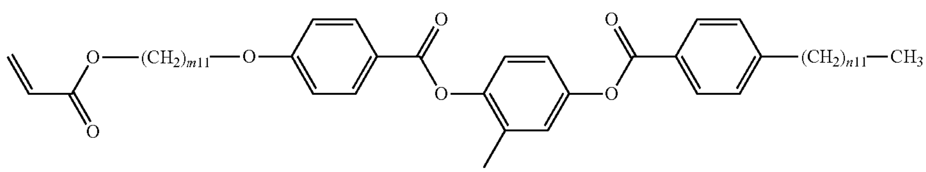
(1-b-27)
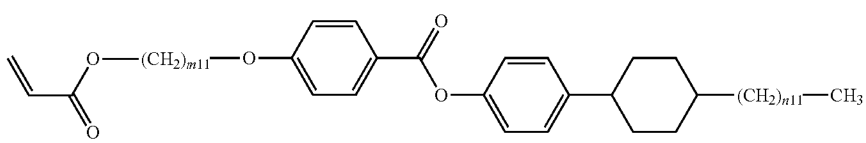
(1-b-28)
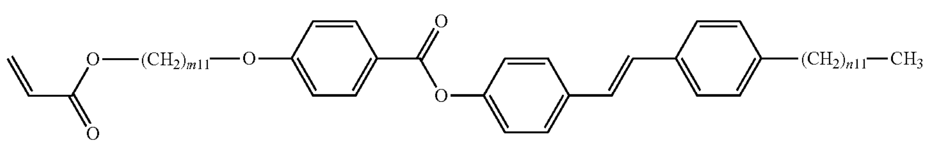
(1-b-29)
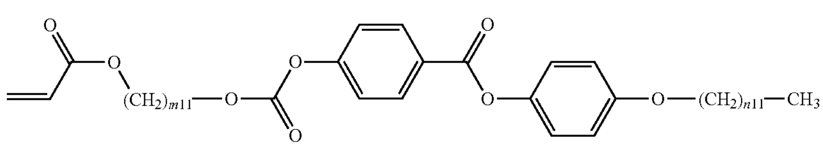
(1-b-30)
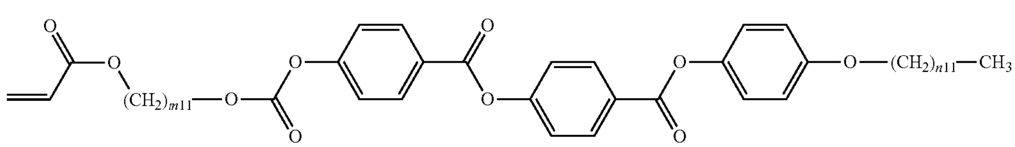
(1-b-31)
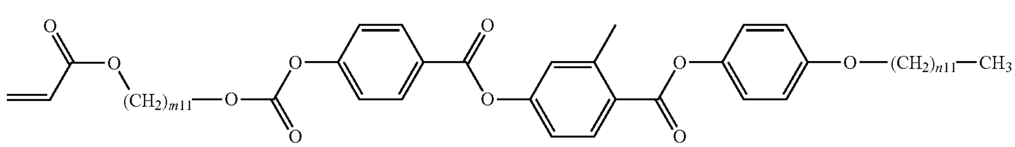

-continued (1-b-32)

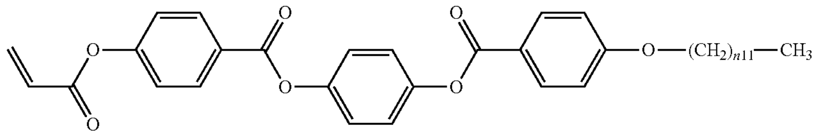

[Chem. 134]

(1-b-33)

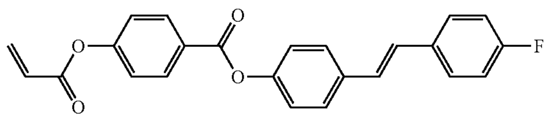

(1-b-34)

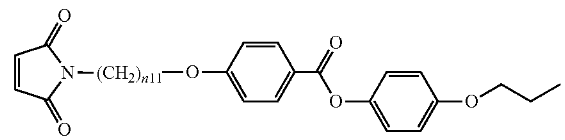

(1-b-35)

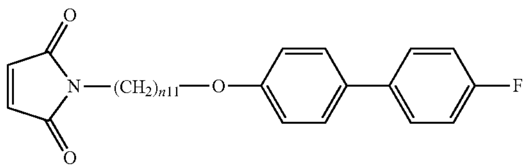

(1-b-36)

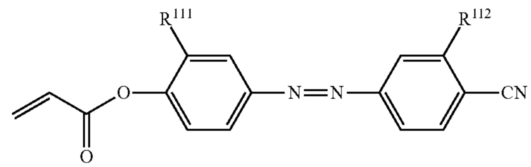

(1-b-37)

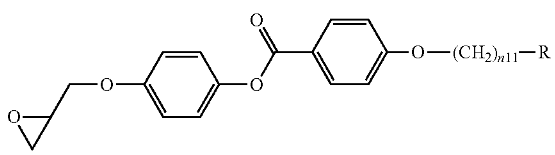

(1-b-38)

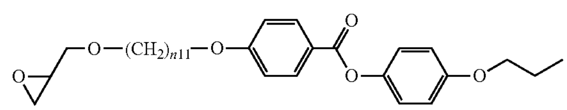

(1-b-39)

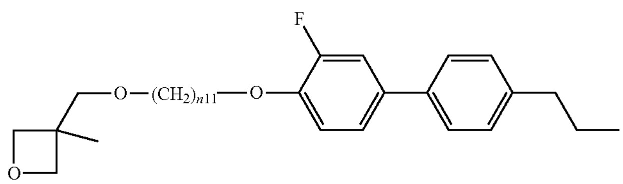

(wherein m11 and n11 each independently represent an integer of 1 to 10; $R^{111}$ and $R^{112}$ each independently represent a hydrogen atom, an alkyl group having 1 to 10 carbon atoms, or a fluorine atom; $R^{113}$ represents a hydrogen atom, a fluorine atom, a chlorine atom, a bromine atom, an iodine atom, a pentafluorosulfuranyl group, a cyano group, a nitro group, an isocyano group, a thioisocyano group, or a linear or branched alkyl group which has 1 to 20 carbon atoms and in which one —$CH_2$— group or two or more nonadjacent —$CH_2$— groups may be each independently replaced by —O—, —S—, —CO—, —COO—, —OCO—, —CO—S—, —S—CO—, —O—CO—O—, —CO—NH—, —NH—CO—, or —C≡C—; and any hydrogen atom in the alkyl group may be replaced by a fluorine atom). These liquid crystal compounds may be used alone or may be used as a mixture of two or more.

Specific examples of the compound represented by general formula (2-b) include compounds represented by formula (2-b-1) to formula (2-b-33) below:

[Chem. 135]

(2-b-1)

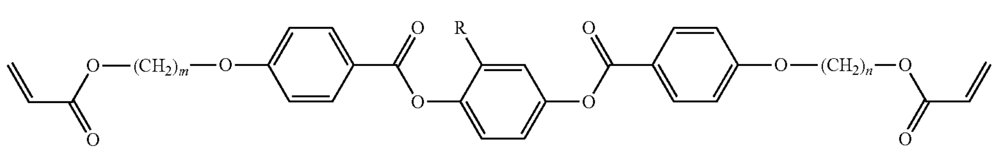

(2-b-2)

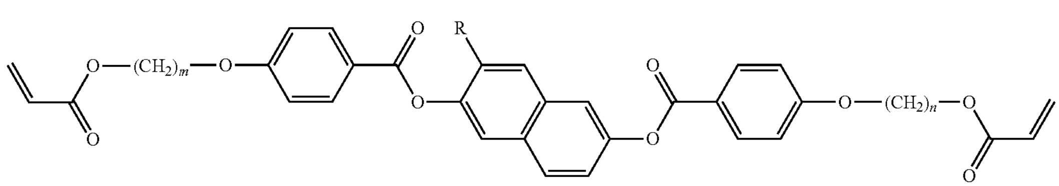

-continued
(2-b-3)
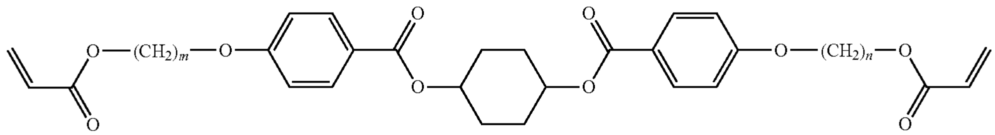
(2-b-4)
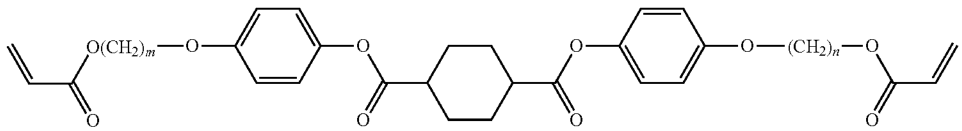
(2-b-5)
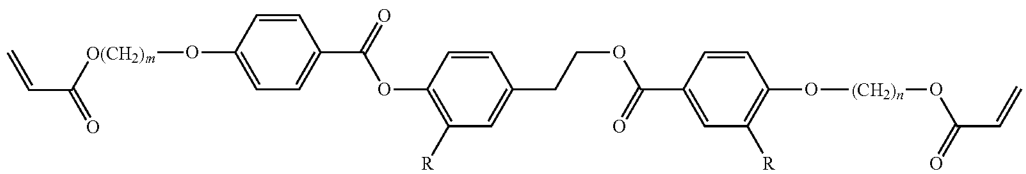
(2-b-6)
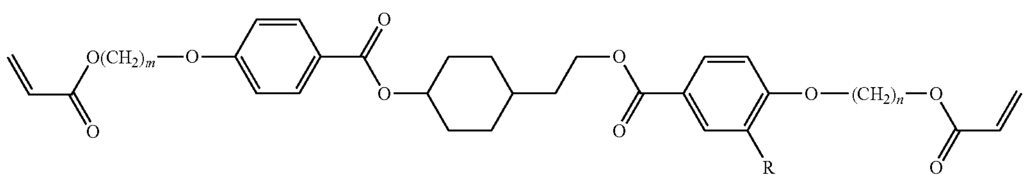
(2-b-7)
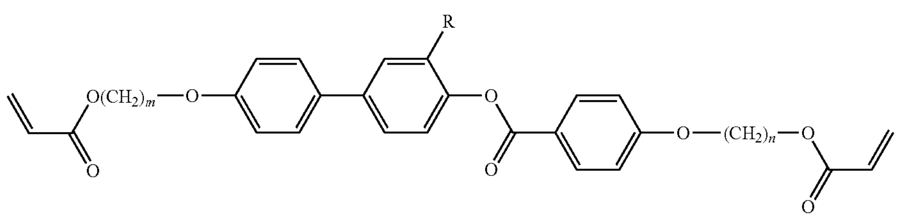
(2-b-8)
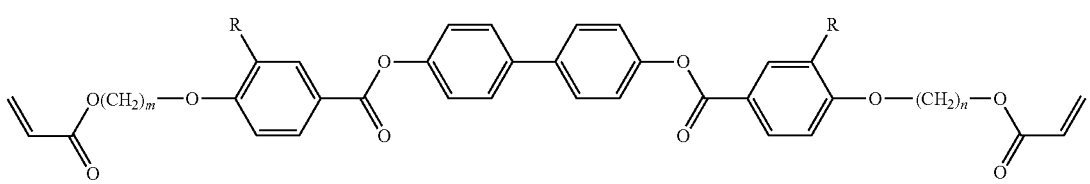
[Chem. 136]
(2-b-9)
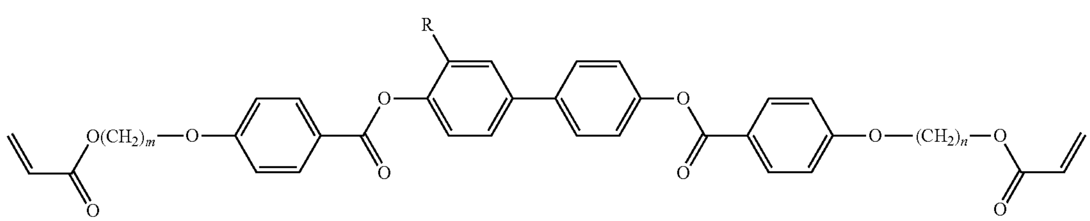
(2-b-10)
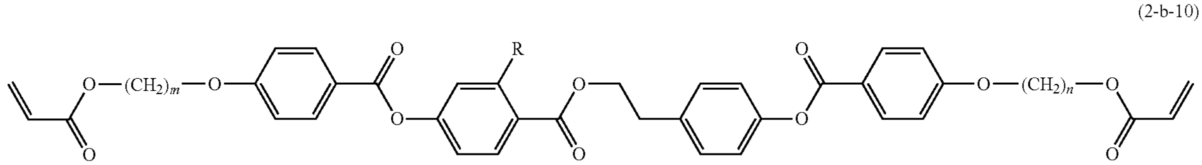

-continued
(2-b-11)
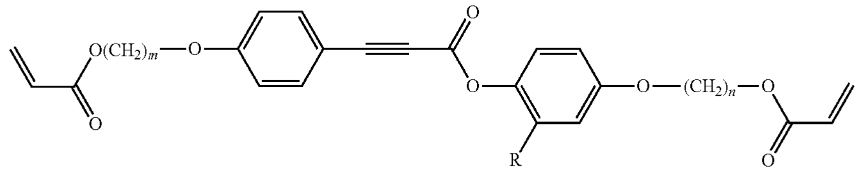
(2-b-12)
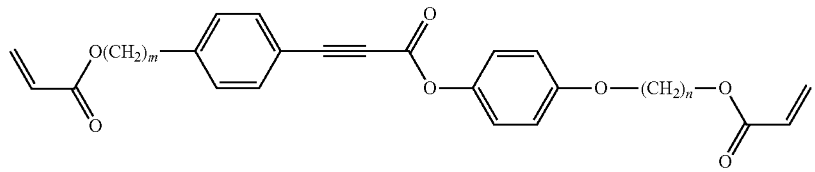
(2-b-13)
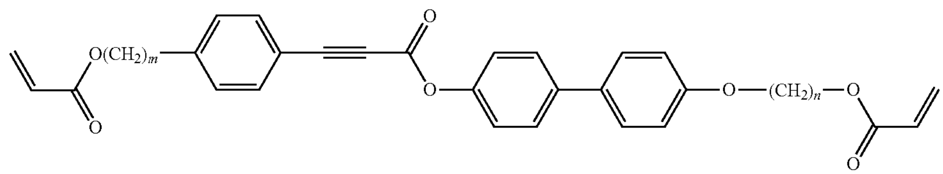
(2-b-14)
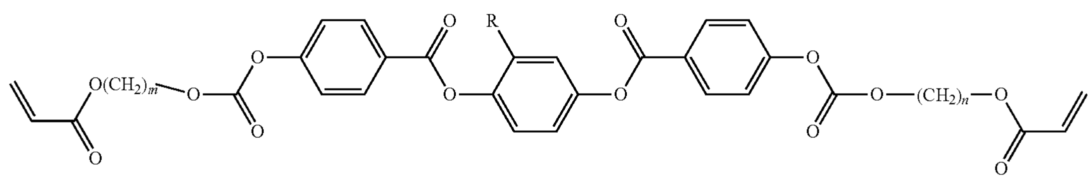
[Chem. 137]
(2-b-15)
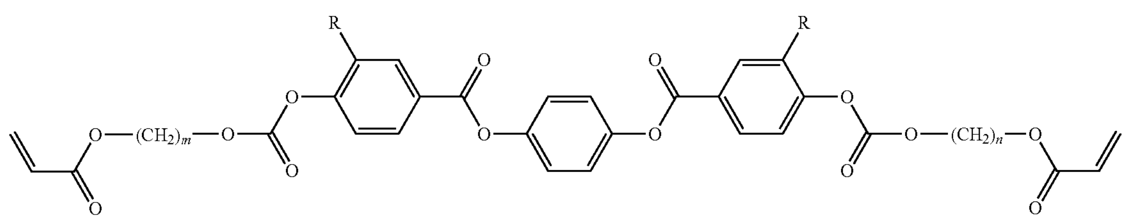
(2-b-16)
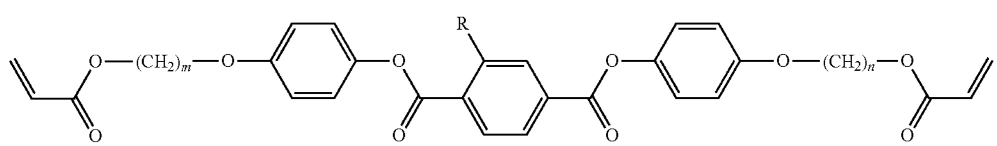
(2-b-17)
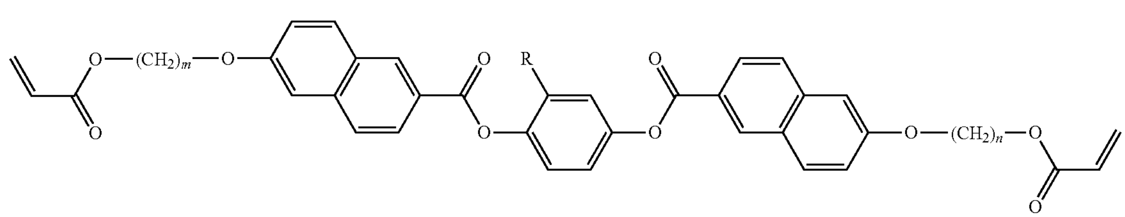
(2-b-18)
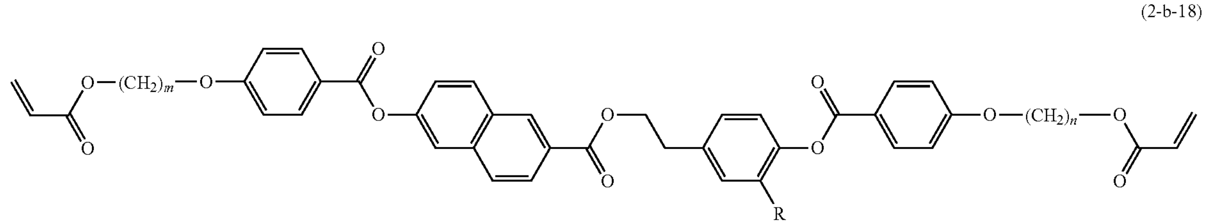

-continued
[Chem. 138]
(2-b-19)
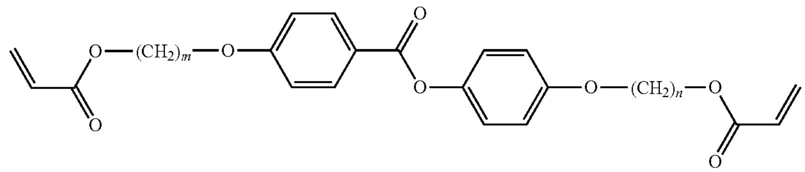
(2-b-20)
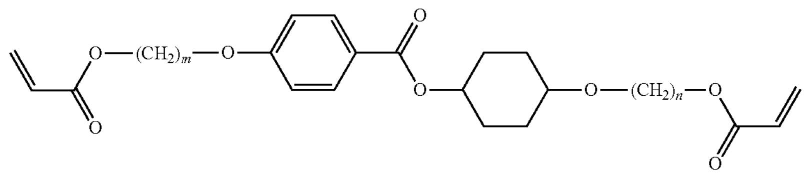
(2-b-21)
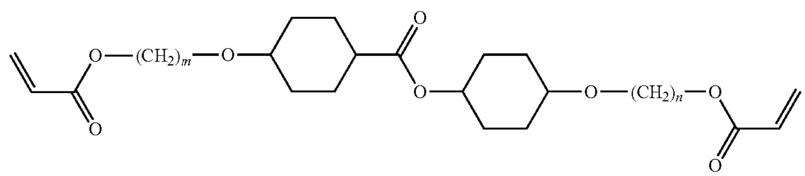
(2-b-22)
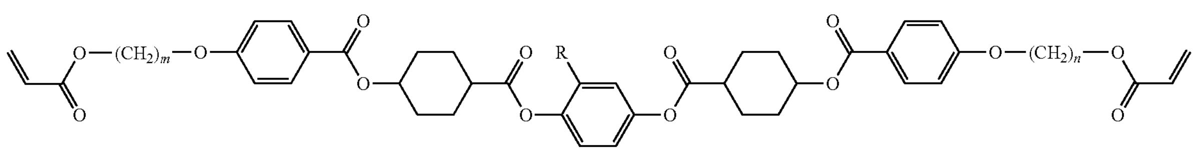
(2-b-23)
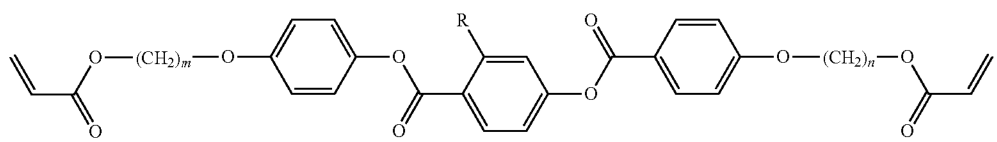
(2-b-24)
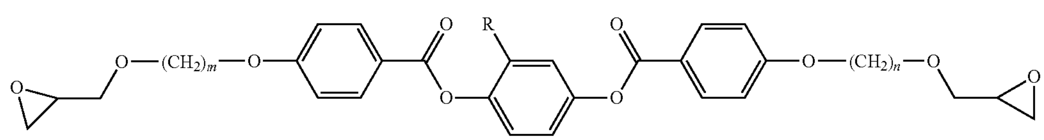
(2-b-25)
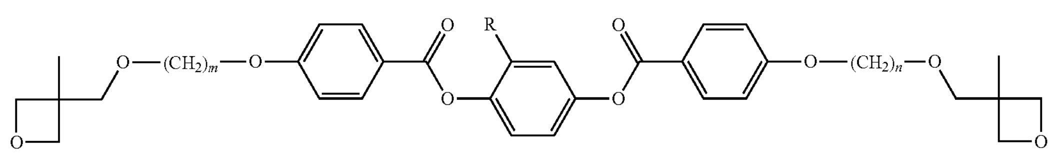
(2-b-26)
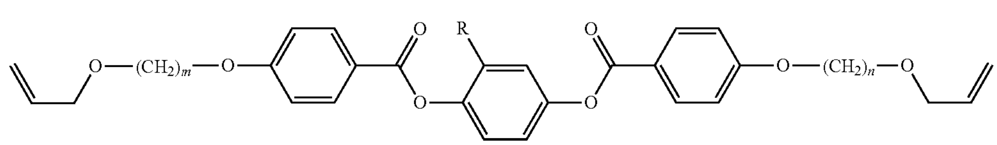
[Chem. 139]
(2-b-27)
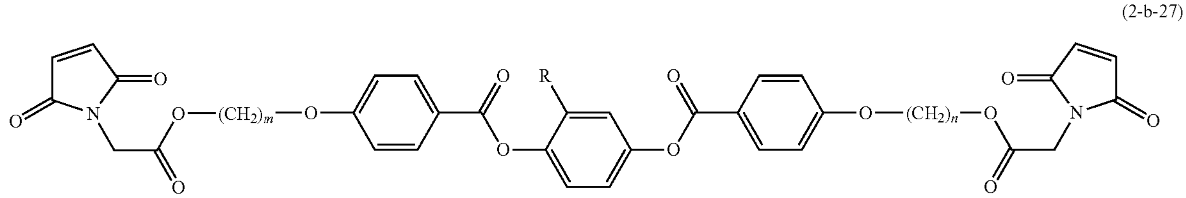

-continued (2-b-28)

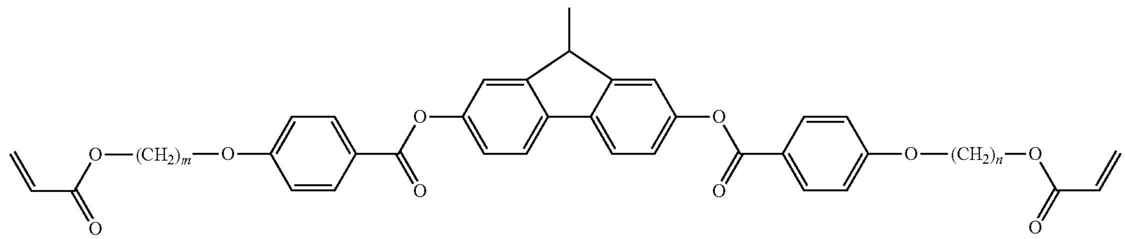

(2-b-29)

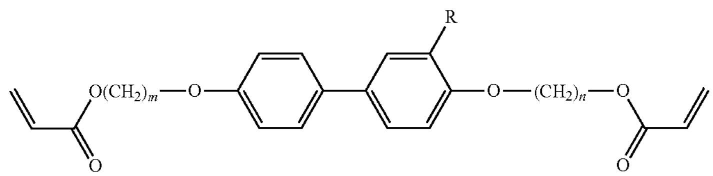

(2-b-30)

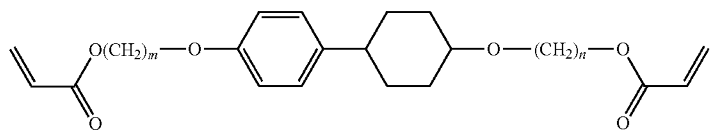

(2-b-31)

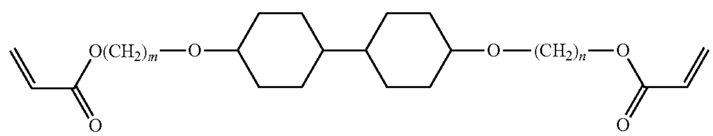

(2-b-32)

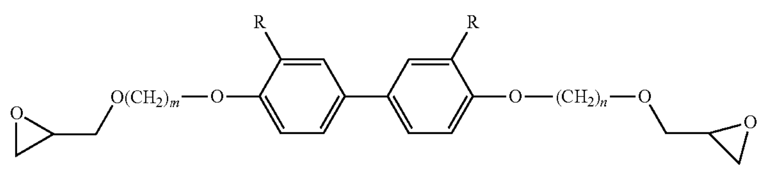

(2-b-33)

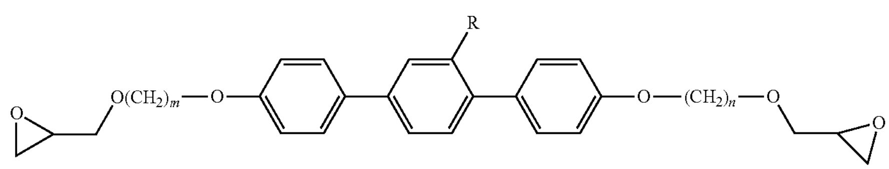

(wherein m and n each independently represent an integer of 1 to 18, and R represents a hydrogen atom, a halogen atom, an alkyl group having 1 to 6 carbon atoms, an alkoxy group having 1 to 6 carbon atoms, or a cyano group. When R is an alkyl group having 1 to 6 carbon atoms or an alkoxy group having 1 to 6 carbon atoms, R may be unsubstituted or substituted by one or at least two halogen atoms). These liquid crystal compounds may be used alone or may be used as a mixture of two or more.

Specific examples of the compound represented by general formula (3-b) include compounds represented by formula (3-b-1) to formula (3-b-16) below:

[Chem. 140]

(3-b-1)

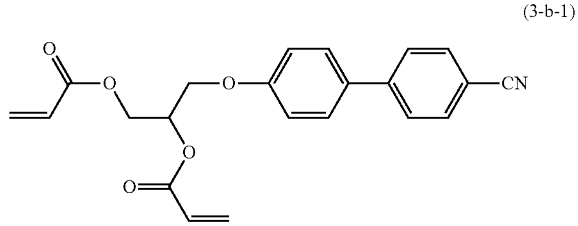

(3-b-2)

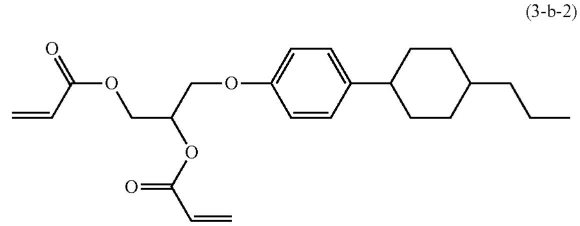

-continued
(3-b-3)
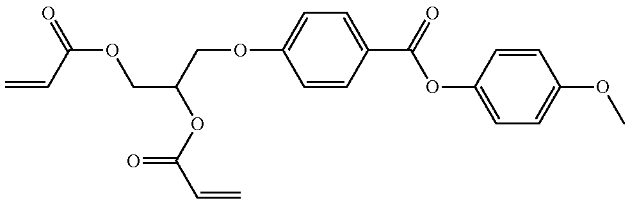
(3-b-4)
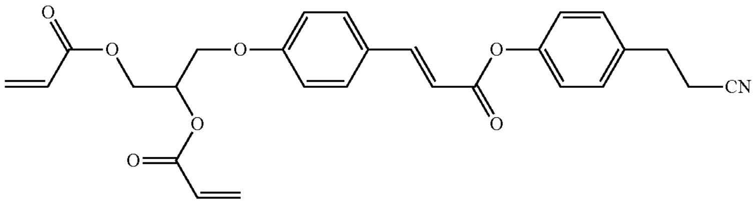
(3-b-5)
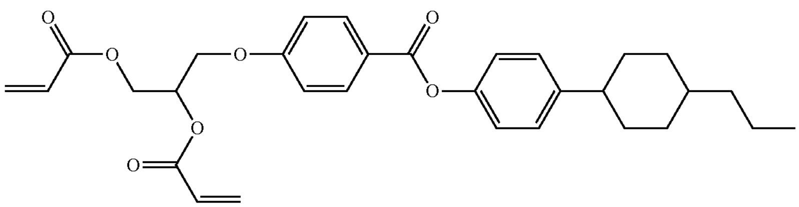
[Chem. 141]
(3-b-6)
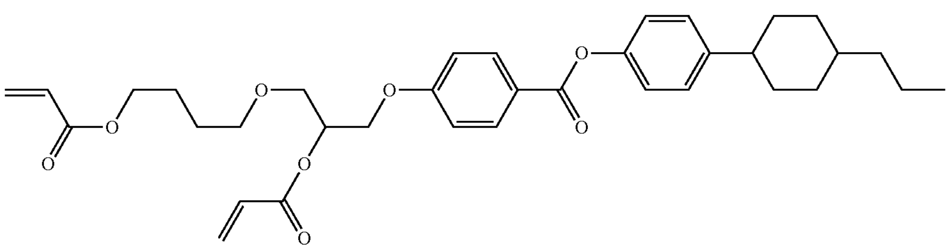
(3-b-7)
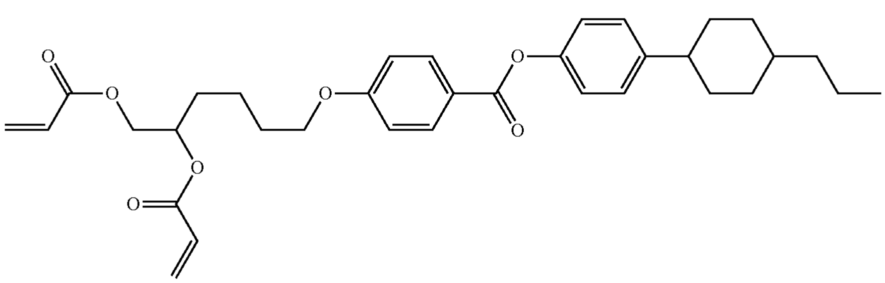
(3-b-8)
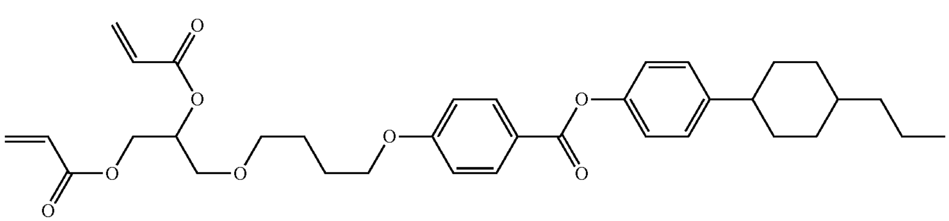

-continued
(3-b-9)
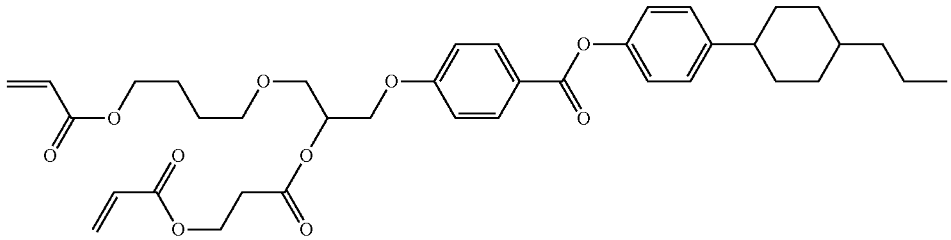
(3-b-10)
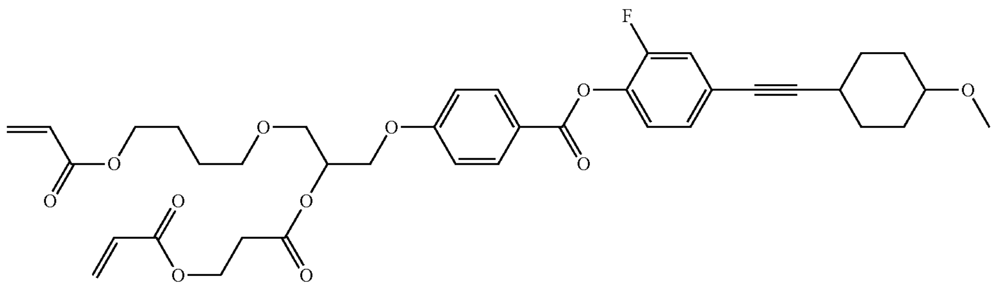
[Chem. 142]
(3-b-11)
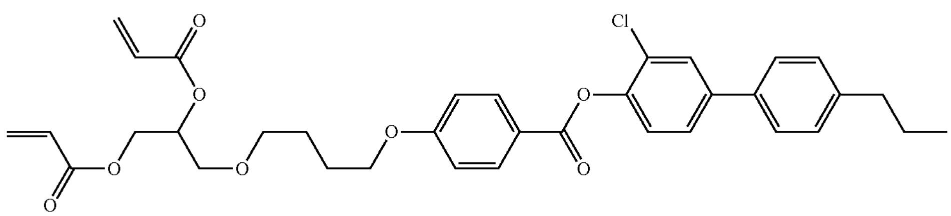
(3-b-12)
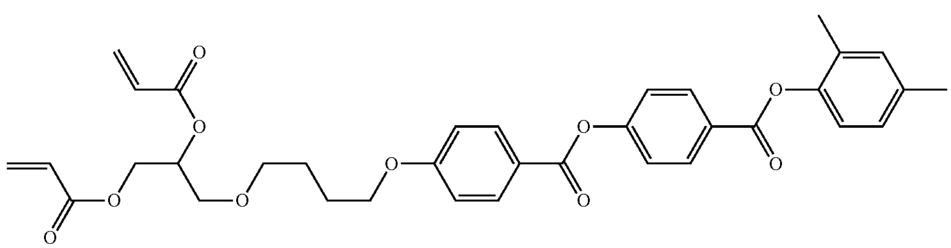
(3-b-13)
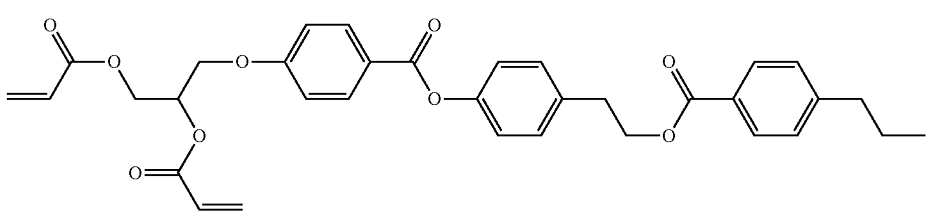
(3-b-14)
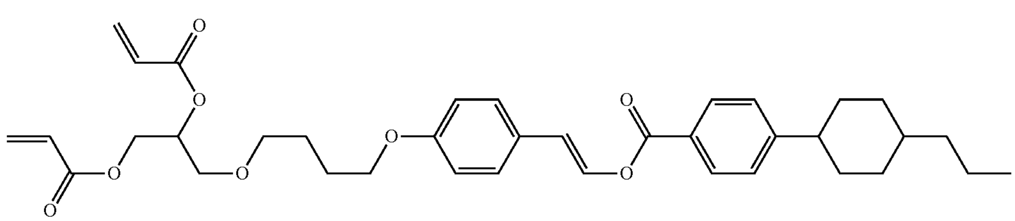

-continued
(3-b-15)
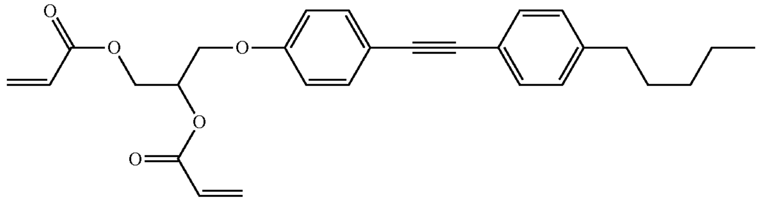
(3-b-16)
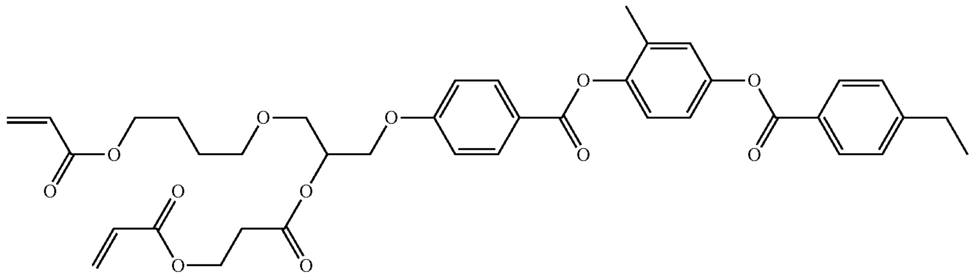
These liquid crystalline compounds may be used alone or as a mixture of two or more.
Specific examples of the compound represented by general formula (4-b) include compounds represented by formula (4-b-1) to formula (4-b-29) below:
[Chem. 143]
(4-b-1)
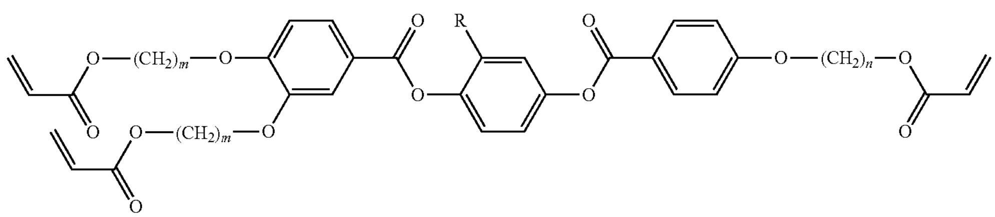
(4-b-2)
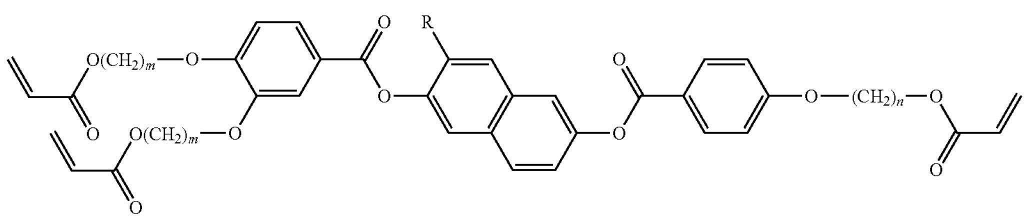
(4-b-3)
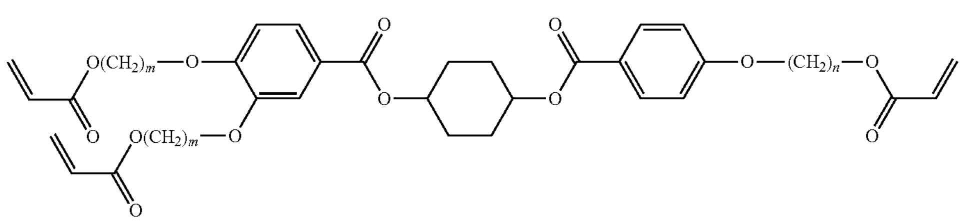
(4-b-4)
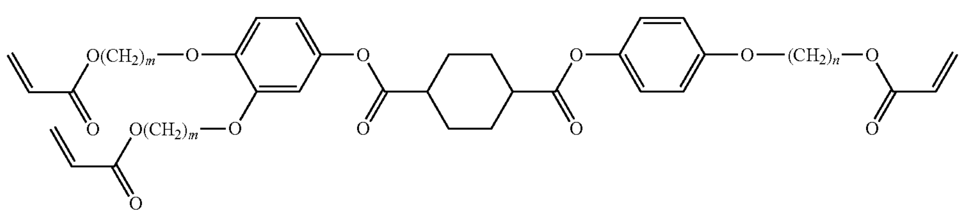

-continued
(4-b-5)
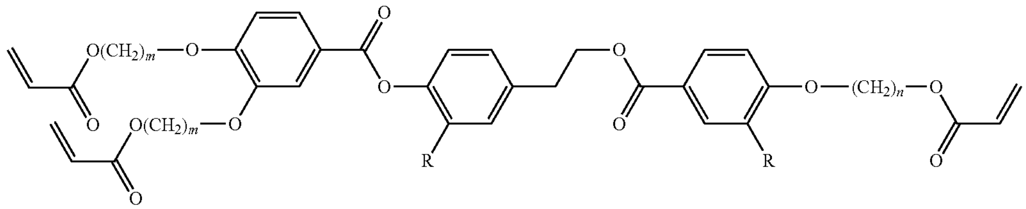
(4-b-6)
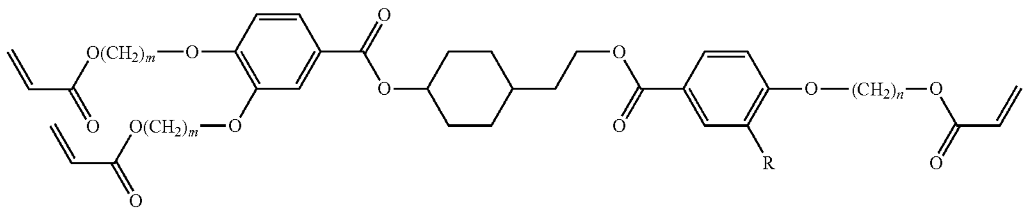
[Chem. 144]
(4-b-7)
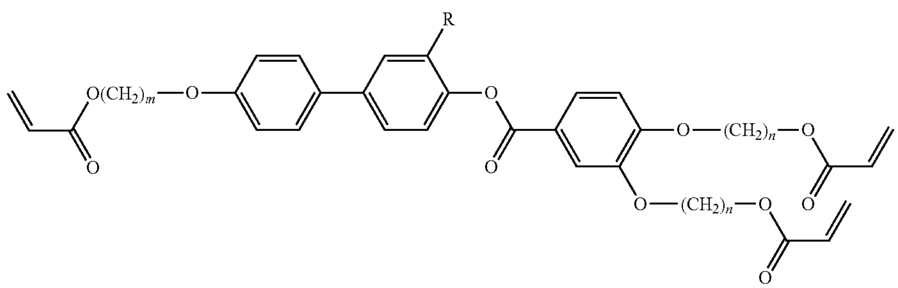
(4-b-8)
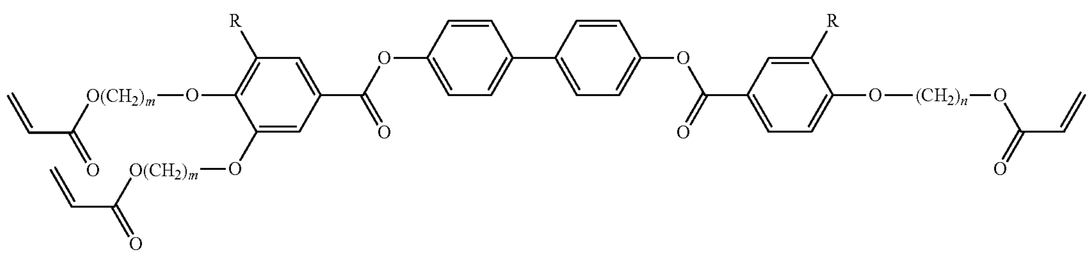
(4-b-9)
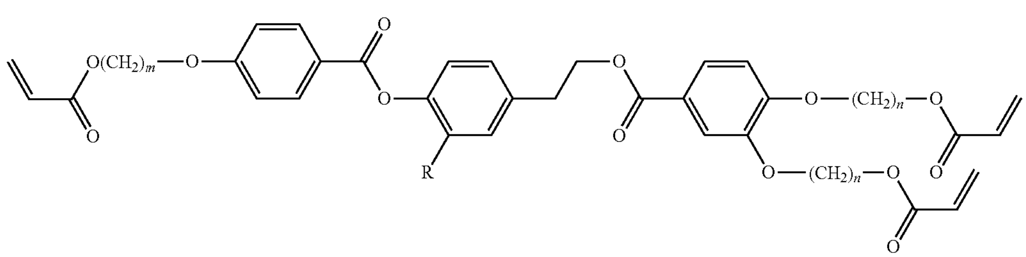
(4-b-10)
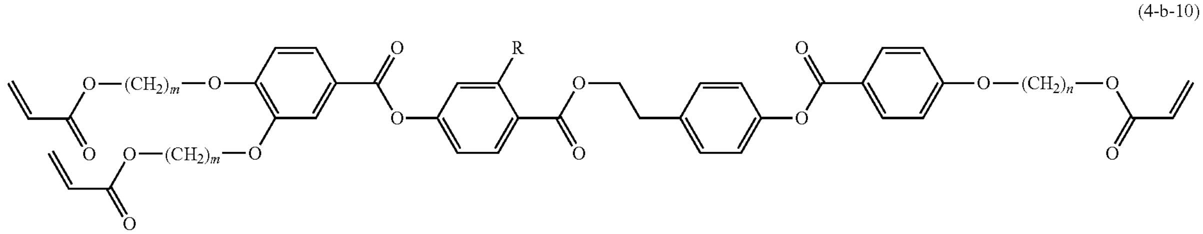

-continued
[Chem. 145]
(4-b-11)
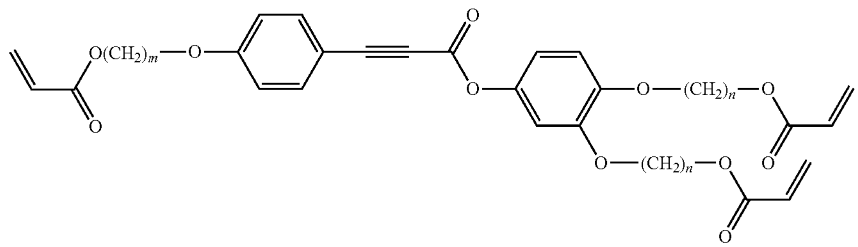
(4-b-12)
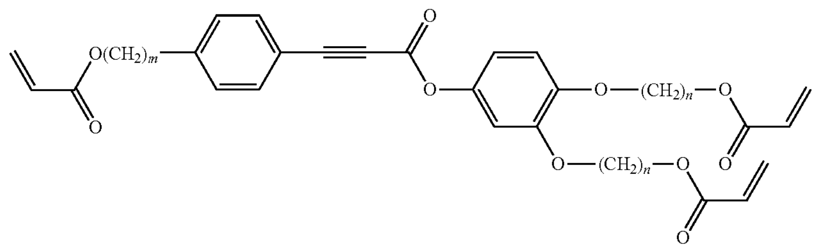
(4-b-13)
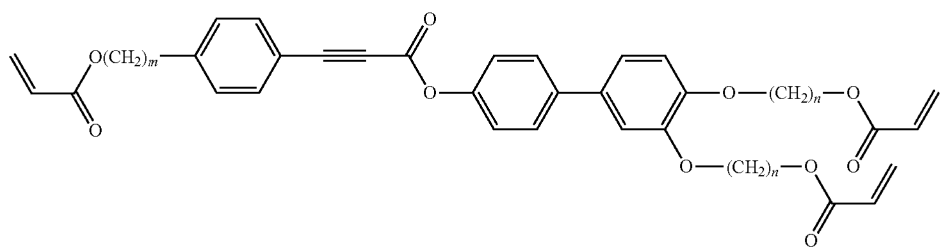
(4-b-14)
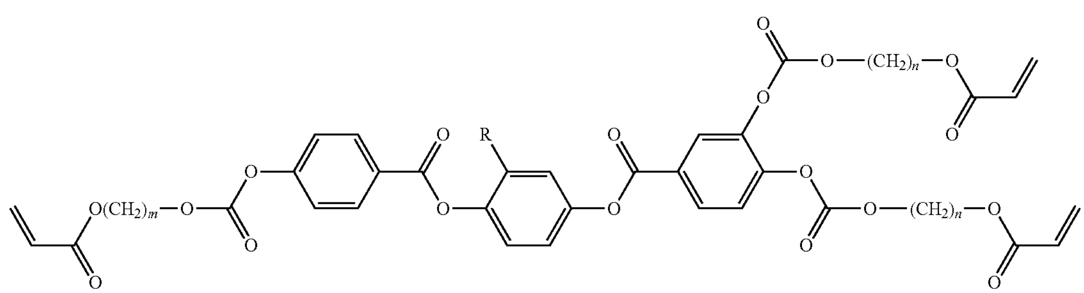
(4-b-15)
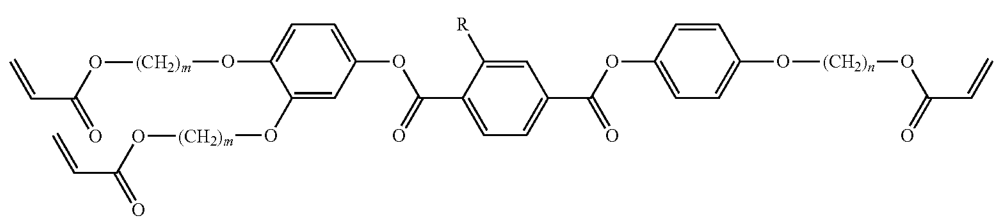
[Chem. 146]
(4-b-16)
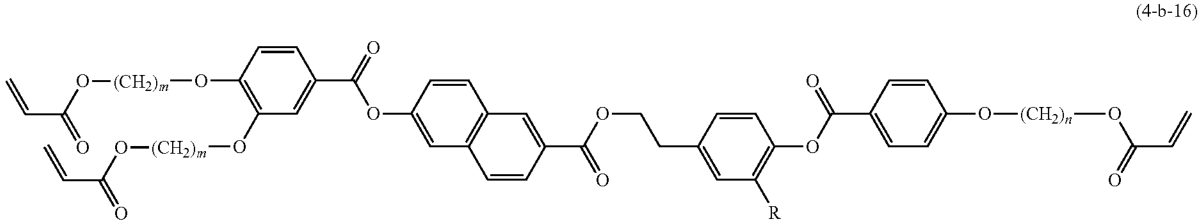

-continued
(4-b-17)
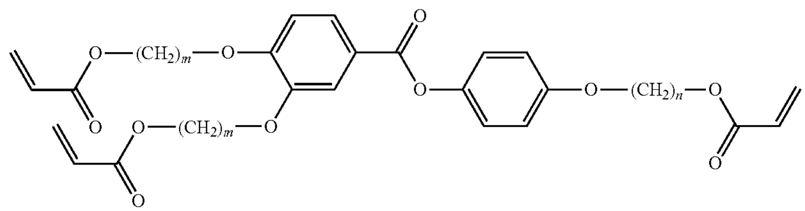
(4-b-18)
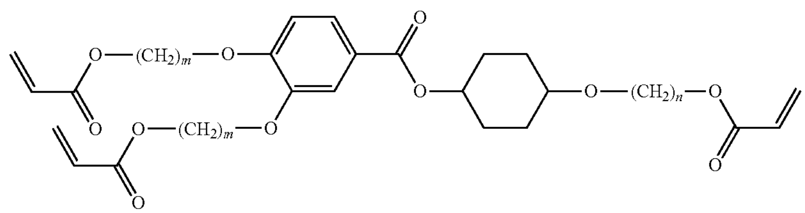
[Chem. 147]
(4-b-19)
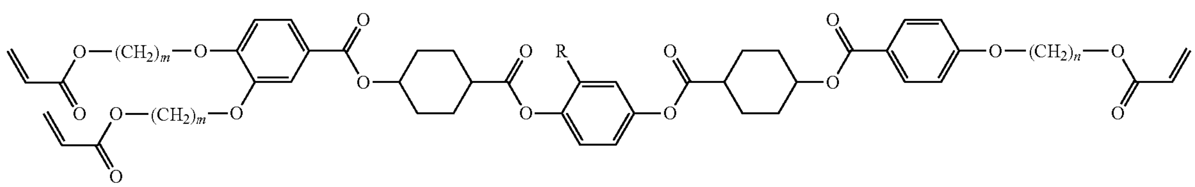
(4-b-20)
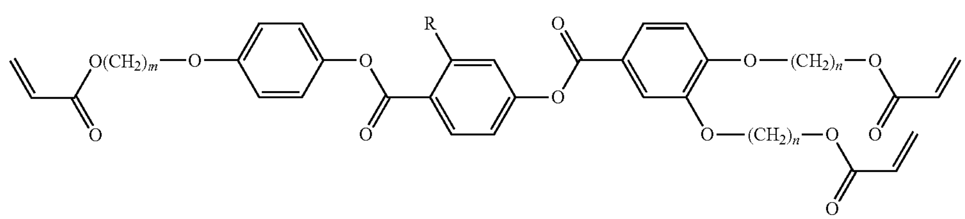
(4-b-21)
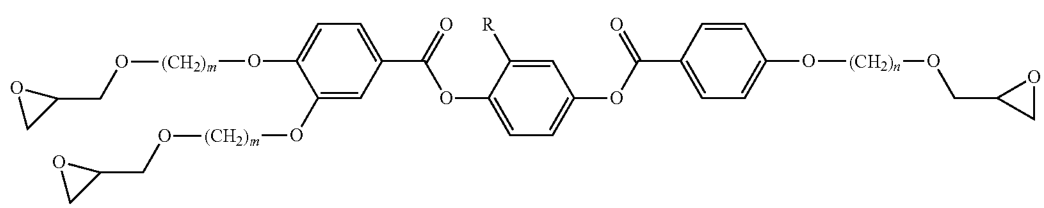
(4-b-22)
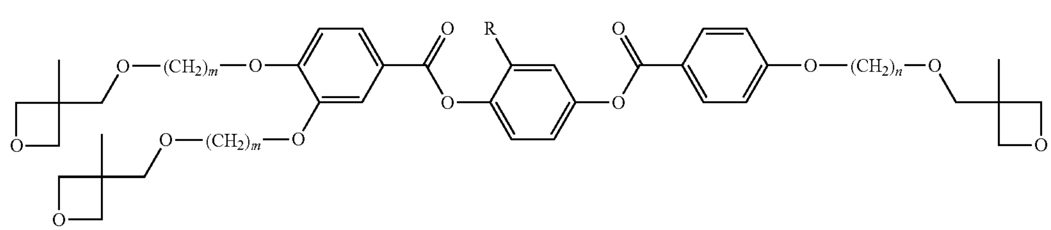

-continued
(4-b-23)
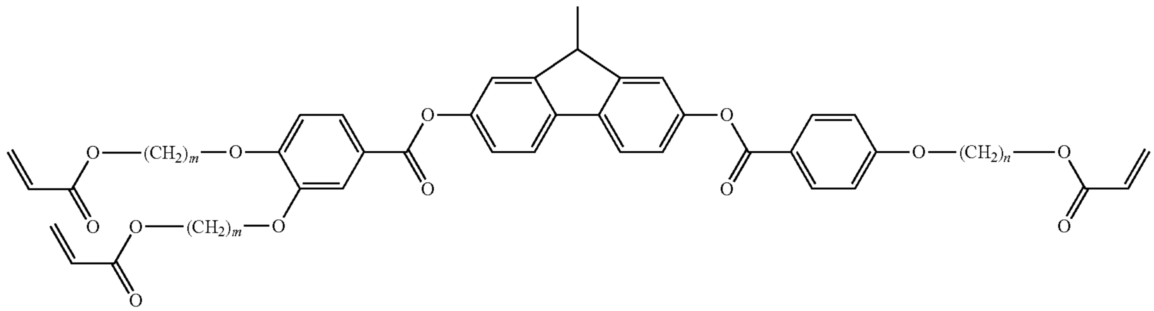
(4-b-24)
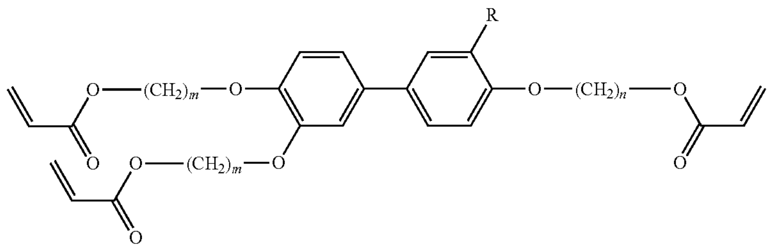
[Chem. 148]
(4-b-25)
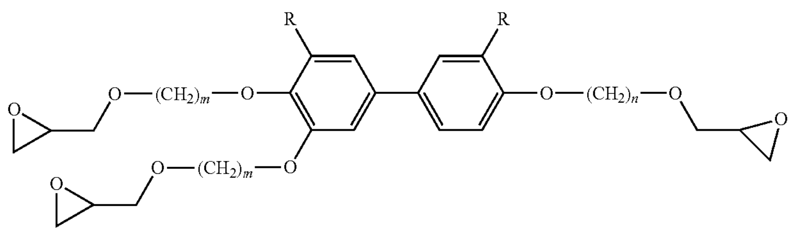
(4-b-26)
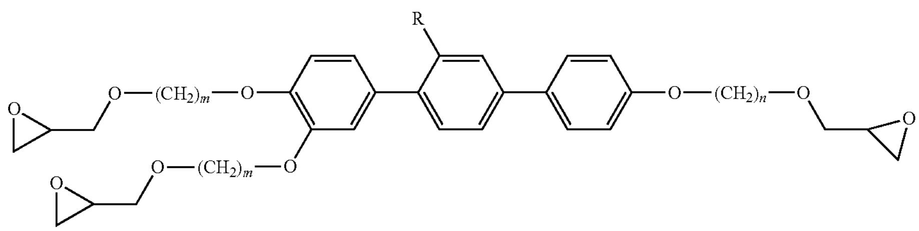
(4-b-27)
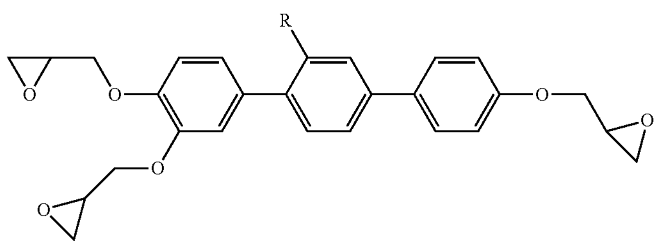
(4-b-28)
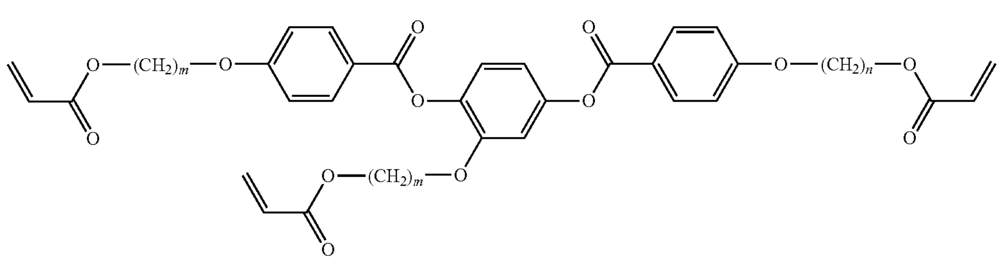

-continued (4-b-29)

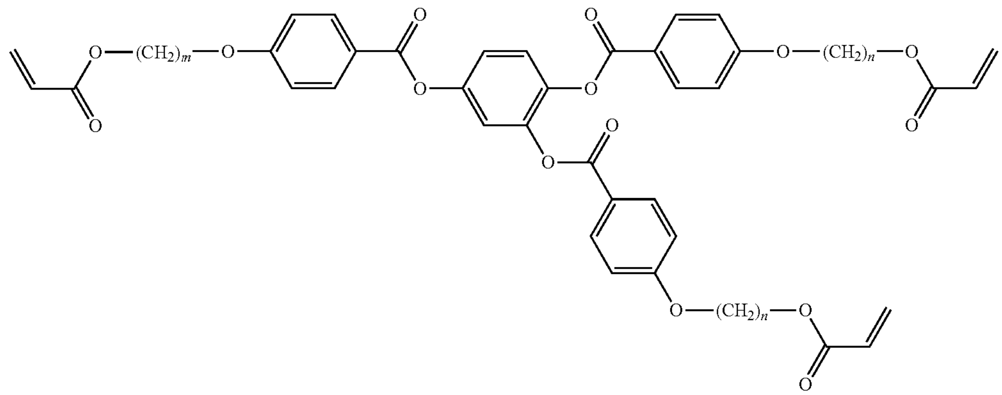

(wherein m and n each independently represent an integer of 1 to 10. R represents a hydrogen atom, a halogen atom, an alkyl group having 1 to 6 carbon atoms, an alkoxy group having 1 to 6 carbon atoms, or a cyano group. When R is an alkyl group having 1 to 6 carbon at atoms or an alkoxy group having 1 to 6 carbon atoms, R may be unsubstituted or substituted by one or at least two halogen atoms). These liquid crystalline compounds may be used alone or as a mixture of two or more.

Specific examples of the compound represented by general formula (5-b) include compounds represented by formula (5-b-1) to formula (5-b-26) below:

[Chem. 149]

(5-b-1)

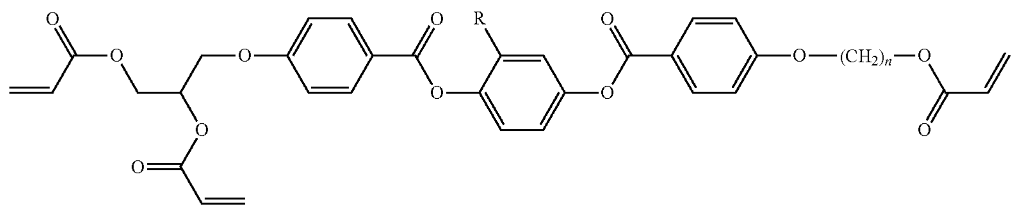

(5-b-2)

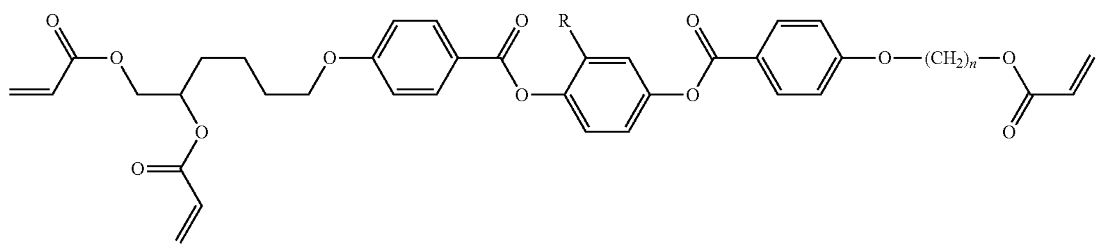

(5-b-3)

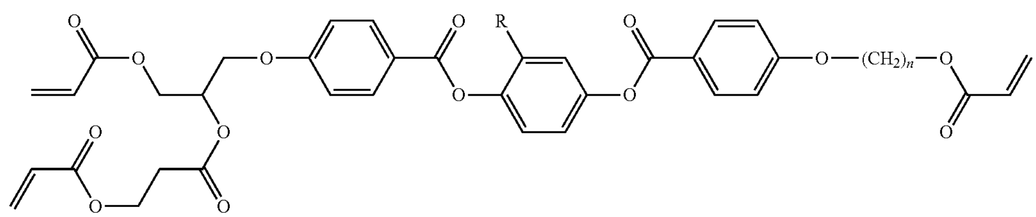

(5-b-4)

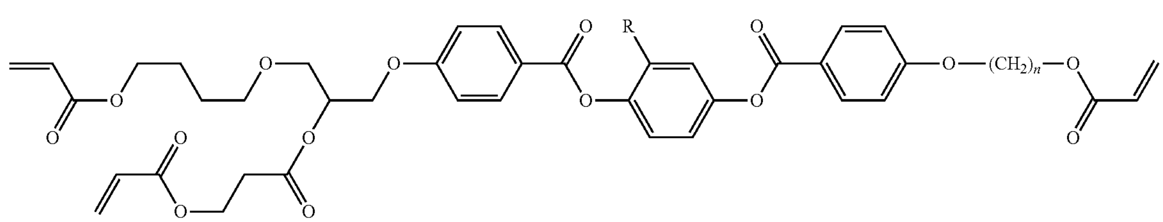

-continued
(5-b-5)
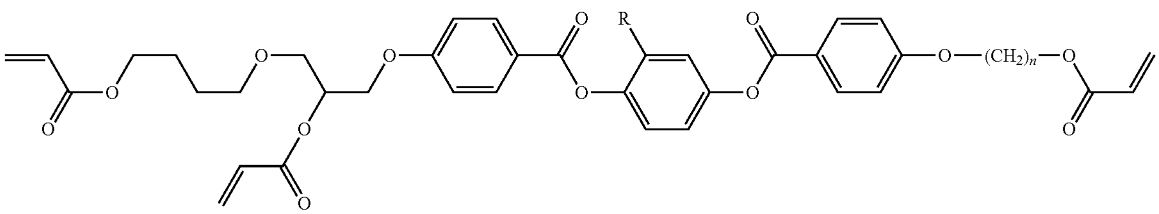
[Chem. 150]
(5-b-6)
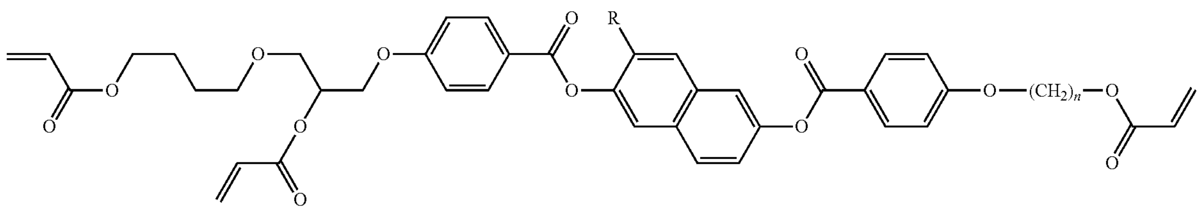
(5-b-7)
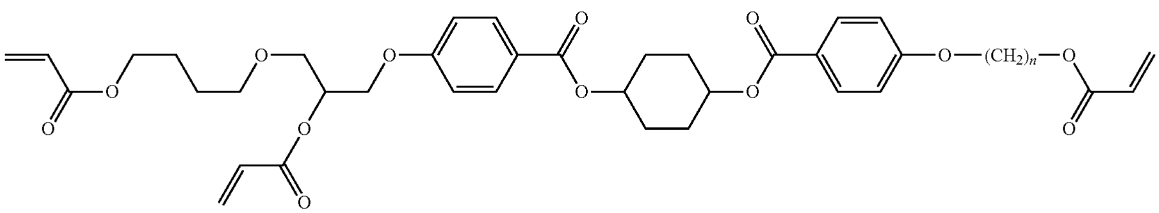
(5-b-8)
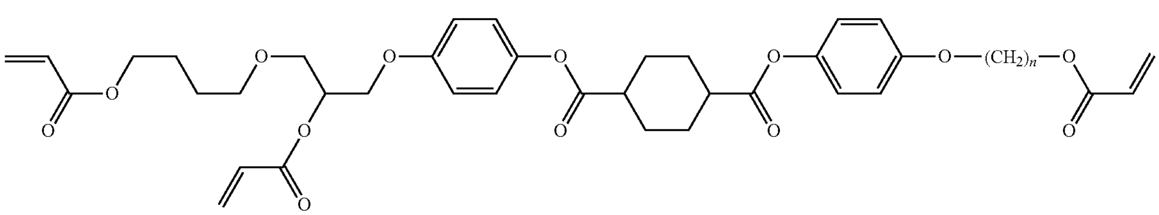
(5-b-9)
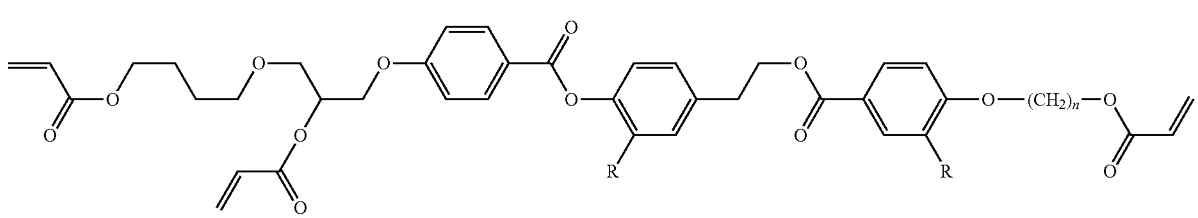
(5-b-10)
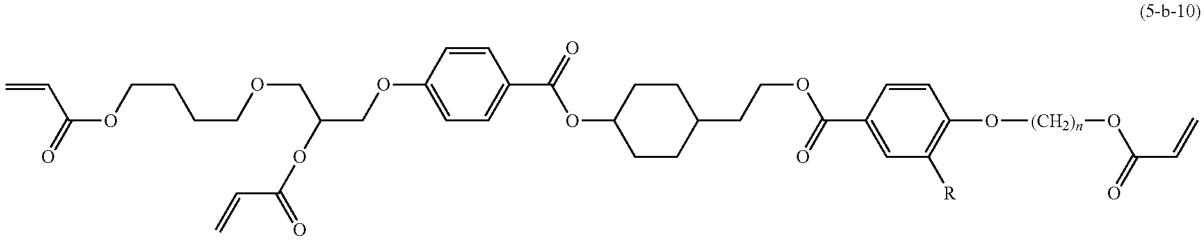

-continued
(5-b-11)
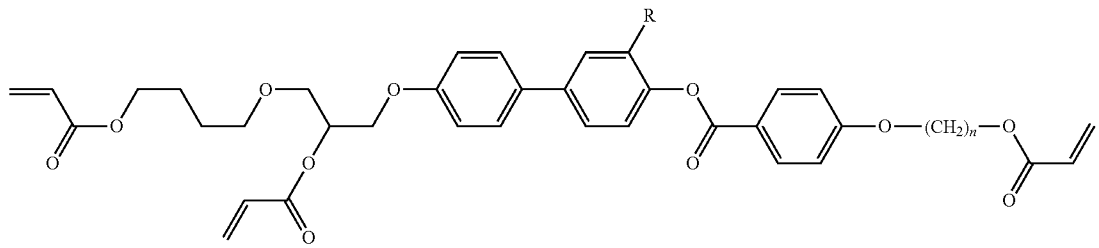
[Chem. 151]
(5-b-12)
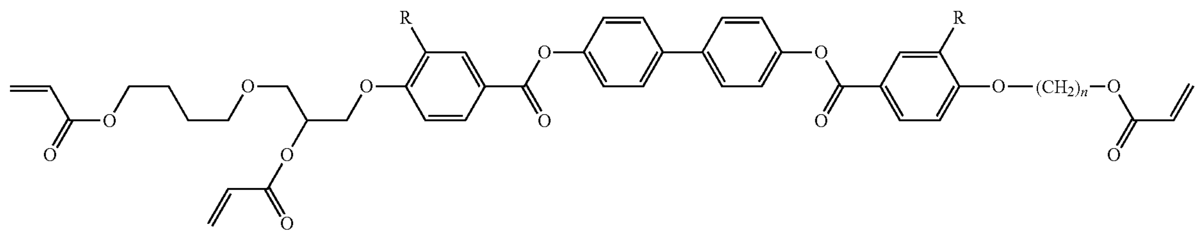
(5-b-13)
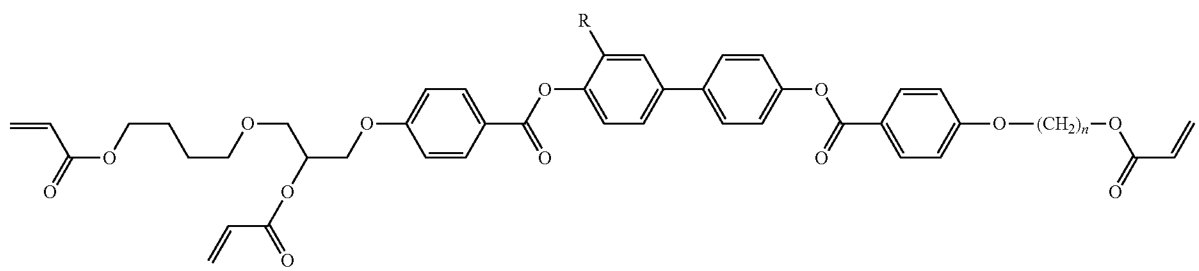
(5-b-14)
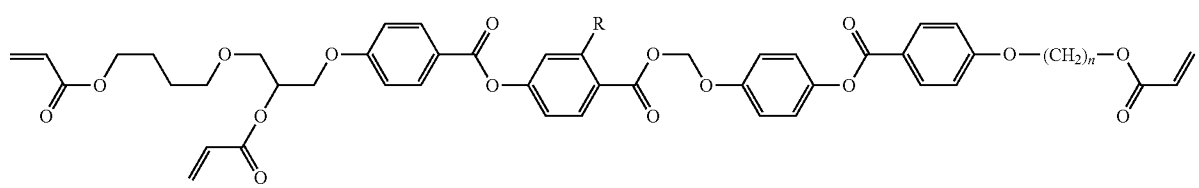
(5-b-15)
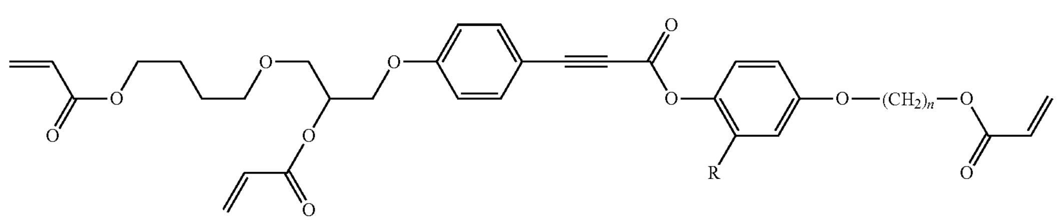
(5-b-16)
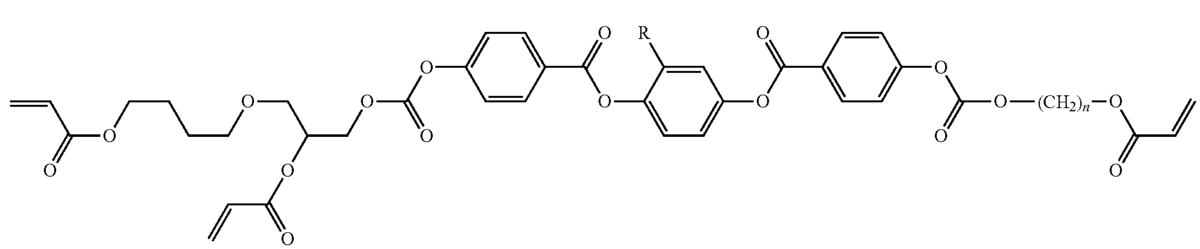

-continued
(5-b-17)
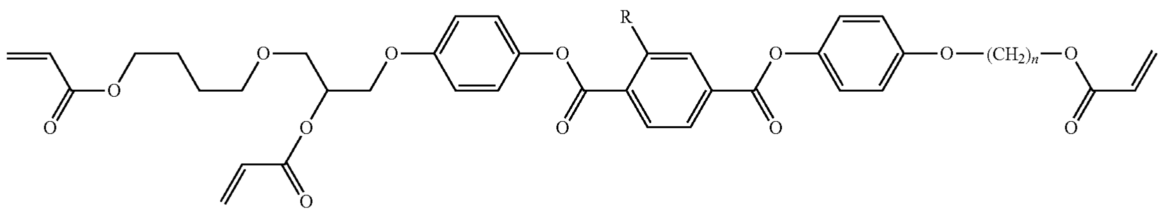
[Chem. 152]
(5-b-18)
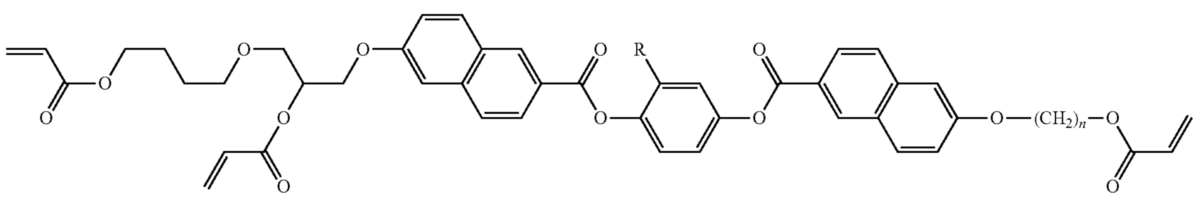
(5-b-19)
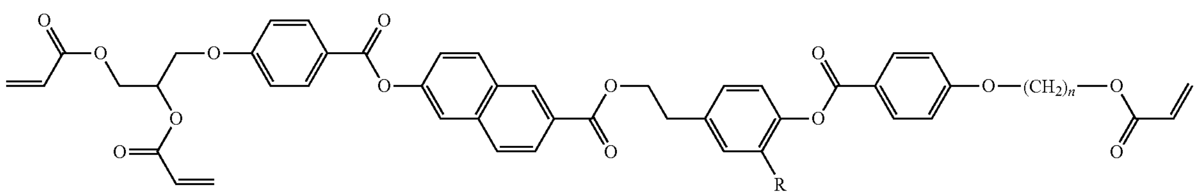
(5-b-20)
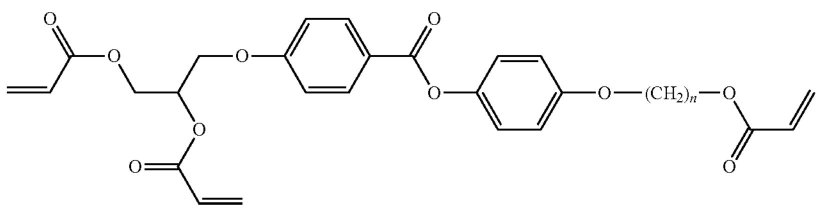
(5-b-21)
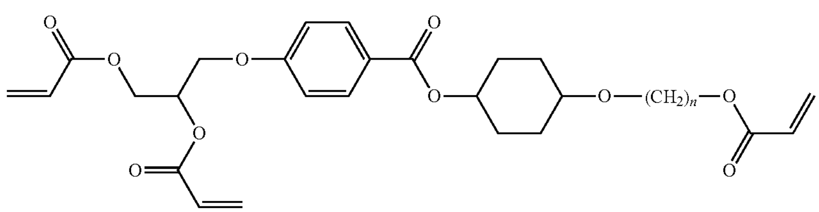
[Chem. 153]
(5-b-22)
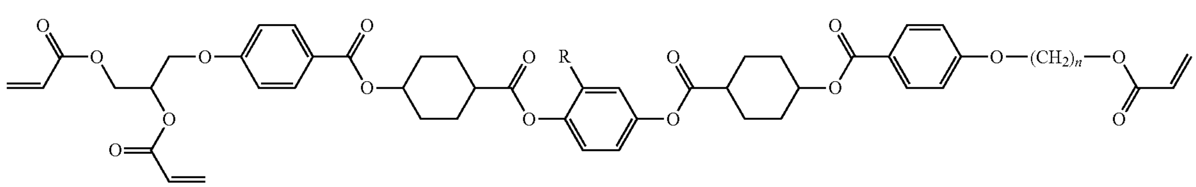
(5-b-23)
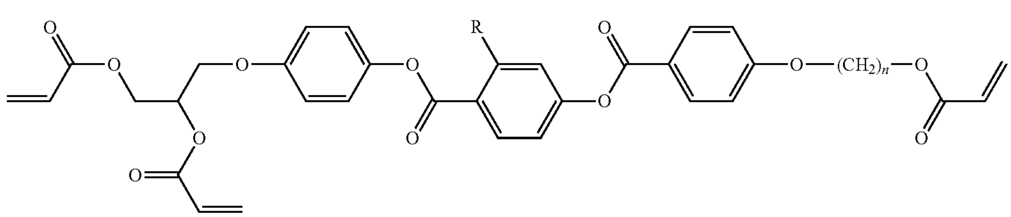

-continued (5-b-24)

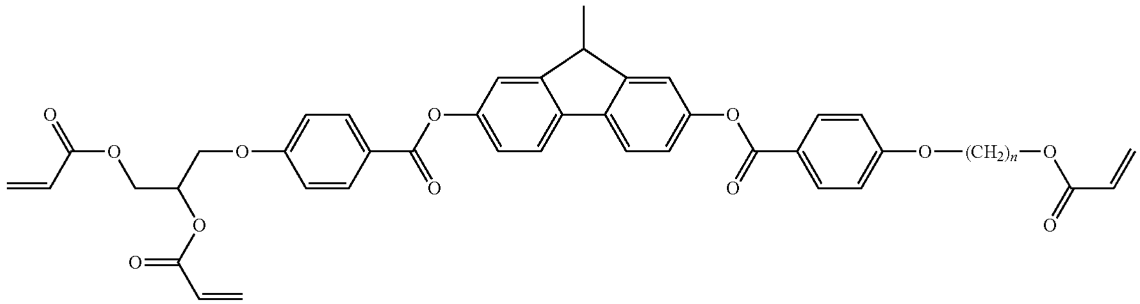

(5-b-25)

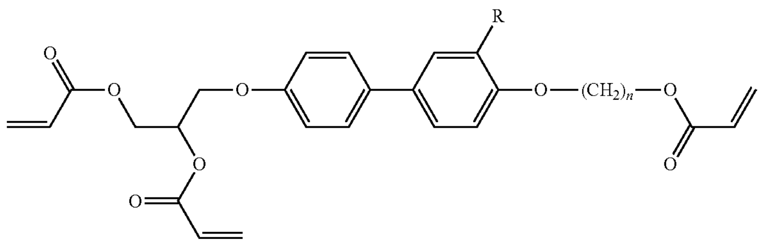

(5-b-26)

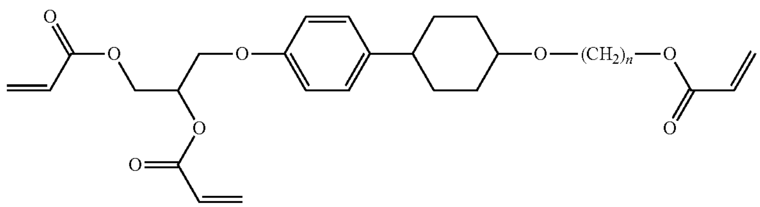

(wherein each n independently represents an integer of 1 to 10. R represents a hydrogen atom, a halogen atom, an alkyl group having 1 to 6 carbon atoms, an alkoxy group having 1 to 6 carbon atoms, or a cyano group. When R is an alkyl group having 1 to 6 carbon atoms or an alkoxy group having 1 to 6 carbon atoms, R may be unsubstituted or substituted by one or at least two halogen atoms). These liquid crystalline compounds may be used alone or may be used as a mixture of two or more.

Specific examples of the compound represented, toy general formula (6-b) include compounds represented by formula (6-b-1) to formula (6-b-23) below:

[Chem. 154]

(6-b-1)

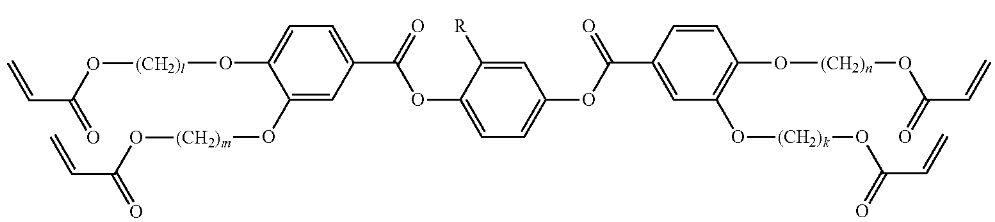

(6-b-2)

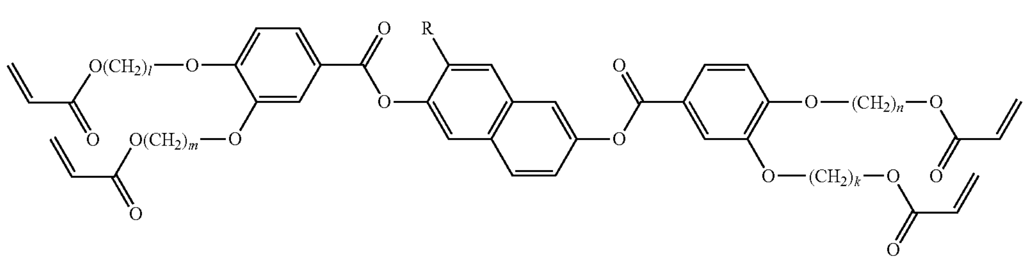

-continued
(6-b-3)
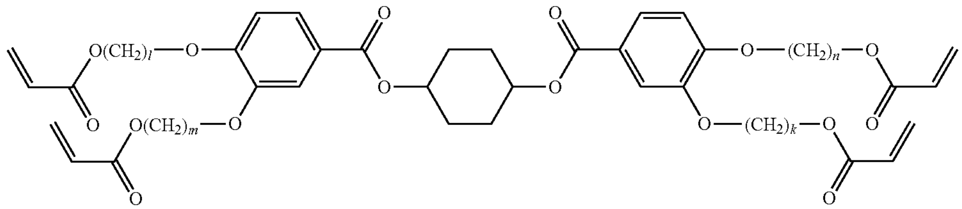
(6-b-4)
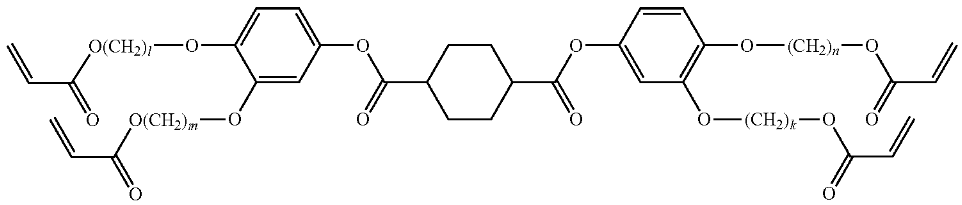
(6-b-5)
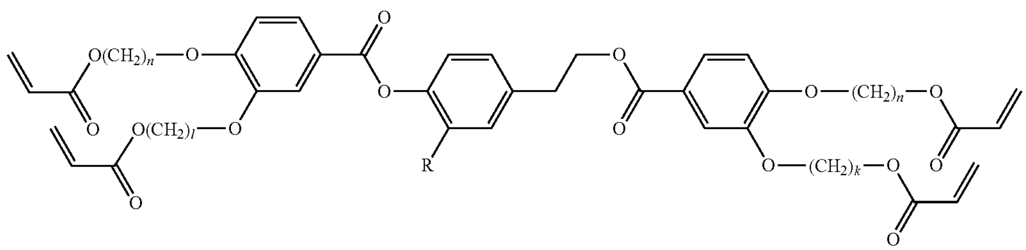
(6-b-6)
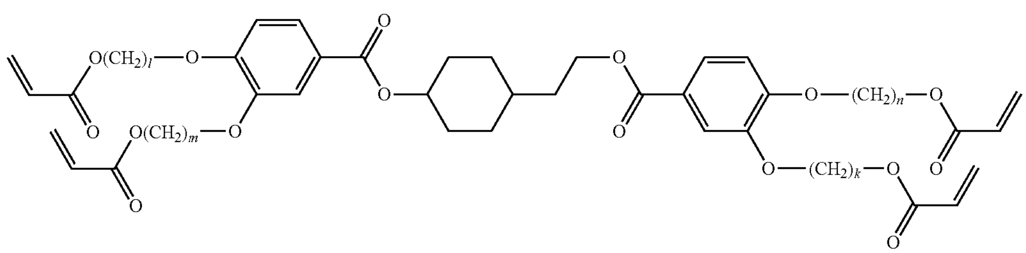
(6-b-7)
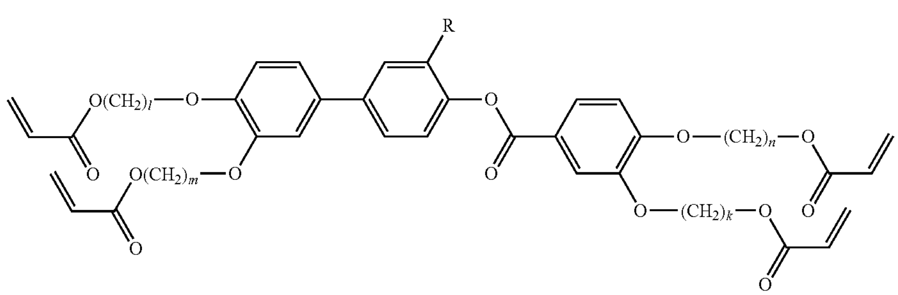
[Chem. 155]
(6-b-8)
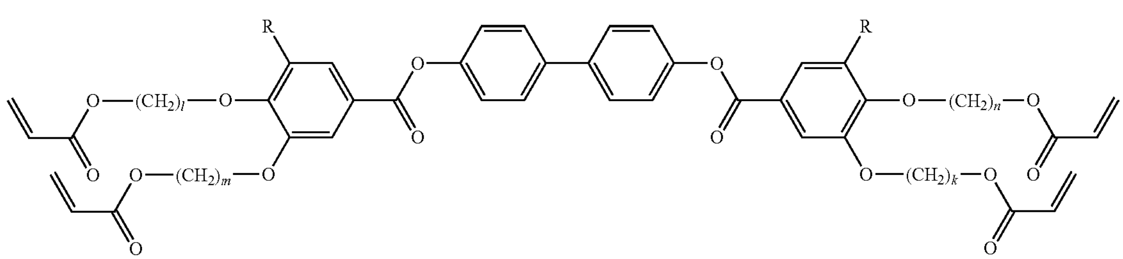

-continued
(6-b-9)
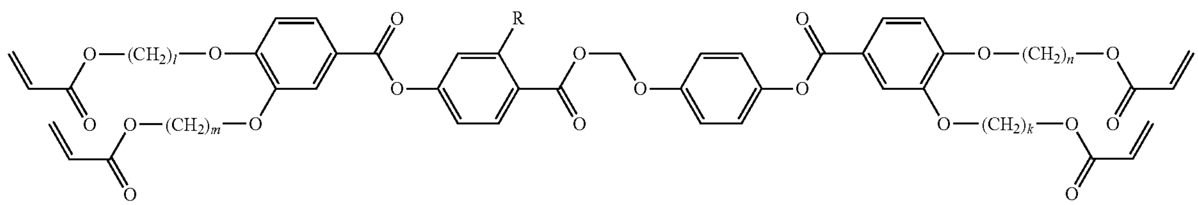
(6-b-10)
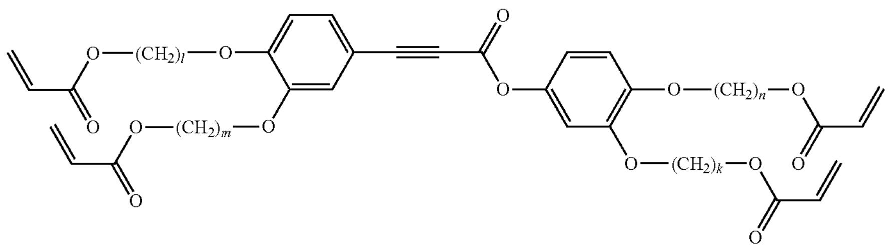
(6-b-11)
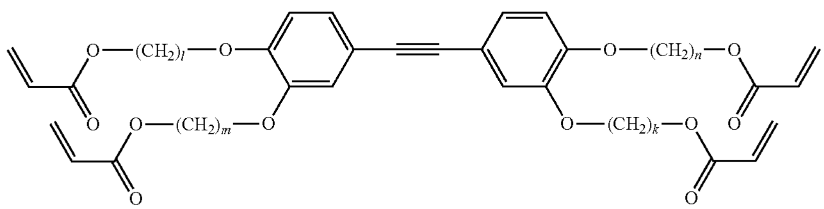
(6-b-12)
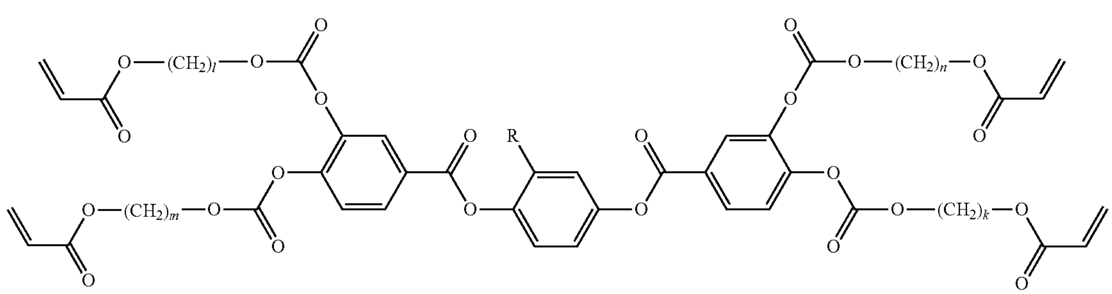
[Chem. 156]
(6-b-13)
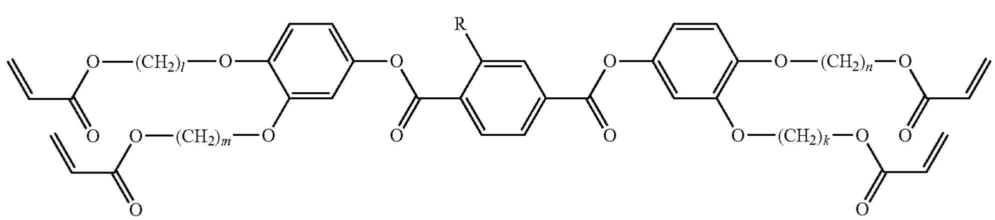
(6-b-14)
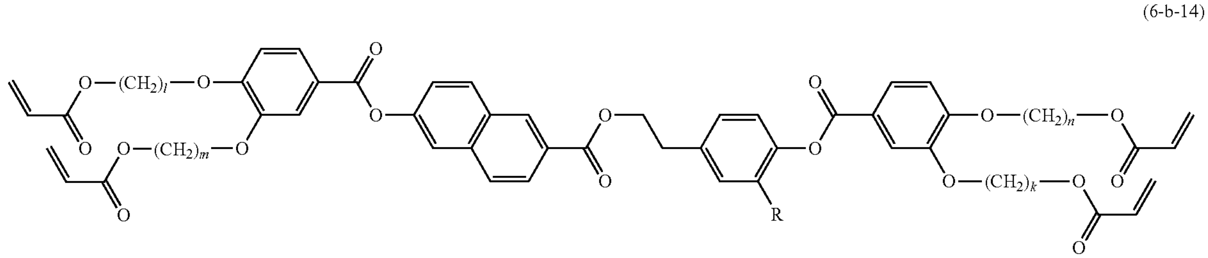

-continued
(6-b-15)
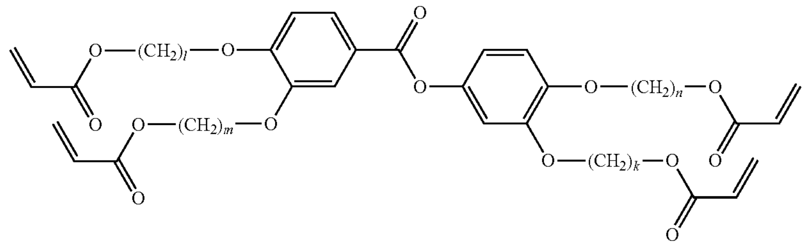
(6-b-16)
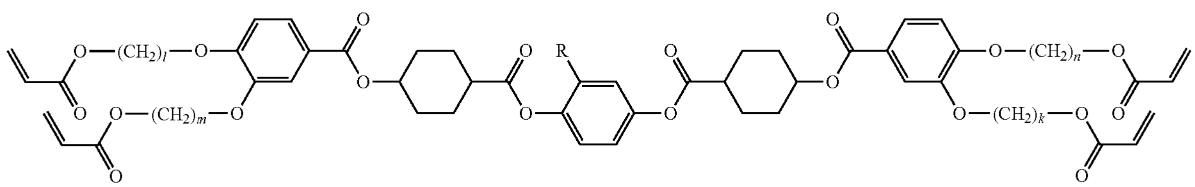
[Chem. 157]
(6-b-17)
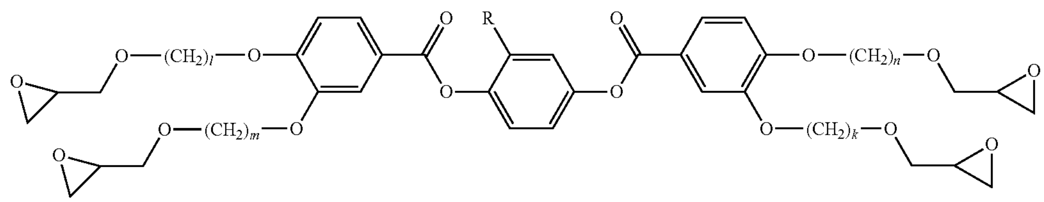
(6-b-18)
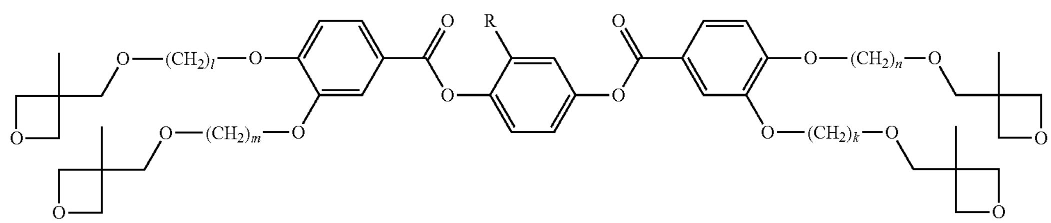
(6-b-19)
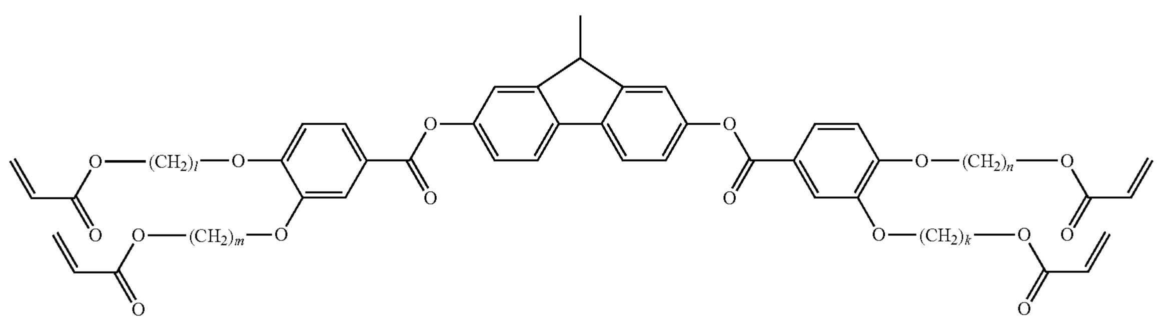
[Chem. 158]
(6-b-20)
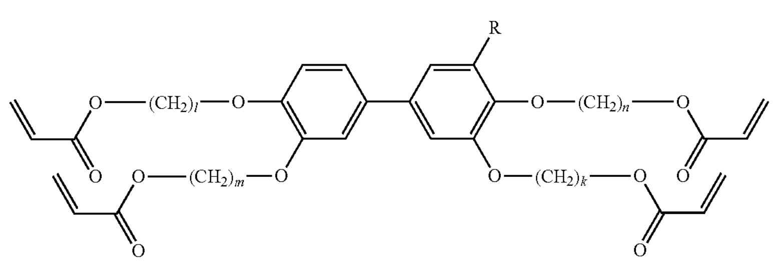

-continued (6-b-21)

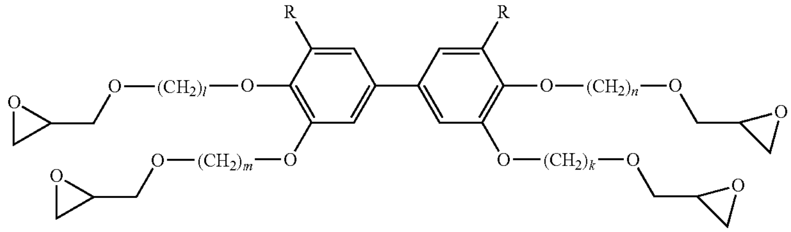

(6-b-22)

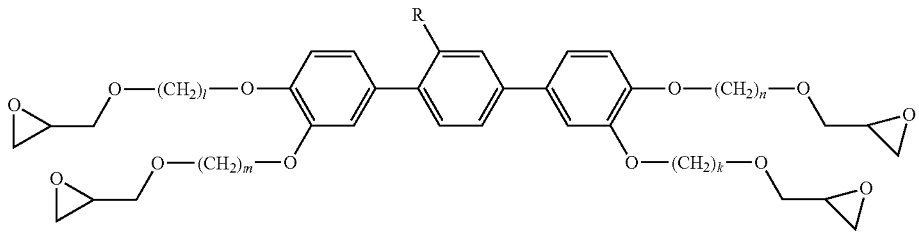

(6-b-23)

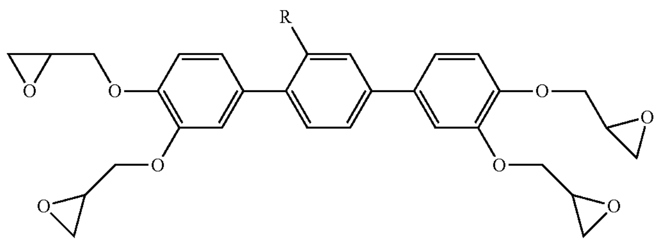

(wherein k, l, m, and n each independently represent an integer of 1 to 10. R represents a hydrogen atom, a halogen atom, an alkyl group having 1 to 6 carbon atoms, an alkoxy group having 1 to 6 carbon atoms, or a cyano group. When R is an alkyl group having 1 to 6 carbon atoms or an alkoxy group having 1 to 6 carbon atoms, R may be unsubstituted or substituted by one or at least two halogen atoms). These liquid crystalline compounds may be used alone or may be used as a mixture of two or more.

Specific examples of the compound represented by general formula (7-b) include compounds represented by formula (7-b-1) to formula (7-b-25) below:

[Chem. 159]

(7-b-1)

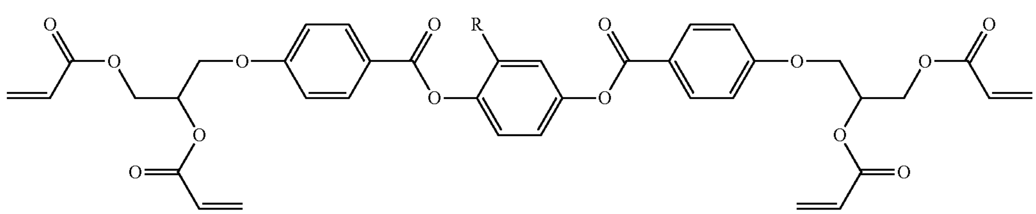

(7-b-2)

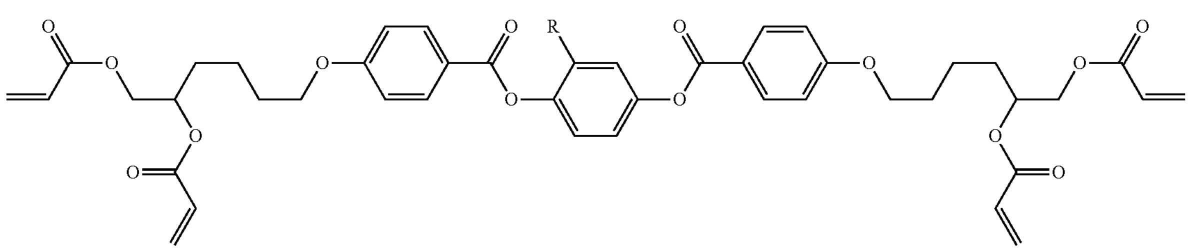

-continued
(7-b-3)
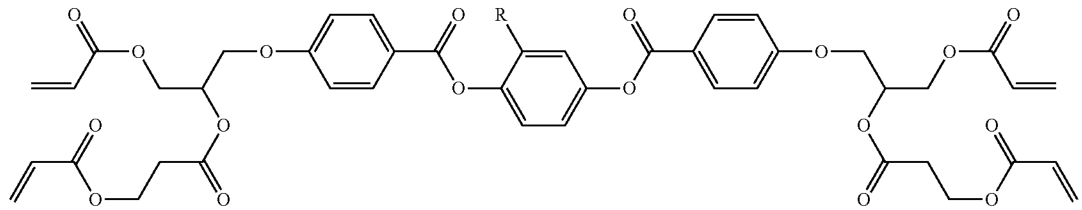
(7-b-4)
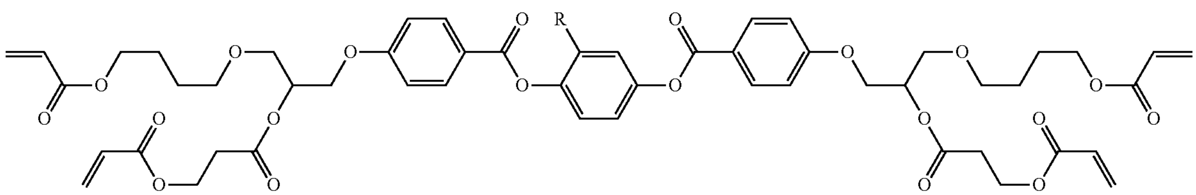
(7-b-5)
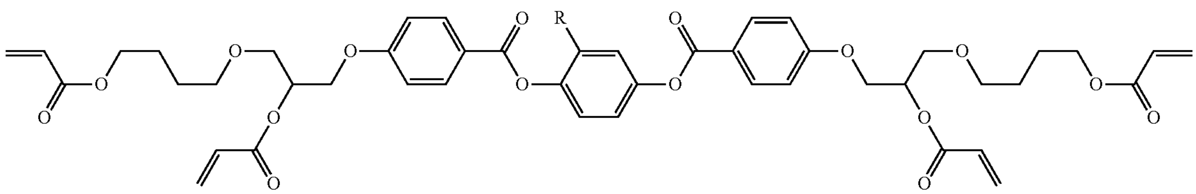
(7-b-6)
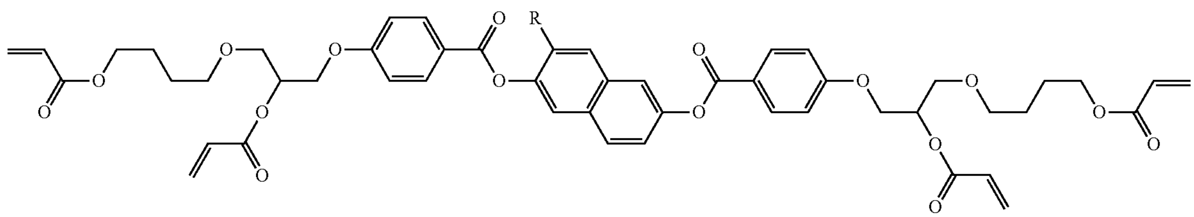
[Chem. 160]
(7-b-7)
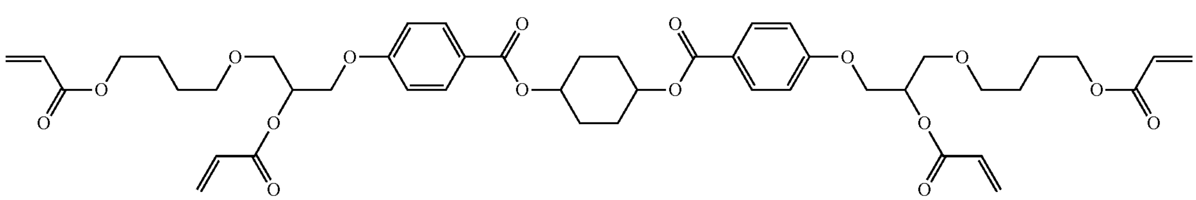
(7-b-8)
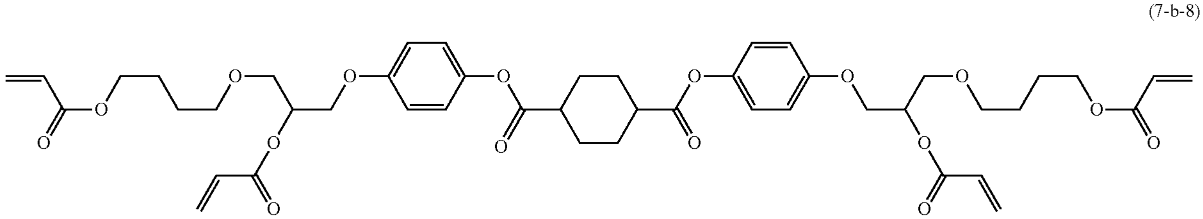
(7-b-9)
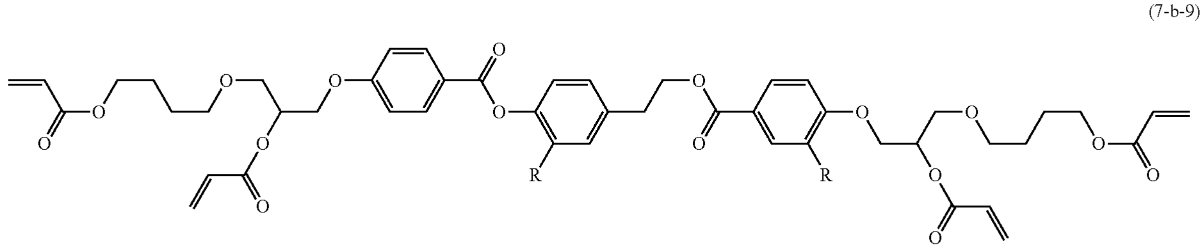

-continued
(7-b-10)
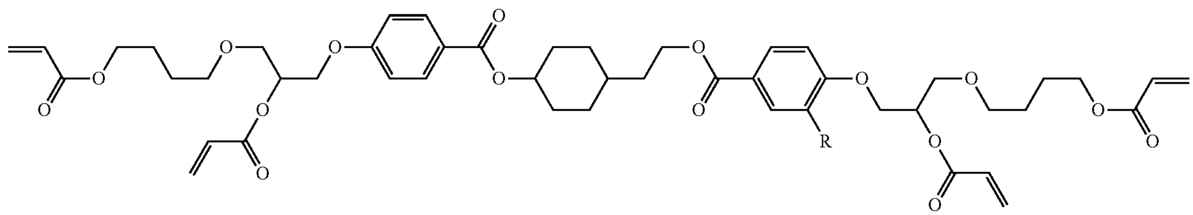
(7-b-11)
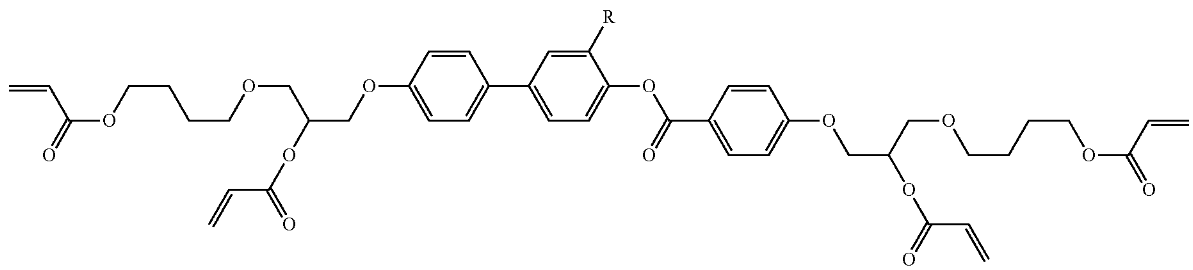
(7-b-12)
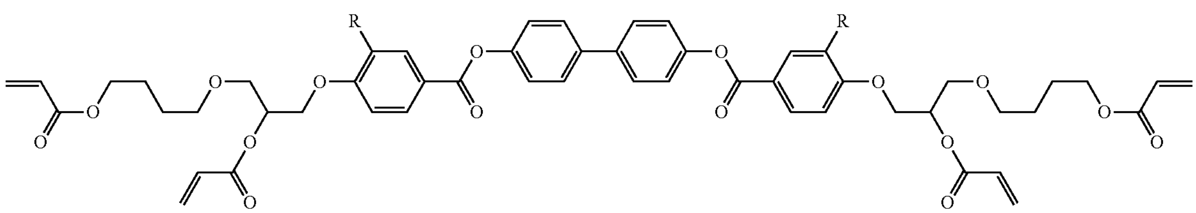
[Chem. 161]
(7-b-13)
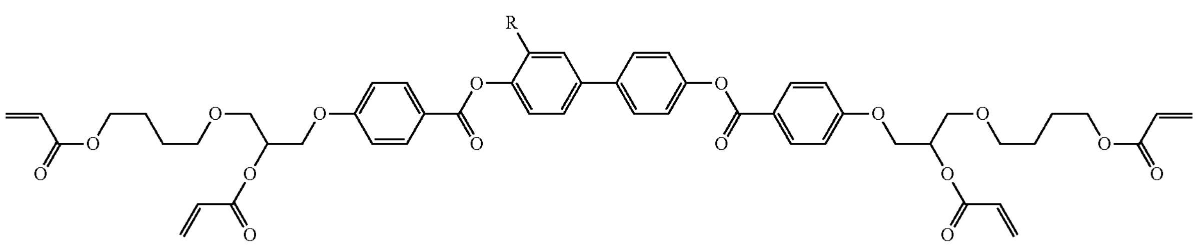
(7-b-14)
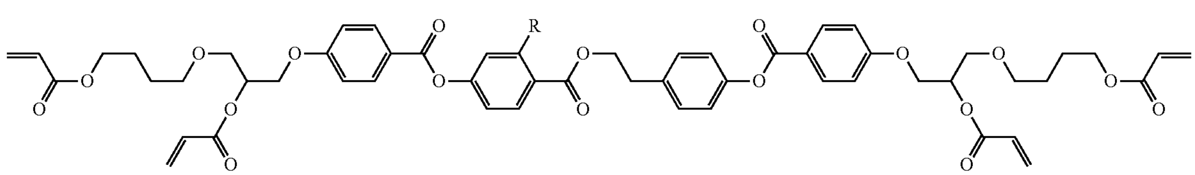
(7--b-15)
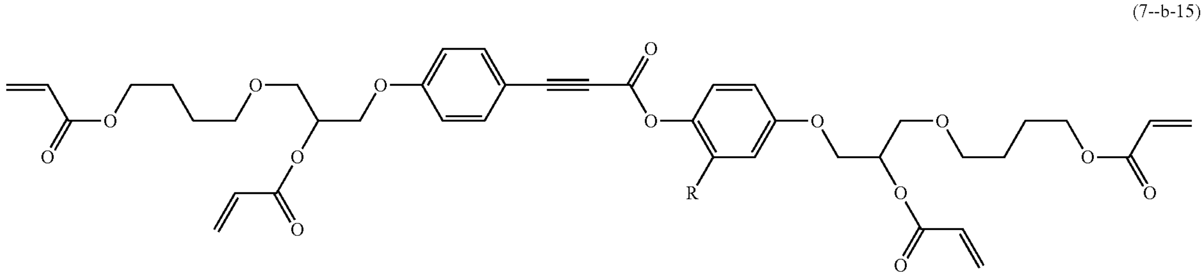

-continued
(7-b-16)
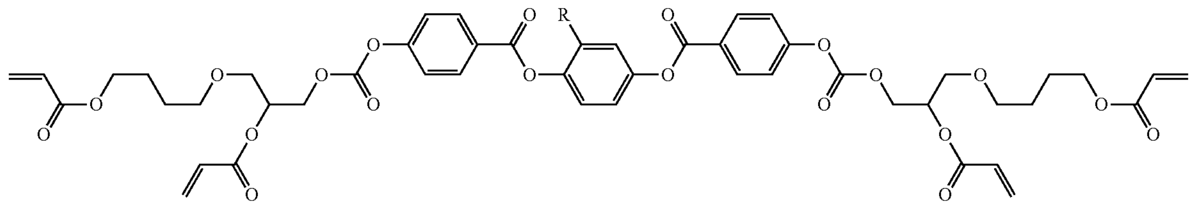
(7-b-17)
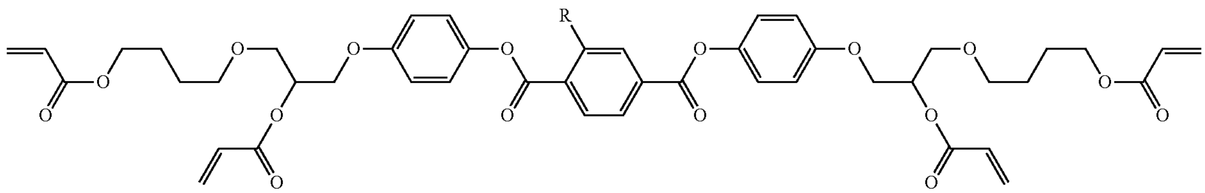
(7-b-18)
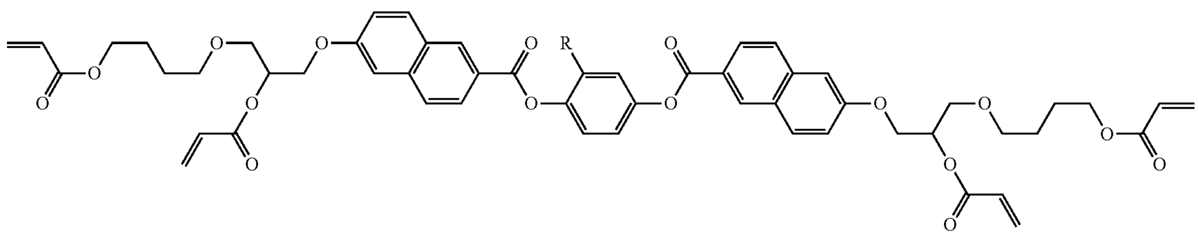
[Chem. 162]
(7-b-19)
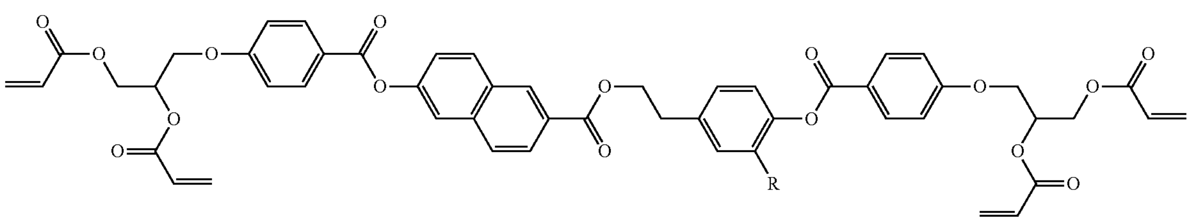
(7-b-20)
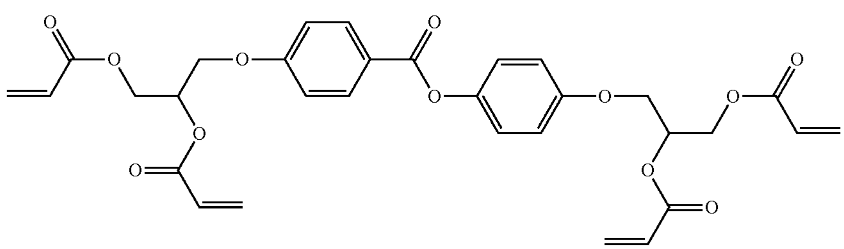
(7-b-21)
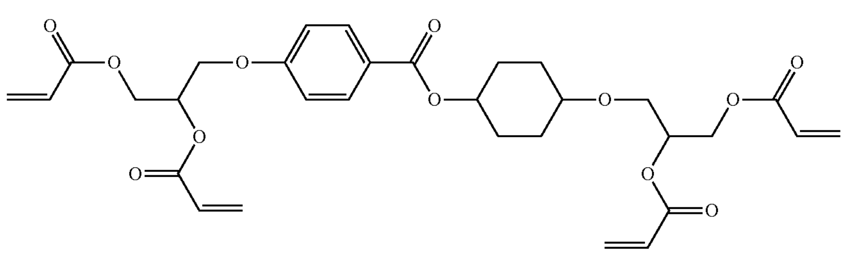

-continued (7-b-22)

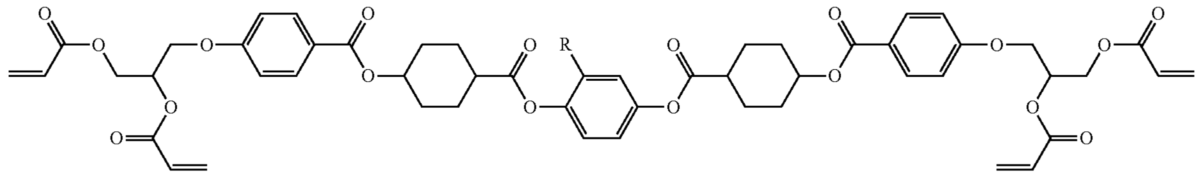

(7-b-23)

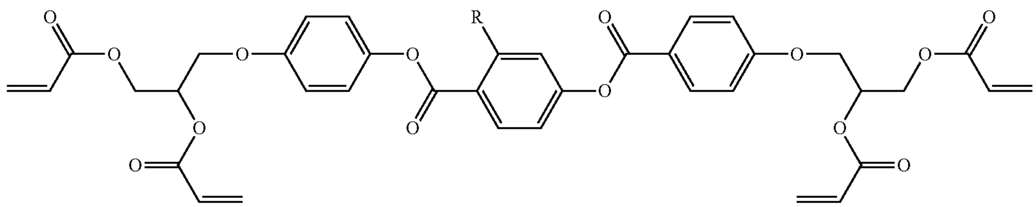

(7-b-24)

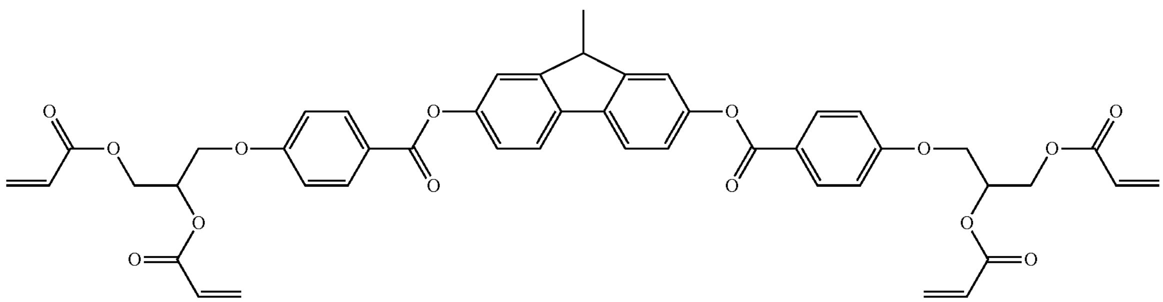

(7-b-25)

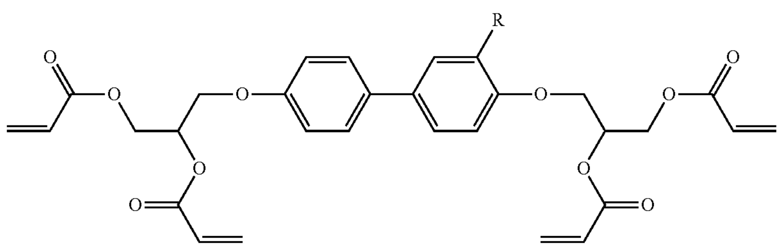

(wherein R represents a hydrogen atom, a halogen atom, an alkyl group having 1 to 6 carbon atoms, an alkoxy group having 1 to 6 carbon atoms, or a cyano group. When R is an alkyl group having 1 to 6 carbon at atoms or an alkoxy group having 1 to 6 carbon atoms, R may be unsubstituted or substituted by one or at least two halogen atoms). These liquid crystalline compounds may be used alone or may be used as a mixture of two or more.

Alignment Material

The polymerizable composition of the present invention may contain an alignment material that improves alignment, for the purpose of improving the alignment. The alignment material used may be any commonly used alignment material so long as it is soluble in a solvent that can dissolve the liquid crystalline compounds having a polymerizable group and used in the polymerizable composition of the present invention. The alignment material may be added in such an amount that the alignment is not significantly impaired. Specifically, the amount of the alignment material is preferably 0.05 to 30% by weight, more preferably 0.5 to 15% by weight, and particularly preferably 1 to 10% by weight with respect to the total weight of the polymerizable compounds contained in the polymerizable composition.

Specific examples of the alignment material include photoisomerizable or photodimerizable compounds such as polyimides, polyamides, BCB (benzocyclobutene polymers), polyvinyl alcohols, polycarbonates, polystyrenes, polyphenylene ethers, polyarylates, polyethylene terephthalates, polyethersulfones, epoxy resins, epoxy acrylate resins, acrylic resins, coumarin compounds, chalcone compounds, cinnamate compounds, fulgide compounds, anthraquinone compounds, azo compounds, and arylethene compounds. Of these, materials aligned by UV irradiation or visible light irradiation (photo-alignment materials) are preferred.

Examples of the photo-alignment material include polyimides having cyclic alkanes, wholly aromatic polyarylates, polyvinyl cinnamate and a polyvinyl ester of p-methoxycinnamic acid shown in Japanese Unexamined Patent Application Publication No. 5-232473, cinnamate derivatives shown in Japanese Unexamined Patent Application Publications Nos. 6-287453 and 6-289374, and maleimide derivatives shown in Japanese Unexamined Patent Application Publication No. 2002-265541. Preferred specific examples include compounds represented by formula (12-1) to formula (12-7) below:

[Chem. 163]

(12-1)

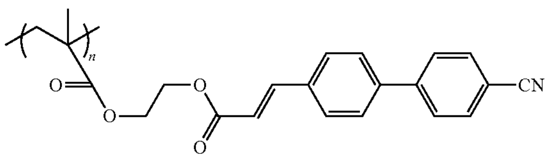

(12-2)

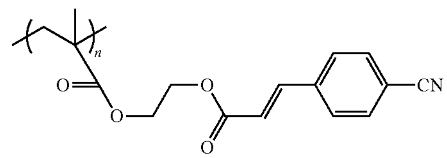

(12-3)

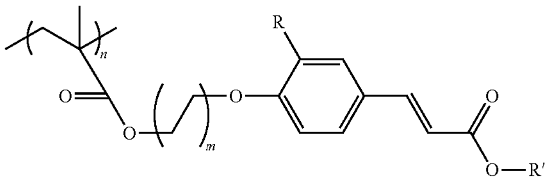

(12-4)

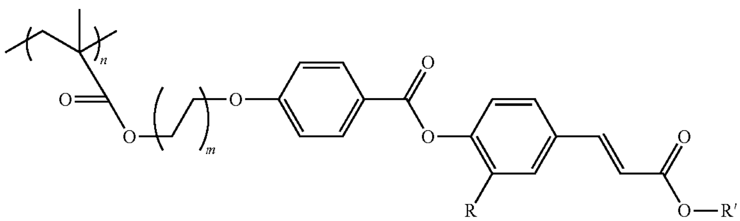

(12-5)

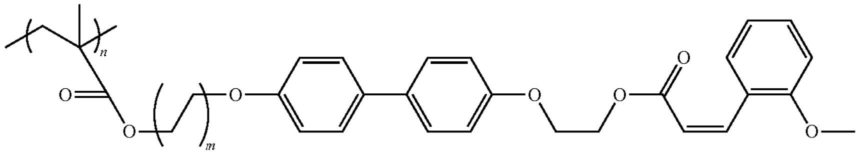

(12-6)

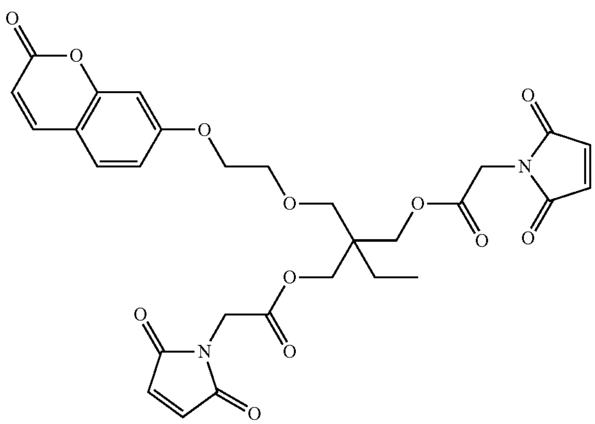

(12-7)

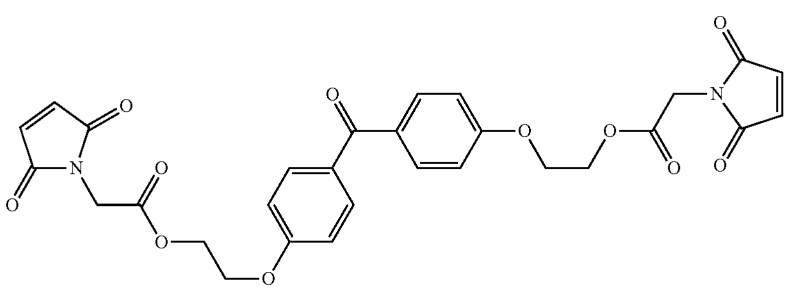

(wherein R represents a hydrogen atom, a halogen atom, an alkyl group having 1 to 3 carbon atoms, an alkoxy group, or a nitro group; R' represents a hydrogen atom or an alkyl group having 1 to 10 carbon atoms, the alkyl group being linear or branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, or —C≡C—; and a terminal $CH_3$ may be replaced by $CF_3$, $CCl_3$, a cyano group, a nitro group, an isocyano group, or a thioisocyano group. n represents 4 to 100,000, and m represents an integer of 1 to 10).

Polymer

The polymer of the present invention is obtained by polymerizing the polymerizable composition of the present invention with the polymerization initiator contained in the polymerizable composition. The polymer of the present invention is used for optically anisotropic bodies, retardation films, lenses, coloring agents, printed materials, etc.

Method for Producing Optically Anisotropic Body

Optically Anisotropic Body

The optically anisotropic body of the present invention is obtained by applying the polymerizable composition of the present invention to a substrate or a substrate having an alignment function, aligning liquid crystal molecules in the polymerizable composition of the present invention uniformly while a nematic phase or a smectic phase is maintained, and then polymerizing the polymerizable composition.

Substrate

No particular limitation is imposed on the substrate used for the optically anisotropic body of the present invention, so long as the substrate is commonly used for liquid crystal display devices, organic light-emitting display devices, other display devices, optical components, coloring agents, markings, printed materials, and optical films and formed of a heat resistant material that can resist heat during drying after application of a solution of the polymerizable composition of the present invention. Examples of such a substrate include glass substrates, metal substrates, ceramic substrates, and organic materials such as plastic substrate and paper. In particular, when the substrate is formed of an organic material, examples of the organic material include cellulose derivatives, polyolefins, polyesters, polyolefins, polycarbonates, polyacrylates, polyarylates, polyethersulfones, polyimides, polyphenylene sulfides, polyphenylene ethers, nylon, and polystyrenes. Of these, plastic substrates such as polyesters, polystyrenes, polyolefins, cellulose derivatives, polyarylates, and polycarbonates are preferred. The shape of the substrate may be a flat plate shape and may also be a shape with a curved surface. If necessary, the substrate may include an electrode layer and have an antireflective function or a reflecting function.

To improve the ease of application of the polymerizable composition of the present invention and to improve its adhesion to the polymer, the substrate may be subjected to surface treatment. Examples of the surface treatment include ozone treatment, plasma treatment, corona treatment, and silane coupling treatment. To control light transmittance and light reflectance, an organic thin film, an inorganic oxide thin film, a metal thin film, etc. may be provided on the surface of the substrate by, for example, vapor deposition. To give optical added value, the substrate may be a pickup lens, a rod lens, an optical disk, a retardation film, a light diffusion film, a color filter, etc. In particular, a pickup lens, a retardation film, a light diffusion film, and a color filter are preferable because of higher added value.

Alignment Treatment

To allow the polymerizable composition of the present invention to be aligned after the polymerizable composition is applied and dried, the substrate has generally been subjected to alignment treatment, or an alignment film may be disposed on the substrate. Examples of the alignment treatment include stretching treatment, rubbing treatment, polarized UV-visible light irradiation treatment, ion beam treatment, and oblique deposition of $SiO_2$ on the substrate. The alignment film used may be a commonly used alignment film. Examples of such an alignment film include: compounds such as polyimides, polysiloxanes, polyamides, polyvinyl alcohols, polycarbonates, polystyrenes, polyphenylene ethers, polyarylates, polyethylene terephthalates, polyethersulfones, epoxy resins, epoxy acrylate resins, acrylic resins, azo compounds, coumarin compounds, chalcone compounds, cinnamate compounds, fulgide compounds, anthraquinone compounds, azo compounds, and arylethene compounds; and polymers and copolymers of these compounds. When rubbing is used for the alignment treatment of a compound, it is preferable that the crystallization of the compound is facilitated by the alignment treatment or a heating process performed after the alignment treatment. When the alignment treatment performed is other than rubbing, the compound used is preferably a photo-alignment material.

Generally, when a liquid crystal composition is brought into contact with a substrate having an alignment function, liquid crystal molecules located near the substrate are aligned in a direction of the alignment treatment performed on the substrate. Whether the liquid crystal molecules are aligned horizontally, inclined, or perpendicularly to the substrate is largely affected by the method of the alignment treatment performed on the substrate. For example, when an alignment film with a very small pretilt angle that is used for in-plane switching (IPS) liquid crystal display devices is disposed on the substrate, a polymerizable liquid crystal layer aligned substantially horizontally is obtained.

When an alignment film used for TN liquid crystal display devices is disposed on the substrate, a polymerizable liquid crystal layer with slightly inclined alignment is obtained. When an alignment film used for STN liquid crystal display devices is used, a polymerizable liquid crystal layer with largely inclined alignment is obtained.

Application

A commonly used coating method may be used to obtain the optically anisotropic body of the present invention, and examples of the coating method include an applicator method, a bar coating method, a spin coating method, a roll coating method, a direct gravure coating method, a reverse gravure coating method, a flexographic coating method, an inkjet method, a die coating method, a cap coating method, a dip coating method, a slit coating method, and a spray coating method. After the polymerizable composition is applied, the composition is dried.

It is preferable that, after the application of the polymerizable composition of the present invention, the liquid crystal molecules in the composition are uniformly aligned while a smectic phase or a nematic phase is maintained. One example of the alignment method is a heat treatment method. Specifically, after the polymerizable composition of the present invention is applied to the substrate, the polymerizable composition is heated to a temperature equal to or higher than the N (nematic phase)-I (isotropic liquid phase) transition temperature (hereinafter abbreviated as the N-I transition temperature) of the liquid crystal composition to bring the liquid crystal composition into the isotropic liquid state. Then, if necessary, the liquid crystal composition is gradually cooled, and the nematic phase thereby appears. In this case, it is preferable that the temperature is temporarily held at the temperature at which the liquid crystal phase appears. This allows liquid crystal phase domains to grow sufficiently, so that a monodomain is formed. Alternatively, after the polymerizable composition of the present invention is applied to the substrate, heat treatment is performed such that the temperature is held constant for a certain time within the temperature range in which the nematic phase of the polymerizable composition of the present invention appears.

If the heating temperature is excessively high, the polymerizable liquid crystal compound may undergo a non-preferable polymerization reaction and thereby deteriorate. If the polymerizable composition is cooled excessively, the polymerizable composition may undergo phase separation. In this case, crystals may precipitate, or a higher-order liquid crystal phase such as a smectic phase may appear, and it may be impossible to complete the alignment treatment.

With the above heat treatment, the optically anisotropic body produced is more uniform and has less alignment defects than optically anisotropic bodies produced by a simple application method.

After the uniform alignment treatment is performed as described above, the polymerizable composition may be cooled to the lowest possible temperature at which the liquid crystal phase does not undergo phase separation, i.e., until the polymerizable composition is supercooled. By polymerizing the polymerizable liquid crystalline compound at this temperature with the liquid crystal phase aligned, an optically anisotropic body with high alignment order and excellent transparency can be obtained.

Polymerization Process

The dried polymerizable composition uniformly aligned is subjected to polymerization treatment generally by irradiation with visible-UV light or heating. Specifically, when light irradiation is used for the polymerization, irradiation with visible-UV light of 420 nm or less is preferable, and irradiation with UV light having a wavelength of 250 to 370 nm is most preferable. If the polymerizable composition is, for example, decomposed under the visible-UV light of 420 nm or less, it is sometimes preferable to perform the polymerization treatment with visible-UV light of 420 nm or more.

Polymerization Method

Examples of the method for polymerizing the polymerizable composition of the present invention include an active energy ray irradiation method and a thermal polymerization method. The active energy ray irradiation method is preferred because the reaction proceeds at room temperature without heating. In particular, a method including irradiation with light such as UV light is preferable because of its simple procedure. The temperature during irradiation is set such that the polymerizable composition of the present invention can maintain its liquid crystal phase. It is preferable, if at all possible, to hold the temperature at 30° C. or lower, in order to avoid induction of thermal polymerization of the polymerizable composition. Generally, in the course of heating, the polymerizable composition is in the liquid crystal phase within the range of from C (solid)-N (nematic) transition temperature (hereinafter abbreviated as the C-N transition temperature) to the N-I transition temperature. However, in the course of cooling, the polymerizable composition is in a thermodynamically non-equilibrium state, and thus the liquid crystal state may be maintained without solidification even at the C-N transition temperature or lower. This state is referred to as a supercooled state. In the present invention, the supercooled state of the liquid crystal composition is also regarded as the state in which the liquid crystal phase is maintained. Specifically, irradiation with UV light of 390 nm or less is preferable, and irradiation with light having a wavelength of 250 to 370 nm is most preferable. However, if the polymerizable composition is, for example, decomposed under UV light of 390 nm or less, it is sometimes preferable to perform the polymerization treatment with UV light of 390 nm or more. Preferably, the light used is diffused light and is unpolarized light. The irradiation intensity of the UV light is preferably within the range of 0.05 $kW/m^2$ to 10 $kW/m^2$. The irradiation intensity of the UV light is particularly preferably within the range of 0.2 $kW/m^2$ to 2 $kW/m^2$. If the intensity of the UV light is less than 0.05 $kW/m^2$, a considerable time is required to complete the polymerization. If the intensity exceeds 2 $kW/m^2$, the liquid crystal molecules in the polymerizable composition tend to undergo photo-decomposition, and a large amount of polymerization heat is generated. In this case, the temperature during polymerization increases, and the order parameter of the polymerizable liquid crystal varies, so that the retardation of the film after polymerization may deviate from the intended retardation.

An optically anisotropic body having a plurality of regions with different alignment directions may be obtained by polymerizing only specific portions under UV irradiation using a mask, changing the alignment state of the unpolymerized portions by application of an electric field, a magnetic field, temperature, etc., and then polymerizing the unpolymerized portions.

When only the specific portions are polymerized under UV irradiation using the mask, an electric field, a magnetic field, temperature, etc. may be applied in advance to the unpolymerized polymerizable composition to control alignment, and the polymerizable composition in this state may be irradiated with light through the mask to polymerize the polymerizable composition. An optically anisotropic body having a plurality of regions with different alignment directions may also be obtained in the manner described above.

The optically anisotropic body obtained by polymerization of the polymerizable composition of the present invention may be separated from the substrate, and the separated optically anisotropic body may be used alone. The optically anisotropic body may not be separated from the substrate, and the optically anisotropic body with the substrate may be used. In particular, since the optically anisotropic body is unlikely to contaminate other members, the optically anisotropic body is useful for a substrate for deposition and is also useful when another substrate is laminated onto the optically anisotropic body.

Retardation Film

The retardation film of the present invention includes the optically anisotropic body described above. The liquid crystalline compound forms a continuous uniform alignment state on the substrate, and the retardation film has in-plane or out-of-plane (with respect to the substrate) biaxiality or both in-plane biaxiality and out-of-plane biaxiality or has in-plane biaxiality. An adhesive or an adhesive layer, a bonding agent or a bonding layer, a protective film, a polarizing film, etc. may be stacked.

Examples of the alignment mode applicable to the above retardation film include a positive-A plate in which a rod-shaped liquid crystalline compound is aligned substantially horizontally with respect to substrates, a negative A-plate in which a uniaxially arranged disk-shaped liquid crystalline compound is aligned vertically to substrates, a positive C-plate in which a rod-shaped liquid crystalline compound is aligned substantially vertically to substrates, a negative C-plate in which a rod-shaped liquid crystalline compound is aligned in cholesteric alignment with respect to substrates or a uniaxially arranged disk-shaped liquid crystalline compound is aligned horizontally to substrates, a biaxial plate, a positive O-plate in which a rod-shaped liquid crystalline compound is aligned in hybrid alignment with respect to substrates, and a negative O-plate in which a disk-shaped liquid crystalline compound is aligned in hybrid alignment with respect to substrates. When the retardation film is used for a liquid crystal display device, no particular limitation is imposed on the alignment mode so long as viewing angle dependence is improved, and any of various modes can be applied.

For example, the alignment mode applied may be the positive A-plate, the negative A-plate, the positive C-plate, the negative C-plate, the biaxial plate, the positive O-plate, or the negative O-plate. Of these, the positive A-plate and the negative C-plate are preferably used. It is more preferable to stack the positive A-plate and the negative C-plate.

The positive A-plate means an optically anisotropic body in which a polymerizable composition is homogeneously aligned. The negative C-plate means an optically anisotropic body in which a polymerizable composition is aligned in cholesteric alignment.

In a liquid crystal cell using a retardation film, it is preferable to use a positive A-plate as a first retardation layer, in order to compensate for viewing angle dependence of polarizing axis orthogonality to thereby increase the viewing angle. In the positive A-plate, the relation "nx>ny=nz" holds, where nx is the refractive index in the direction of an in-plane slow axis of the film, ny is the refractive index in the direction of an in-plane fast axis of the film, and nz is the refractive index in the direction of the thickness of the film. Preferably, the in-plane retardation value of the positive A-plate at a wavelength of 550 nm is within the range of 30 to 500 nm. No particular limitation is imposed on the retardation value in the thickness direction. Preferably, an Nz coefficient is within the range of 0.9 to 1.1.

To eliminate the birefringence of the liquid crystal molecules themselves, it is preferable to use, as a second retardation layer, a so-called negative C-plate having negative refractive index anisotropy. The negative C-plate may be stacked on the positive A-plate.

The negative C-plate is a retardation layer satisfying the relation "nx=ny>nz," where nx is the refractive index of the retardation layer in the direction of its in-plane slow axis, ny is the refractive index of the retardation layer in the direction of its in-plane fast axis, and nz is the refractive index of the retardation layer in its thickness direction. Preferably, the retardation value of the negative C-plate in the direction of its thickness is within the range of 20 to 400 nm.

The refractive index anisotropy in the thickness direction is represented by a retardation value Rth in the thickness direction represented by formula (2) below. The retardation value Rth in the thickness direction can be computed as follows. nx, ny, and nz are determined by numerical computation from formulas (1) and (4) to (7) using an in-plane retardation value $R_0$, a retardation value $R_{50}$ measured at an inclination of 50° with the slow axis serving as an inclination axis, the thickness d of the film, and the average refractive index $n_0$ of the film. Then the nx, ny, and nz determined are substituted into formula (2). The Nz coefficient can be computed from formula (3). The same applies to the rest of the present description.

$$R_0=(nx-ny)\times d \quad (1)$$

$$R_{th}=[(nx+ny)/2-nz]\times d \quad (2)$$

$$Nz\ \text{coefficient}=(nx-nz)/(nx-ny) \quad (3)$$

$$R_{50}=(nx-ny')\times d/\cos(\phi) \quad (4)$$

$$(nx+ny+nz)/3=n_0 \quad (5)$$

Here, $$\phi=\sin^{-1}[\sin(50°)/n_0] \quad (6)$$

$$ny'=ny\times nz/[ny^2\times\sin^2(\phi)+nz^2\times\cos^2(\phi)]^{1/2} \quad (7)$$

In many commercial retardation measurement devices, the above numerical computation is performed automatically in the devices, and the in-plane retardation value $R_0$, the retardation value Rth in the thickness direction, etc. are automatically displayed. Examples of such a measurement device include RETS-100 (manufactured by Otsuka Chemical Co., Ltd.).

Lens

The polymerizable composition of the present invention can be used for the lens of the present invention. Specifically, the polymerizable composition is applied to a substrate or a substrate having the alignment function or injected into a lens-shaped die, aligned uniformly while the nematic phase or the smectic phase is maintained, and then polymerized. Examples of the shape of the lens include simple cell shapes, prism shapes, and lenticular shapes.

Liquid Crystal Display Device

The polymerizable composition of the present invention can be used for the liquid crystal display device of the present invention. Specifically, the polymerizable composition is applied to a substrate or a substrate having the alignment function, aligned uniformly while the nematic phase or the smectic phase is maintained, and then polymerized. The polymerizable composition may be used in the form of, for example, an optical compensation film, a patterned retardation film for liquid crystal stereoscopic display devices, a retardation correction layer for color filters, an overcoat layer, or an alignment film for liquid crystal mediums. In a liquid crystal display device, at least a liquid crystal medium layer, a TFT driving circuit, a black matrix layer, a color filter layer, a spacer, and an electrode circuit suitable for the liquid crystal medium layer are held between at least two substrates. An optical compensation layer, a polarizing plate layer, and a touch panel layer are generally disposed outside the two substrates. However, the optical compensation layer, an overcoat layer, the polarizing plate layer, and an electrode layer for the touch panel may be held between the two substrates.

Examples of the alignment mode of the liquid crystal display device include a TN mode, a VA mode, an IPS mode, an FFS mode, and an OCB mode. When the polymerizable composition is used for an optical compensation film or an optical compensation layer, a film having a retardation suitable for the alignment mode can be produced. When the polymerizable composition is used for a patterned retardation film, it is only necessary that the liquid crystalline compound in the polymerizable composition be aligned substantially horizontally to the substrate. When the polymerizable composition is used for an overcoat layer, it is only necessary that a liquid crystalline compound having a larger number of polymerizable groups per molecule be thermally polymerized. When the polymerizable composition is used for an alignment film for liquid crystal mediums, it is preferable to use a polymerizable composition prepared by mixing an alignment material and a liquid crystalline compound having a polymerizable group. The polymerizable composition may be mixed into a liquid crystal medium, and the effect of improving various properties such as response speed, contrast, etc. is obtained by controlling the ratio of the liquid crystal medium and the liquid crystalline compound.

Organic Light-Emitting Display Device

The polymerizable composition of the present invention can be used for an organic light-emitting display device. Specifically, the polymerizable composition is applied to a substrate or a substrate having the alignment function, aligned uniformly while the nematic phase or the smectic phase is maintained, and then polymerized. The retardation film obtained by the polymerization may be combined with a polarizing plate and used in the form of an antireflective film of the organic light-emitting display device. When the polymerizable composition is used for the antireflective film, it is preferable that the angle between the polarizing axis of the polarizing plate and the slow axis of the retardation film is about 45°. The polarizing plate and the retardation film may be laminated with an adhesive, a bonding agent, etc. The polymerizable composition may be directly deposited on a polarizing plate subjected to rubbing treatment or alignment treatment using a photo-alignment film stacked on the polarizing plate. The polarizing plate used in this case may be a film-shaped polarizing plate doped with a pigment or a metallic polarizing plate such as a wire grid.

Lighting Device

A polymer obtained by aligning the polymerizable composition of the present invention having the nematic phase or the smectic phase on a substrate having the alignment function and then polymerizing the polymerizable composition can be used as a heat dissipation material for lighting devices, particularly light-emitting diode devices. The heat dissipation material is preferably in the form of a prepreg, a polymer sheet, an adhesive, a sheet with a metallic foil, etc.

Optical Component

The polymerizable composition of the present invention can be used for the optical component of the present invention. Specifically, the polymerizable composition is polymerized while the nematic phase or the smectic phase is maintained, or the polymerizable composition combined with an alignment material is polymerized.

Coloring Agent

By adding a coloring agent such as a dye or an organic pigment to the polymerizable composition of the present invention, the resulting polymerizable composition can be used as a coloring agent.

Polarizing Film

By combining the polymerizable composition of the present invention with a dichroic pigment, a lyotropic liquid crystal, a chromonic liquid crystal, etc. or adding the polymerizable composition thereto, the resulting polymerizable composition can be used for a polarizing film.

EXAMPLES

The present invention will next be described by way of Examples and Comparative Examples. However, the present invention is not limited thereto. "Parts" and "%" are based on mass, unless otherwise specified.

Example 1

55 Parts of the compound represented by formula (1-a-5), 25 parts of the compound represented by formula (1-a-6), 20 parts of the compound represented by formula (2-a-1) with n=6, and 0.1 parts of p-methoxyphenol (MEHQ) were added to 400 parts of cyclopentanone (CPN), heated to 60° C., and stirred to dissolve. After dissolution was complete, the mixture was returned to room temperature. Then 3 parts of IRGACURE 907 (Irg 907: manufactured by BASF Japan Ltd.) and 0.15 parts of the surfactant represented by formula (H-1) were added, and the resulting mixture was further stirred to thereby obtain a solution. The solution was clear and uniform. The solution obtained was filtered through a 0.20 μm membrane filter to thereby obtain a polymerizable composition (1) in Example 1.

Examples 2 to 34 and Comparative Examples 1 to 3

Polymerizable compositions (2) to (34) in Examples 2 to 34 and polymerizable compositions (C1) to (C3) in Comparative Examples 1 to 3 were obtained under the same conditions as in the preparation of the polymerizable composition (1) in Example 1 except that ratios of compounds shown in tables below were changed as shown in the tables.

Example 35

100 Parts of the compound represented by formula (2-a-31) with n=6 and 0.1 parts of p-methoxyphenol (MEHQ) were added to 400 parts of chloroform (CLF), heated to 50° C., and stirred to dissolve. After dissolution was complete, the mixture was returned to room temperature. Then 3 parts of IRGACURE 907 (Irg 907: manufactured by BASF Japan Ltd.) and 0.15 parts of the surfactant represented by formula (H-1) were added, and the resulting mixture was further stirred to thereby obtain a solution. The solution was clear and uniform. The solution obtained was filtered through a 0.20 μm membrane filter to thereby obtain a polymerizable composition (35) in Example 35

Example 36

100 Parts of the compound represented by formula (2-a-40) with n=6 and 0.1 parts of p-methoxyphenol (MEHQ) were added to 400 parts of 1,1,2-trichloroethane (TCE), heated to 50° C., and stirred to dissolve. After dissolution was complete, the mixture was returned to room temperature. Then 3 parts of IRGACURE 907 (Irg 907: manufactured by BASF Japan Ltd.) and 0.15 parts of the surfactant represented by formula (H-1) were added, and the resulting mixture was further stirred to thereby obtain a solution. The solution was clear and uniform. The solution obtained was filtered through a 0.20 μm membrane filter to thereby obtain a polymerizable composition (36) in Example 36.

Specific compositions of the polymerizable compositions (1) to (36) in Examples 1 to 36 of the present invention and the polymerizable compositions (C1) to (C3) in Comparative Examples 1 to 3 are shown in tables below.

TABLE 1

| | Polymerizable composition | | | | | | |
|---|---|---|---|---|---|---|---|
| | (1) | (2) | (3) | (4) | (5) | (6) | (7) |
| 1-a-5 | 55 | 55 | 55 | 55 | 55 | 55 | 55 |
| 1-a-6 | 25 | 25 | 25 | 25 | 25 | 25 | 25 |
| 2-a-1 (n = 6) | 20 | 20 | 20 | 20 | 20 | | |
| 2-a-1 (n = 3) | | | | | | 20 | 20 |
| Irg 907 | 3 | 3 | 3 | 3 | 3 | 3 | 3 |
| MEHQ | 0.1 | 0.1 | 0.1 | 0.1 | 0.1 | 0.1 | 0.1 |
| H-1 | 0.10 | 0.15 | 0.20 | | | 0.10 | 0.15 |
| H-2 | | | | 0.15 | | | |
| H-3 | | | | | 0.15 | | |
| CPN | 400 | 400 | 400 | 400 | 400 | 400 | 400 |

TABLE 2

| | Polymerizable composition | | | | | | |
|---|---|---|---|---|---|---|---|
| | (8) | (9) | (10) | (11) | (12) | (13) | (14) |
| 1-a-5 | 55 | 55 | 55 | 55 | 55 | 55 | 55 |
| 1-a-6 | 25 | 25 | 25 | 25 | 25 | 25 | 25 |
| 2-a-1 (n = 6) | | | | 10 | 10 | 10 | 10 |
| 2-a-1 (n = 3) | 20 | 20 | 20 | 10 | 10 | 10 | 10 |
| Irg 907 | 3 | 3 | 3 | 3 | 3 | 3 | 3 |
| MEHQ | 0.1 | 0.1 | 0.1 | 0.1 | 0.1 | 0.1 | 0.1 |
| H-1 | 0.20 | | | 0.10 | 0.15 | 0.20 | |
| H-2 | | 0.15 | | | | | 0.15 |
| H-3 | | | 0.15 | | | | |
| CPN | 400 | 400 | 400 | 400 | 400 | 400 | 400 |

TABLE 3

| | Polymerizable composition | | | | | | |
|---|---|---|---|---|---|---|---|
| | (15) | (16) | (17) | (18) | (19) | (20) | (21) |
| 1-a-5 | 55 | 80 | 80 | 55 | 55 | | |
| 1-a-6 | 25 | | | 25 | 25 | 50 | 50 |
| 1-a-2 | | | | | | 20 | 20 |
| 2-a-1 (n = 6) | 10 | | | | | 15 | 15 |
| 2-a-1 (n = 3) | 10 | | | | | | |
| 2-a-31 (n = 6) | | | | 10 | 10 | | |
| 2-a-42 (n = 6) | | | | 10 | 10 | 15 | 15 |
| 2-b-1 (m = n = 3) | | 10 | 10 | | | | |
| 2-b-1 (m = n = 4) | | 10 | 10 | | | | |
| Irg 907 | 3 | 3 | 3 | 3 | 3 | 3 | 3 |
| MEHQ | 0.1 | 0.1 | 0.1 | 0.1 | 0.1 | 0.1 | 0.1 |
| H-1 | | 0.15 | | 0.15 | | 0.15 | |
| H-3 | 0.15 | | 0.15 | | 0.15 | | 0.15 |
| CPN | 400 | 400 | 400 | 400 | 400 | 400 | 400 |

TABLE 4

| | Polymerizable composition | | | | | | | |
|---|---|---|---|---|---|---|---|---|
| | (21) | (22) | (23) | (24) | (25) | (26) | (27) | (28) |
| 1-a-5 | | | | | | | | 30 |
| 1-a-6 | 50 | 55 | 55 | 55 | 55 | 55 | 55 | 40 |
| 1-a-1 | | 25 | 25 | | | | | |
| 1-a-2 | 20 | | | 25 | 25 | | | |
| 1-a-83 | | | | | | 25 | 25 | |
| 2-a-1 (n = 6) | 15 | 10 | 10 | 10 | 10 | 10 | 10 | 20 |
| 2-a-1 (n = 3) | | 10 | 10 | 10 | 10 | 10 | 10 | |
| 2-a-42 (n = 6) | 15 | | | | | | | |

TABLE 4-continued

| | Polymerizable composition | | | | | | | |
|---|---|---|---|---|---|---|---|---|
| | (21) | (22) | (23) | (24) | (25) | (26) | (27) | (28) |
| 3-a-7 | | | | | | | | 10 |
| Irg 907 | 3 | 3 | 0 | 3 | 3 | 3 | 3 | 3 |
| MEHQ | 0.1 | 0.1 | 0.1 | 0.1 | 0.1 | 0.1 | 0.1 | 0.1 |
| H-1 | | 0.15 | | 0.15 | | 0.15 | | 0.15 |
| H-3 | 0.15 | | 0.15 | | 0.15 | | 0.15 | |
| CPN | 400 | 400 | 400 | 400 | 400 | 400 | 400 | 400 |

TABLE 5

| | Polymerizable composition | | | | | | |
|---|---|---|---|---|---|---|---|
| | (29) | (30) | (31) | (32) | (33) | (34) | (35) |
| 1-a-5 | 30 | 30 | 30 | 30 | 30 | 30 | |
| 1-a-6 | 40 | 40 | 40 | 40 | 40 | 40 | |
| 2-a-1 (n = 6) | 20 | 20 | 20 | 20 | 20 | 20 | |
| 2-a-31 (n = 6) | | | | | 10 | | 100 |
| 2-a-40 (n = 6) | | | | | | 10 | |
| 1-b-27 (m11 = 6, n11 = 2) | 10 | | | | | | |
| 1-b-1 (m11 = 6, n11 = 0) | | 10 | | | | | |
| 2-b-1 (m = n = 3) | | | 10 | | | | |
| 2-b-1 (m = n = 4) | | | | 10 | | | |
| Irg 907 | 3 | 3 | 3 | 3 | 3 | 3 | 3 |
| MEHQ | 0.1 | 0.1 | 0.1 | 0.1 | 0.1 | 0.1 | 0.1 |
| H-1 | 0.15 | 0.15 | 0.15 | 0.15 | 0.15 | 0.15 | 0.15 |
| CPN | 400 | 400 | 400 | 400 | 400 | 400 | |
| CLF | | | | | | | 400 |

TABLE 6

| Polymerizable composition | (36) | (C1) | (C2) | (C3) |
|---|---|---|---|---|
| 1-a-5 | | 55 | 55 | 55 |
| 1-a-6 | | 25 | 25 | 25 |
| 2-a-1 (n = 6) | | 20 | 20 | 20 |
| 2-a-40 (n = 6) | 100 | | | |
| Irg 907 | 3 | 3 | 3 | 3 |
| MEHQ | 0.1 | 0.1 | 0.1 | 0.1 |
| H-1 | 0.15 | | | |
| H-4 | | 0.15 | 0.50 | |
| H-5 | | | | 0.50 |
| CPN | | 400 | 400 | 400 |
| TCE | 400 | | | |

[Chem. 164]
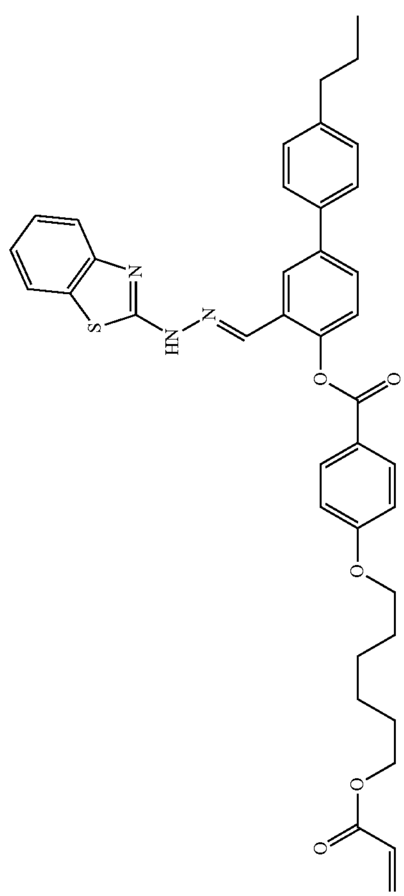
(1-a-5)
[Chem. 165]
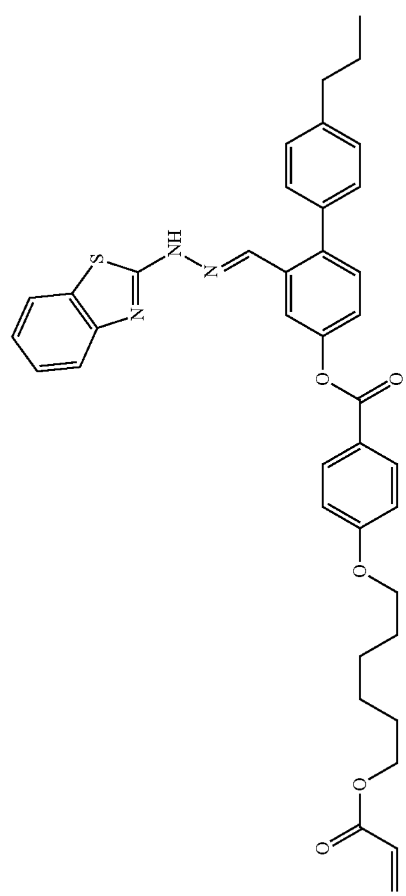
(1-a-6)

-continued
(1-a-1)
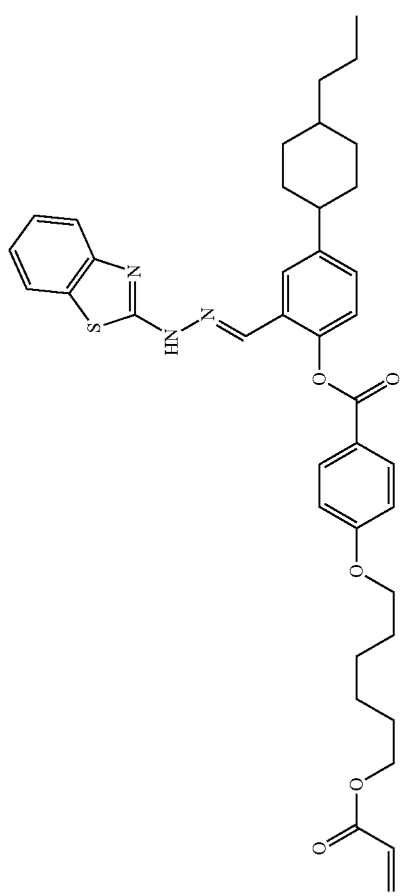
(1-a-2)
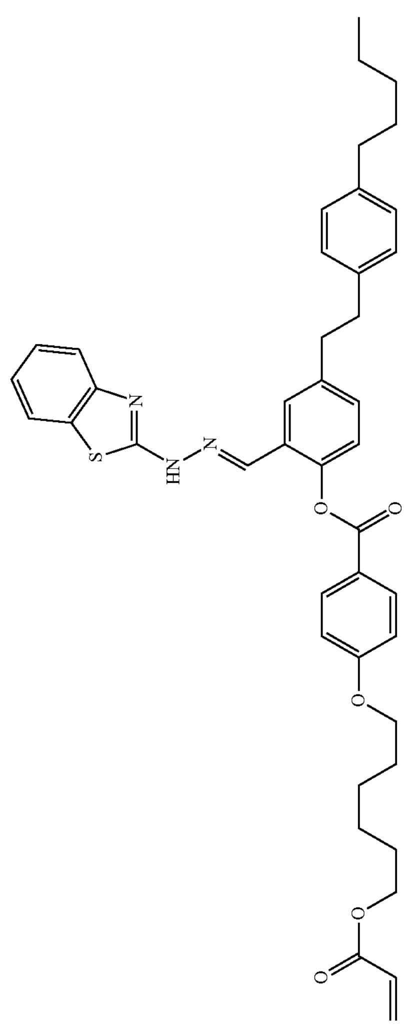

-continued
[Chem. 166]
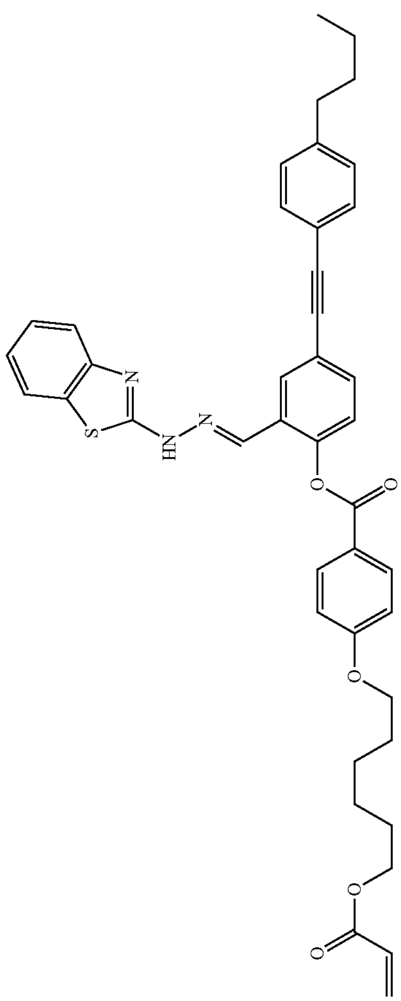
(1-a-83)
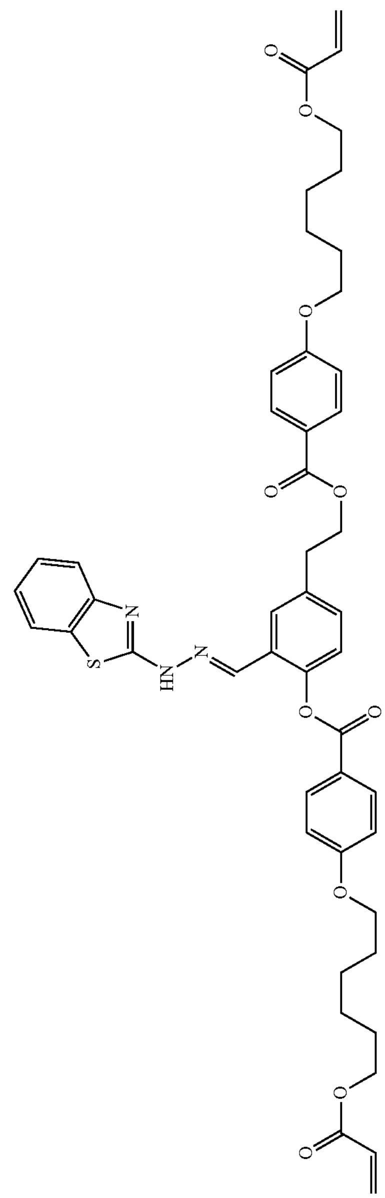
(2-a-1)
n = 6

-continued
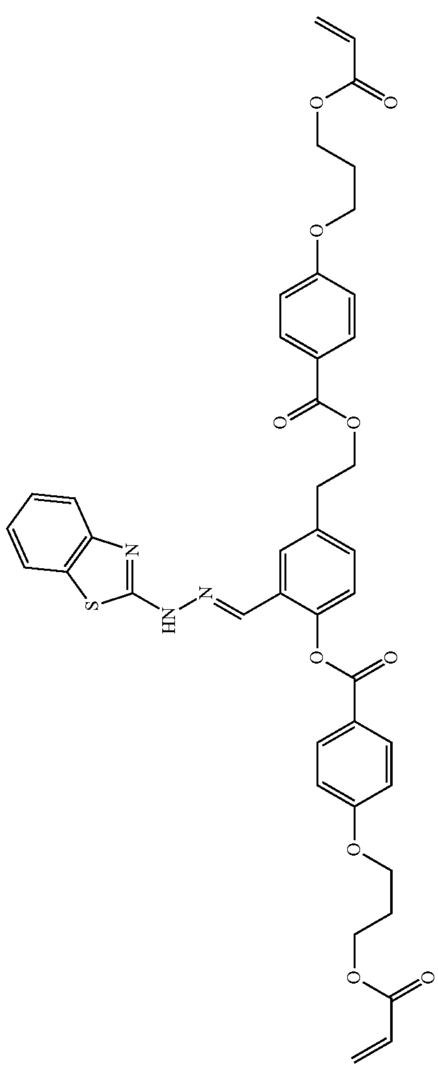
(2-a-1)
n = 3
[Chem. 167]
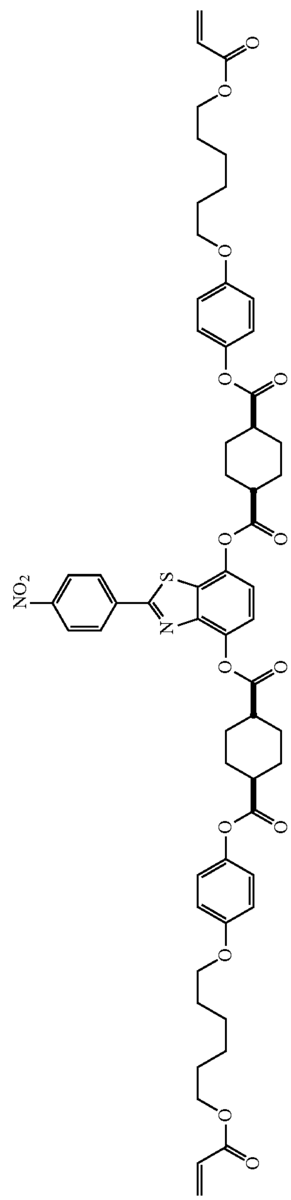
(2-a-31)
n = 6

-continued
(2-a-40)
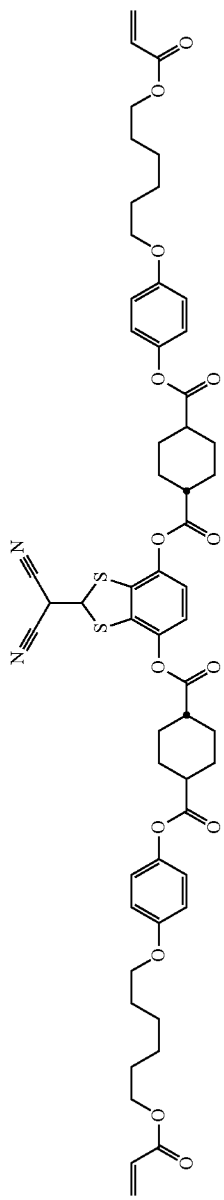
n = 6
(2-a-42)
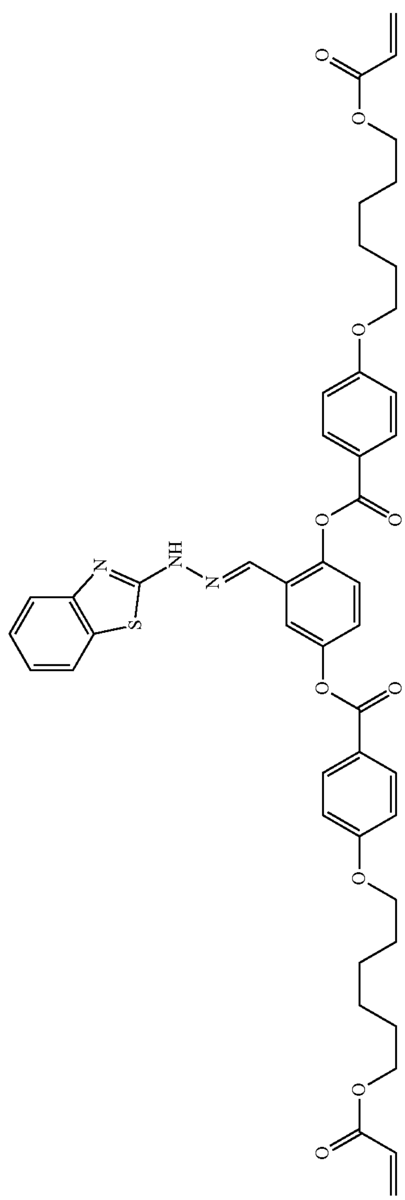
n = 6

-continued
(3-a-7)
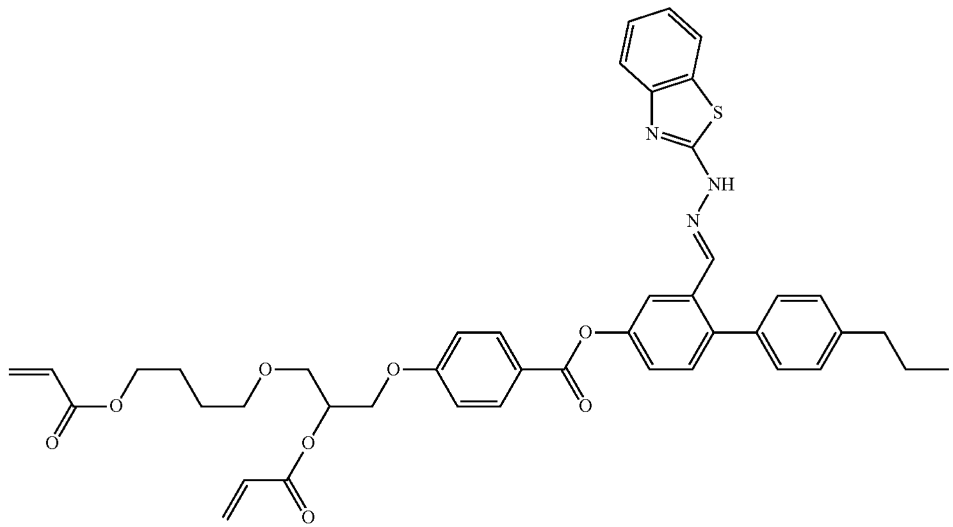
[Chem. 168]
(1-b-27)
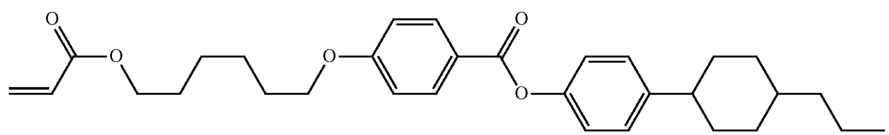
m11 = 6, n11 = 2
(1-b-1)
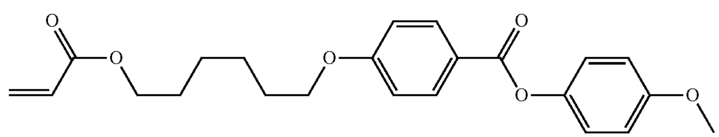
m11 = 6, n11 = 0

-continued
(2-b-1)
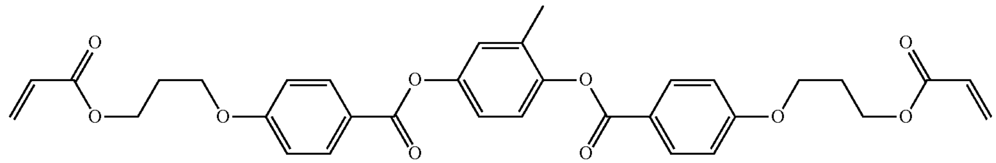
m = n = 3
(2-b-1)
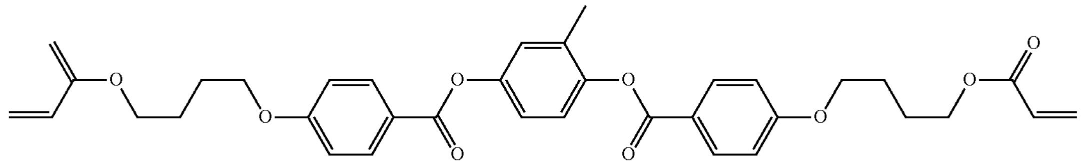
m = n = 4
[Chem. 169]
(H-1)
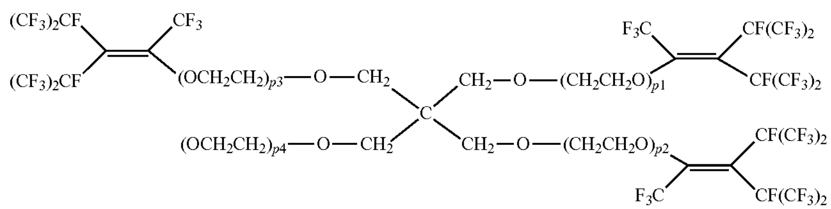
(H-2)
(H-3)
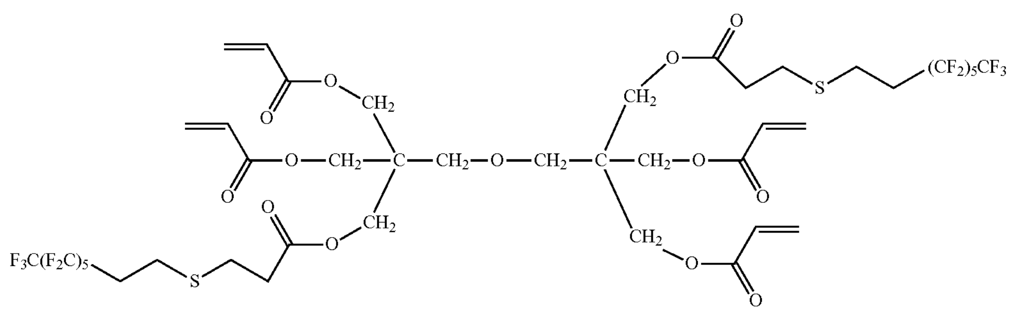
(H-4)
$C_8F_{17}SO_2N(C_2H_5)(CH_2CH_2O)_{10}CH_3$
(H-5)
$C_8F_{17}CH_2CH_2OH$ Compound (*H*-1): $p1+p2+p3+p4=18$ Compound (*H*-2): $p1+p2+p3+p4=12$ The values of Re(450 nm)/Re(550 nm) of the compounds represented by the above formulas are shown in the following table.

TABLE 7

| Compound | Re(450 nm)/Re(550 nm) |
|---|---|
| Formula (1-a-5) | 0.881 |
| Formula (1-a-6) | 0.784 |
| Formula (1-a-1) | 0.716 |
| Formula (1-a-2) | 0.773 |
| Formula (1-a-83) | 0.957 |
| Formula (2-a-1) (n = 6) | 0.988 |
| Formula (2-a-1) (n = 3) | 0.802 |
| Formula (2-a-42) (n = 6) | 0.845 |
| Formula (2-a-31) (n = 6) | 0.900 |
| Formula (2-a-40) (n = 6) | 0.832 |
| Formula (3-a-7) | 0.850 |

Solubility Evaluation

The solubility in each of Examples 1 to 36 and Comparative Examples 1 to 3 was evaluated as follows.

A: After preparation, the clear and uniform state can be visually observed.

B: The clear and uniform state can be visually observed after heating and stirring, but precipitates of compounds are found when the mixture is returned to room temperature.

C: Compounds cannot be uniformly dissolved even after heating and stirring.

Storage Stability Evaluation

For each of Examples 1 to 36 and Comparative Examples 1 to 3, the state after the polymerizable composition was left to stand at room temperature for 1 week was visually checked. The storage stability of the polymerizable composition was evaluated as follows.

A: The clear and uniform state is maintained even after the polymerizable composition is left to stand at room temperature for 3 days.

B: The clear and uniform state is maintained even after the polymerizable composition is left to stand at room temperature for 1 day.

C: Precipitates of compounds are found after the polymerizable composition is left to stand at room temperature for 1 hour.

The results obtained are shown in the following table.

TABLE 8

| | Polymerizable composition | Solubility | Storage stability |
|---|---|---|---|
| Example 1 | (1) | A | A |
| Example 2 | (2) | A | A |
| Example 3 | (3) | A | A |
| Example 4 | (4) | A | A |
| Example 5 | (5) | A | A |
| Example 6 | (6) | A | A |
| Example 7 | (7) | A | A |
| Example 8 | (8) | A | A |
| Example 9 | (9) | A | A |
| Example 10 | (10) | A | A |
| Example 11 | (11) | A | A |
| Example 12 | (12) | A | A |
| Example 13 | (13) | A | A |

TABLE 8-continued

| | Polymerizable composition | Solubility | Storage stability |
|---|---|---|---|
| Example 14 | (14) | A | A |
| Example 15 | (15) | A | A |
| Example 16 | (16) | A | A |
| Example 17 | (17) | A | A |
| Example 18 | (18) | A | A |
| Example 19 | (19) | A | A |
| Example 20 | (20) | A | A |
| Example 21 | (21) | A | A |
| Example 22 | (22) | A | A |
| Example 23 | (23) | A | A |
| Example 24 | (24) | A | A |
| Example 25 | (25) | A | A |
| Example 26 | (26) | A | A |
| Example 27 | (27) | A | A |
| Example 28 | (28) | A | A |
| Example 29 | (29) | A | A |
| Example 30 | (30) | A | A |
| Example 31 | (31) | A | A |
| Example 32 | (32) | A | A |
| Example 33 | (33) | A | A |
| Example 34 | (34) | A | A |
| Example 35 | (35) | A | A |
| Example 36 | (36) | A | A |
| Comparative Example 1 | (C1) | A | A |
| Comparative Example 2 | (C2) | A | A |
| Comparative Example 3 | (C3) | A | A |

Example 37

40 Parts of the compound represented by formula (1-a-5), 40 parts of the compound represented by formula (1-a-6), 10 parts of the compound represented by formula (2-a-1) with n=6, 10 parts of the compound represented by formula (2-a-42) with n=6, and 0.1 parts of p-methoxyphenol (MEHQ) were added to 400 parts of methyl ethyl ketone (MEK), heated to 60° C., and stirred to dissolve. After dissolution was complete, the mixture was returned to room temperature. Then 3 parts of IRGACURE 907 (manufactured by BASF Japan Ltd.) and 0.15 parts of the surfactant represented by formula (H-1) were added, and the resulting mixture was further stirred to thereby obtain a solution. The solution was clear and uniform. The solution obtained was filtered through a 0.20 μm membrane filter to thereby obtain a polymerizable composition (37) in Example 37.

The state of the polymerizable composition (37) of the present invention after it was left to stand at room temperature for 3 days was visually checked. The polymerizable composition of the present invention maintained its clear and uniform state even after 1 week.

Examples 38 to 48 and Comparative Examples 4 to 5

Polymerizable compositions (38) to (48) in Examples 38 to 48 and polymerizable compositions (C4) to (C5) in Comparative Examples 4 to 5 were obtained under the same conditions as in the preparation of the polymerizable composition (37) except that ratios of compounds shown in tables below were changed as shown in the tables.

Examples 49 and 50

50 Parts of the compound represented by formula (1-a-6), 25 parts of the compound represented by formula (1-a-2), 25 parts of the compound represented by formula (2-a-1) with n=6, and 0.1 parts of p-methoxyphenol (MEHQ) were dissolved in 200 parts of methyl ethyl ketone (MEK) and 200 parts of methyl isobutyl ketone (MIBK), heated to 60° C., and stirred to dissolve. After dissolution was complete, the mixture was returned to room temperature. Then 3 parts of IRGACURE 907 (manufactured by BASF Japan Ltd.) and 0.15 parts of the surfactant represented by formula (H-1) were added, and the resulting mixture was further stirred to thereby obtain a solution. The solution was clear and uniform. The solution obtained was filtered through a 0.20 μm membrane filter to thereby obtain a polymerizable composition (49) in Example 49.

A polymerizable composition (50) in Example 50 was obtained in the same manner as in Example 49 except that ratios of compounds in a table below were changed as shown in the table.

The state of each of the polymerizable compositions (49) and (50) of the present invention after they were left to stand at room temperature for 3 days was visually checked. These polymerizable compositions of the present invention maintained their clear and uniform state even after 1 week.

Example 51

40 Parts of the compound represented by formula (1-a-6), 20 parts of the compound represented by formula (1-a-2), 20 parts of the compound represented by formula (2-a-1) with n=6, 10 parts of the compound represented by formula (2-a-42) with n=6, 10 parts of the compound represented by formula (2-b-1) with m=n=3, and 0.1 parts of p-methoxyphenol were added to 300 parts of methyl ethyl ketone (MEK) and 100 parts of methyl isobutyl ketone (MIBK), heated to 60° C., and stirred to dissolve. After dissolution was complete, the mixture was returned to room temperature. Then 3 parts of IRGACURE 907 (manufactured by BASF Japan Ltd.) and 0.15 parts of the surfactant represented by formula (H-1) were added, and the resulting mixture was further stirred to thereby obtain a solution. The solution was clear and uniform. The solution obtained was filtered through a 0.20 μm membrane filter to thereby obtain a polymerizable composition (51) in Example 51.

Example 52

10 Parts of the compound represented by formula (1-a-5), 50 parts of the compound represented by formula (1-a-6), 10 parts of the compound represented by formula (1-a-83), 20 parts of the compound represented by formula (2-a-1) with n=6, 10 parts of the compound represented by formula (2-b-1) with m=n=4, and 0.1 parts of p-methoxyphenol were added to 200 parts of methyl ethyl ketone (MEK) and 200 parts of methyl isobutyl ketone (MIBK), heated to 60° C., and stirred to dissolve. After dissolution was complete, the mixture was returned to room temperature. Then 3 parts of IRGACURE 907 (manufactured by BASF Japan Ltd.) and 0.15 parts of the surfactant represented by formula (H-1) were added, and the resulting mixture was further stirred to thereby obtain a solution. The solution was clear and uniform. The solution obtained was filtered through a 0.20 μm membrane filter to thereby obtain a polymerizable composition (52) in Example 52.

Comparative Example 6

A polymerizable composition (C6) in Comparative Example 6 was obtained under the same conditions as in the preparation of the polymerizable composition (51) except that ratios of compounds shown in a table below were changed as shown in the table.

The state of each of the polymerizable compositions (51) and (52) of the present invention after they were left to stand at room temperature for 3 days was visually checked. In the polymerizable compositions of the present invention, their clear and uniform state was maintained even after 1 week.

Specific compositions of the polymerizable compositions (37) to (52) in Examples 37 to 52 of the present invention and the polymerizable compositions (C4) to (C6) in Comparative Examples 4 to 6 are shown in the following tables.

TABLE 9

| | Polymerizable composition | | | | | | |
|---|---|---|---|---|---|---|---|
| | (37) | (38) | (39) | (40) | (41) | (42) | (43) |
| 1-a-5 | 40 | | | | | | |
| 1-a-6 | 40 | 40 | 40 | 50 | 50 | 30 | 40 |
| 1-a-2 | | 40 | | 30 | | 30 | 30 |
| 1-a-83 | | | 40 | | 30 | | |
| 2-a-1 (n = 6) | 10 | 20 | 20 | 5 | 5 | 25 | 25 |
| 2-a-42 (n = 6) | 10 | | | 15 | 15 | 15 | 15 |
| Irg 907 | 3 | 3 | 3 | 3 | 3 | 3 | 3 |
| MEHQ | 0.1 | 0.1 | 0.1 | 0.1 | 0.1 | 0.1 | 0.1 |
| H-1 | 0.15 | 0.15 | 0.15 | 0.15 | 0.15 | 0.15 | 0.15 |
| MEK | 400 | 400 | 400 | 400 | 400 | 400 | 400 |

TABLE 10

| | Polymerizable composition | | | | | | |
|---|---|---|---|---|---|---|---|
| | (44) | (45) | (46) | (47) | (48) | (49) | (50) |
| 1-a-6 | 40 | 40 | 40 | 40 | 40 | 50 | 50 |
| 1-a-2 | | | | | | 25 | |
| 1-a-83 | 30 | 30 | 30 | 30 | 30 | | 25 |
| 2-a-1 (n = 6) | 20 | 20 | 20 | 20 | 20 | 25 | 25 |
| 3-a-7 | 10 | | | | | | |

TABLE 10-continued

| | Polymerizable composition | | | | | | |
|---|---|---|---|---|---|---|---|
| | (44) | (45) | (46) | (47) | (48) | (49) | (50) |
| 1-b-27 (m11 = 6, n11 = 2) | | 10 | | | | | |
| 1-b-1 (m11 = 6, n11 = 0) | | | 10 | | | | |
| 2-b-1 (m = n = 3) | | | | 10 | | | |
| 2-b-1 (m = n = 4) | | | | | 10 | | |
| Irg 907 | 3 | 3 | 3 | 3 | 3 | 3 | 3 |
| MEHQ | 0.1 | 0.1 | 0.1 | 0.1 | 0.1 | 0.1 | 0.1 |
| H-1 | 0.15 | 0.15 | 0.15 | 0.15 | 0.15 | 0.15 | 0.15 |
| MEK | 400 | 400 | 400 | 400 | 400 | 400 | 400 |

TABLE 11

| | Polymerizable composition | | | | |
|---|---|---|---|---|---|
| | (51) | (52) | (C4) | (C5) | (C6) |
| 1-a-5 | | 10 | 40 | 40 | |
| 1-a-6 | 40 | 50 | 40 | 40 | 40 |
| 1-a-2 | 20 | | 10 | 10 | 20 |
| 1-a-83 | | 10 | | | |
| 2-a-1 (n = 6) | 20 | 20 | | | 20 |
| 2-a-42 (n = 6) | 10 | | 10 | 10 | 10 |
| 2-b-1 (m = n = 3) | 10 | | | | 10 |
| 2-b-1 (m = n = 4) | | 10 | | | |
| Irg 907 | 3 | 3 | 3 | 3 | 3 |
| MEHQ | 0.1 | 0.1 | 0.1 | 0.1 | 0.1 |
| H-1 | 0.15 | 0.15 | | | |
| H-4 | | | 0.15 | | 0.15 |
| H-5 | | | | 0.15 | |
| MEK | 300 | 200 | 400 | 400 | 300 |
| MIBK | 100 | 200 | | | 100 |

Solubility Evaluation and Storage Stability Evaluation

For each of Examples 37 to 52 and Comparative Examples 4 to 6, the solubility and the storage stability were evaluated as in Example 1. The results obtained are shown in the following tables.

TABLE 12

| | Polymerizable composition | Solubility | Storage stability |
|---|---|---|---|
| Example 37 | (37) | A | A |
| Example 38 | (38) | A | A |
| Example 39 | (39) | A | A |
| Example 40 | (40) | A | A |
| Example 41 | (41) | A | A |
| Example 42 | (42) | A | A |
| Example 43 | (43) | A | A |
| Example 44 | (44) | A | A |
| Example 45 | (45) | A | A |
| Example 46 | (46) | A | A |
| Example 47 | (47) | A | A |
| Example 48 | (48) | A | A |
| Example 49 | (49) | A | A |
| Example 50 | (50) | A | A |
| Example 51 | (51) | A | A |
| Example 52 | (52) | A | A |
| Comparative Example 4 | (C4) | A | A |
| Comparative Example 5 | (C5) | A | A |
| Comparative Example 6 | (C6) | A | A |

Example 53

A polyimide solution for an alignment film was applied to a 0.7 mm-thick glass substrate by spin coating, dried at 100° C. for 10 minutes, and then fired at 200° C. for 60 minutes to obtain a coating film. The coating film obtained was subjected to rubbing treatment. The rubbing treatment was performed using a commercial rubbing device.

The polymerizable composition (1) of the present invention was applied to the substrate subjected to rubbing by spin coating and dried at 100° C. for 2 minutes. The coating film obtained was cooled to room temperature and irradiated with UV rays at an intensity of 30 mW/cm$^2$ for 30 seconds using a high-pressure mercury lamp to thereby obtain an optically anisotropic body serving as a positive A-plate. The optically anisotropic body obtained was evaluated according to the following criteria. No defects were found at all by visual inspection, and no defects were found at all by polarizing microscope observation.

Alignment Evaluation

AA: No defects are found at all by visual inspection, and no defects are found at all by polarizing microscope observation.

A: No defects are found by visual inspection, but non-aligned portions are found in some parts by polarizing microscope observation.

B: No defects are found by visual inspection, but non-aligned portions are found over the entire region by polarizing microscope observation.

C: Defects are found in some parts by visual inspection, and non-aligned portions are found over the entire region by polarizing microscope observation.

Retardation Ratio

The retardation of the optically anisotropic body produced above was measured using a retardation film-optical material inspection device RETS-100 (manufactured by Otsuka Electronics Co., Ltd.), and the in-plane retardation (Re(550)) at a wavelength of 550 nm was 130 nm. The ratio of the in-plane retardation (Re(450)) at a wavelength of 450 nm to Re(550), i.e., Re(450)/Re(550), was 0.846, and the retardation film obtained had high uniformity.

Leveling Property Evaluation

The degree of cissing in the optically anisotropic body produced above was checked visually.

AA: Mo cissing defects are found at all on the surface of the coating film.

A: A very small number of cissing defects are found on the surface of the coating film.

B: A small number of cissing defects are found on the surface of the coating film.

C: A large number of cissing defects are found on the surface of the coating film.

Offset Evaluation

A TAC film (B) was placed on a polymerizable composition surface (A) of the optically anisotropic body produced above, and the resulting stack was held under a load of 40 g/cm$^2$ at 80° C. for 30 minutes and then cooled to room temperature while the stacked state was maintained. Then the film (B) was removed, and whether or not the surfactant in the polymerizable composition was offset onto the film (B) was visually checked. When the surfactant is transferred to the film (B), the offset portion is observed as a whitish portion.

AA: Not observed at all.

A: Very slightly observed.

B: Slightly observed.

C: Observed over the entire region.

Examples 54 to 88 and Comparative Examples 7 to 9

Optically anisotropic bodies in Examples 54 to 88 each serving as a positive A-plate and optically anisotropic bodies in Comparative Examples 7 to 9 were obtained under the same conditions as in Example 53 except that the polymerizable composition used was changed to one of the polymerizable compositions (2) to (36) of the present invention and the polymerizable compositions (C1) to (C3) for comparison. For each of the optically anisotropic bodies obtained, the alignment evaluation, the retardation ratio, the leveling property evaluation, and the offset evaluation were performed in the same manner as in Example 53. The results obtained are shown in the following table.

TABLE 13

| | Polymerizable composition | Alignment evaluation | Retardation ratio | Leveling property evaluation | Offset evaluation |
|---|---|---|---|---|---|
| Example 53 | (1) | AA | 0.846 | A | AA |
| Example 54 | (2) | AA | 0.849 | AA | AA |
| Example 55 | (3) | AA | 0.842 | AA | A |
| Example 56 | (4) | AA | 0.846 | AA | AA |
| Example 57 | (5) | AA | 0.851 | AA | AA |
| Example 58 | (6) | AA | 0.823 | A | AA |
| Example 59 | (7) | AA | 0.825 | AA | AA |
| Example 60 | (8) | AA | 0.824 | AA | A |
| Example 61 | (9) | AA | 0.827 | A | AA |
| Example 62 | (10) | AA | 0.823 | A | AA |
| Example 63 | (11) | AA | 0.841 | A | AA |
| Example 64 | (12) | AA | 0.842 | AA | AA |
| Example 65 | (13) | AA | 0.842 | AA | A |
| Example 66 | (14) | AA | 0.842 | A | AA |
| Example 67 | (15) | AA | 0.840 | A | AA |
| Example 68 | (16) | AA | 0.936 | AA | AA |
| Example 69 | (17) | AA | 0.932 | AA | AA |
| Example 70 | (18) | AA | 0.839 | AA | AA |
| Example 71 | (19) | AA | 0.824 | AA | AA |
| Example 72 | (20) | AA | 0.805 | AA | AA |
| Example 73 | (21) | AA | 0.807 | AA | AA |
| Example 74 | (22) | AA | 0.767 | AA | AA |
| Example 75 | (23) | AA | 0.769 | AA | AA |
| Example 76 | (24) | AA | 0.784 | AA | AA |
| Example 77 | (25) | AA | 0.778 | AA | AA |
| Example 78 | (26) | AA | 0.832 | AA | AA |

TABLE 13-continued

| | Polymerizable composition | Alignment evaluation | Retardation ratio | Leveling property evaluation | Offset evaluation |
|---|---|---|---|---|---|
| Example 79 | (27) | AA | 0.815 | AA | AA |
| Example 80 | (28) | AA | 0.827 | AA | AA |
| Example 81 | (29) | AA | 0.861 | AA | AA |
| Example 82 | (30) | AA | 0.879 | AA | AA |
| Example 83 | (31) | AA | 0.875 | AA | AA |
| Example 84 | (32) | AA | 0.877 | AA | AA |
| Example 85 | (33) | AA | 0.846 | AA | AA |
| Example 86 | (34) | AA | 0.825 | AA | AA |
| Example 87 | (35) | AA | 0.870 | AA | AA |
| Example 88 | (36) | AA | 0.804 | AA | AA |
| Comparative Example 7 | (C1) | B | 0.840 | C | B |
| Comparative Example 8 | (C2) | C | 0.845 | A | C |
| Comparative Example 9 | (C3) | B | 0.842 | A | C |

Example 89

A uniaxially stretched 50 μm-thick PET film was subjected to rubbing treatment using a commercial rubbing device, and the polymerizable composition (37) of the present invention was applied by bar coating and dried at 80° C. for 2 minutes. The coating film obtained was cooled to room temperature and irradiated with UV rays at a conveying speed of 6 m/min using a UV conveyer device (manufactured by GS Yuasa Corporation) to thereby obtain an optically anisotropic body in Example 89 serving as a positive A-plate. The optically anisotropic body obtained was subjected to alignment evaluation, retardation ratio, leveling property evaluation, and offset evaluation in the same manner as in Example 53.

Examples 90 to 100 and Comparative Examples 10 to 11

Optically anisotropic bodies in Examples 90 to 100 and Comparative Examples 10 to 11 each serving as a positive A-plate were obtained under the same conditions as in Example 89 except that the polymerizable composition used was changed to one of the polymerizable compositions (37) to (48) of the present invention and the polymerizable compositions (C4) and (C5) for comparison. For each of the optically anisotropic bodies obtained, the alignment evaluation, the retardation ratio, the leveling property evaluation, and the offset evaluation were performed in the same manner as in Example 53.

Example 101

A non-stretched 40 μm-thick cycloolefin polymer film "ZEONOR" (manufactured by ZEON CORPORATION) was subjected to rubbing treatment using a commercial rubbing device, and the polymerizable composition (49) of the present invention was applied by bar coating and dried at 80° C. for 2 minutes. The coating film obtained was cooled to room temperature and irradiated with UV rays at a conveying speed of 6 m/min using a UV conveyer device (manufactured by GS Yuasa Corporation) to thereby obtain an optically anisotropic body in Example 101 serving as a positive A-plate. The optically anisotropic body obtained was subjected to alignment evaluation, retardation ratio, leveling property evaluation, and offset evaluation in the same manner as in Example 53. The results of the alignment evaluation showed that no defects were found at all by visual inspection and that no defects were found at all by polarizing microscope observation. The (Re(550) of the optically anisotropic body obtained was 121 nm, and the ratio of the in-plane retardation (Re(450)) at a wavelength of 450 nm to Re(550), i.e., Re(450)/Re(550), was 0.814. The retardation film obtained had high uniformity.

Example 102

An optically anisotropic body in Example 102 serving as a positive A-plate was obtained under the same conditions as in Example 101 except that the polymerizable composition used was changed to the polymerizable composition (50) of the present invention. The optically anisotropic body obtained was subjected to alignment evaluation, retardation ratio, leveling property evaluation, and offset evaluation in the same manner as in Example 53. The results obtained are shown in the following table.

TABLE 14

| | Polymer-izable composition | Alignment evaluation | Retar-dation ratio | Leveling property evaluation | Offset evaluation |
|---|---|---|---|---|---|
| Example 89 | (37) | AA | 0.818 | AA | AA |
| Example 90 | (38) | AA | 0.800 | AA | AA |
| Example 91 | (39) | AA | 0.865 | AA | AA |
| Example 92 | (40) | AA | 0.778 | AA | AA |
| Example 93 | (41) | AA | 0.824 | AA | AA |
| Example 94 | (42) | AA | 0.819 | AA | AA |
| Example 95 | (43) | AA | 0.804 | AA | AA |
| Example 96 | (44) | AA | 0.856 | AA | AA |
| Example 97 | (45) | AA | 0.899 | AA | AA |
| Example 98 | (46) | AA | 0.888 | AA | AA |
| Example 99 | (47) | AA | 0.906 | AA | AA |
| Example 100 | (48) | AA | 0.899 | AA | AA |
| Example 101 | (49) | AA | 0.814 | AA | AA |
| Example 102 | (50) | AA | 0.854 | AA | AA |
| Comparative Example 10 | (C4) | B | 0.815 | C | B |
| Comparative Example 11 | (C5) | A | 0.807 | B | B |

Example 103

5 Parts of a photo-alignment material represented by formula (12-4) below was dissolved in 95 parts of cyclopentanone to obtain a solution. The solution obtained was filtered through a 0.45 μm membrane filter to thereby obtain a photo-alignment solution (1). Next, the solution obtained was applied to a 0.7 mm-thick glass substrate by spin coating, dried at 80° C. for 2 minutes, and then irradiated with linearly polarized light of 313 nm at an intensity of 10 mW/cm$^2$ for 20 seconds to thereby obtain a photo-alignment film (1). The polymerizable composition (51) was applied to the obtained photo-alignment film by spin coating and dried at 100° C. for 2 minutes. The coating film obtained was cooled to room temperature and irradiated with UV rays at an intensity of 30 mW/cm$^2$ for 30 seconds using a high-pressure mercury lamp to thereby obtain an optically anisotropic body in Example 103 serving as a positive A-plate. The optically anisotropic body obtained was subjected to alignment evaluation, retardation ratio, leveling property evaluation, and offset evaluation in the same manner as in Example 53. The results of the alignment evaluation showed that no defects were found at all by visual inspection and that no defects were found at all by polarizing microscope observation. The retardation of the optically anisotropic body obtained was measured using the RETS-100 (manufactured by Otsuka Electronics Co., Ltd.). The in-plane retardation (Re(550)) at a wavelength of 550 nm was 125 nm, and the retardation film obtained had high uniformity.

Example 104

5 Parts of a photo-alignment material represented by formula (12-9) below was dissolved in 95 parts of N-methyl-2-pyrrolidone, and the solution obtained was filtered through a 0.45 μm membrane filter to thereby obtain a photo-alignment solution (2). Next, the solution obtained was applied to a 0.7 mm-thick glass substrate by spin coating, dried at 100° C. for 5 minutes, further dried at 130° C. for 10 minutes, and then irradiated with linearly polarized light of 313 nm at an intensity of 10 mW/cm$^2$ for 1 minute to thereby obtain a photo-alignment film (2). The polymerizable composition (51) was applied to the obtained photo-alignment film by spin coating and dried at 100° C. for 2 minutes. The coating film obtained was cooled to room temperature and irradiated with UV rays at an intensity of 30 mW/cm$^2$ for 30 seconds using a high-pressure mercury lamp to thereby obtain an optically anisotropic body in Example 104 serving as a positive A-plate. The optically anisotropic body obtained was subjected to alignment evaluation, retardation ratio, leveling property evaluation, and offset evaluation in the same manner as in Example 53. The results of the alignment evaluation showed that no defects were found at all by visual inspection and that no defects were found at all by polarizing microscope observation. The retardation of the optically anisotropic body obtained was measured using the RETS-100 (manufactured by Otsuka Electronics Co., Ltd.). The in-plane retardation (Re(550)) at a wavelength of 550 nm was 120 nm, and the retardation film obtained had high uniformity.

[Chem. 170]

(12-4)

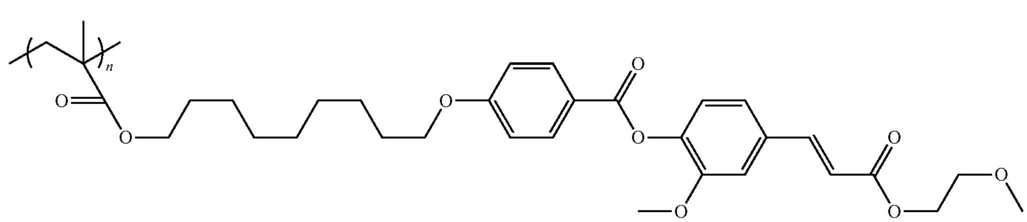

-continued (12-9)

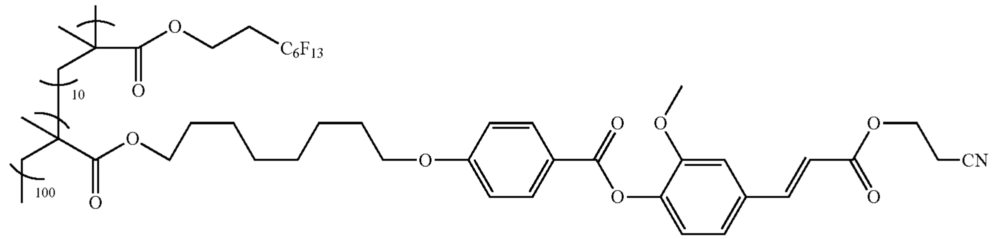

(12-8)

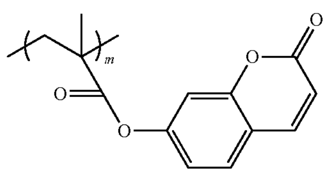

Example 105

1 Part of a photo-alignment material represented by formula (12-8) above was dissolved in 50 parts of (2-ethoxyethoxy) ethanol and 49 parts of 2-butoxyethanol, and the solution obtained was filtered through a 0.45 μm membrane filter to thereby obtain a photon-alignment solution (3). Next, the solution obtained was applied to an 80 μm-thick polymethyl methacrylate (PMMA) film by bar coating, dried at 80° C. for 2 minutes, and irradiated with linearly polarized light of 365 nm at an intensity of 10 mW/cm$^2$ for 50 seconds to thereby obtain a photo-alignment film (3). The polymerizable composition (51) was applied to the obtained photo-alignment film by spin coating and dried at 100° C. for 2 minutes. The coating film obtained was cooled to room temperature and irradiated with UV rays at an intensity of 30 mW/cm$^2$ for 30 seconds using a high-pressure mercury lamp to thereby obtain an optically anisotropic body in Example 105 serving as a positive A-plate. The optically anisotropic body obtained was subjected to alignment evaluation, retardation ratio, leveling property evaluation, and offset evaluation in the same manner as in Example 53. The results of the alignment evaluation showed that no defects were found at all by visual inspection and that no defects were found at all by polarizing microscope observation. The retardation of the optically anisotropic body obtained was measured using the RETS-100 (manufactured by Otsuka Electronics Co., Ltd.). The in-plane retardation (Re(550)) at a wavelength of 550 nm was 137 nm, and the retardation film obtained had high uniformity.

Comparative Examples 12 to 14

An optically anisotropic body in Comparative Example 12 serving as a positive A-plate was obtained under the same conditions as in Example 103 except that the polymerizable composition (C6) for comparison was used. An optically anisotropic body in Comparative Example 13 serving as a positive A-plate was obtained under the same conditions as in Example 104 except that the polymerizable composition (C6) for comparison was used. An optically anisotropic body in Comparative Example 14 serving as a positive A-plate was obtained under the same conditions as in Example 105 except that the polymerizable composition (C6) for comparison was used. The optically anisotropic bodies obtained were subjected to alignment evaluation, retardation ratio, leveling property evaluation, and offset evaluation in the same manner as in Example 53. The results of the alignment evaluation showed that no defects were found at all by visual inspection and that no defects were found at all by polarizing microscope observation. The retardation films obtained had high uniformity. The obtained optically anisotropic bodies (12) to (14) for comparison were visually inspected for leveling property evaluation, and a small number of cissing defects were found on the surfaces of the coating films. For each of the obtained optically anisotropic bodies (12) to (14) for comparison, whether or not the surfactant in the polymerizable composition was offset was visually checked, and slight offset was observed.

Example 106

A 180 μm-thick PET film was subjected to rubbing treatment using a commercial rubbing device, and the polymerizable composition (52) of the present invention was applied by bar coating and dried at 80° C. for 2 minutes. The coating film obtained was cooled to room temperature and irradiated with UV rays at a conveying speed of 5 m/min using a UV conveyer device (manufactured by GS Yuasa Corporation) with a lamp power of 2 kW to thereby obtain an optically anisotropic body in Example 106 serving as a positive A-plate. The optically anisotropic body obtained was subjected to alignment evaluation, retardation ratio, leveling property evaluation, and offset evaluation in the same manner as in Example 53.

The retardation Re(550) of the optically anisotropic body obtained was 137 nm, and the ratio of the in-plane retardation (Re(450)) at a wavelength of 450 nm to Re(550), i.e., Re(450)/Re(550), was 0.872. The retardation film obtained had high uniformity. The degree of cissing in the optically anisotropic body (106) obtained was checked visually. No cissing defects were observed at all on the surface of the coating film. In the optically anisotropic body obtained (106), whether or not the surfactant in the polymerizable composition was offset was visually checked, and no offset was observed at all.

Next, a 75 μm-thick polyvinyl alcohol film with an average polymerization degree of about 2,400 and a saponification degree of 99.9 mol % or more was uniaxially stretched by a factor of about 5.5 under dry conditions. While the stretched state was maintained, the film was immersed in pure water at 60° C. for 60 seconds and then immersed in an aqueous solution with an iodine/potassium iodide/water ratio of 0.05/5/100 by weight at 28° C. for 20 seconds. The resulting film was immersed in an aqueous solution with a potassium iodide/boric acid/water ratio of 8.5/8.5/100 by weight at 72° C. for 300 seconds. Then the resulting film was washed with pure water at 26° C. for 20 seconds and dried at 65° C. to thereby obtain a polarizing film in which iodine was adsorbed and aligned on the polyvinyl alcohol resin.

Saponified triacetylcellulose films (KC8UX2MW manufactured by Konica Minolta Opto Products Co., Ltd.) were applied to opposite surfaces of the thus-obtained polarizer through a polyvinyl alcohol-based adhesive prepared using 3 parts of carboxyl group-modified polyvinyl alcohol [KURARAY POVAL KL318 manufactured by KURARAY Co., Ltd.] and 1.5 parts of water-soluble polyamide epoxy resin [Sumirez Resin 650 (an aqueous solution with a solid content of 30%) manufactured by Sumika Chemtex Co., Ltd.] to protect the opposite surfaces, and a polarizing film was thereby produced.

The polarizing film obtained and the retardation film were laminated through an adhesive such that the angle between the polarizing axis of the polarizing film and the slow axis of the retardation film was 45° to thereby obtain an antireflective film of the present invention. The antireflective film obtained and an aluminum plate used as an alternative to an organic light-emitting element were laminated through an adhesive, and reflective visibility from the aluminum plate was visually checked from the front and at an oblique angle of 45°. No reflection from the aluminum plate was observed.

TABLE 15

| | Polymerizable composition | Alignment evaluation | Retardation ratio | Leveling property evaluation | Offset evaluation |
|---|---|---|---|---|---|
| Example 103 | (51) | AA | 0.860 | AA | AA |
| Example 104 | (51) | AA | 0.876 | AA | AA |
| Example 105 | (51) | AA | 0.868 | AA | AA |
| Example 106 | (52) | AA | 0.872 | AA | AA |
| Comparative Example 12 | (C6) | B | 0.860 | B | B |
| Comparative Example 13 | (C6) | B | 0.861 | B | B |
| Comparative Example 14 | (C6) | B | 0.870 | B | B |

Examples 107 to 142

Polymerizable compositions (53) to (88) in Examples 107 to 142 were obtained under the same conditions as in the preparation of the polymerizable composition (1) in Example 1 except that ratios of compounds shown in tables below were changed as shown in the tables below. Specific compositions of the polymerizable compositions (53) to (88) of the present invention are shown in the following tables.

TABLE 16

| | Polymerizable composition | | | | | |
|---|---|---|---|---|---|---|
| | (53) | (54) | (55) | (56) | (57) | (58) |
| 1-a-6 | 20 | 20 | 20 | | | |
| 1-a-93 (n = 6) | 40 | 40 | 40 | | | |
| 1-a-100 (n = 3) | | | | 40 | | |
| 1-a-101 (n = 3) | | | | | 20 | |
| 1-a-105 (n = 3) | | | | | 10 | |
| 2-a-1 (n = 3) | | | | 20 | | |
| 2-a-11 (n = 6) | | | | 40 | | |
| 2-a-53 (n = 3) | | | 20 | | | |

TABLE 16-continued

| | Polymerizable composition | | | | | |
|---|---|---|---|---|---|---|
| | (53) | (54) | (55) | (56) | (57) | (58) |
| 2-a-55 (n = 6) | | | | | 50 | |
| 2-a-56 (n = 6) | | | | | 20 | |
| 2-a-57 (n = 6) | 40 | 40 | 20 | | | |
| 2-a-60 (n = 6) | | | | | | 100 |
| Irg. OXE01 | 6 | 6 | 6 | 6 | 6 | 6 |
| MEHQ | 0.1 | 0.1 | 0.1 | 0.1 | 0.1 | 0.1 |
| H-1 | 0.20 | | 020 | 0.20 | 0.20 | 0.20 |
| H-3 | | 0.20 | | | | |
| TOL | 400 | 400 | 400 | 400 | | 400 |
| CPN | | | | | 400 | |

TABLE 17

| | Polymerizable composition | | | | | |
|---|---|---|---|---|---|---|
| | (59) | (60) | (61) | (62) | (63) | (64) |
| 2-a-58 (n = 6) | | | | 50 | 50 | 50 |
| 2-a-60 (n = 6) | 100 | 100 | 100 | 50 | 50 | 50 |
| Irg 907 | | | 6 | | | |
| Irg. OXE01 | 6 | 6 | | 6 | 6 | 6 |
| MEHQ | 0.1 | 0.1 | 0.1 | 0.1 | 0.1 | 0.1 |
| H-1 | | | 0.20 | 0.20 | | |
| H-2 | 0.15 | | | | 0.15 | |
| H-3 | | 0.20 | | | | 0.20 |
| TOL | 400 | 400 | 400 | 400 | 400 | 400 |

TABLE 18

| | Polymerizable composition | | | | | |
|---|---|---|---|---|---|---|
| | (65) | (66) | (67) | (68) | (69) | (70) |
| 2-a-58 (n = 6) | 50 | 50 | | | | |
| 2-a-59 (n = 6) | | | 85 | 50 | 50 | 50 |
| 2-a-60 (n = 6) | 50 | 50 | 15 | 50 | 50 | 50 |
| Irg 907 | 6 | 4 | | | | |
| Irg. OXE01 | | 3 | 6 | 6 | | |
| MEHQ | 0.1 | 0.1 | 0.1 | 0.1 | 0.1 | 0.1 |
| H-1 | 0.20 | 0.20 | 0.20 | 0.20 | | |
| H-2 | | | | | 0.15 | |
| H-3 | | | | | | 0.20 |
| TOL | 400 | 400 | 400 | 400 | 400 | 400 |

TABLE 19

| | Polymerizable composition | | | | | |
|---|---|---|---|---|---|---|
| | (71) | (72) | (73) | (74) | (75) | (76) |
| 1-a-102 (n = 6) | | | | 20 | 20 | |
| 1-a-103 (n = 6) | | | | | | 20 |
| 2-a-59 (n = 6) | 50 | 50 | 50 | 50 | 50 | 50 |
| 2-a-60 (n = 6) | 50 | 50 | | 30 | 30 | 30 |
| 2-a-61 (n = 3) | | | 50 | | | |
| Irg 907 | 6 | 4 | | | | |
| Irg. OXE01 | | 3 | 6 | 6 | 6 | 6 |
| MEHQ | 0.1 | 0.1 | 0.1 | 0.1 | 0.1 | 0.1 |
| H-1 | 0.20 | 0.20 | 0.20 | 0.20 | | 0.20 |
| H-3 | | | | | 0.20 | |
| TOL | 400 | 400 | 400 | 400 | 400 | 400 |

TABLE 20
| | Polymerizable composition | | | | | |
|---|---|---|---|---|---|---|
| | (77) | (78) | (79) | (80) | (81) | (82) |
| 1-a-5 | | | | | 25 | |
| 1-a-6 | | | | | 25 | 40 |
| 1-a-102 (n = 6) | | 50 | 50 | 25 | | |
| 1-a-103 (n = 6) | | | | 25 | | |
| 1-a-104 (n = 6) | 20 | | | | | |
| 2-a-1 (n = 6) | | | | | 50 | 50 |
| 2-a-59 (n = 6) | 50 | | | | | |
| 2-a-60 (n = 6) | 30 | 50 | 50 | 50 | | |
| 2-b-19 (m = n = 6) | | | | | | 10 |
| Irg OXE01 | 6 | 6 | 6 | 6 | 6 | 6 |
| MEHQ | 0.1 | 0.1 | 0.1 | 0.1 | 0.1 | 0.1 |
| H-1 | 0.20 | 0.20 | | 0.20 | 0.05 | 0.05 |
| H-3 | | | 0.20 | | | |
| TOL | 400 | 400 | 400 | 400 | 400 | 400 |
TABLE 21
| | Polymerizable composition | | | | | |
|---|---|---|---|---|---|---|
| | (83) | (84) | (85) | (86) | (87) | (88) |
| 1-a-93 (n = 6) | | | | 50 | | |
| 1-a-100 (n = 3) | 40 | | | | | |
| 1-a-102 (n = 6) | | 50 | 50 | | 50 | 50 |
| 2-a-1 (n = 6) | 50 | | | | | |
| 2-a-1 (n = 3) | 10 | | | | | |
| 2-a-11 (n = 6) | | | | 50 | | |
| 2-a-59 (n = 6) | | 50 | 50 | | 50 | 50 |
| Irg 907 | 6 | 6 | 6 | 6 | 6 | 6 |
| MEHQ | 0.1 | 0.1 | 0.1 | 0.1 | 0.1 | 0.1 |
| H-1 | 0.05 | 0.05 | | 0.05 | 0.05 | |
| H-3 | | | 0.05 | | | 0.05 |
| TOL | 400 | 400 | 400 | 400 | 400 | 400 |
[Chem. 171]
(1-a-93)
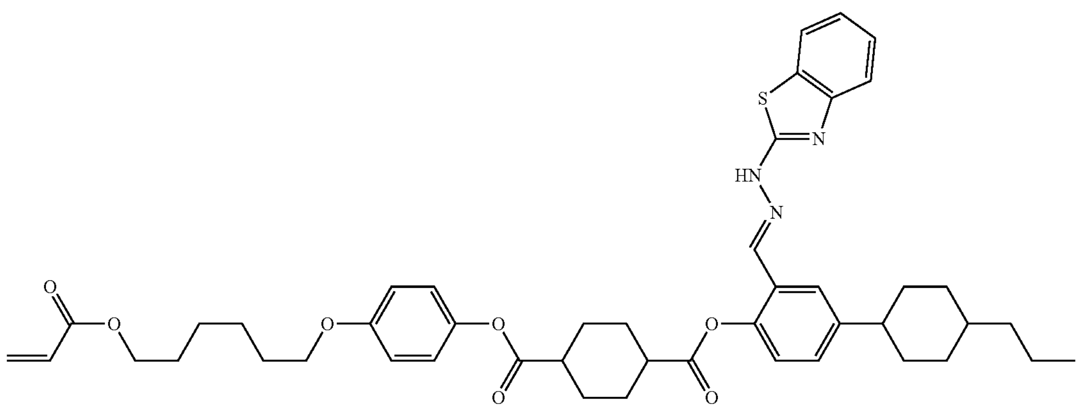
n = 6
(1-a-100)
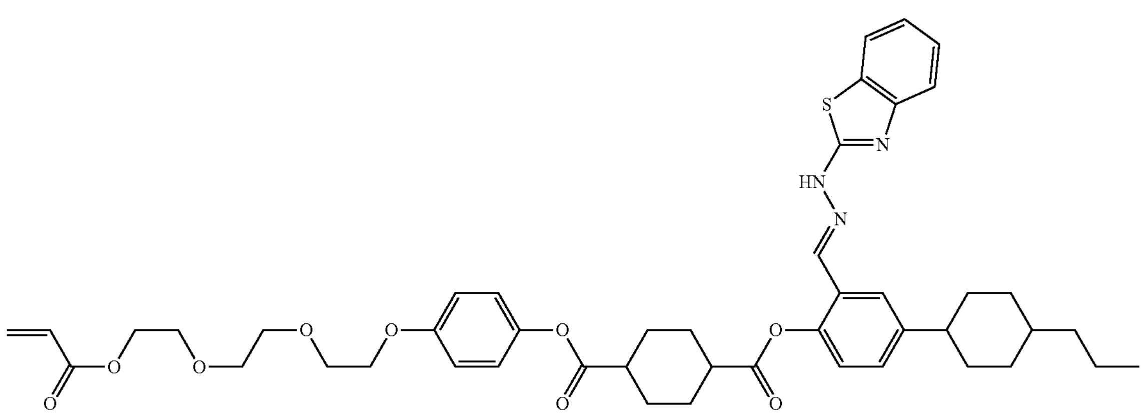
n = 3

-continued
(1-a-101)
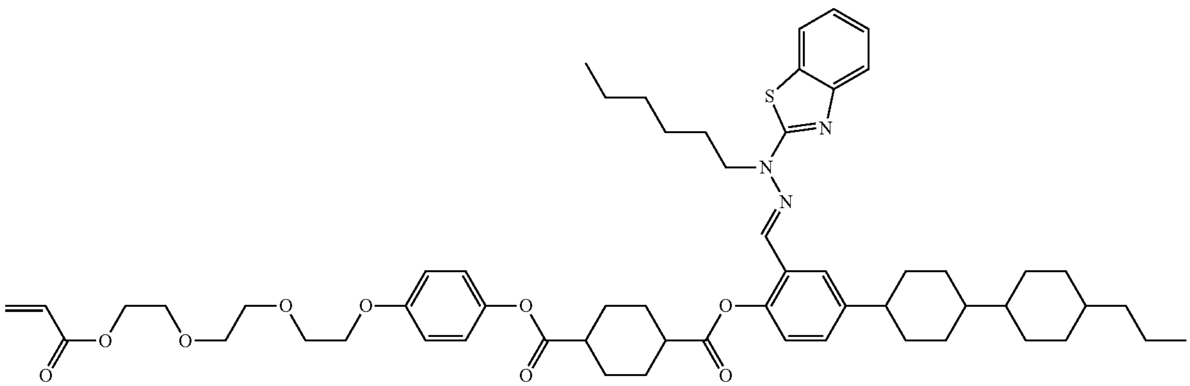
n = 3
[Chem. 172]
(1-a-102)
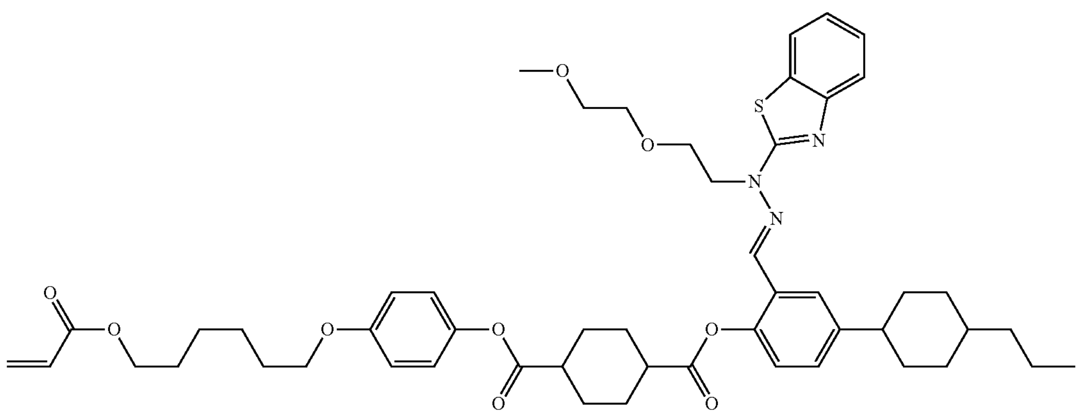
n = 6
(1-a-103)
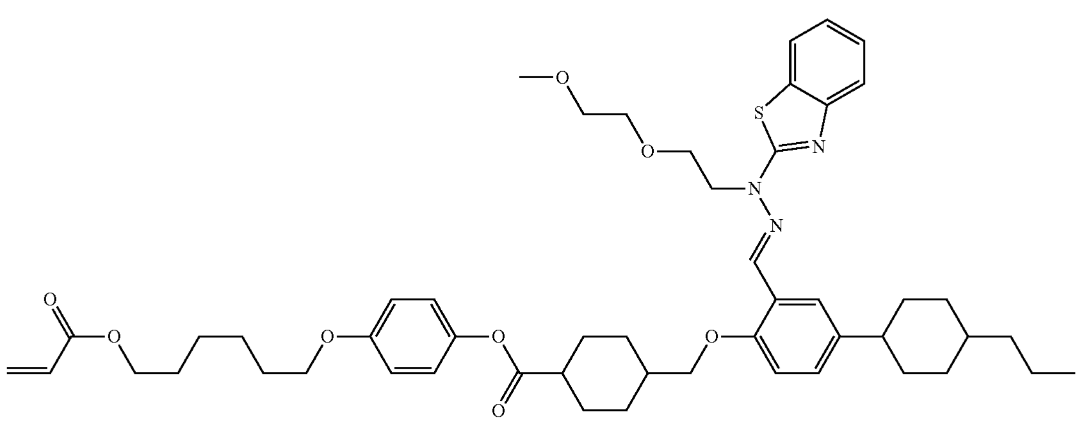
n = 6

-continued
(1-a-104)
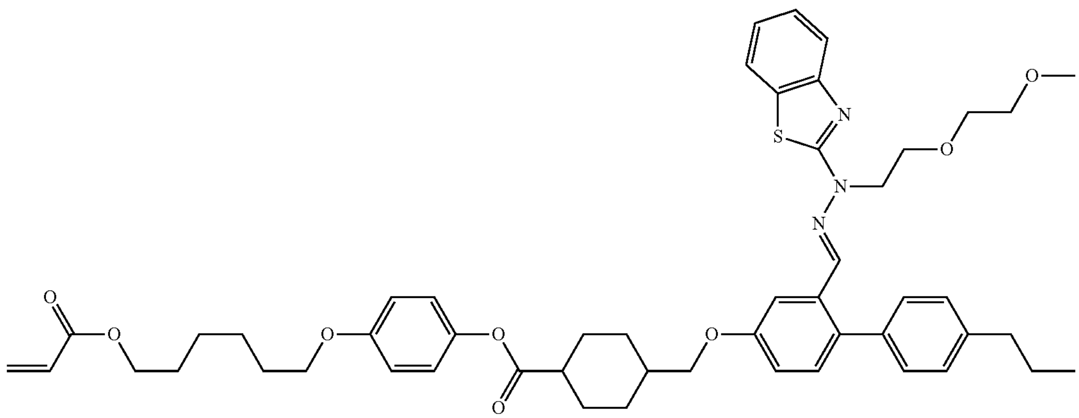
n = 6
(1-a-105)
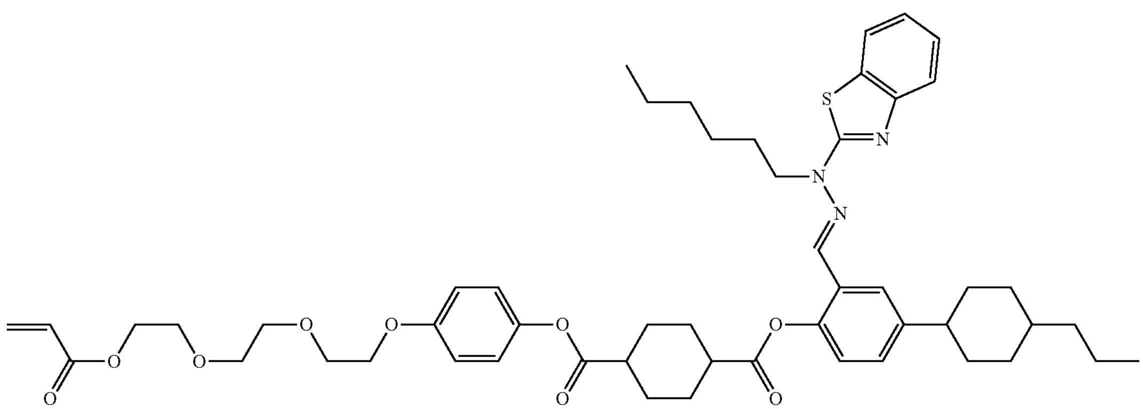
n = 3
[Chem. 173]
(2-a-11)
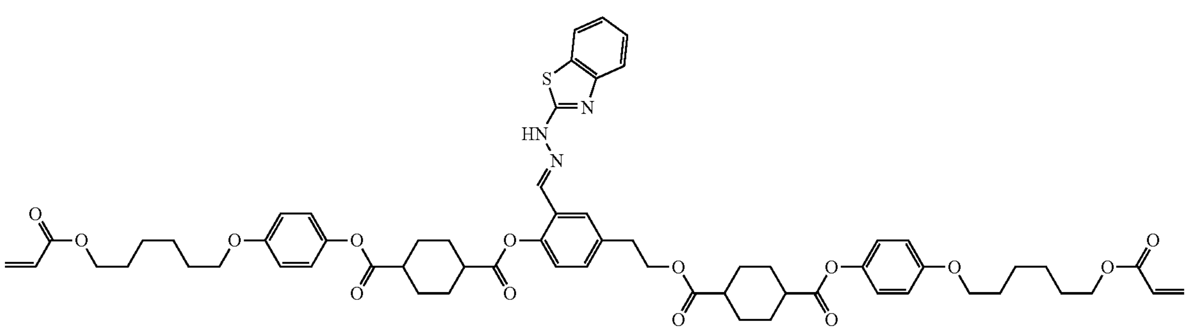
n = 6

-continued
(2-a-53)
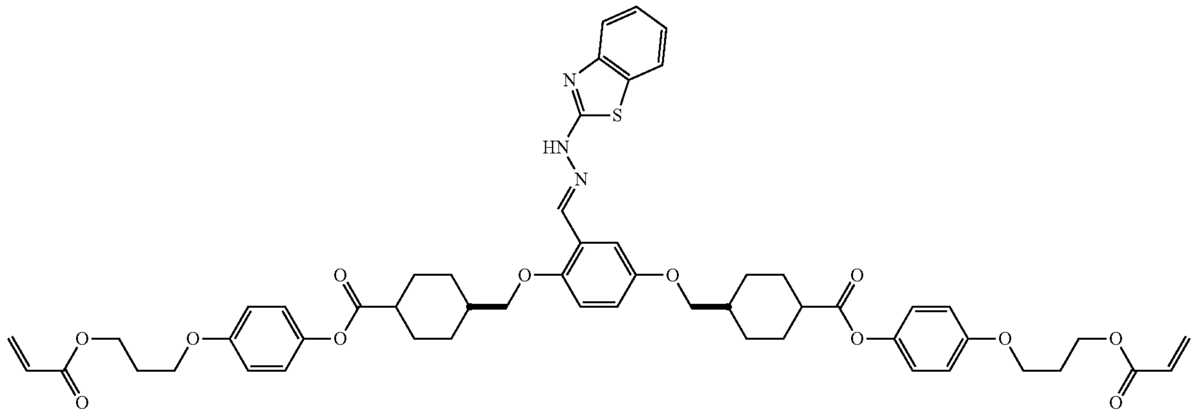
n = 3
(2-a-55)
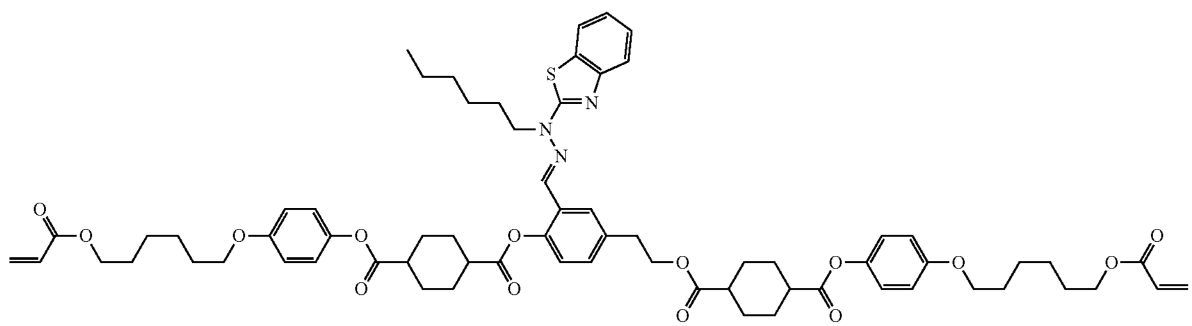
n = 6
(2-a-56)
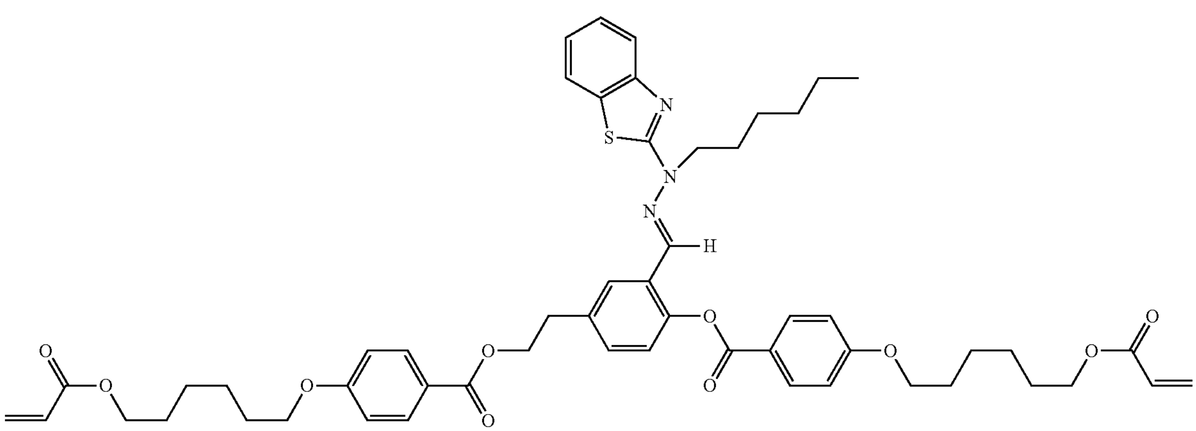
n = 6

-continued
(2-a-57)
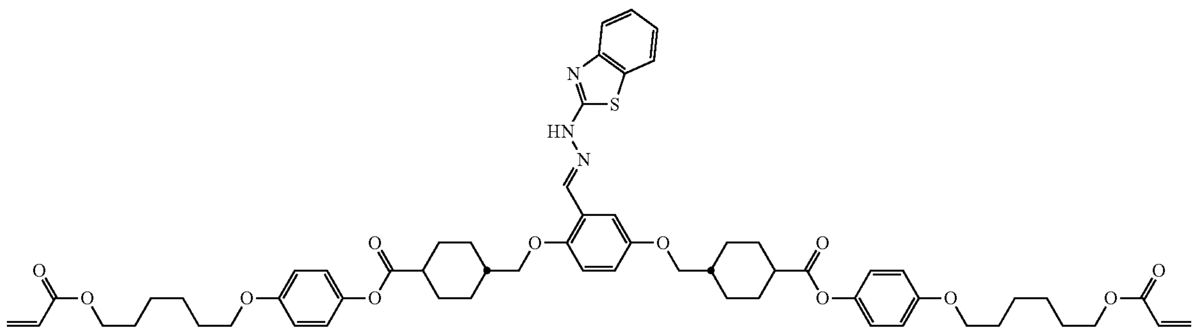
n = 6
[Chem. 174]
(2-a-58)
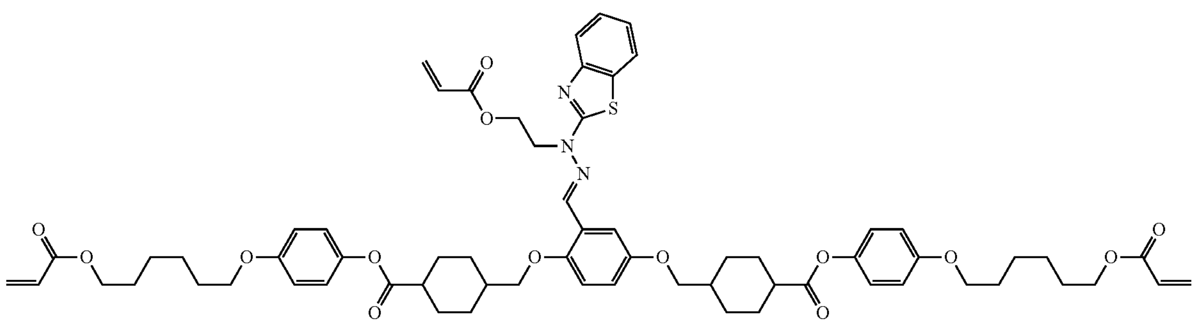
n = 6
(2-a-59)
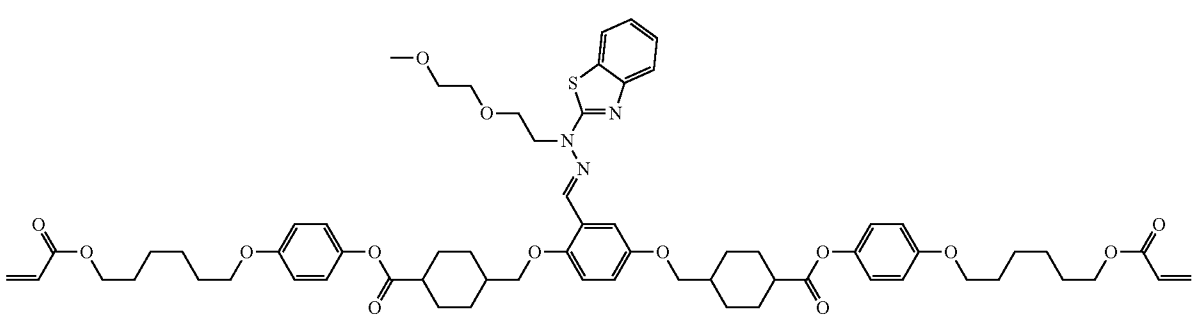
n = 6
(2-a-60)
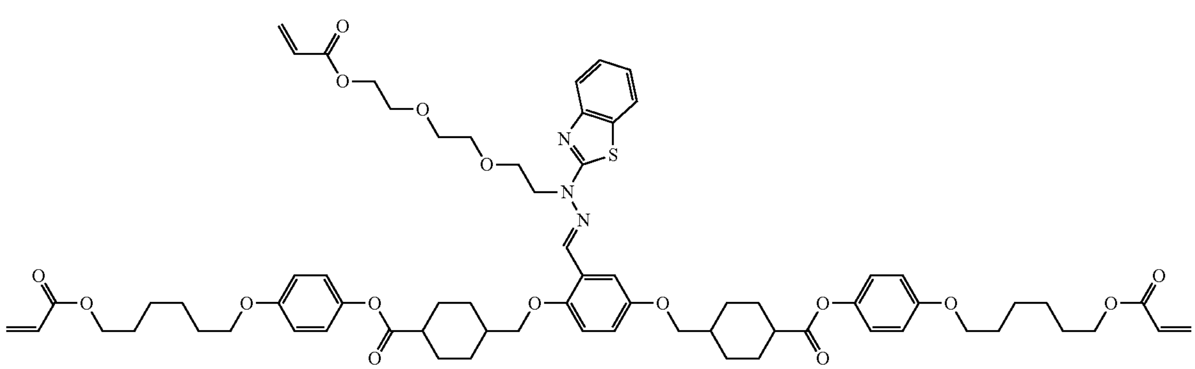
n = 6

-continued (2-a-61)

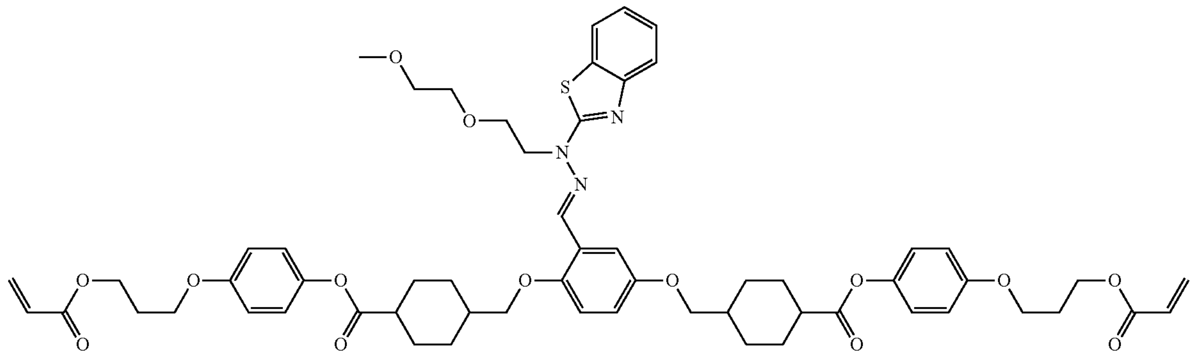

n = 3

[Chem. 175]

(2-b-19)

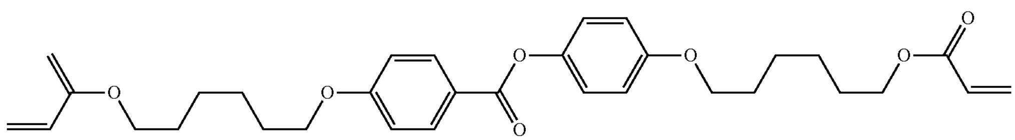

m = n = 6

The value of Re(450 nm)/Re(550 nm) of each of the compounds represented by the above formulas is shown in the following table.

TABLE 22

| Compound | Re(450 nm)/Re(550 nm) |
|---|---|
| Formula (1-a-93) (n = 6) | 0.664 |
| Formula (1-a-100) (n = 3) | 0.571 |
| Formula (1-a-101) (n = 3) | 0.601 |
| Formula (1-a-102) (n = 6) | 0.769 |
| Formula (1-a-103) (n = 6) | 0.749 |
| Formula (1-a-104) (n = 6) | 0.867 |
| Formula (1-a-105) (n = 3) | 0.363 |
| Formula (2-a-11) (n = 6) | 0.806 |
| Formula (2-a-53) (n = 3) | 0.622 |
| Formula (2-a-55) (n = 6) | 0.838 |
| Formula (2-a-56) (n = 6) | 0.554 |
| Formula (2-a-57) (n = 6) | 0.675 |
| Formula (2-a-58) (n = 6) | 0.878 |
| Formula (2-a-59) (n = 6) | 0.723 |
| Formula (2-a-60) (n = 6) | 0.823 |
| Formula (2-a-61) (n = 3) | 0.758 |

Solubility Evaluation

The solubility in each of Examples 107 to 142 was evaluated as follows.

A: After preparation, the clear and uniform state can be visually observed.

B: The clear and uniform state can be visually observed after heating and stirring, but precipitates of compounds are found when the mixture is returned to room temperature.

C: Compounds cannot be uniformly dissolved even after heating and stirring.

Storage Stability Evaluation

For each of Examples 107 to 142, the state after the polymerizable composition was left to stand at room temperature for 1 week was visually checked. The storage stability was evaluated as follows.

A: The clear and uniform state is maintained even after the polymerizable composition is left to stand at room temperature for 3 days.

B: The clear and uniform state is maintained even after the polymerizable composition is left to stand at room temperature for 1 day.

C: Precipitates of compounds are found after the polymerizable composition is left to stand at room temperature for 1 hour.

The results obtained are shown in the following table.

TABLE 23

| | Polymerizable composition | Solubility | Storage stability |
|---|---|---|---|
| Example 107 | (53) | A | A |
| Example 108 | (54) | A | A |
| Example 109 | (55) | A | A |
| Example 110 | (56) | A | A |
| Example 111 | (57) | A | A |
| Example 112 | (58) | A | A |
| Example 113 | (59) | A | A |
| Example 114 | (60) | A | A |
| Example 115 | (61) | A | A |
| Example 116 | (62) | A | A |
| Example 117 | (63) | A | A |
| Example 118 | (64) | A | A |
| Example 119 | (65) | A | A |
| Example 120 | (66) | A | A |
| Example 121 | (67) | A | A |
| Example 122 | (68) | A | A |
| Example 123 | (69) | A | A |
| Example 124 | (70) | A | A |
| Example 125 | (71) | A | A |
| Example 126 | (72) | A | A |
| Example 127 | (73) | A | A |
| Example 128 | (74) | A | A |
| Example 129 | (75) | A | A |
| Example 130 | (76) | A | A |
| Example 131 | (77) | A | A |
| Example 132 | (78) | A | A |

TABLE 23-continued

| | Polymerizable composition | Solubility | Storage stability |
|---|---|---|---|
| Example 133 | (79) | A | A |
| Example 134 | (80) | A | A |
| Example 135 | (81) | A | A |
| Example 136 | (82) | A | A |
| Example 137 | (83) | A | A |
| Example 138 | (84) | A | A |
| Example 139 | (85) | A | A |
| Example 140 | (86) | A | A |
| Example 141 | (87) | A | A |
| Example 142 | (88) | A | A |

Example 143

A uniaxially stretched 50 μm-thick PET film was subjected to rubbing treatment using a commercial rubbing device, and the polymerizable composition (53) of the present invention was applied by bar coating and dried at 90° C. for 2 minutes. The coating film obtained was cooled to room temperature and irradiated with UV rays at a conveying speed of 6 m/min using a UV conveyer device (manufactured by GS Yuasa Corporation) to thereby obtain an optically anisotropic body in Example 143 serving as a positive A-plate. The optically anisotropic body obtained was subjected to alignment evaluation, retardation ratio, leveling property evaluation, and offset evaluation in the same manner as in Example 53.

Examples 144 to 170

Optically anisotropic bodies in Examples 144 to 170 each serving as a positive A-plate were obtained under the same conditions as in Example 143 except that the polymerizable composition used was changed to one of the polymerizable compositions (54) to (80) of the present invention. The optically anisotropic bodies obtained were subjected to alignment evaluation, retardation ratio, leveling property evaluation, and offset evaluation in the same manner as in Example 53. The results obtained are shown in the following table.

TABLE 24

| | Polymerizable composition | Alignment evaluation | Retardation ratio | Leveling property evaluation | Offset evaluation |
|---|---|---|---|---|---|
| Example 143 | (53) | AA | 0.856 | AA | AA |
| Example 144 | (54) | AA | 0.852 | AA | AA |
| Example 145 | (55) | AA | 0.843 | AA | AA |
| Example 146 | (56) | AA | 0.843 | AA | AA |
| Example 147 | (57) | AA | 0.846 | AA | AA |
| Example 148 | (58) | AA | 0.831 | AA | AA |
| Example 149 | (59) | AA | 0.834 | AA | AA |
| Example 150 | (60) | AA | 0.838 | AA | AA |
| Example 151 | (61) | AA | 0.844 | AA | AA |
| Example 152 | (62) | AA | 0.855 | AA | AA |
| Example 153 | (63) | AA | 0.854 | AA | AA |
| Example 154 | (64) | AA | 0.859 | AA | AA |
| Example 155 | (65) | AA | 0.862 | AA | AA |
| Example 156 | (66) | AA | 0.865 | AA | AA |
| Example 157 | (67) | AA | 0.822 | AA | AA |
| Example 158 | (68) | AA | 0.830 | AA | AA |

TABLE 24-continued

| | Polymerizable composition | Alignment evaluation | Retardation ratio | Leveling property evaluation | Offset evaluation |
|---|---|---|---|---|---|
| Example 159 | (69) | AA | 0.832 | AA | AA |
| Example 160 | (70) | AA | 0.838 | AA | AA |
| Example 161 | (71) | AA | 0.845 | AA | AA |
| Example 162 | (72) | AA | 0.841 | AA | AA |
| Example 163 | (73) | AA | 0.818 | AA | AA |
| Example 164 | (74) | AA | 0.827 | AA | AA |
| Example 165 | (75) | AA | 0.833 | AA | AA |
| Example 166 | (76) | AA | 0.842 | AA | AA |
| Example 167 | (77) | AA | 0.854 | AA | AA |
| Example 168 | (78) | AA | 0.870 | AA | AA |
| Example 169 | (79) | AA | 0.872 | AA | AA |
| Example 170 | (80) | AA | 0.865 | AA | AA |

Examples 171 to 175

One of the polymerizable compositions (81) to (85) of the present invention was applied by bar coating to a film prepared by stacking a silane coupling agent-based vertical alignment film on a COP film substrate and then dried at 90° C. for 2 minutes. The coating films obtained were cooled to room temperature and irradiated with UV rays at a conveying speed of 6 m/min using a UV conveyer device (manufactured by GS Yuasa Corporation) to thereby obtain optically anisotropic bodies in Examples 171 to 175 each serving as a positive C-plate. The optically anisotropic bodies obtained were subjected to alignment evaluation, retardation ratio, leveling property evaluation, and offset property evaluation in the same manner as in Example 89. The results obtained are shown in the following table.

TABLE 25

| | Polymerizable composition | Alignment evaluation | Retardation ratio | Leveling property evaluation | Offset evaluation |
|---|---|---|---|---|---|
| Example 171 | (81) | AA | 0.861 | AA | AA |
| Example 172 | (82) | AA | 0.878 | AA | AA |
| Example 173 | (83) | AA | 0.874 | AA | AA |
| Example 174 | (84) | AA | 0.872 | AA | AA |
| Example 175 | (85) | AA | 0.870 | AA | AA |

Examples 176 to 178

A uniaxially stretched 50 μm-thick PET film was subjected to rubbing treatment using a commercial rubbing device, and one of the polymerizable compositions (86) to (88) of the present invention was applied by bar coating to the PET film and dried at 90° C. for 2 minutes. The coating films obtained were cooled to room temperature and irradiated with UV rays at a conveying speed of 6 m/min using a UV conveyer device (manufactured by GS Yuasa Corporation) to thereby obtain optically anisotropic bodies in Examples 176 to 178 each serving as a positive O-plate. The optically anisotropic bodies obtained were subjected to alignment evaluation, retardation ratio, leveling property evaluation, and offset property evaluation in the same manner as in Example 89. The results obtained are shown in the following table.

TABLE 26

| | Polymer-izable composition | Alignment evaluation | Retar-dation ratio | Leveling property evaluation | Offset evaluation |
|---|---|---|---|---|---|
| Example 176 | (86) | AA | 0.826 | AA | AA |
| Example 177 | (87) | AA | 0.872 | AA | AA |
| Example 178 | (88) | AA | 0.875 | AA | AA |

Example 179

20 Parts of the compound represented by formula (1-a-5), 50 parts of the compound represented by formula (1-a-6), 10 parts of the compound represented by formula (2-a-1) with n=6, 10 parts of the compound represented by formula (2-a-1) with n=3, 10 parts of the compound represented by formula (2-b-1) with m=n=3, and 6 parts of the compound represented by formula (d-7) were added to 400 parts of cyclopentanone, heated to 60° C., and dispersed and dissolved under stirring. After dispersion and dissolution was complete, the mixture was returned to room temperature. Then 3 parts of IRGACURE 907 (Irg 907 manufactured by BASF Japan Ltd.), 3 parts of IRGACURE OXE-01 (Irg. OXE-01 manufactured by BASF Japan Ltd.), 0.20 parts of the compound represented by formula (H-1), 0.1 parts of p-methoxyphenol (MEHQ), 0.1 parts of IRGANOX 1076 (manufactured by BASF Japan Ltd.), and 2 parts of trimethylolpropane tris(3-mercaptopropionate) TMMP (manufactured by SC Organic Chemical Co., Ltd.) were added, and the resulting mixture was further stirred to thereby obtain a solution. The solution was uniform. The solution obtained was filtered through a 0.5 μm membrane filter to thereby obtain a polymerizable composition (89) of the present invention. The solubility in Example 179 was evaluated in the same manner as in Example 1, and a clear and uniform state was found. The storage stability was evaluated in the same manner as in Example 1, and the clear and uniform state was maintained even after the polymerizable composition was left to stand for 3 days.

Examples 180 to 182

Polymerizable compositions (90) to (92) in Examples 180 to 182 were obtained under the same conditions as in the preparation of the polymerizable composition (89) in Example 179 except that ratios of compounds shown in a table below were changed as shown in the table. Specific compositions of the polymerizable compositions (89) to (92) of the present invention are shown in the following table.

TABLE 27

| | Polymerizable composition | | | |
|---|---|---|---|---|
| | (89) | (90) | (91) | (92) |
| 1-a-5 | 20 | 30 | 30 | 30 |
| 1-a-6 | 50 | 30 | 30 | 30 |
| 2-a-1 (n = 6) | 10 | | | |
| 2-a-1 (n = 3) | 10 | | | |
| 2-a-42 (n = 6) | | 40 | 40 | 40 |
| 2-b-1 (m = n = 3) | 10 | | | |
| d-7 | 6 | | | |
| 12-4 | | | 0.6 | |
| 12-8 | | | | 20 |
| 12-9 | | 1 | | |
| Irg 907 | 3 | 6 | 6 | 6 |
| Irg. OXE01 | 3 | | | |
| I-1076 | 0.1 | | | |
| TMMP | 2 | | | |
| MEHQ | 0.1 | 0.1 | 0.1 | 0.1 |
| H-1 | 0.2 | 0.2 | 0.2 | 0.2 |
| CPN | 400 | 400 | 400 | 400 |

[Chem. 176]

(2-a-42)

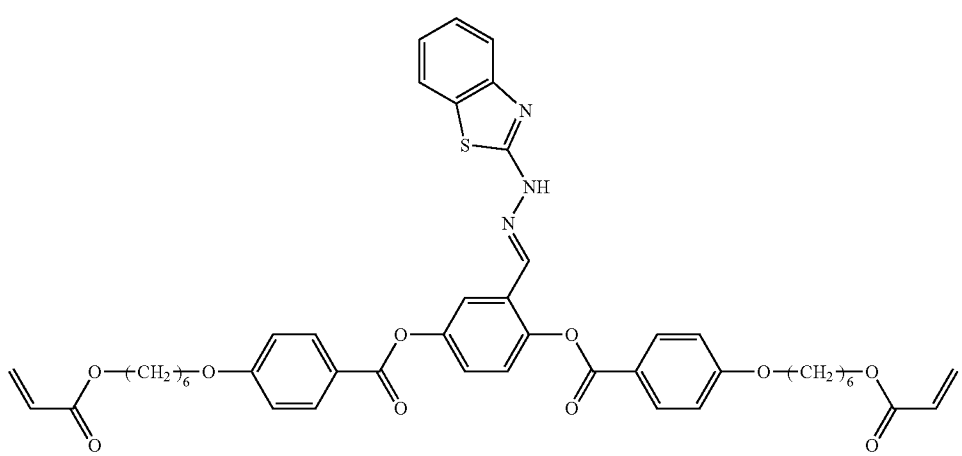

n = 6

-continued (d-7)

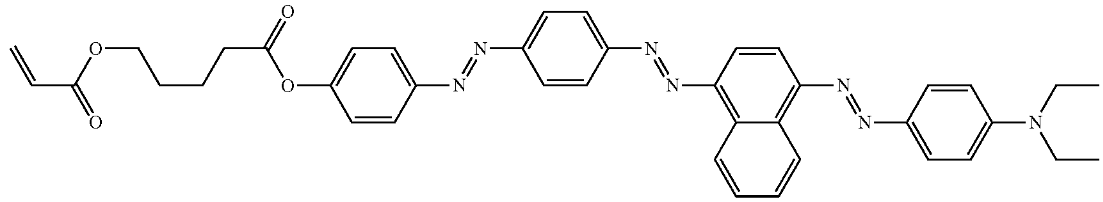

IRGANOX 1076 (I-1076)

Trimethylolpropane tris(3-mercaptopropionate) (TMMP)

Solubility Evaluation

The solubility in each of Examples 179 to 182 was evaluated as follows.

A: After preparation, the clear and uniform state can be visually observed.

B: The clear and uniform state can be visually observed after heating and stirring, but precipitates of compounds are found when the mixture is returned to room temperature.

C: Compounds cannot be uniformly dissolved even after heating and stirring.

Storage Stability Evaluation

For each of Examples 179 to 182, the state after the polymerizable composition was left to stand at room temperature for 1 week was visually checked. The storage stability of the polymerizable composition was evaluated as follows.

A: The clear and uniform state is maintained even after the polymerizable composition is left to stand at room temperature for 3 days.

B: The clear and uniform state is maintained even after the polymerizable composition is left to stand at room temperature for 1 day.

C: Precipitates of compounds are found after the polymerizable composition is left to stand at room temperature for 1 hour.

The results obtained are shown in the following table.

TABLE 28

| | Polymerizable composition | Solubility | Storage stability |
|---|---|---|---|
| Example 179 | (89) | A | A |
| Example 180 | (90) | A | A |
| Example 181 | (91) | A | A |
| Example 182 | (92) | A | A |

Example 183

A polyimide solution for an alignment film was applied to a 0.7 mm-thick glass substrate by spin coating, dried at 100° C. for 10 minutes, and then fired at 200° C. for 60 minutes to obtain a coating film. The coating film obtained was subjected to rubbing treatment. The rubbing treatment was performed using a commercial rubbing device.

The polymerizable composition (89) of the present invention was applied to the substrate subjected to rubbing by spin coating and dried at 90° C. for 2 minutes. The coating film obtained was cooled to room temperature over 2 minutes and irradiated with UV rays at an intensity of 30 $mW/cm^2$ for 30 minutes using a high-pressure mercury lamp to thereby obtain an optically anisotropic body in Example 183 serving as a positive A-plate. The degree of polarization, transmittance, and contrast of the optically anisotropic body obtained were measured using the RETS-100 (manufactured by Otsuka Electronics Co., Ltd.). The degree of polarization was 99.0%, the transmittance was 44.5%, and the contrast was 93. The optically anisotropic body was found to function as a polarizing film.

Example 184

The polymerizable composition (90) of the present invention was applied to a 0.7 mm-thick glass substrate by spin coating, dried at 70° C. for 2 minutes, further dried at 100° C. for 2 minutes, and irradiated with linearly polarized light of 313 nm at an intensity of 10 $mW/cm^2$ for 30 seconds. Then the coating film was returned to room temperature and irradiated with UV rays at an intensity of 30 $mW/cm^2$ for 30 seconds using a high-pressure mercury lamp to thereby obtain an optically anisotropic body in Example 184 serving as a positive A-plate. The alignment of the optically anisotropic body obtained was evaluated. No defects were found at all by visual inspection, and also no defects were found at all by polarizing microscope observation. The retardation of the optically anisotropic body obtained was measured using the RETS-100 (manufactured by Otsuka Electronics Co., Ltd.). The in-plane retardation (Re(550)) at a wavelength of 550 nm was 137 nm, and the retardation film obtained had high uniformity.

Example 185

An optically anisotropic body in Example 185 serving as a positive A-plate was obtained under the same conditions as in Example 184 except that the polymerizable composition used was changed to the polymerizable composition (91) of the present invention. The alignment of the optically anisotropic body obtained was evaluated. No defects were found at all by visual inspection, and also no defects were found at all by polarizing microscope observation. The retardation of the optically anisotropic body obtained was measured using the RETS-100 (manufactured by Otsuka Electronics Co., Ltd.). The in-plane retardation (Re(550)) at a wavelength of 550 nm was 130 nm, and the retardation film obtained had high uniformity.

Example 186

An optically anisotropic body in Example 186 serving as a positive A-plate was obtained under the same conditions as in Example 184 except that the polymerizable composition used was changed to the polymerizable composition (92) of the present invention. The alignment of the optically anisotropic body obtained was evaluated. No defects were found at all by visual inspection, and also no defects were found at all by polarizing microscope observation. The retardation of the optically anisotropic body obtained was measured using the RETS-100 (manufactured by Otsuka Electronics Co., Ltd.). The in-plane retardation (Re(550)) at a wavelength of 550 nm was 108 nm, and the retardation film obtained had high uniformity.

The polymerizable compositions (1) to (92) of the present invention using the surfactants represented by formula (H-1) to formula (H-3) (Examples 1 to 52, Examples 107 to 142, and Examples 179 to 182) were excellent in solubility and storage properties. In the optically anisotropic bodies formed from the polymerizable compositions (1) to (92) (Examples 53 to 106, Examples 143 to 178, and Examples 183 to 186), the results of all the leveling property evaluation, offset evaluation, and alignment evaluation were good, and the productivity of these optically anisotropic bodies was good. In particular, in the polymerizable compositions using the fluorosurfactants having the pentaerythritol skeleton and ethylene oxide groups, the results of the leveling property evaluation, offset evaluation, and alignment evaluation were very good. As can be seen from the results in Comparative Examples 1 to 14, when the unimolecular fluorosurfactants having no pentaerythritol skeleton and no dipentaerythritol skeleton were used, the results of any of the leveling property evaluation, offset evaluation, and alignment evaluation were poor. These results were poorer than those in the polymerizable compositions of the present invention.

The invention claimed is:

1. A polymerizable composition comprising:

a) a polymerizable compound having one polymerizable group or two or more polymerizable groups and satisfying formula (I)

$$Re(450\ \text{nm})/Re(550\ \text{nm})<1.0 \quad \text{(I)}$$

wherein Re(450 nm) is an in-plane retardation at a wavelength of 450 nm when the polymerizable compound having one polymerizable group is aligned on a substrate such that the direction of long axes of molecules of the polymerizable compound is horizontal to the substrate, and Re(550 nm) is an in-plane retardation at a wavelength of 550 nm when the polymerizable compound having one polymerizable group is aligned on the substrate such that the direction of the long axes of the molecules of the polymerizable compound is horizontal to the substrate; and b) at least one fluorosurfactant selected from the group consisting of compounds denoted by a general formula (III-1) and compounds denoted by a general formula (III-2)

(III-1)

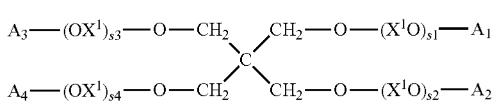

wherein $X^1$ represents an alkylene group; s1 represents a numerical value of 1 to 80; s2 to s4 each independently represent a numerical value of 0 to 79; s1+s2+s3+s4 represents a numerical value of 4 to 80; $A_1$ represents a fluoroalkyl group or a fluoroalkenyl group; and $A_2$ to $A_4$ each independently represent a hydrogen atom, an acryloyl group, a methacryloyl group, a fluoroalkyl group, or a fluoroalkenyl group;

(III-2)

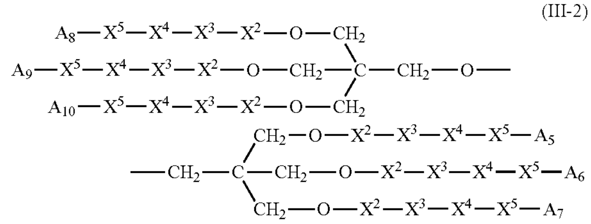

wherein $X^2$, $X^3$, $X^4$, and $X^5$ each independently represent a single bond, —O—, —S—, —CO—, an alkyl group having 1 to 4 carbon atoms, or an oxyalkylene group; $A_5$ represents a fluoroalkyl group or a fluoroalkenyl group; and $A_6$ to $A_{10}$ each independently represent a hydrogen atom, an acryloyl group, a methacryloyl group, a fluoroalkyl group, or a fluoroalkenyl group, and wherein the polymerizable compound having one polymerizable group or two or more polymerizable groups and satisfying formula (I) comprises at least one selected from liquid crystalline compounds represented by general formulas (1) to (7):

(1)

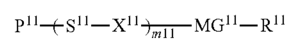

(2)

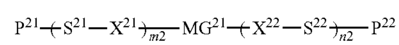

(3)

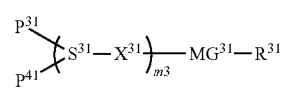

(4)

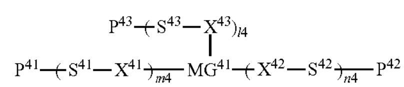

(5)

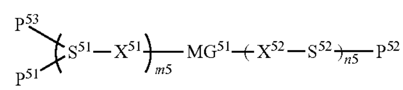

(6)

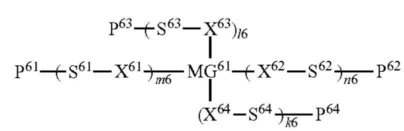

(7)

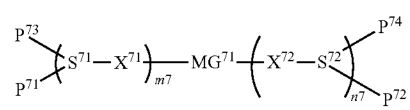

wherein $P^{11}$ to $P^{74}$ each represent a polymerizable group; $S^{11}$ to $S^{72}$ each represent a spacer group or a single bond; when a plurality of $S^{11}$s to $S^{72}$s are present, they are the same or different;

$X^{11}$ to $X^{72}$ each represent —O—, —S, —$OCH_2$, —$CH_2O$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—COO—, —CH═CH—OCO—, —COO—CH═CH—, —OCO—CH═CH—, —COO—

$CH_2CH_2$—, —OCO—$CH_2CH_2$—, —$CH_2CH_2$—COO—, —$CH_2CH_2$—OCO—, —COO—$CH_2$—, —OCO—$CH_2$—, —$CH_2$—COO—, —$CH_2$—OCO—, —CH═CH—, —N═N—, —CH═N—N═CH—, —CF═CF—, —C≡C—, or a single bond provided that each P—(S—X)— bond contains no —O—O—; when a plurality of $X^{11}$ s to $X^{72}$ s are present, they are the same or different;

$MG^{11}$ to $MG^{71}$ each independently represent formula (a):

$$-(A^{11}-Z^{11})_{j11}-\underset{}{\overset{G}{\overset{|}{M}}}-(Z^{12}-A^{12})_{j12}- \quad \text{(a)}$$

wherein $A^{11}$ and $A^{12}$ each independently represent a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, each of which are unsubstituted or substituted by at least one $L^1$; when a plurality of $A^{11}$s and/or $A^{12}$s are present, they are the same or different;

$Z^{11}$ and $Z^{12}$ each independently represent —O—, —S—, —$OCH_2$—, —$CH_2O$—, —$CH_2CH_2$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—OCO—, —CH═CH—OCO—, —COO—CH═CH—, —OCO—CH═CH—, —COO—$CH_2CH_2$—, —OCO—$CH_2CH_2$—, —$CH_2CH_2$—COO—, —$CH_2CH_2$—OCO—, —COO—$CH_2$—, —OCO—$CH_2$—, —$CH_2$—COO—, —$CH_2$—OCO—, —CH═CH—, —N═N—, —CH═N—, —N═CH—, —CH═N—N═CH—, —CF═CF—, —C≡C—, or a single bond; when a plurality of $Z^{11}$s and/or $Z^{12}$s are present, they are the same or different; wherein at least one of $Z^{11}$ and $Z^{12}$ in general formula (a) is —$OCH_2$— or —$CH_2O$—, M represents a group selected from formula (M-1) to formula (M-11) below:

(M-1)

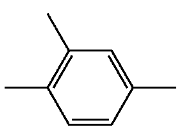

(M-2)

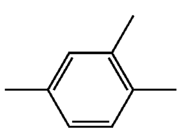

(M-3)

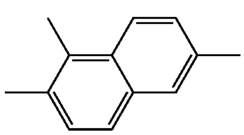

(M-4)

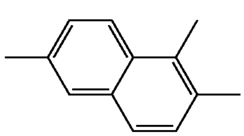

-continued (M-5)

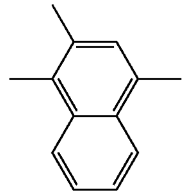

(M-6)

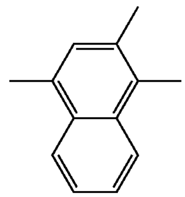

(M-7)

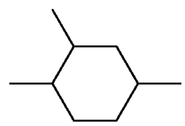

(M-8)

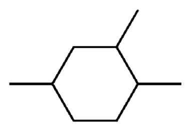

(M-9)

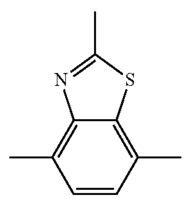

(M-10)

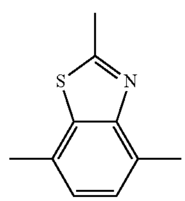

(M-11)

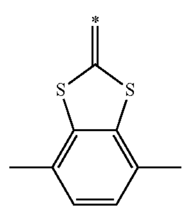

the groups represented by formula (M-1) to formula (M-11) are unsubstituted or substituted by at least one $L^1$;

G is one of formula (G-1) to formula (G-6) below:

(G-1)

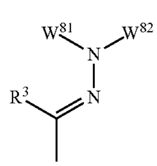

-continued (G-2)

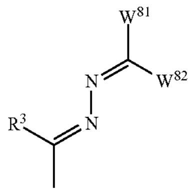

(G-3)

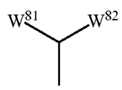

(G-4)

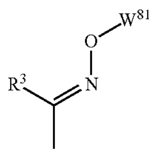

(G-5)

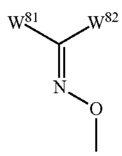

(G-6)

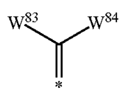

wherein $R^3$ represents a hydrogen atom or an alkyl group having 1 to 20 carbon atoms, the alkyl group being linear or an alkyl group having 3 to 20 carbon atoms, the alkyl group being branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, or —C≡C—;

$W^{81}$ represents a group that has at least one aromatic group and has 5 to 30 carbon atoms and that is unsubstituted or substituted by at least one $L^1$;

$W^{82}$ represents a hydrogen atom or an alkyl group having 1 to 20 carbon atoms, the alkyl group being linear or an alkyl group having 3 to 20 carbon atoms, the alkyl group being branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—; the meaning of $W^{82}$ is the same as the meaning of $W^{81}$; alternatively, $W^{82}$ represents the following group:

$$P^{W82} \!-\!\!\left( S^{W82} - X^{W82} \right)_{n^{W82}}$$

wherein the meaning of $P^{W82}$ is the same as the meaning of $P^{11}$; the meaning of $S^{W82}$ is the same as the meaning of $S^{11}$; the meaning of $X^{W82}$ is the same as the meaning of $X^{11}$; and the meaning of $n^{W82}$ is the same as the meaning of m11; $W^{83}$ and $W^{84}$ are each independently a halogen atom, a hydroxy group, a nitro group, a carboxyl group, a carbamoyloxy group, an amino group, a sulfamoyl group, a group having at least one aromatic group and having 5 to 30 carbon atoms, an alkyl group having 1 to 20 carbon atoms, a cycloalkyl group having 3 to 20 carbon atoms, an alkenyl group having 2 to 20 carbon atoms, a cycloalkenyl group having 3 to 20 carbon atoms, an alkoxy group having 1 to 20 carbon atoms, an acyloxy group having 2 to 20 carbon atoms, or an alkylcarbonyloxy group having 2 to 20 carbon atoms, one —$CH_2$— group or two or more nonadjacent —$CH_2$— groups in each of the alkyl group, the cycloalkyl group, the alkenyl group, the cycloalkenyl group, the alkoxy group, the acyloxy group, and the alkylcarbonyloxy group being each independently optionally replaced by —O—, —S—, —CO—, —COO—, —OCO—, —CO—S—, —S—CO—, —O—CO—O—, —CO—NH—, —NH—CO—, or —C≡C—; when M is selected from formula (M-1) to formula (M-10), G is selected from formula (G-1) to formula (G-5); when M represents formula (M-11), G represents formula (G-6);

$L^1$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or an alkyl group having 1 to 20 carbon atoms, the alkyl group being linear or an alkyl group having 3 to 20 carbon atoms, the alkyl group being branched, any hydrogen atom in the alkyl group being optionally replaced by a fluorine atom, one —$CH_2$— group or two or more nonadjacent —$CH_2$— groups in the alkyl group being each independently optionally replaced by a group selected from —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, and —C≡C—; when a plurality of $L^1$s are present in the compound, they are the same or different;

j11 represents an integer from 1 to 5; and j12 represents an integer of 1 to 5 while j11+j12 is an integer from 2 to 5); $R^{11}$ and $R^{31}$ each represent a hydrogen atom, a fluorine atom, a chlorine atom, a bromine atom, an iodine atom, a pentafluorosulfuranyl group, a cyano group, a nitro group, an isocyano group, a thioisocyano group, or an alkyl group having 1 to 20 carbon atoms, the alkyl group being linear or an alkyl group having 3 to 20 carbon atoms, the alkyl group being branched, any hydrogen atom in the alkyl group being optionally replaced by a fluorine atom, one —$CH_2$— group or two or more nonadjacent —$CH_2$— groups in the alkyl group being each independently optionally replaced by —O—, —S—, —CO—, —COO—, —OCO—, —CO—S—, —S—CO—, —O—CO—O—, —CO—NH—, —NH—CO—, or —C≡C—; m11 represents an integer of 0 to 8; and m2 to m7, n2 to n7, 14 to 16, and k6 each independently represent an integer from 0 to 5.

2. The polymerizable composition according to claim 1, wherein each of the polymerizable groups $P^{11}$ to $P^{74}$ is represented by any of general formulas (P-1) to (P-20):

(P-1)

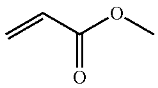

(P-2)

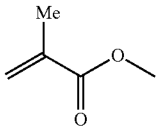

(P-3)

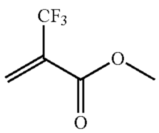

(P-4)

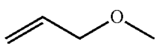

(P-5)

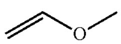

(P-6)

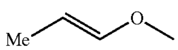

(P-7)

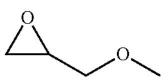

(P-8)

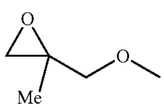

(P-9)

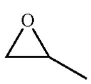

(P-10)

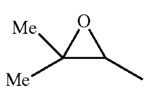

(P-11)

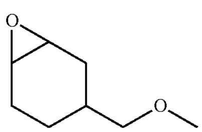

(P-12)

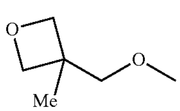

(P-13)

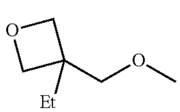

(P-14)

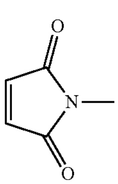

(P-15)

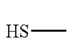

-continued (P-16)

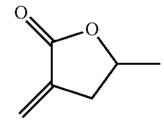

(P-17)

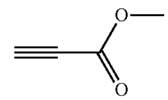

(P-18)

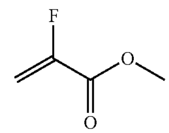

(P-19)

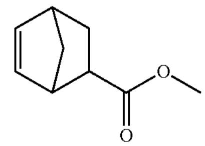

(P-20)

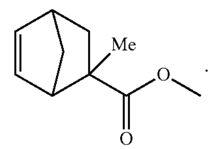

3. The polymerizable composition according to claim 1, further comprising a dichroic pigment.

4. The polymerizable composition according to claim 1, further comprising a cinnamate derivative.

5. A polymer of the polymerizable composition according to claim 1.

6. An optically anisotropic body comprising the polymer according to claim 5.

7. A retardation film comprising the polymer according to claim 5.

8. A polarizing film comprising the polymer according to claim 5.

9. A lens sheet comprising the polymer according to claim 5.

10. A light-emitting diode lighting device comprising the polymer according to claim 5.

11. A display device comprising the optically anisotropic body according to claim 6.

12. A light-emitting device comprising the optically anisotropic body according to claim 6.

13. A antireflective film comprising the retardation film according to claim 7.

14. A display device comprising the retardation film according to claim 7.

15. A light-emitting device comprising the retardation film according to claim 7.

16. The polymerizable composition according to claim 1, when j11 and j12 in formula (a) are both 1, $Z^{11}$ and $Z^{12}$ are independently —$OCH_2$— or —$CH_2O$—, and when a plurality of $Z^{11}$s and/or $Z^{12}$s are present, $Z^{11}$ bound to M and $Z^{12}$ bound to M are independently —$OCH_2$— or —$CH_2O$.

* * * * *